US011997920B2

(12) United States Patent
Nakamura et al.

(10) Patent No.: US 11,997,920 B2
(45) Date of Patent: May 28, 2024

(54) ORGANIC ELECTROLUMINESCENT ELEMENT AND ELECTRONIC DEVICE

(71) Applicant: IDEMITSU KOSAN CO.,LTD., Tokyo (JP)

(72) Inventors: Masato Nakamura, Sodegaura (JP); Taro Yamaki, Sodegaura (JP); Ryota Takahashi, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 673 days.

(21) Appl. No.: 17/133,297

(22) Filed: Dec. 23, 2020

(65) Prior Publication Data

US 2021/0336149 A1 Oct. 28, 2021

(30) Foreign Application Priority Data

Dec. 25, 2019 (JP) ................................ 2019-233740

(51) Int. Cl.

*H10K 50/15* (2023.01)
*H10K 85/60* (2023.01)

(Continued)

(52) U.S. Cl.

CPC ......... *H10K 85/626* (2023.02); *H10K 85/615* (2023.02); *H10K 85/6572* (2023.02);

(Continued)

(58) Field of Classification Search

None

See application file for complete search history.

(56) References Cited

U.S. PATENT DOCUMENTS

2005/0211958 A1* 9/2005 Conley ................ H10K 85/626 252/583
2006/0046097 A1* 3/2006 Kim ..................... H10K 85/626 313/506

(Continued)

FOREIGN PATENT DOCUMENTS

JP 2014-110348 A 6/2014
WO WO-2019229591 A1 * 12/2019 ............. C07C 15/38
WO WO-2019235475 A1 * 12/2019 ......... H01L 27/3209

OTHER PUBLICATIONS

Kim, Bong Sung, et al. "Electrical and optical analyses of tandem organic light-emitting diodes with organic charge-generation layer." AIP Advances 8.6 (2018): 065303. (Year: 2018).*

(Continued)

*Primary Examiner* — Robert S Loewe
(74) *Attorney, Agent, or Firm* — Foley & Lardner LLP

(57) ABSTRACT

An organic electroluminescence device includes: an anode; a cathode; a first emitting unit including a first emitting layer and a first hole transporting zone; a first charge generating layer; and a second emitting unit including a second emitting layer, in which the first emitting unit, the first charge generating layer, and the second emitting unit are provided between the anode and the cathode in this order from the anode, the first hole transporting zone is provided between the anode and the first emitting layer, the first emitting layer contains a compound represented by a formula (1) below, and a thickness $d_1$ of the first hole transporting zone is 60 nm or less. In the formula (1): at least one of $R_1$ to $R_8$ is $-L_{13}-Ar_{13}$; $L_{11}$ to $L_{13}$ are each independently a single bond, an arylene group or the like; and $R_1$ to $R_8$ not being $-L_{13}-Ar_{13}$ are each independently a hydrogen atom or the like.

(Continued)

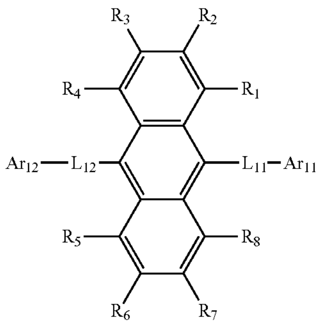

(1)

21 Claims, 5 Drawing Sheets

(51) Int. Cl.
*H10K 50/13* (2023.01)
*H10K 101/40* (2023.01)

(52) U.S. Cl.
CPC ..... *H10K 85/6574* (2023.02); *H10K 85/6576* (2023.02); *H10K 50/13* (2023.02); *H10K 2101/40* (2023.02)

(56) References Cited

U.S. PATENT DOCUMENTS

| | | | | |
|---|---|---|---|---|
| 2006/0204783 | A1* | 9/2006 | Conley | H10K 50/11 313/506 |
| 2008/0268282 | A1* | 10/2008 | Spindler | H05B 33/14 428/690 |
| 2015/0303391 | A1 | 10/2015 | Nishimura et al. | |
| 2021/0066618 | A1* | 3/2021 | Kang | H10K 85/654 |
| 2021/0119133 | A1* | 4/2021 | Kadoma | C09K 11/06 |

OTHER PUBLICATIONS

Serevičius, Tomas, et al. "Non-symmetric 9, 10-diphenylanthracene-based deep-blue emitters with enhanced charge transport properties." Physical Chemistry Chemical Physics 16.15 (2014): 7089-7101. (Year: 2014).*

Serevičius, Tomas, et al. "Impact of non-symmetric 2, 9, 10-aryl substitution on charge transport and optical properties of anthracene derivatives." Dyes and Pigments 122 (2015): 147-159. (Year: 2015).*

* cited by examiner

ORGANIC ELECTROLUMINESCENT ELEMENT AND ELECTRONIC DEVICE

The entire disclosure of Japanese Patent Application No. 2019-233740 filed Dec. 25, 2019 is expressly incorporated by reference herein.

TECHNICAL FIELD

The present invention relates to an organic electroluminescence device and an electronic device.

BACKGROUND ART

There has been known an organic electroluminescence device (hereinafter, referred to as an "organic EL device") that includes an emitting unit, in which an emitting layer is included, between an anode and a cathode and emits light using exciton energy generated by a recombination of holes and electrons that have been injected into the emitting layer.

Recently, there has been studied an arrangement of the organic EL device having a plurality of emitting units laminated through a charge generating layer and connected in series. Such an arrangement is also referred to as a tandem organic EL device.

Patent Literature 1 (US 2005/0211958 A) discloses an organic electroluminescence device including an anthracene material having aromatic carbocyclic rings as a host material of an emitting layer. Patent Literature 1 discloses that the organic electroluminescence device described therein can also be used for a laminated device structure.

SUMMARY OF THE INVENTION

An object of the invention is to provide an organic electroluminescence device emitting light with a long lifetime at a low voltage, and an electronic device including the organic electroluminescence device.

According to an aspect of the invention, an organic electroluminescence device includes:

an anode, a cathode;

a first emitting unit including a first emitting layer and a first hole transporting zone;

a first charge generating layer;

a second emitting unit including a second emitting layer, in which the first emitting unit, the first charge generating layer, and the second emitting unit are provided between the anode and the cathode in this order from the anode, the first hole transporting zone of the first emitting unit is provided between the anode and the first emitting layer, the first emitting layer includes a compound represented by a formula (1) below, and a thickness of the first hole transporting zone of the first emitting unit is 60 nm or less,

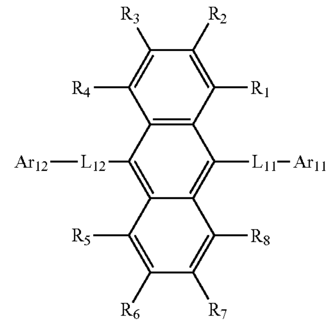

(1)

where, in the formula (1): at least one of $R_1$ to $R_8$ is $-L_{13}-Ar_{13}$;

$L_{11}$ to $L_{13}$ are each independently a single bond, a substituted or unsubstituted arylene group having 6 to 50 ring carbon atoms, or a substituted or unsubstituted divalent heterocyclic group having 5 to 50 ring atoms;

when a plurality of $L_{13}$ are present, the plurality of $L_{13}$ are mutually the same or different;

$Ar_{11}$ to $Ar_{13}$ are each independently a substituted or unsubstituted aryl group having 6 to 50 ring carbon atoms, or a substituted or unsubstituted heterocyclic group having 5 to 50 ring atoms;

when a plurality of $Ar_{13}$ are present, the plurality of $Ar_{13}$ are mutually the same or different;

$R_1$ to $R_8$ not being $-L_{13}-Ar_{13}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$, $R_{902}$, $R_{903}$, $R_{904}$, $R_{905}$, $R_{906}$, and $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

According to another aspect of the invention, an electronic device including the organic electroluminescence device according to the above aspect of the invention is provided.

According to the aspects of the invention, an organic electroluminescence device emitting light with a long lifetime at a low voltage, and an electronic device including the organic electroluminescence device can be provided.

DESCRIPTION OF EMBODIMENT(S)

Definitions

Figure 1:
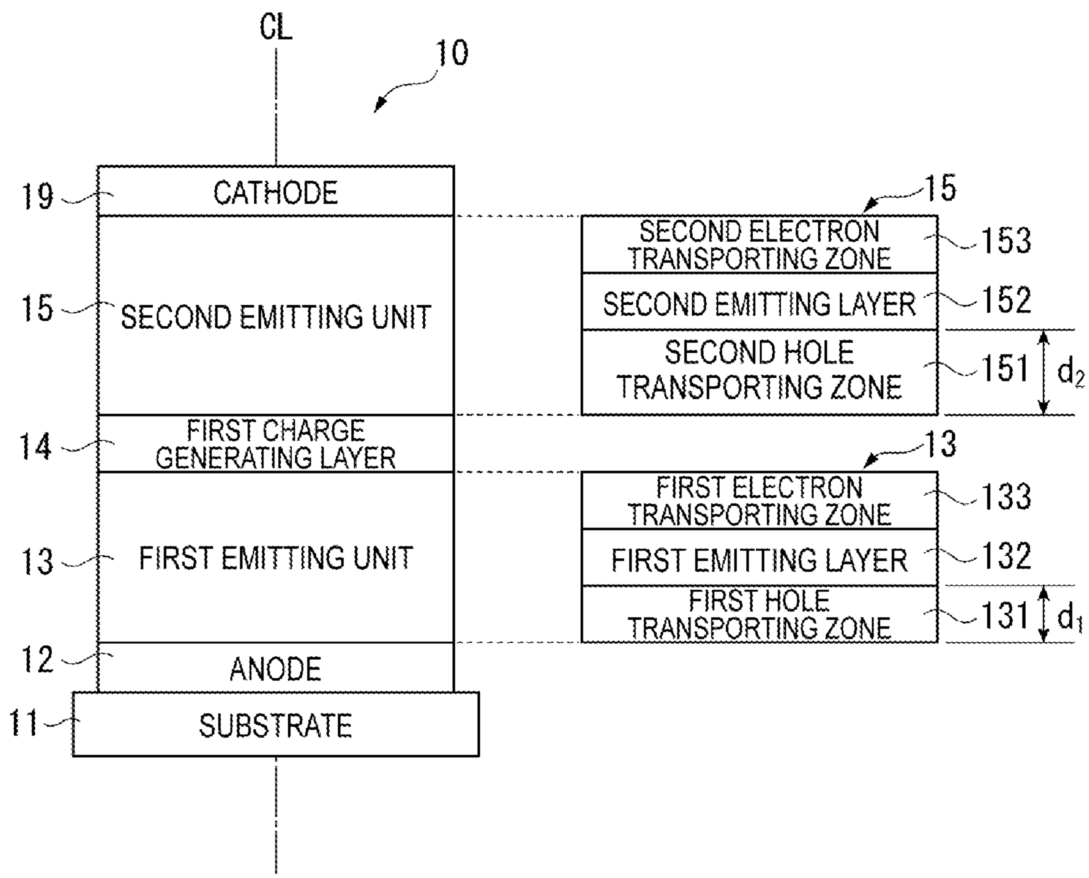
FIG. 1 schematically shows an exemplary arrangement of an organic EL device according to a first exemplary embodiment.

Herein, a hydrogen atom includes isotope having different numbers of neutrons, specifically, protium, deuterium and tritium.

In chemical formulae herein, it is assumed that a hydrogen atom (i.e. protium, deuterium and tritium) is bonded to each of bondable positions that are not annexed with signs "R" or the like or "D" representing a protium.

Herein, the ring carbon atoms refer to the number of carbon atoms among atoms forming a ring of a compound (e.g., a monocyclic compound, fused-ring compound, crosslinking compound, carbon ring compound, and heterocyclic compound) in which the atoms are bonded with each other to form the ring. When the ring is substituted by a substituent(s), carbon atom(s) contained in the substituent(s) is not counted in the ring carbon atoms. Unless otherwise specified, the same applies to the "ring carbon atoms" described later. For instance, a benzene ring has 6 ring carbon atoms, a naphthalene ring has 10 ring carbon atoms, a pyridine ring has 5 ring carbon atoms, and a furan ring has 4 ring carbon atoms. Further, for instance, 9,9-diphenylfluorenyl group has 13 ring carbon atoms and 9,9'-spirobifluorenyl group has 25 ring carbon atoms.

When a benzene ring is substituted by a substituent in a form of, for instance, an alkyl group, the number of carbon atoms of the alkyl group is not counted in the number of the ring carbon atoms of the benzene ring. Accordingly, the benzene ring substituted by an alkyl group has 6 ring carbon atoms. When a naphthalene ring is substituted by a substituent in a form of, for instance, an alkyl group, the number of carbon atoms of the alkyl group is not counted in the number of the ring carbon atoms of the naphthalene ring. Accordingly, the naphthalene ring substituted by an alkyl group has 10 ring carbon atoms.

Herein, the ring atoms refer to the number of atoms forming a ring of a compound (e.g., a monocyclic compound, fused-ring compound, crosslinking compound, carbon ring compound, and heterocyclic compound) in which the atoms are bonded to each other to form the ring (e.g., monocyclic ring, fused ring, and ring assembly). Atom(s) not forming the ring (e.g., hydrogen atom(s) for saturating the valence of the atom which forms the ring) and atom(s) in a substituent by which the ring is substituted are not counted as the ring atoms. Unless otherwise specified, the same applies to the "ring atoms" described later. For instance, a pyridine ring has 6 ring atoms, a quinazoline ring has 10 ring atoms, and a furan ring has 5 ring atoms. For instance, the number of hydrogen atom(s) bonded to a pyridine ring or the number of atoms forming a substituent are not counted as the pyridine ring atoms. Accordingly, a pyridine ring bonded with a hydrogen atom(s) or a substituent(s) has 6 ring atoms. For instance, the hydrogen atom(s) bonded to a quinazoline ring or the atoms forming a substituent are not counted as the quinazoline ring atoms. Accordingly, a quinazoline ring bonded with hydrogen atom(s) or a substituent(s) has 10 ring atoms.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group. Herein, "YY" is larger than "XX," "XX" representing an integer of 1 or more and "YY" representing an integer of 2 or more.

Herein, "XX to YY atoms" in the description of "substituted or unsubstituted ZZ group having XX to YY atoms" represent atoms of an unsubstituted ZZ group and does not include atoms of a substituent(s) of the substituted ZZ group. Herein, "YY" is larger than "XX," "XX" representing an integer of 1 or more and "YY" representing an integer of 2 or more.

Herein, an unsubstituted ZZ group refers to an "unsubstituted ZZ group" in a "substituted or unsubstituted ZZ group," and a substituted ZZ group refers to a "substituted ZZ group" in a "substituted or unsubstituted ZZ group."

Herein, the term "unsubstituted" used in a "substituted or unsubstituted ZZ group" means that a hydrogen atom(s) in the ZZ group is not substituted with a substituent(s). The hydrogen atom(s) in the "unsubstituted ZZ group" is protium, deuterium, or tritium.

Herein, the term "substituted" used in a "substituted or unsubstituted ZZ group" means that at least one hydrogen atom in the ZZ group is substituted with a substituent. Similarly, the term "substituted" used in a "BB group substituted by AA group" means that at least one hydrogen atom in the BB group is substituted with the AA group.

Substituent Mentioned Herein

Substituents mentioned herein will be described below.

An "unsubstituted aryl group" mentioned herein has, unless otherwise specified herein, 6 to 50, preferably 6 to 30, more preferably 6 to 18 ring carbon atoms.

An "unsubstituted heterocyclic group" mentioned herein has, unless otherwise specified herein, 5 to 50, preferably 5 to 30, more preferably 5 to 18 ring atoms.

An "unsubstituted alkyl group" mentioned herein has, unless otherwise specified herein, 1 to 50, preferably 1 to 20, more preferably 1 to 6 carbon atoms.

An "unsubstituted alkenyl group" mentioned herein has, unless otherwise specified herein, 2 to 50, preferably 2 to 20, more preferably 2 to 6 carbon atoms.

An "unsubstituted alkynyl group" mentioned herein has, unless otherwise specified herein, 2 to 50, preferably 2 to 20, more preferably 2 to 6 carbon atoms.

An "unsubstituted cycloalkyl group" mentioned herein has, unless otherwise specified herein, 3 to 50, preferably 3 to 20, more preferably 3 to 6 ring carbon atoms.

An "unsubstituted arylene group" mentioned herein has, unless otherwise specified herein, 6 to 50, preferably 6 to 30, more preferably 6 to 18 ring carbon atoms.

An "unsubstituted divalent heterocyclic group" mentioned herein has, unless otherwise specified herein, 5 to 50, preferably 5 to 30, more preferably 5 to 18 ring atoms.

An "unsubstituted alkylene group" mentioned herein has, unless otherwise specified herein, 1 to 50, preferably 1 to 20, more preferably 1 to 6 carbon atoms.

Substituted or Unsubstituted Aryl Group

Specific examples (specific example group G1) of the "substituted or unsubstituted aryl group" mentioned herein include unsubstituted aryl groups (specific example group G1A) below and substituted aryl groups (specific example group G1B). (Herein, an unsubstituted aryl group refers to an "unsubstituted aryl group" in a "substituted or unsubstituted aryl group," and a substituted aryl group refers to a "substituted aryl group" in a "substituted or unsubstituted aryl group.")

A simply termed "aryl group" herein includes both of "unsubstituted aryl group" and "substituted aryl group." The "substituted aryl group" refers to a group derived by substituting at least one hydrogen atom in an "unsubstituted aryl group" with a substituent. Examples of the "substituted aryl group" include a group derived by substituting at least one hydrogen atom in the "unsubstituted aryl group" in the specific example group G1A below with a substituent, and examples of the substituted aryl group in the specific example group G1B below. It should be noted that the examples of the "unsubstituted aryl group" and the "substituted aryl group" mentioned herein are merely exemplary, and the "substituted aryl group" mentioned herein includes a group derived by substituting a hydrogen atom bonded to a carbon atom of a skeleton of a "substituted aryl group" in the specific example group G1B below, and a group derived by substituting a hydrogen atom of a substituent of the "substituted aryl group" in the specific example group G1B below.

Unsubstituted Aryl Group (Specific Example Group G1A):

a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, benzanthryl group, phenanthryl group, benzophenanthryl group, phenalenyl group, pyrenyl group, chrysenyl group, benzochrysenyl group, triphenylenyl group, benzotriphenylenyl group, tetracenyl group, pentacenyl group, fluorenyl group, 9,9'-spirobifluorenyl group, benzofluorenyl group, dibenzofluorenyl group, fluoranthenyl group, benzofluoranthenyl group, a perylenyl group, and a monovalent aryl group derived by removing one hydrogen atom from cyclic structures represented by formulae (TEMP-1) to (TEMP-15) below.

(TEMP-1)

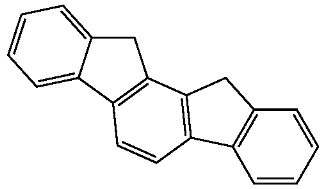

-continued (TEMP-2)

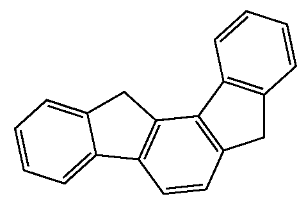

(TEMP-3)

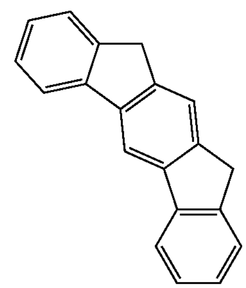

(TEMP-4)

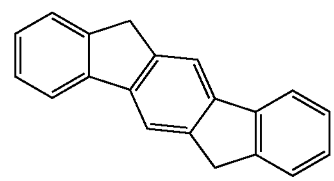

(TEMP-5)

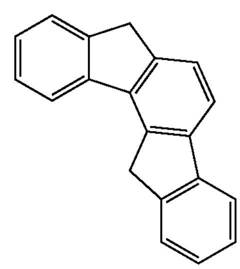

(TEMP-6)

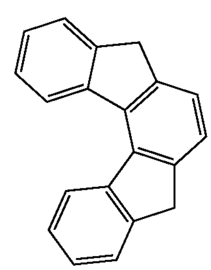

(TEMP-7)

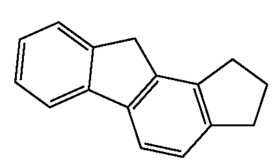

(TEMP-8)

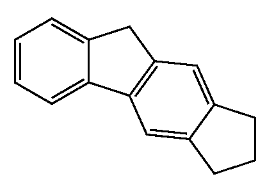

-continued (TEMP-9)

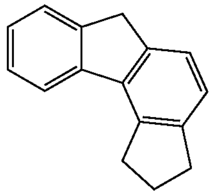

(TEMP-10)

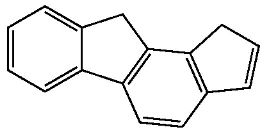

(TEMP-11)

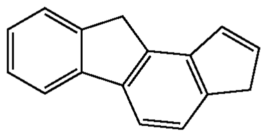

(TEMP-12)

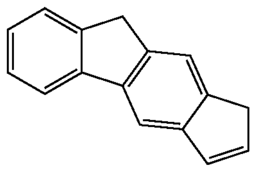

(TEMP-13)

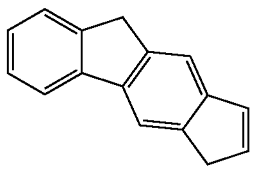

(TEMP-14)

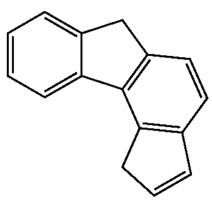

(TEMP-15)

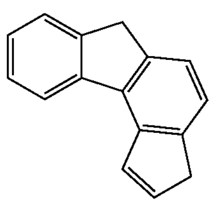

Substituted Aryl Group (Specific Example Group G1B):

an o-tolyl group, m-tolyl group, p-tolyl group, para-xylyl group, meta-xylyl group, ortho-xylyl group, para-isopropylphenyl group, meta-isopropylphenyl group, ortho-isopropylphenyl group, para-t-butylphenyl group, meta-t-butylphenyl group, ortho-t-butylphenyl group, 3,4,5-trimethylphenyl group, 9,9-dimethylfluorenyl group, 9,9-diphenylfluorenyl group, 9,9-bis(4-methylphenyl)fluorenyl group, 9,9-bis(4-isopropylphenyl)fluorenyl group, 9,9-bis(4-t-butylphenyl)fluorenyl group, cyanophenyl group, triphenylsilylphenyl group, trimethylsilylphenyl group, phenylnaphthyl group, naphthylphenyl group, and a group derived by substituting at least one hydrogen atom of a monovalent group derived from one of the cyclic structures represented by the formulae (TEMP-1) to (TEMP-15) with a substituent.

Substituted or Unsubstituted Heterocyclic Group

The "heterocyclic group" mentioned herein refers to a cyclic group having at least one hetero atom in the ring atoms. Specific examples of the hetero atom include a nitrogen atom, oxygen atom, sulfur atom, silicon atom, phosphorus atom, and boron atom.

The "heterocyclic group" mentioned herein is a monocyclic group or a fused-ring group.

The "heterocyclic group" mentioned herein is an aromatic heterocyclic group or a non-aromatic heterocyclic group.

Specific examples (specific example group G2) of the "substituted or unsubstituted heterocyclic group" mentioned herein include unsubstituted heterocyclic groups (specific example group G2A) and substituted heterocyclic groups (specific example group G2B). (Herein, an unsubstituted heterocyclic group refers to an "unsubstituted heterocyclic group" in a "substituted or unsubstituted heterocyclic group," and a substituted heterocyclic group refers to a "substituted heterocyclic group" in a "substituted or unsubstituted heterocyclic group.") A simply termed "heterocyclic group" herein includes both of "unsubstituted heterocyclic group" and "substituted heterocyclic group."

The "substituted heterocyclic group" refers to a group derived by substituting at least one hydrogen atom in an "unsubstituted heterocyclic group" with a substituent. Specific examples of the "substituted heterocyclic group" include a group derived by substituting at least one hydrogen atom in the "unsubstituted heterocyclic group" in the specific example group G2A below with a substituent, and examples of the substituted heterocyclic group in the specific example group G2B below. It should be noted that the examples of the "unsubstituted heterocyclic group" and the "substituted heterocyclic group" mentioned herein are merely exemplary, and the "substituted heterocyclic group" mentioned herein includes a group derived by substituting a hydrogen atom bonded to a ring atom of a skeleton of a "substituted heterocyclic group" in the specific example group G2B below, and a group derived by substituting a hydrogen atom of a substituent of the "substituted heterocyclic group" in the specific example group G2B below.

The specific example group G2A includes, for instance, unsubstituted heterocyclic groups including a nitrogen atom (specific example group G2A1) below, unsubstituted heterocyclic groups including an oxygen atom (specific example group G2A2) below, unsubstituted heterocyclic groups including a sulfur atom (specific example group G2A3) below, and monovalent heterocyclic groups (specific example group G2A4) derived by removing a hydrogen atom from cyclic structures represented by formulae (TEMP-16) to (TEMP-33) below.

The specific example group G2B includes, for instance, substituted heterocyclic groups including a nitrogen atom (specific example group G2B1) below, substituted heterocyclic groups including an oxygen atom (specific example group G2B2) below, substituted heterocyclic groups including a sulfur atom (specific example group G2B3) below, and groups derived by substituting at least one hydrogen atom of the monovalent heterocyclic groups (specific example group G2B4) derived from the cyclic structures represented by formulae (TEMP-16) to (TEMP-33) below.

Unsubstituted Heterocyclic Groups Including Nitrogen Atom (Specific Example Group G2A1):

a pyrrolyl group, imidazolyl group, pyrazolyl group, triazolyl group, tetrazolyl group, oxazolyl group, isoxazolyl group, oxadiazolyl group, thiazolyl group, isothiazolyl group, thiadiazolyl group, pyridyl group, pyridazynyl group, pyrimidinyl group, pyrazinyl group, triazinyl group, indolyl group, isoindolyl group, indolizinyl group, quinolizinyl group, quinolyl group, isoquinolyl group, cinnolyl group, phthalazinyl group, quinazolinyl group, quinoxalinyl group, benzimidazolyl group, indazolyl group, phenanthrolinyl group, phenanthridinyl group, acridinyl group, phenazinyl group, carbazolyl group, benzocarbazolyl group, morpholino group, phenoxazinyl group, phenothiazinyl group, azacarbazolyl group, and diazacarbazolyl group.

Unsubstituted Heterocyclic Groups Including Oxygen Atom (Specific Example Group G2A2):

furyl group, oxazolyl group, isoxazolyl group, oxadiazolyl group, xanthenyl group, benzofuranyl group, isobenzofuranyl group, dibenzofuranyl group, naphthobenzofuranyl group, benzoxazolyl group, benzisoxazolyl group, phenoxazinyl group, morpholino group, dinaphthofuranyl group, azadibenzofuranyl group, diazadibenzofuranyl group, azanaphthobenzofuranyl group, and diazanaphthobenzofuranyl group.

Unsubstituted Heterocyclic Groups Including Sulfur Atom (Specific Example Group G2A3):

a thienyl group, thiazolyl group, isothiazolyl group, thiadiazolyl group, benzothiophenyl group (benzothienyl group), isobenzothiophenyl group (isobenzothienyl group), dibenzothiophenyl group (dibenzothienyl group), naphthobenzothiophenyl group (nahthobenzothienyl group), benzothiazolyl group, benzisothiazolyl group, phenothiazinyl group, dinaphthothiophenyl group (dinaphthothienyl group), azadibenzothiophenyl group (azadibenzothienyl group), diazadibenzothiophenyl group (diazadibenzothienyl group), azanaphthobenzothiophenyl group (azanaphthobenzothienyl group), and diazanaphthobenzothiophenyl group (diazanaphthobenzothienyl group).

Monovalent Heterocyclic Groups Derived by Removing a Hydrogen Atom from Cyclic Structures Represented by Formulae (TEMP-16) to (TEMP-33) below (Specific Example Group G2A4):

(TEMP-16)

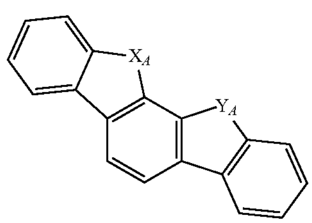

(TEMP-17)

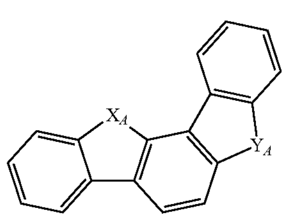

-continued (TEMP-18)

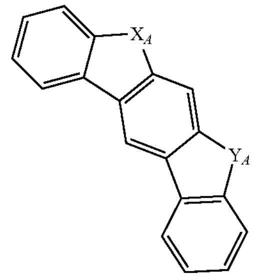

(TEMP-19)

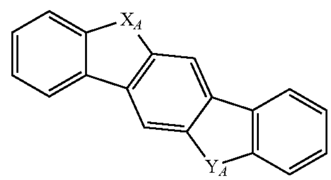

(TEMP-20)

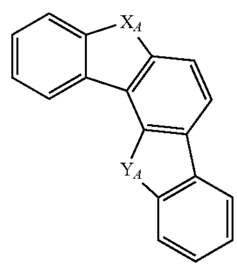

(TEMP-21)

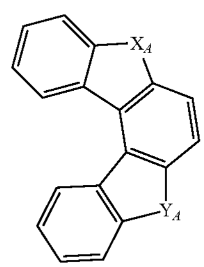

(TEMP-22)

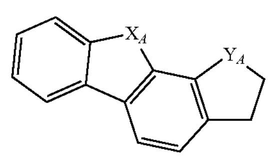

(TEMP-23)

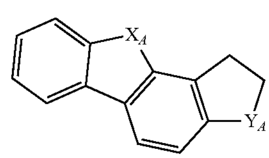

(TEMP-24)

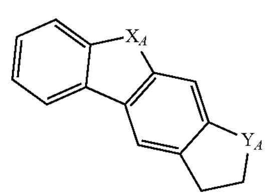

-continued (TEMP-25)

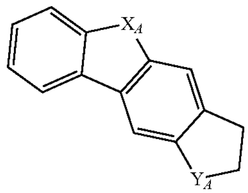

(TEMP-26)

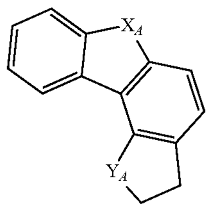

(TEMP-27)

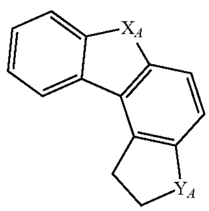

(TEMP-28)

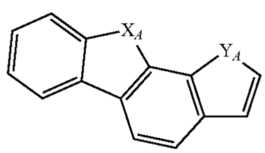

(TEMP-29)

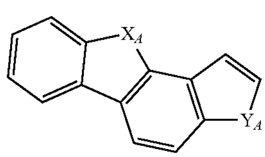

(TEMP-30)

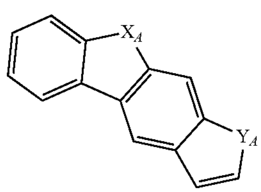

(TEMP-31)

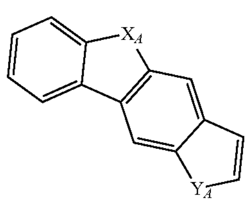

(TEMP-32)

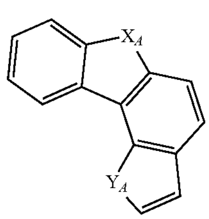

-continued (TEMP-33)

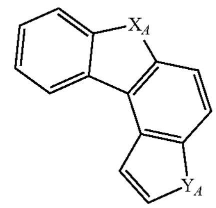

In the formulae (TEMP-16) to (TEMP-33), $X_A$ and $Y_A$ are each independently an oxygen atom, a sulfur atom, NH or $CH_2$, with a proviso that at least one of $X_A$ and $Y_A$ is an oxygen atom, a sulfur atom, or NH.

When at least one of $X_A$ and $Y_A$ in the formulae (TEMP-16) to (TEMP-33) is NH or $CH_2$, the monovalent heterocyclic groups derived from the cyclic structures represented by the formulae (TEMP-16) to (TEMP-33) include a monovalent group derived by removing one hydrogen atom from NH or $CH_2$.

Substituted Heterocyclic Groups Including Nitrogen Atom (Specific Example Group G2B1):

a (9-phenyl)carbazolyl group, (9-biphenylyl)carbazolyl group, (9-phenyl)phenylcarbazolyl group, (9-naphthyl)carbazolyl group, diphenylcarbazole-9-yl group, henylcarbazole-9-yl group, methyl benzimidazolyl group, ethyl benzimidazolyl group, phenyltriazinyl group, biphenylyltriazinyl group, diphenyltriazinyl group, phenylquinazolinyl group, and biphenylylquinazolinyl group.

Substituted Heterocyclic Groups Including Oxygen Atom (Specific Example Group G2B2):

a phenyldibenzofuranyl group, methyldibenzofuranyl group, t-butyldibenzofuranyl group, and monovalent residue of spiro[9H-xanthene-9,9'-[9H]fluorene].

Substituted Heterocyclic Groups Including Sulfur Atom (Specific Example Group G2B3):

a phenyldibenzothiophenyl group, methyldibenzothiophenyl group, t-butyldibenzothiophenyl group, and monovalent residue of spiro[9H-thioxanthene-9,9'-[9H]fluorene].

Groups Derived by Substituting at Least One Hydrogen Atom of Monovalent Heterocyclic Group Derived from Cyclic Structures Represented by Formulae (TEMP-16) to (TEMP-33) with Substituent (Specific Example Group G2B4):

The "at least one hydrogen atom of a monovalent heterocyclic group" means at least one hydrogen atom selected from a hydrogen atom bonded to a ring carbon atom of the monovalent heterocyclic group, a hydrogen atom bonded to a nitrogen atom of at least one of XA or YA in a form of NH, and a hydrogen atom of one of $X_A$ and $Y_A$ in a form of a methylene group (CH2).

Substituted or Unsubstituted Alkyl Group

Specific examples (specific example group G3) of the "substituted or unsubstituted alkyl group" mentioned herein include unsubstituted alkyl groups (specific example group G3A) and substituted alkyl groups (specific example group G3B below). (Herein, an unsubstituted alkyl group refers to an "unsubstituted alkyl group" in a "substituted or unsubstituted alkyl group," and a substituted alkyl group refers to a "substituted alkyl group" in a "substituted or unsubstituted alkyl group.") A simply termed "alkyl group" herein includes both of "unsubstituted alkyl group" and "substituted alkyl group."

The "substituted alkyl group" refers to a group derived by substituting at least one hydrogen atom in an "unsubstituted alkyl group" with a substituent. Specific examples of the "substituted alkyl group" include a group derived by substituting at least one hydrogen atom of an "unsubstituted alkyl group" (specific example group G3A) below with a substituent, and examples of the substituted alkyl group (specific example group G3B) below. Herein, the alkyl group for the "unsubstituted alkyl group" refers to a chain alkyl group. Accordingly, the "unsubstituted alkyl group" include linear "unsubstituted alkyl group" and branched "unsubstituted alkyl group." It should be noted that the examples of the "unsubstituted alkyl group" and the "substituted alkyl group" mentioned herein are merely exemplary, and the "substituted alkyl group" mentioned herein includes a group derived by substituting a hydrogen atom bonded to a carbon atom of a skeleton of the "substituted alkyl group" in the specific example group G3B, and a group derived by substituting a hydrogen atom of a substituent of the "substituted alkyl group" in the specific example group G3B.

Unsubstituted Alkyl Group (Specific Example Group G3A):

a methyl group, ethyl group, n-propyl group, isopropyl group, n-butyl group, isobutyl group, s-butyl group, and t-butyl group.

Substituted Alkyl Group (Specific Example Group G3B):

a heptafluoropropyl group (including isomer thereof), pentafluoroethyl group, 2,2,2-trifluoroethyl group, and trifluoromethyl group.

Substituted or Unsubstituted Alkenyl Group

Specific examples (specific example group G4) of the "substituted or unsubstituted alkenyl group" mentioned herein include unsubstituted alkenyl groups (specific example group G4A) and substituted alkenyl groups (specific example group G4B). (Herein, an unsubstituted alkenyl group refers to an "unsubstituted alkenyl group" in a "substituted or unsubstituted alkenyl group," and a substituted alkenyl group refers to a "substituted alkenyl group" in a "substituted or unsubstituted alkenyl group.") A simply termed "alkenyl group" herein includes both of "unsubstituted alkenyl group" and "substituted alkenyl group."

The "substituted alkenyl group" refers to a group derived by substituting at least one hydrogen atom in an "unsubstituted alkenyl group" with a substituent. Specific examples of the "substituted alkenyl group" include an "unsubstituted alkenyl group" (specific example group G4A) substituted by a substituent, and examples of the substituted alkenyl group (specific example group G4B) below. It should be noted that the examples of the "unsubstituted alkenyl group" and the "substituted alkenyl group" mentioned herein are merely exemplary, and the "substituted alkenyl group" mentioned herein includes a group derived by substituting a hydrogen atom of a skeleton of the "substituted alkenyl group" in the specific example group G4B with a substituent, and a group derived by substituting a hydrogen atom of a substituent of the "substituted alkenyl group" in the specific example group G4B with a substituent.

Unsubstituted Alkenyl Group (Specific Example Group G4A):

a vinyl group, allyl group, 1-butenyl group, 2-butenyl group, and 3-butenyl group.

Substituted Alkenyl Group (Specific Example Group G4B):

a 1,3-butanedienyl group, 1-methylvinyl group, 1-methylallyl group, 1,1-dimethylallyl group, 2-methylallyl group, and 1,2-dimethylallyl group.

Substituted or Unsubstituted Alkynyl Group

Specific examples (specific example group G5) of the "substituted or unsubstituted alkynyl group" mentioned herein include unsubstituted alkynyl groups (specific example group G5A) below (Herein, an unsubstituted alkynyl group refers to an "unsubstituted alkynyl group" in the "substituted or unsubstituted alkynyl group.") A simply termed "alkynyl group" herein includes both of "unsubstituted alkynyl group" and "substituted alkynyl group."

The "substituted alkynyl group" refers to a group derived by substituting at least one hydrogen atom in an "unsubstituted alkynyl group" with a substituent. Specific examples of the "substituted alkynyl group" include a group derived by substituting at least one hydrogen atom of the "unsubstituted alkynyl group" (specific example group G5A) below with a substituent.

Unsubstituted Alkynyl Group (Specific Example Group G5A): ethynyl group.

Substituted or Unsubstituted Cycloalkyl Group

Specific examples (specific example group G6) of the "substituted or unsubstituted cycloalkyl group" mentioned herein include unsubstituted cycloalkyl groups (specific example group G6A) and substituted cycloalkyl groups (specific example group G6B). (Herein, an unsubstituted cycloalkyl group refers to an "unsubstituted cycloalkyl group" in the "substituted or unsubstituted cycloalkyl group," and a substituted cycloalkyl group refers to the "substituted cycloalkyl group" in a "substituted or unsubstituted cycloalkyl group.") A simply termed "cycloalkyl group" herein includes both of "unsubstituted cycloalkyl group" and "substituted cycloalkyl group."

The "substituted cycloalkyl group" refers to a group derived by substituting at least one hydrogen atom of an "unsubstituted cycloalkyl group" with a substituent. Specific examples of the "substituted cycloalkyl group" include a group derived by substituting at least one hydrogen atom of the "unsubstituted cycloalkyl group" (specific example group G6A) below with a substituent, and examples of the substituted cycloalkyl group (specific example group G6B) below. It should be noted that the examples of the "unsubstituted cycloalkyl group" and the "substituted cycloalkyl group" mentioned herein are merely exemplary, and the "substituted cycloalkyl group" mentioned herein includes a group derived by substituting at least one hydrogen atom bonded to a carbon atom of a skeleton of the "substituted cycloalkyl group" in the specific example group G6B with a substituent, and a group derived by substituting a hydrogen atom of a substituent of the "substituted cycloalkyl group" in the specific example group G6B with a substituent.

Unsubstituted Cycloalkyl Group (Specific Example Group G6A):

a cyclopropyl group, cyclobutyl group, cyclopentyl group, cyclohexyl group, 1-adamantyl group, 2-adamantyl group, 1-norbornyl group, and 2-norbornyl group.

Substituted Cycloalkyl Group (Specific Example Group G6B):

a 4-methylcyclohexyl group.

Group Represented by "—Si($R_{901}$)($R_{902}$)($R_{903}$)"

Specific examples (specific example group G7) of the group represented herein by —Si($R_{901}$)($R_{902}$)($R_{903}$) include:

—Si(G1)(G1)(G1);
—Si(G1)(G2)(G2);
—Si(G1)(G1)(G2);
—Si(G2)(G2)(G2);
—Si(G3)(G3)(G3); and
—Si(G6)(G6)(G6), where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3;

G6 represents a "substituted or unsubstituted cycloalkyl group" in the specific example group G6;

the plurality of G1 in —Si(G1)(G1)(G1) are mutually the same or different;

the plurality of G2 in —Si(G1)(G2)(G2) are mutually the same or different;

the plurality of G1 in —Si(G1)(G1)(G2) are mutually the same or different;

the plurality of G2 in —Si(G2)(G2)(G2) are mutually the same or different;

The plurality of G3 in —Si(G3)(G3)(G3) are mutually the same or different.

the plurality of G6 in —Si(G6)(G6)(G6) are mutually the same or different.

Group Represented by "—O—($R_{904}$)"

Specific examples (specific example group G8) of a group represented by —O—($R_{904}$) herein include:

—O(G1);

—O(G2);

—O(G3); and

—O(G6), where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3;

G6 represents a "substituted or unsubstituted cycloalkyl group" in the specific example group G6.

Group Represented by "—S—($R_{905}$)"

Specific examples (specific example group G9) of a group represented herein by —S—($R_{905}$) include:

—S(G1);

—S(G2);

—S(G3); and

—S(G6), where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3;

G6 represents a "substituted or unsubstituted cycloalkyl group" in the specific example group G6.

Group Represented by "—N($R_{906}$)($R_{907}$)"

Specific examples (specific example group G10) of a group represented herein by —N($R_{906}$)($R_{907}$) include:

—N(G1)(G1);

—N(G2)(G2);

—N(G1)(G2);

—N(G3)(G3); and

—N(G6)(G6), where:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3;

G6 represents a "substituted or unsubstituted cycloalkyl group" in the specific example group G6;

the plurality of G1 in —N(G1)(G1) are mutually the same or different;

the plurality of G2 in —N(G2)(G2) are mutually the same or different;

the plurality of G3 in —N(G3)(G3) are mutually the same or different; and the plurality of G6 in —N(G6)(G6) are mutually the same or different.

Halogen Atom

Specific examples (specific example group G11) of "halogen atom" mentioned herein include a fluorine atom, chlorine atom, bromine atom, and iodine atom.

Substituted or Unsubstituted Fluoroalkyl Group

The "substituted or unsubstituted fluoroalkyl group" mentioned herein refers to a group derived by substituting at least one hydrogen atom of the "substituted or unsubstituted alkyl group" with a fluorine atom, and also includes a group (perfluoro group) derived by substituting all of the hydrogen atoms bonded to a carbon atom(s) of the alkyl group in the "substituted or unsubstituted alkyl group" with fluorine atoms. An "unsubstituted fluoroalkyl group" has, unless otherwise specified herein, 1 to 50, preferably 1 to 30, more preferably 1 to 18 carbon atoms. The "substituted fluoroalkyl group" refers to a group derived by substituting at least one hydrogen atom in a "fluoroalkyl group" with a substituent. It should be noted that the examples of the "substituted fluoroalkyl group" mentioned herein include a group derived by substituting at least one hydrogen atom bonded to a carbon atom of an alkyl chain of a "substituted fluoroalkyl group" with a substituent, and a group derived by substituting at least one hydrogen atom of a substituent of the "substituted fluoroalkyl group" with a substituent. Specific examples of the "substituted fluoroalkyl group" include a group derived by substituting at least one hydrogen atom of the "alkyl group" (specific example group G3) with a fluorine atom.

Substituted or Unsubstituted Haloalkyl Group

The "substituted or unsubstituted haloalkyl group" mentioned herein refers to a group derived by substituting at least one hydrogen atom of the "substituted or unsubstituted alkyl group" with a halogen atom, and also includes a group derived by substituting all of the hydrogen atoms bonded to a carbon atom(s) of the alkyl group in the "substituted or unsubstituted alkyl group" with halogen atoms. An "unsubstituted haloalkyl group" has, unless otherwise specified herein, 1 to 50, preferably 1 to 30, more preferably 1 to 18 carbon atoms. The "substituted haloalkyl group" refers to a group derived by substituting at least one hydrogen atom in a "haloalkyl group" with a substituent. It should be noted that the examples of the "substituted haloalkyl group" mentioned herein include a group derived by substituting at least one hydrogen atom bonded to a carbon atom of an alkyl chain of a "substituted haloalkyl group" with a substituent, and a group derived by substituting at least one hydrogen atom of a substituent of the "substituted haloalkyl group" with a substituent. Specific examples of the "substituted haloalkyl group" include a group derived by substituting at least one hydrogen atom of the "alkyl group" (specific example group G3) with a halogen atom. The haloalkyl group is sometimes referred to as a halogenated alkyl group.

Substituted or Unsubstituted Alkoxy Group

Specific examples of a "substituted or unsubstituted alkoxy group" mentioned herein include a group represented by —O(G3), G3 being the "substituted or unsubstituted alkyl group" in the specific example group G3. An "unsubstituted alkoxy group" has, unless otherwise specified herein, 1 to 50, preferably 1 to 30, more preferably 1 to 18 carbon atoms.

Substituted or Unsubstituted Alkylthio Group

Specific examples of a "substituted or unsubstituted alkylthio group" mentioned herein include a group represented by —S(G3), G3 being the "substituted or unsubstituted alkyl group" in the specific example group G3. An "unsubstituted alkylthio group" has, unless otherwise specified herein, 1 to 50, preferably 1 to 30, more preferably 1 to 18 carbon atoms.

Substituted or Unsubstituted Aryloxy Group

Specific examples of a "substituted or unsubstituted aryloxy group" mentioned herein include a group represented by —O(G1), G1 being the "substituted or unsubstituted aryl group" in the specific example group G1. An "unsubstituted aryloxy group" has, unless otherwise specified herein, 6 to 50, preferably 6 to 30, more preferably 6 to 18 ring carbon atoms.

Substituted or Unsubstituted Arylthio Group

Specific examples of a "substituted or unsubstituted arylthio group" mentioned herein include a group represented by —S(G1), G1 being the "substituted or unsubstituted aryl group" in the specific example group G1. An "unsubstituted arylthio group" has, unless otherwise specified herein, 6 to 50, preferably 6 to 30, more preferably 6 to 18 ring carbon atoms.

Substituted or Unsubstituted Trialkylsilyl Group

Specific examples of a "trialkylsilyl group" mentioned herein include a group represented by —Si(G3)(G3)(G3), G3 being the "substituted or unsubstituted alkyl group" in the specific example group G3. The plurality of G3 in —Si(G3)(G3)(G3) are mutually the same or different. Each of the alkyl groups in the "trialkylsilyl group" has, unless otherwise specified herein, 1 to 50, preferably 1 to 20, more preferably 1 to 6 carbon atoms.

Substituted or Unsubstituted Aralkyl Group

Specific examples of a "substituted or unsubstituted aralkyl group" mentioned herein include a group represented by (G3)-(G1), G3 being the "substituted or unsubstituted alkyl group" in the specific example group G3, G1 being the "substituted or unsubstituted aryl group" in the specific example group G1. Accordingly, the "aralkyl group" is a group derived by substituting a hydrogen atom of the "alkyl group" with a substituent in a form of the "aryl group," which is an example of the "substituted alkyl group." An "unsubstituted aralkyl group," which is an "unsubstituted alkyl group" substituted by an "unsubstituted aryl group," has, unless otherwise specified herein, 7 to 50 carbon atoms, preferably 7 to 30 carbon atoms, more preferably 7 to 18 carbon atoms.

Specific examples of the "substituted or unsubstituted aralkyl group" include a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

Preferable examples of the substituted or unsubstituted aryl group mentioned herein include, unless otherwise specified herein, a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, phenanthryl group, pyrenyl group, chrysenyl group, triphenylenyl group, fluorenyl group, 9,9'-spirobifluorenyl group, 9,9-dimethylfluorenyl group, and 9,9-diphenylfluorenyl group.

Preferable examples of the substituted or unsubstituted heterocyclic group mentioned herein include, unless otherwise specified herein, a pyridyl group, pyrimidinyl group, triazinyl group, quinolyl group, isoquinolyl group, quinazolinyl group, benzimidazolyl group, phenanthrolinyl group, carbazolyl group (1-carbazolyl group, 2-carbazolyl group, 3-carbazolyl group, 4-carbazolyl group, or 9-carbazolyl group), benzocarbazolyl group, azacarbazolyl group, diazacarbazolyl group, dibenzofuranyl group, naphthobenzofuranyl group, azadibenzofuranyl group, diazadibenzofuranyl group, dibenzothiophenyl group, naphthobenzothiophenyl group, azadibenzothiophenyl group, diazadibenzothiophenyl group, (9-phenyl)carbazolyl group ((9-phenyl)carbazole-1-yl group, (9-phenyl)carbazole-2-yl group, (9-phenyl)carbazole-3-yl group, or (9-phenyl)carbazole-4-yl group), (9-biphenylyl)carbazolyl group, (9-phenyl)phenylcarbazolyl group, diphenylcarbazole-9-yl group, phenylcarbazole-9-yl group, phenyltriazinyl group, biphenylyltriazinyl group, diphenyltriazinyl group, phenyldibenzofuranyl group, and phenyldibenzothiophenyl group.

The carbazolyl group mentioned herein is, unless otherwise specified herein, specifically a group represented by one of formulae below.

(TEMP-Cz1)

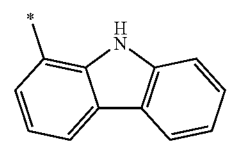

(TEMP-Cz2)

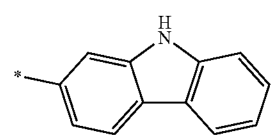

(TEMP-Cz3)

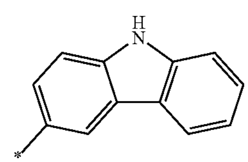

(TEMP-Cz4)

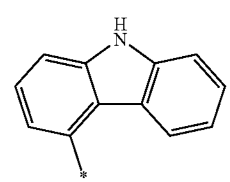

(TEMP-Cz5)

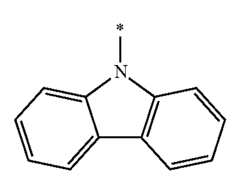

The (9-phenyl)carbazolyl group mentioned herein is, unless otherwise specified herein, specifically a group represented by one of formulae below.

(TEMP-Cz6)

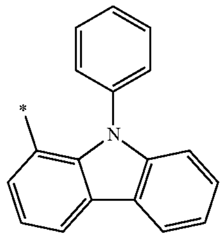

(TEMP-Cz7)

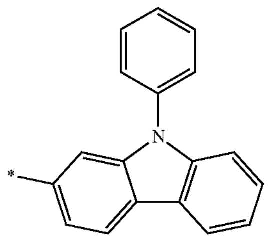

(TEMP-Cz8)

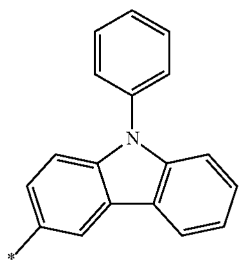

(TEMP-Cz9)

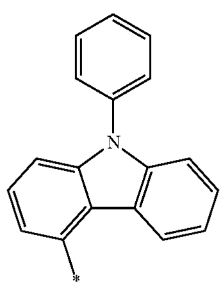

In the formulae (TEMP-Cz1) to (TEMP-Cz9), * represents a bonding position.

The dibenzofuranyl group and dibenzothiophenyl group mentioned herein are, unless otherwise specified herein, each specifically represented by one of formulae below.

(TEMP-34)

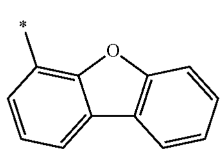

(TEMP-35)

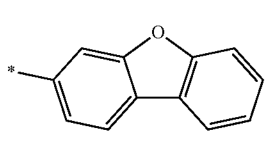

-continued (TEMP-36)

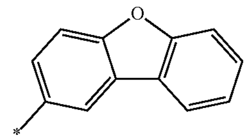

(TEMP-37)

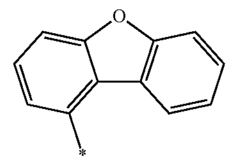

(TEMP-38)

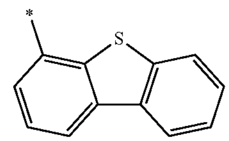

(TEMP-39)

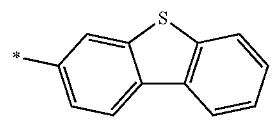

(TEMP-40)

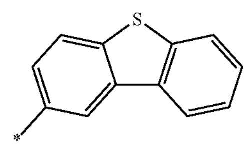

(TEMP-41)

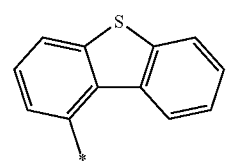

In the formulae (TEMP-34) to (TEMP-41), * represents a bonding position.

Preferable examples of the substituted or unsubstituted alkyl group mentioned herein include, unless otherwise specified herein, a methyl group, ethyl group, propyl group, isopropyl group, n-butyl group, isobutyl group, and t-butyl group.

Substituted or Unsubstituted Arylene Group

The "substituted or unsubstituted arylene group" mentioned herein is, unless otherwise specified herein, a divalent group derived by removing one hydrogen atom on an aryl ring of the "substituted or unsubstituted aryl group." Specific examples of the "substituted or unsubstituted arylene group" (specific example group G12) include a divalent group derived by removing one hydrogen atom on an aryl ring of the "substituted or unsubstituted aryl group" in the specific example group G1.

Substituted or Unsubstituted Divalent Heterocyclic Group

The "substituted or unsubstituted divalent heterocyclic group" mentioned herein is, unless otherwise specified herein, a divalent group derived by removing one hydrogen atom on a heterocycle of the "substituted or unsubstituted heterocyclic group." Specific examples of the "substituted or unsubstituted divalent heterocyclic group" (specific example group G13) include a divalent group derived by removing one hydrogen atom on a heterocyclic ring of the "substituted or unsubstituted heterocyclic group" in the specific example group G2.

Substituted or Unsubstituted Alkylene Group

The "substituted or unsubstituted alkylene group" mentioned herein is, unless otherwise specified herein, a divalent group derived by removing one hydrogen atom on an alkyl chain of the "substituted or unsubstituted alkyl group." Specific examples of the "substituted or unsubstituted alkylene group" (specific example group G14) include a divalent group derived by removing one hydrogen atom on an alkyl chain of the "substituted or unsubstituted alkyl group" in the specific example group G3.

The substituted or unsubstituted arylene group mentioned herein is, unless otherwise specified herein, preferably any one of groups represented by formulae (TEMP-42) to (TEMP-68) below.

(TEMP-42)

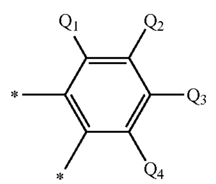

(TEMP-43)

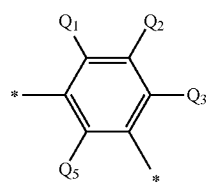

(TEMP-44)

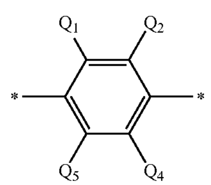

(TEMP-45)

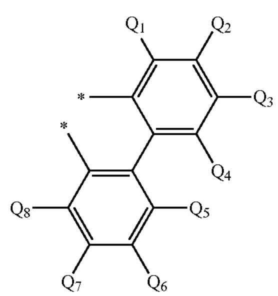

(TEMP-46)

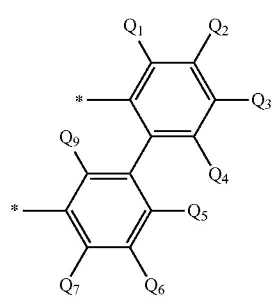

-continued (TEMP-47)

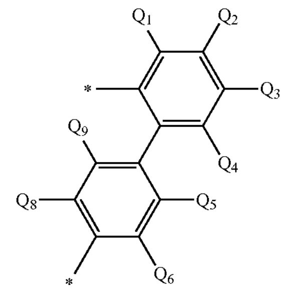

(TEMP-48)

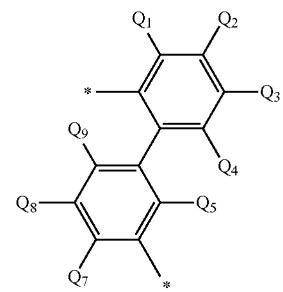

(TEMP-49)

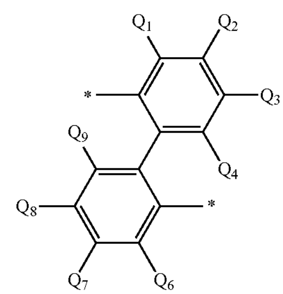

(TEMP-50)

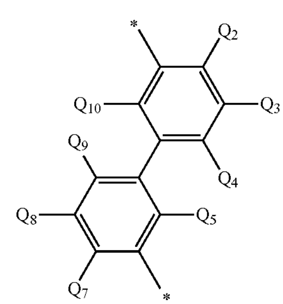

(TEMP-51)

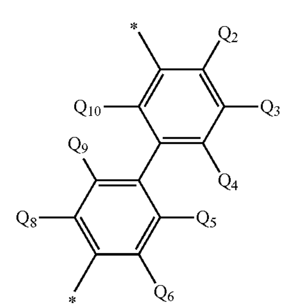

-continued (TEMP-52)

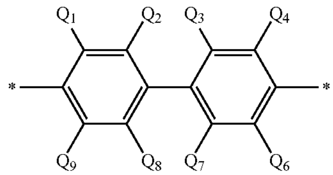

In the formulae (TEMP-42) to (TEMP-52), $Q_1$ to $Q_{10}$ each independently are a hydrogen atom or a substituent.

In the formulae (TEMP-42) to (TEMP-52), * represents a bonding position.

(TEMP-53)

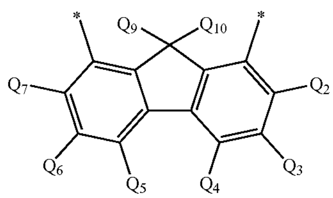

(TEMP-54)

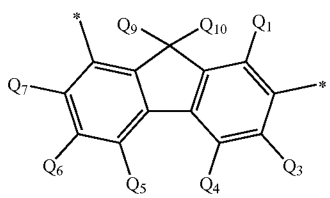

(TEMP-55)

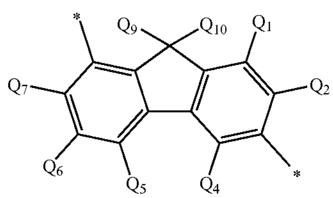

(TEMP-56)

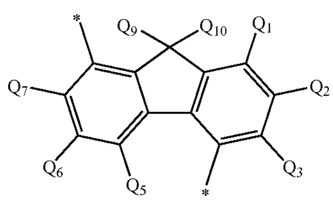

(TEMP-57)

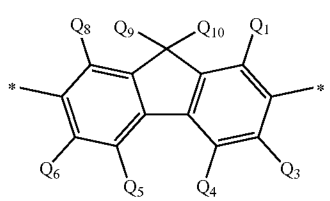

(TEMP-58)

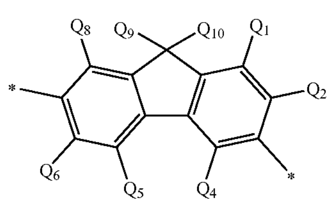

-continued (TEMP-59)

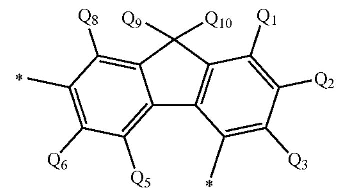

(TEMP-60)

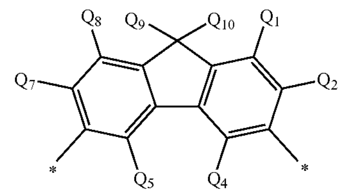

(TEMP-61)

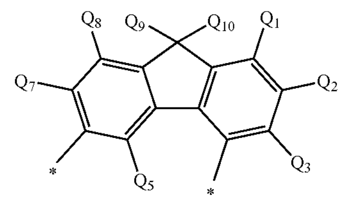

(TEMP-62)

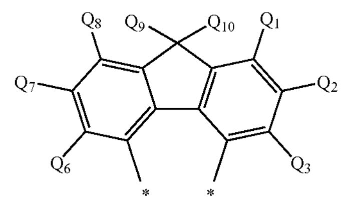

In the formulae (TEMP-53) to (TEMP-62), $Q_1$ to $Q_{10}$ each independently are a hydrogen atom or a substituent In the formulae, $Q_9$ and $Q_{10}$ may be mutually bonded through a single bond to form a ring.

In the formulae (TEMP-53) to (TEMP-62), * represents a bonding position.

(TEWP-63)

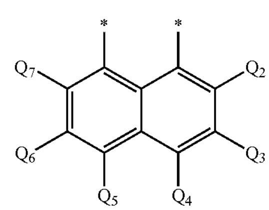

(TEMP-64)

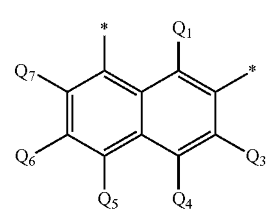

-continued (TEMP-65)

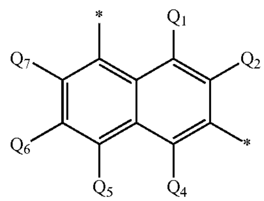

(TEMP-66)

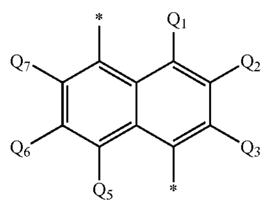

(TEMP-67)

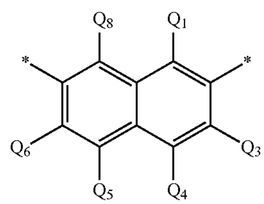

(TEMP-68)

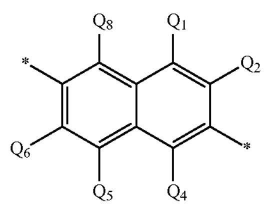

In the formulae (TEMP-63) to (TEMP-68), $Q_1$ to $Q_8$ each independently are a hydrogen atom or a substituent.

In the formulae (TEMP-63) to (TEMP-68), * represents a bonding position.

The substituted or unsubstituted divalent heterocyclic group mentioned herein is, unless otherwise specified herein, preferably a group represented by any one of formulae (TEMP-69) to (TEMP-102) below.

(TEMP-69)

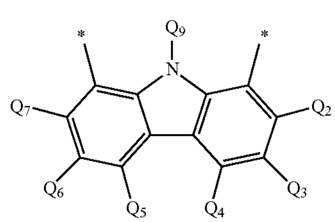

(TEMP-70)

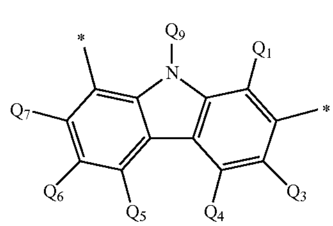

-continued (TEMP-71)

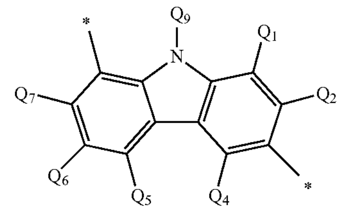

(TEMP-72)

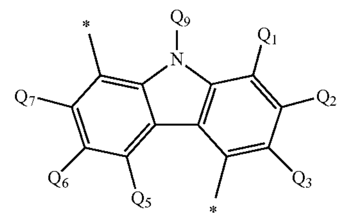

(TEMP-73)

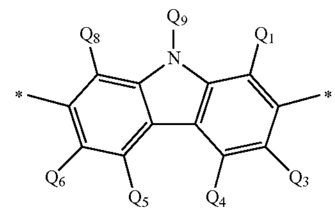

(TEMP-74)

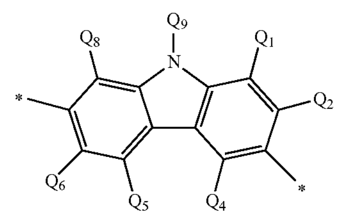

(TEMP-75)

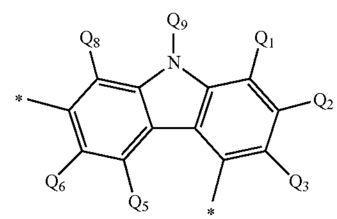

(TEMP-76)

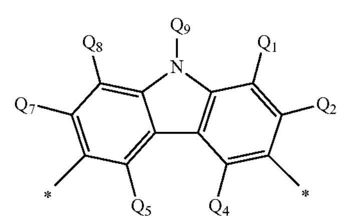

(TEMP-77)

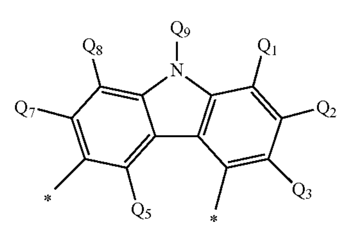

-continued
(TEMP-78)
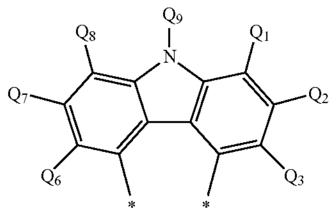
(TEMP-79)
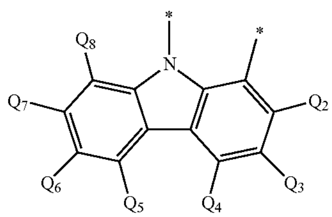
(TEMP-80)
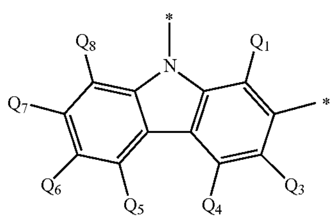
(TEMP-81)
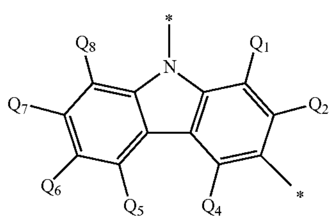
(TEMP-82)
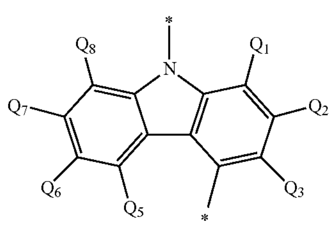
In the formulae (TEMP-69) to (TEMP-82), $Q_1$ to $Q_9$ each independently are a hydrogen atom or a substituent.
(TEMP-83)
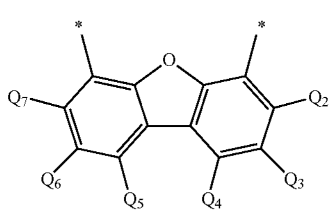
-continued
(TEMP-84)
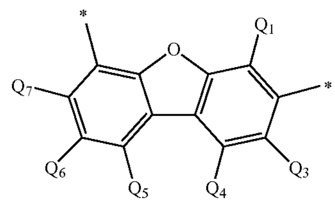
(TEMP-85)
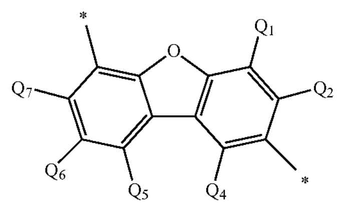
(TEMP-86)
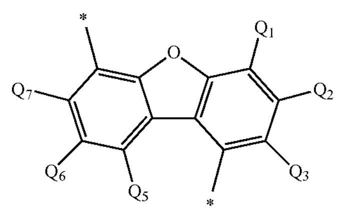
(TEMP-87)
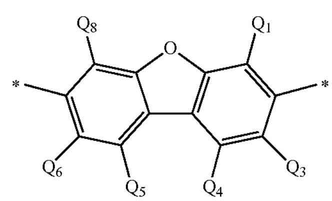
(TEMP-88)
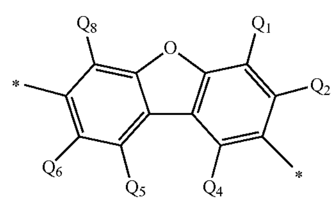
(TEMP-89)
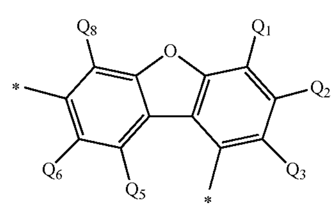
(TEMP-90)
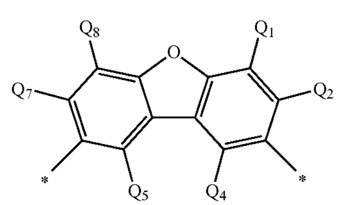

-continued (TEMP-91)

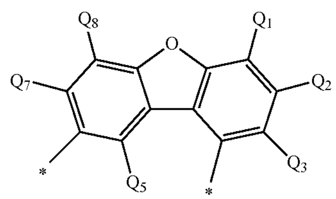

(TEMP-92)

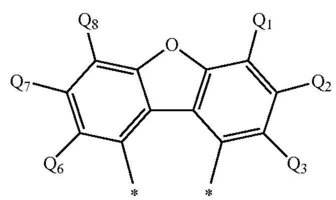

(TEMP-93

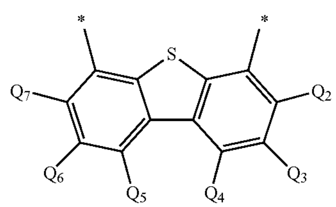

(TEMP-94)

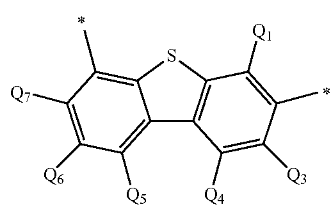

(TEMP-95)

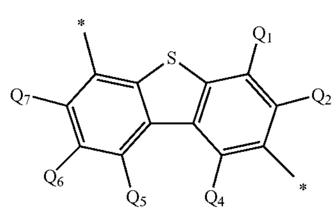

(TEMP-96)

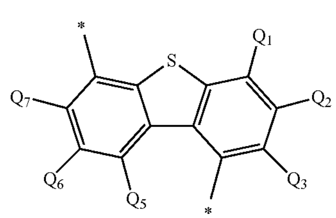

(TEMP-97)

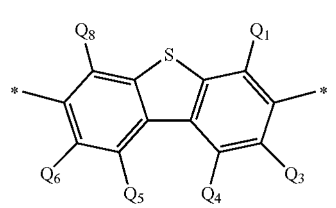

-continued (TEMP-98)

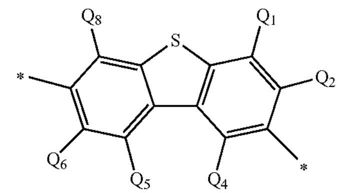

(TEMP-99)

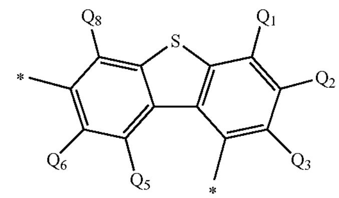

(TEMP-100)

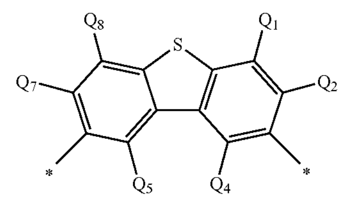

(TEMP-101)

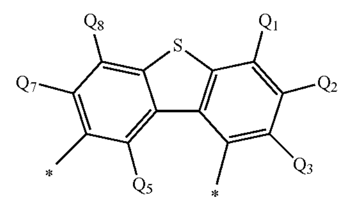

(TEMP-102)

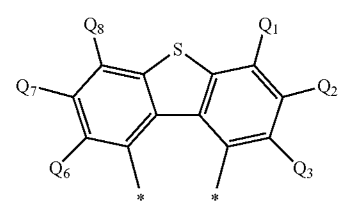

In the formulae (TEMP-83) to (TEMP-102), $Q_1$ to $Q_8$ each independently are a hydrogen atom or a substituent.

The substituent mentioned herein has been described above. Instance "Bonded to Form a Ring"

Instances where "at least one combination of adjacent two or more (of . . . ) are mutually bonded to form a substituted or unsubstituted monocyclic ring, mutually bonded to form a substituted or unsubstituted fused ring, or not mutually bonded" mentioned herein refer to instances where "at least one combination of adjacent two or more (of . . . ) are mutually bonded to form a substituted or unsubstituted monocyclic ring, "at least one combination of adjacent two or more (of . . . ) are mutually bonded to form a substituted or unsubstituted fused ring," and "at least one combination of adjacent two or more (of . . . ) are not mutually bonded."

Instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (these instances will be sometimes collectively referred to as an instance "bonded to form a ring" hereinafter) will be described below. An anthracene compound having a basic skeleton in a form of an anthracene ring and represented by a formula (TEMP-103) below will be used as an example for the description.

(TEMP-103)

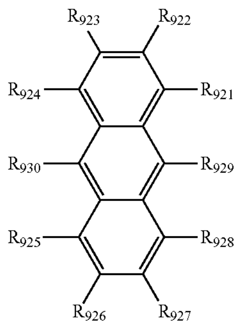

For instance, when "at least one combination of adjacent two or more of" $R_{921}$ to $R_{930}$ " are mutually bonded to form a ring," the pair of adjacent ones of $R_{921}$ to $R_{930}$ (i.e. the combination at issue) is a pair of $R_{921}$ and a pair of $R_{922}$, $R_{922}$ and $R_{923}$, a pair of $R_{923}$ and $R_{924}$, a pair of $R_{924}$ and $R_{930}$, a pair of $R_{930}$ and $R_{925}$, a pair of $R_{925}$ and $R_{926}$, a pair of $R_{926}$ and $R_{927}$, a pair of $R_{927}$ and $R_{928}$, a pair of $R_{928}$ and $R_{929}$, or a pair of $R_{929}$ and $R_{921}$.

The term "at least one combination" means that two or more of the above combinations of adjacent two or more of $R_{921}$ to $R_{930}$ may simultaneously form rings. For instance, when $R_{921}$ and $R_{922}$ are mutually bonded to form a ring $Q_A$ and $R_{925}$ and $R_{926}$ are simultaneously mutually bonded to form a ring $Q_B$, the anthracene compound represented by the formula (TEMP-103) is represented by a formula (TEMP-104) below.

(TEMP-104)

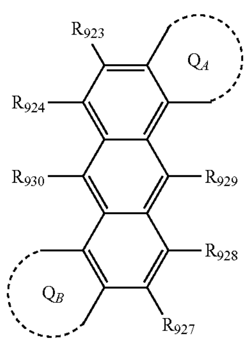

The instance where the "combination of adjacent two or more" form a ring means not only an instance where the "two" adjacent components are bonded but also an instance where adjacent "three or more" are bonded. For instance, $R_{921}$ and $R_{922}$ are mutually bonded to form a ring $Q_A$ and $R_{922}$, $R_{923}$ are mutually bonded to form a ring Qc, and mutually adjacent three components ($R_{921}$, $R_{922}$ and $R_{923}$) are mutually bonded to form a ring fused to the anthracene basic skeleton. In this case, the anthracene compound represented by the formula (TEMP-103) is represented by a formula (TEMP-105) below. In the formula (TEMP-105) below, the ring $Q_A$ and the ring Qc share $R_{922}$.

(TEMP-105)

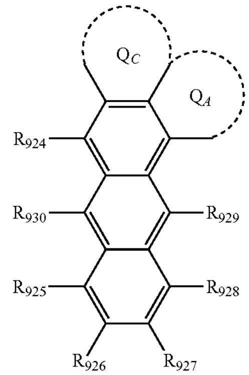

The formed "monocyclic ring" or "fused ring" may be, in terms of the formed ring in itself, a saturated ring or an unsaturated ring. When the "combination of adjacent two" form a "monocyclic ring" or a "fused ring," the "monocyclic ring" or "fused ring" may be a saturated ring or an unsaturated ring. For instance, the ring $Q_A$ and the ring $Q_B$ formed in the formula (TEMP-104) are each independently a "monocyclic ring" or a "fused ring." Further, the ring $Q_A$ and the ring Qc formed in the formula (TEMP-105) are each a "fused ring." The ring $Q_A$ and the ring Qc in the formula (TEMP-105) are fused to form a fused ring. When the ring $Q_A$ in the formula (TMEP-104) is a benzene ring, the ring $Q_A$ is a monocyclic ring. When the ring $Q_A$ in the formula (TMEP-104) is a naphthalene ring, the ring $Q_A$ is a fused ring.

The "unsaturated ring" represents an aromatic hydrocarbon ring or an aromatic heterocycle. The "saturated ring" represents an aliphatic hydrocarbon ring or a non-aromatic heterocycle.

Specific examples of the aromatic hydrocarbon ring include a ring formed by terminating a bond of a group in the specific example of the specific example group G1 with a hydrogen atom.

Specific examples of the aromatic heterocycle include a ring formed by terminating a bond of an aromatic heterocyclic group in the specific example of the specific example group G2 with a hydrogen atom.

Specific examples of the aliphatic hydrocarbon ring include a ring formed by terminating a bond of a group in the specific example of the specific example group G6 with a hydrogen atom.

The phrase "to form a ring" herein means that a ring is formed only by a plurality of atoms of a basic skeleton, or by a combination of a plurality of atoms of the basic skeleton and one or more optional atoms. For instance, the ring $Q_A$ formed by mutually bonding $R_{921}$ and $R_{922}$ shown in the formula (TEMP-104) is a ring formed by a carbon atom of the anthracene skeleton bonded with $R_{921}$, a carbon atom of the anthracene skeleton bonded with $R_{922}$, and one or more optional atoms. Specifically, when the ring $Q_A$ is a monocyclic unsaturated ring formed by $R_{921}$ and $R_{922}$, the ring formed by a carbon atom of the anthracene skeleton bonded with $R_{921}$, a carbon atom of the anthracene skeleton bonded with $R_{922}$, and four carbon atoms is a benzene ring.

The "optional atom" is, unless otherwise specified herein, preferably at least one atom selected from the group consisting of a carbon atom, nitrogen atom, oxygen atom, and sulfur atom. A bond of the optional atom (e.g. a carbon atom and a nitrogen atom) not forming a ring may be terminated by a hydrogen atom or the like or may be substituted by an "optional substituent" described later. When the ring includes an optional element other than carbon atom, the resultant ring is a heterocycle.

The number of "one or more optional atoms" forming the monocyclic ring or fused ring is, unless otherwise specified herein, preferably in a range from 2 to 15, more preferably in a range from 3 to 12, further preferably in a range from 3 to 5.

Unless otherwise specified herein, the ring, which may be a "monocyclic ring" or "fused ring," is preferably a "monocyclic ring."

Unless otherwise specified herein, the ring, which may be a "saturated ring" or "unsaturated ring," is preferably an "unsaturated ring."

Unless otherwise specified herein, the "monocyclic ring" is preferably a benzene ring.

Unless otherwise specified herein, the "unsaturated ring" is preferably a benzene ring.

When "at least one combination of adjacent two or more" (of . . . ) are "mutually bonded to form a substituted or unsubstituted monocyclic ring" or "mutually bonded to form a substituted or unsubstituted fused ring," unless otherwise specified herein, at least one combination of adjacent two or more of components are preferably mutually bonded to form a substituted or unsubstituted "unsaturated ring" formed of a plurality of atoms of the basic skeleton, and 1 to 15 atoms of at least one element selected from the group consisting of carbon, nitrogen, oxygen and sulfur.

When the "monocyclic ring" or the "fused ring" has a substituent, the substituent is the substituent described in later-described "optional substituent." When the "monocyclic ring" or the "fused ring" has a substituent, specific examples of the substituent are the substituents described in the above under the subtitle "Substituent Mentioned Herein."

When the "saturated ring" or the "unsaturated ring" has a substituent, the substituent is the substituent described in later-described "optional substituent." When the "monocyclic ring" or the "fused ring" has a substituent, specific examples of the substituent are the substituents described in the above under the subtitle "Substituent Mentioned Herein."

The above is the description for the instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (sometimes referred to as an instance "bonded to form a ring".

Substituent Meant by "Substituted or Unsubstituted"

In an exemplary embodiment herein, the substituent meant by the phrase "substituted or unsubstituted" (sometimes referred to as an "optional substituent" hereinafter) is, for instance, a group selected from the group consisting of an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901}$)($R_{902}$)($R_{903}$), —O—($R_{904}$), —S—($R_{905}$), —N($R_{906}$)($R_{907}$), a halogen atom, a cyano group, a nitro group, an unsubstituted aryl group having 6 to 50 ring carbon atoms, and an unsubstituted heterocyclic group having 5 to 50 ring atoms; $R_{901}$ to $R_{907}$ each independently are a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when two or more $R_{901}$ are present, the two or more $R_{901}$ are mutually the same or different;

when two or more $R_{902}$ are present, the two or more $R_{902}$ are mutually the same or different;

when two or more $R_{903}$ are present, the two or more $R_{903}$ are mutually the same or different;

when two or more $R_{904}$ are present, the two or more $R_{904}$ are mutually the same or different;

when two or more $R_{905}$ are present, the two or more $R_{905}$ are mutually the same or different;

When two or more $R_{906}$ are present, the two or more $R_{903}$ are mutually the same or different; and When two or more $R_{907}$ are present, the two or more $R_{907}$ are mutually the same or different.

In an exemplary embodiment, the substituent meant by "substituted or unsubstituted" is selected from the group consisting of an alkyl group having 1 to 50 carbon atoms, an aryl group having 6 to 50 ring carbon atoms, and a heterocyclic group having 5 to 50 ring atoms.

In an exemplary embodiment, the substituent meant by "substituted or unsubstituted" is selected from the group consisting of an alkyl group having 1 to 18 carbon atoms, an aryl group having 6 to 18 ring carbon atoms, and a heterocyclic group having 5 to 18 ring atoms.

Specific examples of the above optional substituent are the same as the specific examples of the substituent described in the above under the subtitle "Substituent Mentioned Herein."

Unless otherwise specified herein, adjacent ones of the optional substituents may form a "saturated ring" or an "unsaturated ring," preferably a substituted or unsubstituted saturated five-membered ring, a substituted or unsubstituted saturated six-membered ring, a substituted or unsubstituted saturated five-membered ring, or a substituted or unsubstituted unsaturated six-membered ring, more preferably a benzene ring.

Unless otherwise specified herein, the optional substituent may further include a substituent. Examples of the substituent for the optional substituent are the same as the examples of the optional substituent.

Herein, numerical ranges represented by "AA to BB" represents a range whose lower limit is the value (AA) recited before "to" and whose upper limit is the value (BB) recited after "to."

First Exemplary Embodiment

An organic EL device according to a first exemplary embodiment is a tandem organic EL device including two emitting units. The organic EL device of the exemplary embodiment has an exemplary arrangement as follows.

anode/first emitting unit/first charge generating layer/second emitting unit/cathode The first emitting unit, the second emitting unit and the first charge generating layer each include an organic layer. The organic layer includes a plurality of layers formed of an organic compound(s). The organic layer may further contain an inorganic compound.

In the exemplary embodiment, a tandem organic EL device 10 shown in FIG. 1 is described as an example. The organic EL device 10 includes an anode 12, first emitting unit 13, first charge generating layer 14, second emitting unit 15, and cathode 19, which are laminated on a substrate 11 in this order.

A detailed arrangement of the first emitting unit 13 and the second emitting unit 15 is as follows:

the first emitting unit 13: a first hole transporting zone 131 (thickness $d_1$), a first emitting layer 132, and a first electron transporting zone 133; and the second emitting unit 15: a second hole transporting zone 151 (thickness $d_2$), a second emitting layer 152, and a second electron transporting zone 153.

Examples of the first hole transporting zone 131 include at least one layer selected from the group consisting of a hole injecting layer, a hole transporting layer, and an electron blocking layer. The same applies to the second hole transporting zone 151.

Examples of the first electron transporting zone 133 include at least one layer selected from the group consisting of an electron injecting layer, an electron transporting layer, and a hole blocking layer. The same applies to the second electron transporting zone 153.

In the exemplary embodiment, the first emitting layer 132 contains the compound represented by the formula (1). The thickness $d_1$ of the first hole transporting zone 131 of the first emitting unit 13 is 60 nm or less.

It is preferable that the first hole transporting zone 131 is in contact with the first emitting layer 132 and the anode 12. It is also preferable that the second hole transporting zone 151 is in contact with the second emitting layer 152 and the first charge generating layer 14.

An anthracene derivative substituted by two substituents (in the formula (1), $-L_{11}-Ar_{11}$, and $-L_{12}-Ar_{12}$) (hereinafter sometimes referred to as a "disubstituted anthracene derivative"), and an anthracene derivative substituted by three substituents (in the formula (1), $-L_{11}-Ar_{11}$, $-L_{12}-Ar_{12}$, and $-L_{13}-Ar_{13}$) (hereinafter sometimes referred to as a "trisubstituted anthracene derivative") are known as typical host materials. Since the trisubstituted anthracene derivative typically has a higher electron mobility than the disubstituted anthracene derivative, it has been necessary to adjust an overall carrier balance by selecting a compound to be contained in neighboring layers (e.g., a hole transporting layer and electron transporting layer) of the emitting layers in the case where the trisubstituted anthracene derivative is contained in the emitting layers.

The inventors have found that a lifetime and drive voltage of a tandem organic EL device can be improved by containing the compound represented by the formula (1) (i.e., an anthracene derivative substituted by at least three substituents) in the first emitting layer as a host material and setting a thickness of the first hole transporting zone of the first emitting unit to be as thin as 60 nm or less.

According to the exemplary embodiment, it is considered that holes and electrons are injected from the neighboring layers of the first emitting layer to the first emitting layer in good balance by combining the first emitting layer containing the compound represented by the formula (1) whose electron mobility is higher than that of the disubstituted anthracene derivative as a host material with the first hole transporting zone whose thickness is set to be 60 nm or less. Consequently, it is considered that an energy transfer occurs effectively from the host material to a dopant material, resulting in the improvement in the lifetime and voltage.

Accordingly, according to the exemplary embodiment, an organic EL device and emitting light with a long lifetime at a low voltage can be achieved.

Effects of emitting light with a long lifetime at a low voltage are herein referred to as "effects of the exemplary embodiment."

In FIG. 1, the first emitting unit 13 and the second emitting unit 15 include the first electron transporting zone 133 and the second electron transporting zone 153, respectively, but may not include the first electron transporting zone 133 and the second electron transporting zone 153. However, in order to further express the effects of the exemplary embodiment, it is preferable that the first emitting unit 13 and the second emitting unit 15 include the first electron transporting zone 133 and the second electron transporting zone 153, respectively.

The hole transporting zone means a region in which holes transfer. A hole mobility pH in the hole transporting zone is preferably $10^{-6}$ cm$^2$/[V·s] or more. The hole transporting zone may be provided by a single layer or a plurality of layers. The hole mobility $\mu^H$ [cm$^2$/[V·s]] can be measured according to impedance spectroscopy disclosed in JP 2014-110348 A.

The electron transporting zone means a region in which electrons transfer. The electron mobility $\mu^E$ in the electron transporting zone is preferably $10^{-6}$ cm$^2$/[V·s] or more. The electron transporting zone may be provided by a single layer or a plurality of layers. The electron mobility $\mu^E$ [cm$^2$/[V·s] can be measured according to impedance spectroscopy disclosed in JP 2014-110348 A.

The charge generating layer means a layer in which holes and electrons are generated when a voltage is applied.

In FIG. 1, for instance, when the first charge generating layer 14 includes a plurality of layers, it is preferable that the first charge generating layer 14 includes: an N layer disposed closer to the anode 12 and configured to inject electrons into the first emitting unit 13; and a P layer disposed closer to the cathode 19 and configured to inject holes into the second emitting unit 15.

In the organic EL device 10 of the exemplary embodiment, one of the anode 12 and the cathode 19 is a reflective electrode. In other words, the organic EL device 10 may be a bottom emission organic EL device in which the cathode 19 is a reflective electrode and light is extracted from the anode 12, or a top emission organic EL device in which the anode 12 is a reflective electrode and light is extracted from the cathode 19.

First Emitting Unit

First Emitting Layer

The first emitting layer 132 contains the compound represented by the formula (1). The compound represented by the formula (1) is preferably a host material (sometimes referred to as a matrix material). One of the host material may be used alone or two or more thereof may be used in combination.

Compound Represented by Formula (1)

(1)

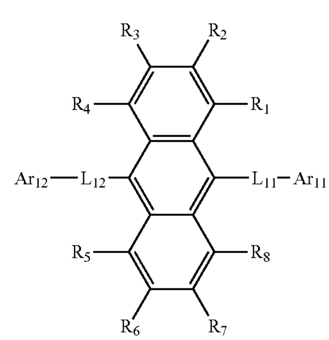

In the formula (1), at least one of $R_1$ to $R_8$ is $-L_{13}-Ar_{13}$, $L_{11}$ to $L_{13}$ are each independently a single bond, a substituted or unsubstituted arylene group having 6 to 50 ring carbon atoms, or a substituted or unsubstituted divalent heterocyclic group having 5 to 50 ring atoms;

when a plurality of $L_{13}$ are present, the plurality of $L_{13}$ are mutually the same or different;

$Ar_{11}$ to $Ar_{13}$ are each independently a substituted or unsubstituted aryl group having 6 to 50 ring carbon atoms, or a substituted or unsubstituted heterocyclic group having 5 to 50 ring atoms;

when a plurality of $Ar_{13}$ are present, the plurality of $Ar_{13}$ are mutually the same or different;

$R_1$ to $R_8$ not being $-L_{13}-Ar_{13}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$, $R_{902}$, $R_{903}$, $R_{904}$, $R_{905}$, $R_{906}$, and $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{905}$ are mutually the same or different; and when a plurality of $R_{907}$ are present, the plurality of $R_{907}$ are mutually the same or different.

In $R_1$ to $R_8$ not being $-L_{13}-Ar_{13}$, it is preferable that the combination of $R_1$ and $R_2$, the combination of $R_2$ and $R_3$, the combination of $R_3$ and $R_4$, the combination of $R_5$ and $R_6$, the combination of $R_6$ and $R_7$, and the combination of $R_7$ and $R_8$ are not mutually bonded to form a ring.

In the formula (1), it is preferable that $L_{11}$ to $L_{13}$ are each independently a single bond or a substituted or unsubstituted arylene group having 6 to 50 ring carbon atoms.

In the formula (1), it is preferable that $L_{11}$ to $L_{13}$ are each independently a single bond, a substituted or unsubstituted phenylene group, a substituted or unsubstituted biphenylene group, a substituted or unsubstituted terphenylene group, a substituted or unsubstituted quarter-phenylene group, or a substituted or unsubstituted naphthylene group.

In the formula (1), it is preferable that $Ar_{11}$ to $Ar_{13}$ are each independently a substituted or unsubstituted aryl group having 6 to 30 ring carbon atoms.

In the formula (1), it is preferable that $Ar_{11}$ to $Ar_{13}$ are each independently a substituted or unsubstituted phenyl group, a substituted or unsubstituted naphthyl group, a substituted or unsubstituted fluorenyl group, a substituted or unsubstituted 9,9'-spirobifluorenyl group, a substituted or unsubstituted benzofluorenyl group, a substituted or unsubstituted phenanthryl group, or a substituted or unsubstituted benzophenanthryl group.

In the formula (1), it is preferable that at least one of $Ar_{11}$ to $Ar_{13}$ are each independently a substituted or unsubstituted heterocyclic group having 5 to 30 ring atoms.

In the formula (1), it is preferable that a group represented by $-L_{13}-Ar_{13}$ is each independently a substituted or unsubstituted phenyl group, a substituted or unsubstituted naphthyl group, a substituted or unsubstituted biphenyl group, a substituted or unsubstituted phenanthrenyl group, a substituted or unsubstituted benzophenanthrenyl group, a substituted or unsubstituted fluorenyl group, a substituted or unsubstituted benzofluorenyl group, a substituted or unsubstituted dibenzofuranyl group, a substituted or unsubstituted naphthobenzofuranyl group, a substituted or unsubstituted dibenzothiophenyl group, or a substituted or unsubstituted carbazolyl group.

In the formula (1), $R_1$ to $R_8$ not being $-L_{13}-Ar_{13}$ are each preferably a hydrogen atom.

In the formula (1), one of $L_{11}$ and $L_{12}$ is preferably a single bond.

The compound represented by the formula (1) is preferably a compound represented by a formula (1-1) below.

(1-1)

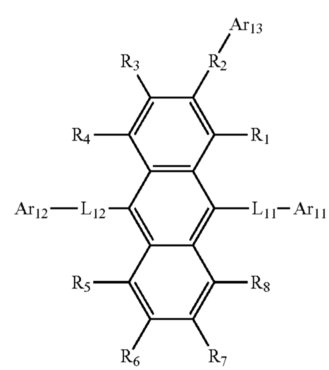

$L_{11}$ to $L_{13}$, $Ar_{11}$ to $Ar_{13}$, $R_1$, $R_3$, $R_4$, and $R_5$ to $R_8$ in the formula (1-1) each independently represent the same as $L_{11}$ to $L_{13}$, $Ar_{11}$ to $Ar_{13}$, $R_1$, $R_3$, $R_4$, and $R_5$ to $R_8$ in the formula (1).

However, $R_1$, $R_3$, $R_4$, and $R_5$ to $R_8$ are not $-L_{13}-Ar_{13}$.

The compound represented by the formula (1) is preferably a compound represented by a formula (1-1H) below.

(1-1H)

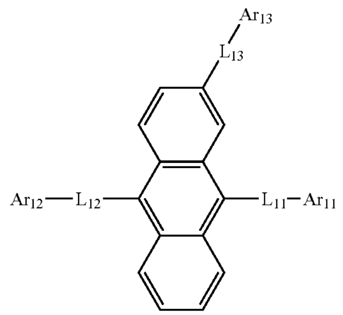

$L_{11}$ to $L_{13}$ and $Ar_{11}$ to $Ar_{13}$ in the formula (1-1H) each independently represent the same as $L_{11}$ to $L_{13}$ and $Ar_{11}$ to $Ar_{13}$ in the formula (1).

The compound represented by the formula (1) is preferably a compound represented by a formula (1-2) below, a compound represented by a formula (1-3) below, or a compound represented by a formula (1-4) below.

(1-2)

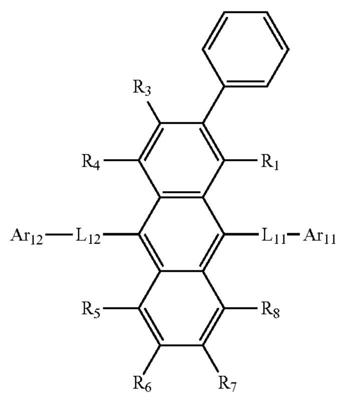

(1-3)

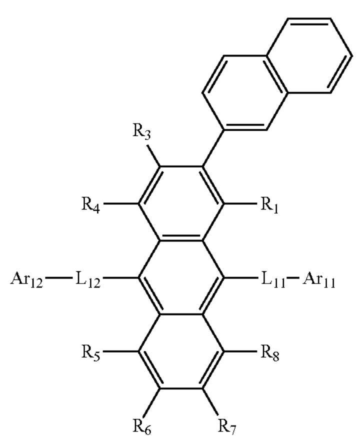

-continued (1-4)

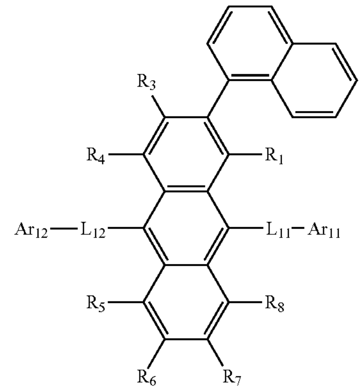

$L_{11}$, $L_{12}$, $Ar_{11}$, $Ar_{12}$, $R_1$, $R_3$, $R_4$, and $R_5$ to $R_8$ in the formulae (1-2) to (1-4) each independently represent the same as $L_{11}$, $L_{12}$, $Ar_{11}$, $Ar_{12}$, $R_1$, $R_3$, $R_4$, and $R_5$ to $R_8$ in the formula (1).

However, $R_1$, $R_3$, $R_4$, and $R_5$ to $R_8$ are not -$L_{13}$-$Ar_{13}$.

Manufacturing Method of Compound Represented by Formula (1) The compound represented by the formula (1) can be manufactured by a known method.

Specific examples of the compound represented by the formula (1) are shown below. It should be noted that the compound represented by the formula (1) in the invention is not limited to these specific examples.

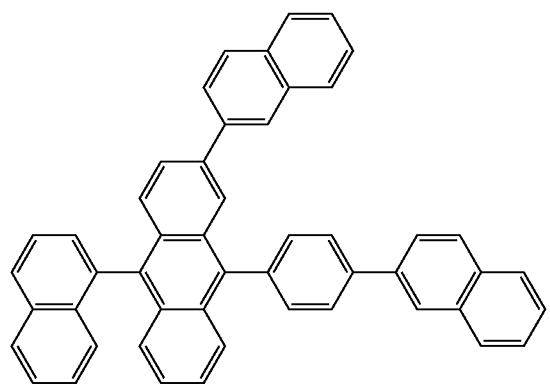

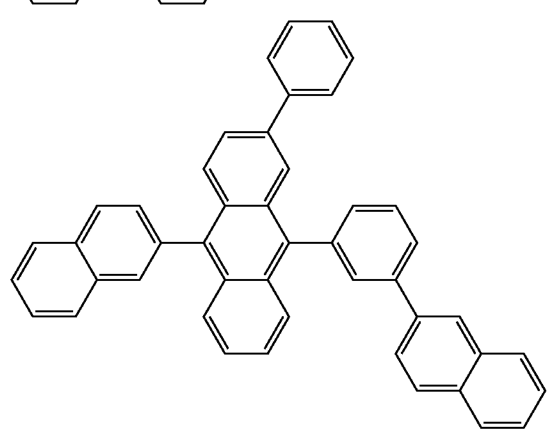

-continued
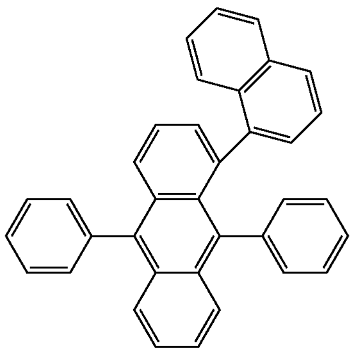
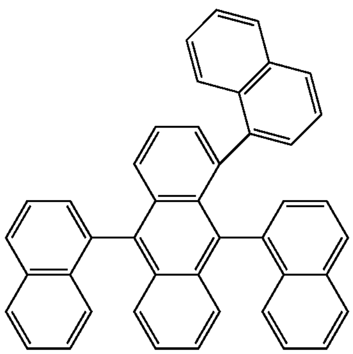
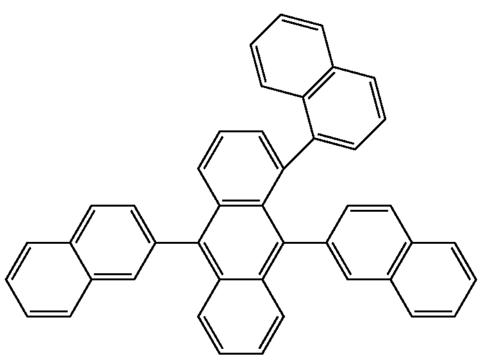
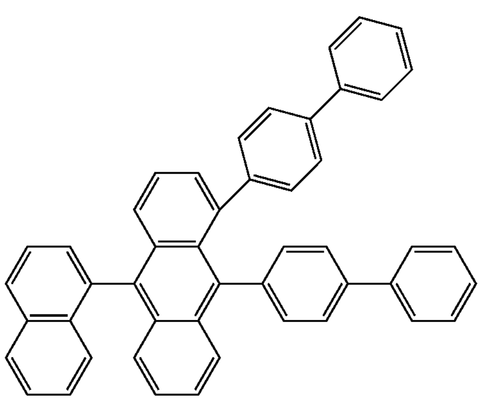
-continued
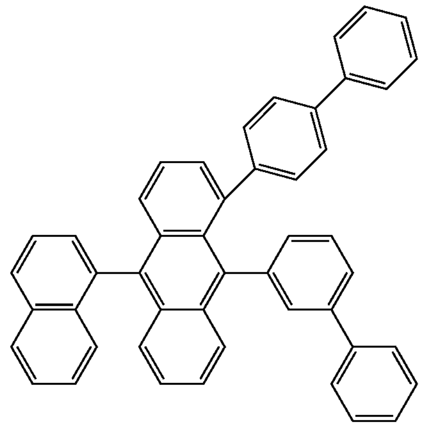
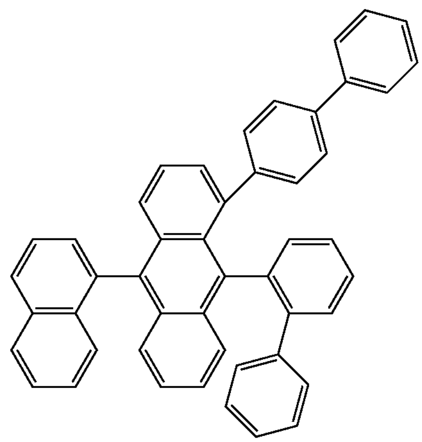
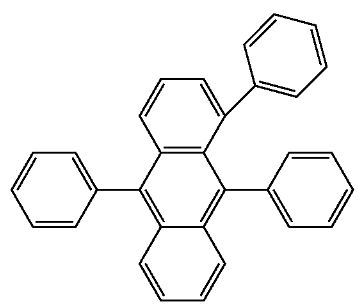
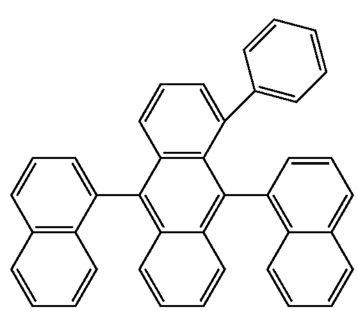

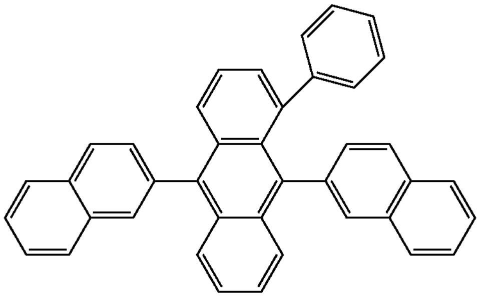
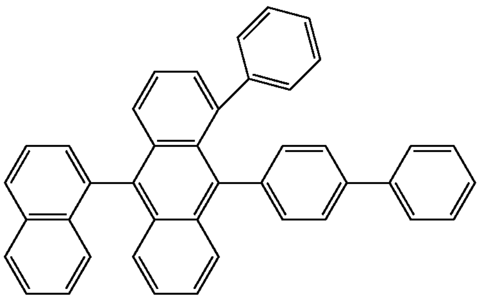
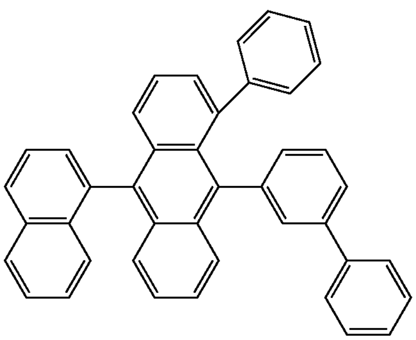
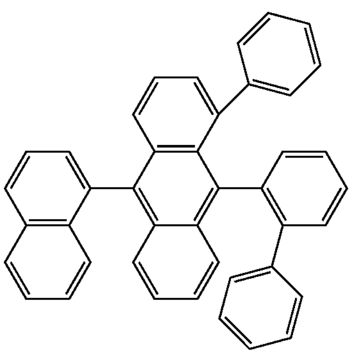
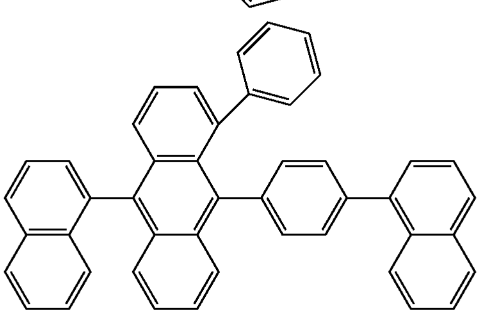
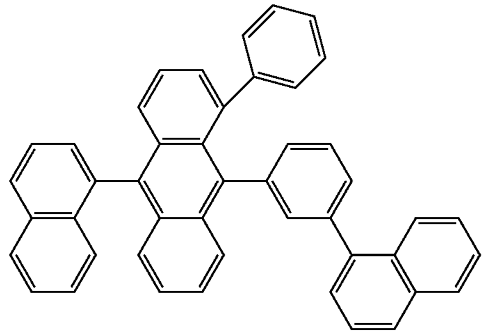
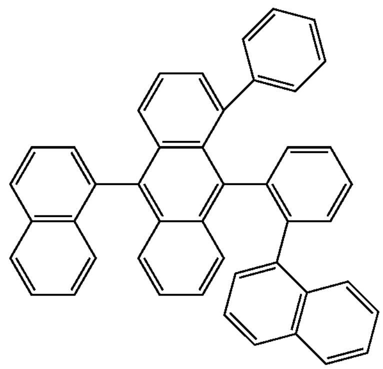
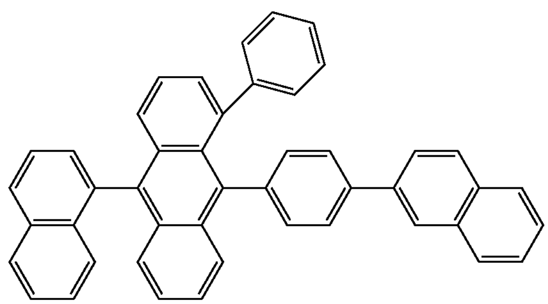
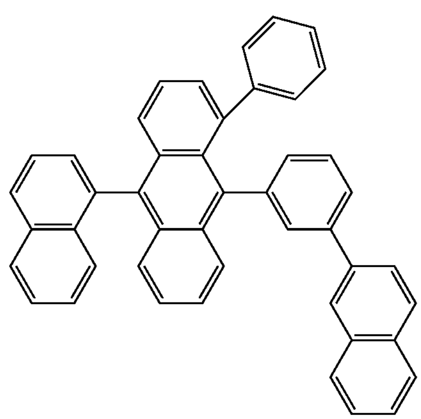

-continued
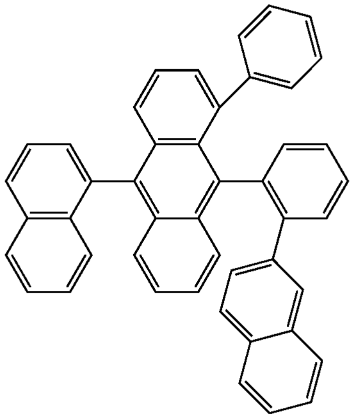
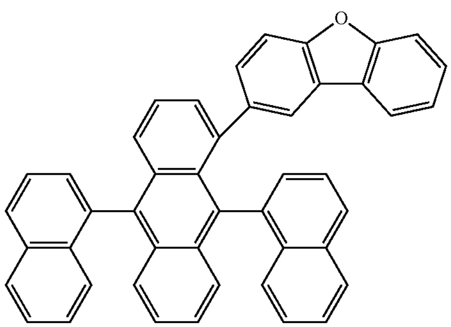
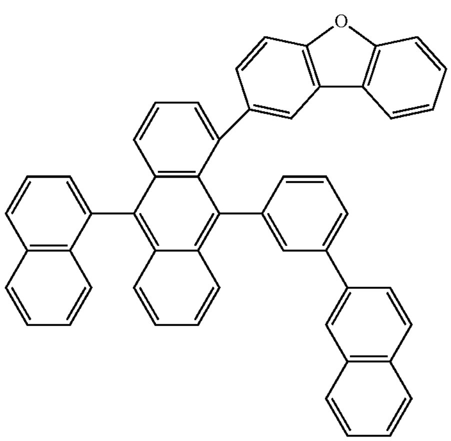
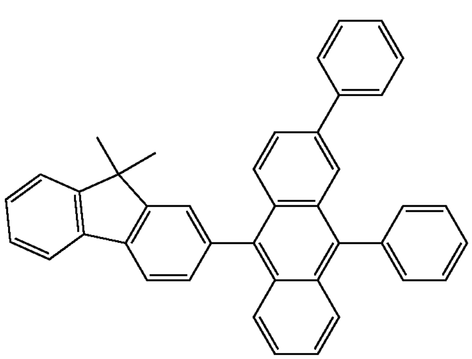
-continued
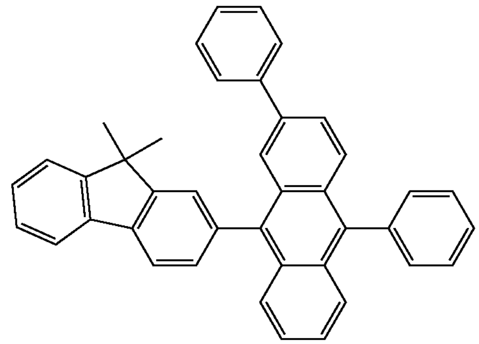
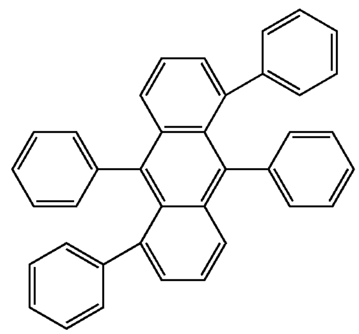
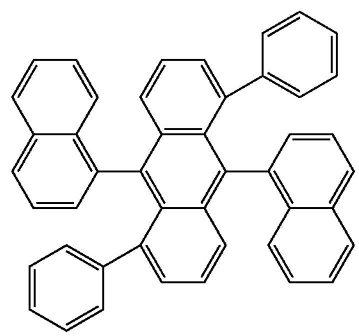
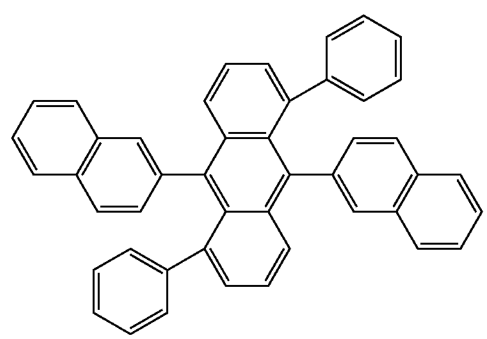
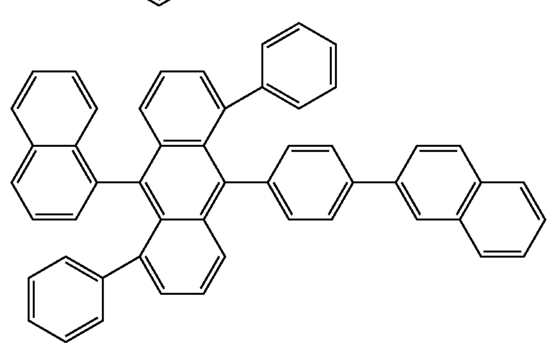

-continued
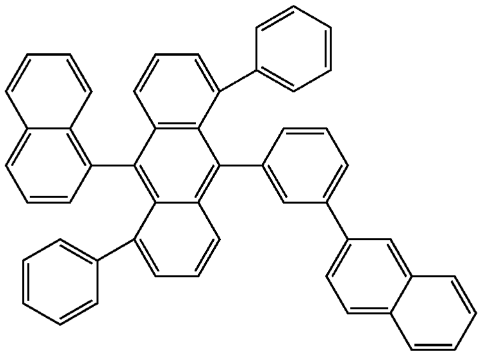
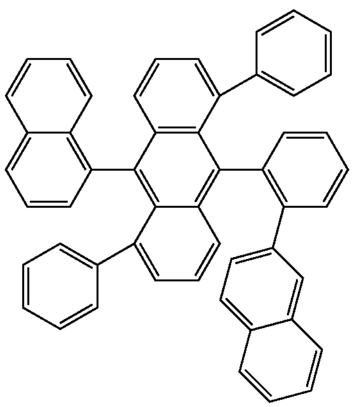
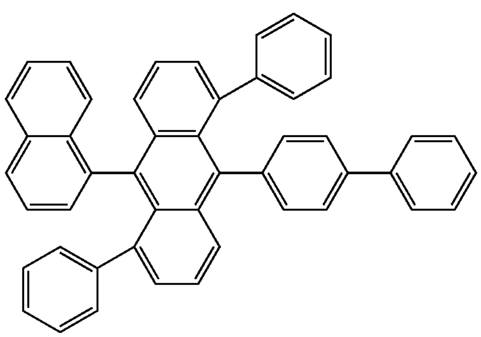
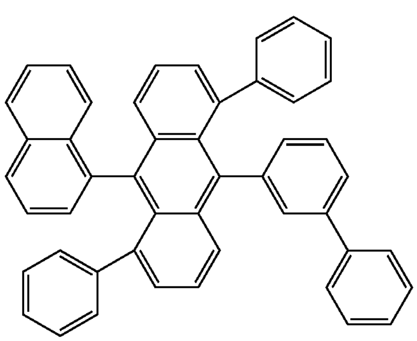
-continued
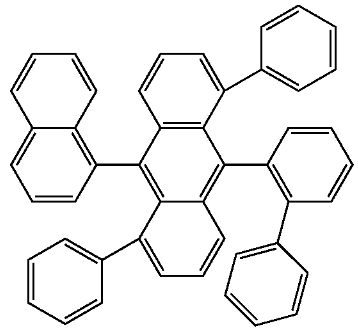
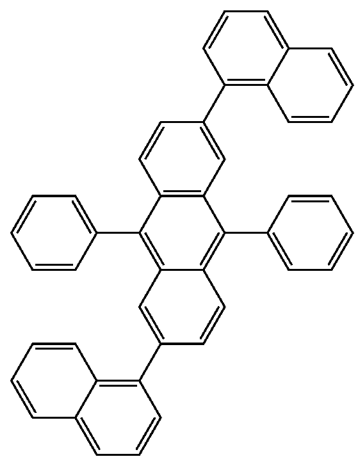
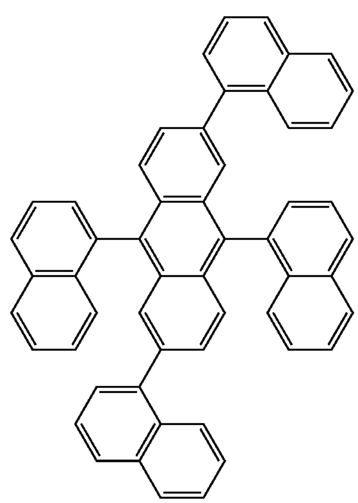

-continued
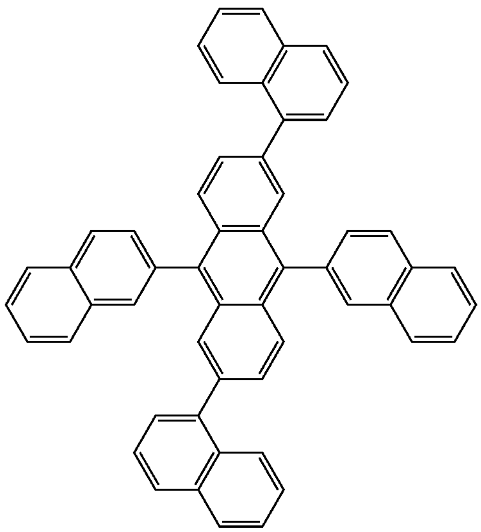
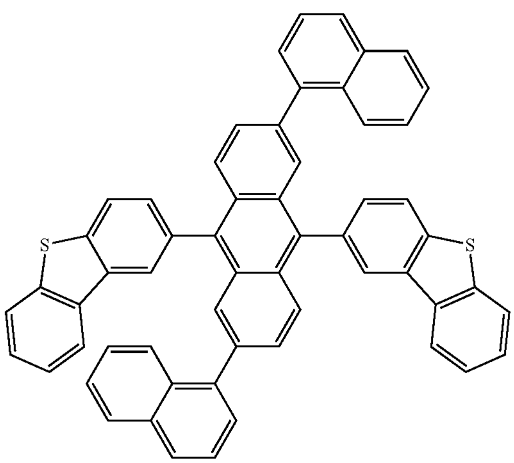
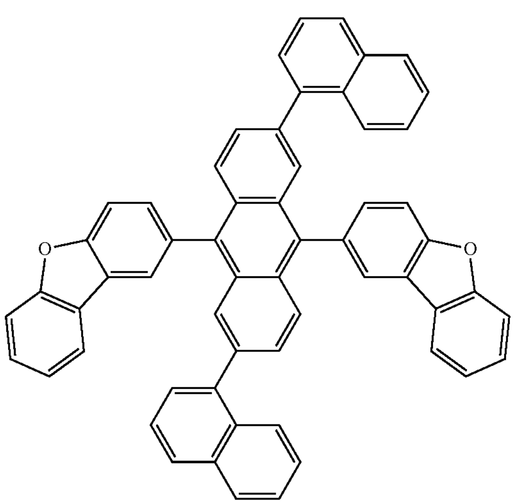
-continued
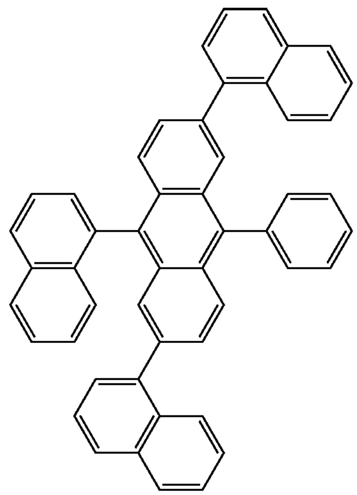
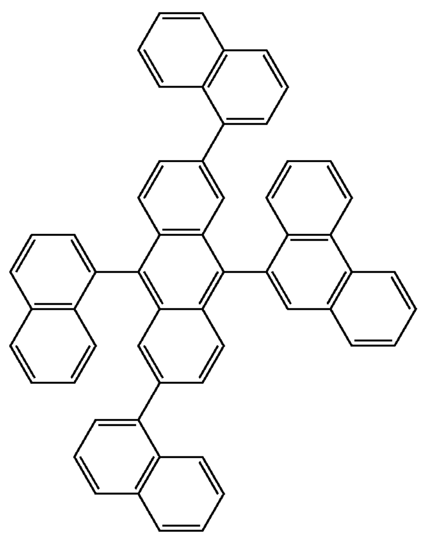
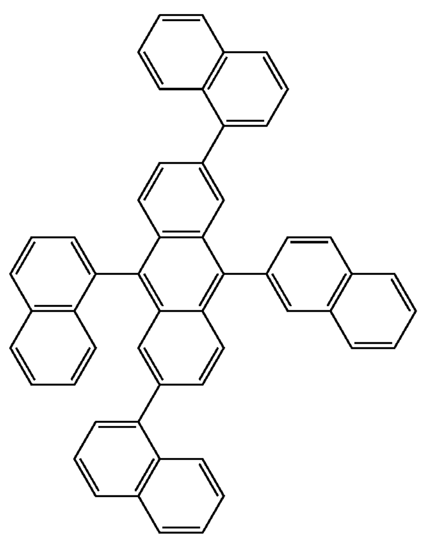

-continued
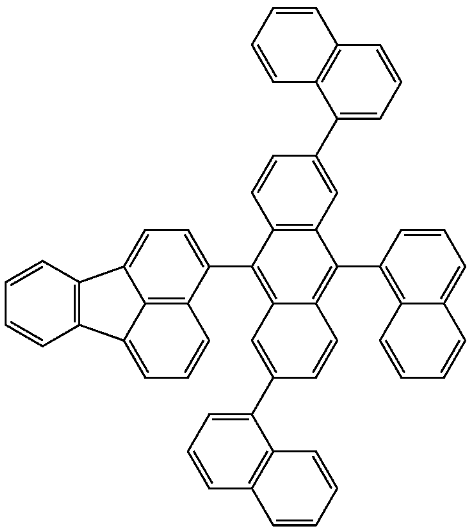
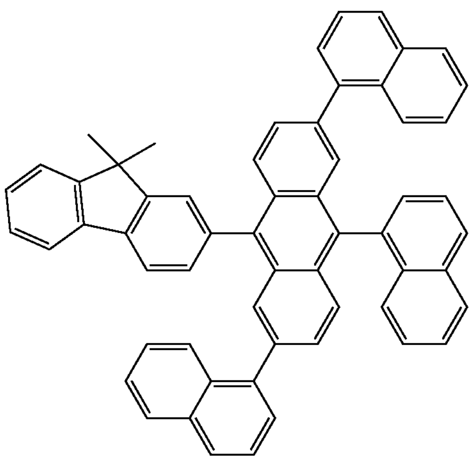
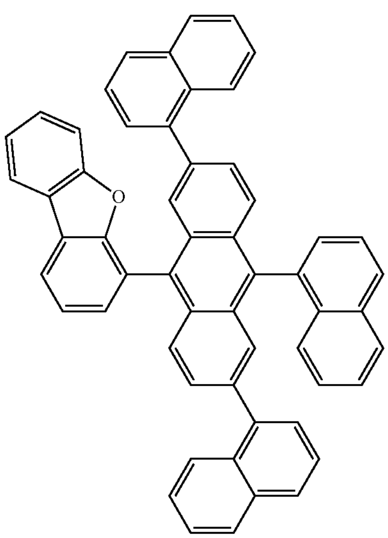
-continued
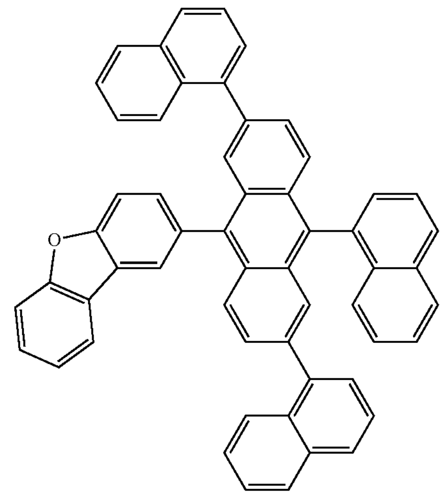
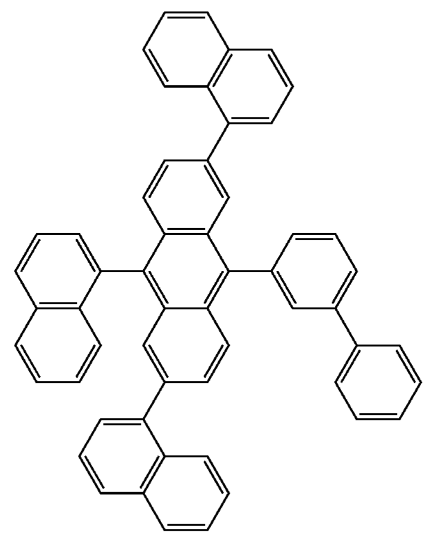
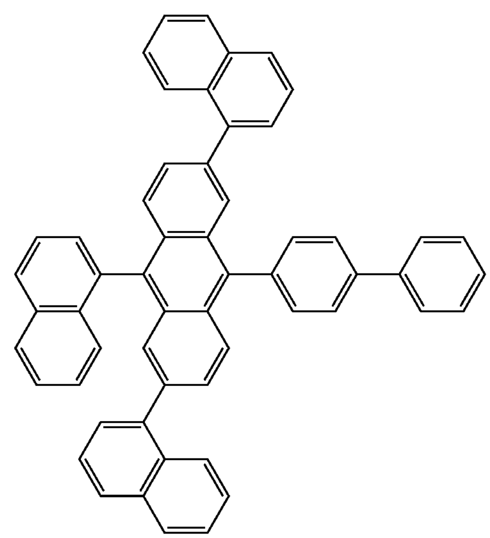

-continued
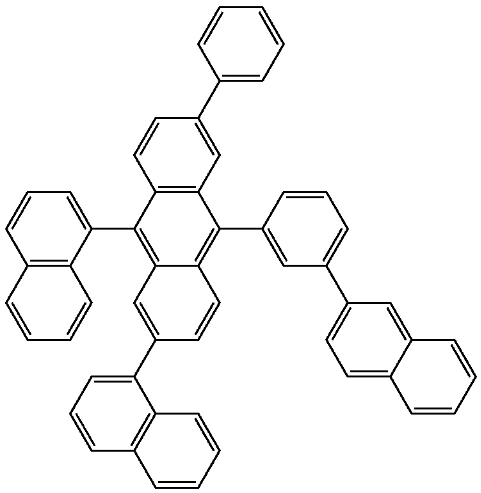
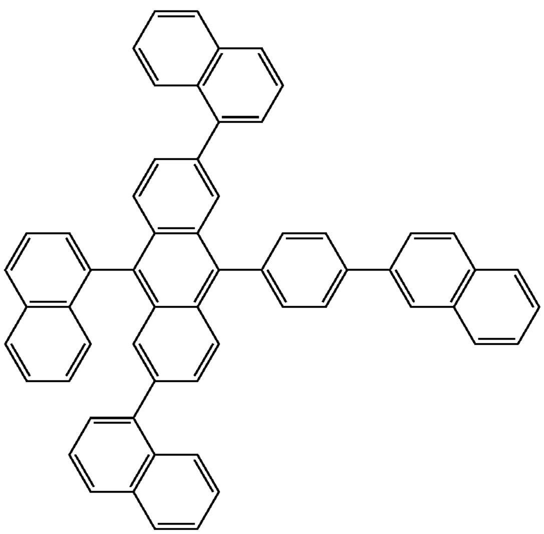
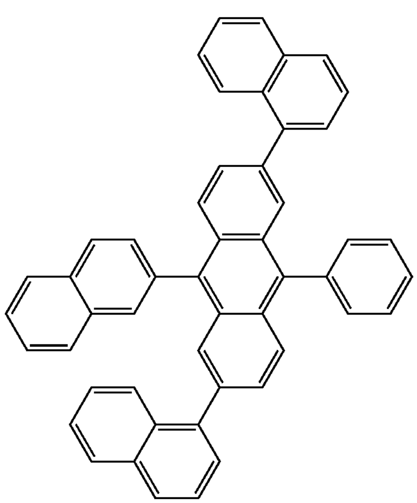
-continued
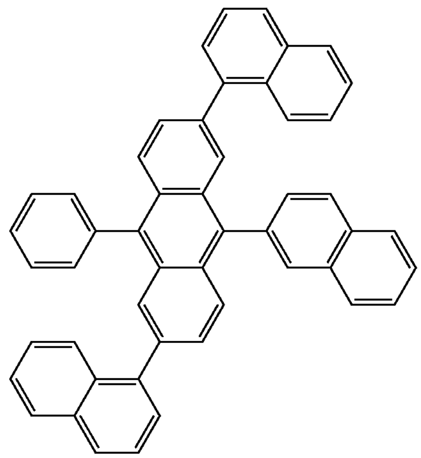
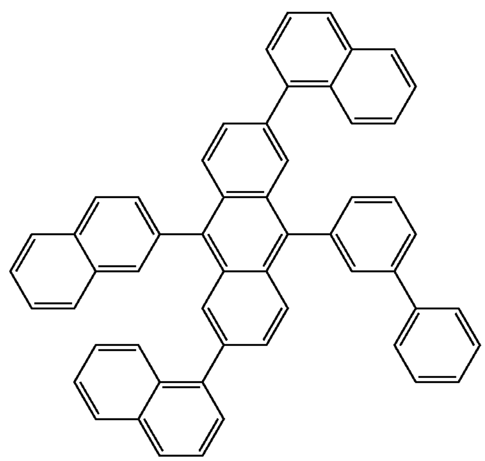
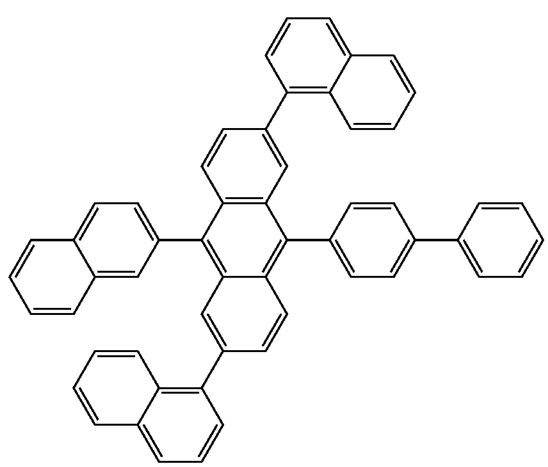

-continued
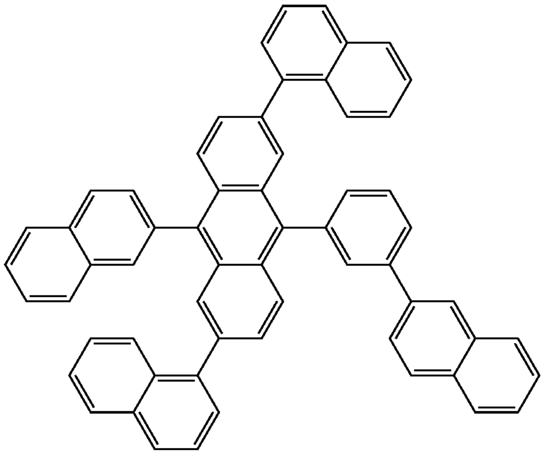
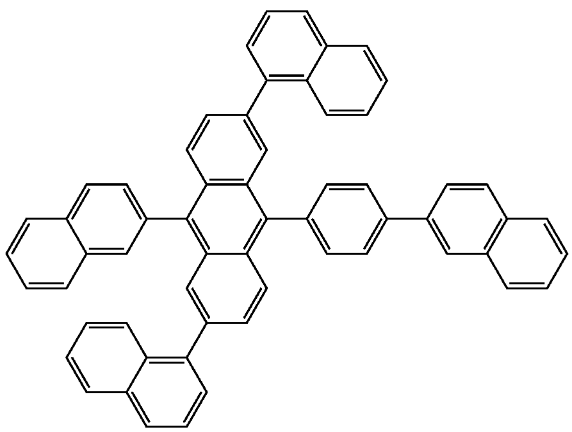
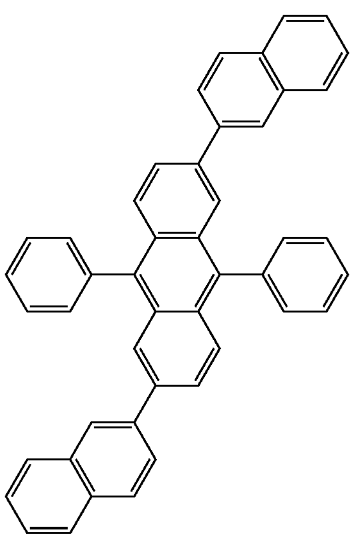
-continued
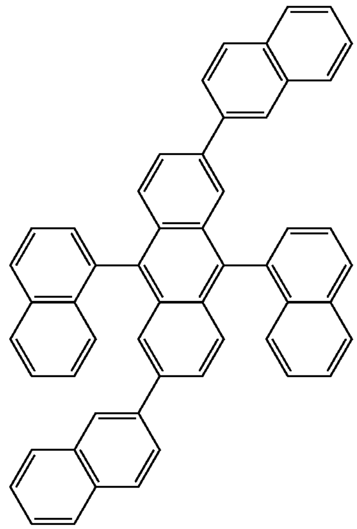
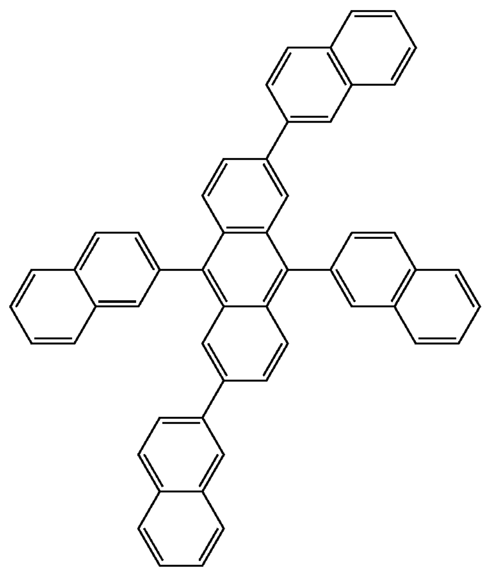
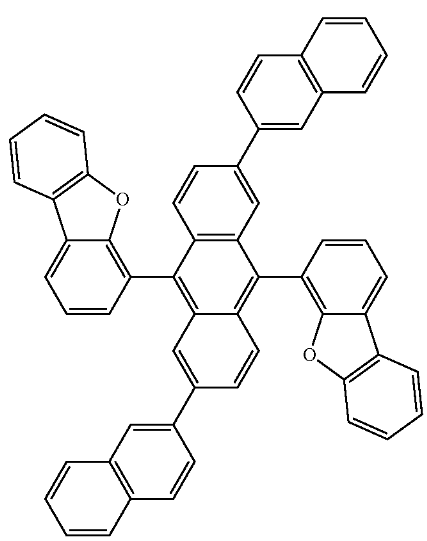

-continued
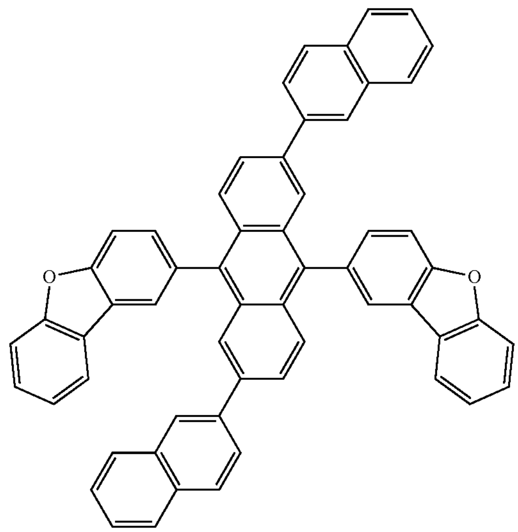
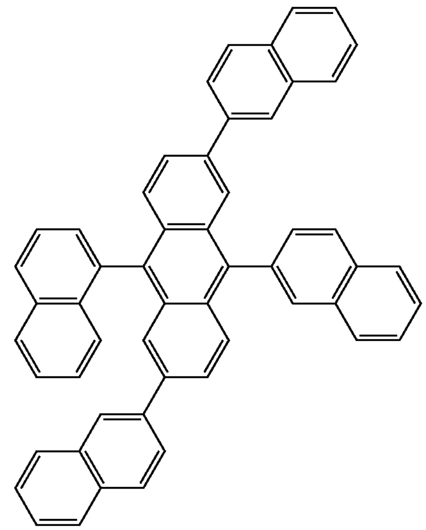
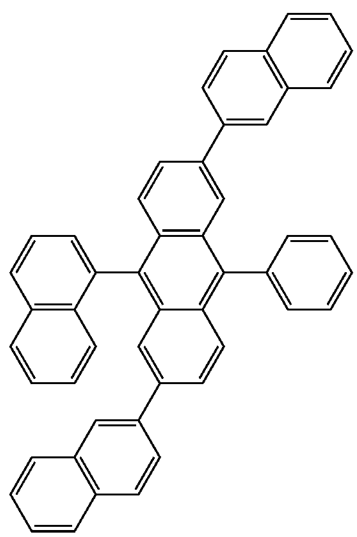
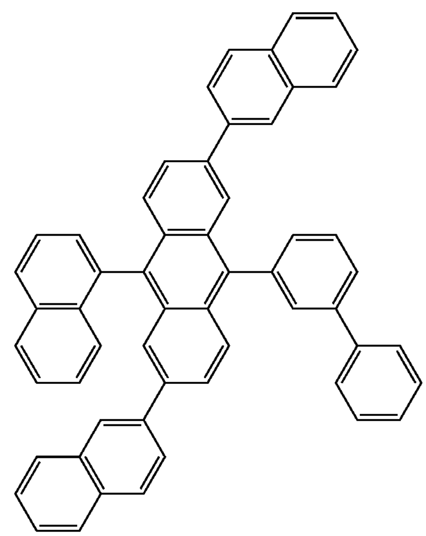
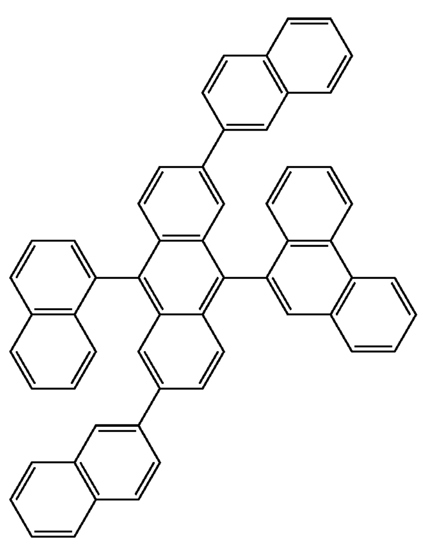
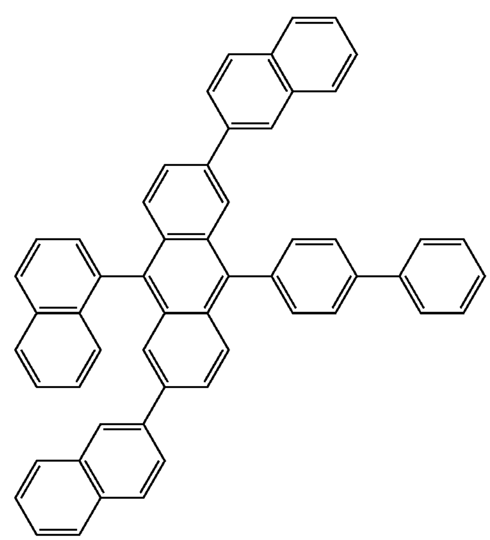
-continued

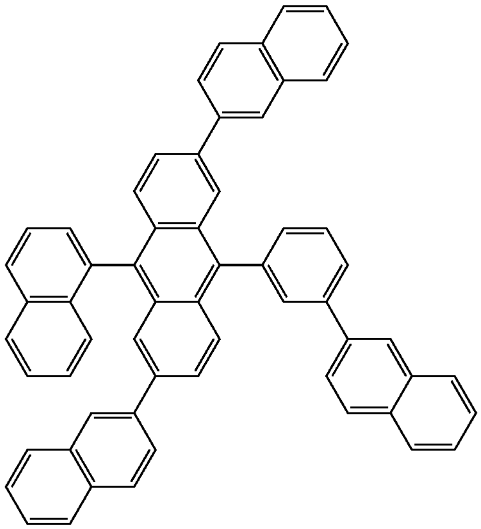
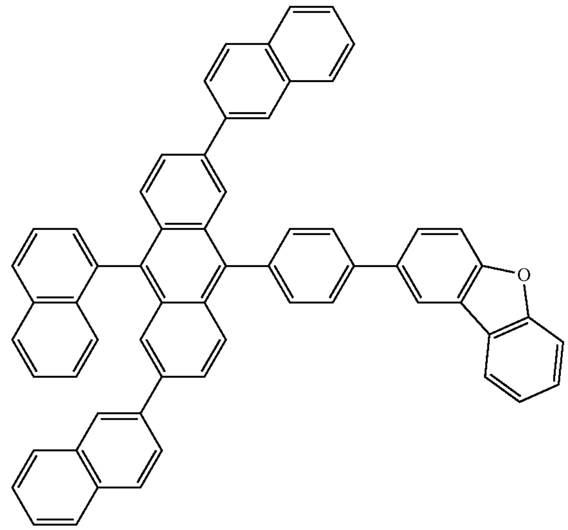
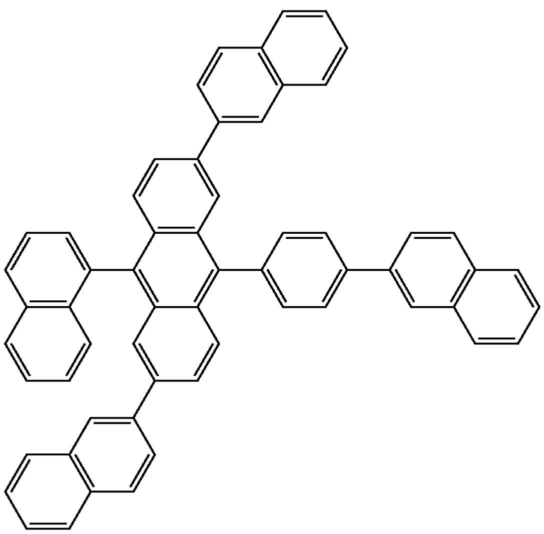
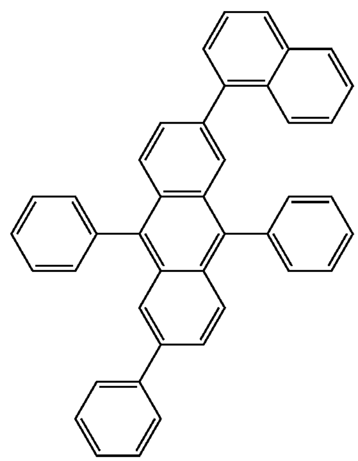
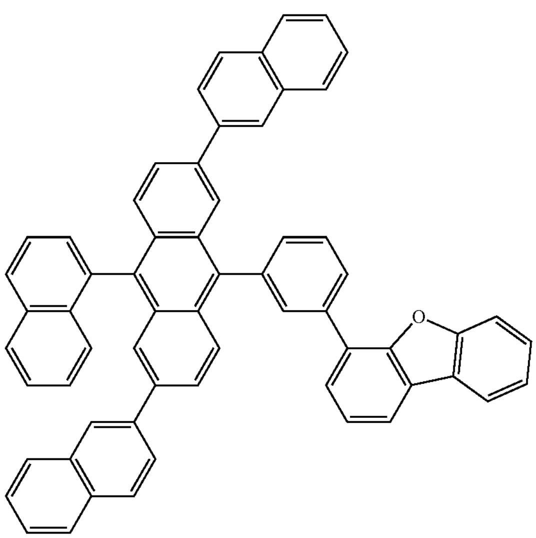
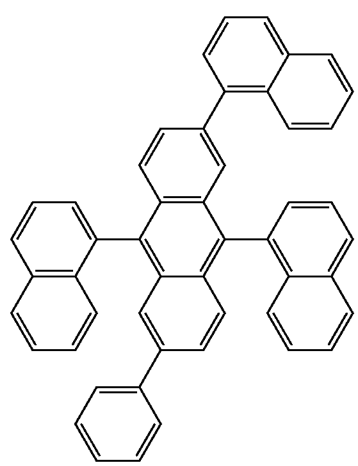

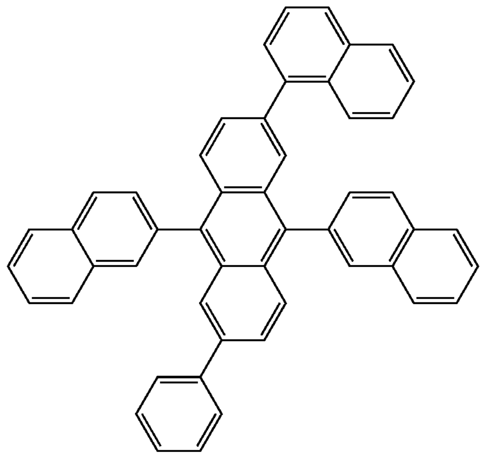
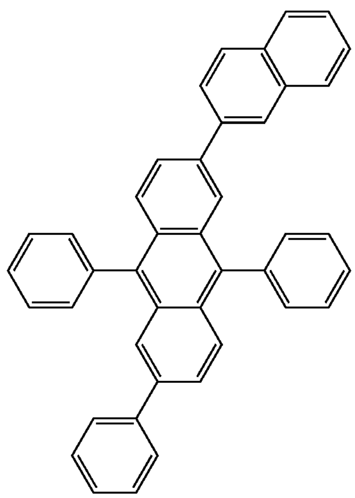
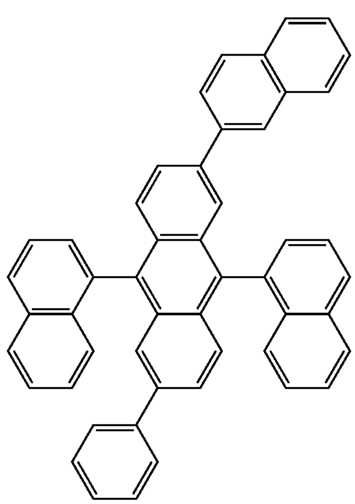
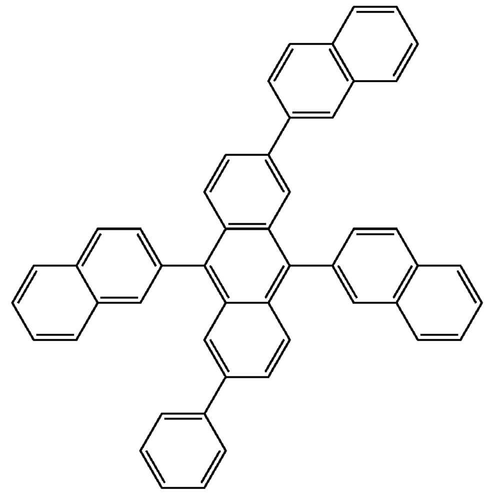
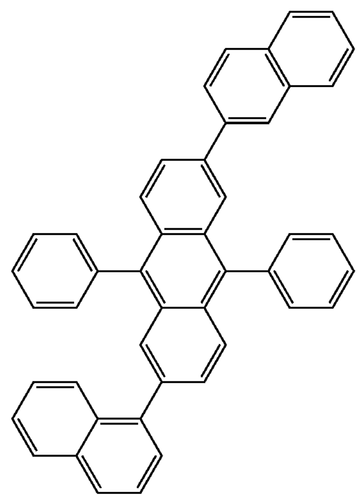
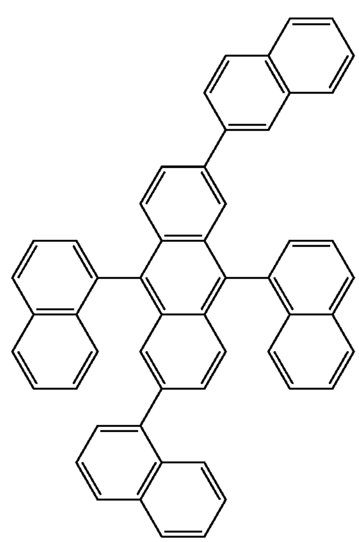

-continued
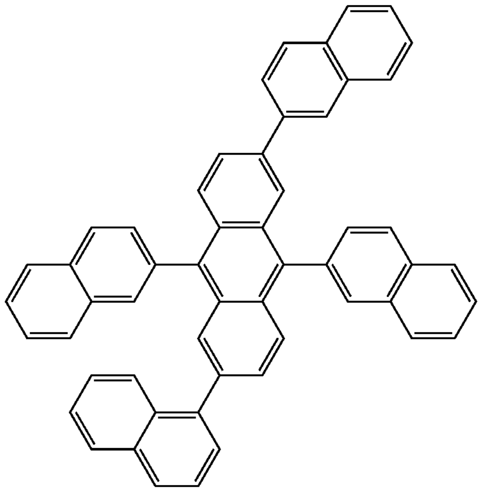
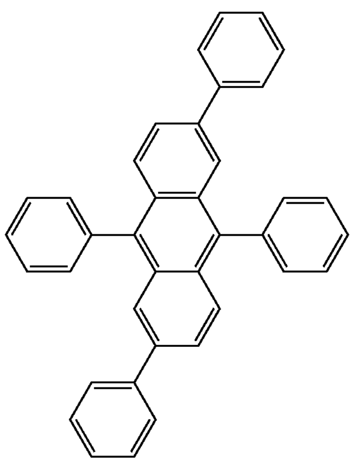
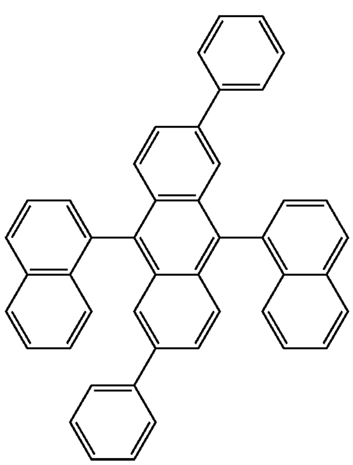
-continued
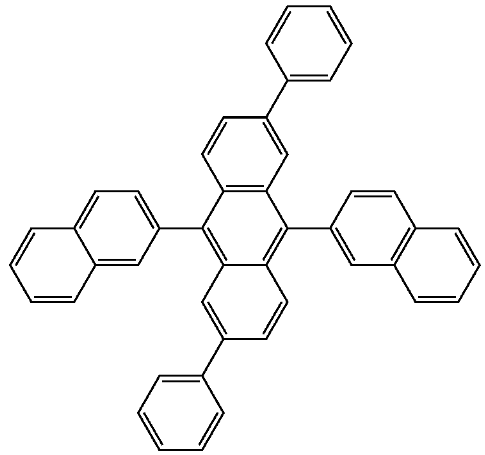
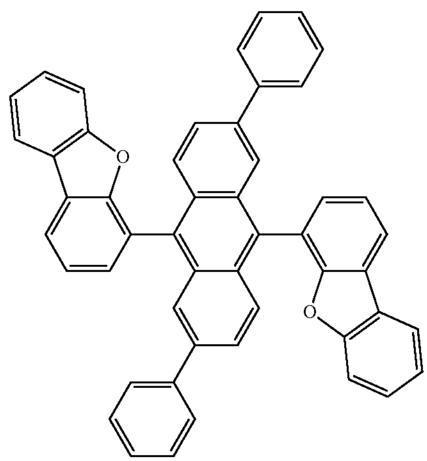
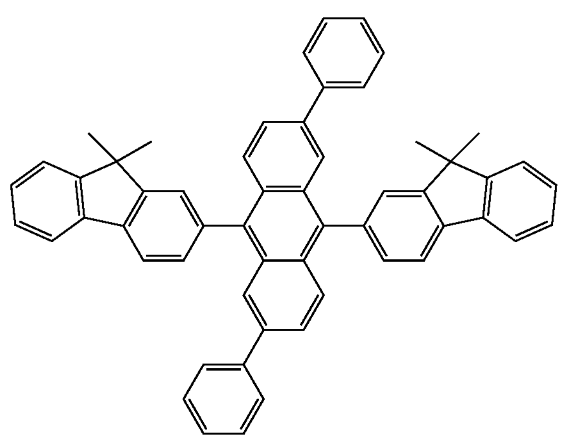

-continued
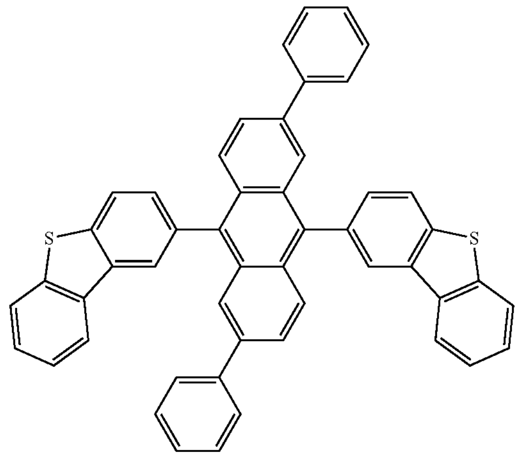
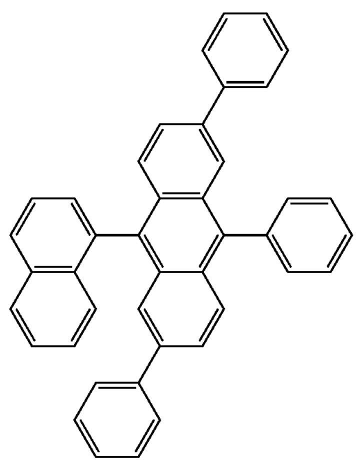
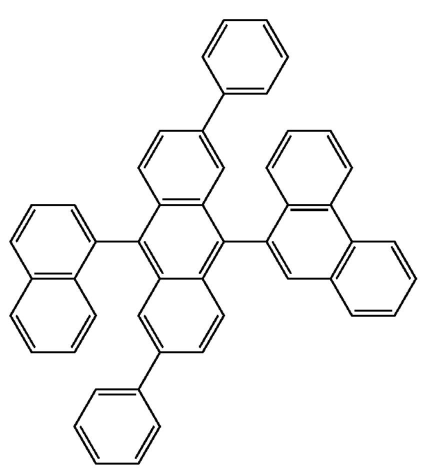
-continued
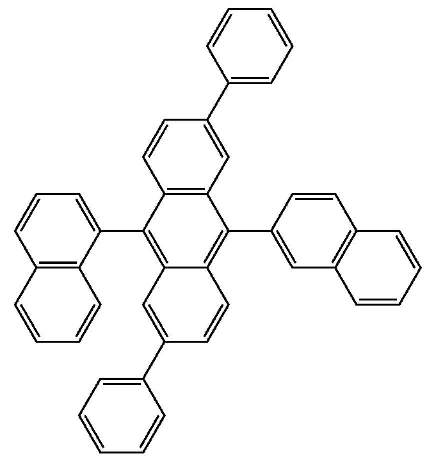
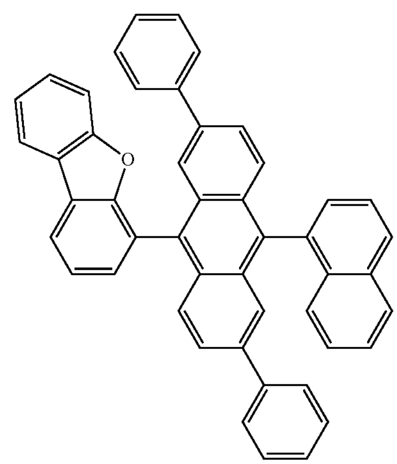
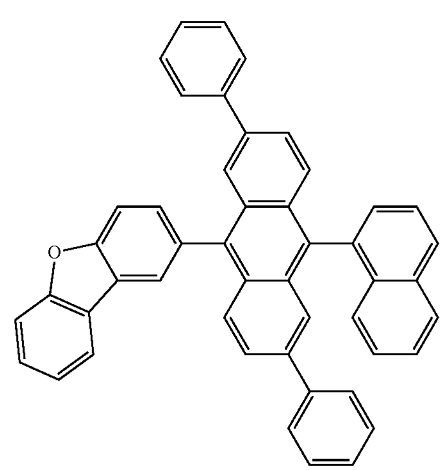

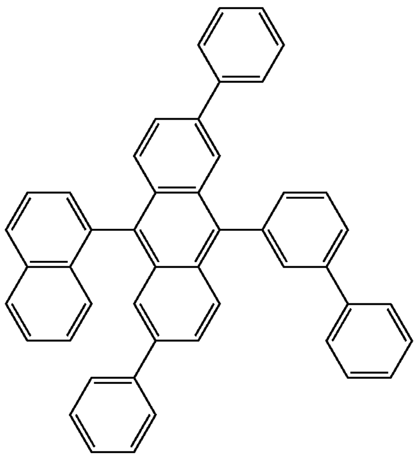
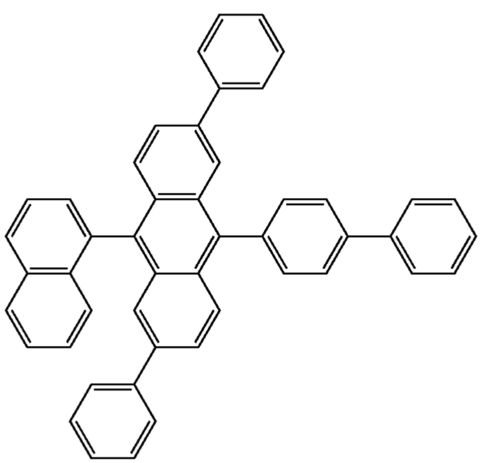
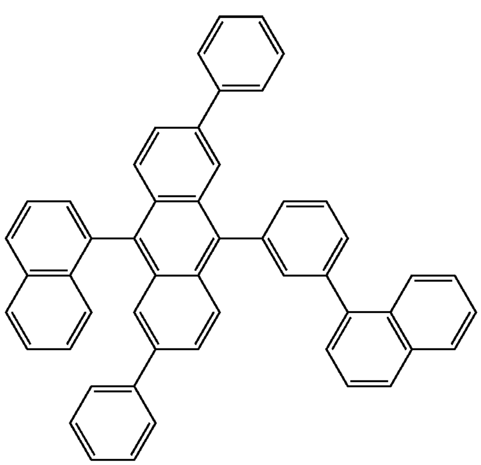
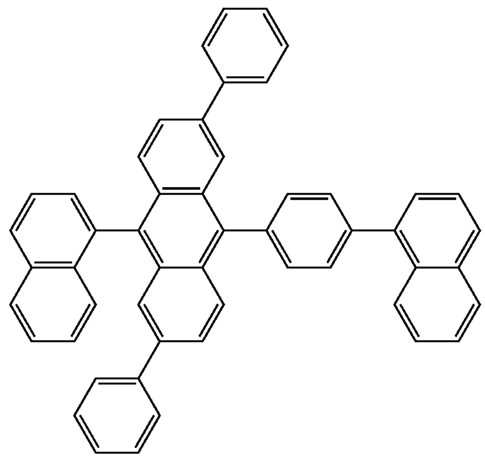
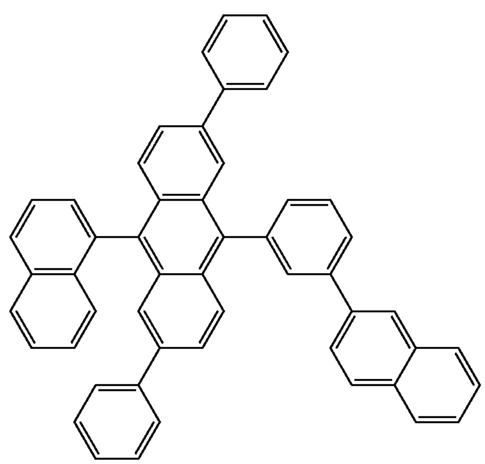
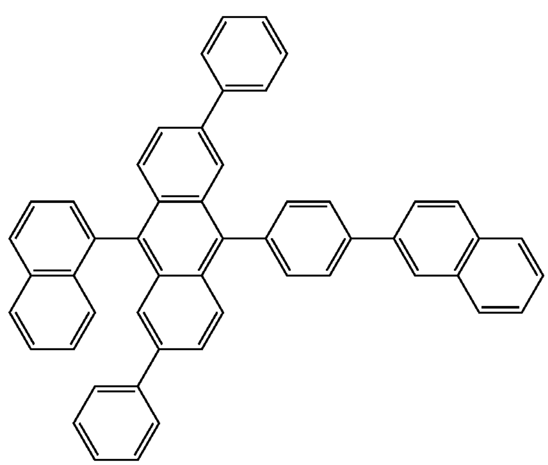

-continued
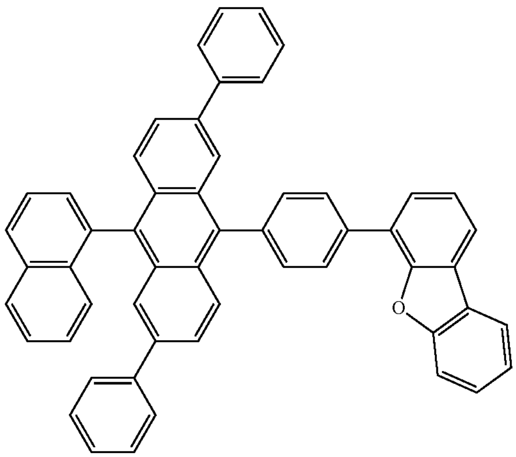
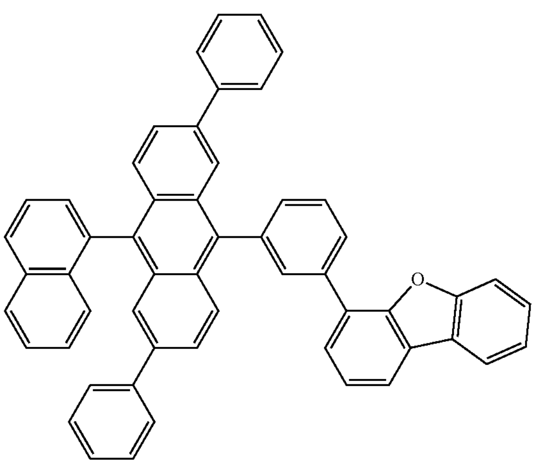
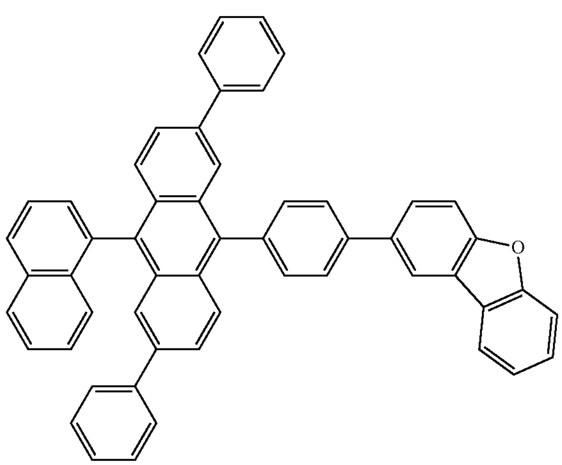
-continued
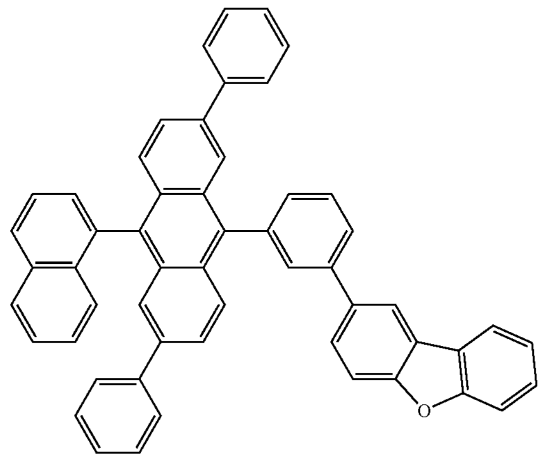
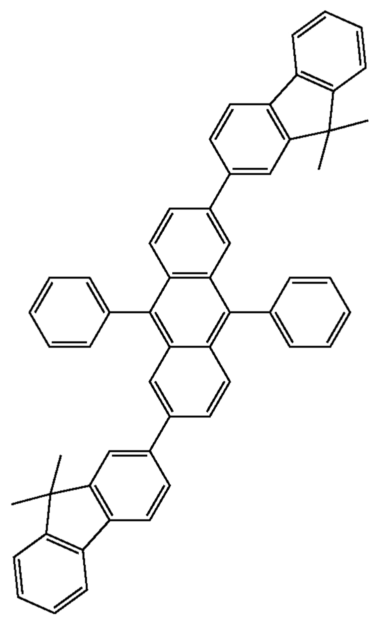
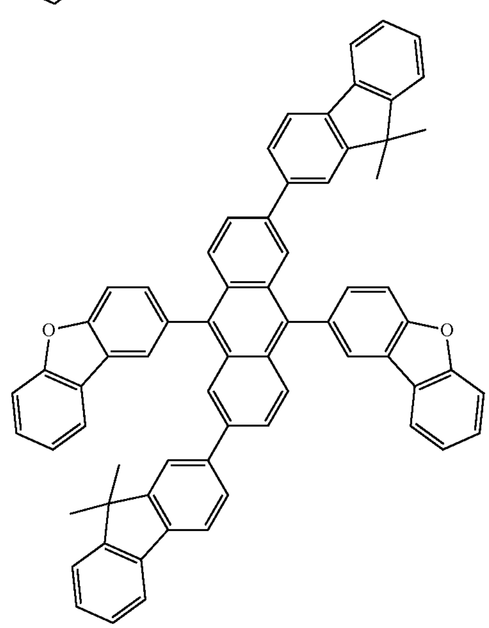

-continued
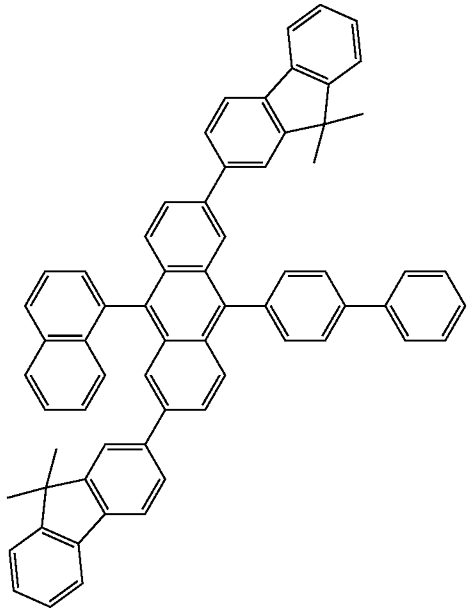
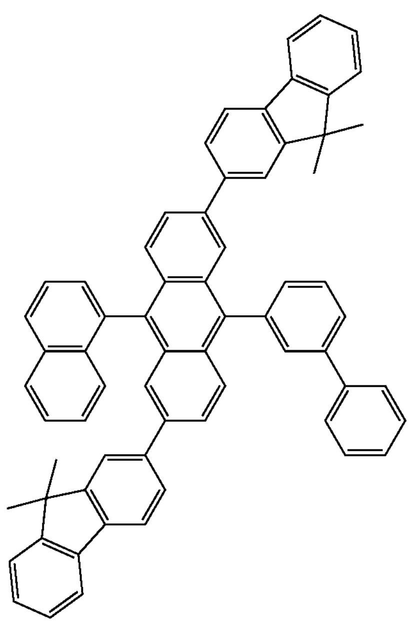
-continued
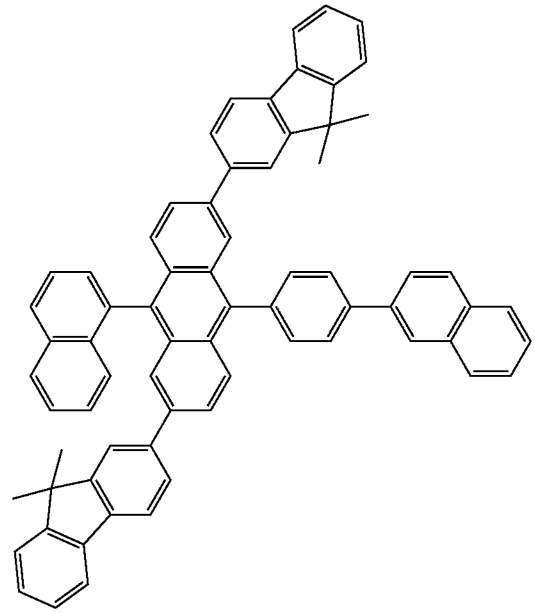
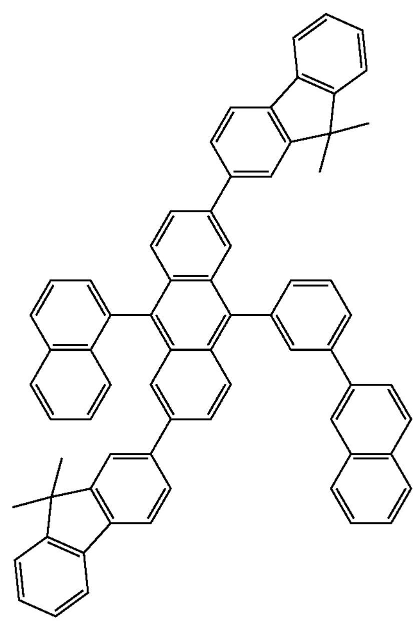

-continued
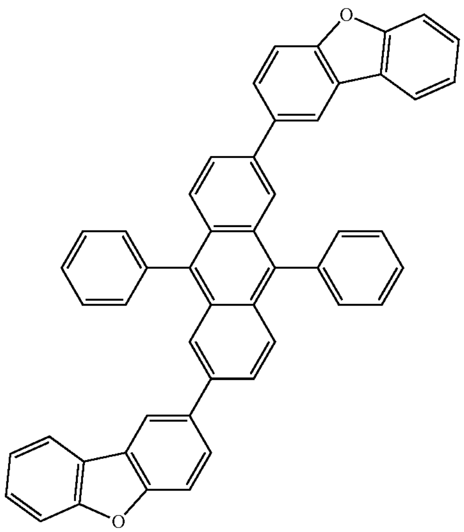
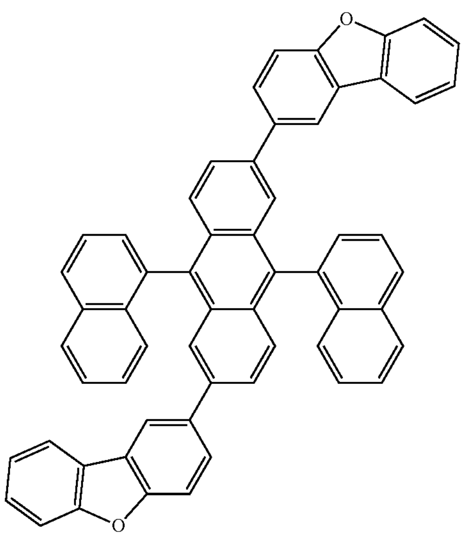
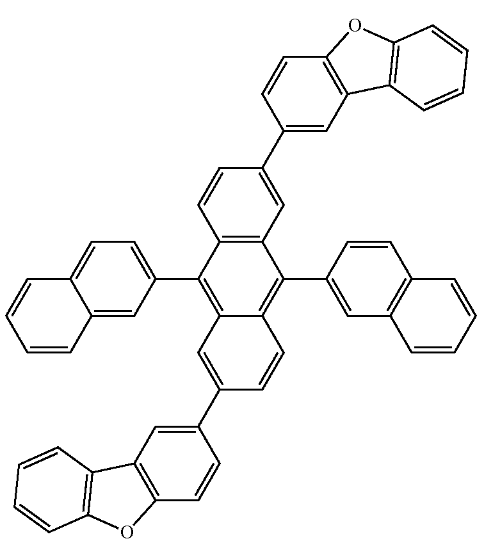
-continued
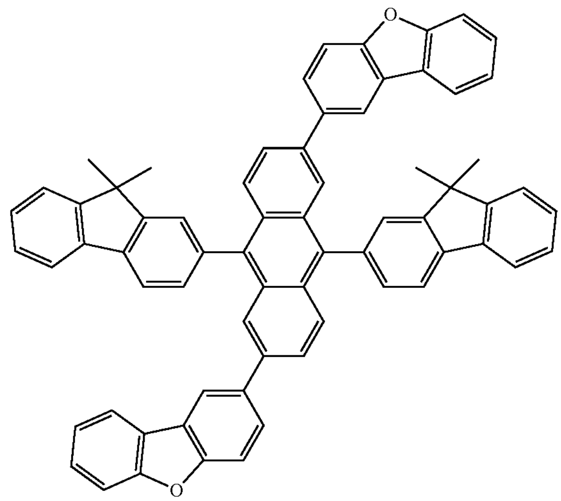
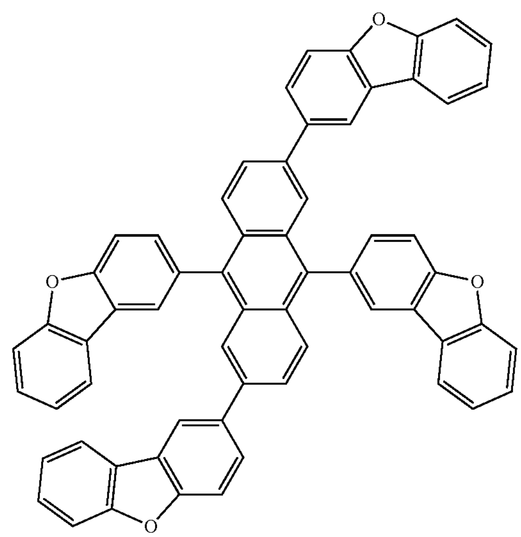
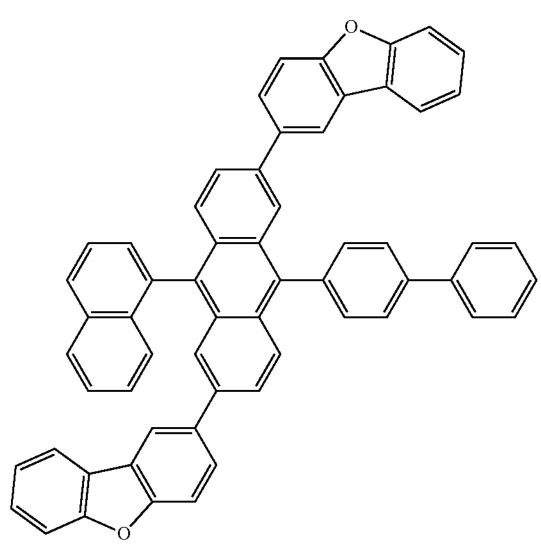

-continued
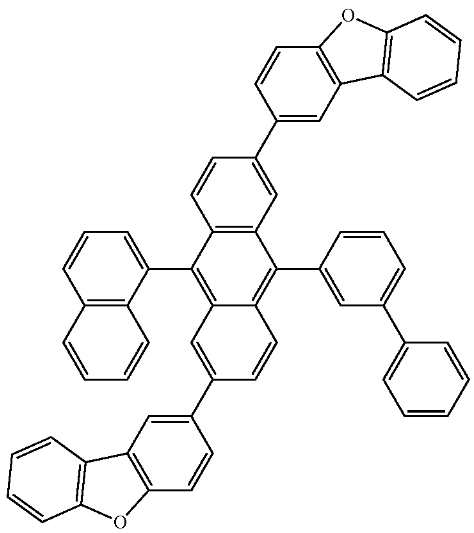
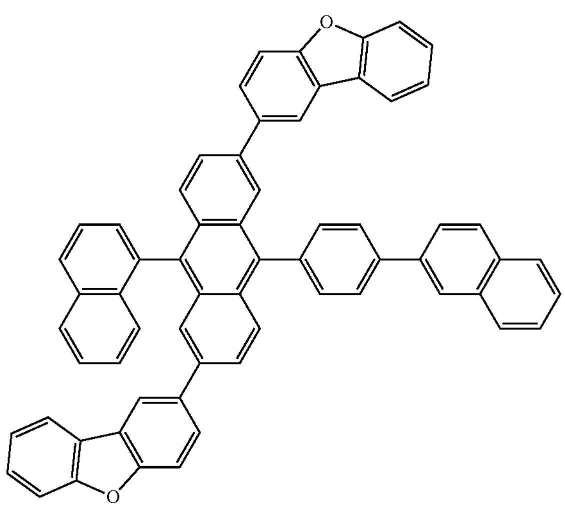
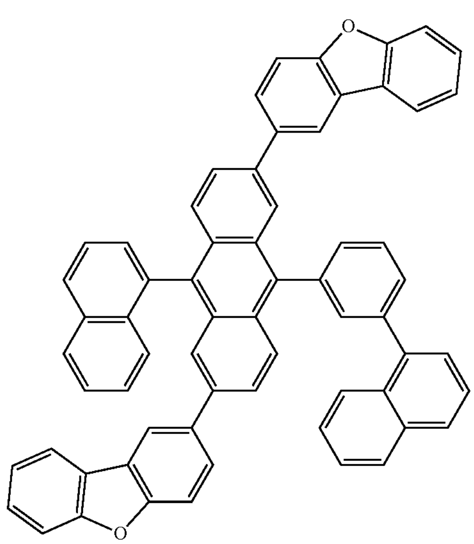
-continued
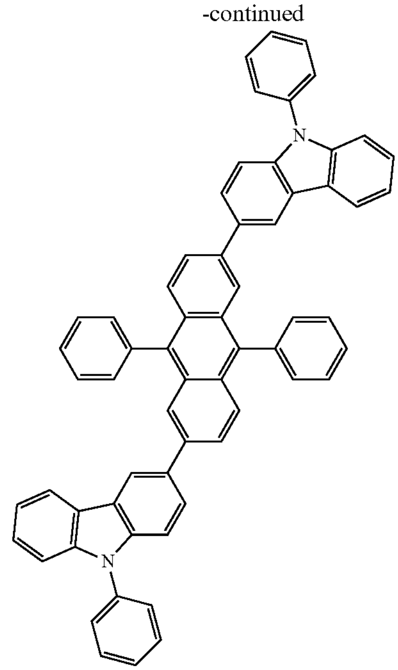
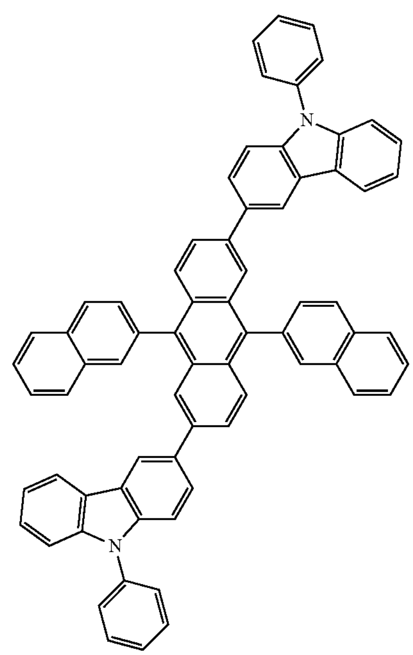

-continued
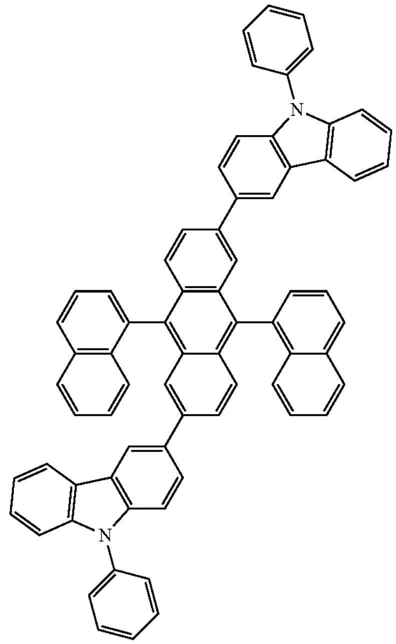
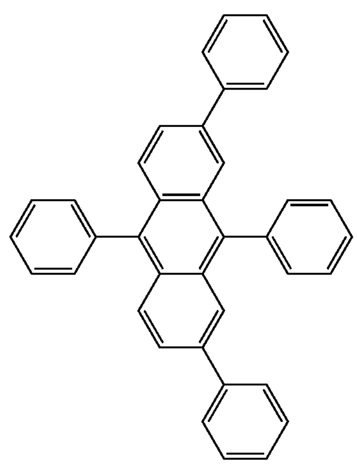
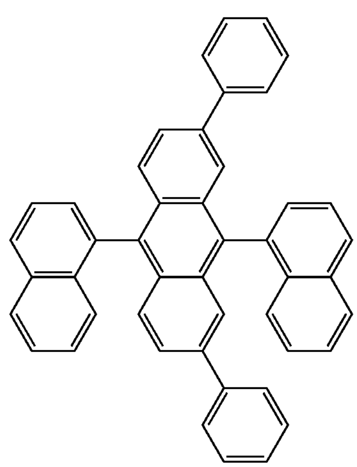
-continued
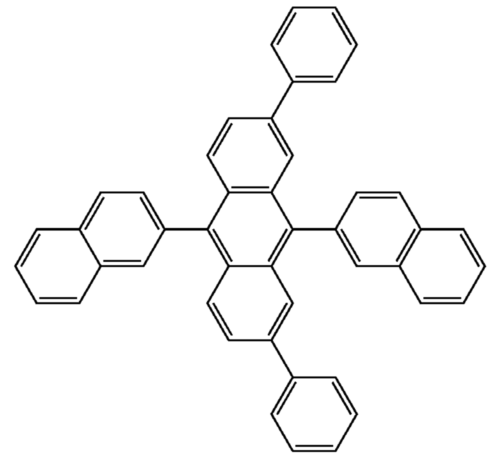
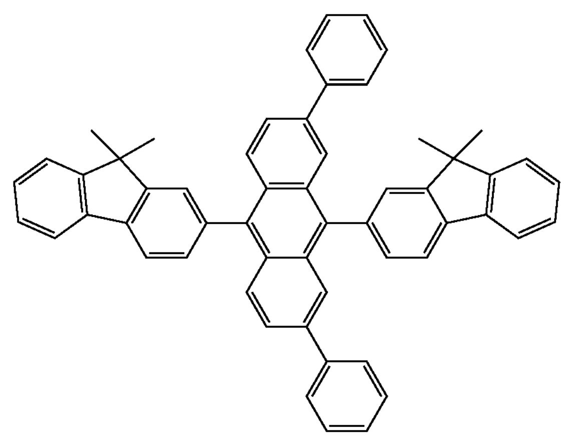
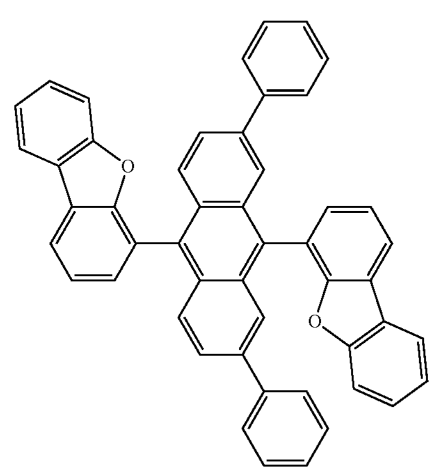

-continued
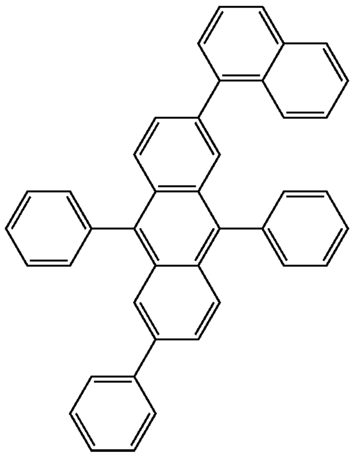
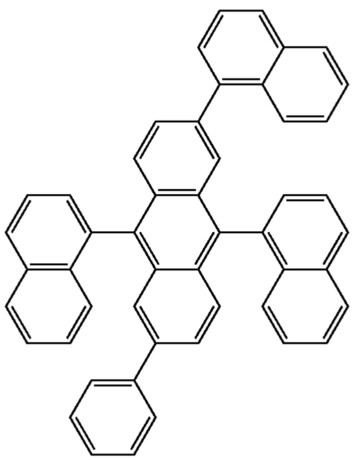
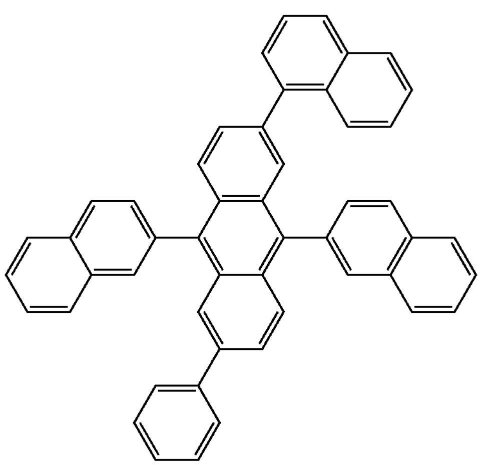
-continued
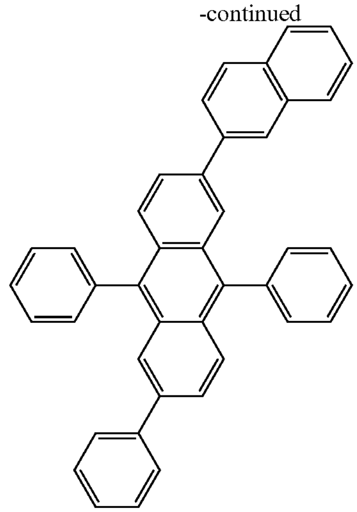
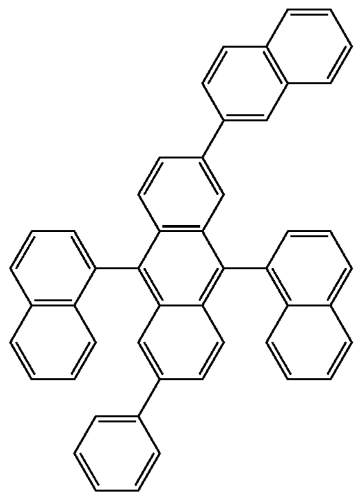
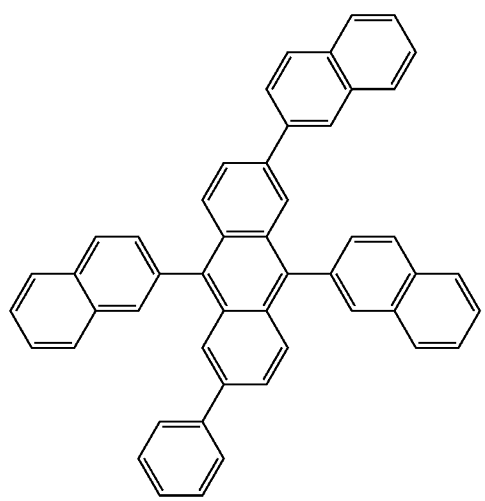

-continued
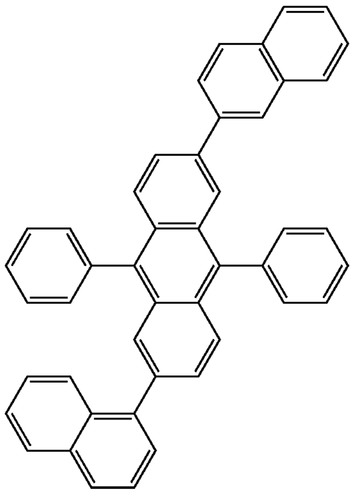
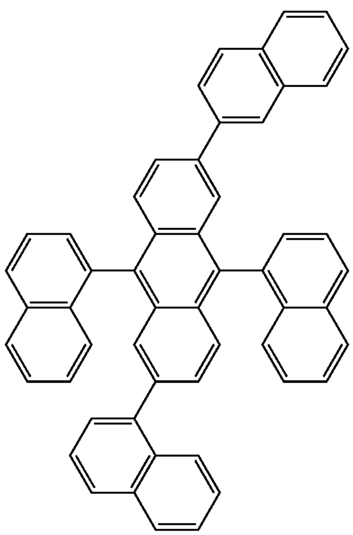
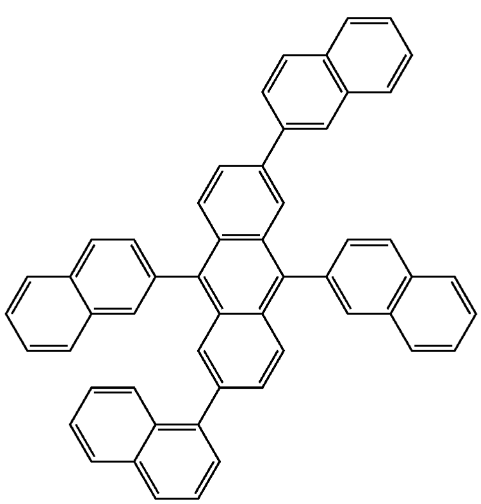
-continued
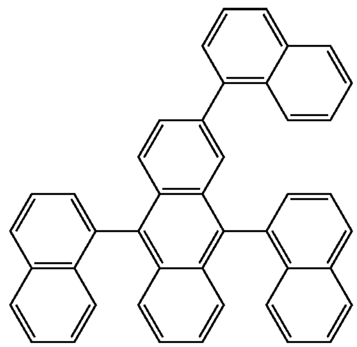
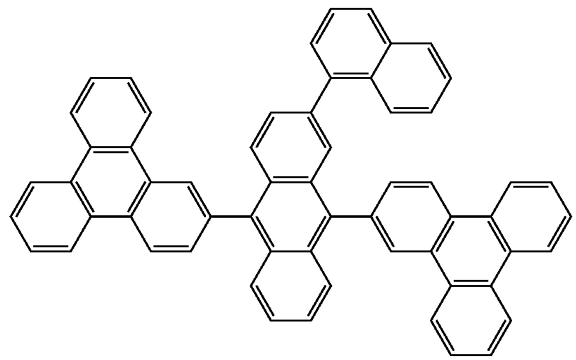
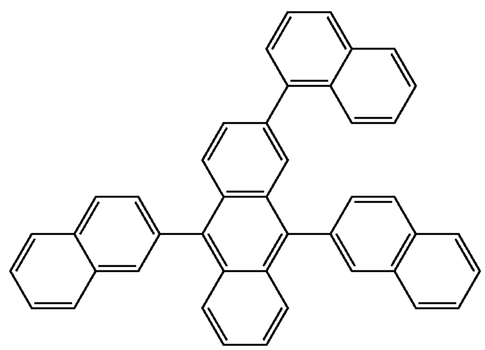
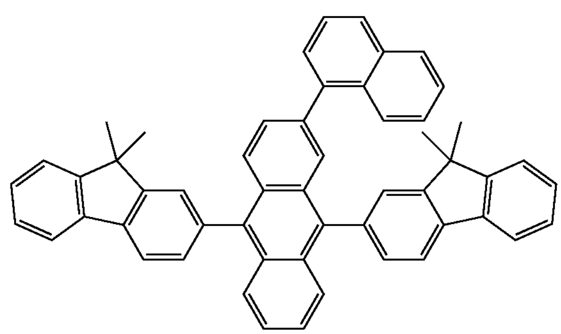

-continued
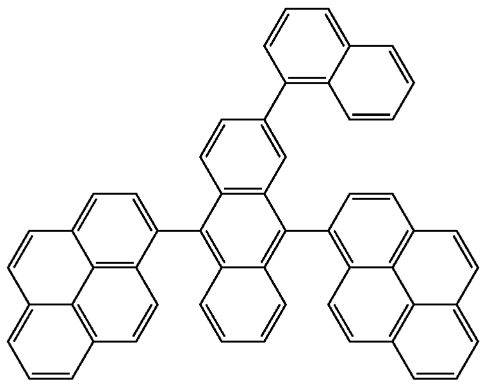
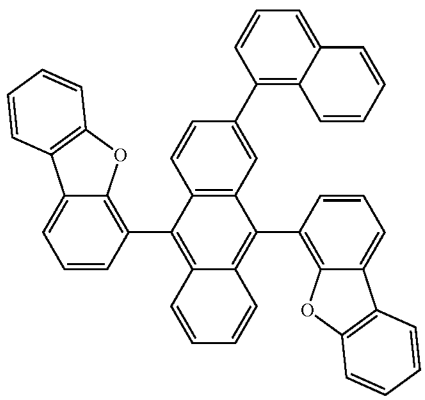
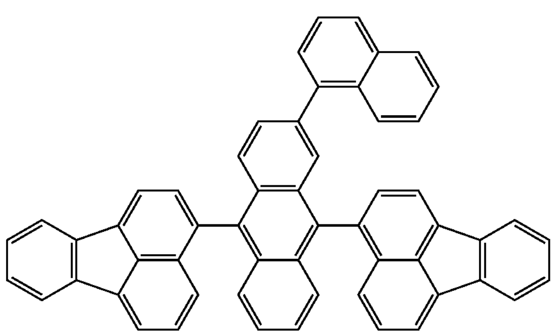
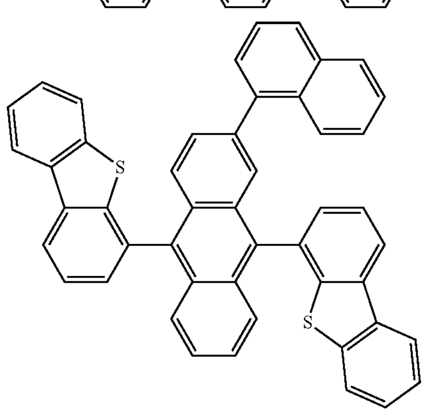
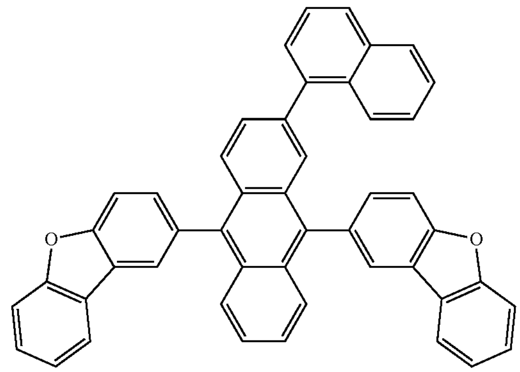
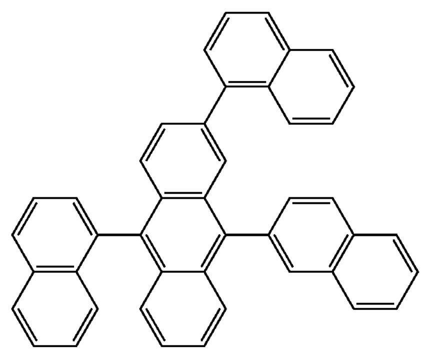
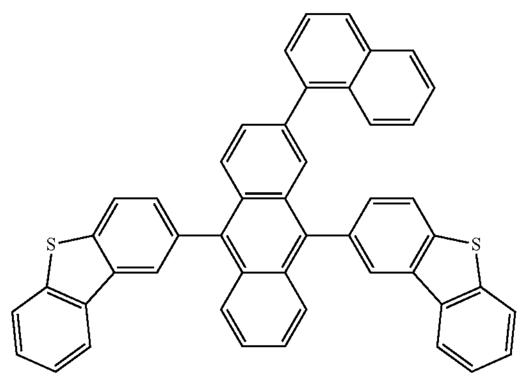
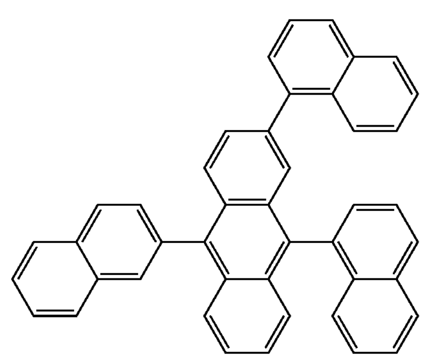

-continued
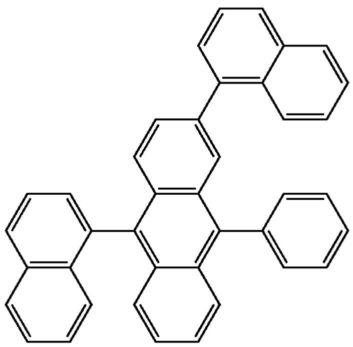
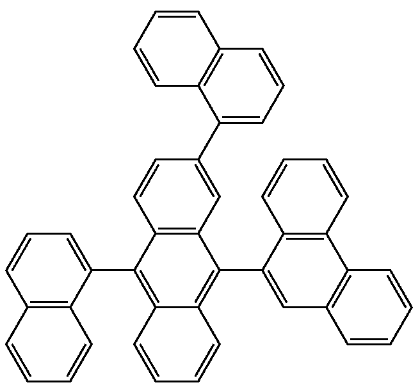
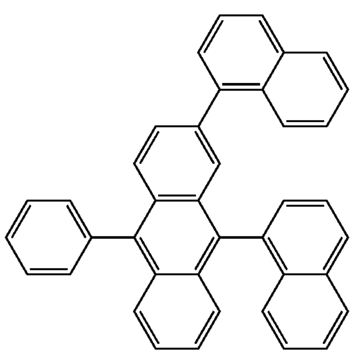
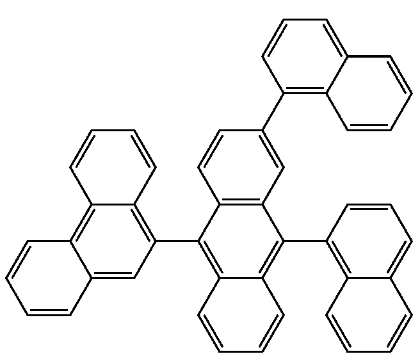
-continued
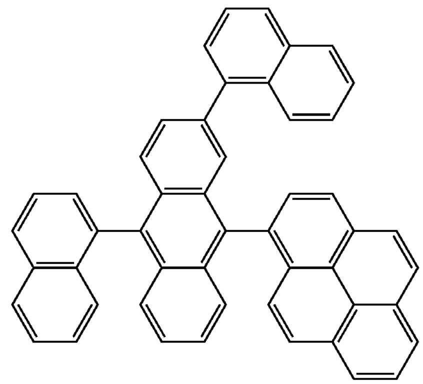
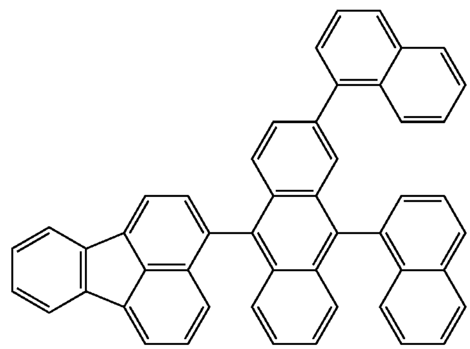
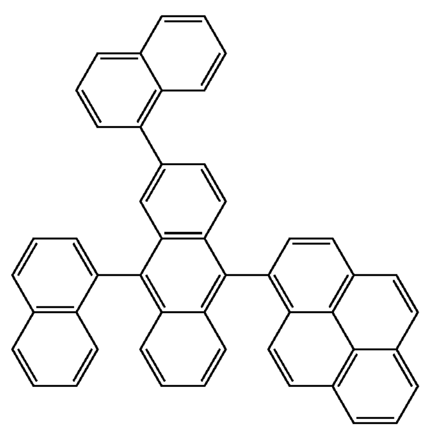
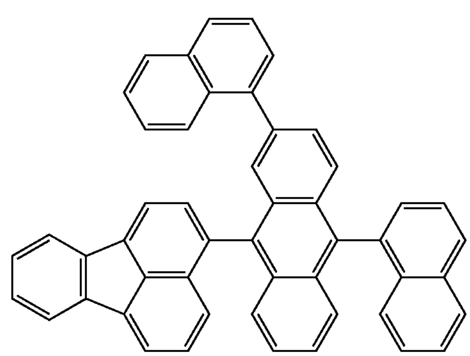

-continued
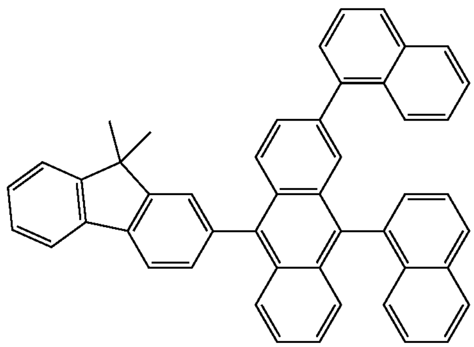
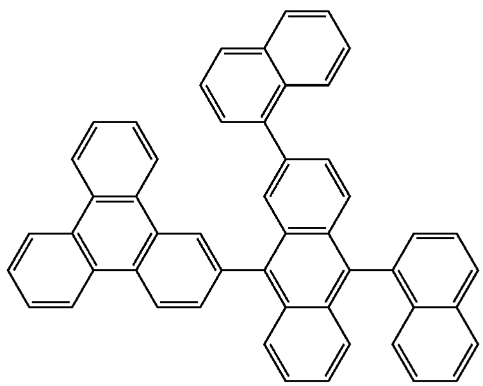
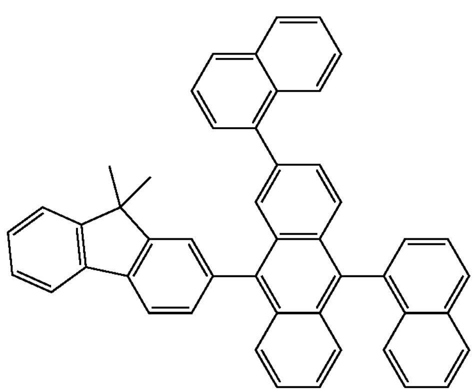
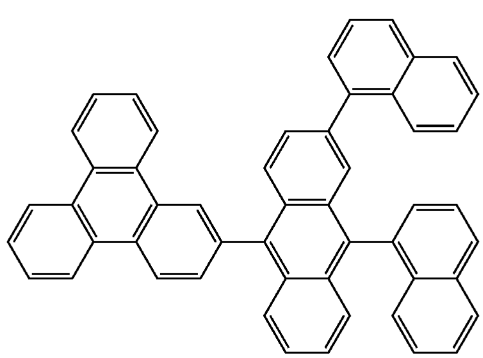
-continued
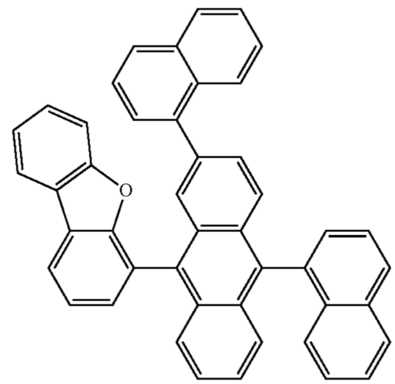
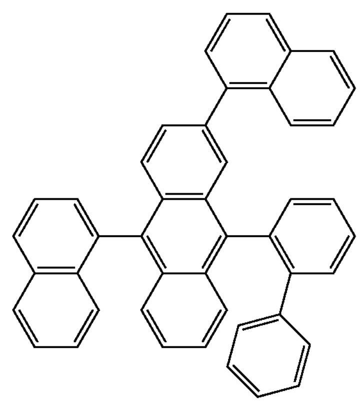
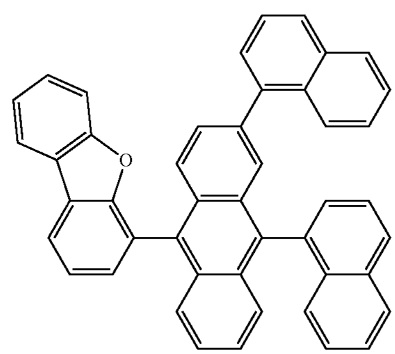
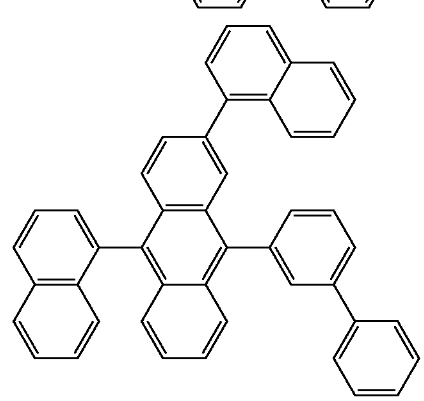

-continued
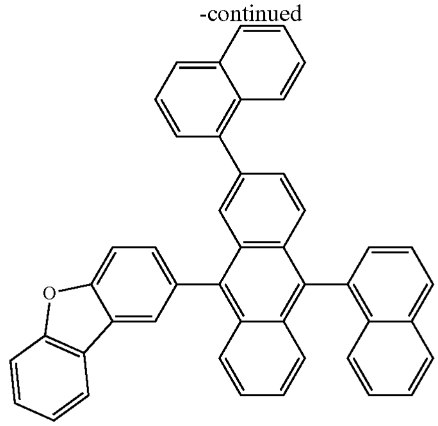
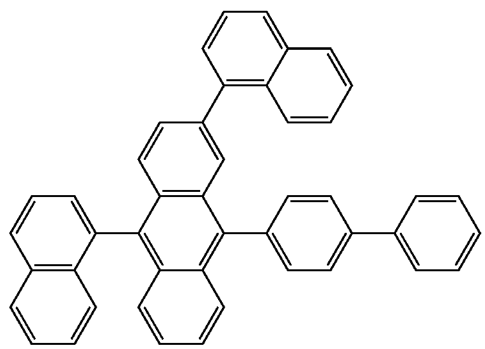
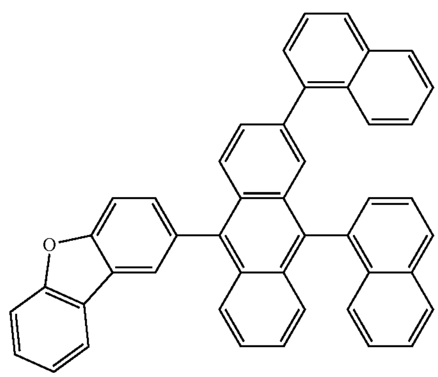
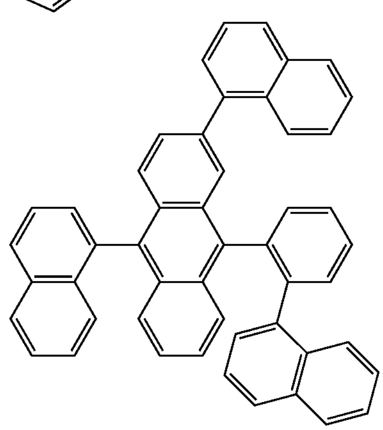
-continued
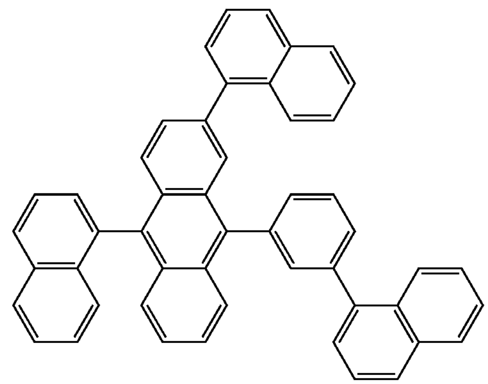
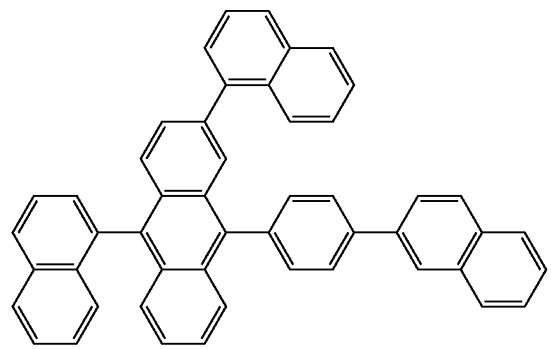
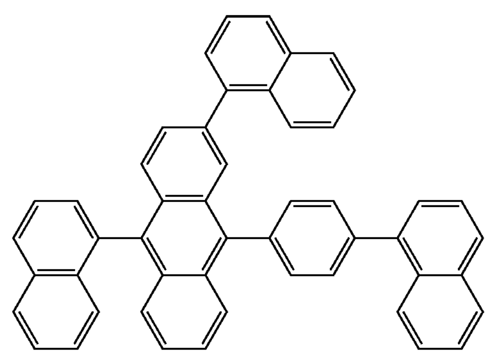
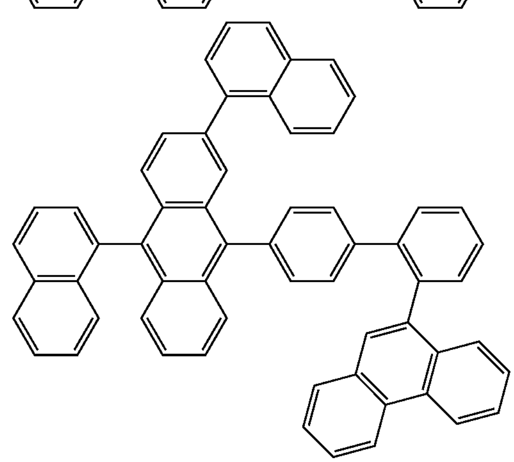

-continued
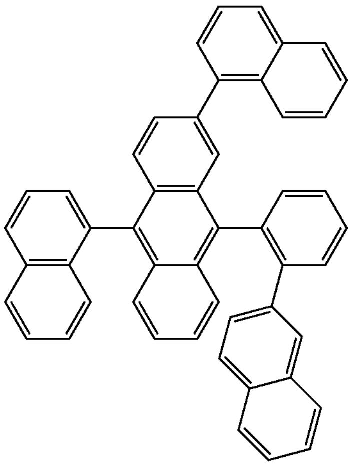
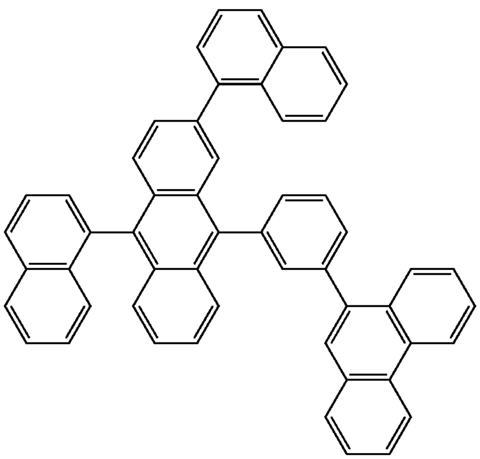
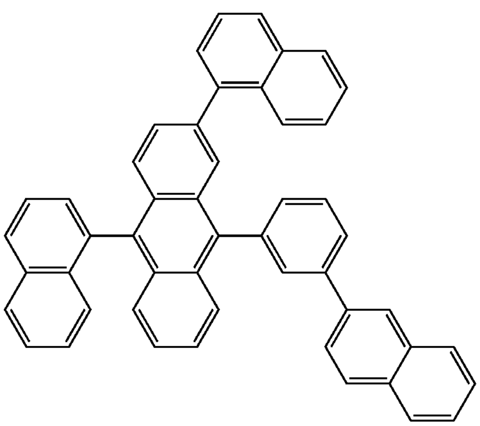
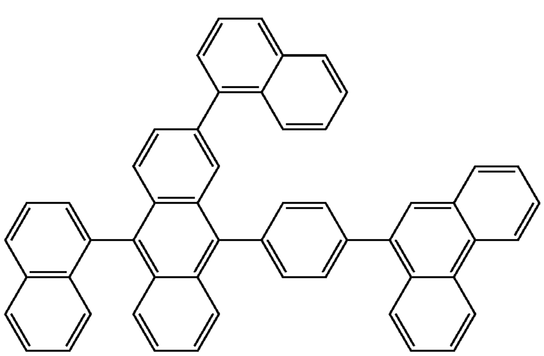
-continued
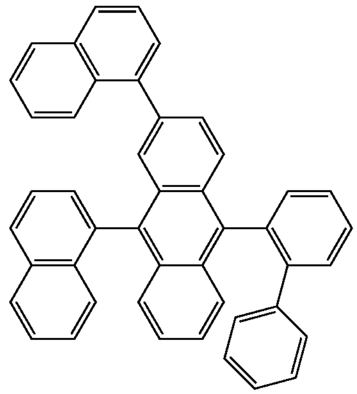
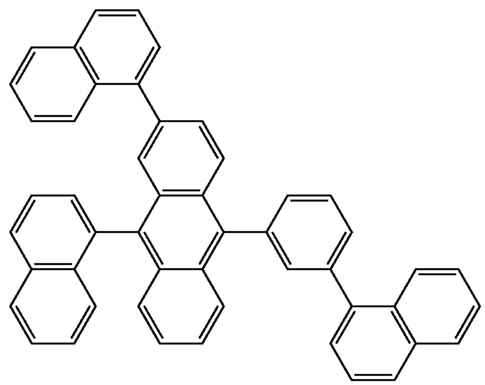
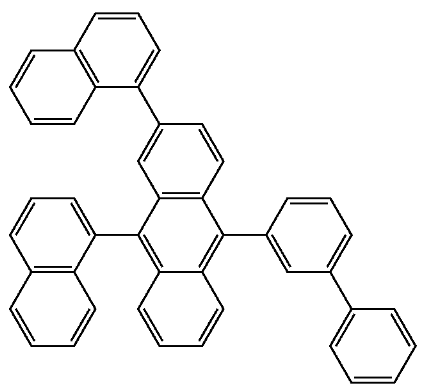
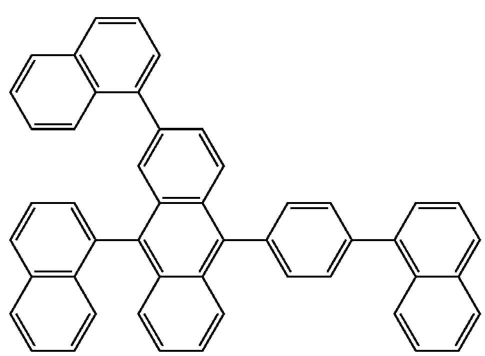

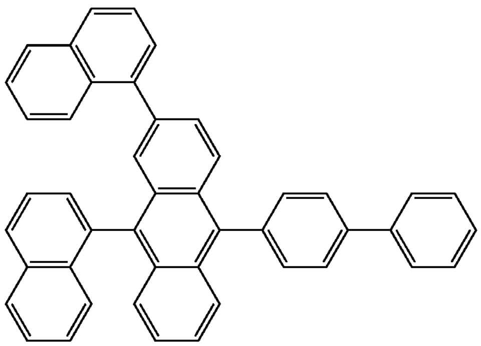
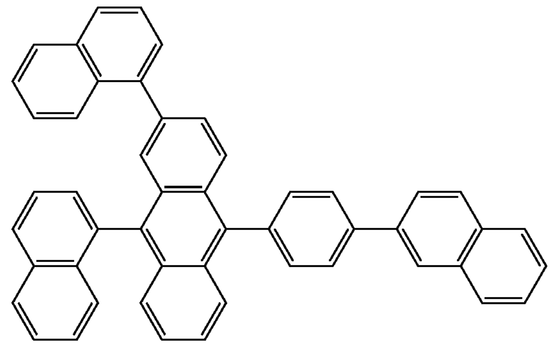
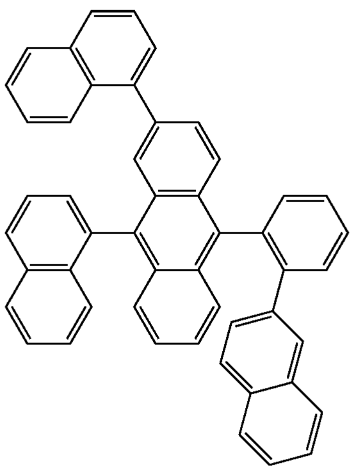
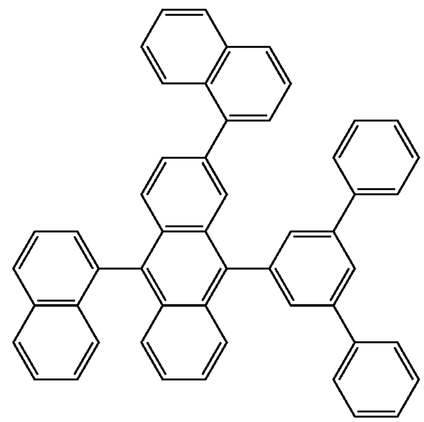
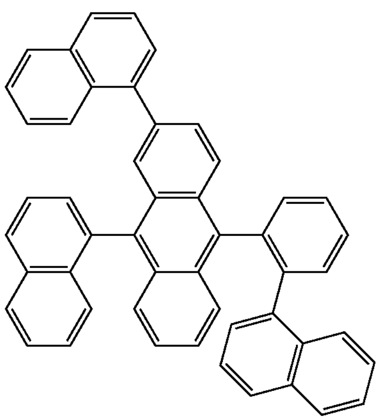
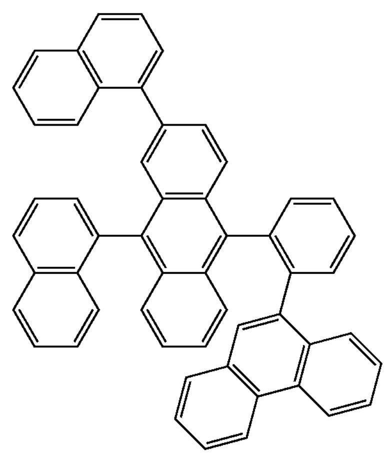
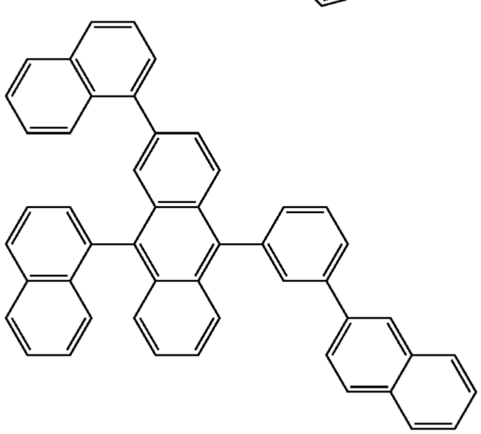
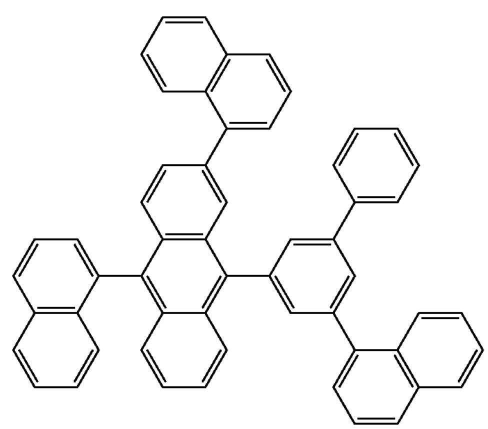

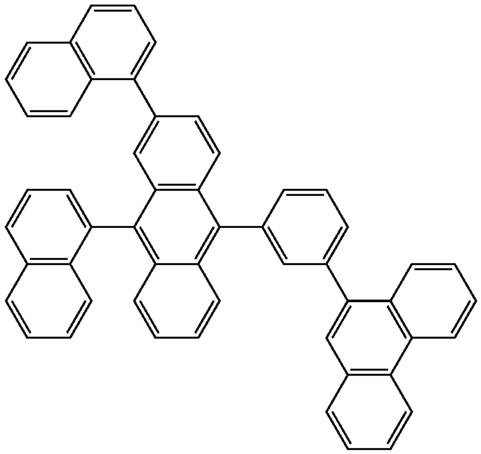
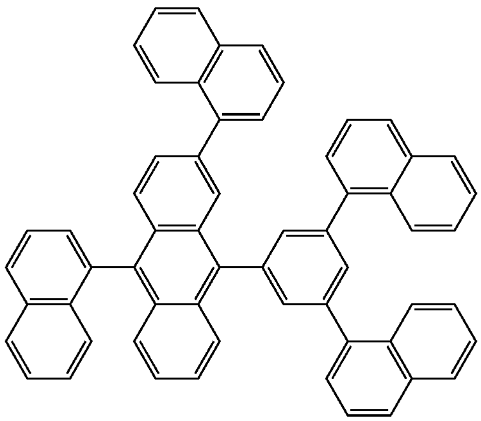
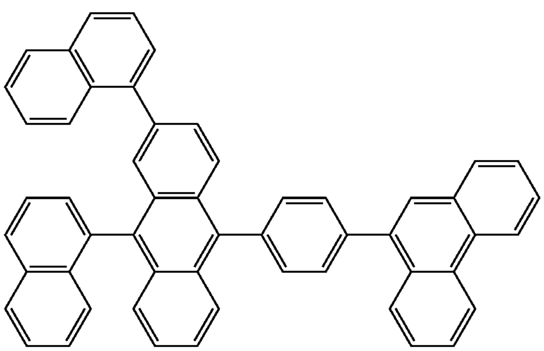
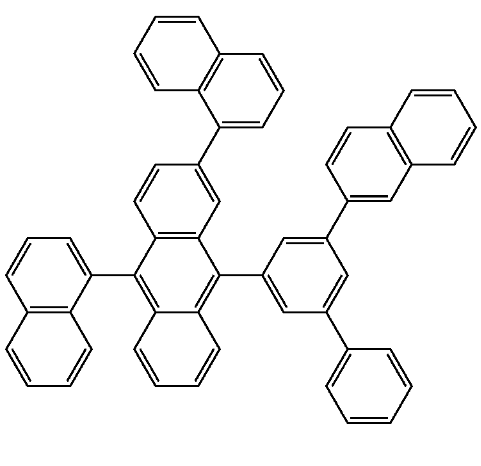
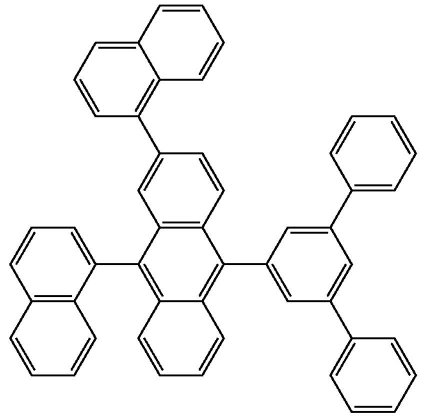
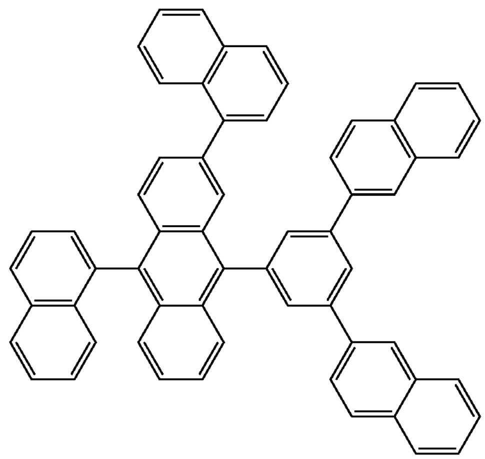
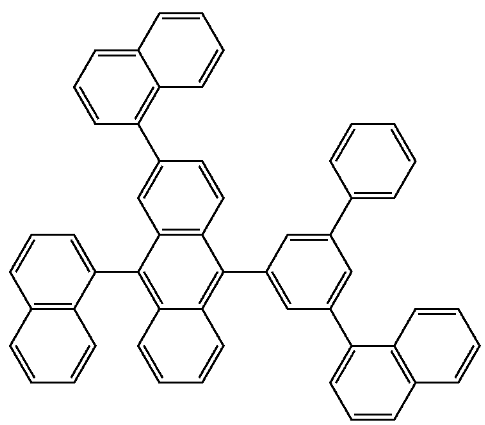
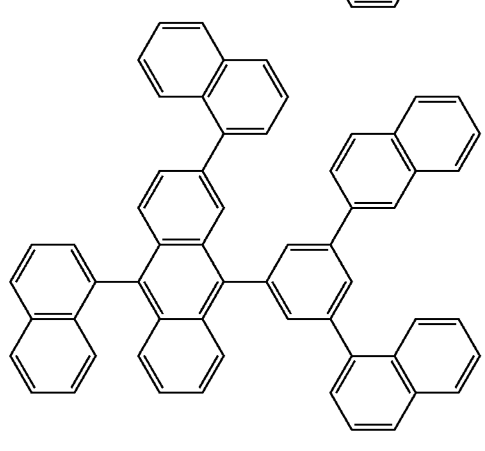

-continued
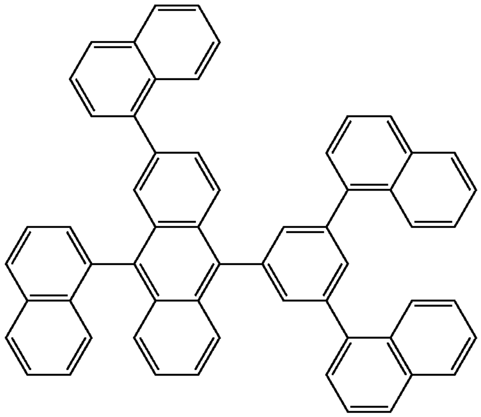
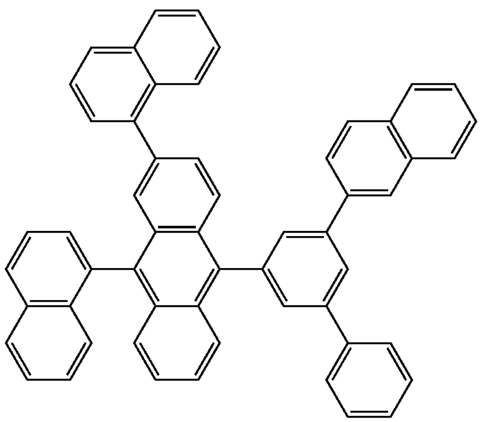
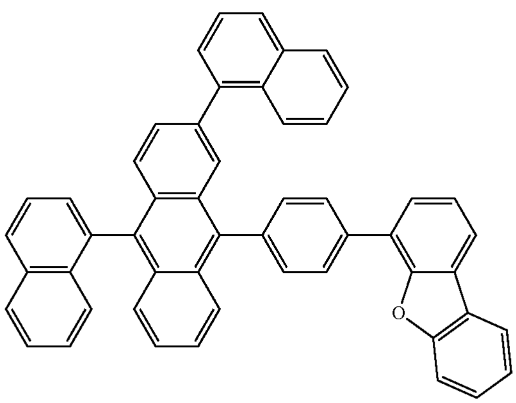
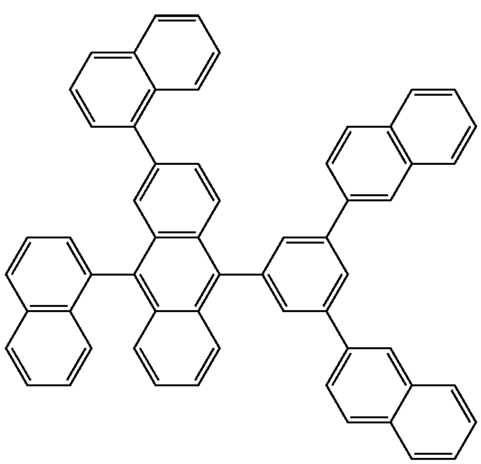
-continued
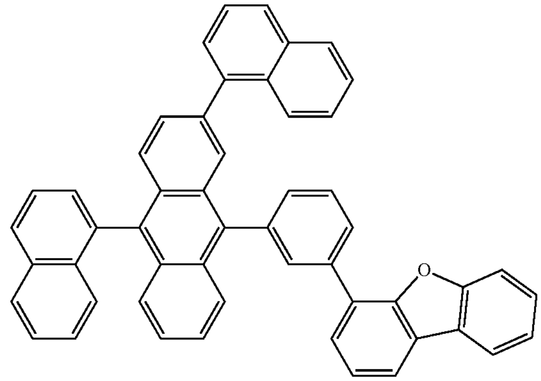
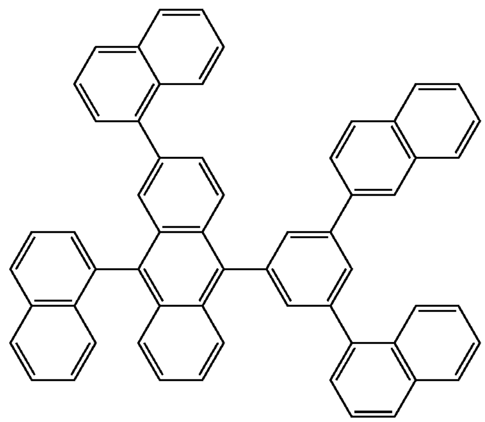
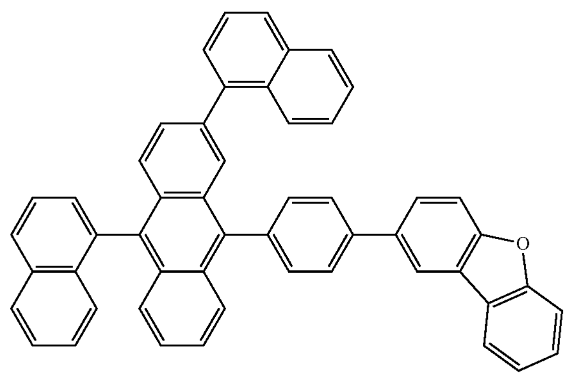
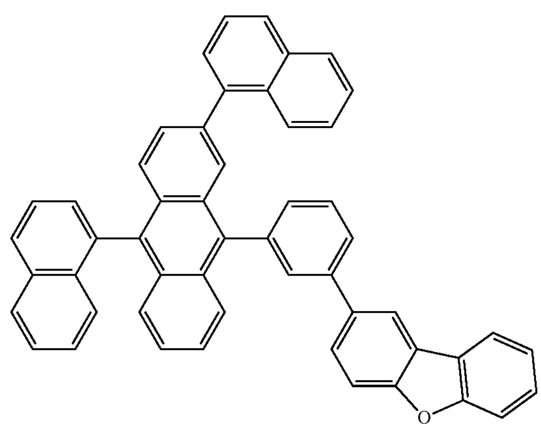

-continued
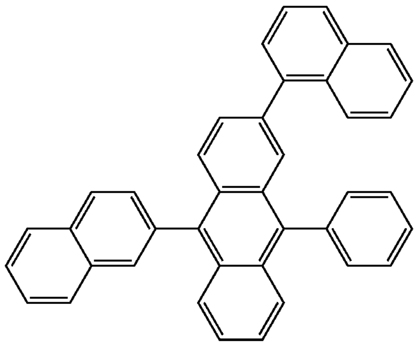
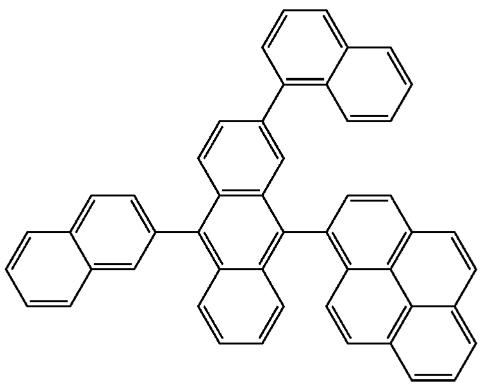
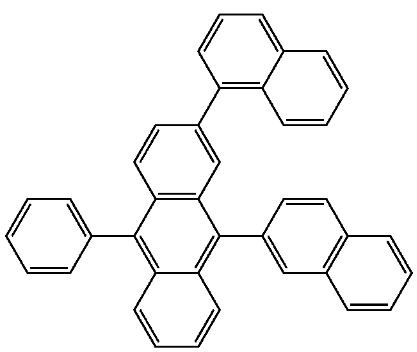
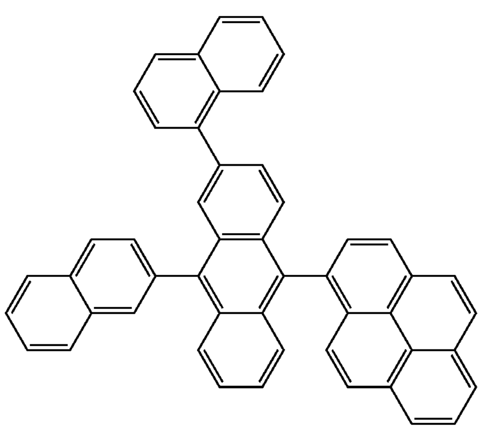
-continued
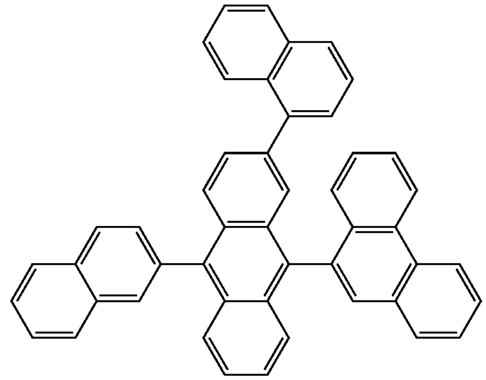
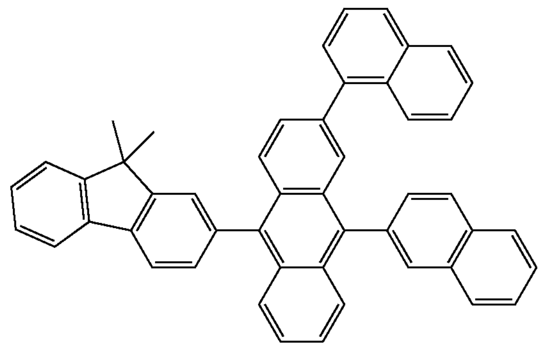
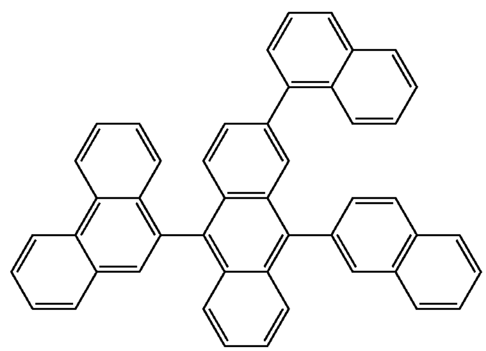
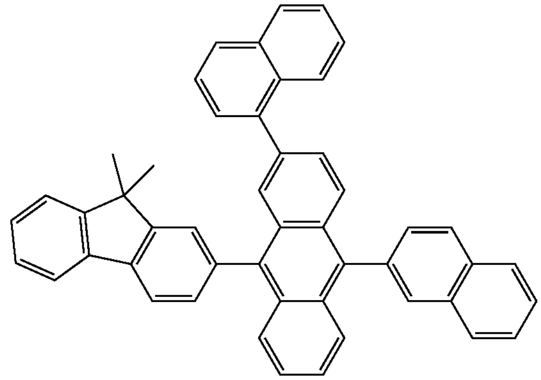

-continued
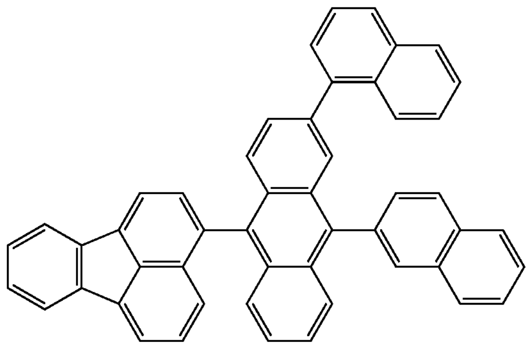
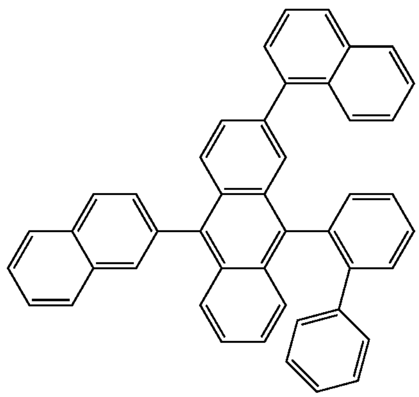
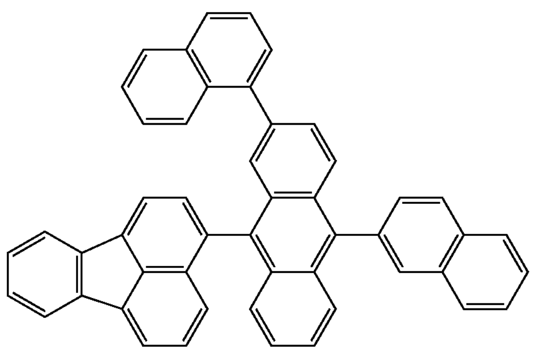
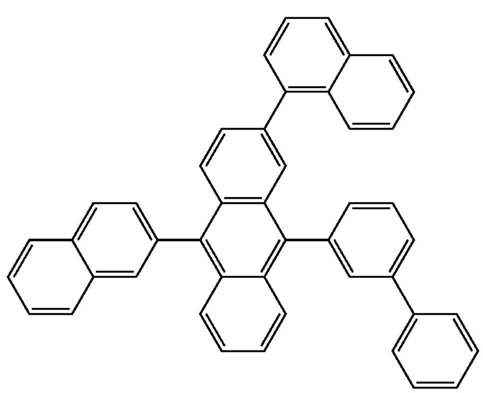
-continued
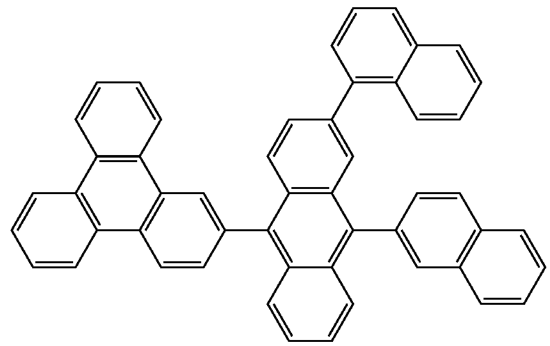
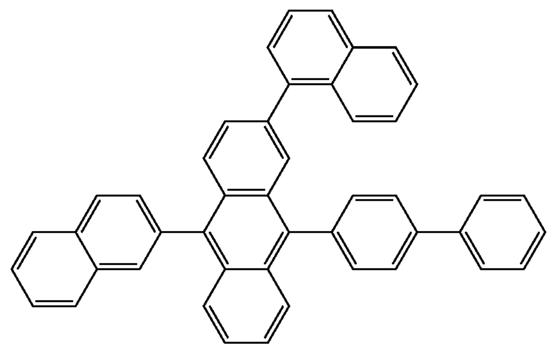
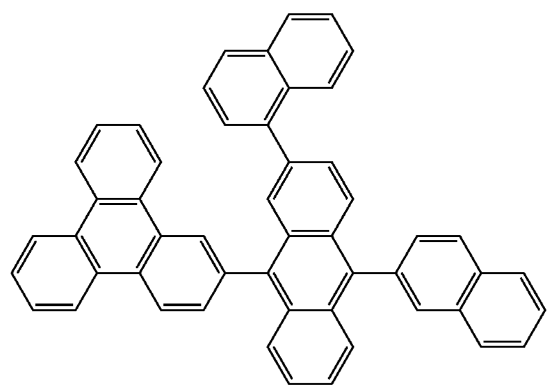
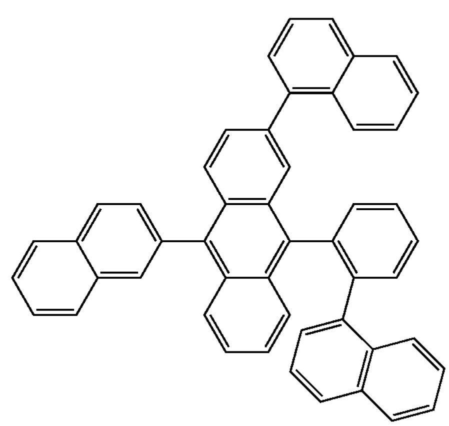

-continued
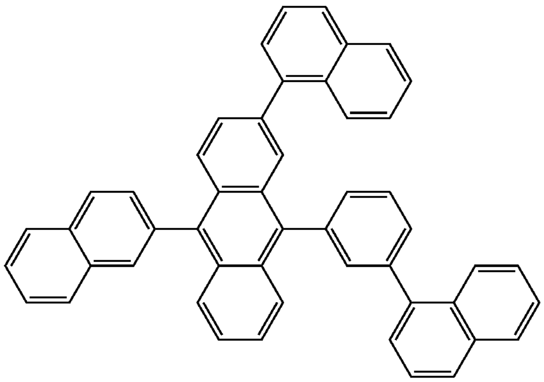
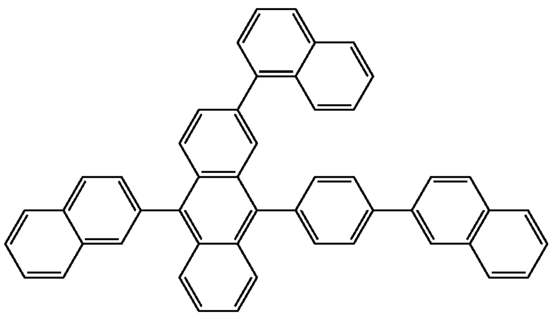
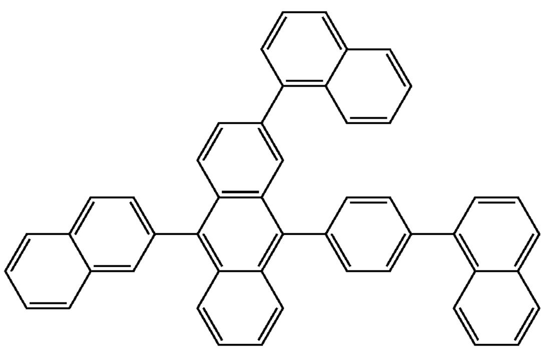
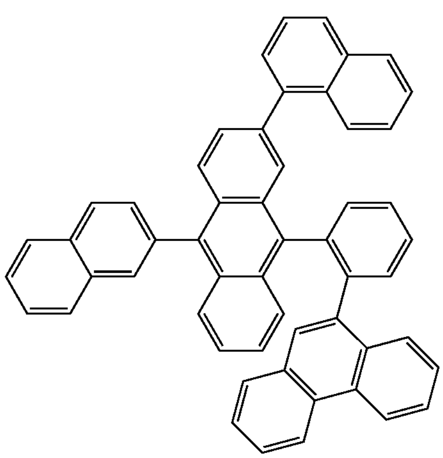
-continued
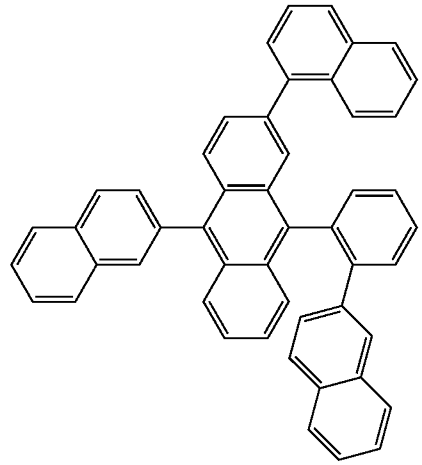
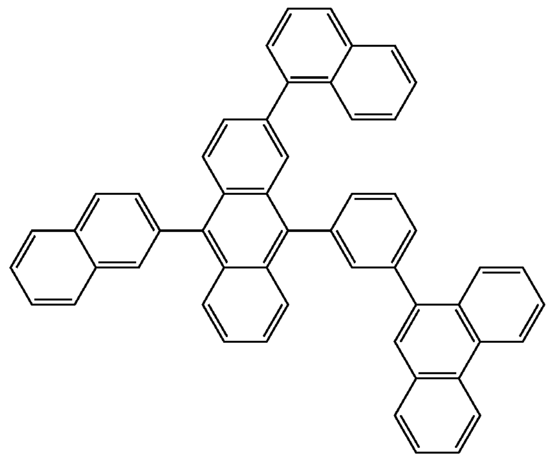
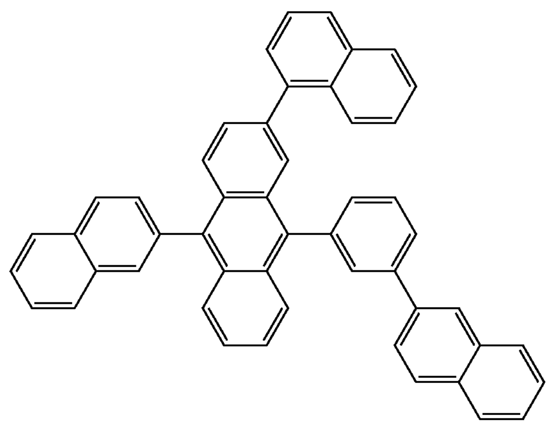
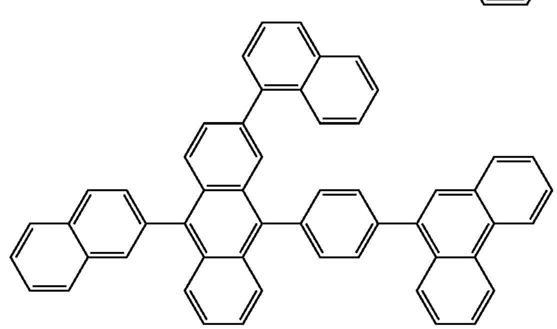

-continued
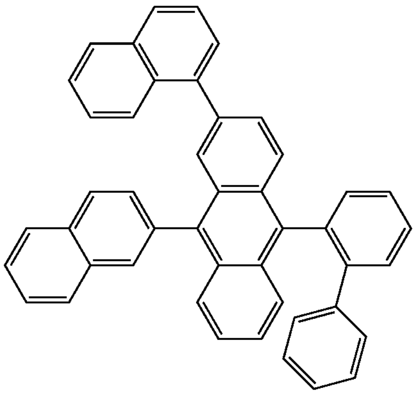
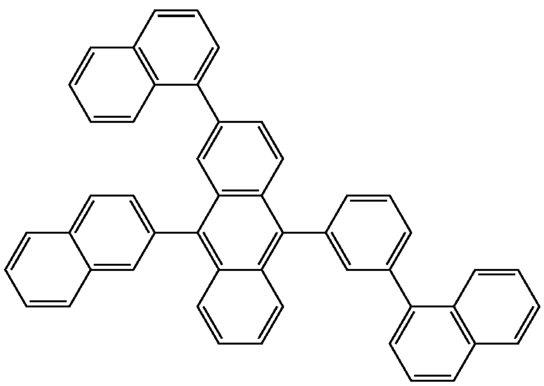
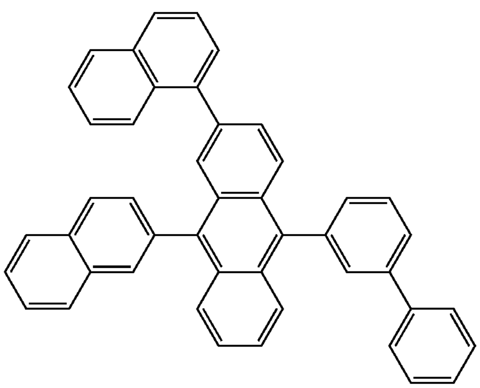
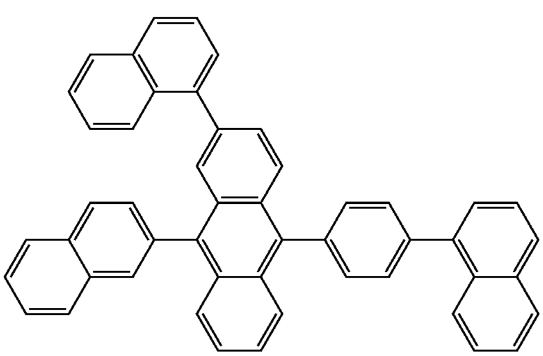
-continued
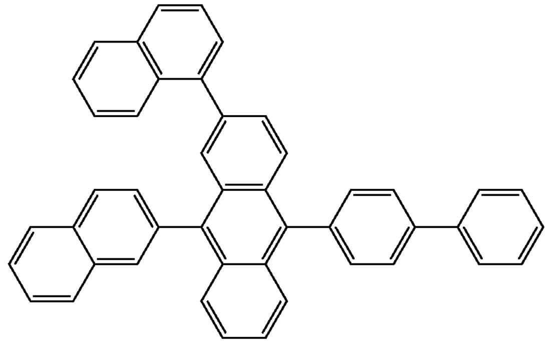
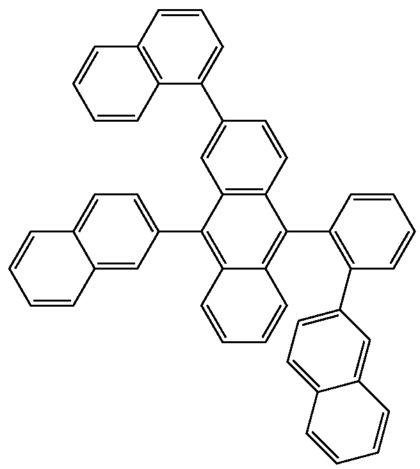
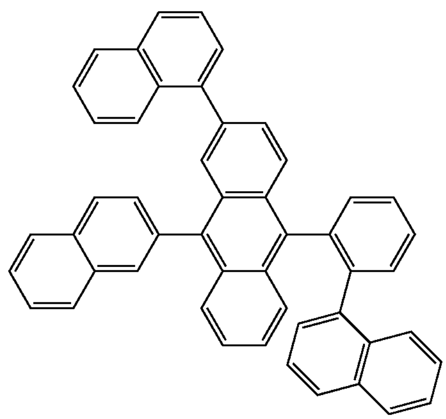
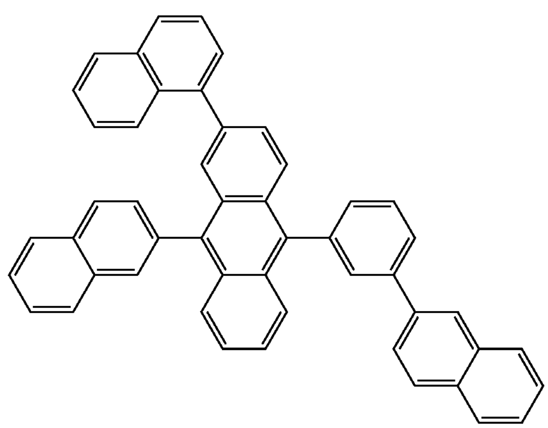

-continued
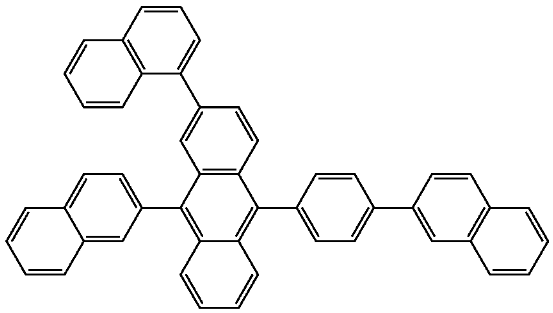
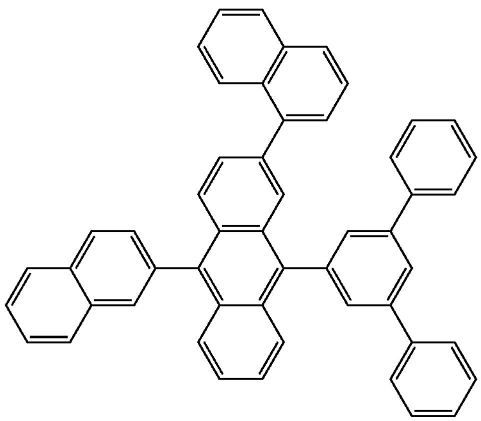
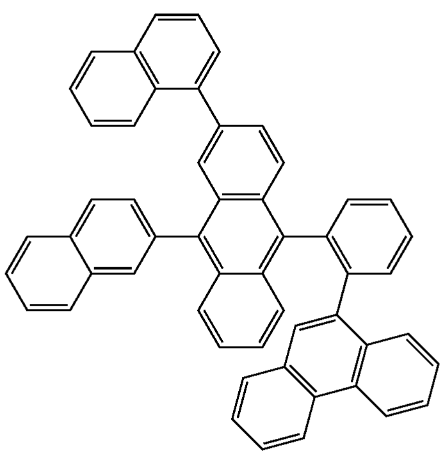
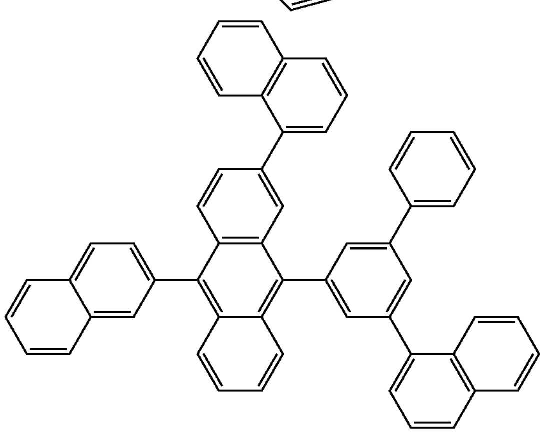
-continued
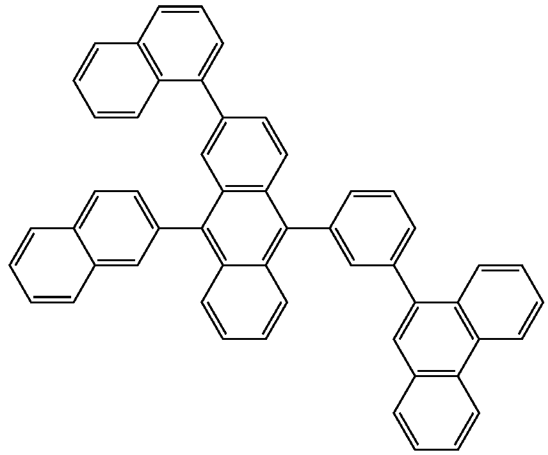
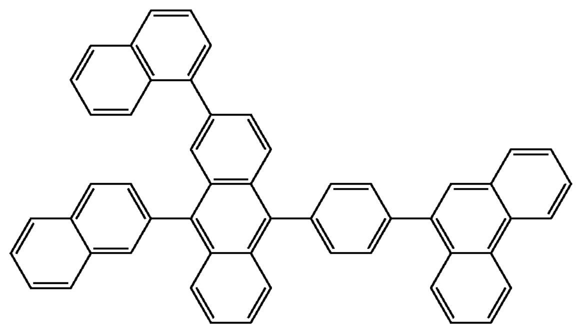
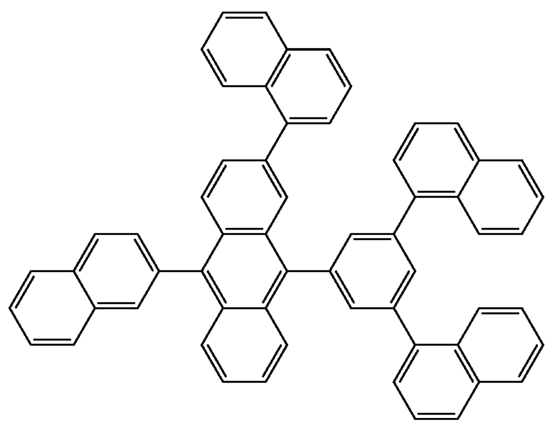
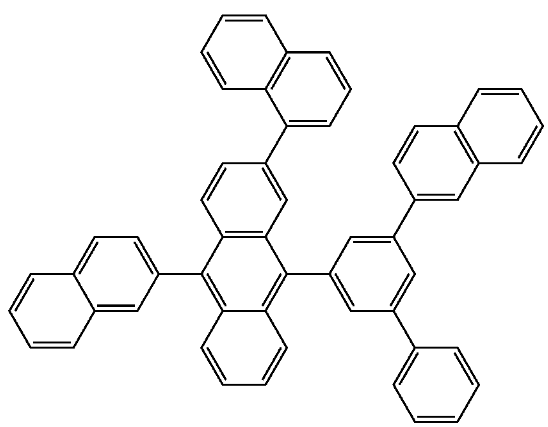

-continued
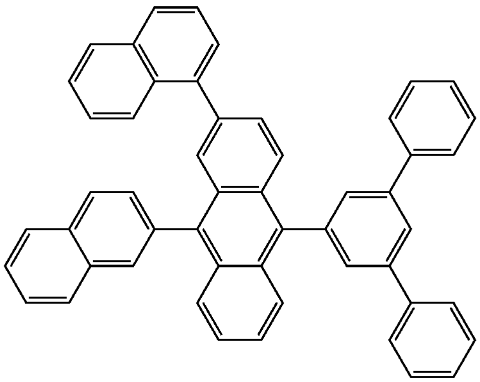
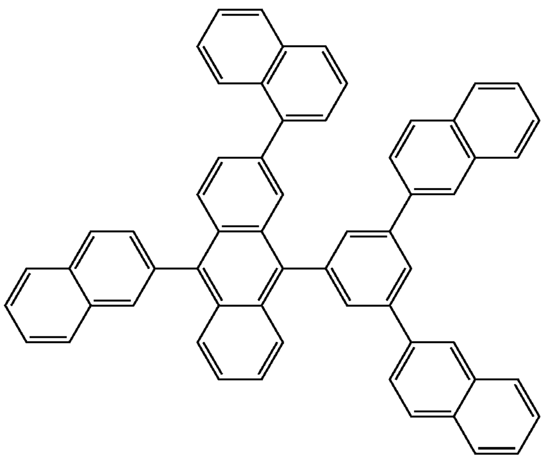
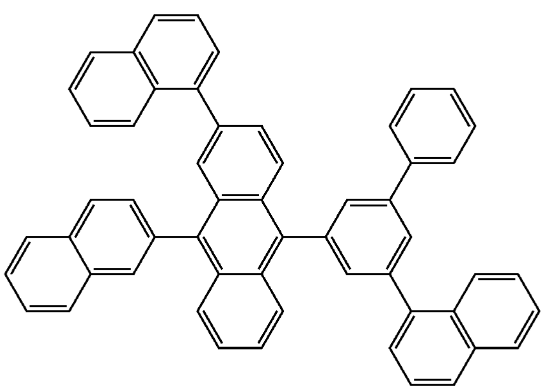
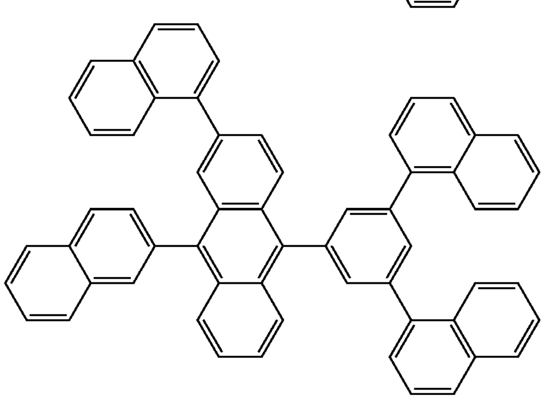
-continued
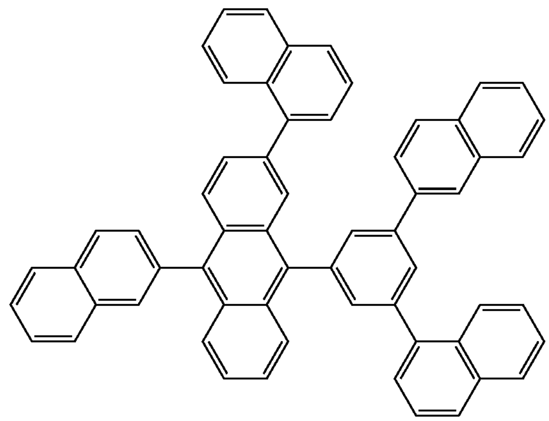
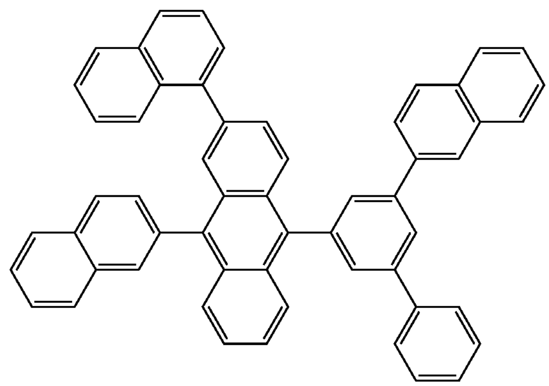
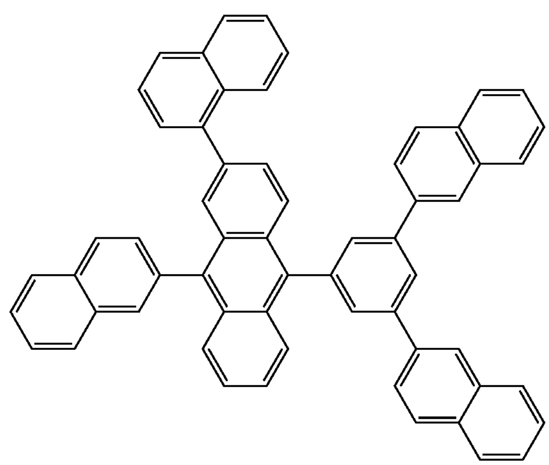
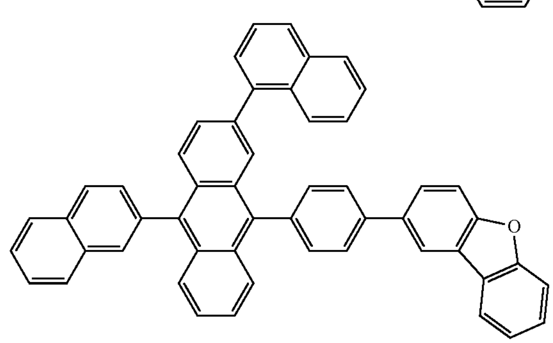

-continued
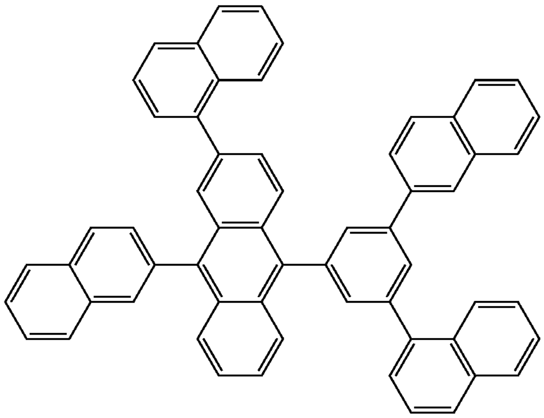
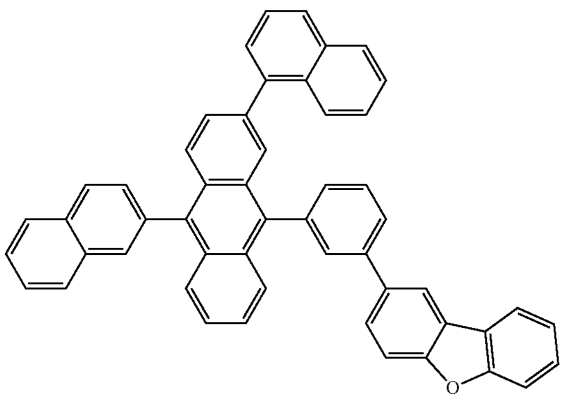
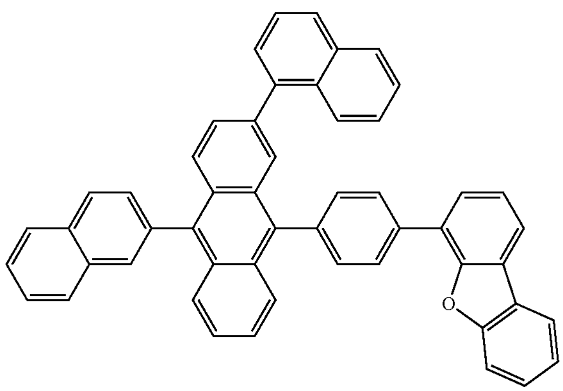
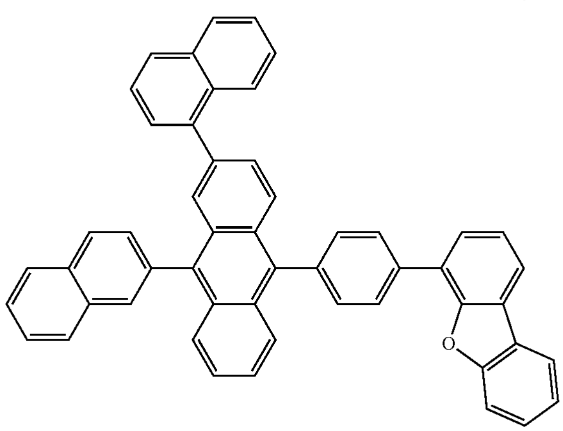
-continued
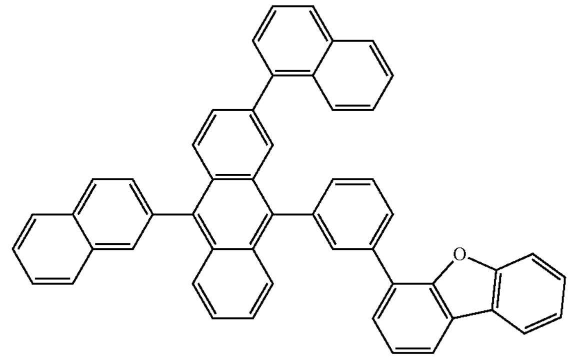
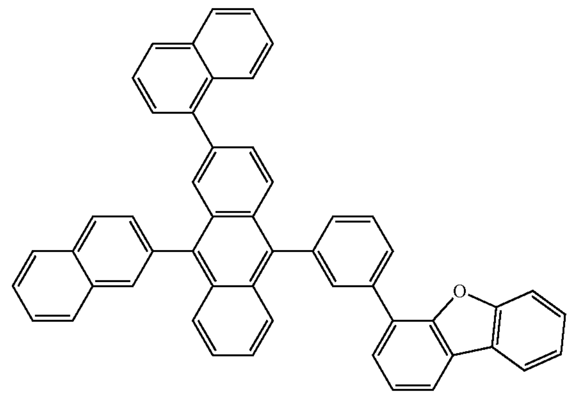
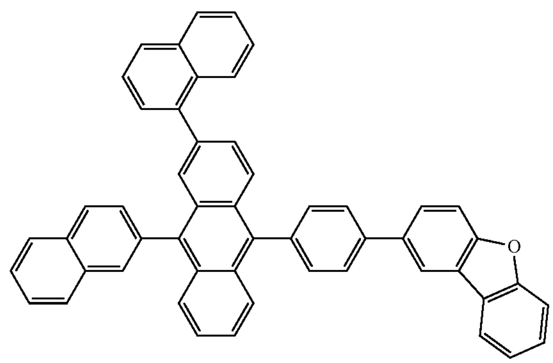
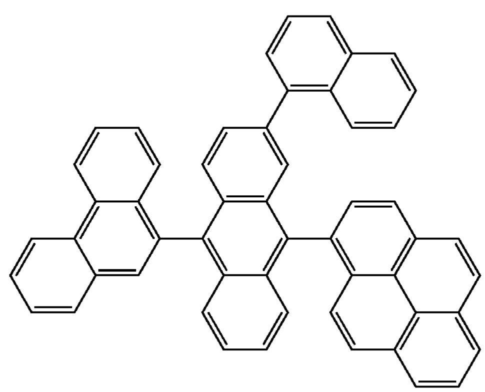

-continued
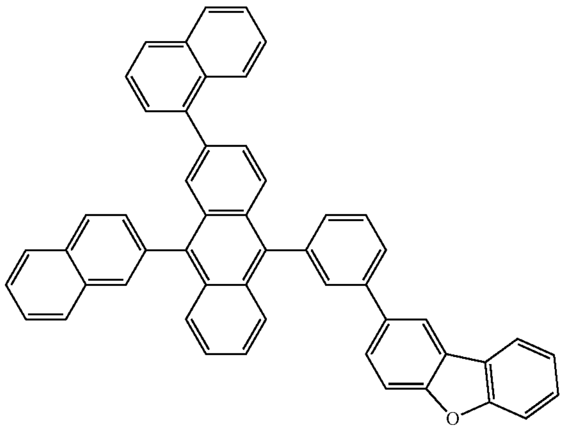
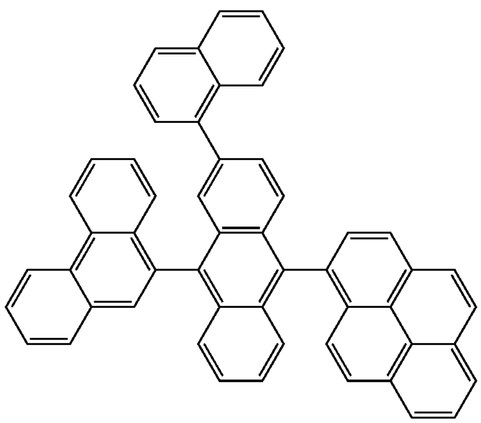
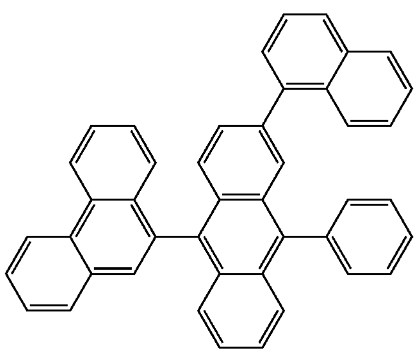
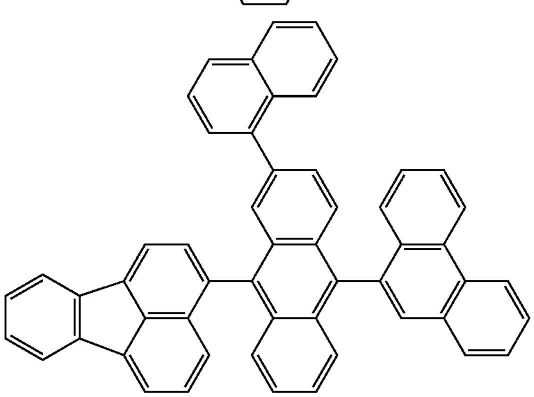
-continued
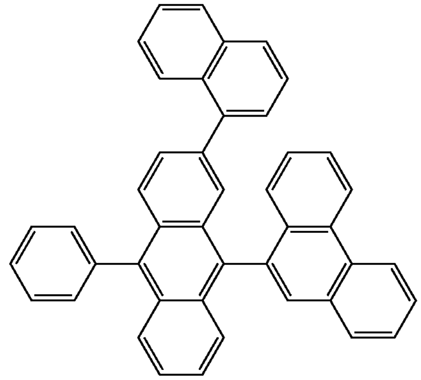
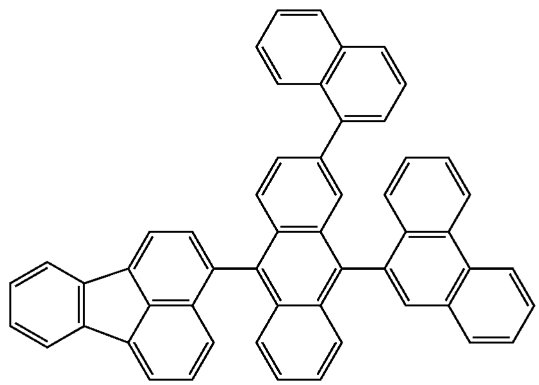
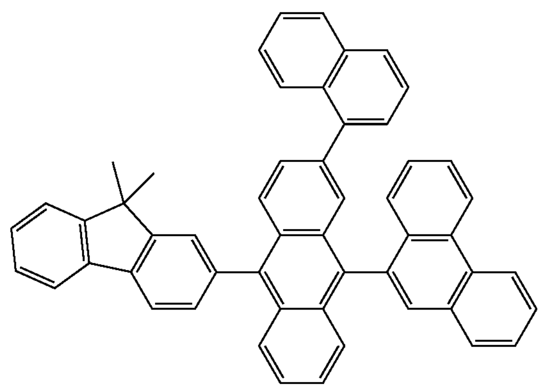
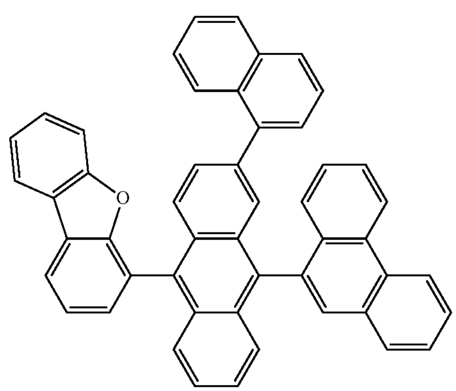

-continued
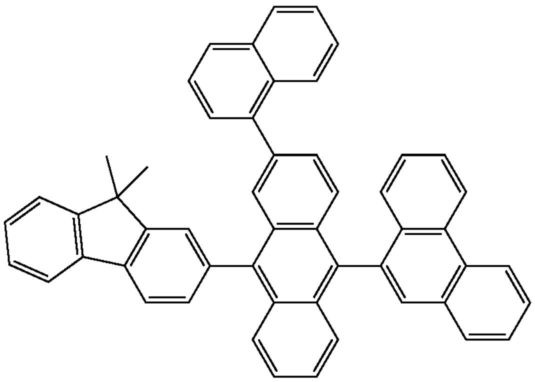
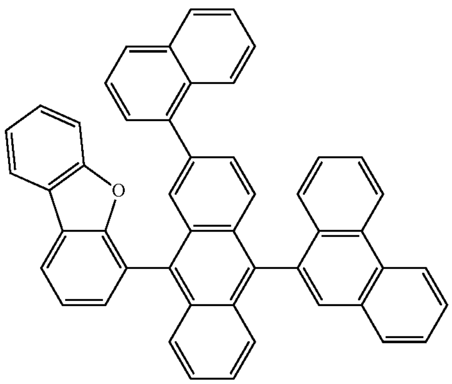
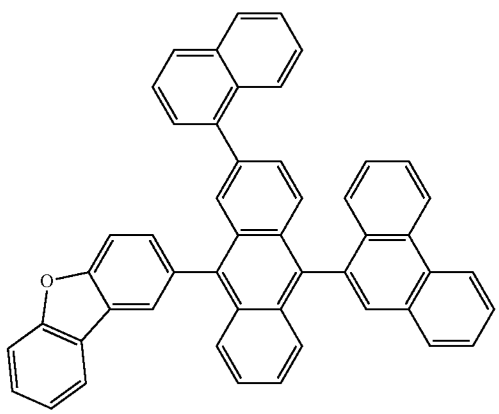
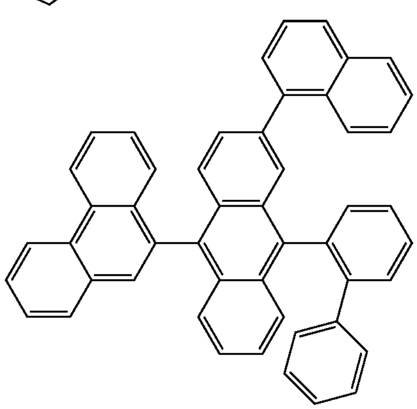
-continued
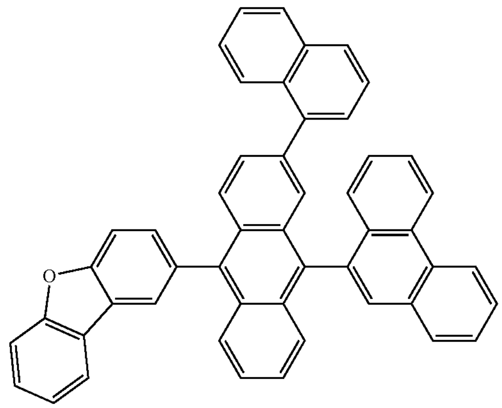
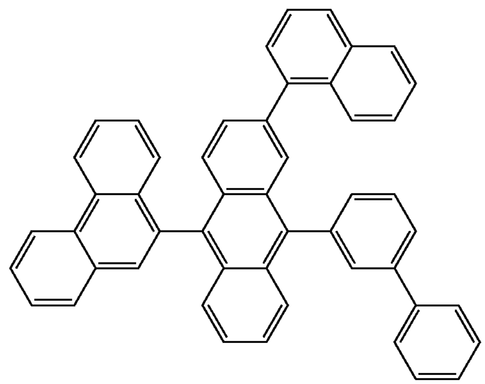
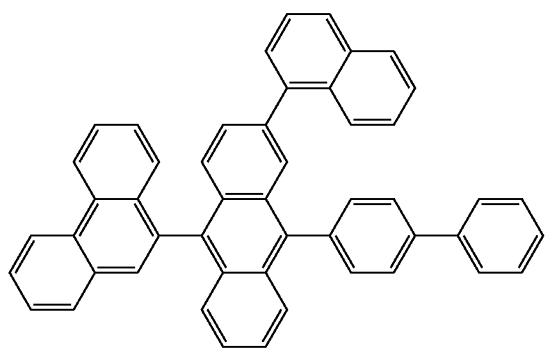
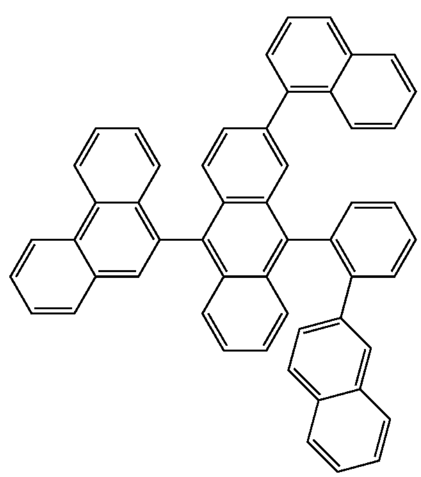

-continued
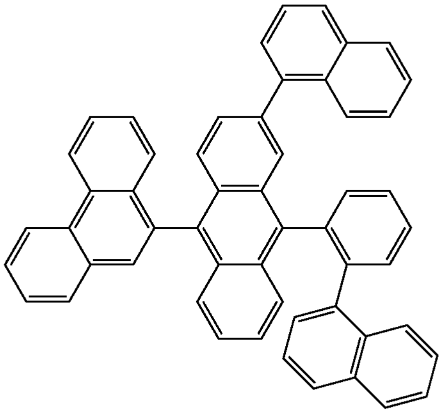
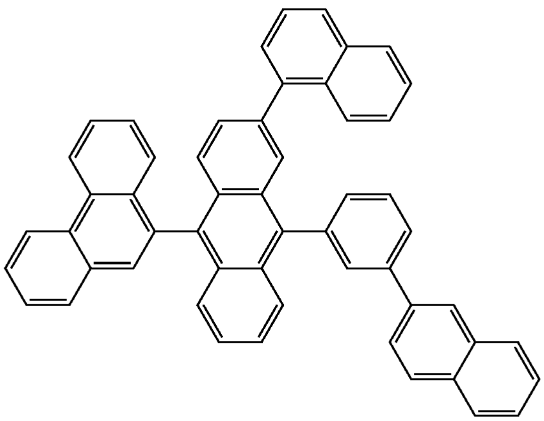
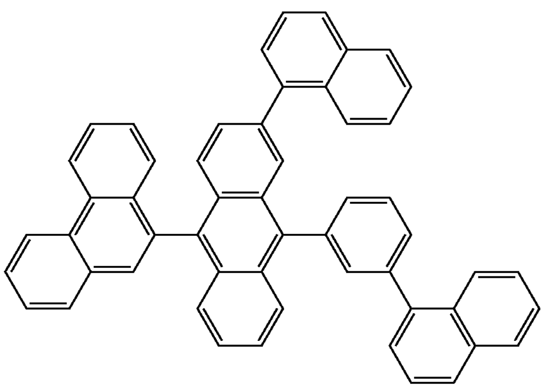
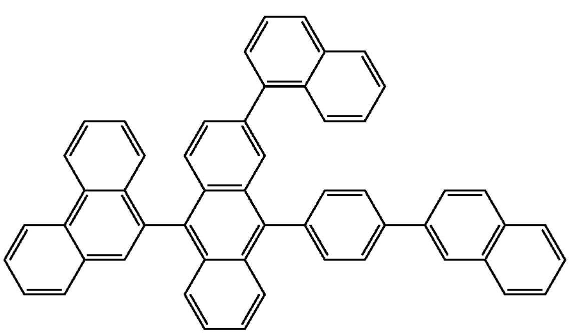
-continued
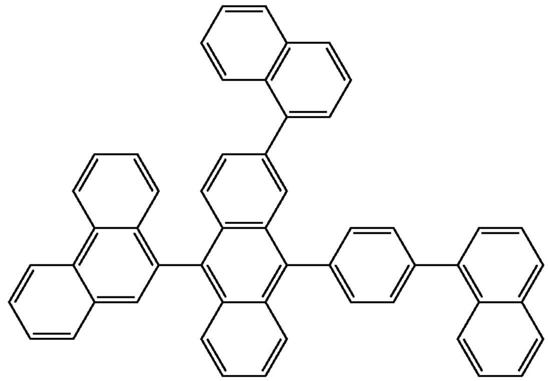
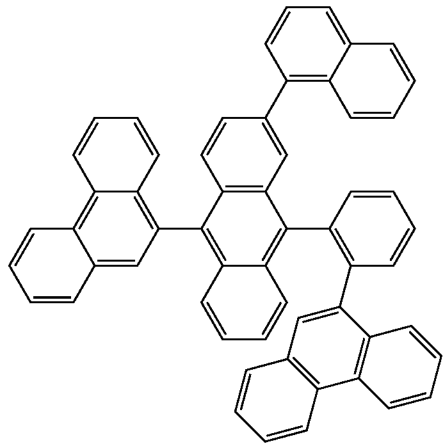
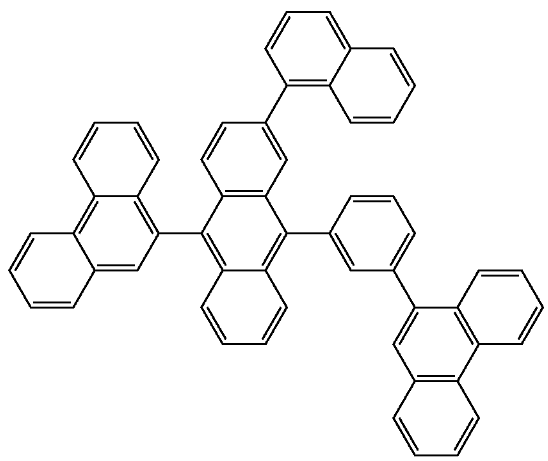
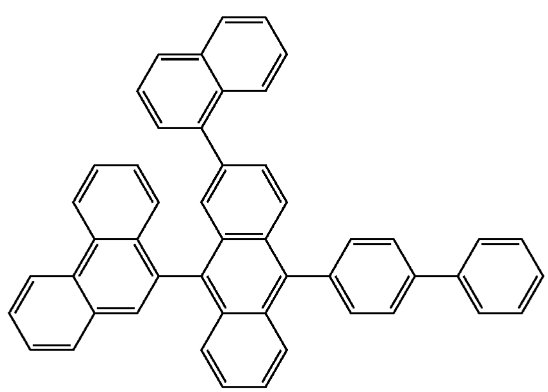

-continued
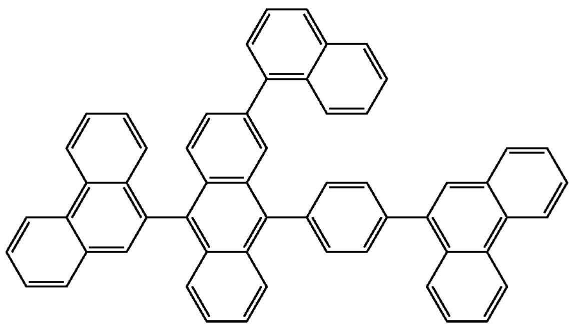
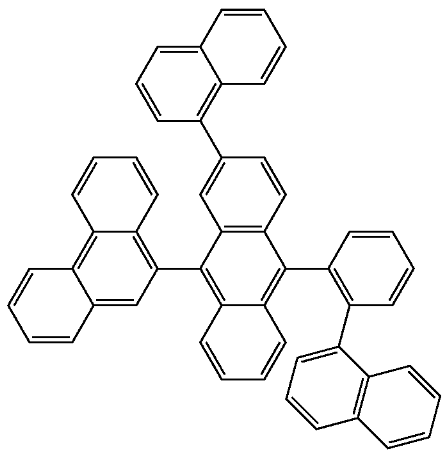
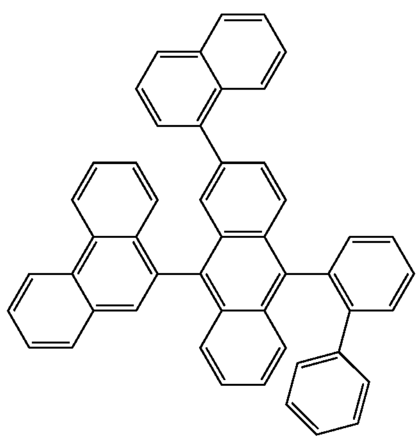
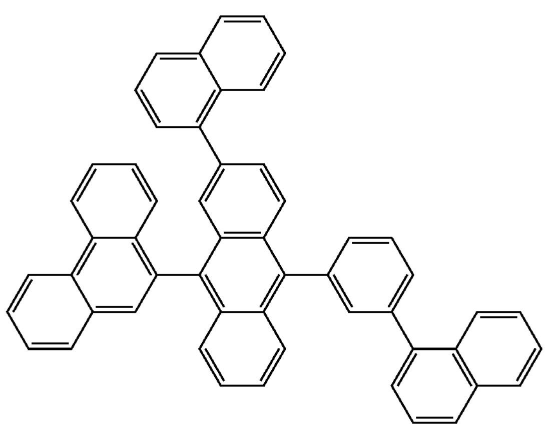
-continued
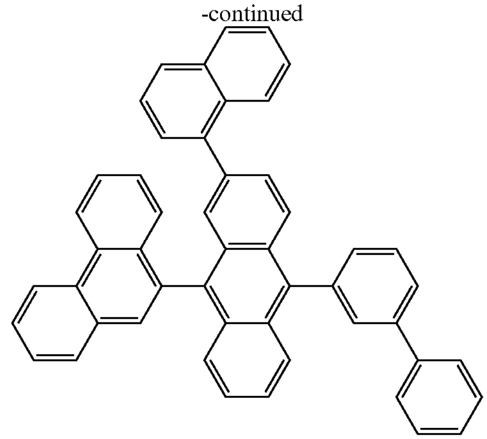
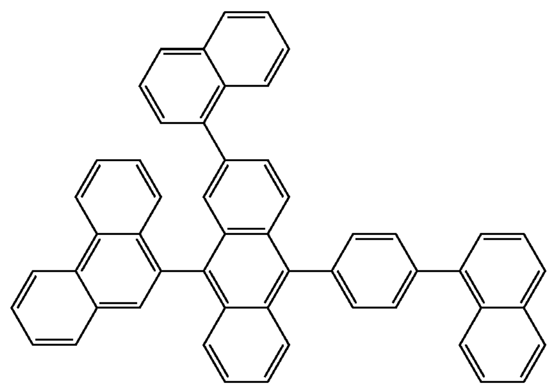
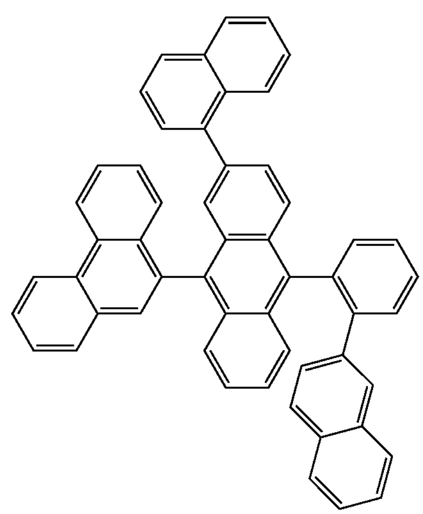

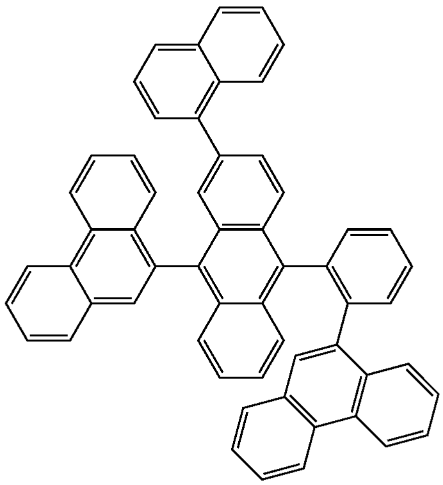
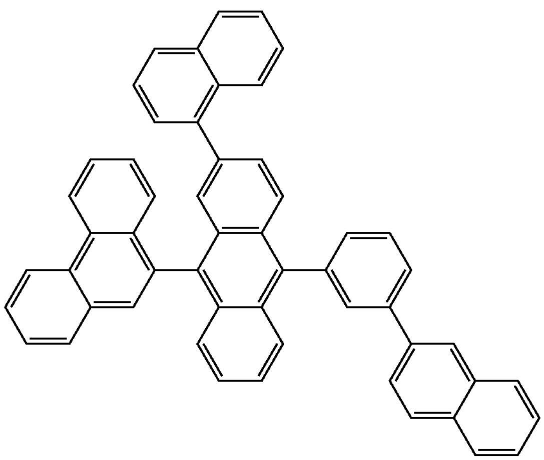
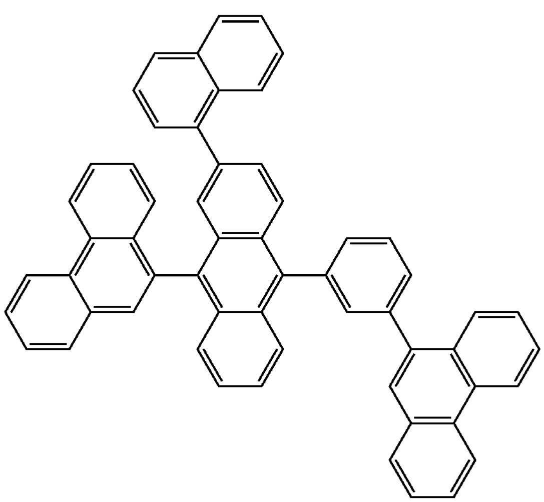
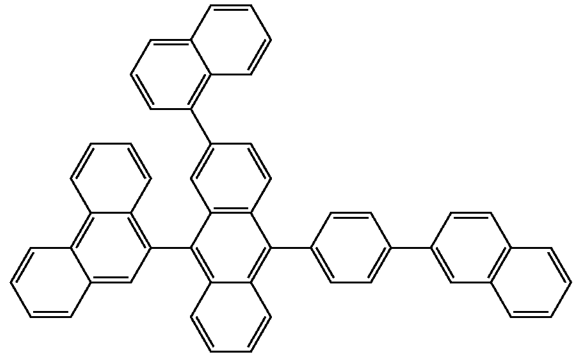
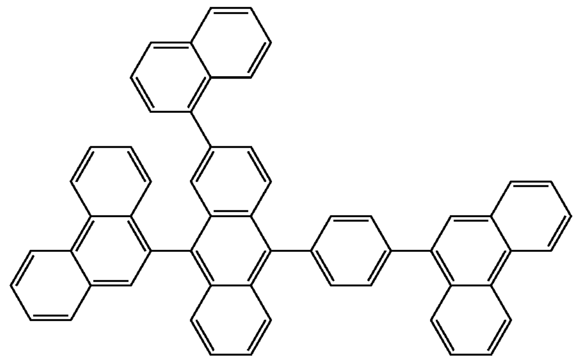
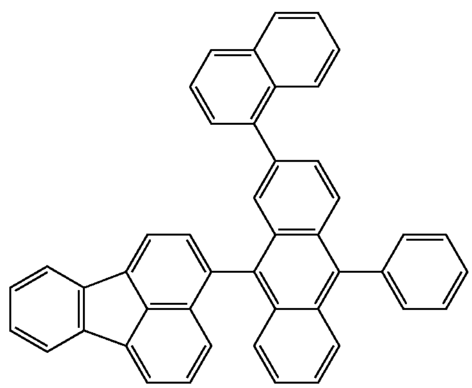
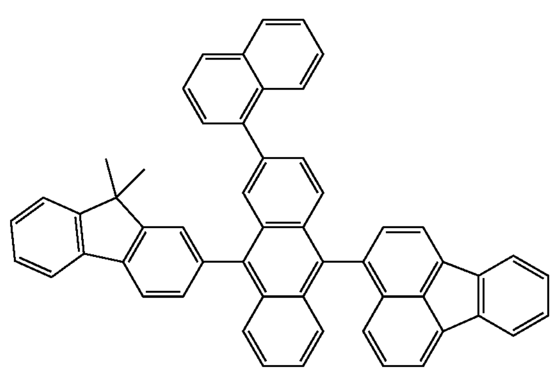

-continued
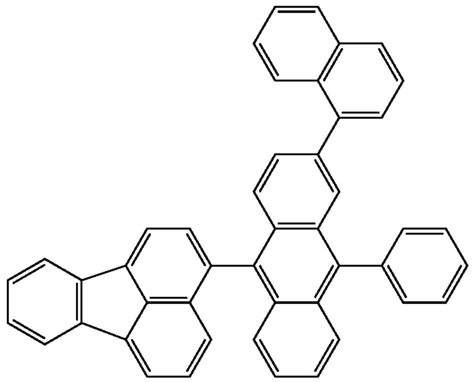
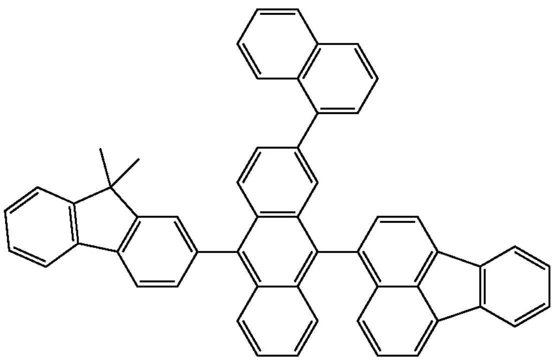
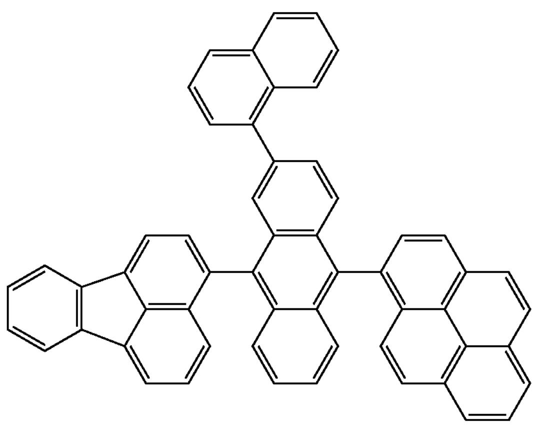
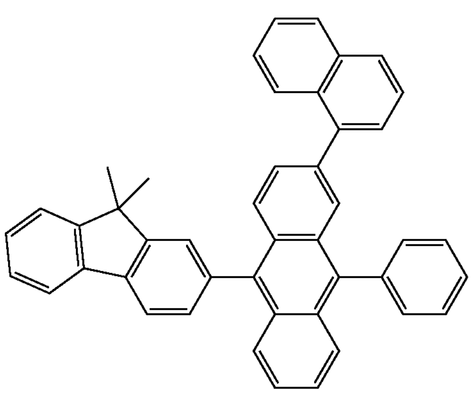
-continued
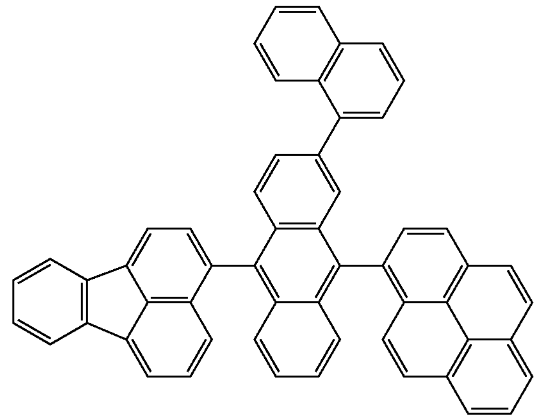
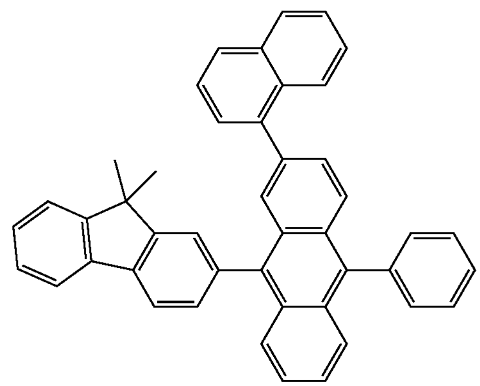
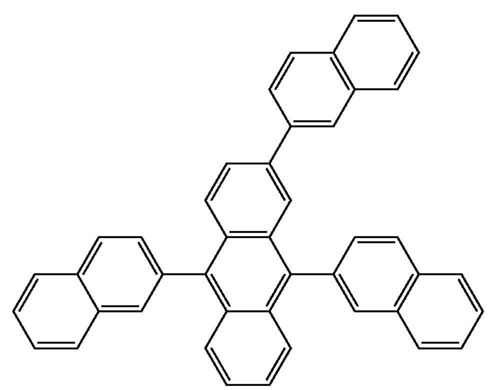
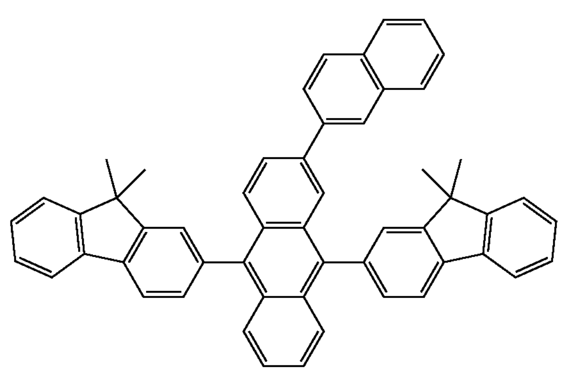

-continued
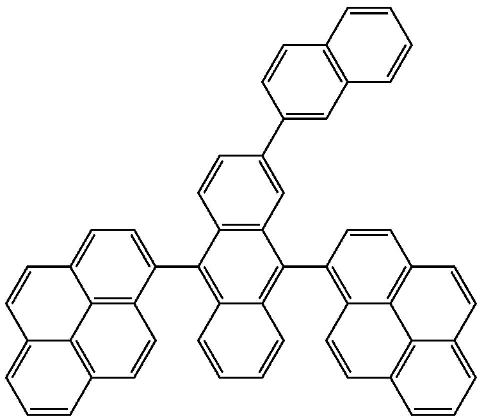
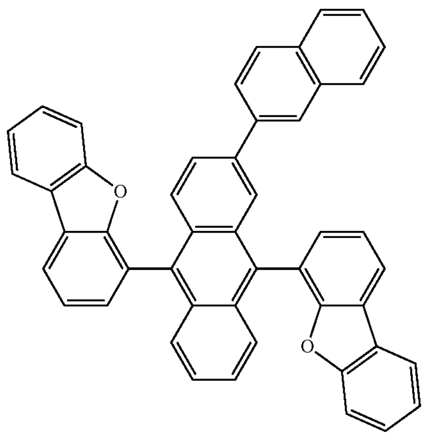
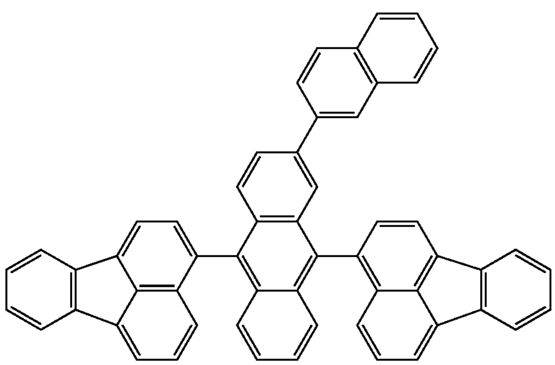
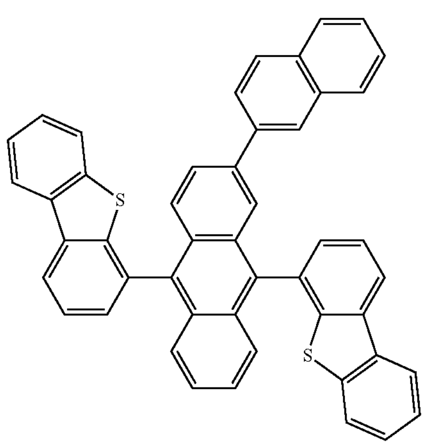
-continued
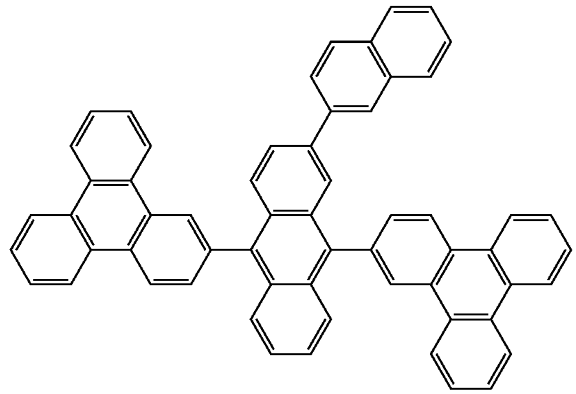
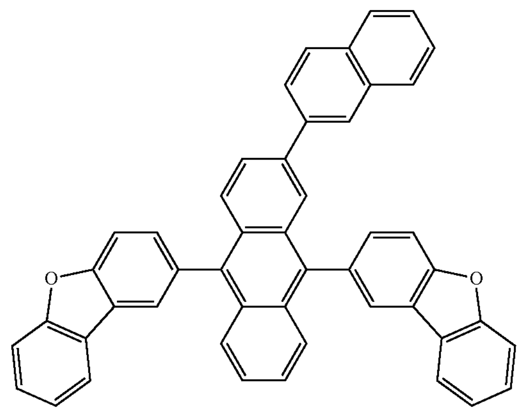
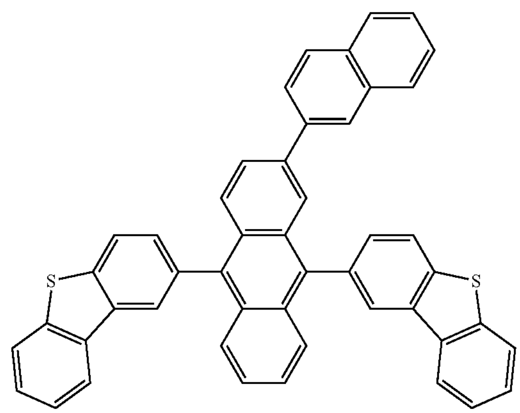
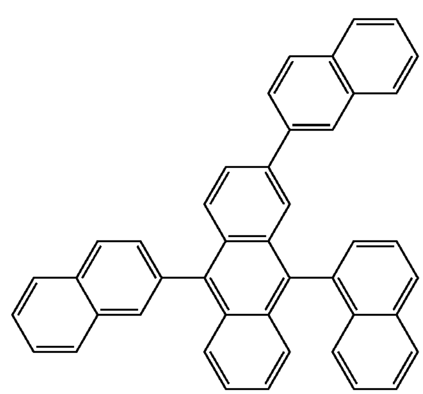

-continued
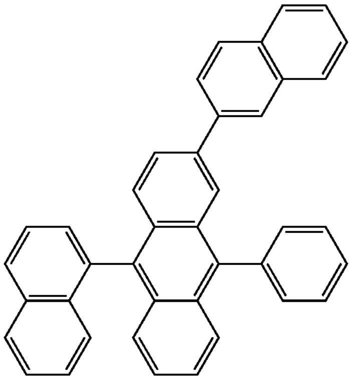
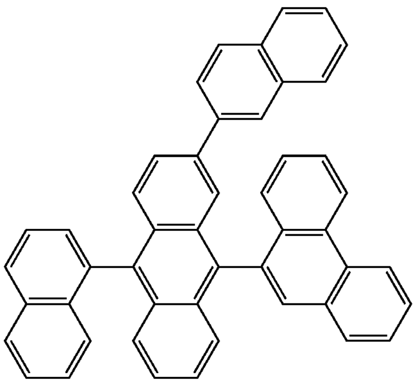
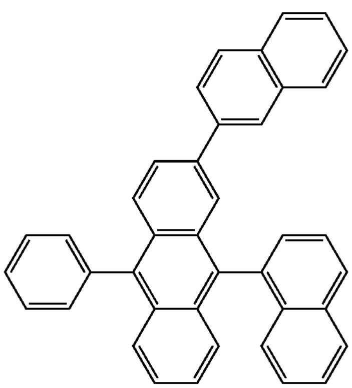
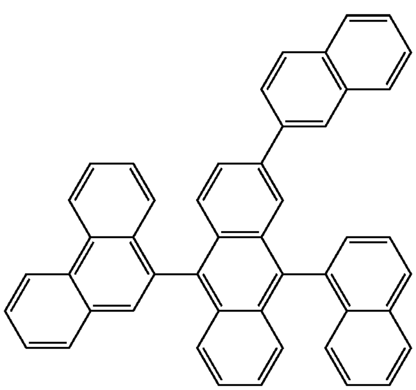
-continued
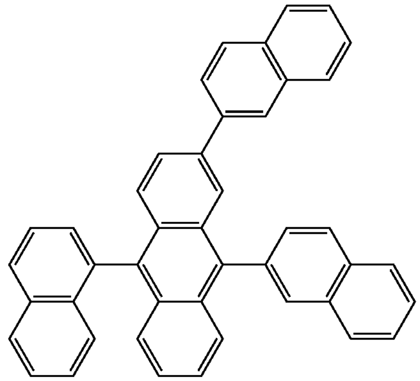
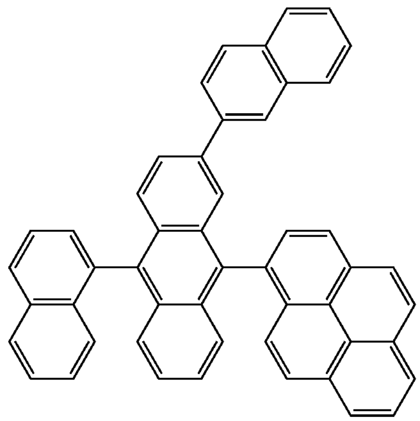
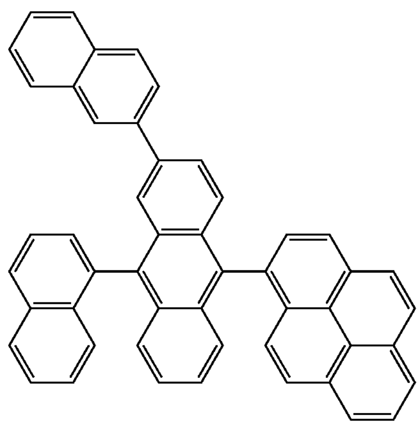
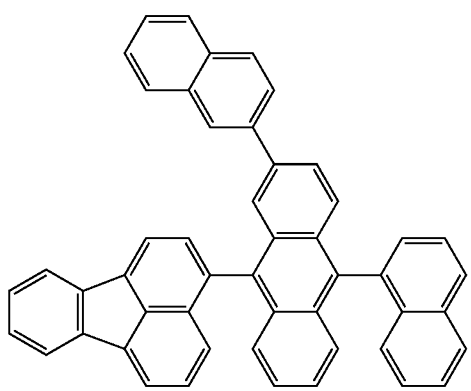

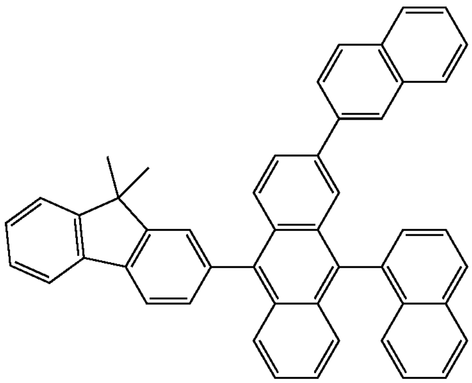
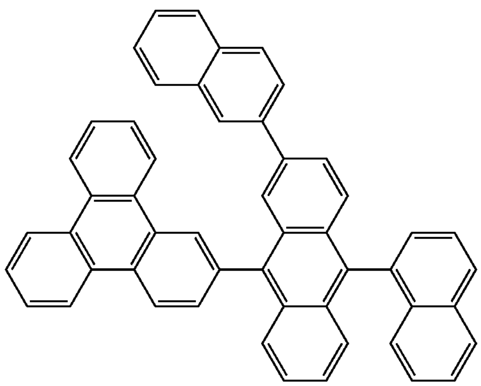
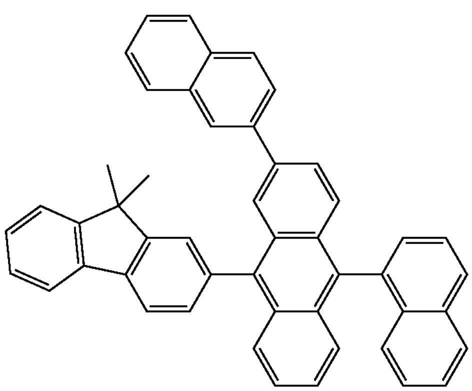
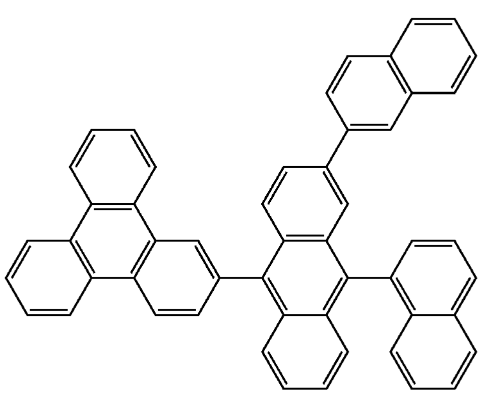
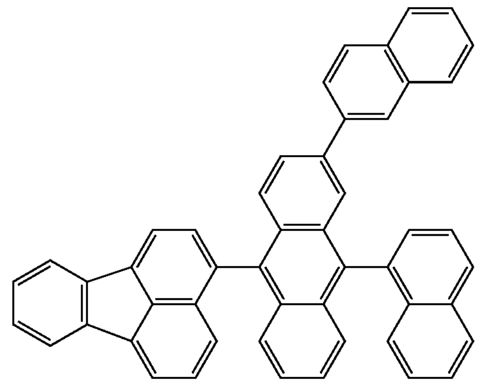
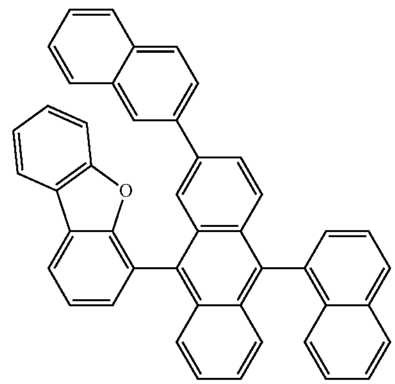
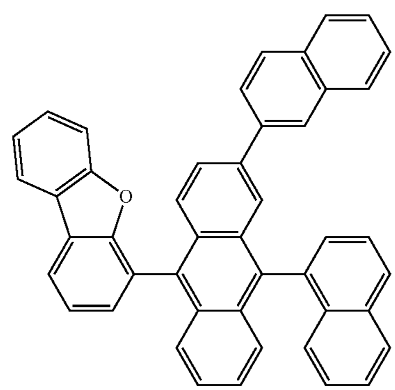
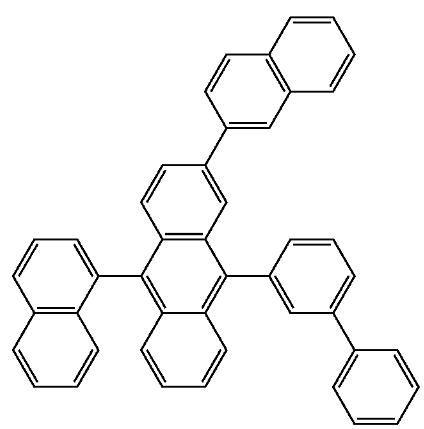
O -continued
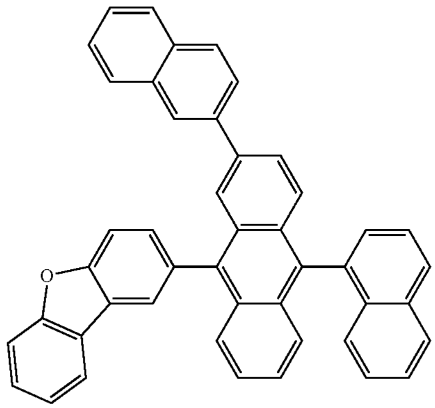
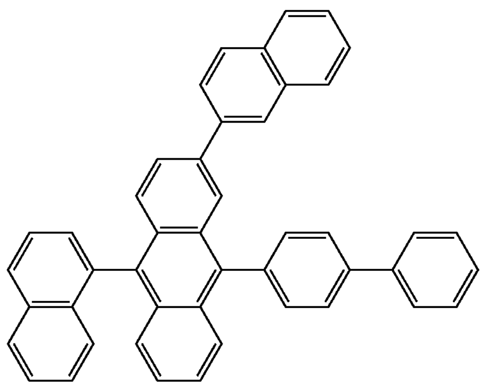
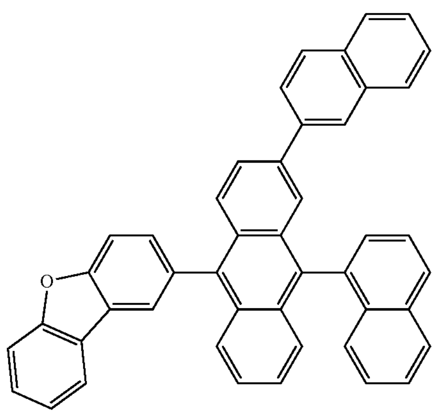
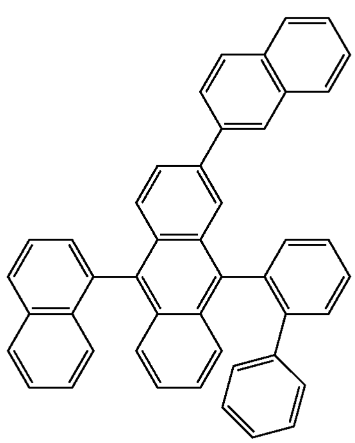
-continued
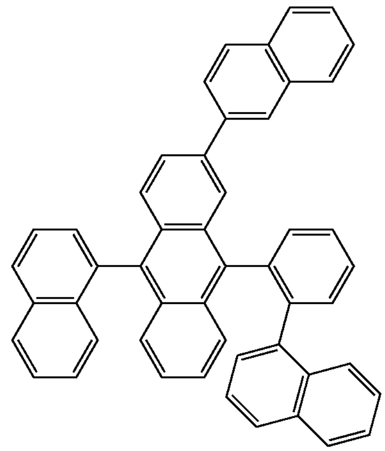
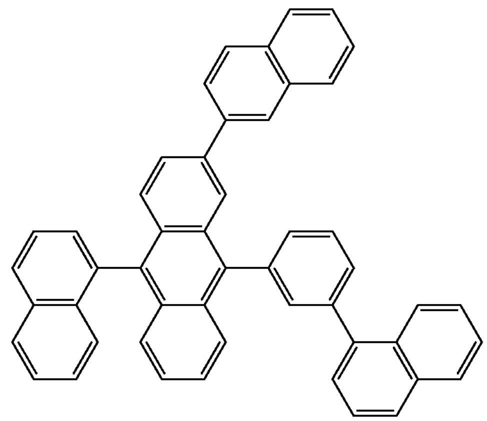
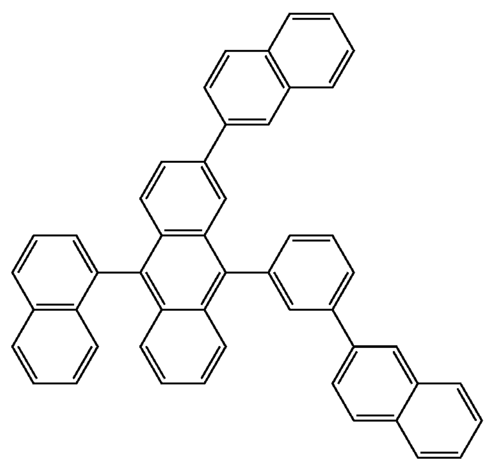
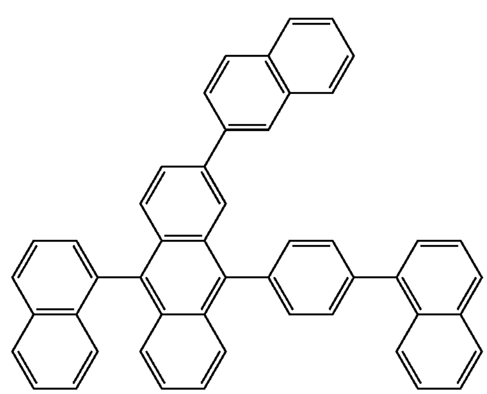

-continued
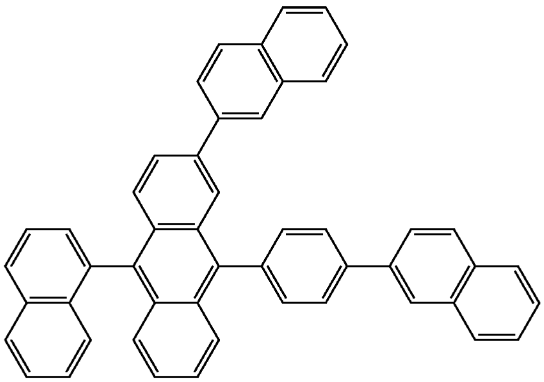
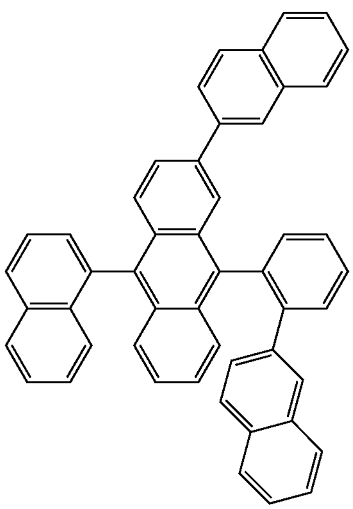
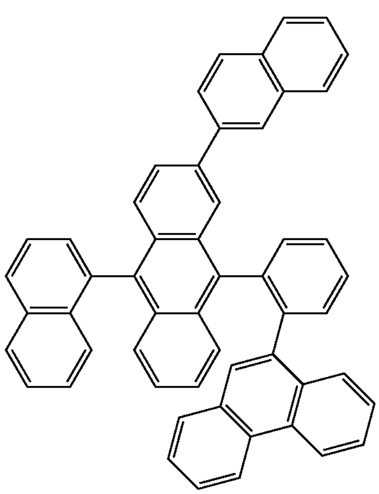
-continued
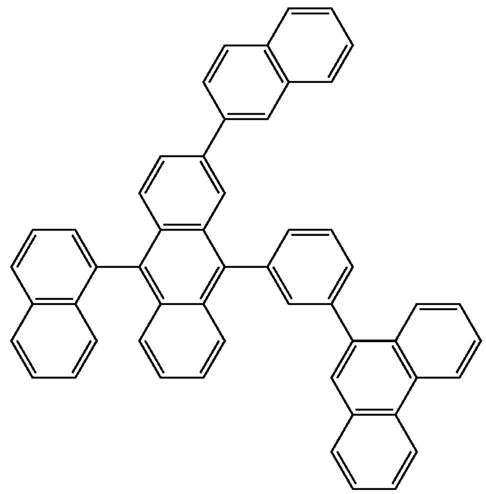
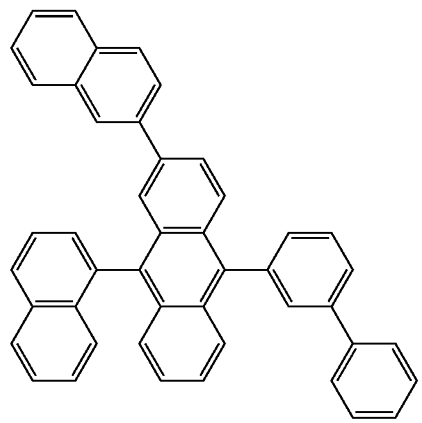
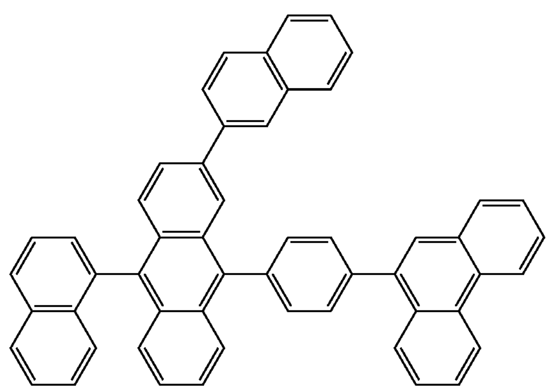
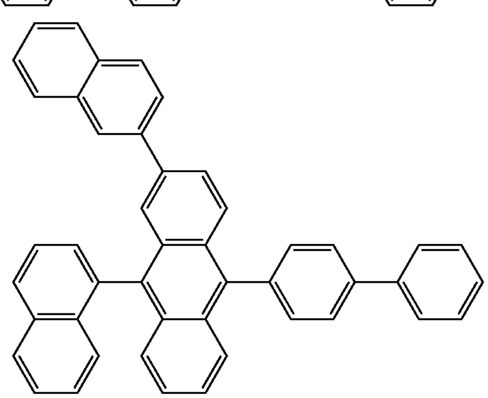

-continued
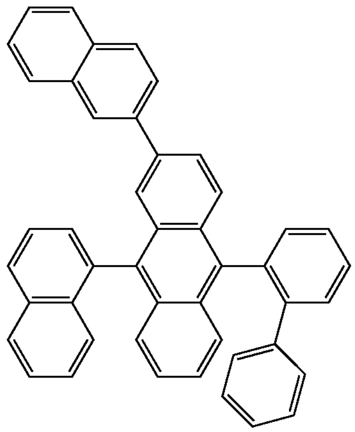
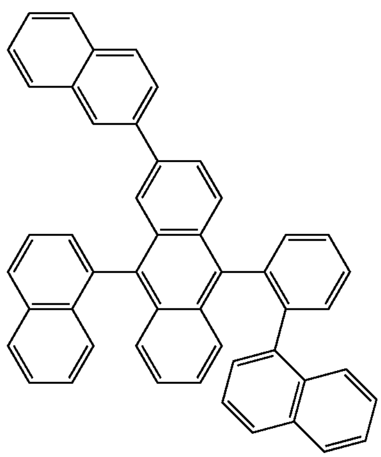
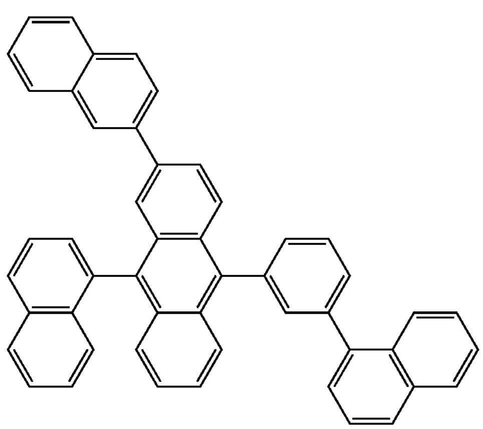
-continued
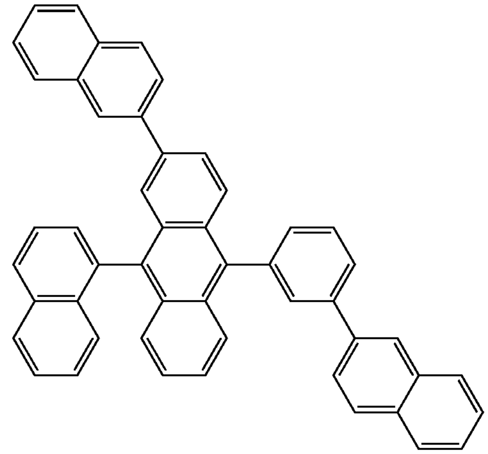
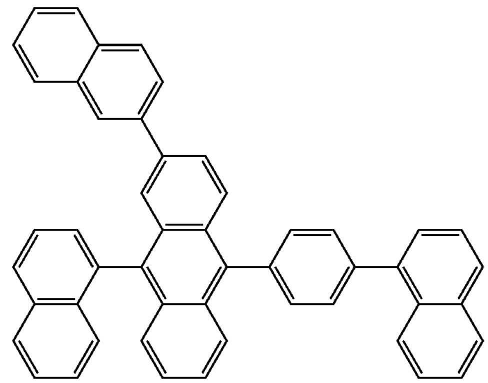
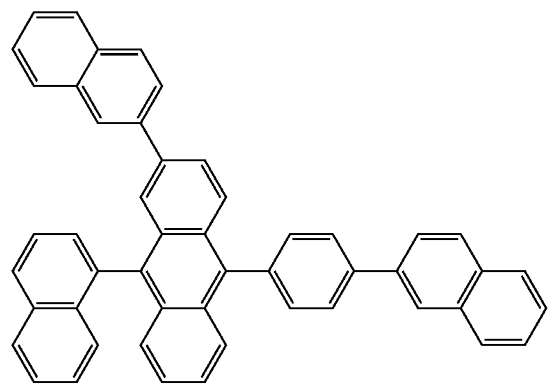
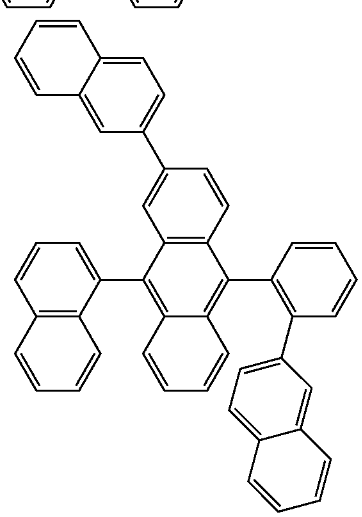

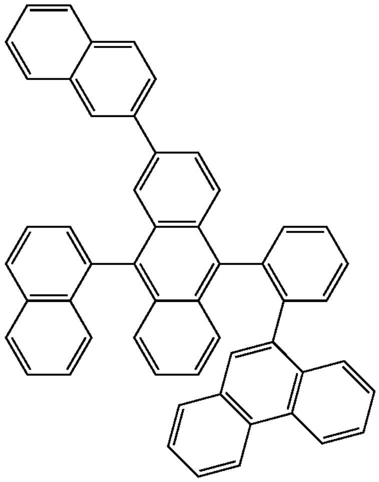
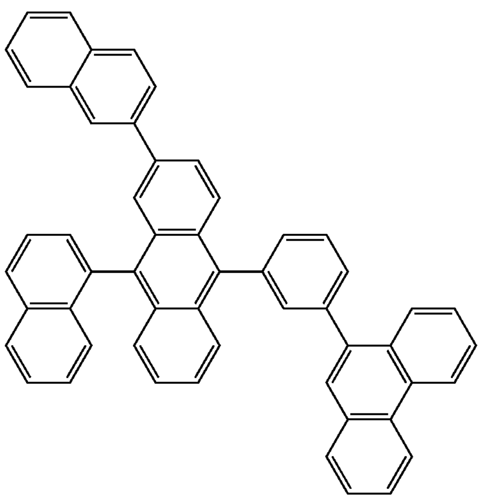
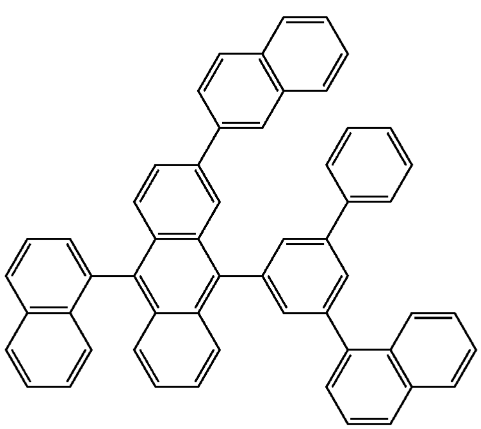
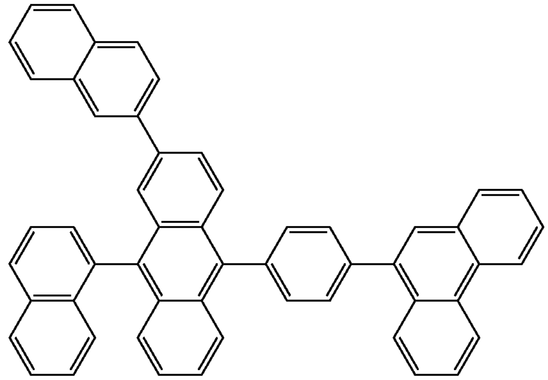
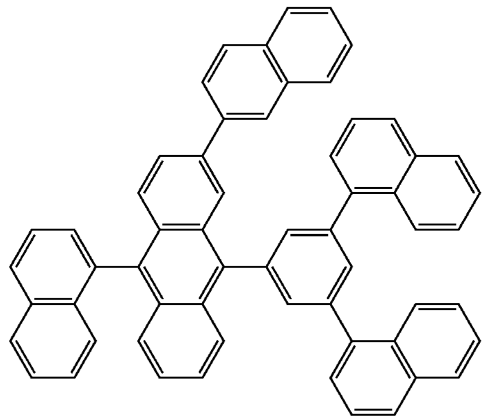
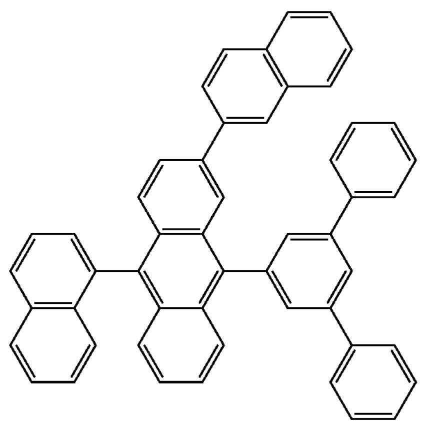
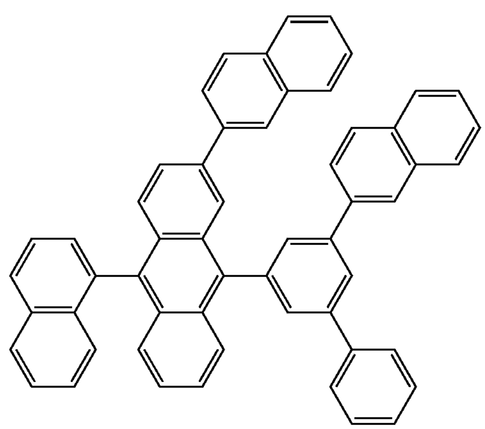

-continued
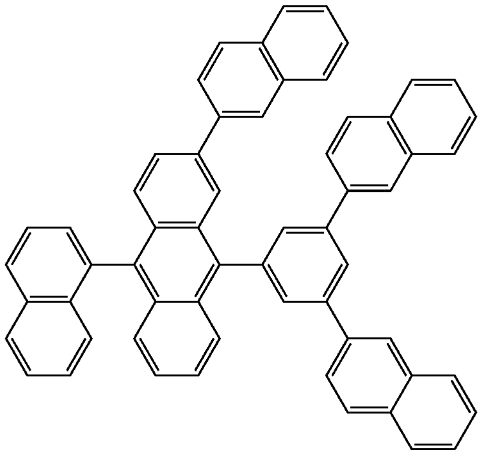
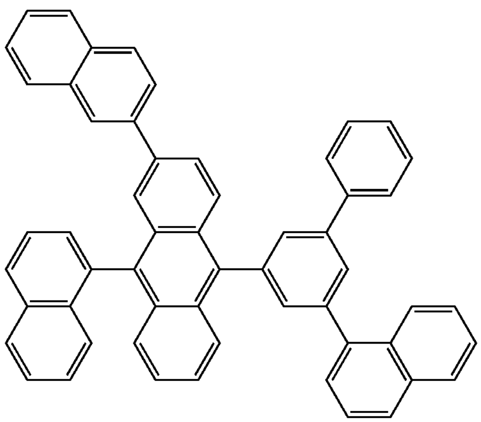
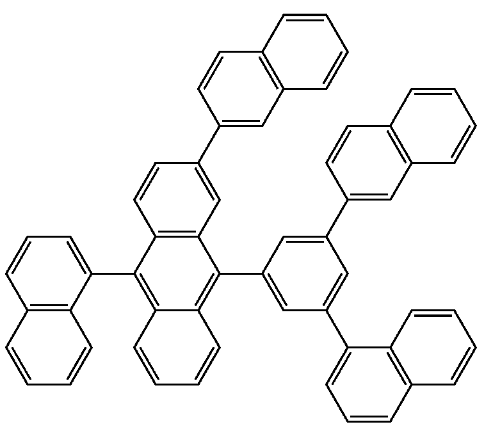
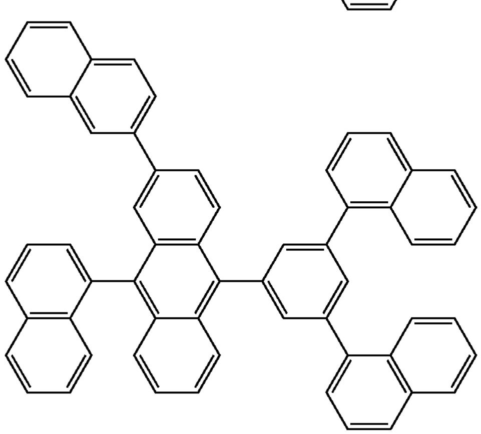
-continued
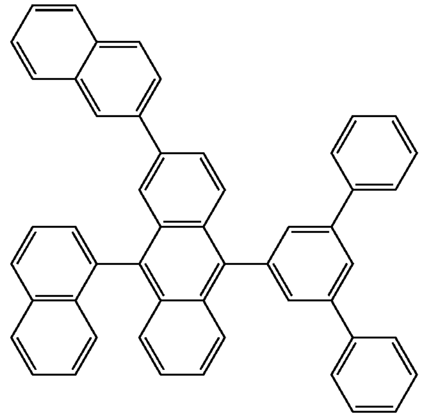
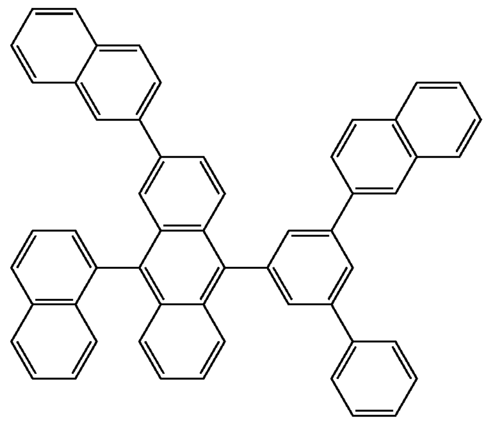
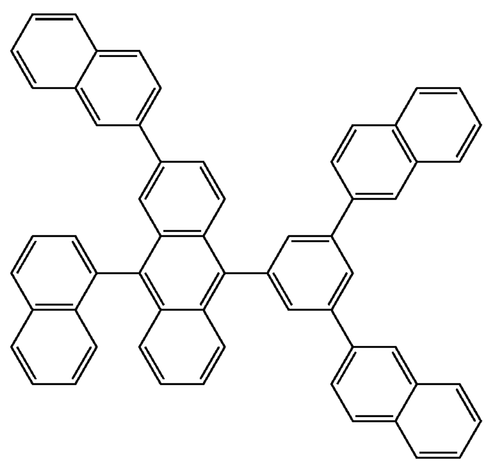
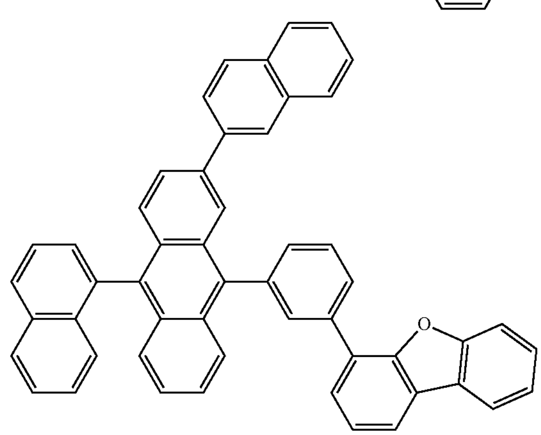

-continued
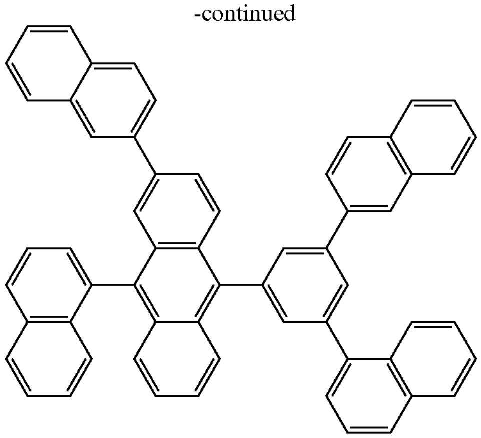
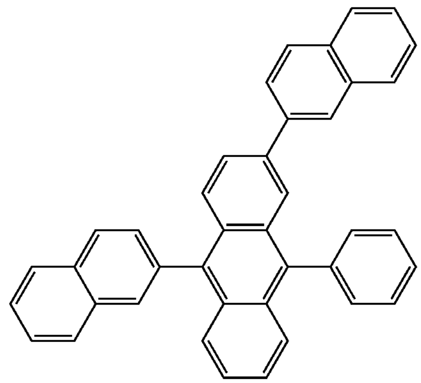
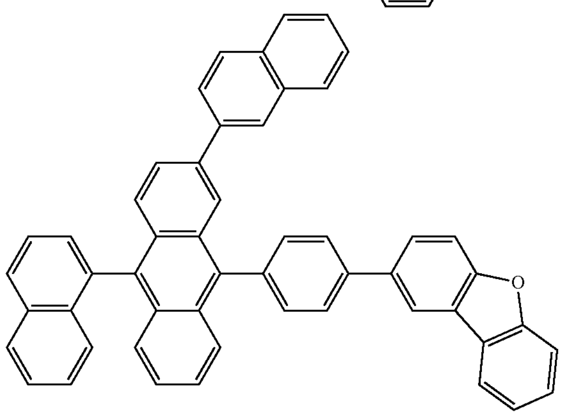
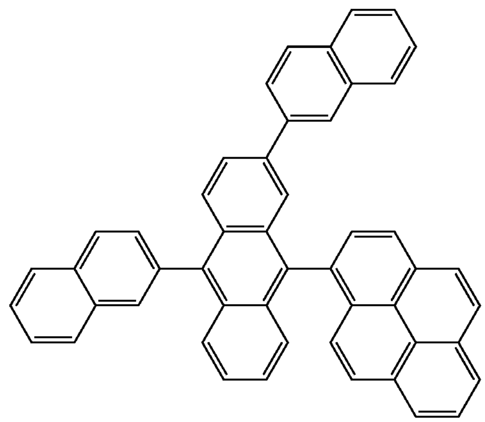
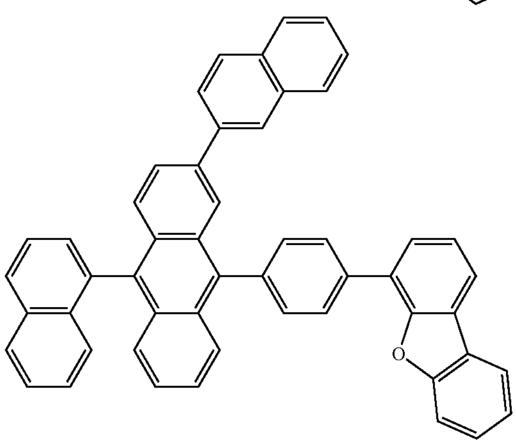
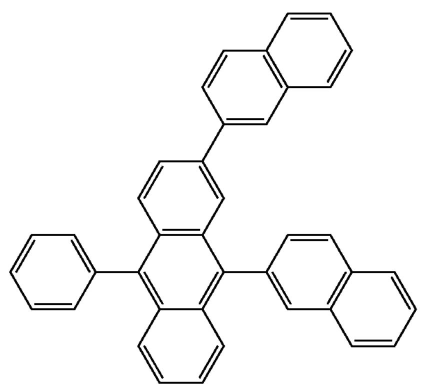
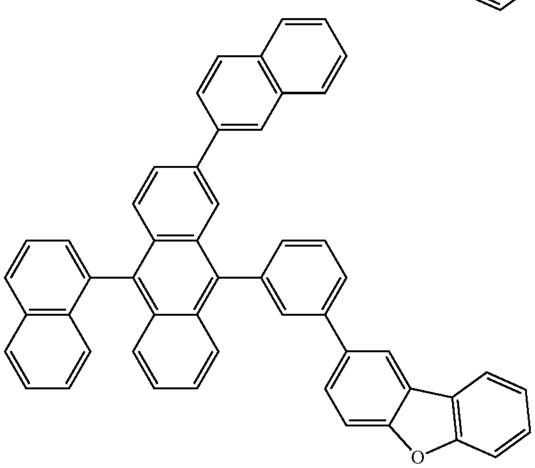
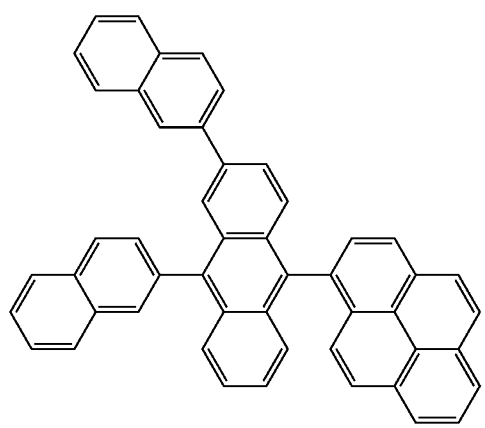

-continued
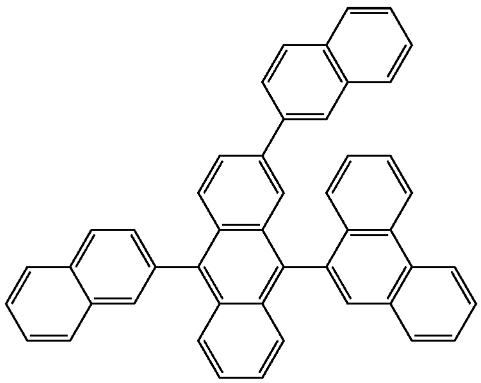
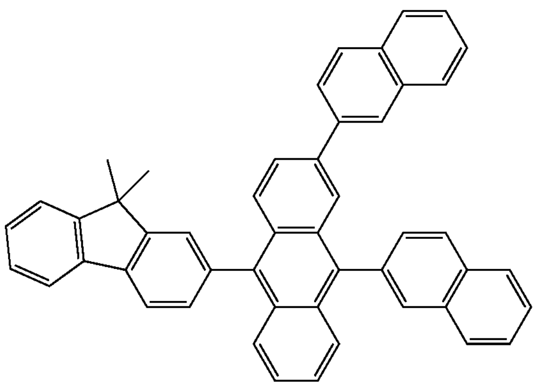
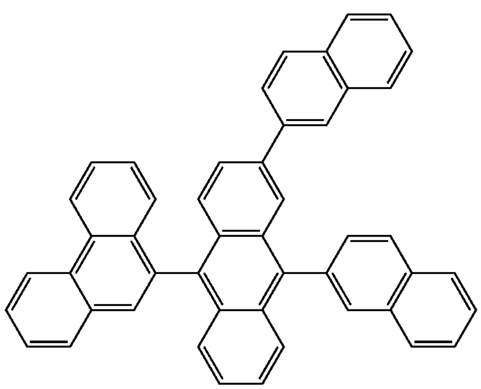
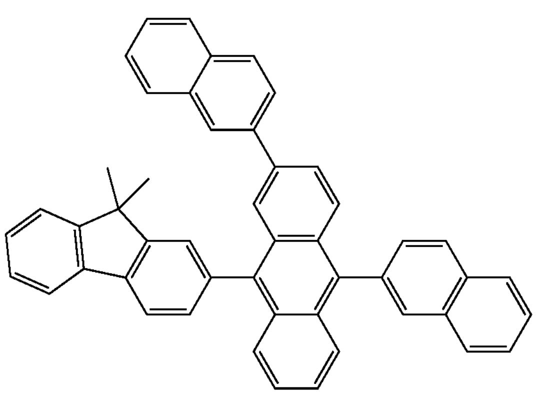
-continued
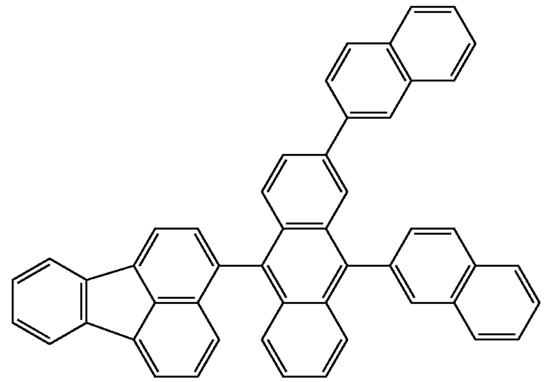
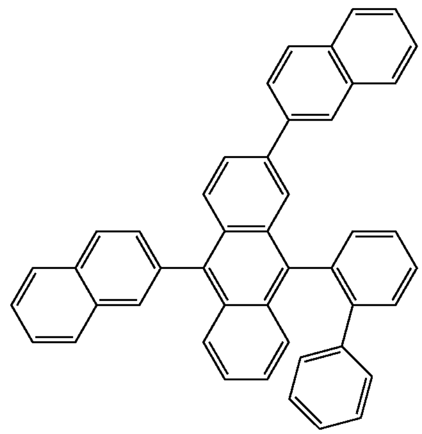
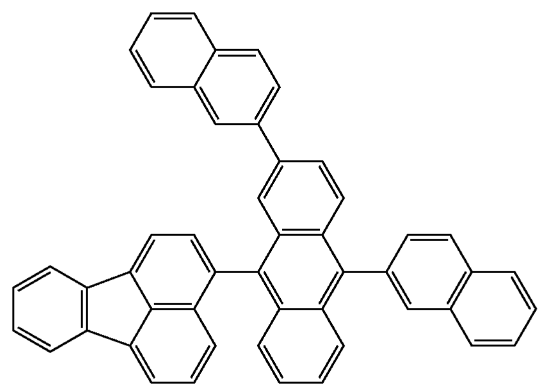
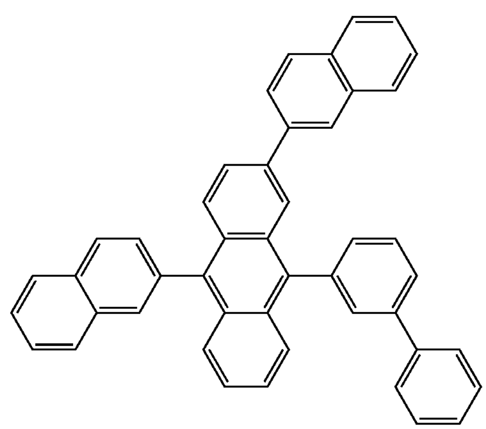

-continued
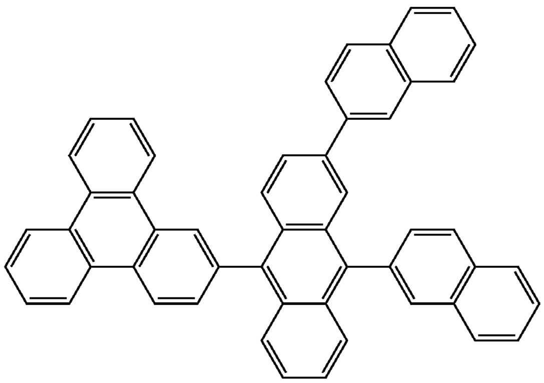
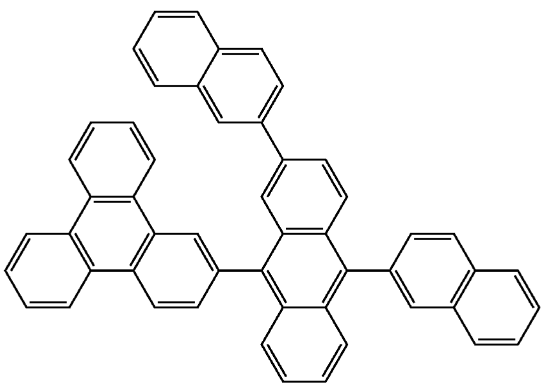
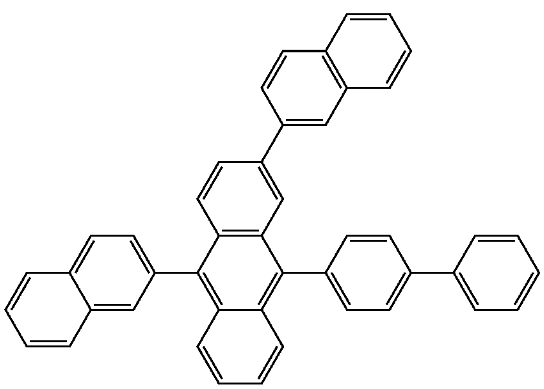
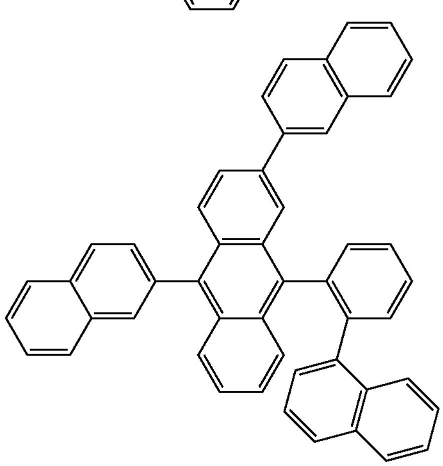
-continued
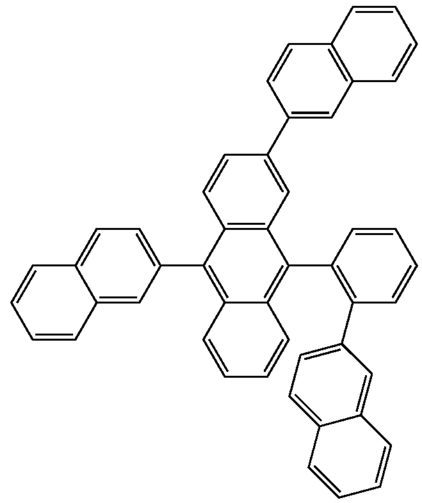
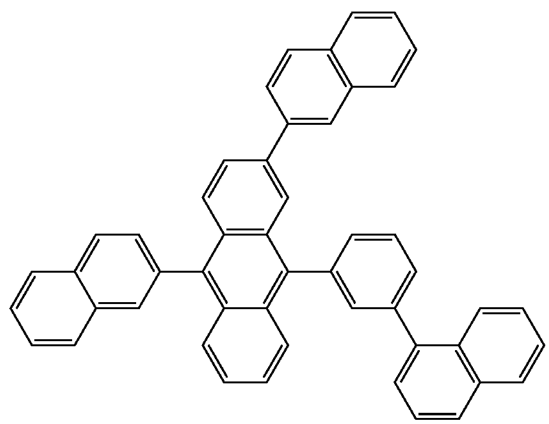
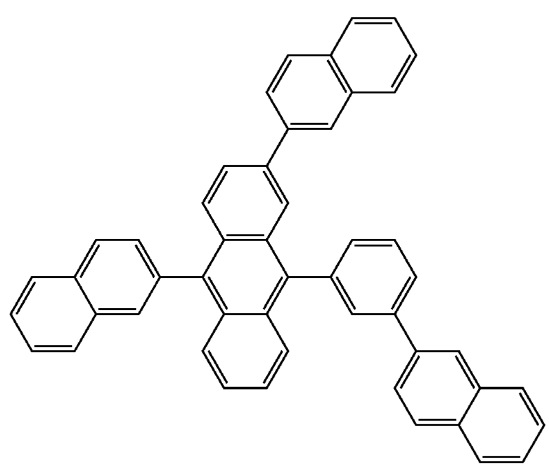

-continued
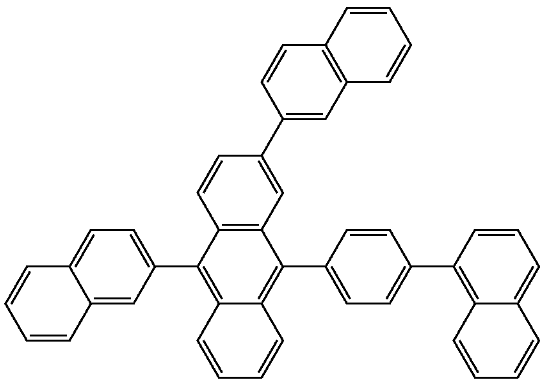
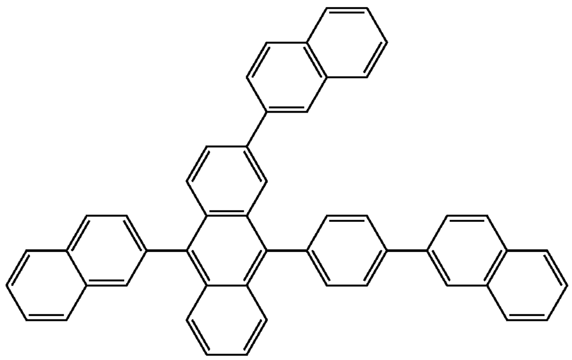
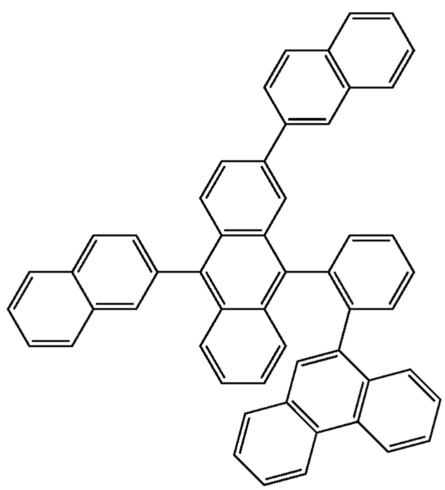
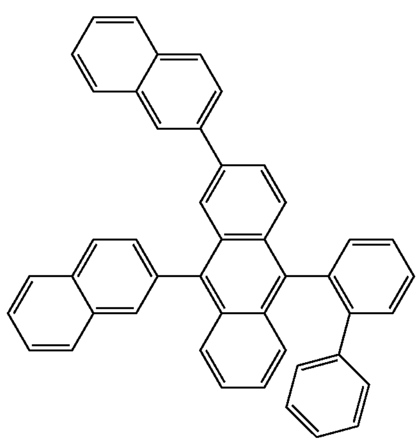
-continued
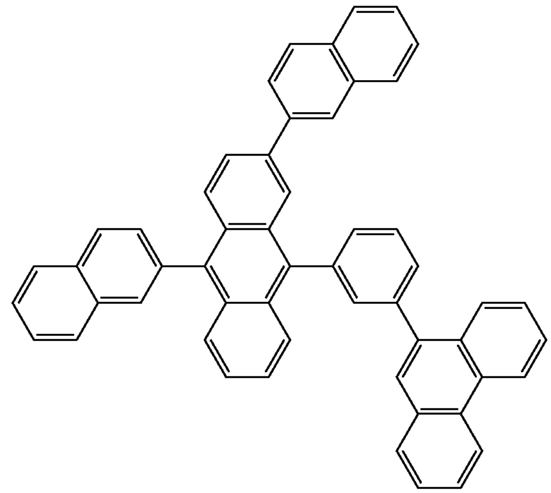
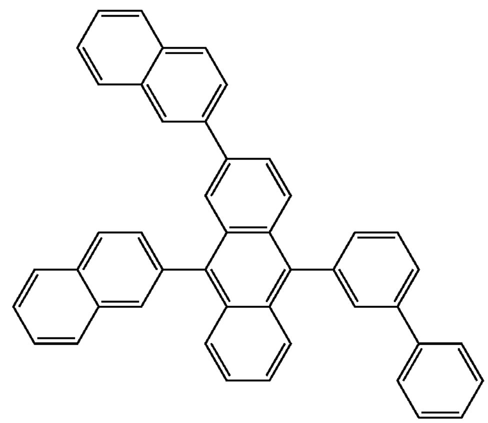
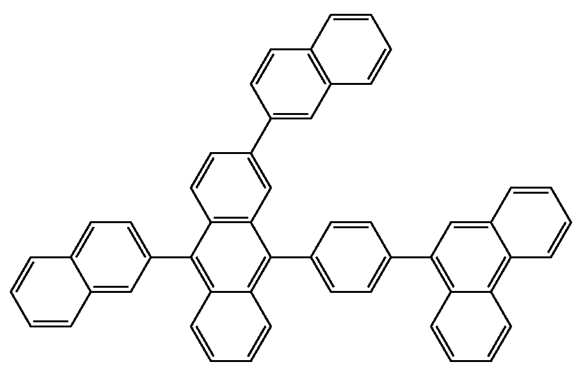
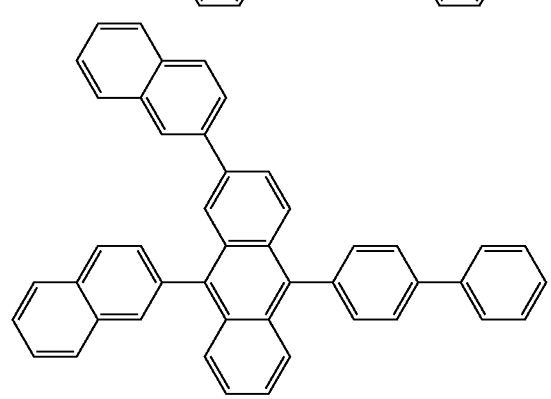

-continued
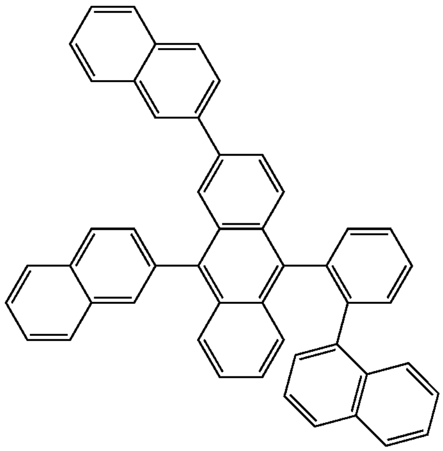
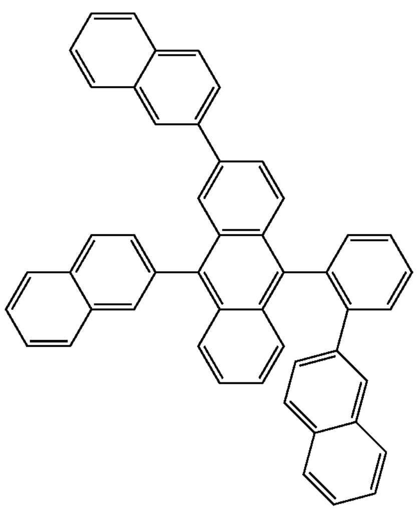
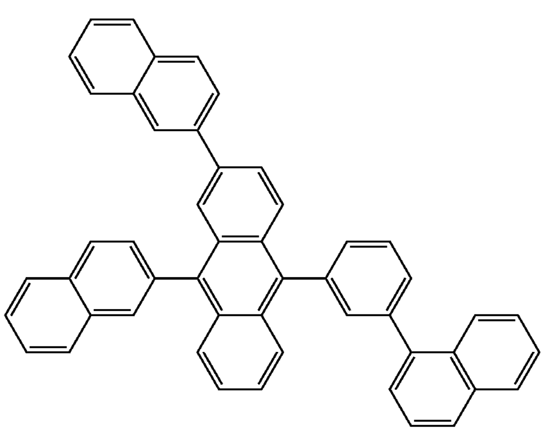
-continued
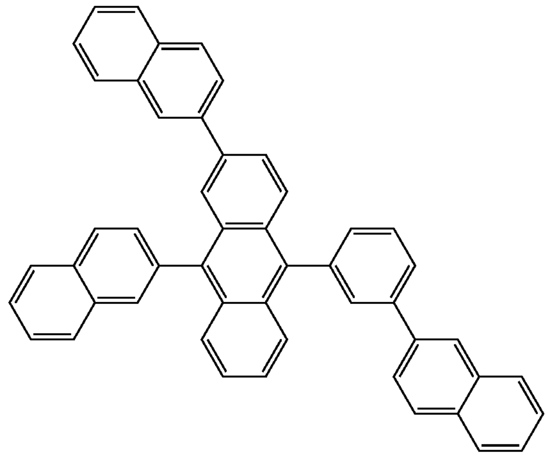
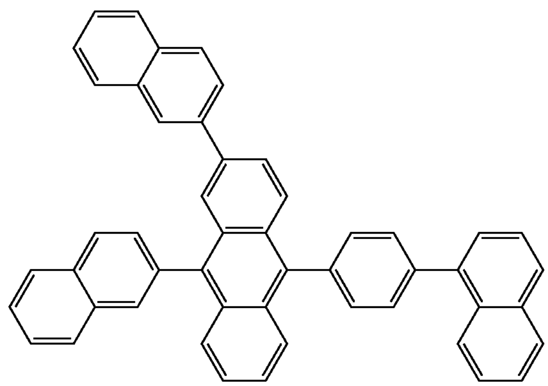
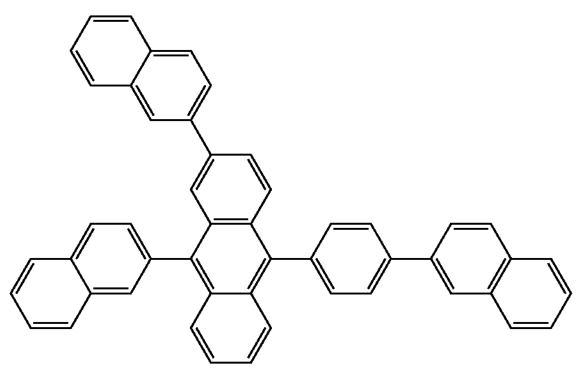
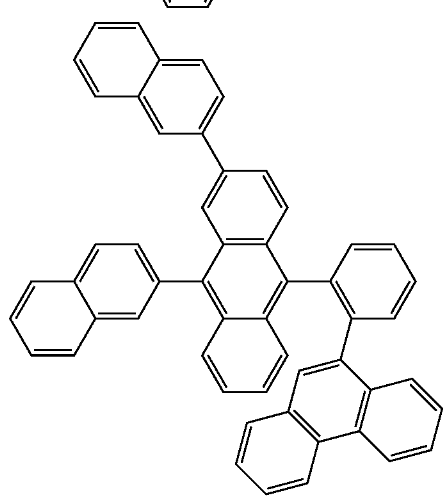

-continued
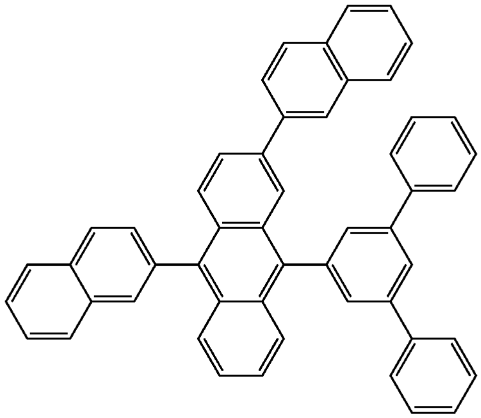
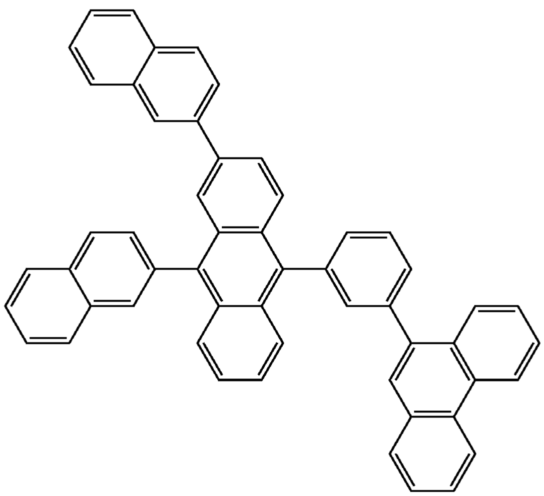
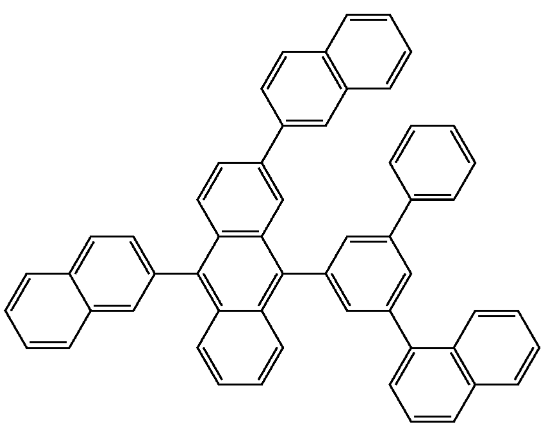
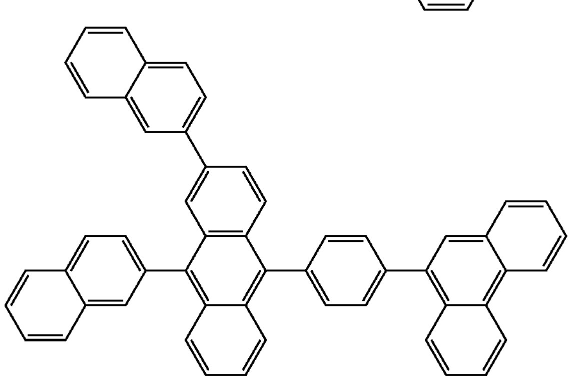
-continued
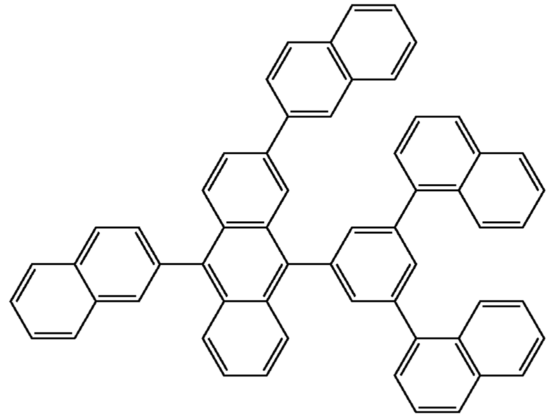
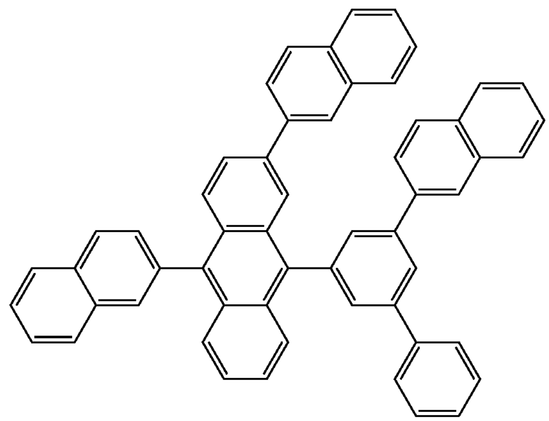
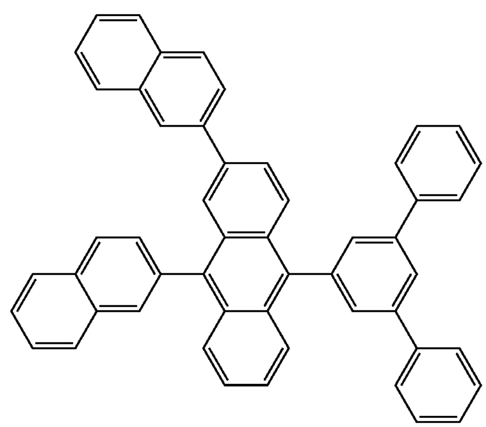
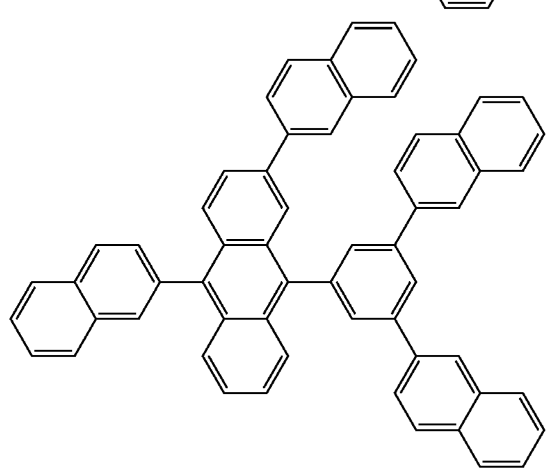

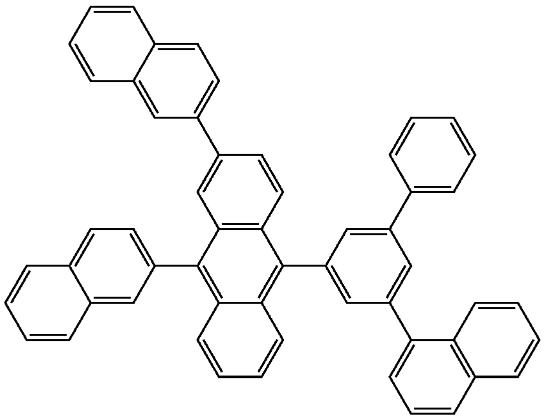
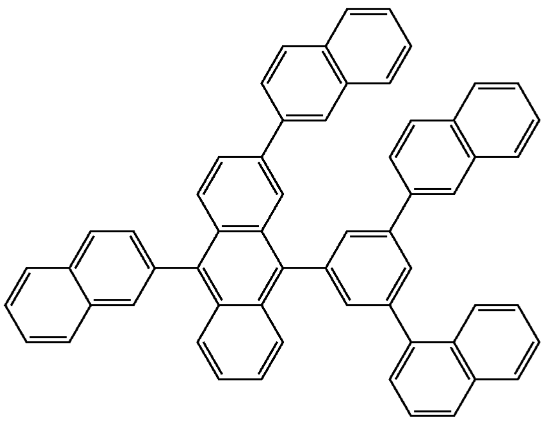
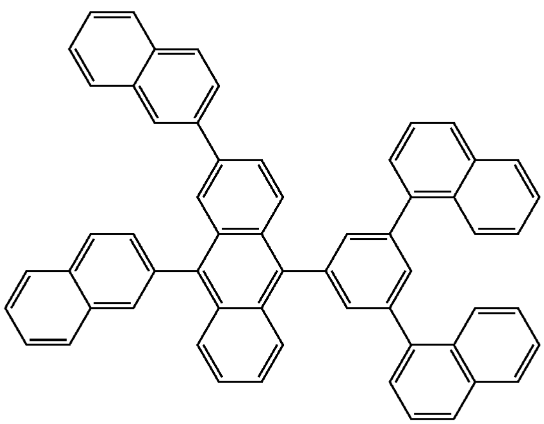
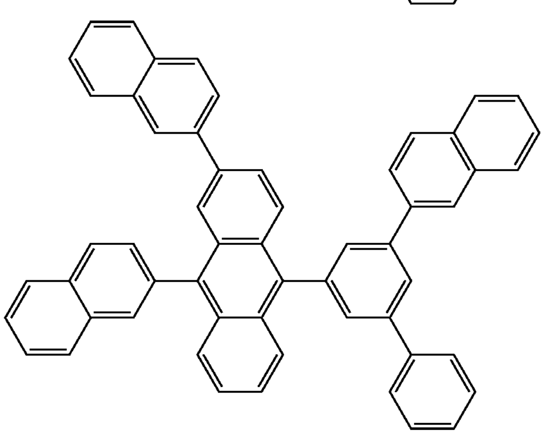
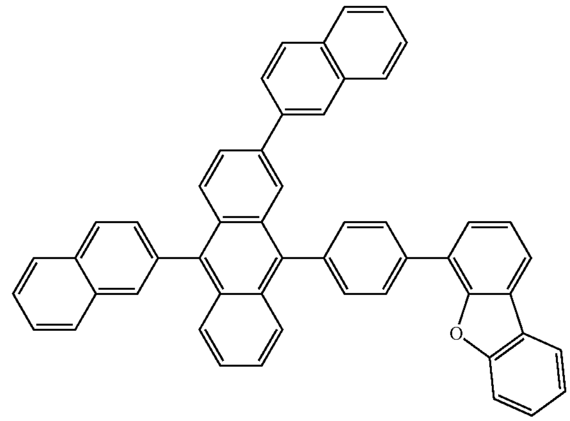
O
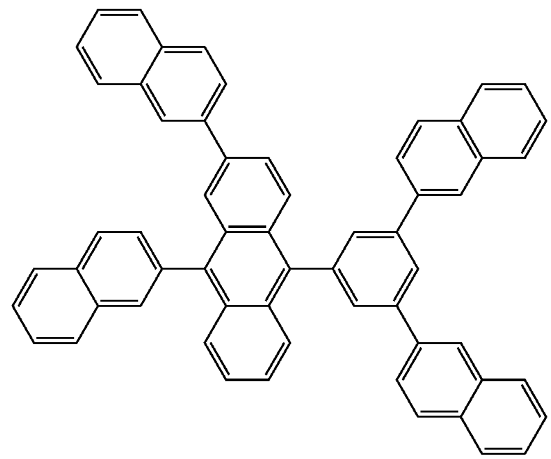
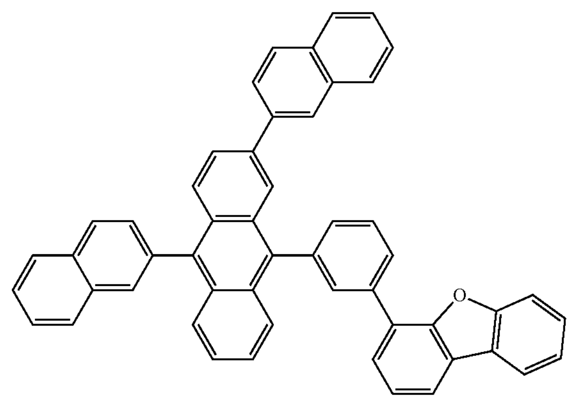
O
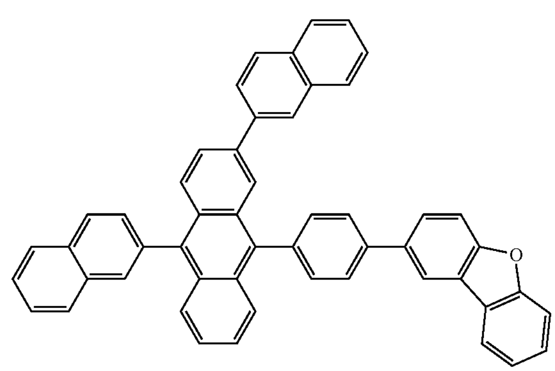
O

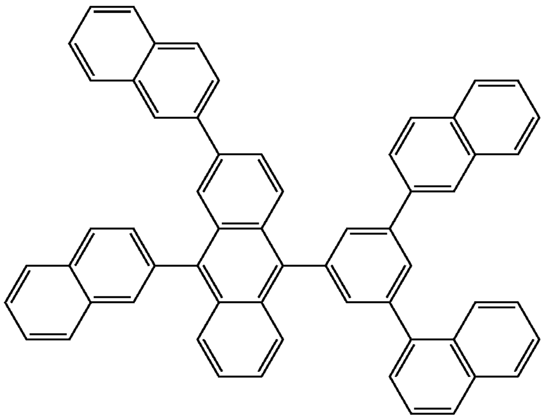
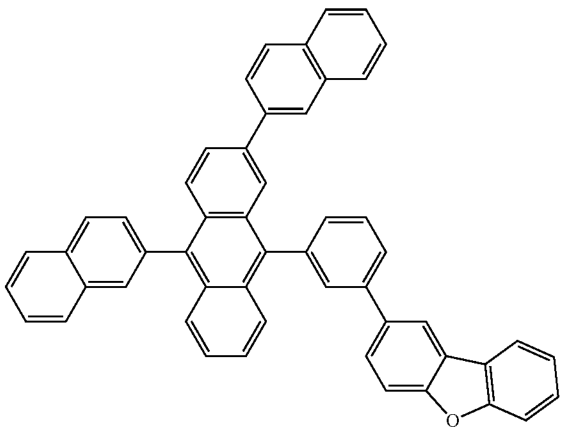
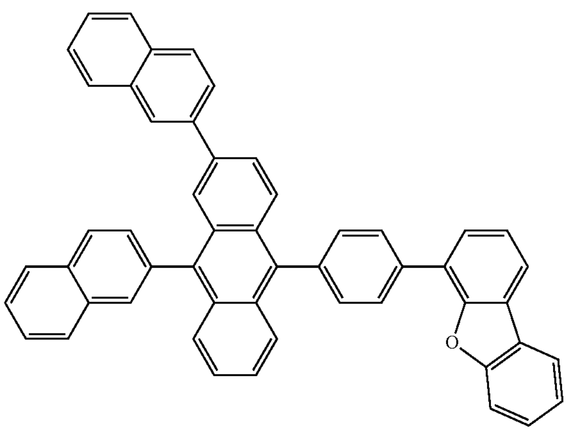
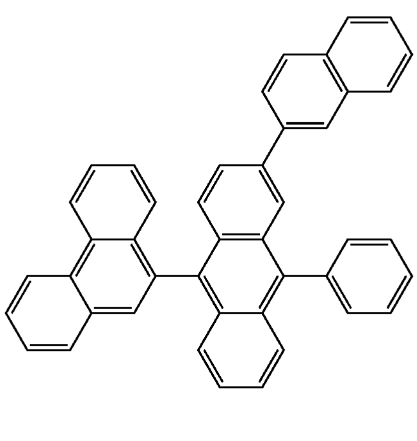
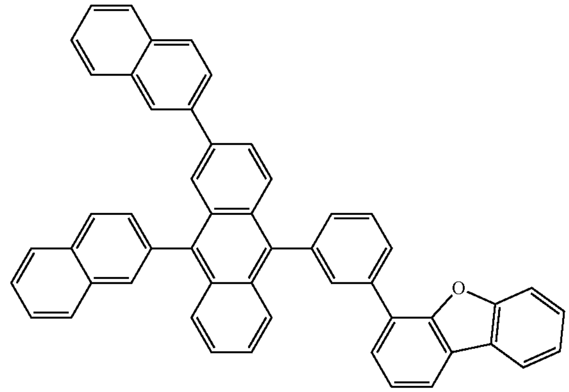
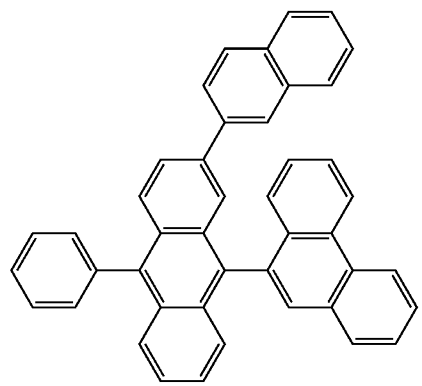
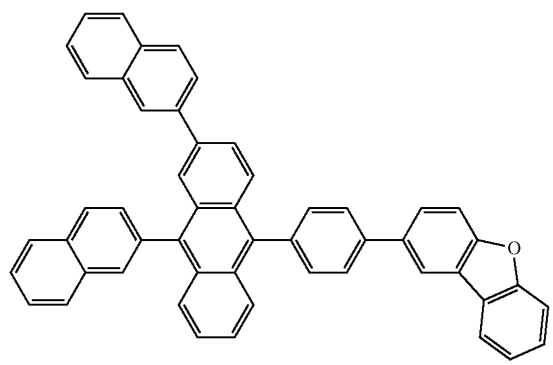
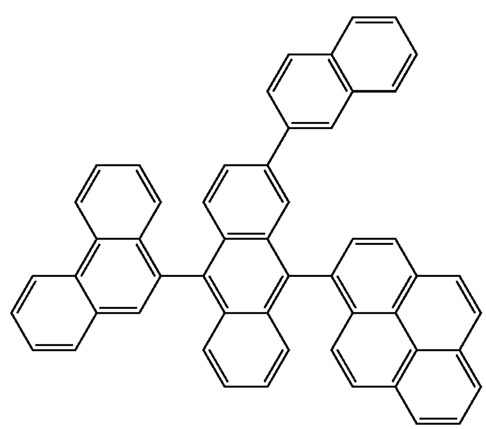

-continued
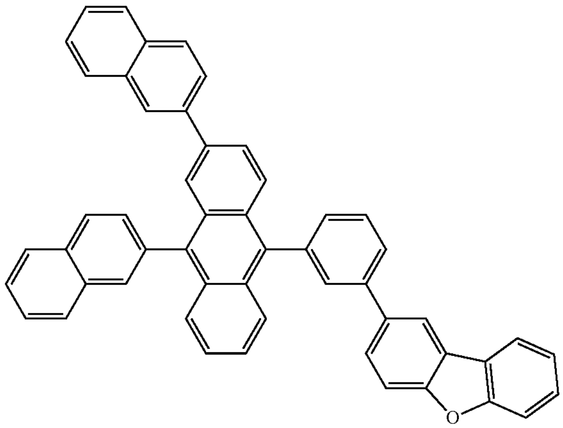
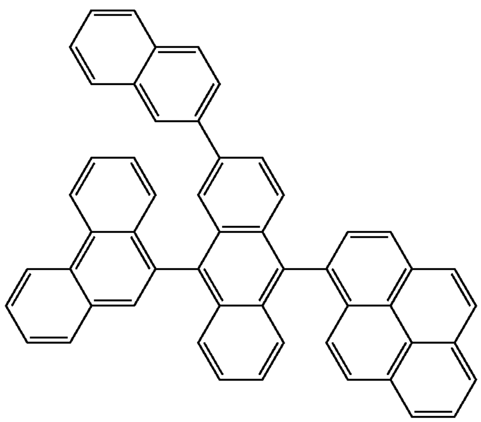
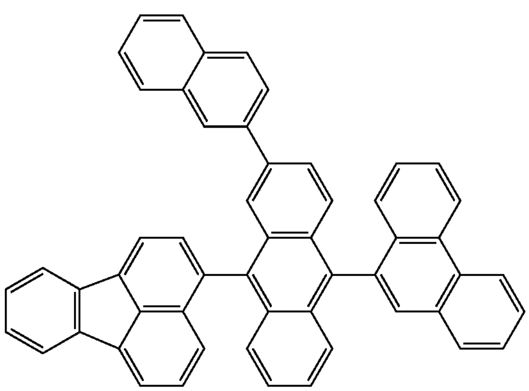
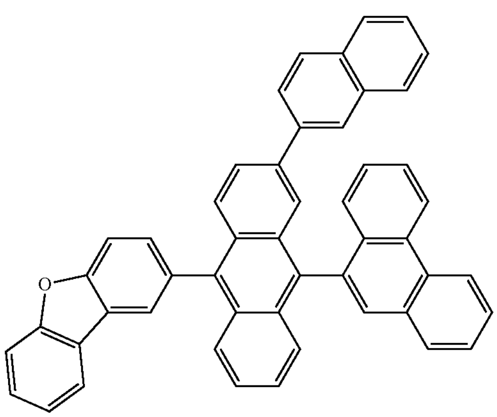
-continued
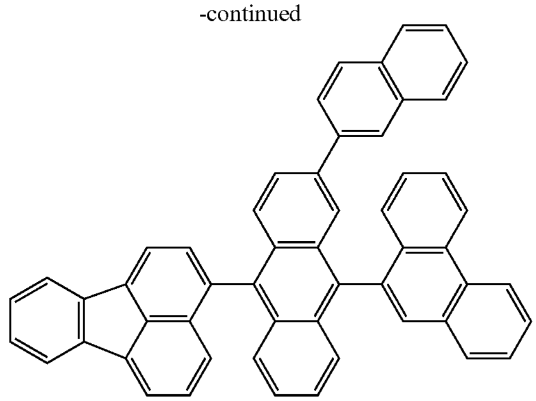
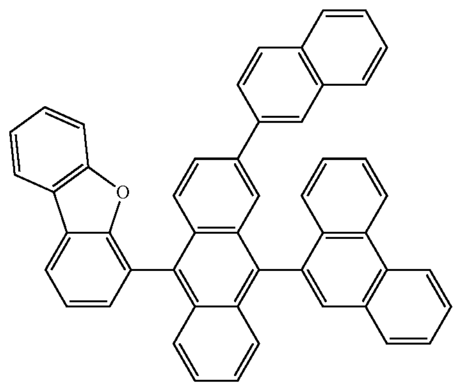
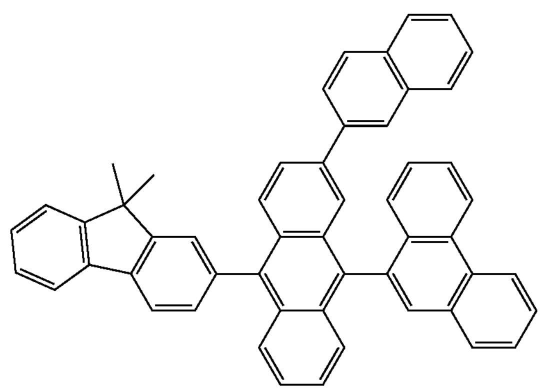
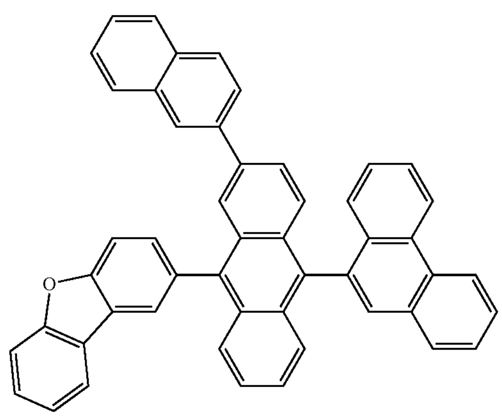

-continued
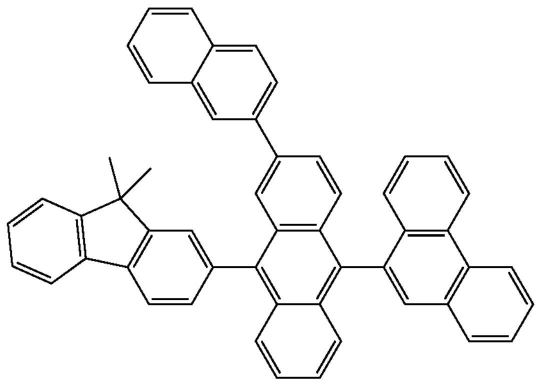
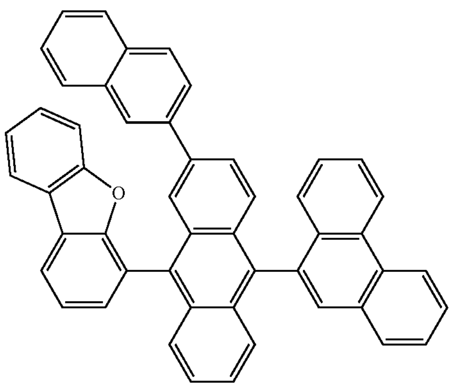
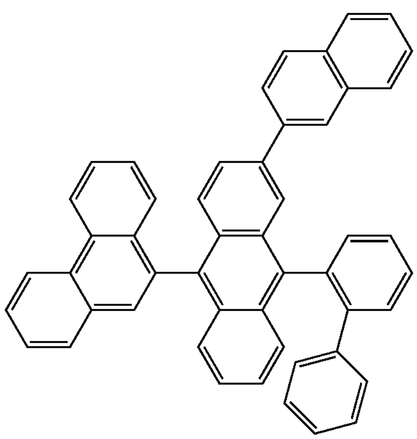
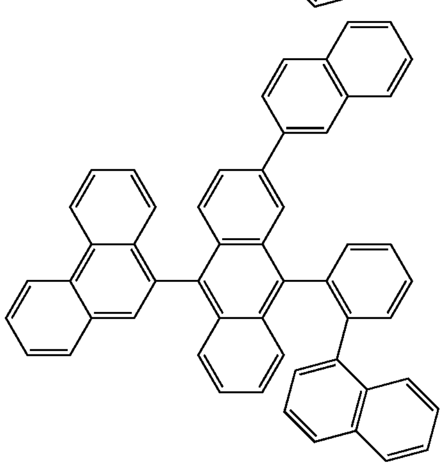
-continued
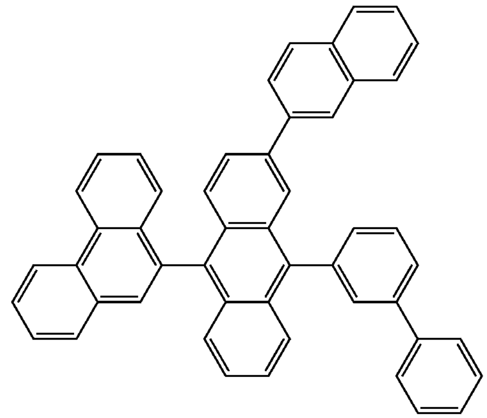
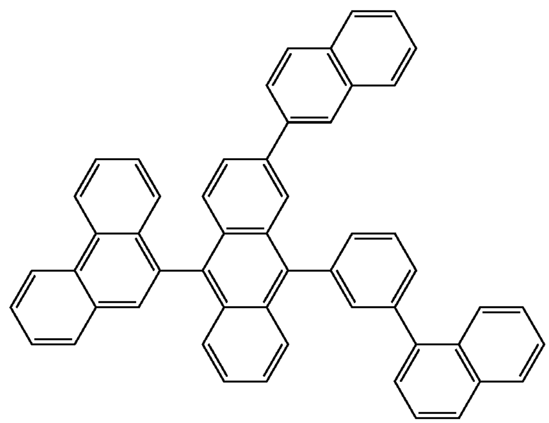
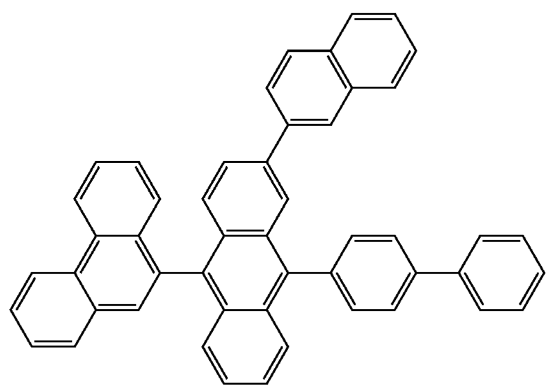
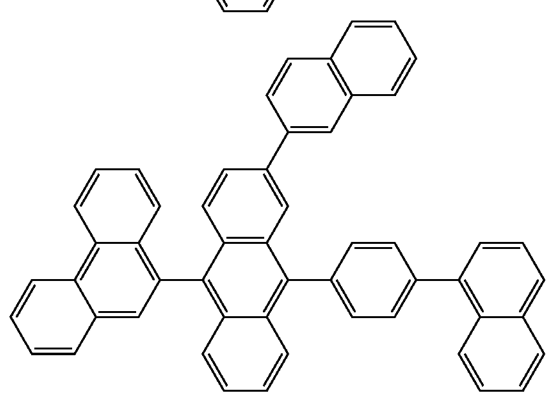

-continued
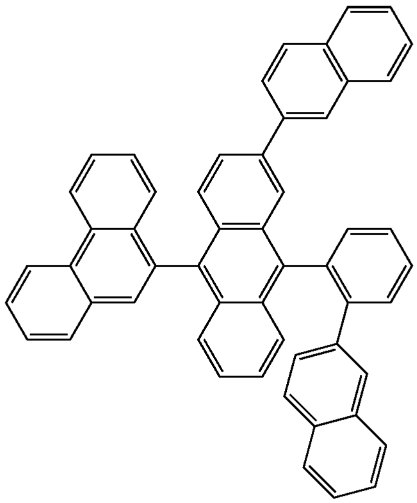
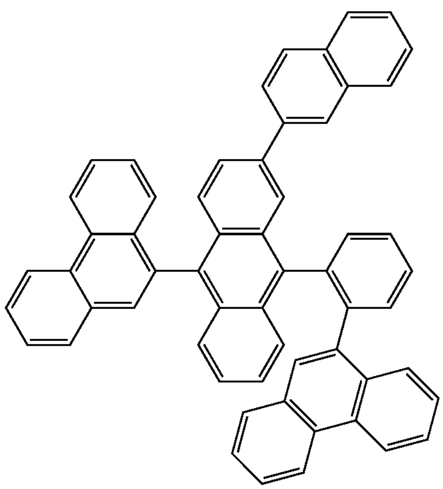
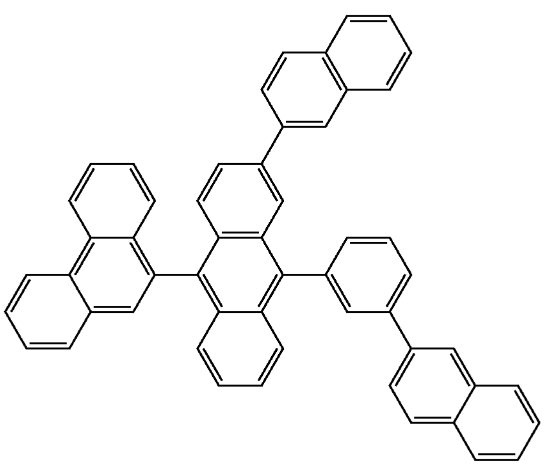
-continued
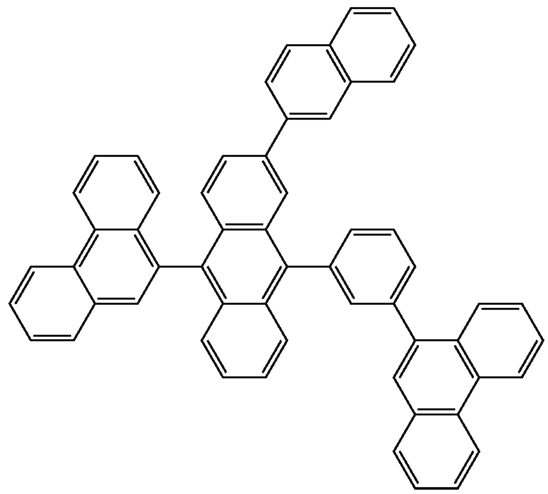
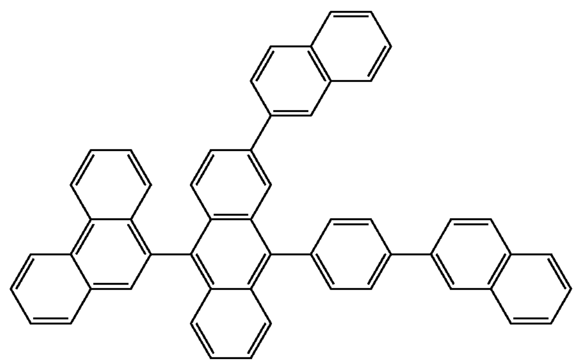
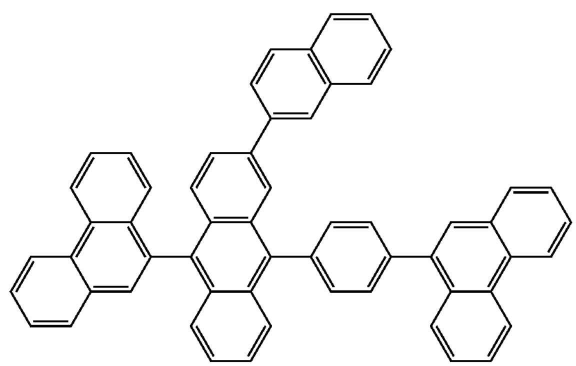
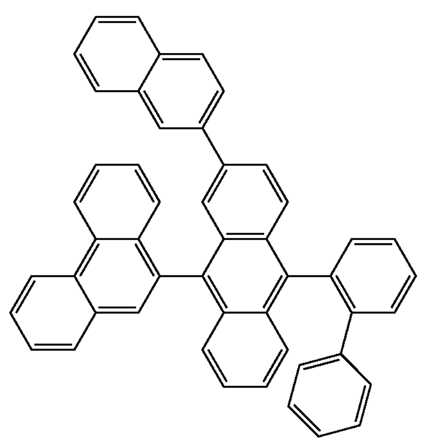

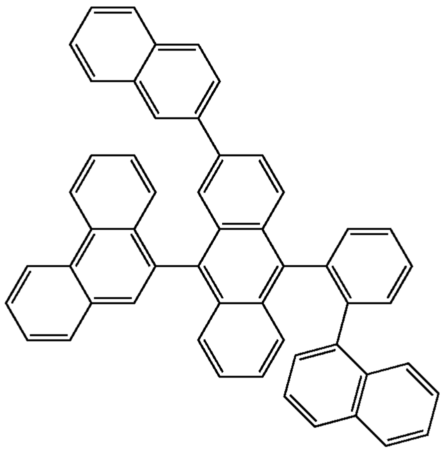
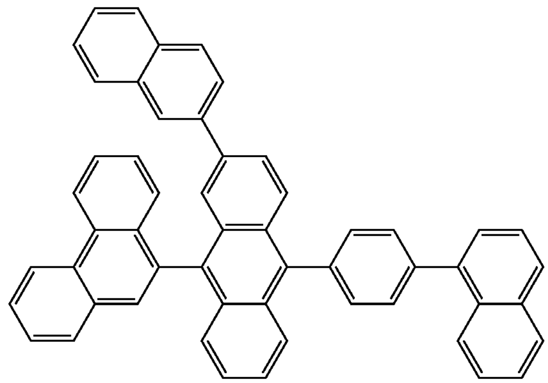
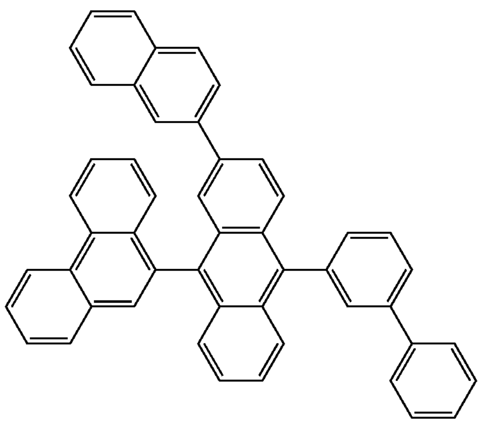
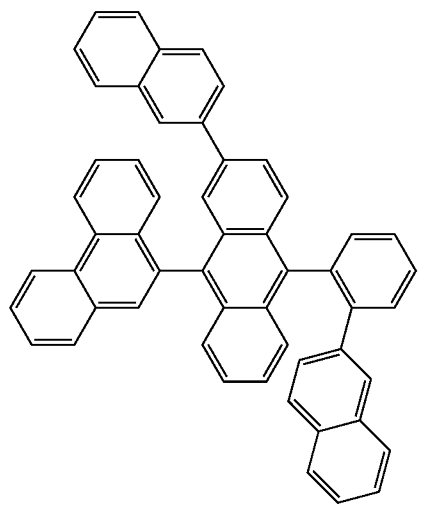
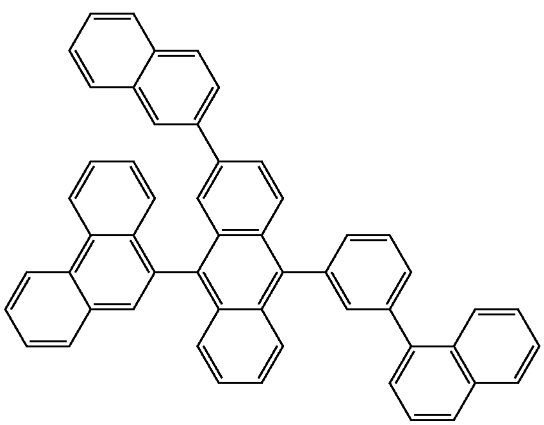
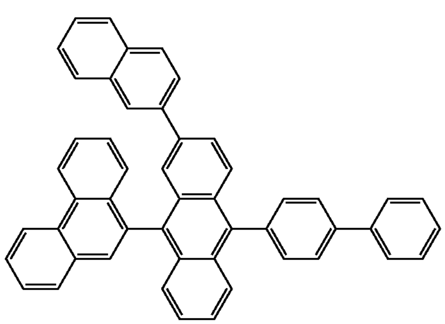
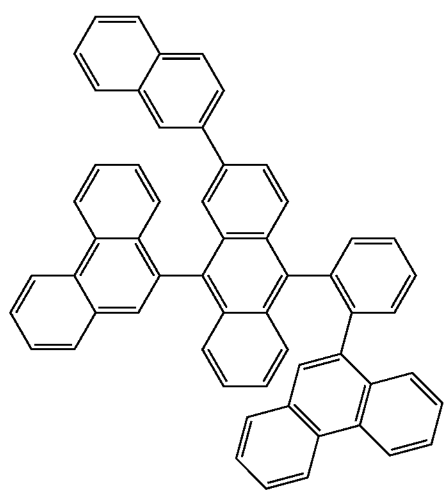

-continued
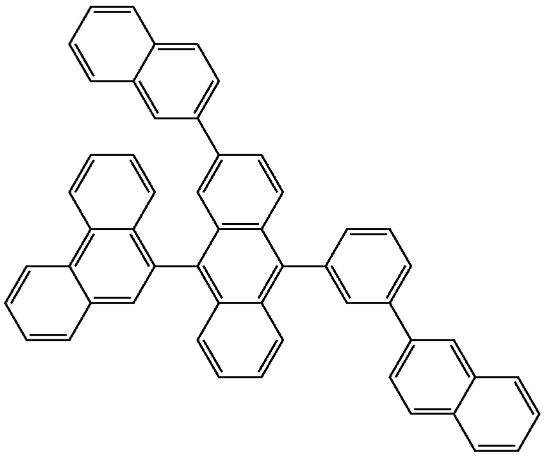
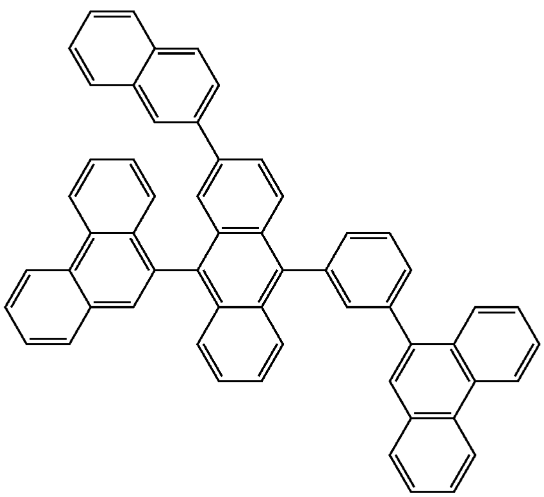
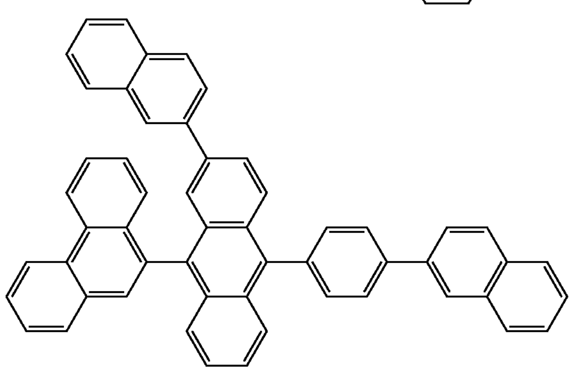
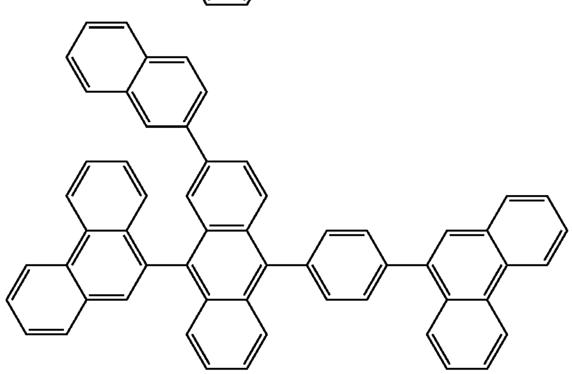
-continued
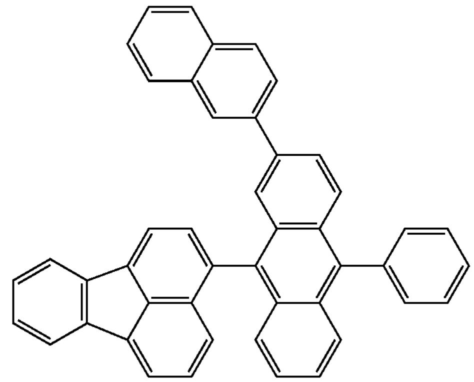
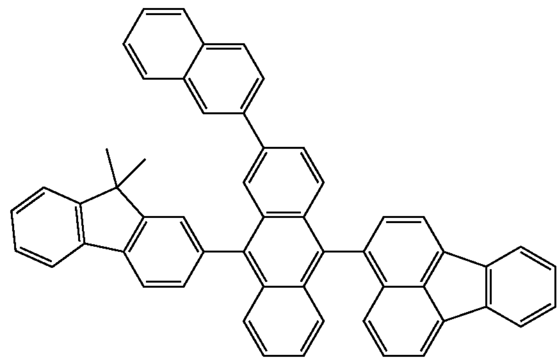
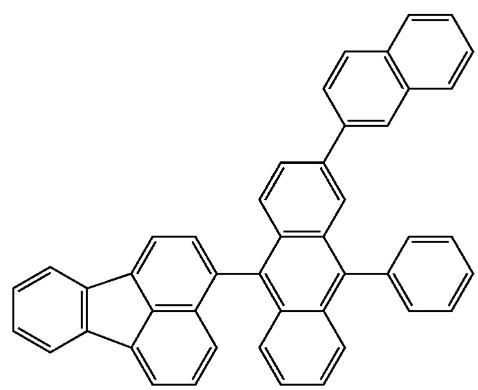
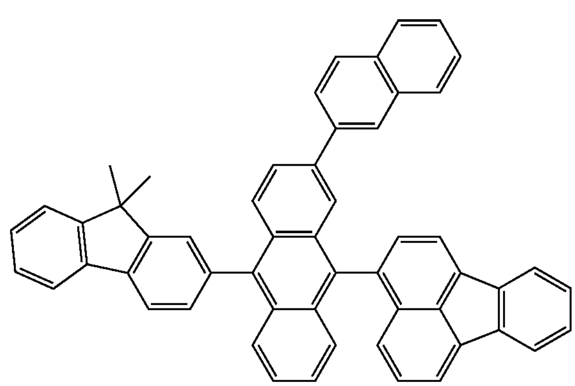

-continued
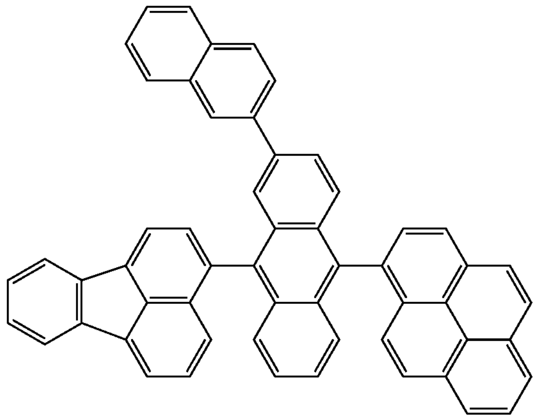
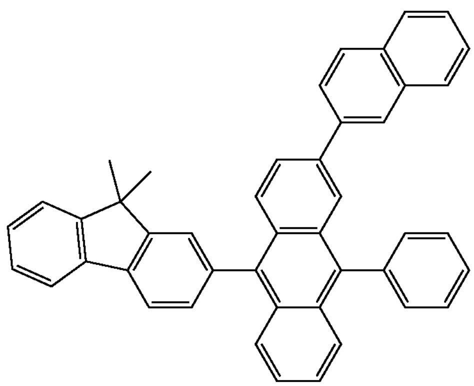
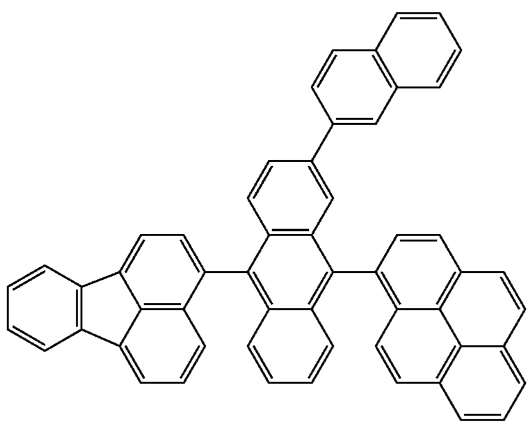
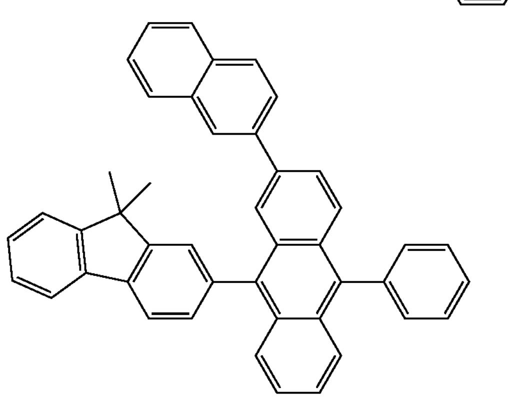
-continued
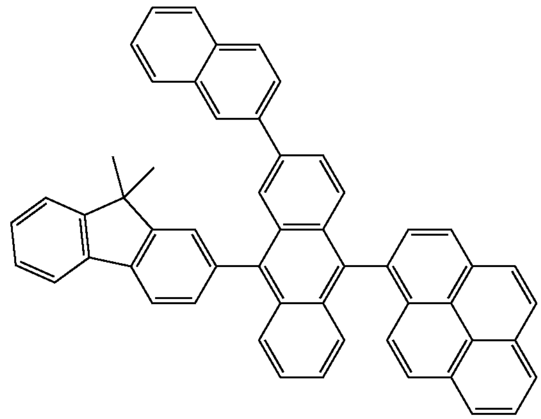
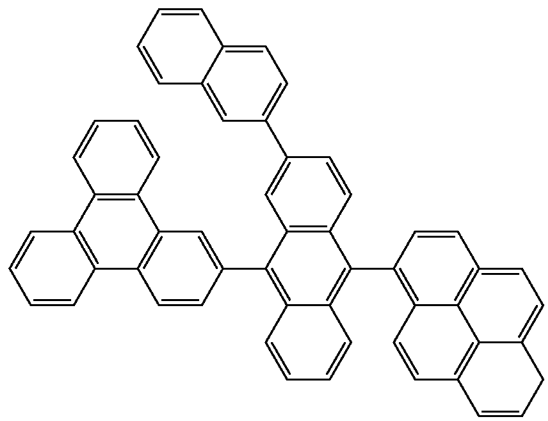
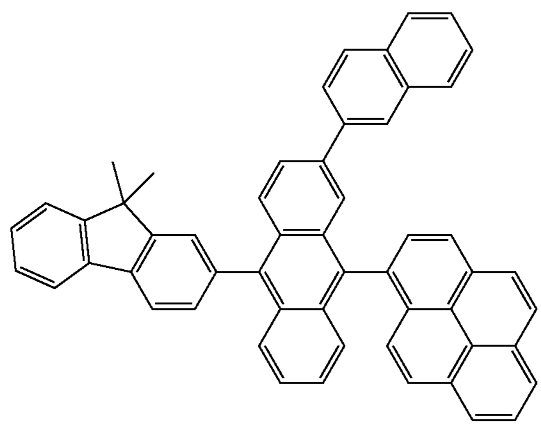
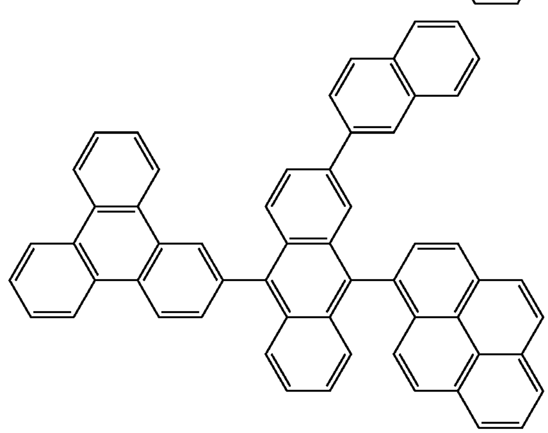

-continued
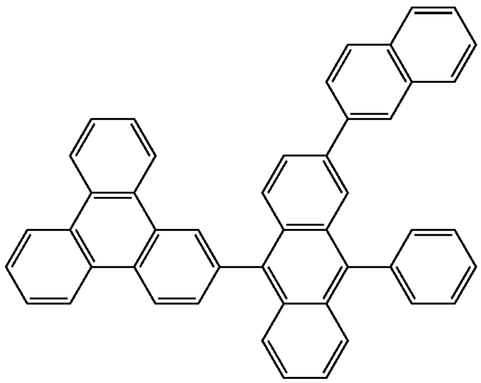
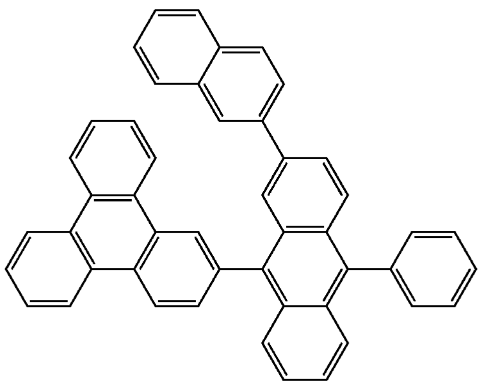
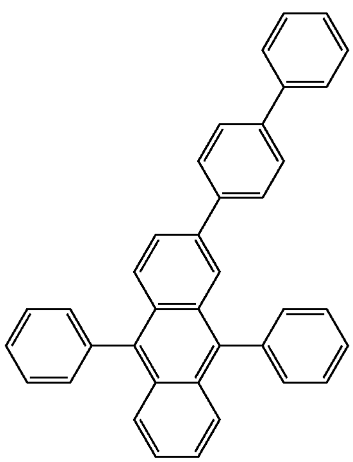
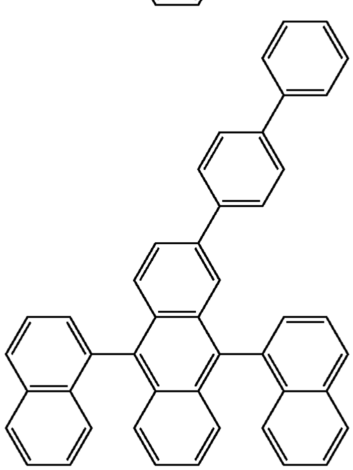
-continued
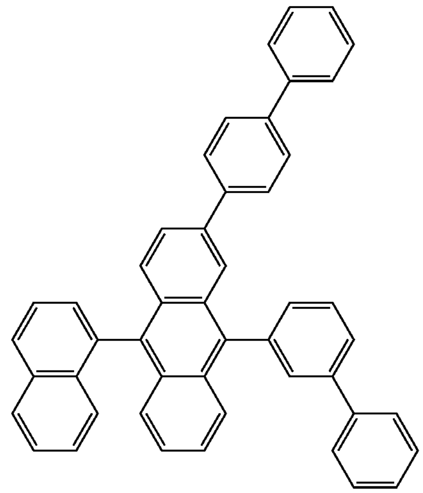
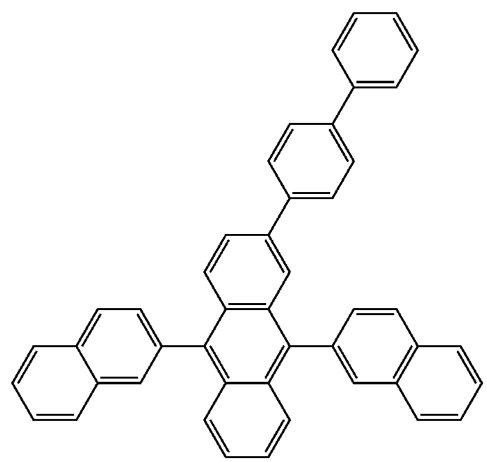
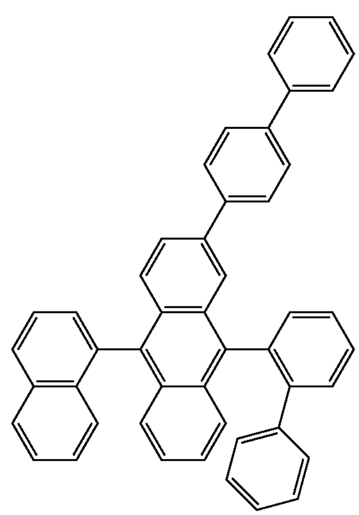

-continued
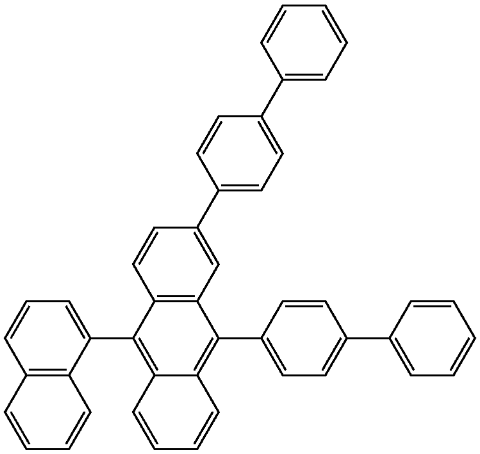
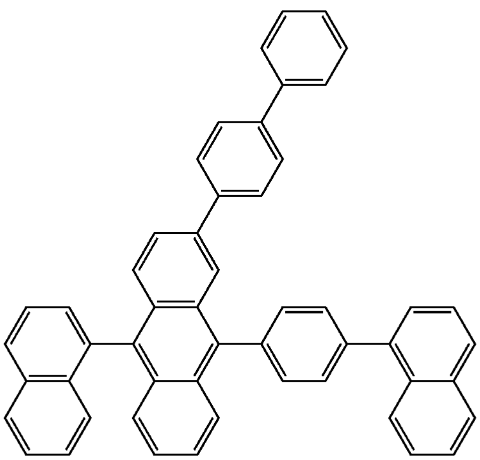
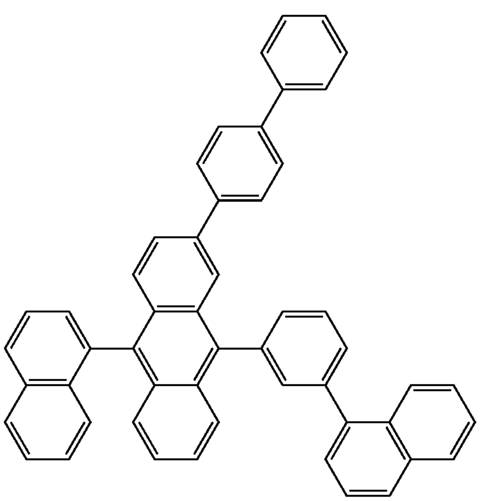
-continued
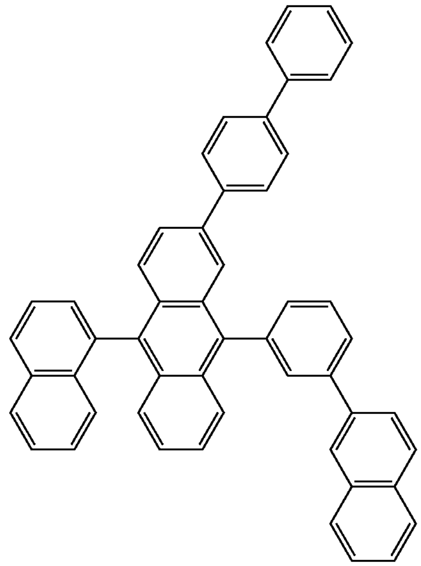
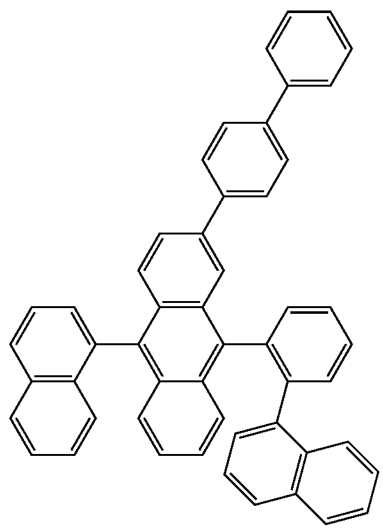
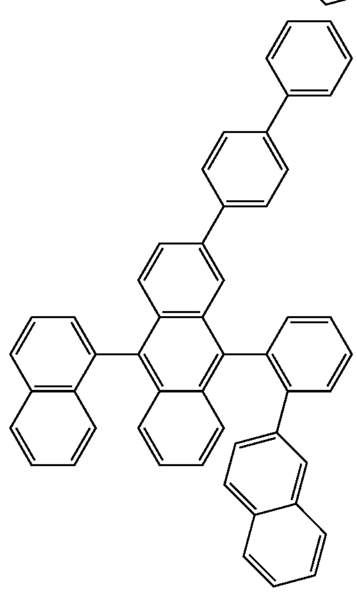

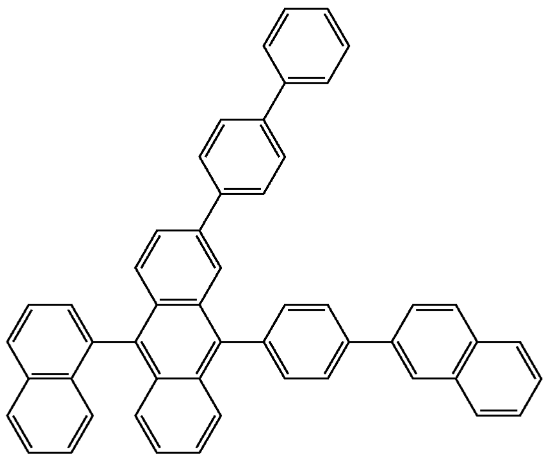
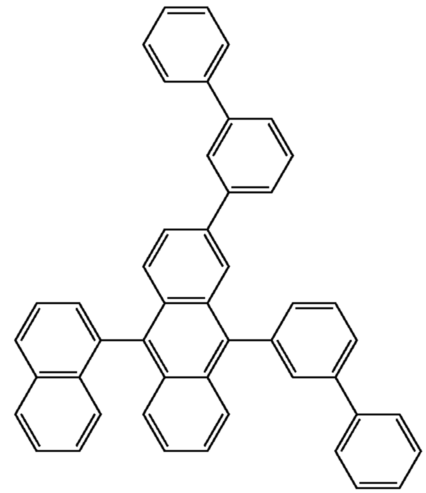
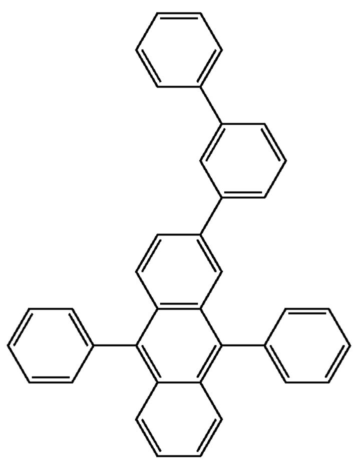
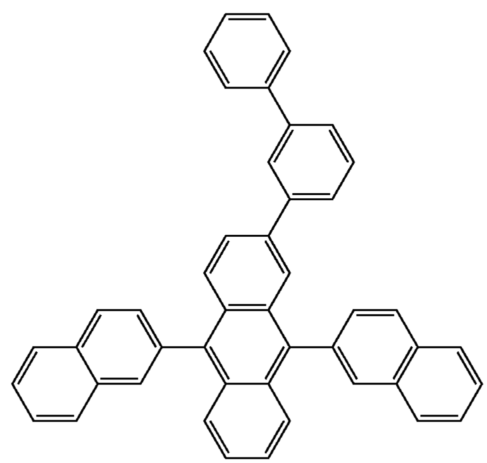
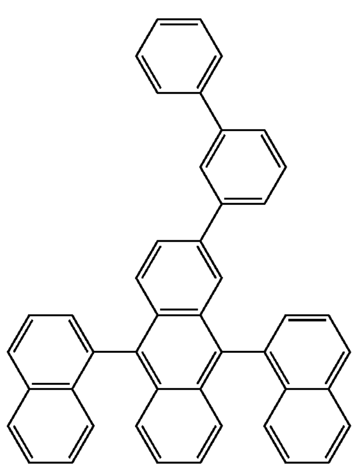
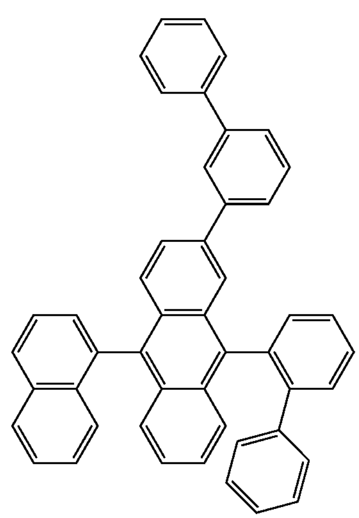

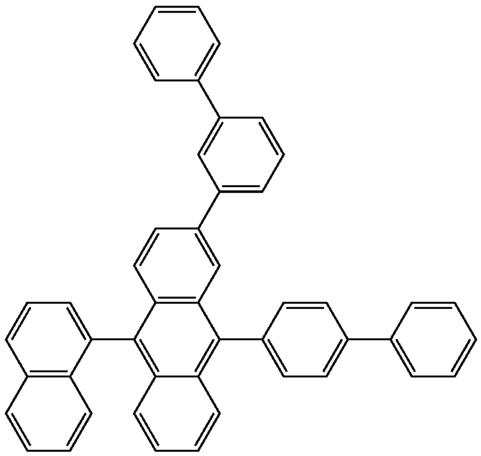
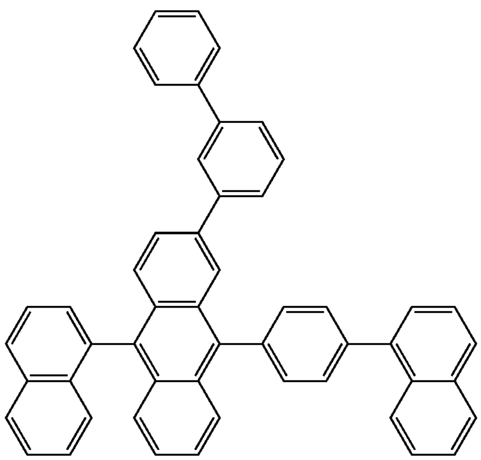
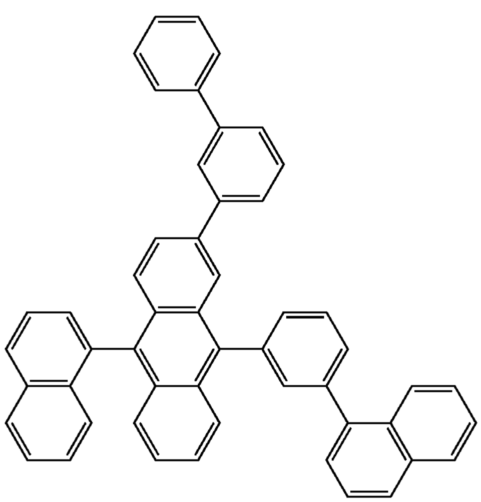
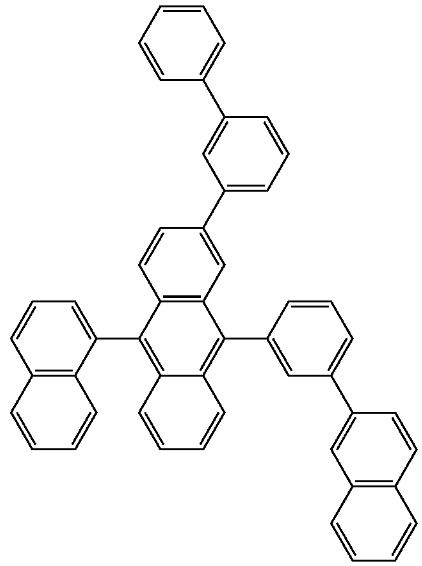
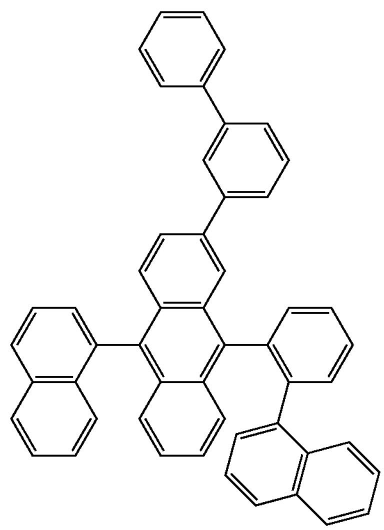
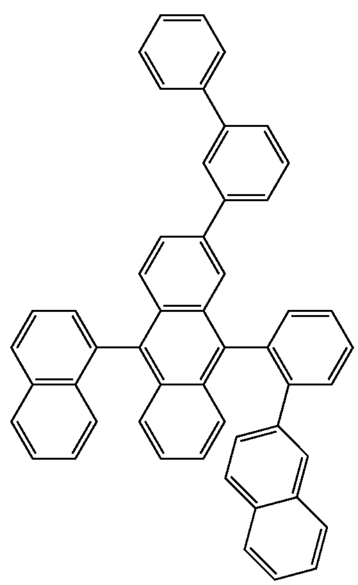

-continued
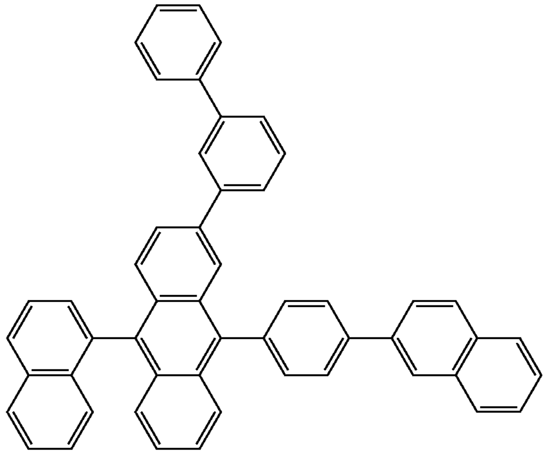
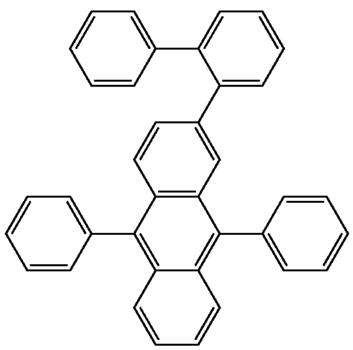
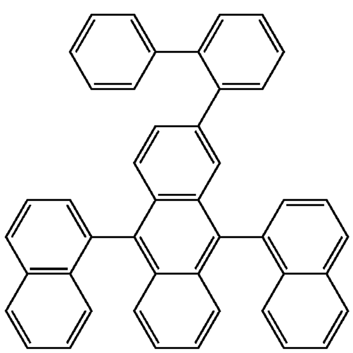
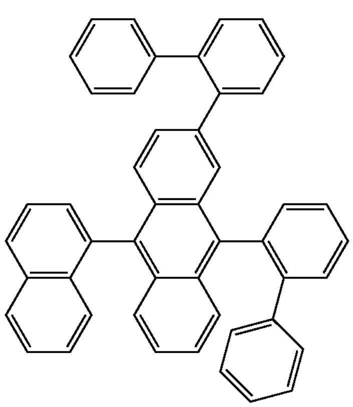
-continued
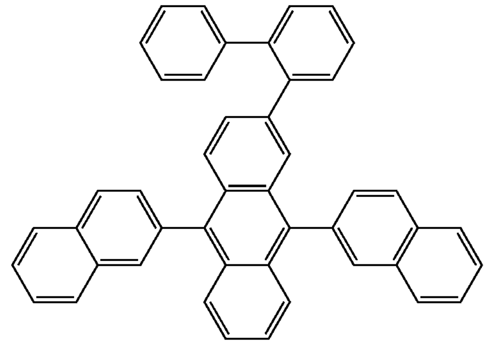
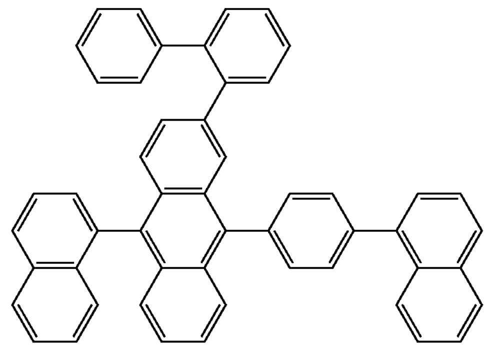
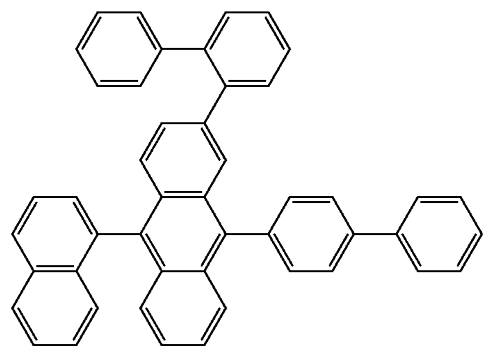
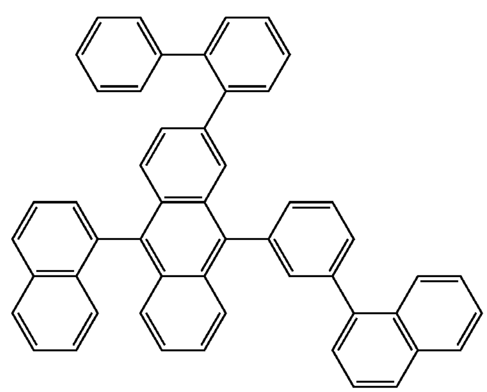

-continued
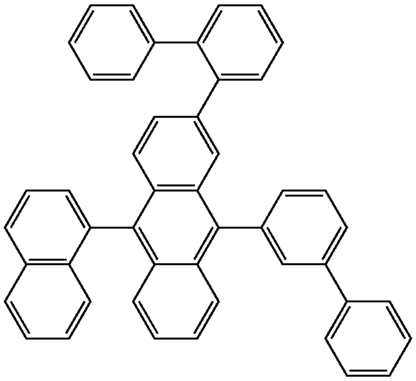
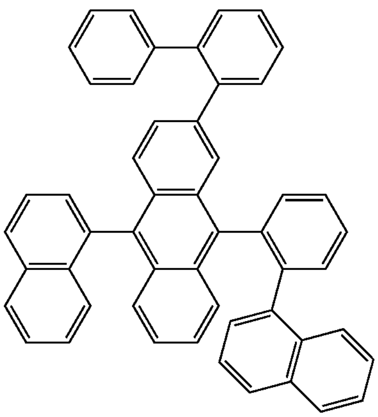
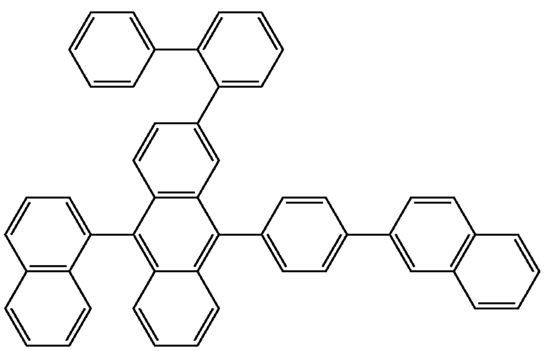
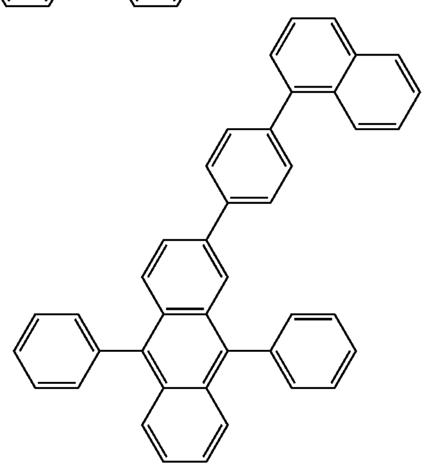
-continued
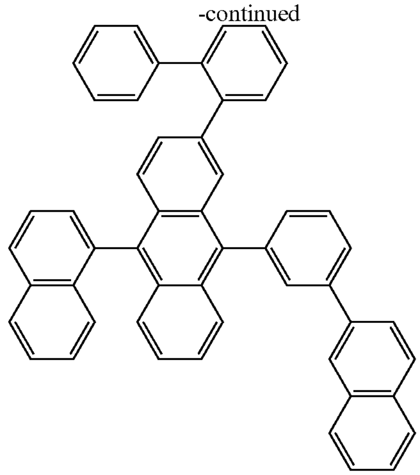
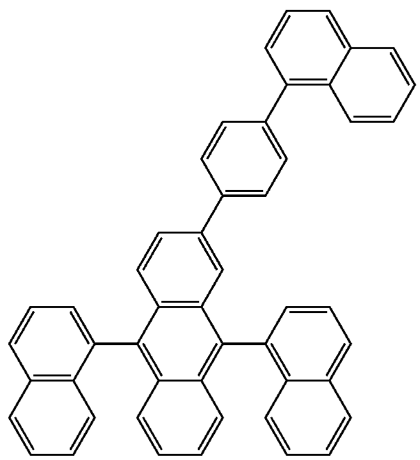
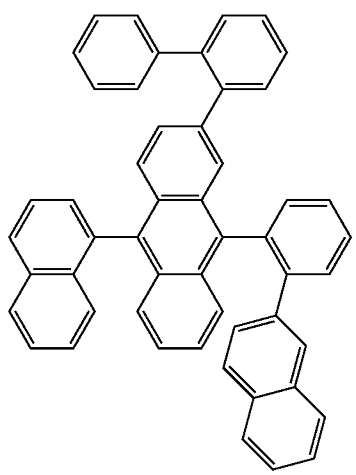

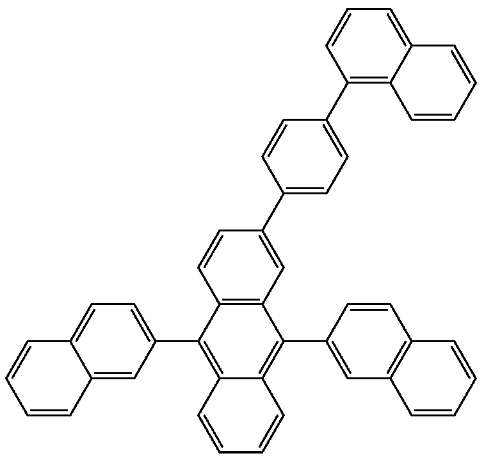
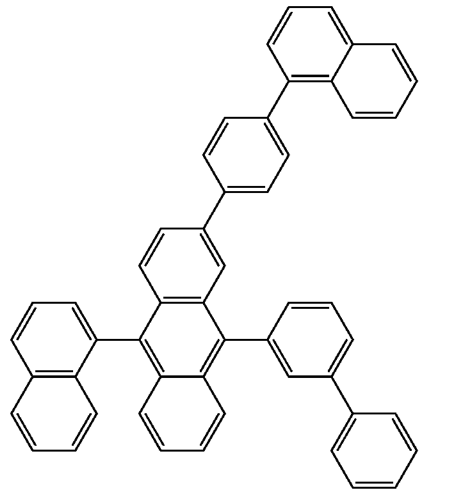
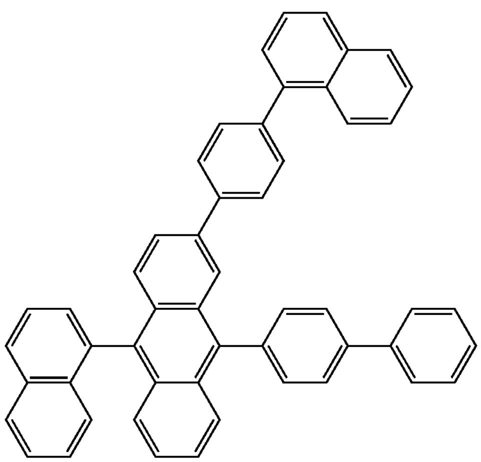
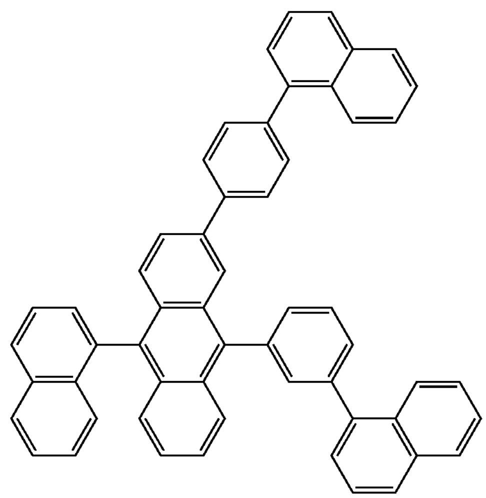
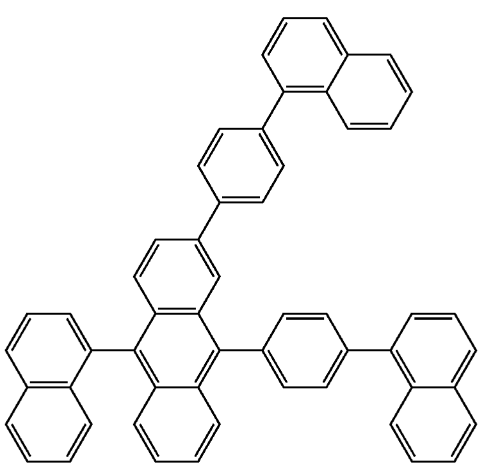
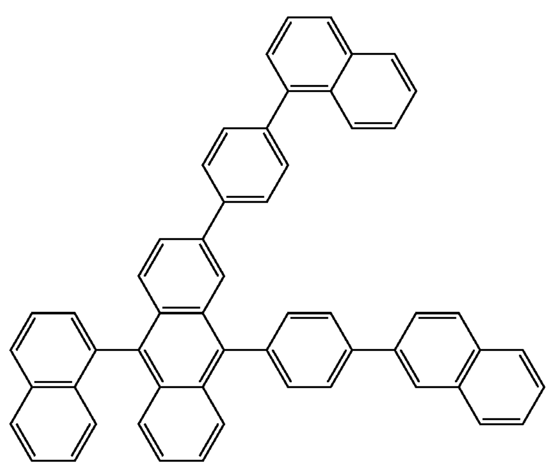

-continued
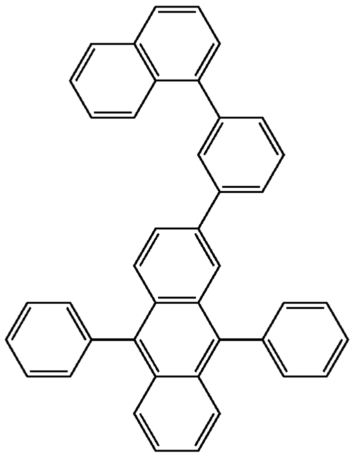
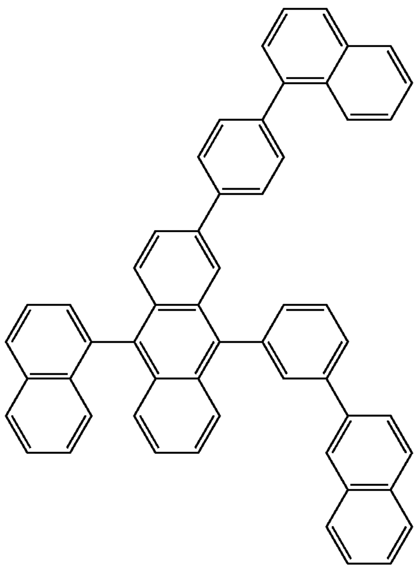
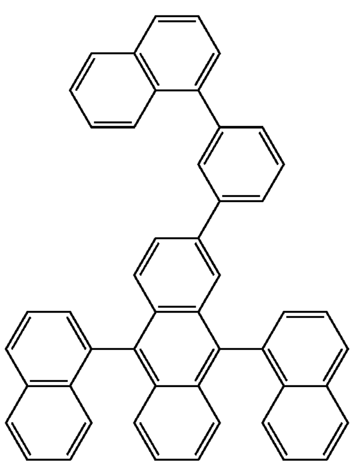
-continued
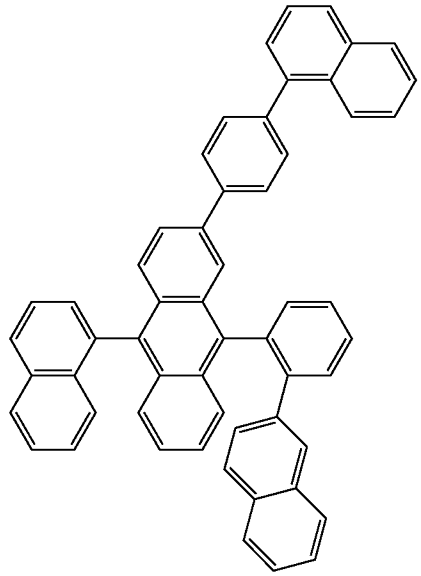
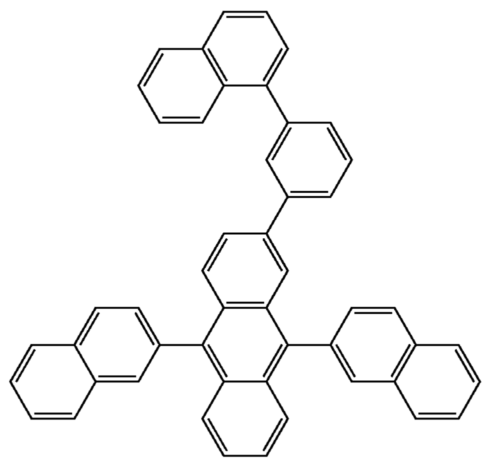
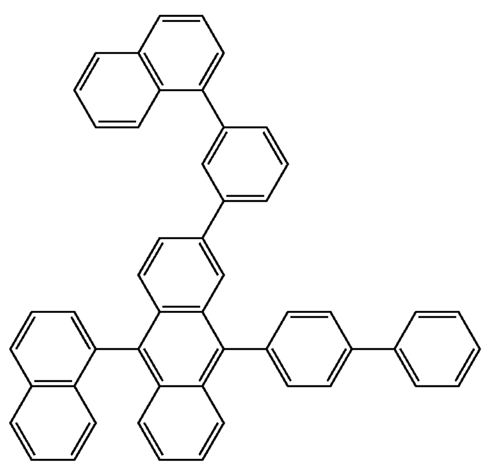

-continued
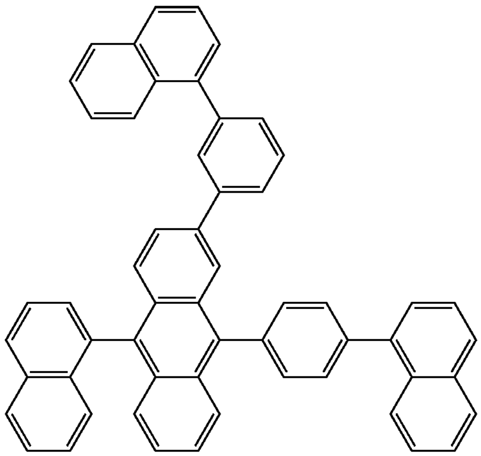
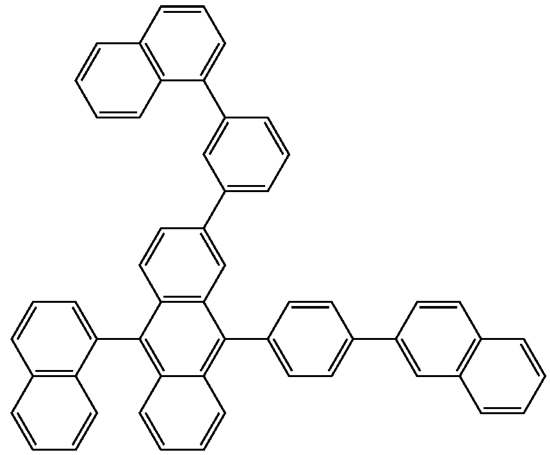
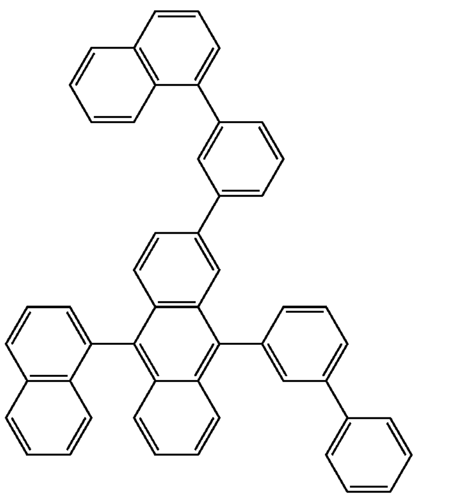
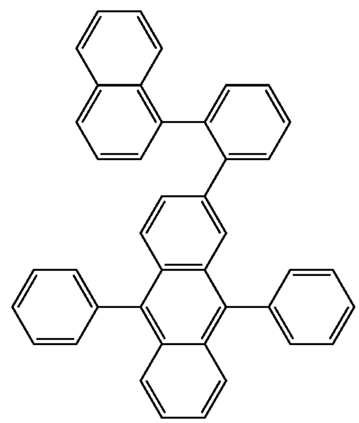
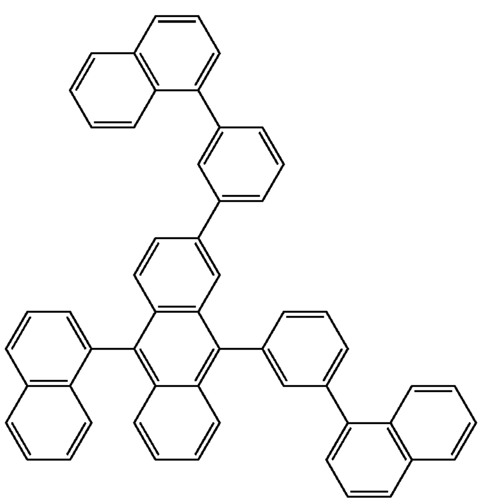
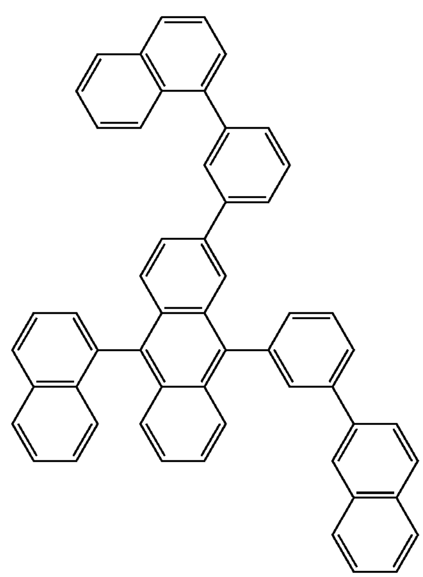
-continued -continued
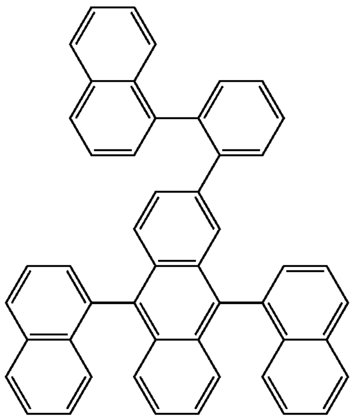
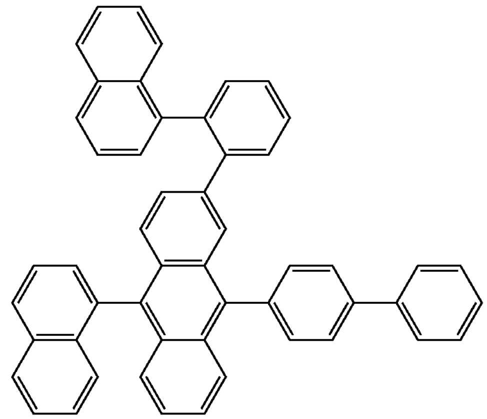
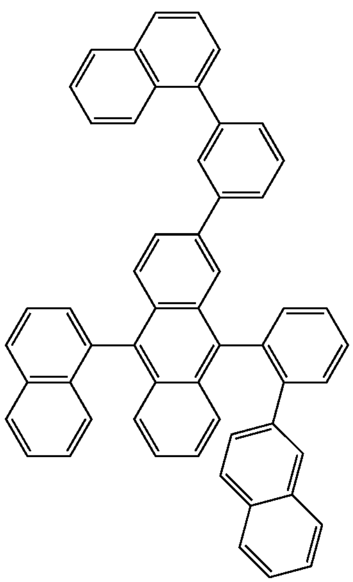
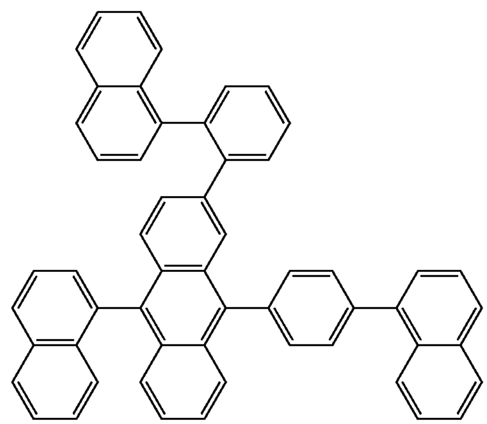
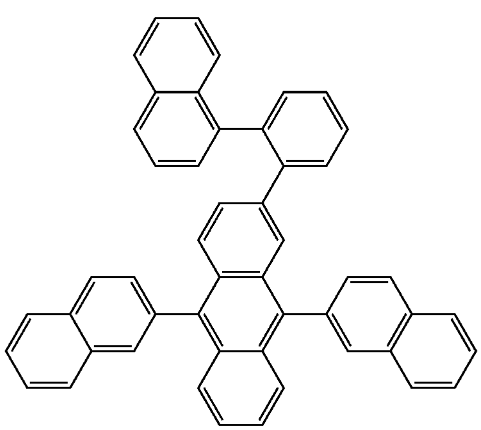
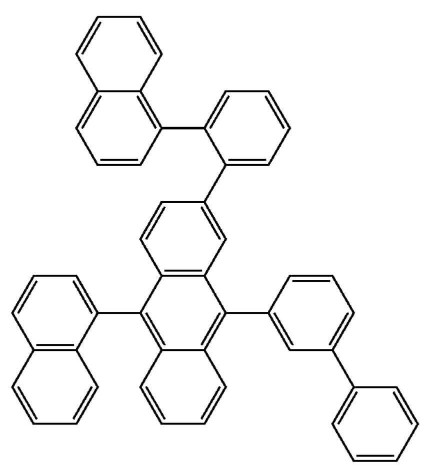

-continued
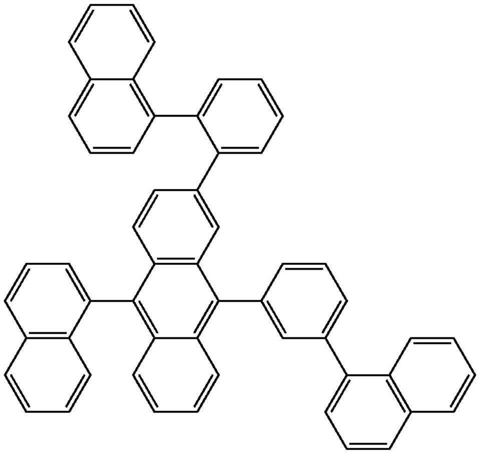
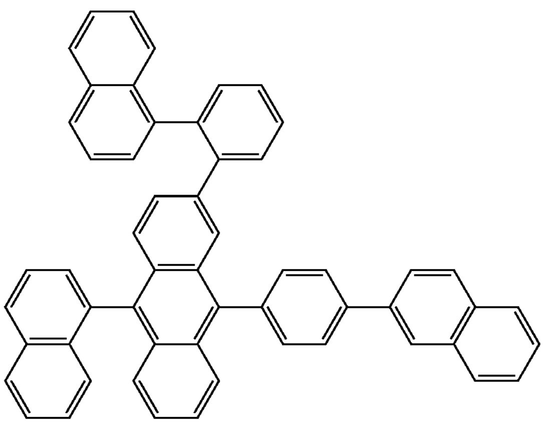
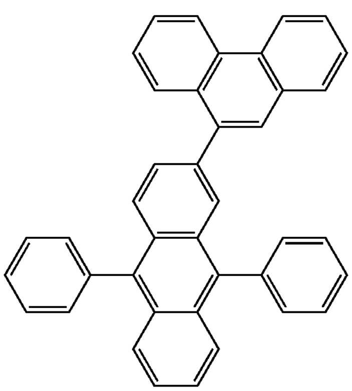
-continued
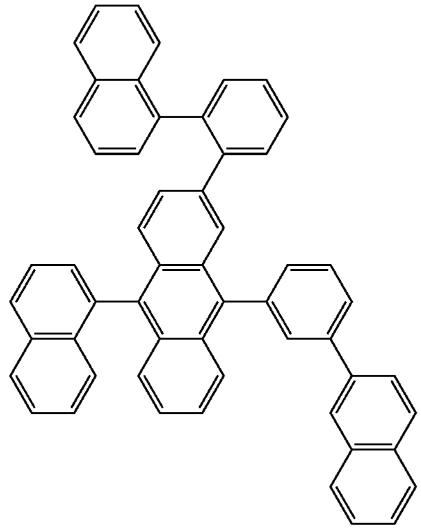
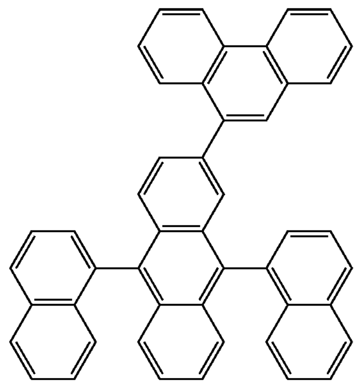
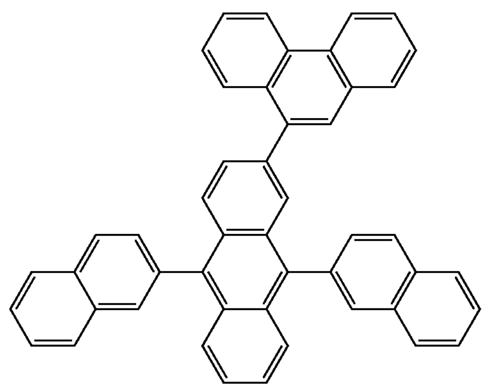
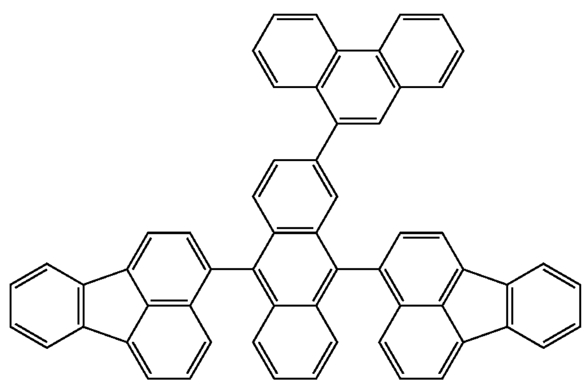

-continued
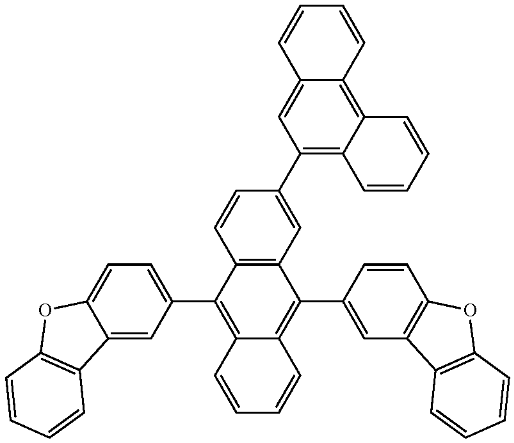
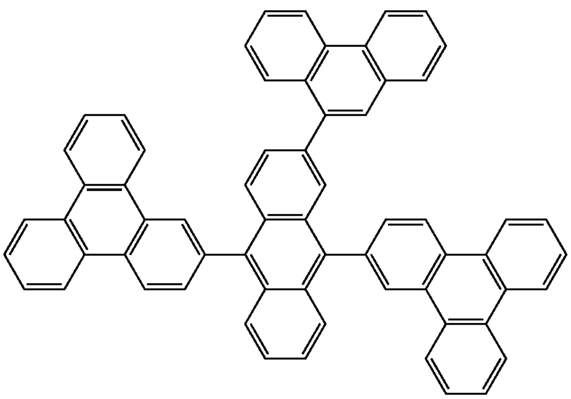
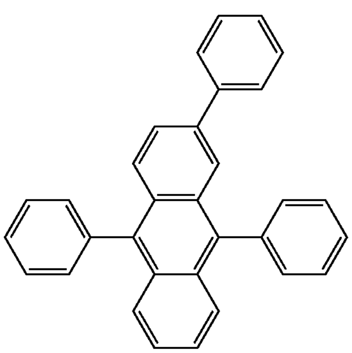
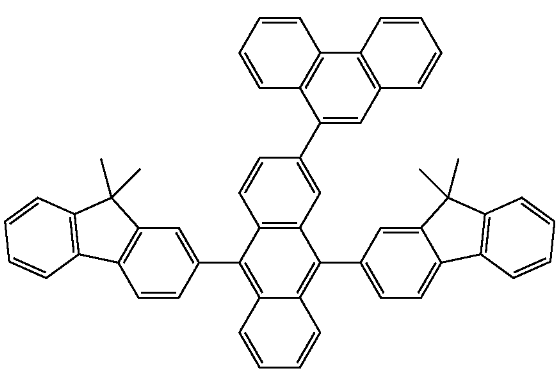
-continued
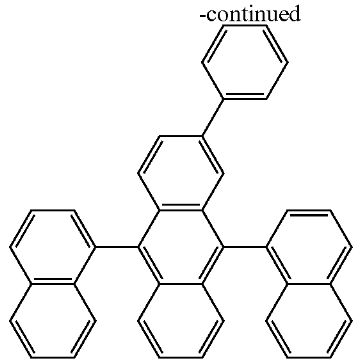
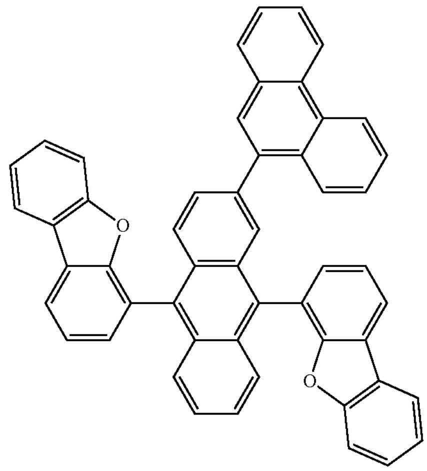
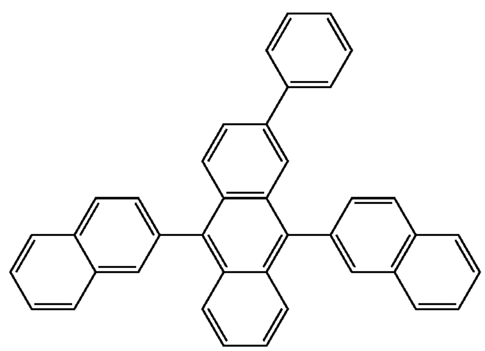
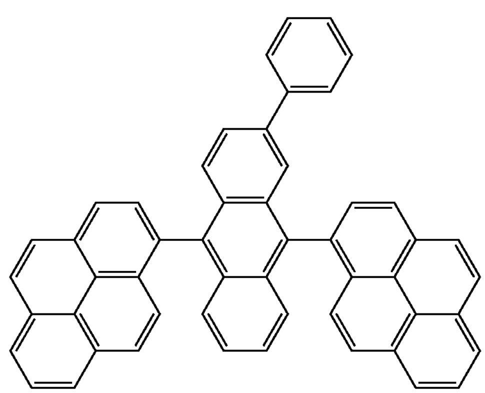

-continued
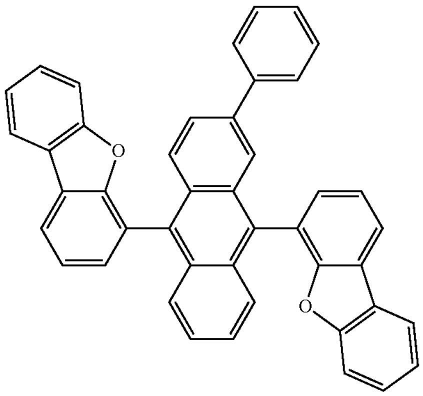
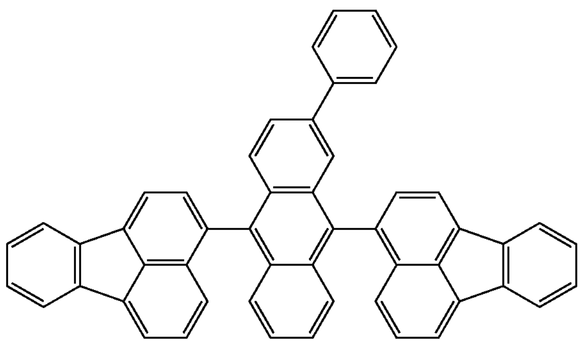
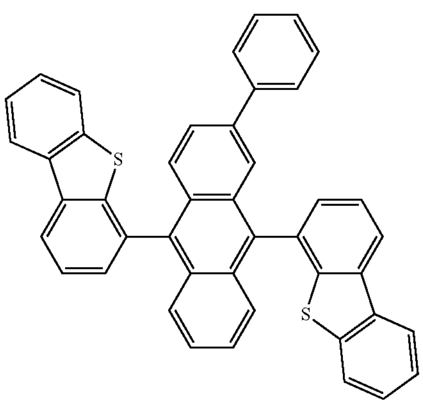
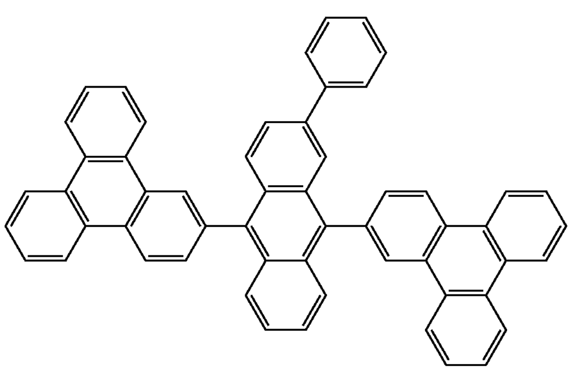
-continued
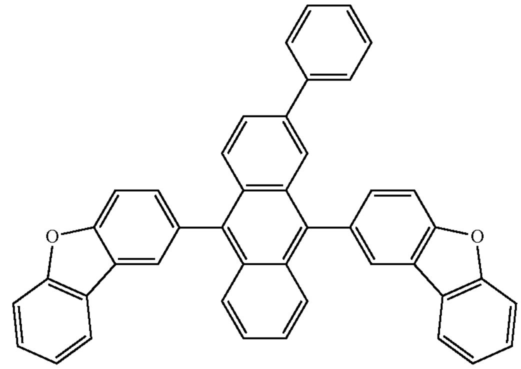
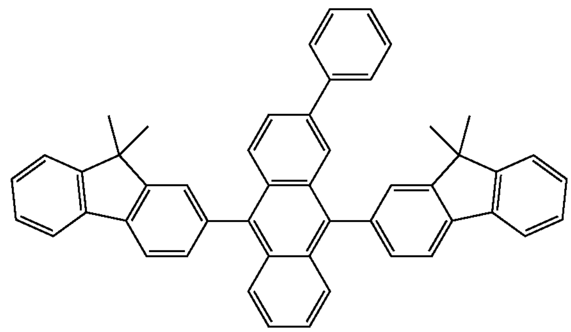
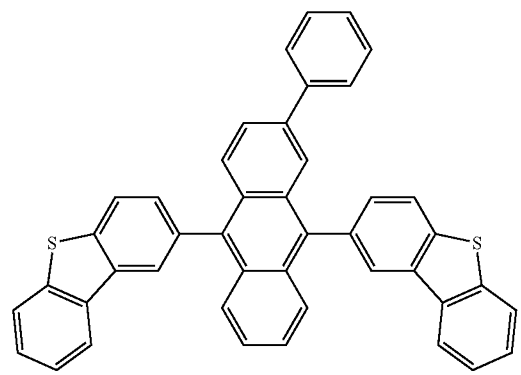
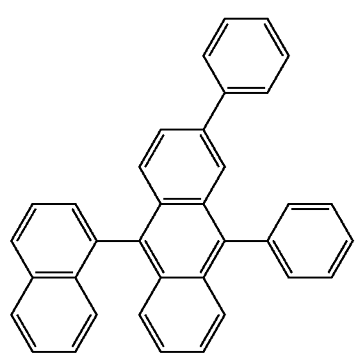

-continued
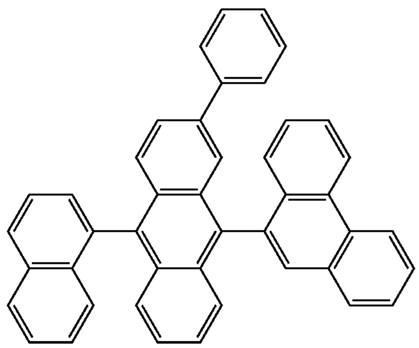
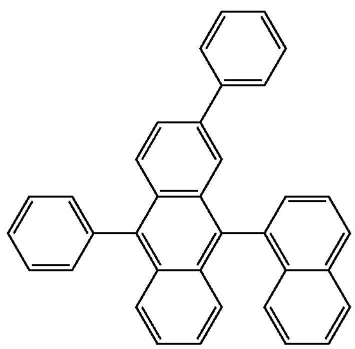
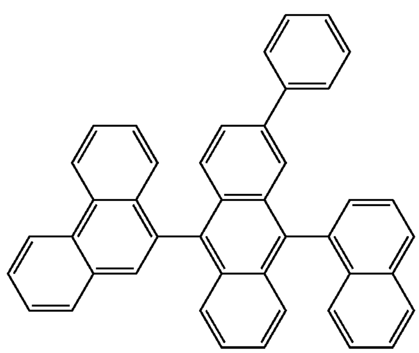
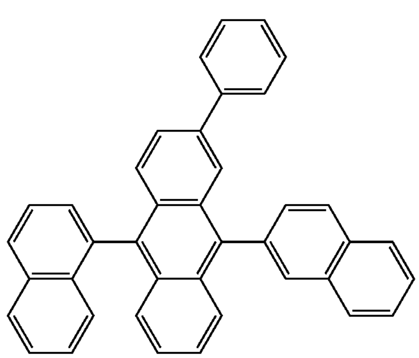
-continued
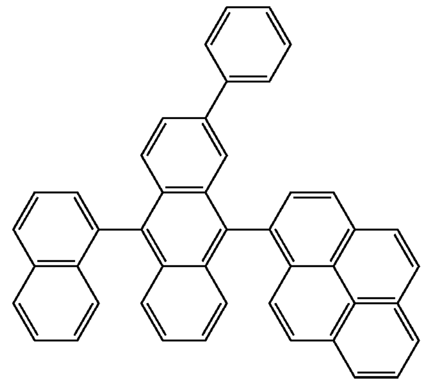
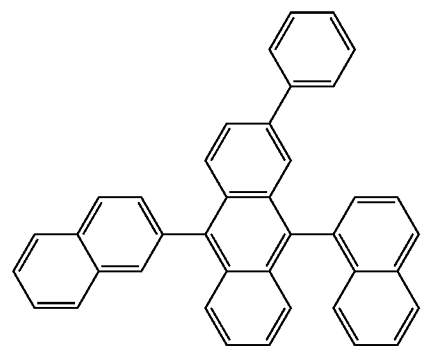
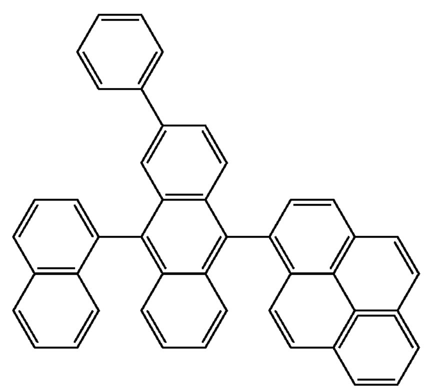
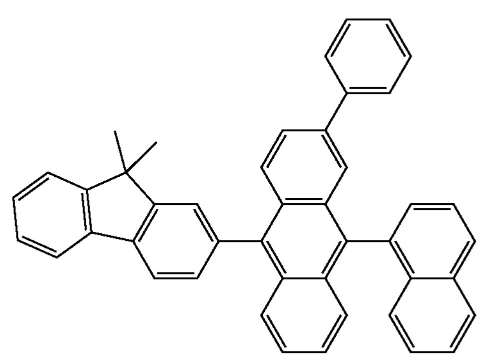

-continued
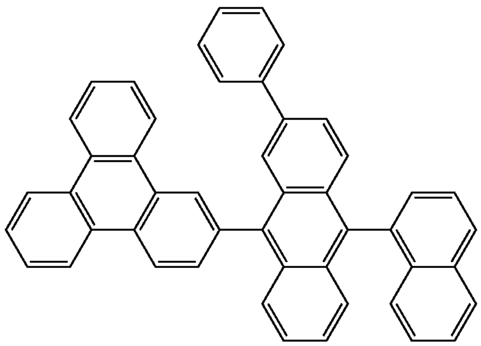
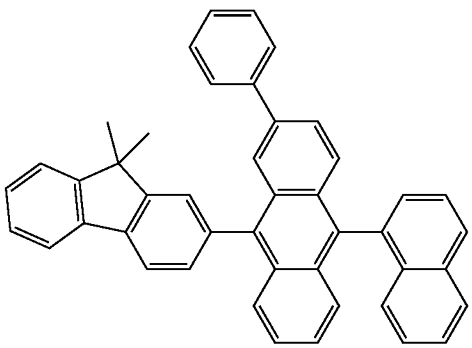
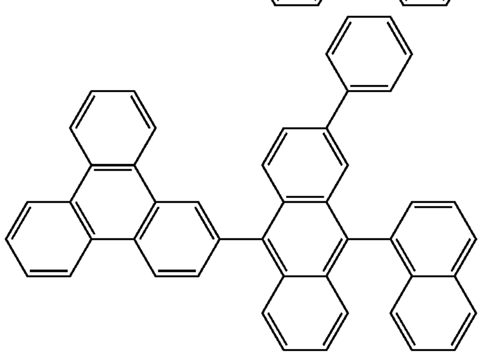
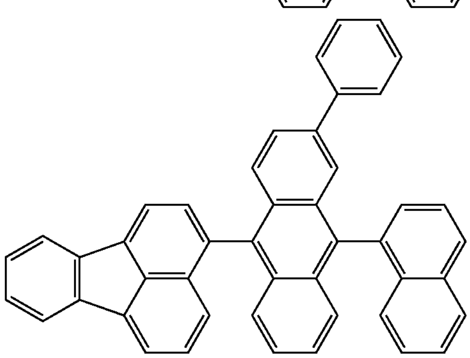
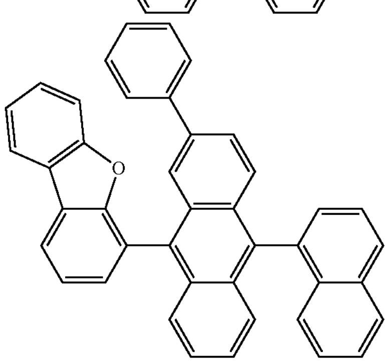
-continued
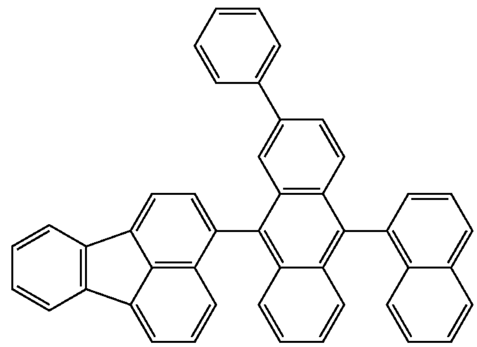
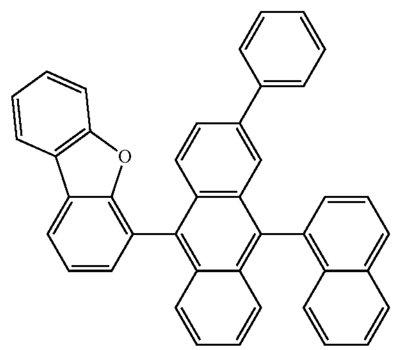
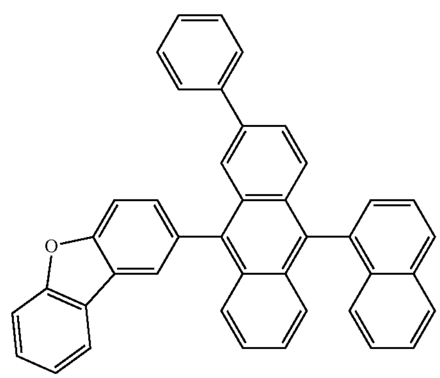
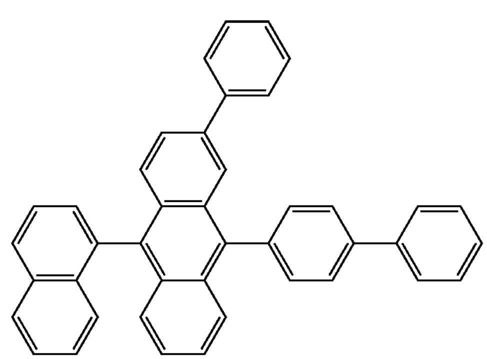

-continued
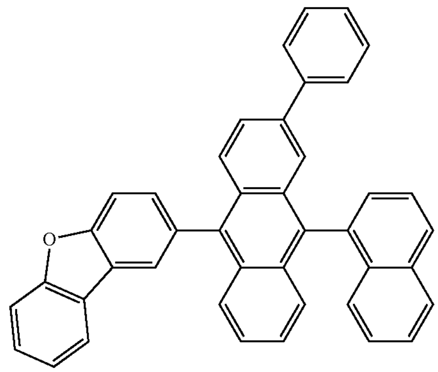
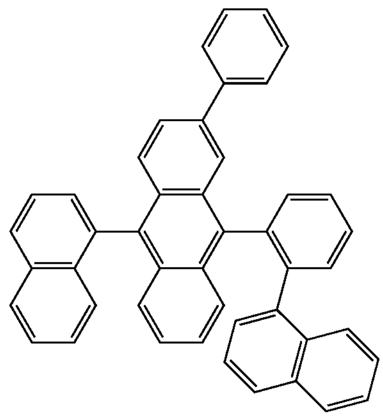
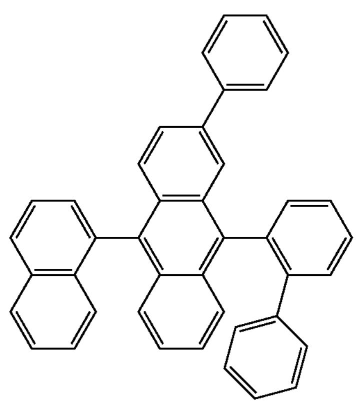
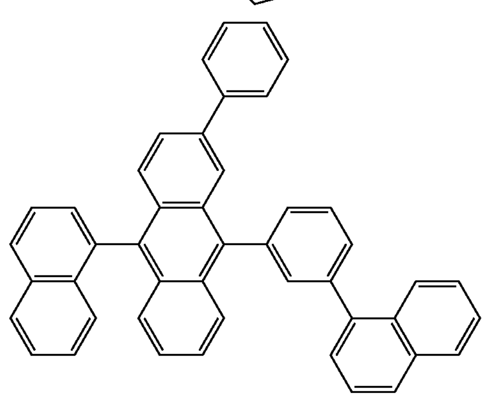
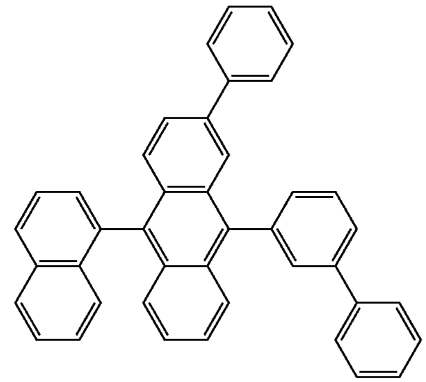
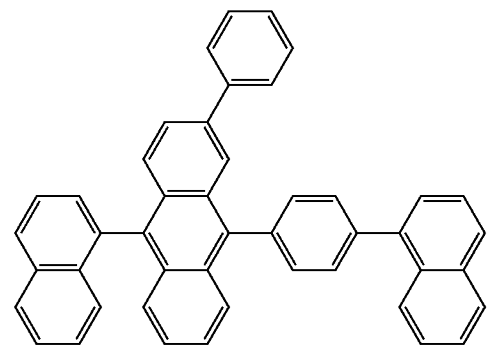
-continued
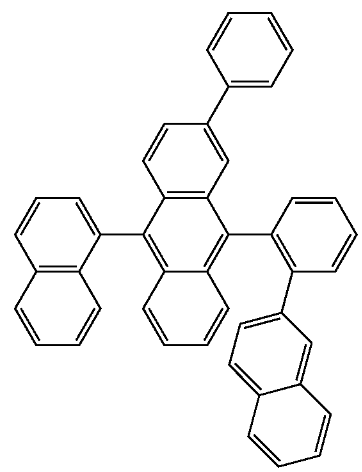 [SMILES: c1ccc(-c2ccc3c(-c4cccc5ccccc45)c4ccccc4c(-c4ccccc4-c4ccc5ccccc5c4)c3c2)cc1]
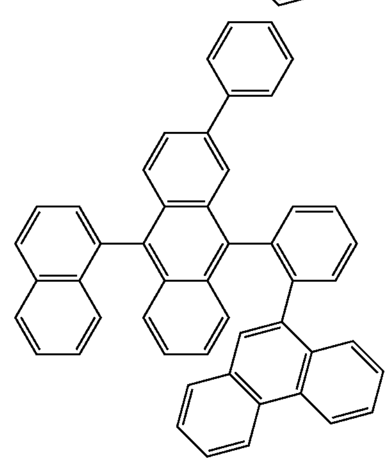

-continued
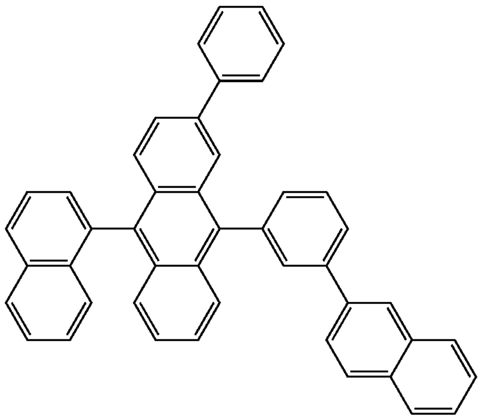
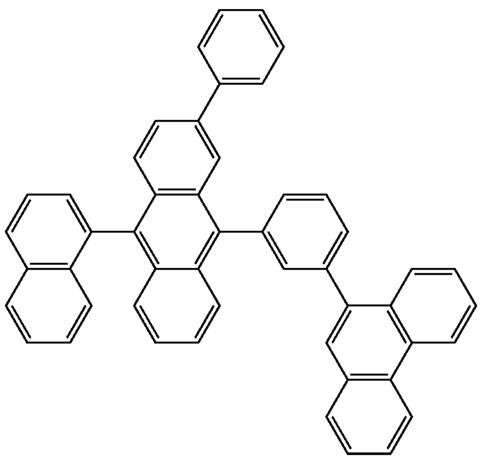
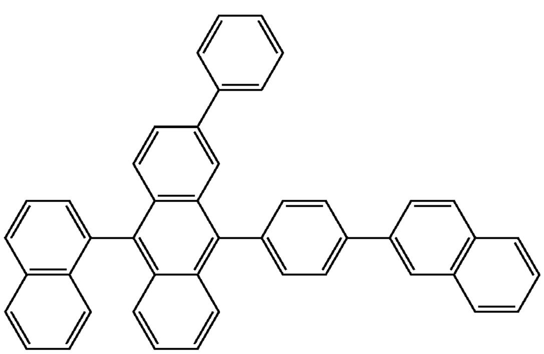
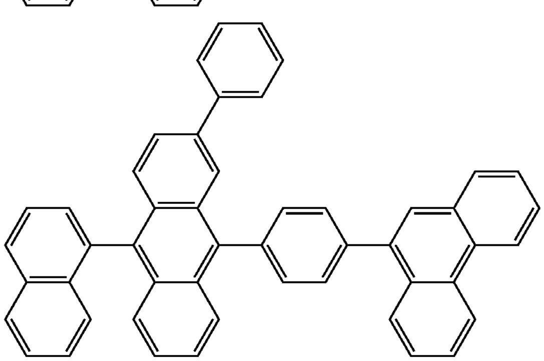
-continued
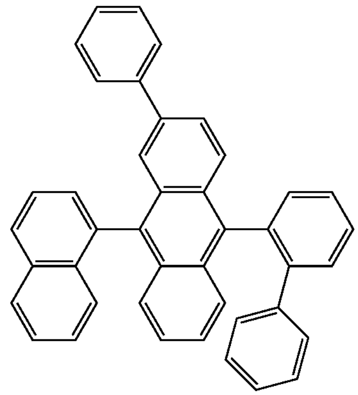
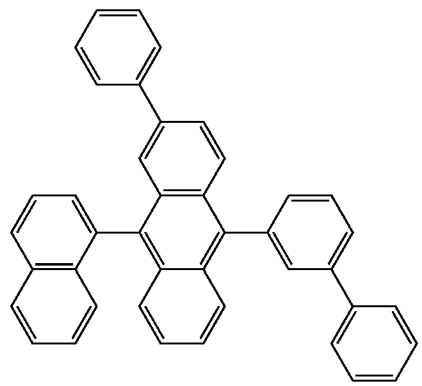
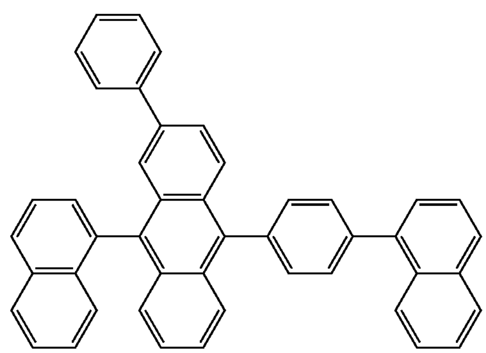
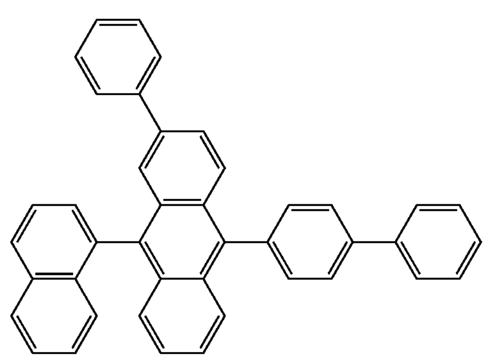

-continued
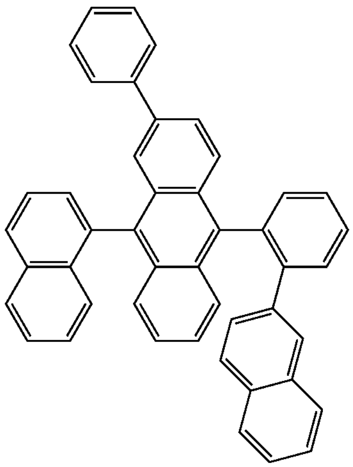
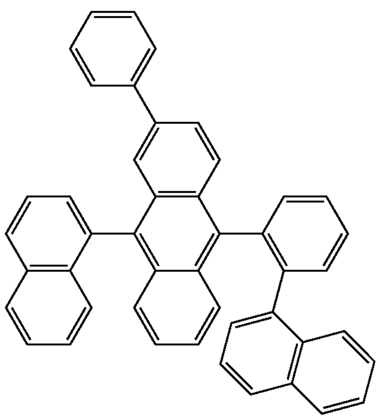
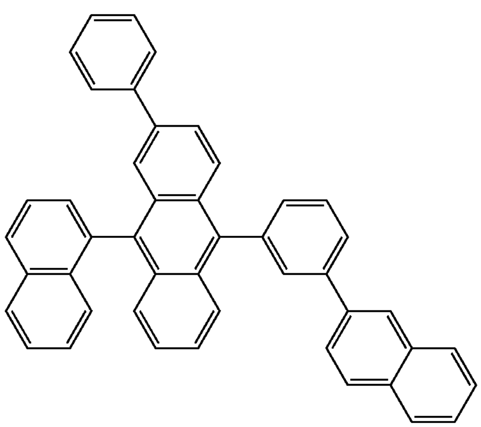
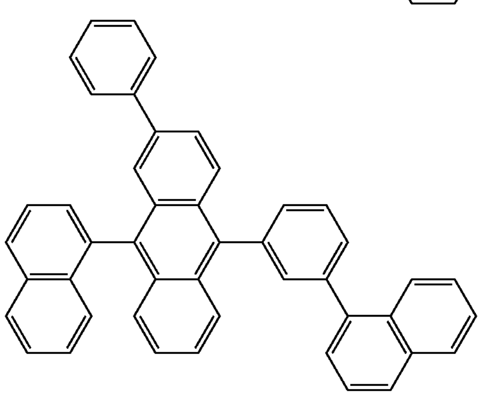
-continued
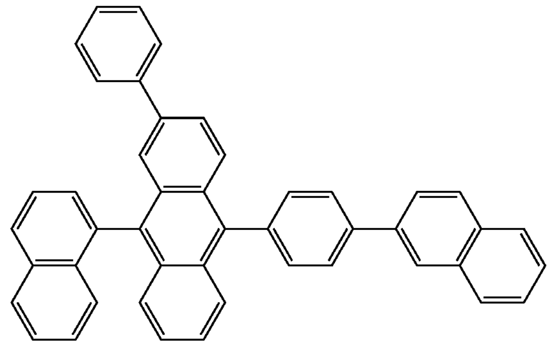
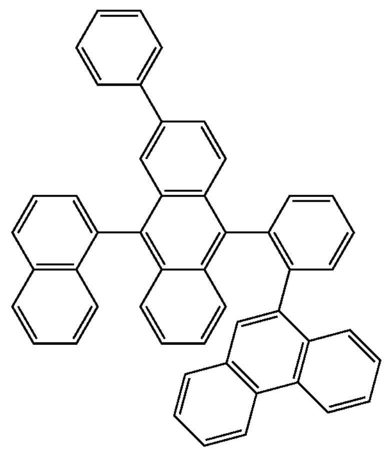
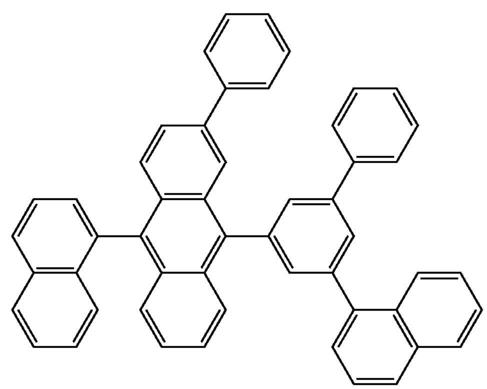
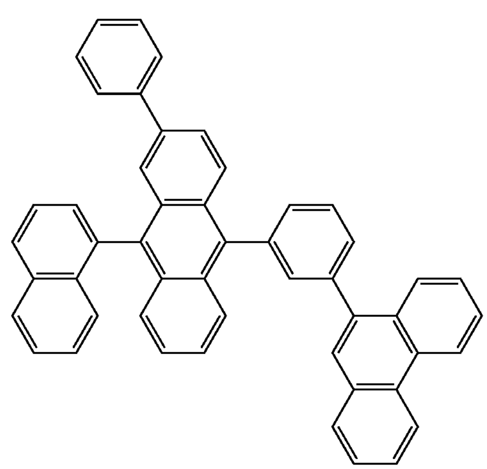

-continued
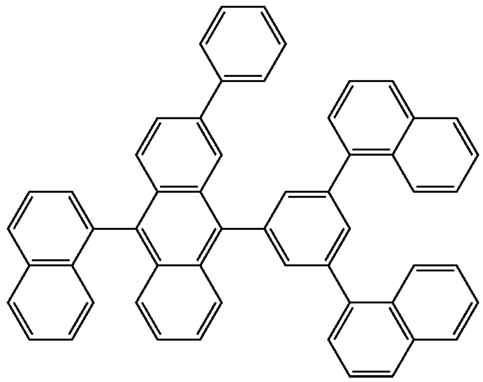
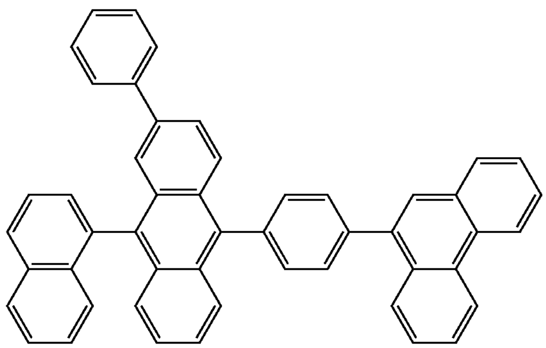
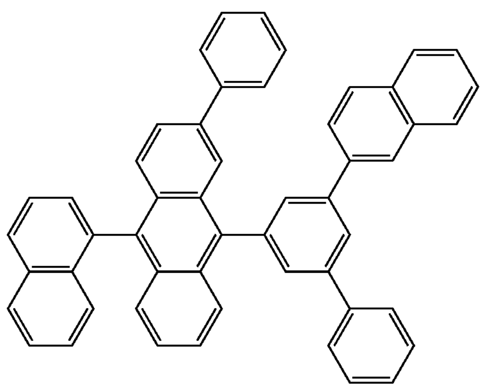
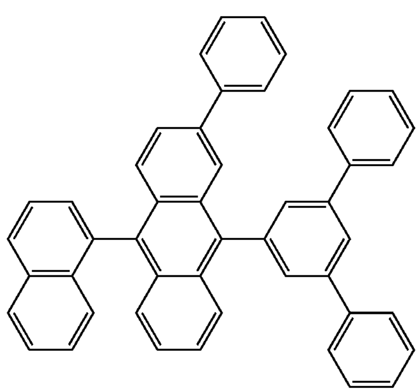
-continued
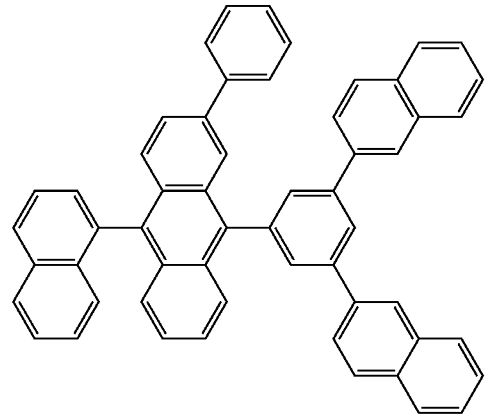
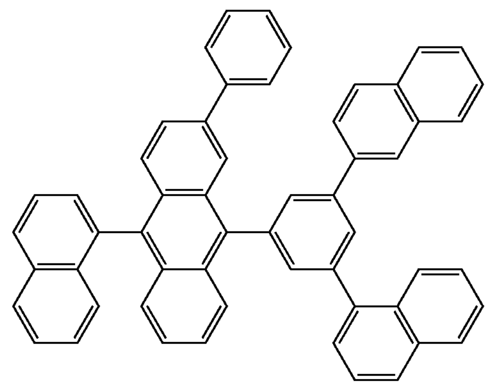
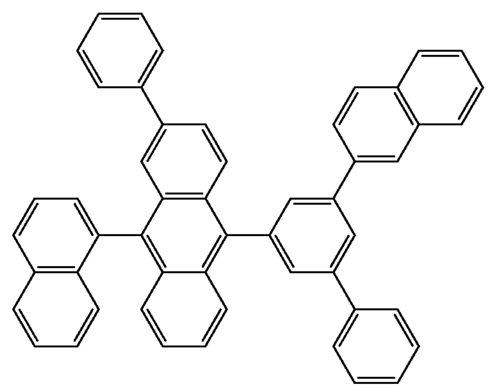
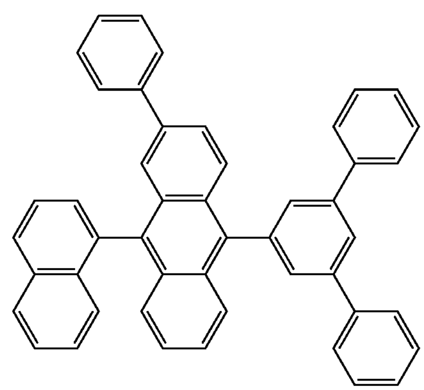

-continued
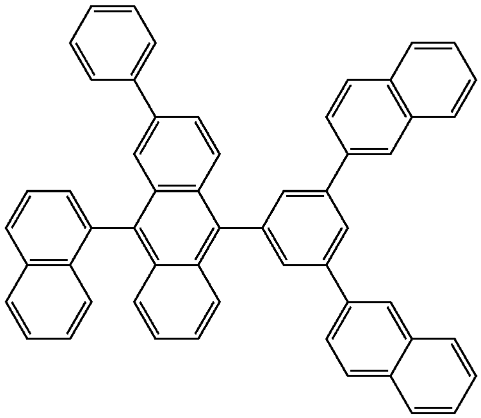
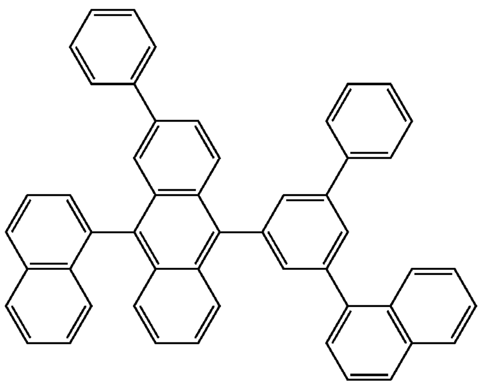
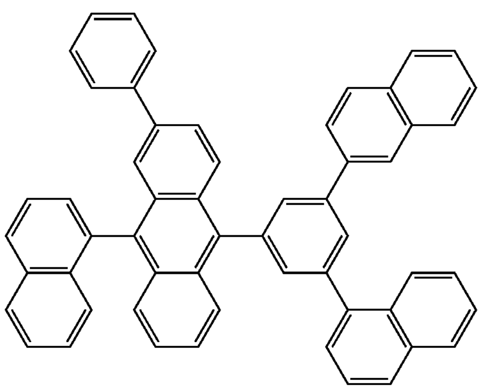
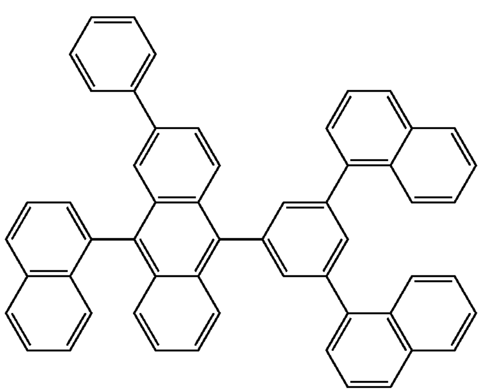
-continued
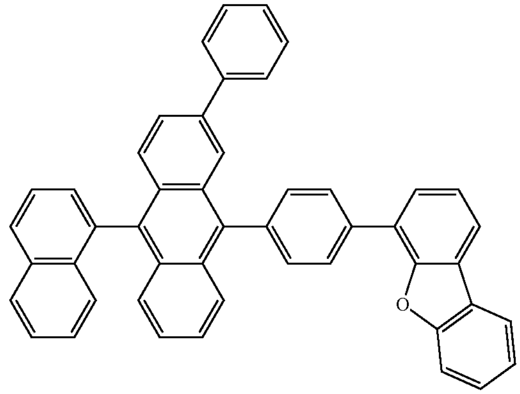
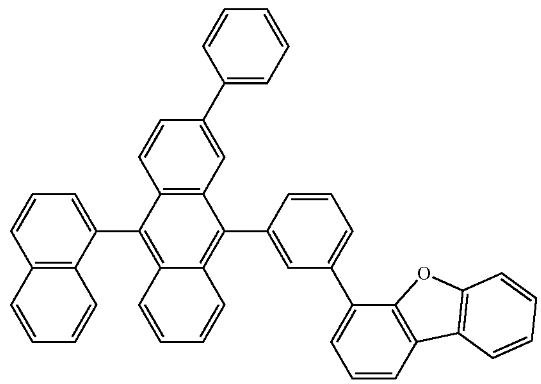
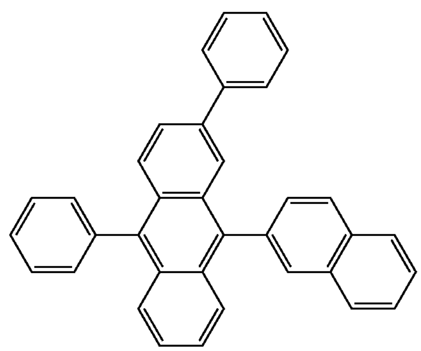
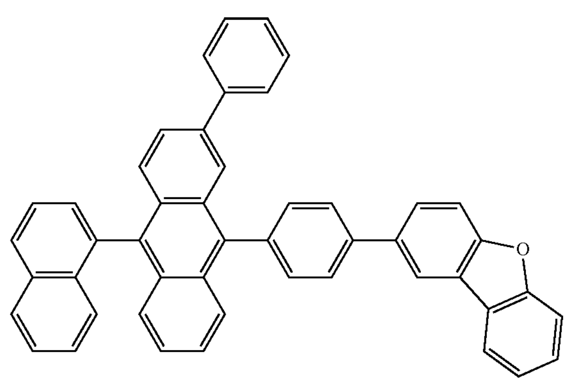

-continued
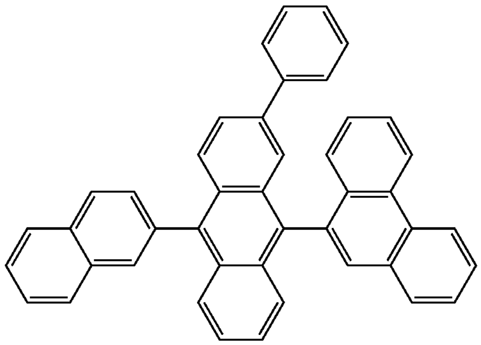
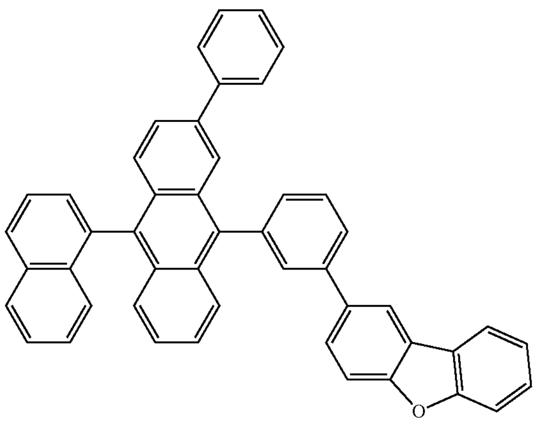
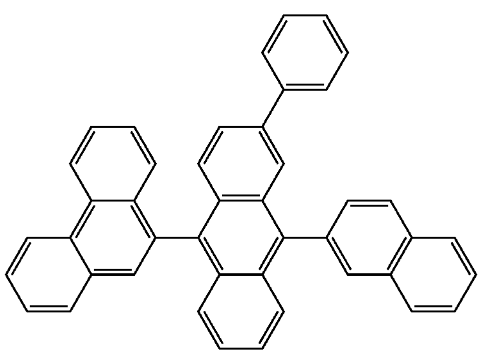
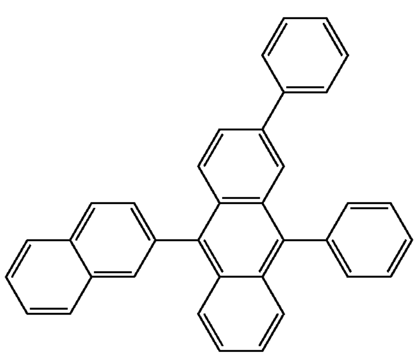
-continued
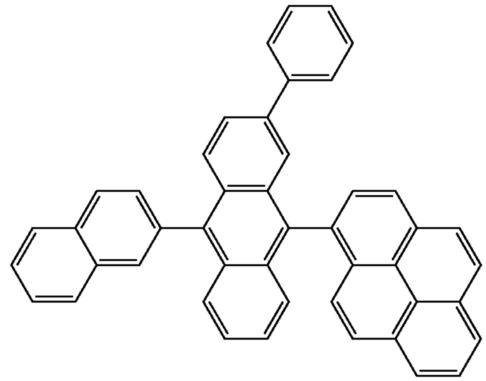
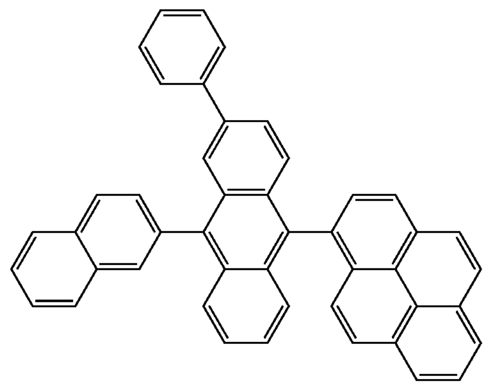
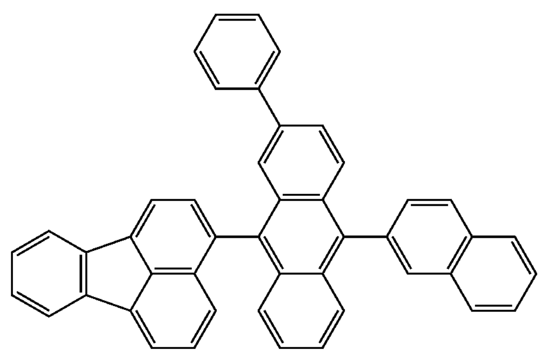
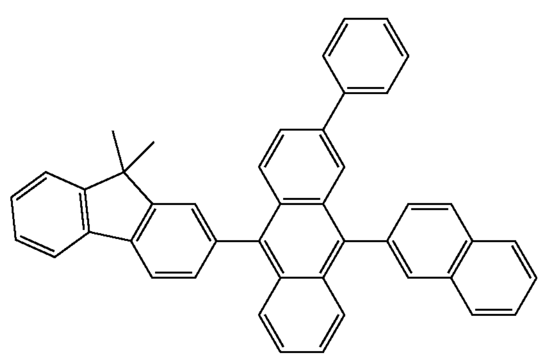

-continued
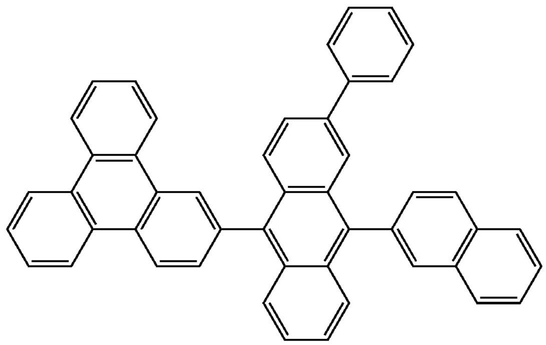
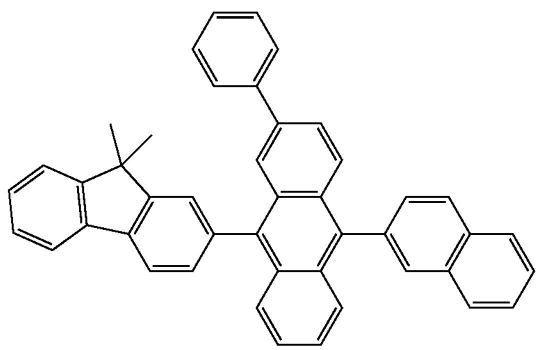
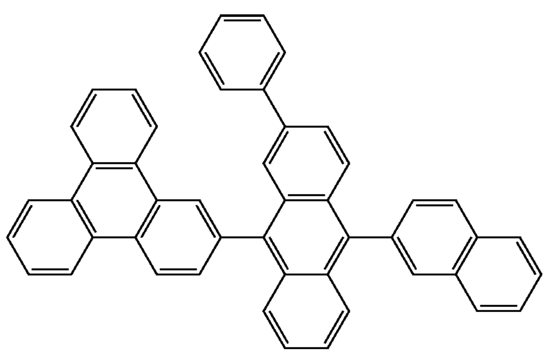
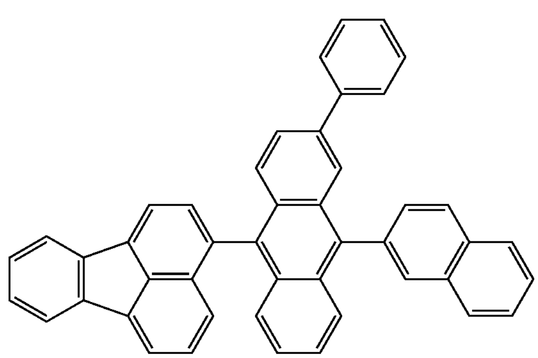
-continued
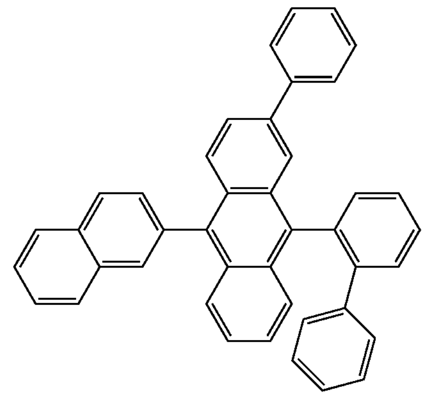
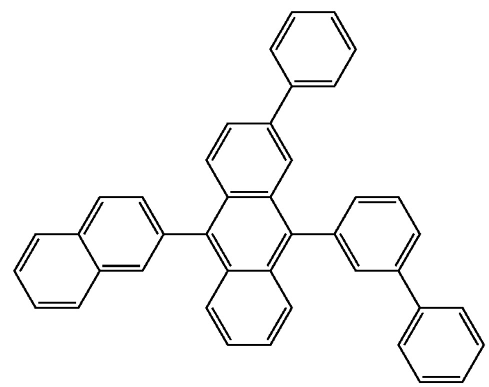
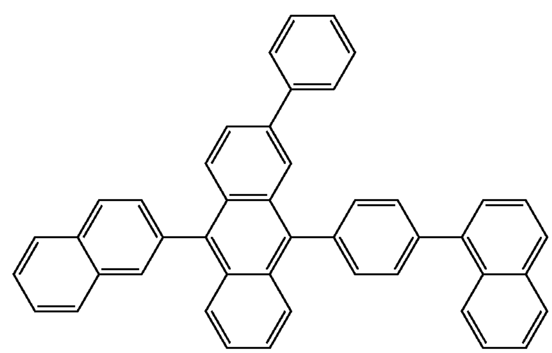
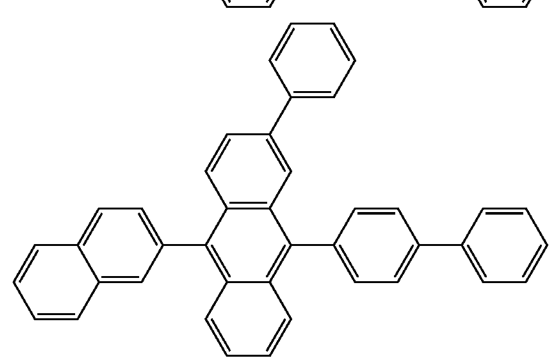

-continued
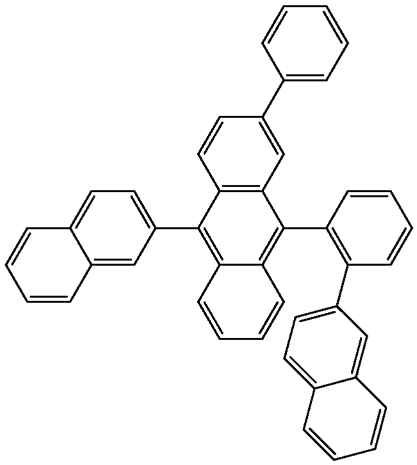
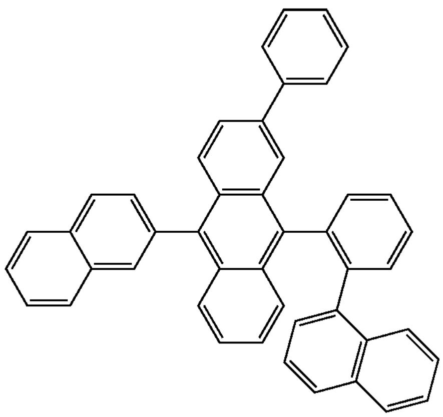
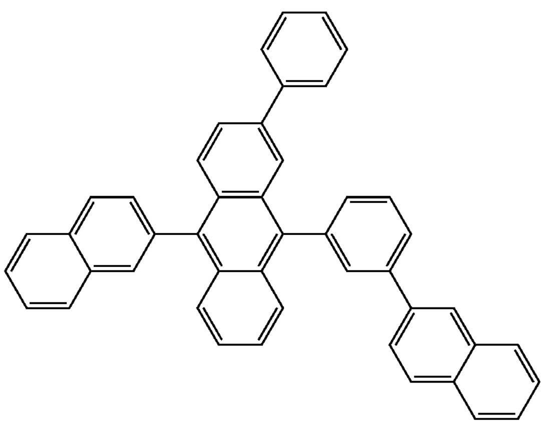
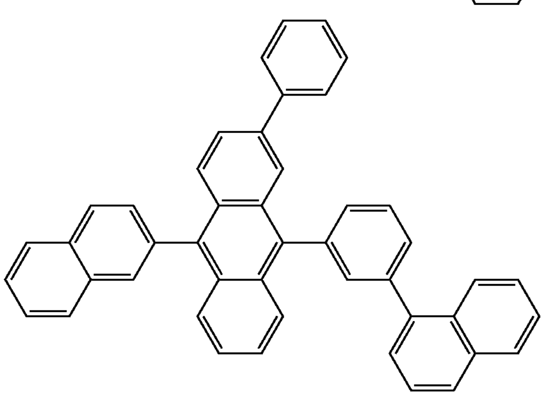
-continued
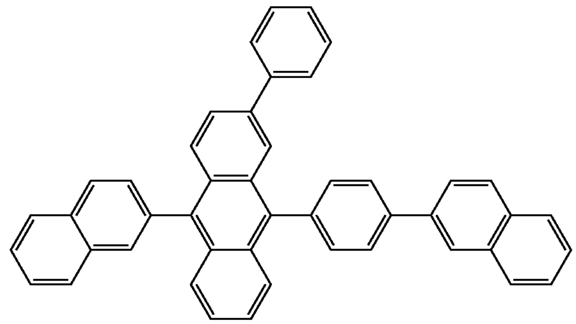
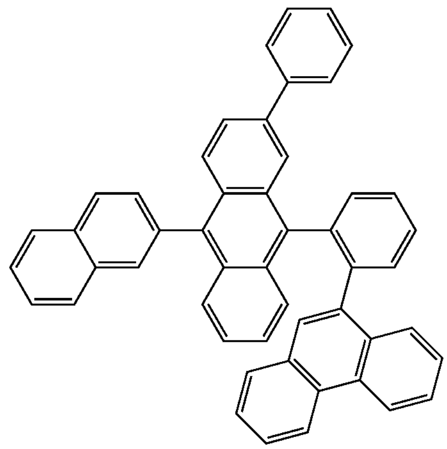
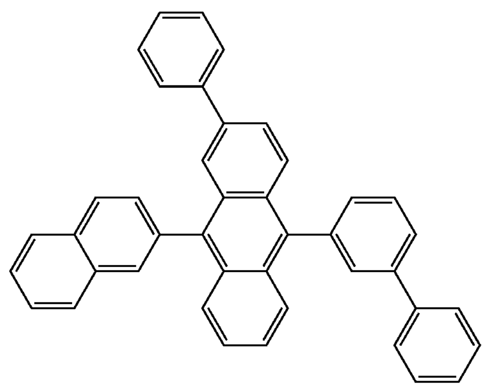
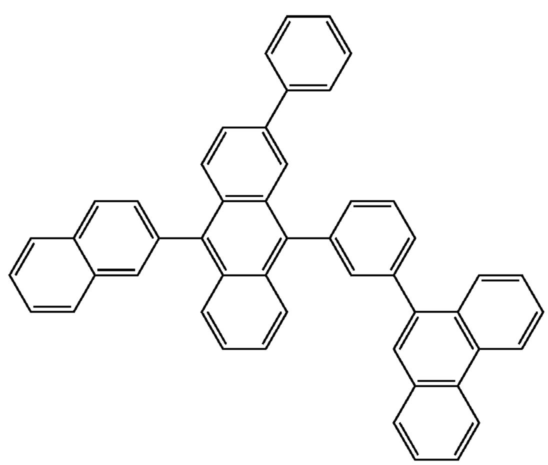

-continued
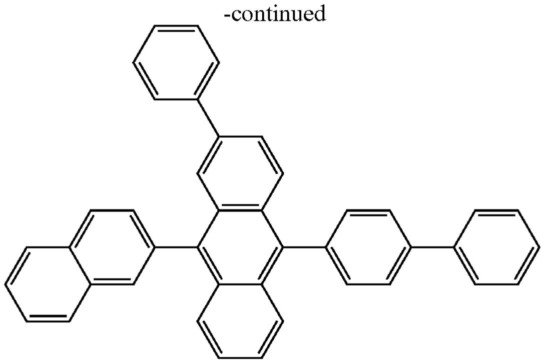
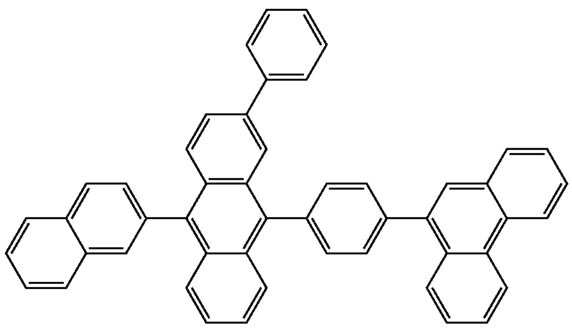
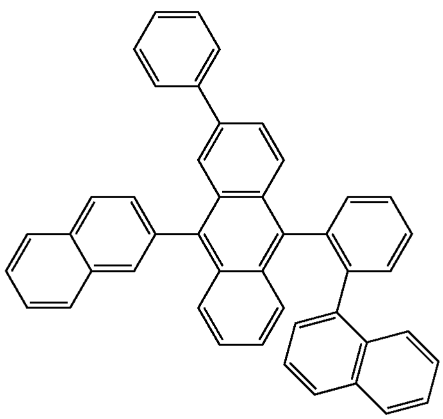
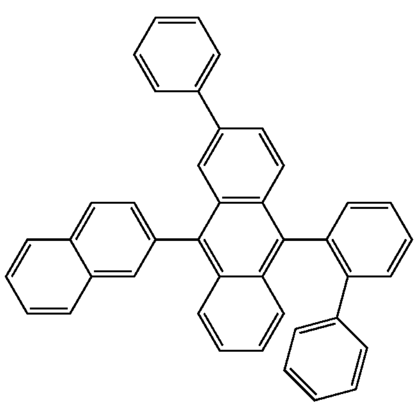
-continued
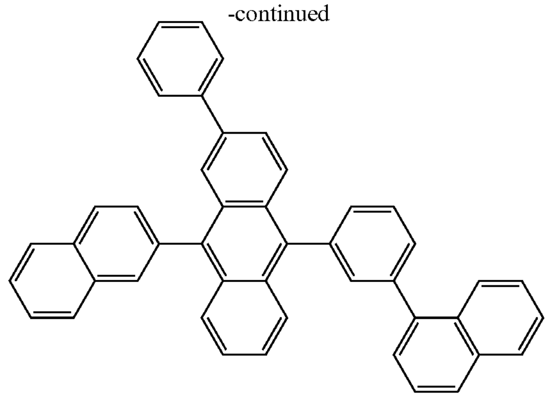
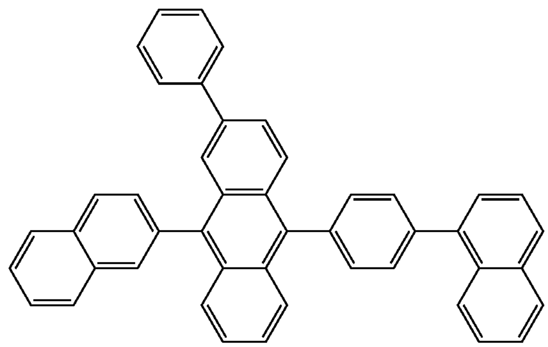
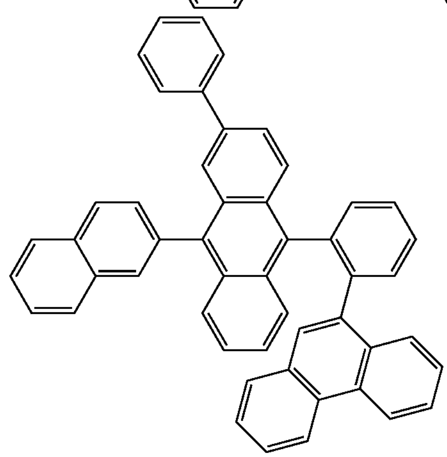
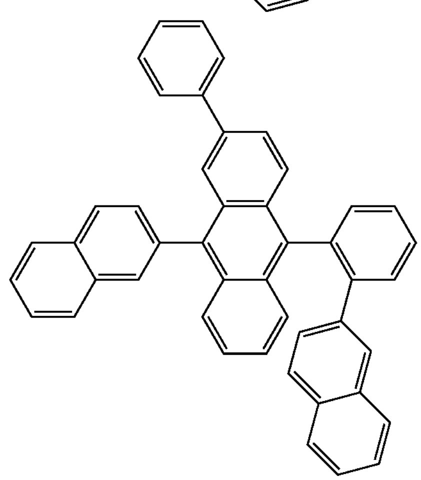

-continued
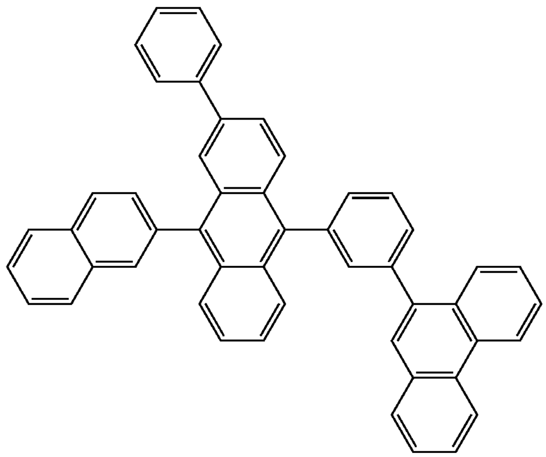
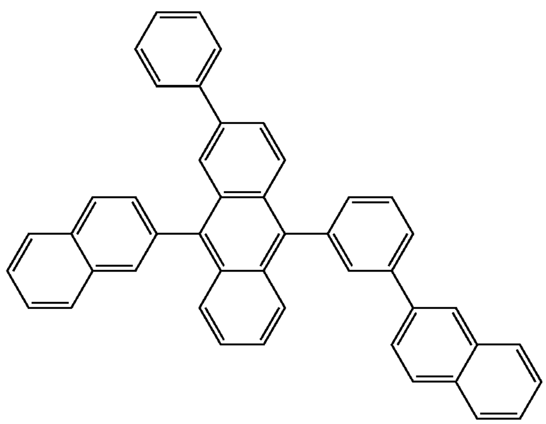
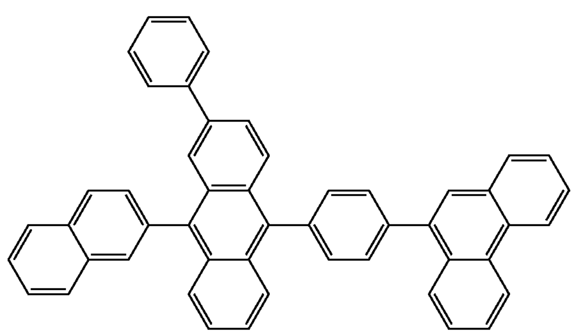
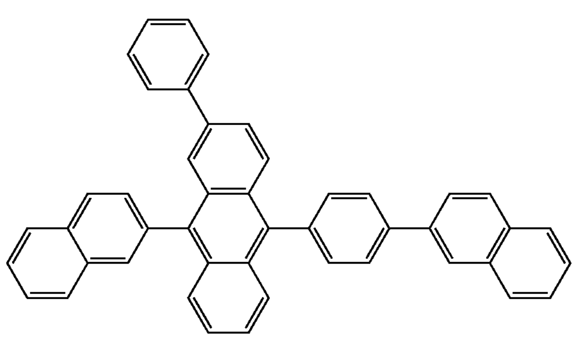
-continued
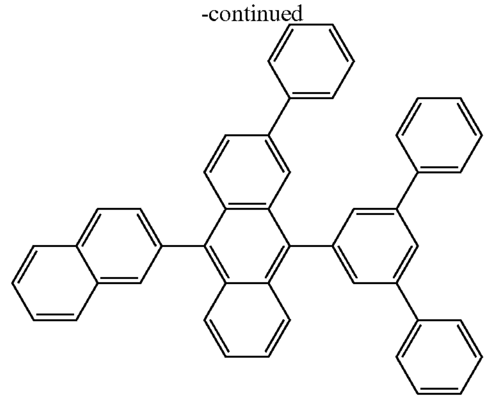
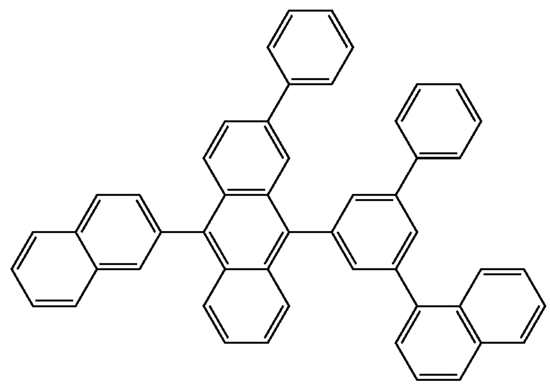
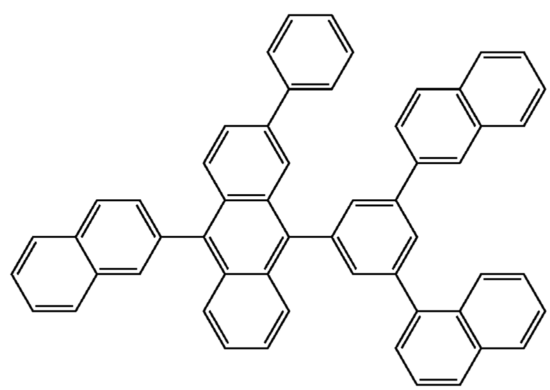
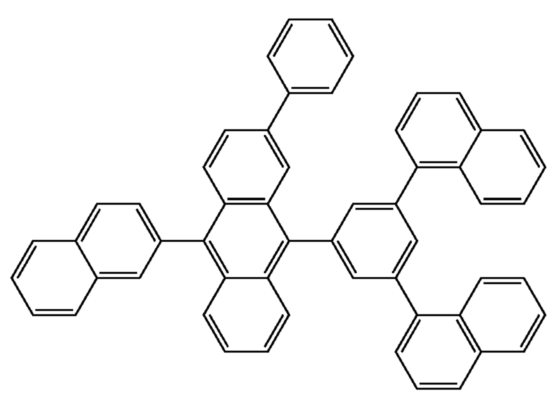

-continued
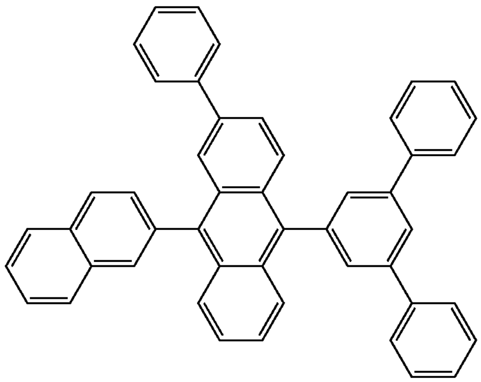
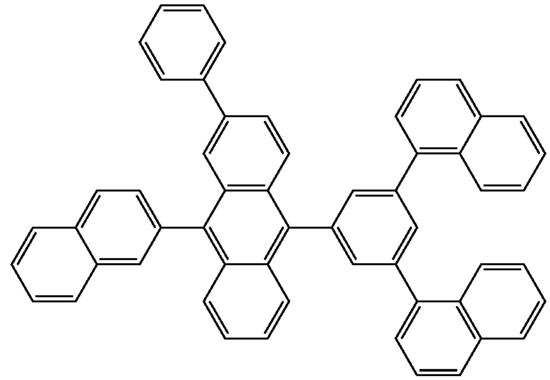
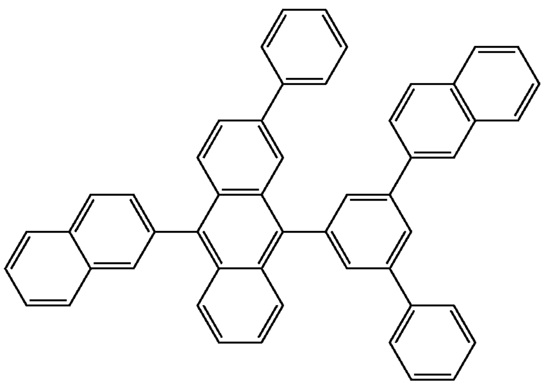
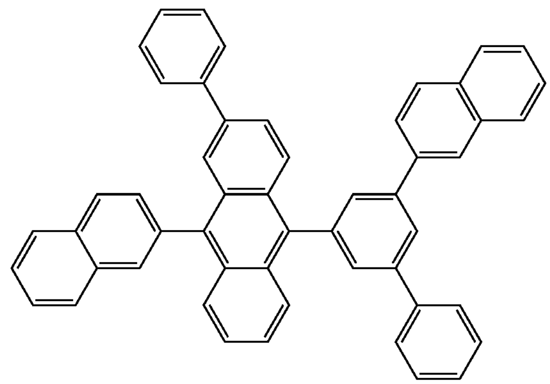
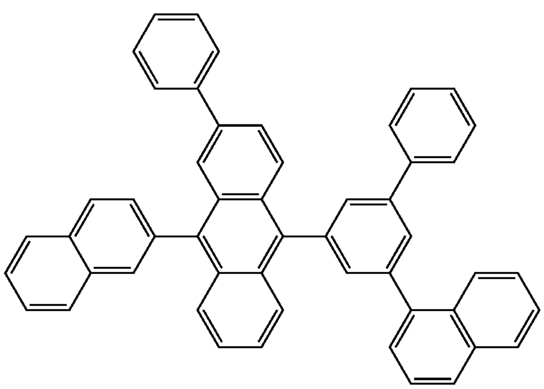
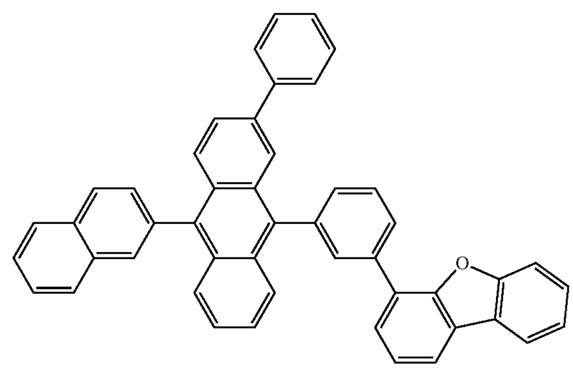
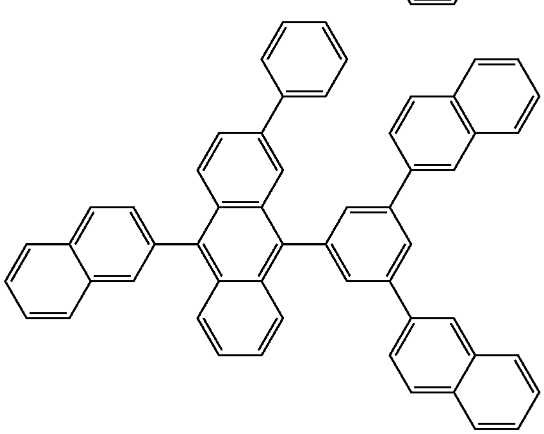
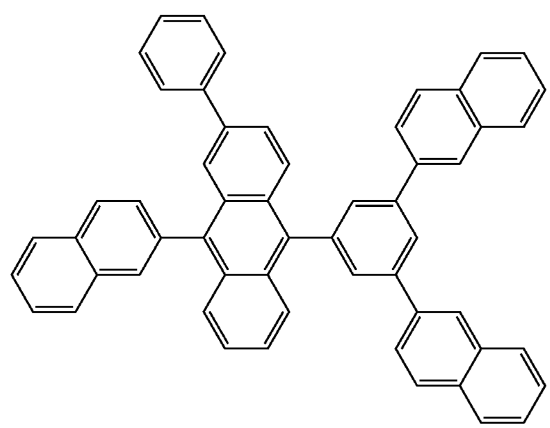

-continued
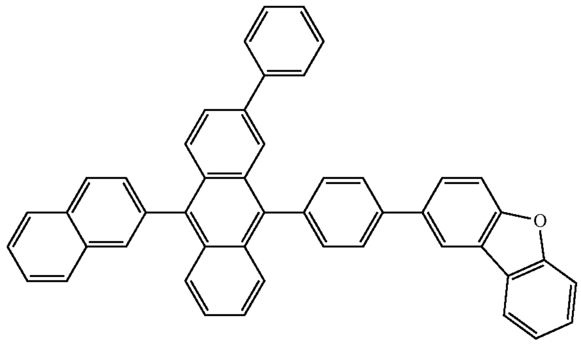
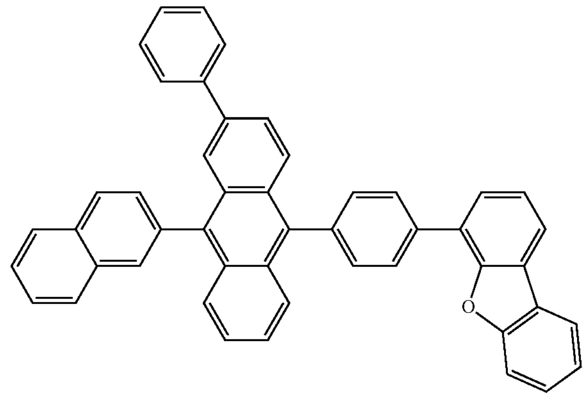
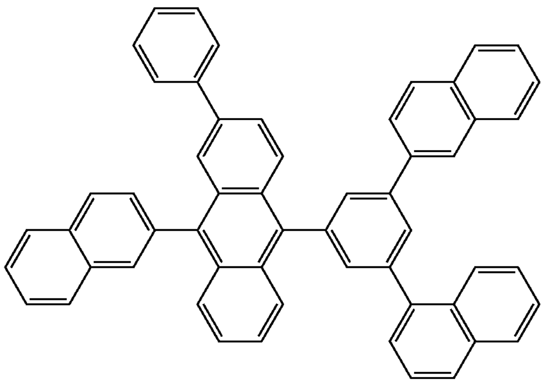
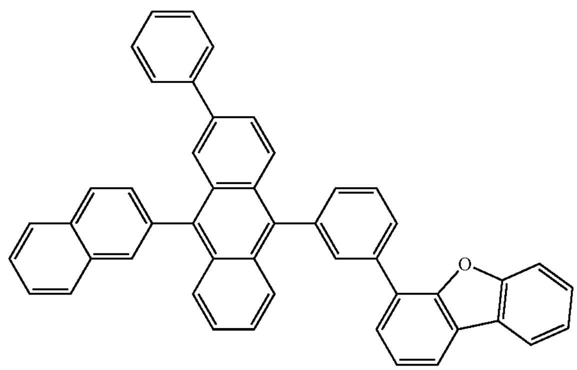
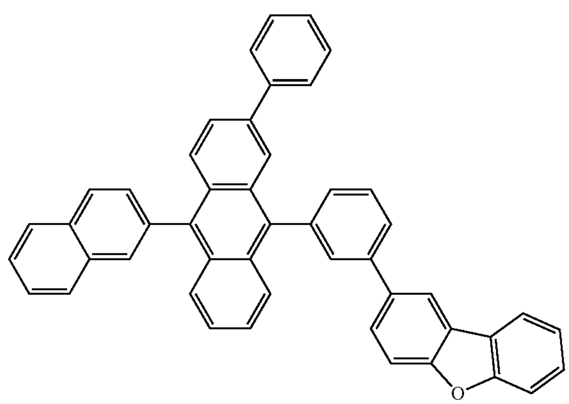
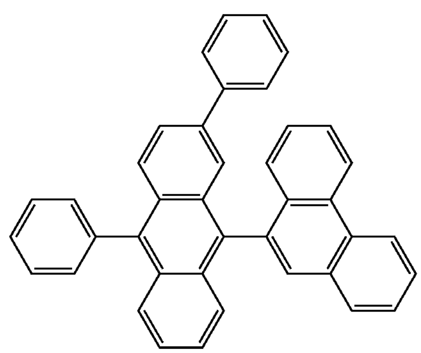
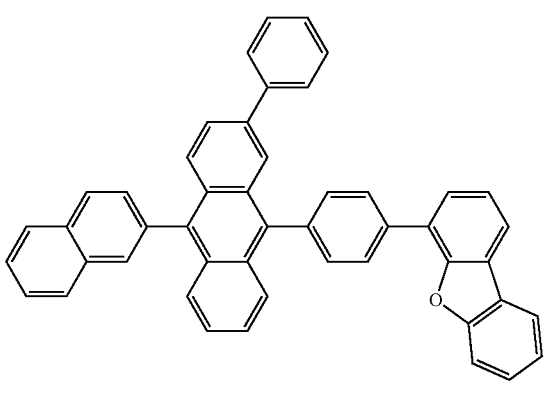
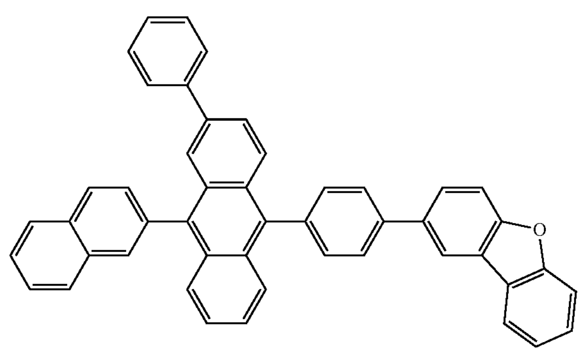
-continued -continued
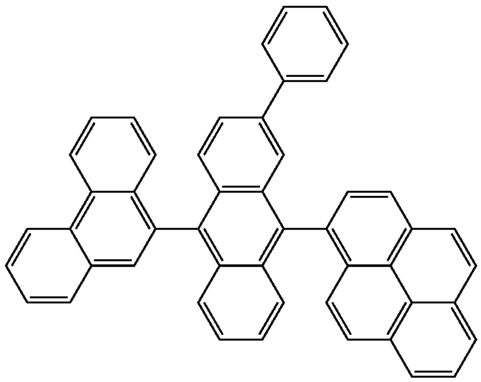
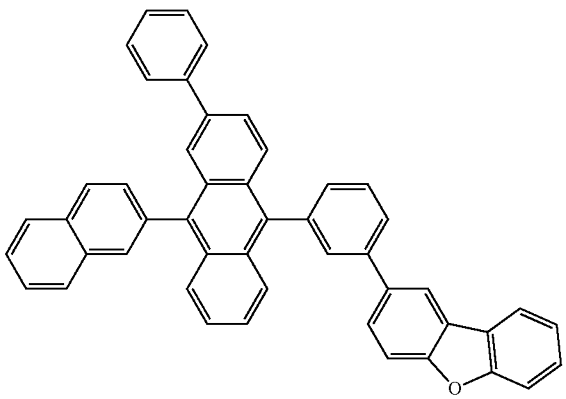
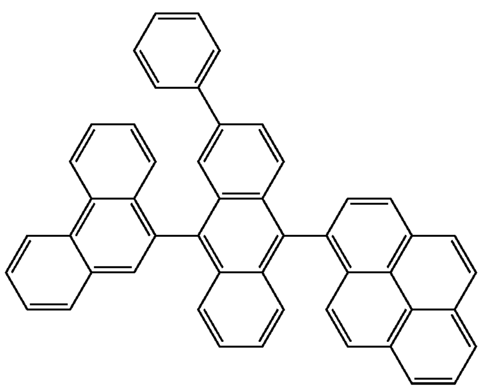
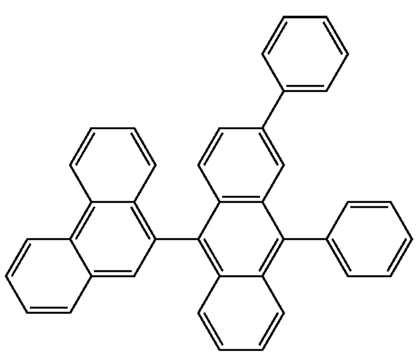
-continued
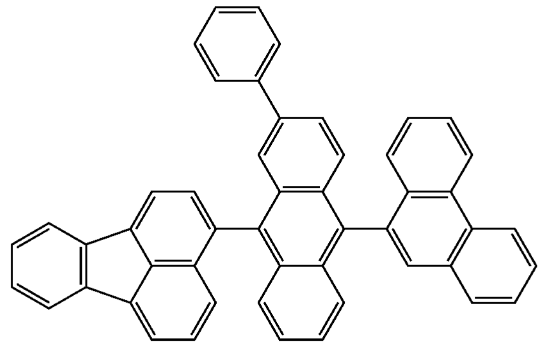
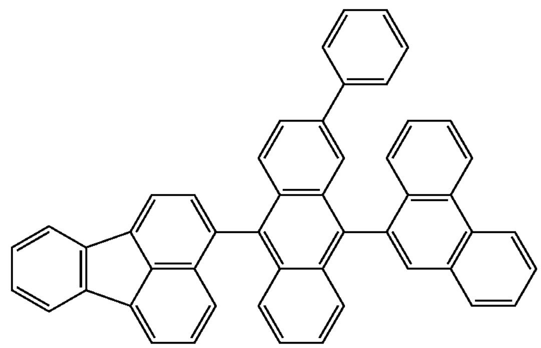
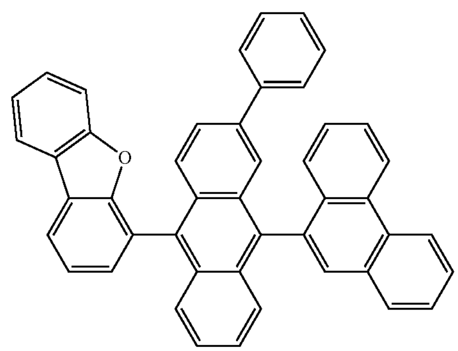
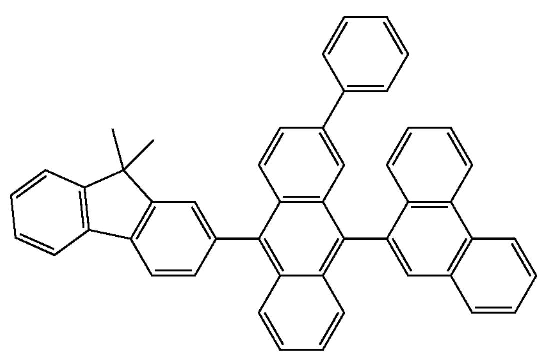

-continued
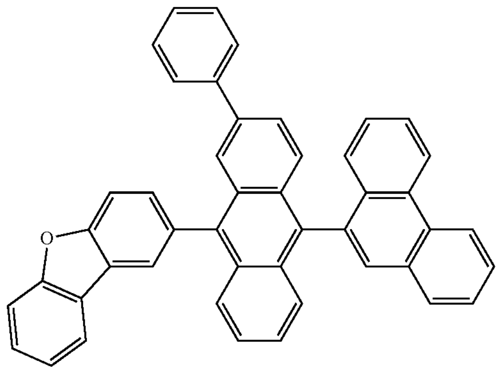
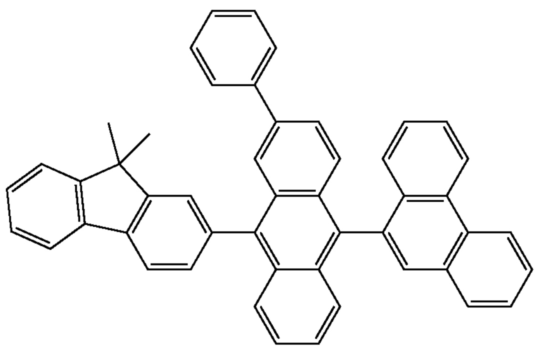
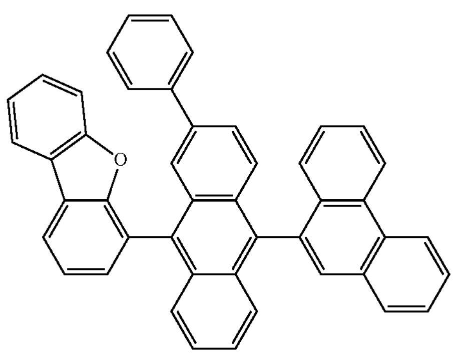
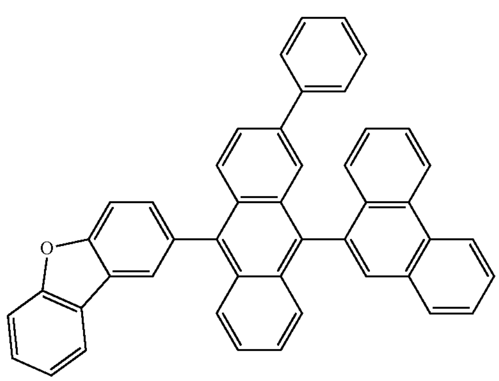
-continued
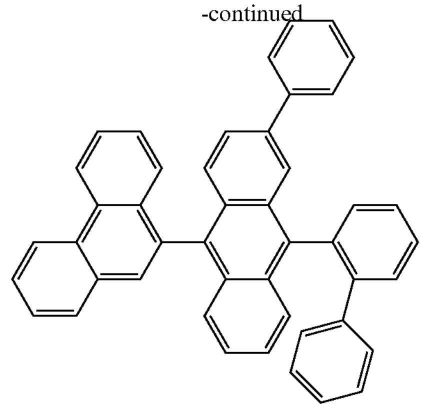
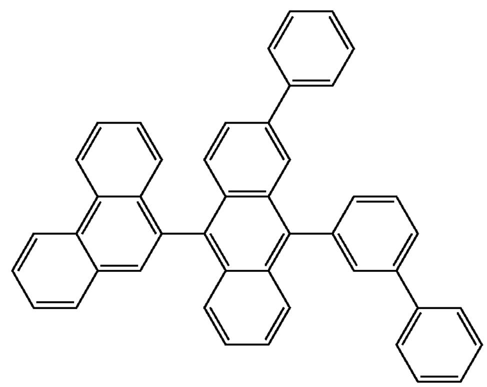
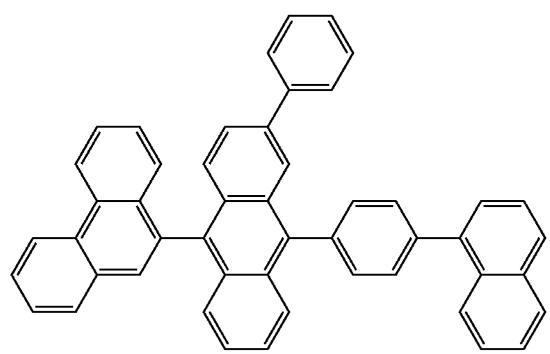
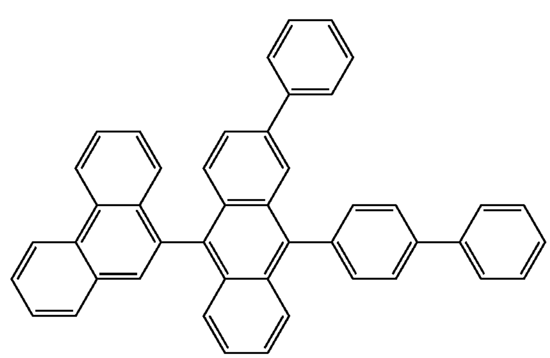

-continued
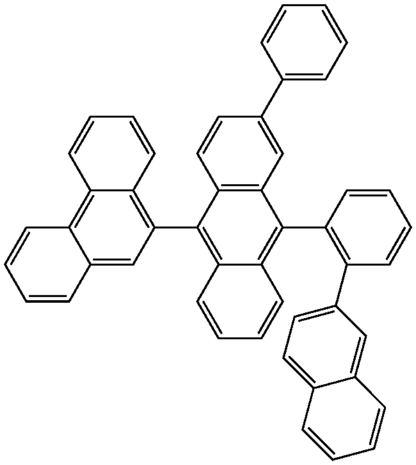
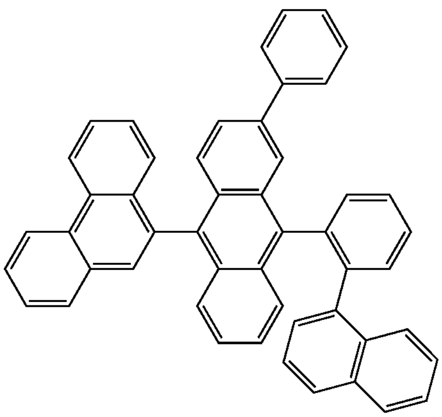
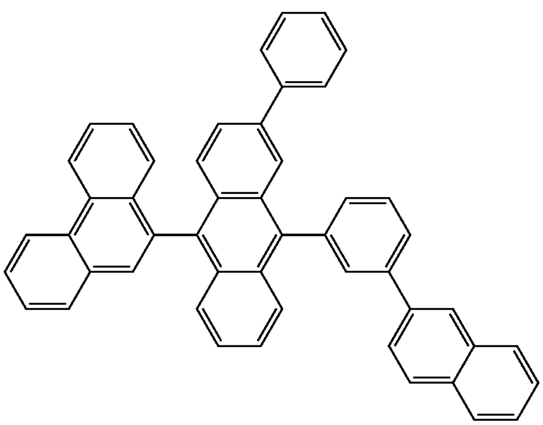
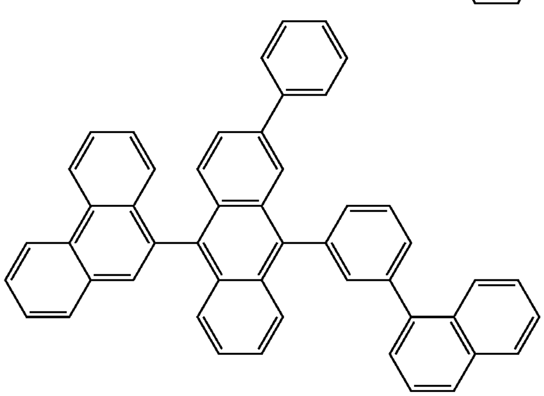
-continued
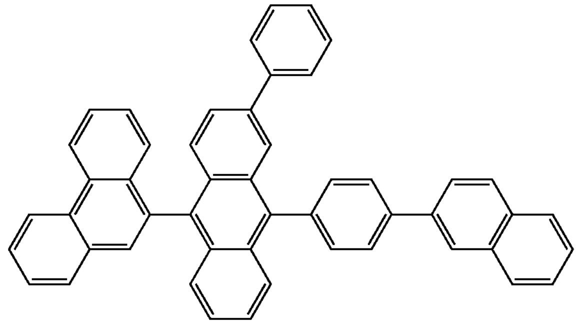
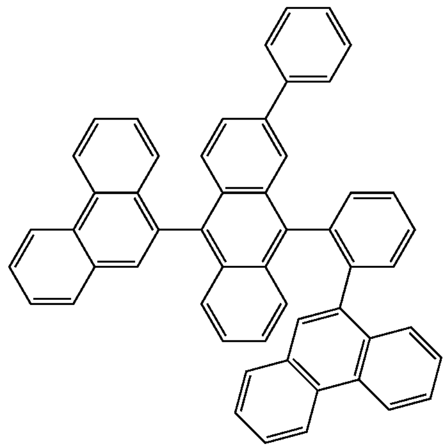
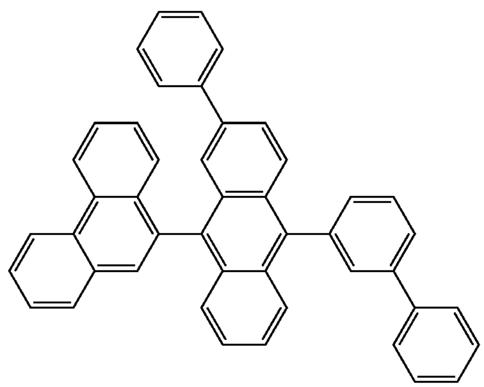
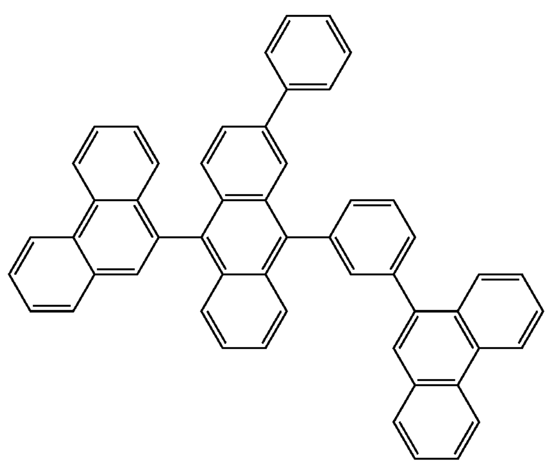

-continued
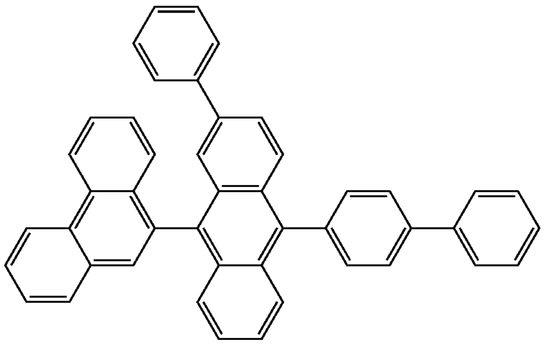
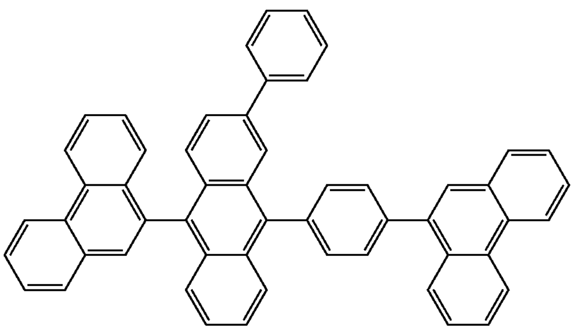
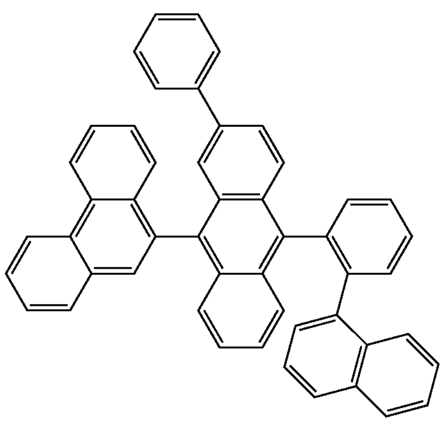
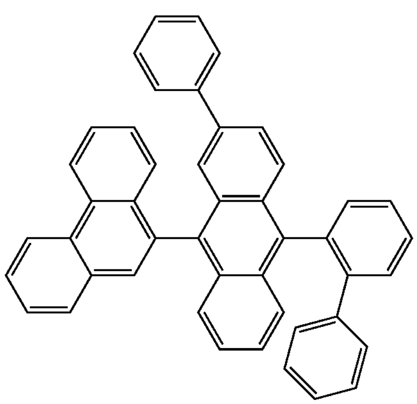
-continued
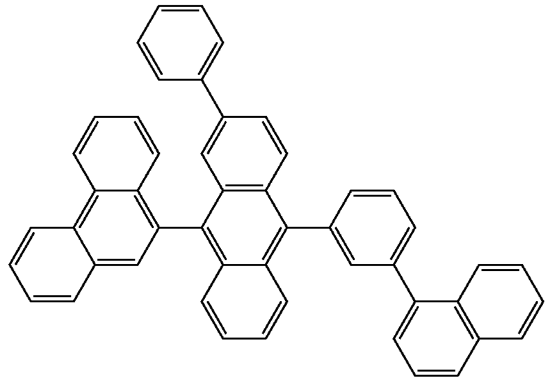
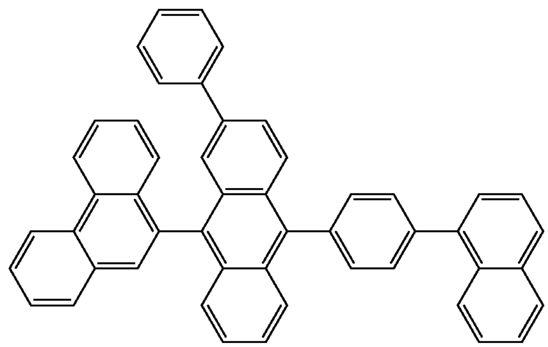
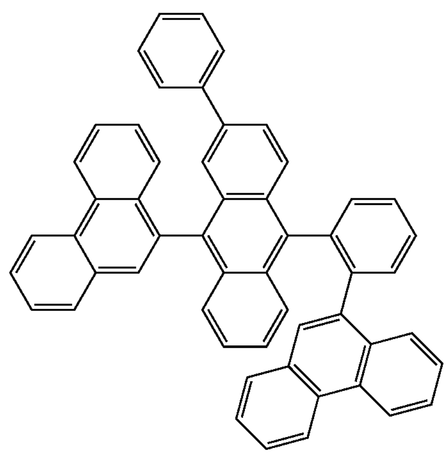
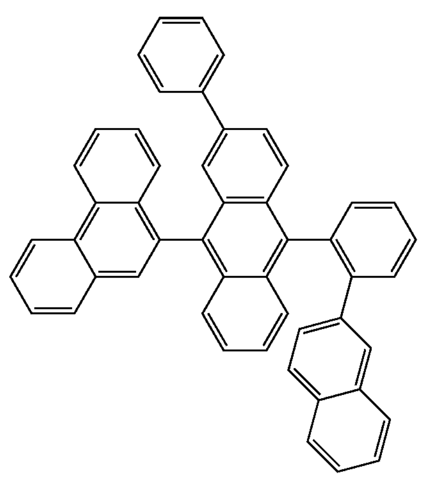

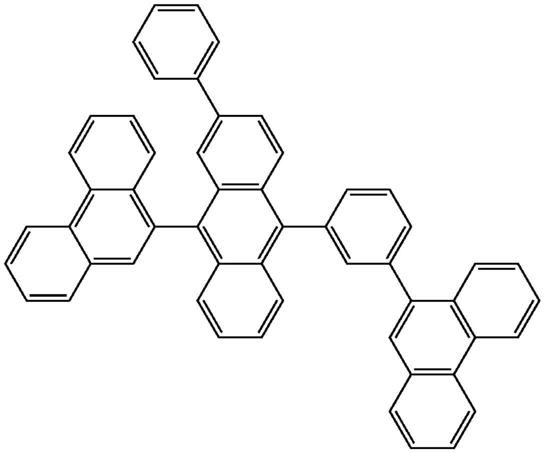
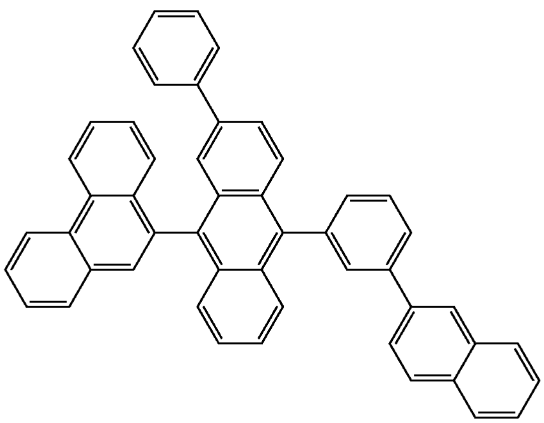
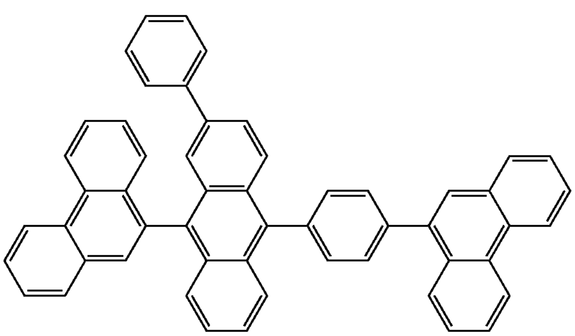
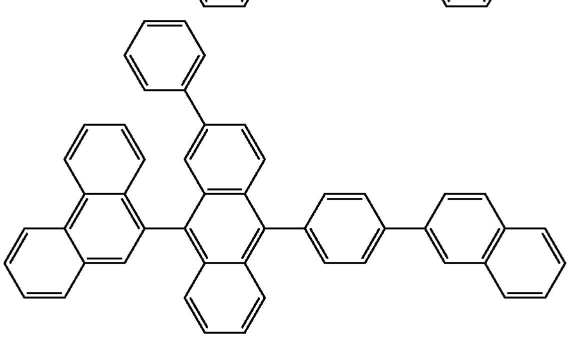
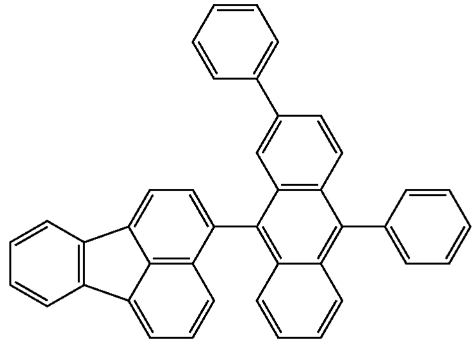
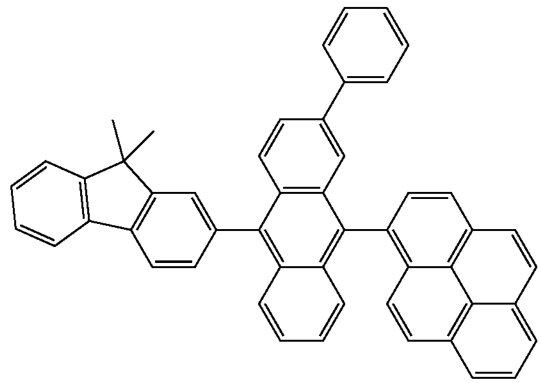
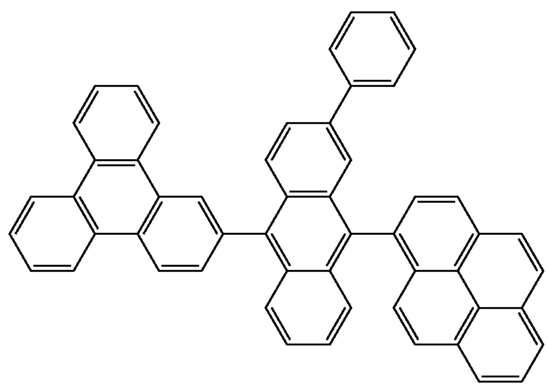
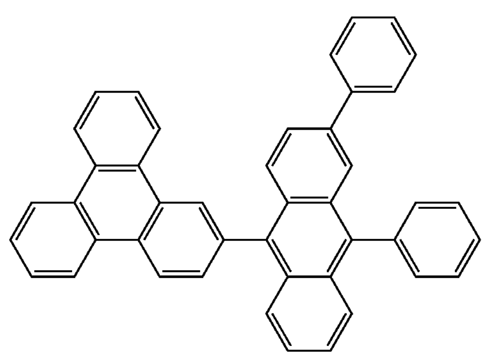

-continued
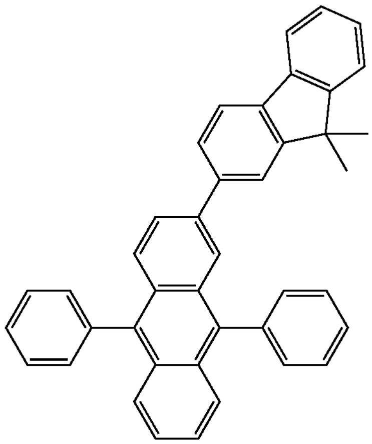
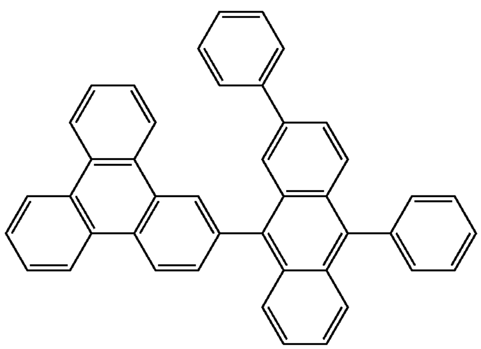
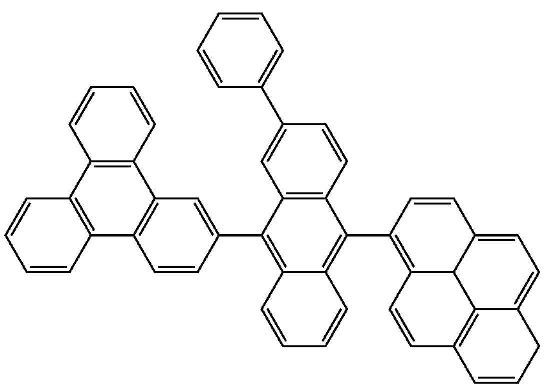
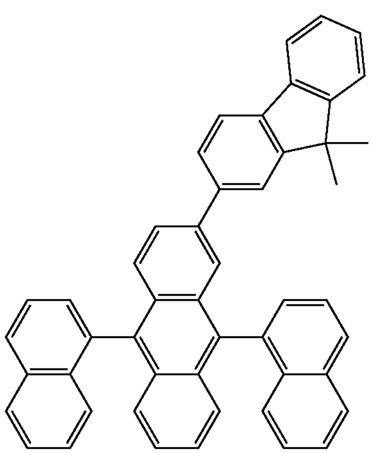
-continued
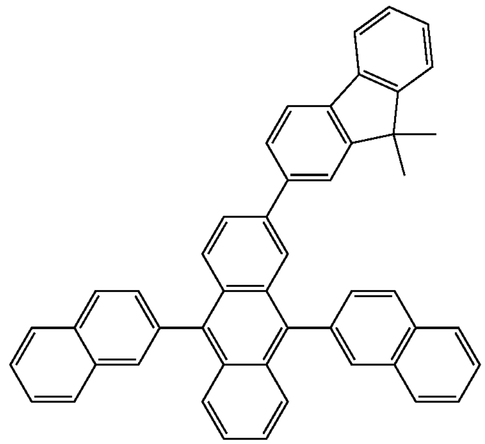
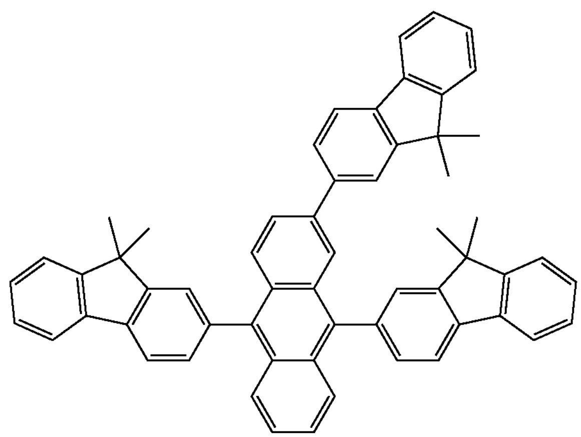
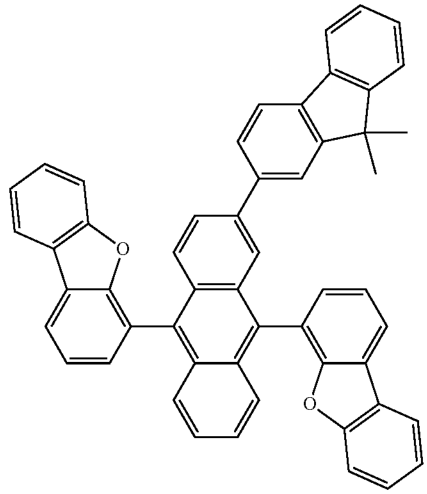

-continued
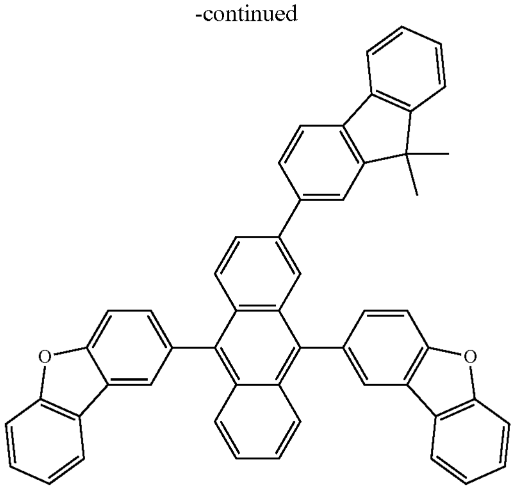
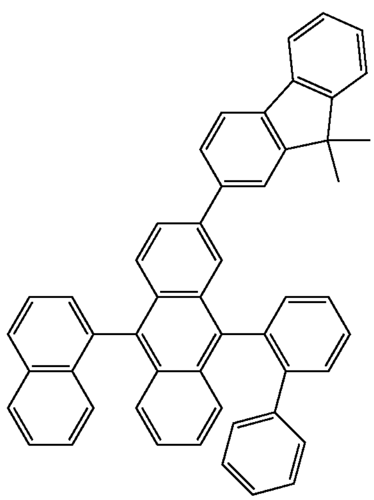
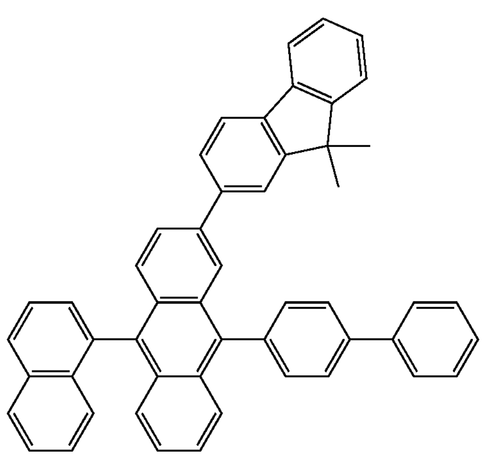
-continued
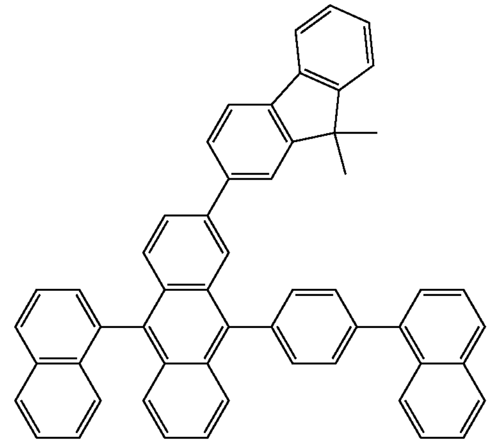
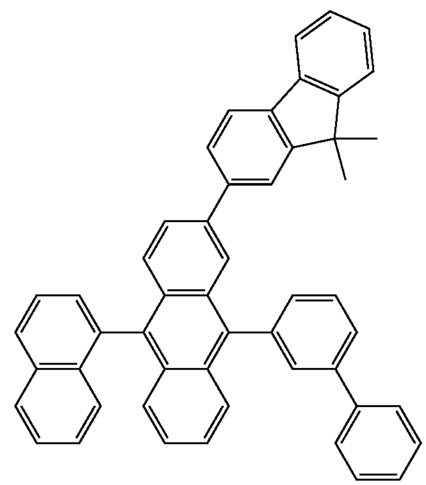
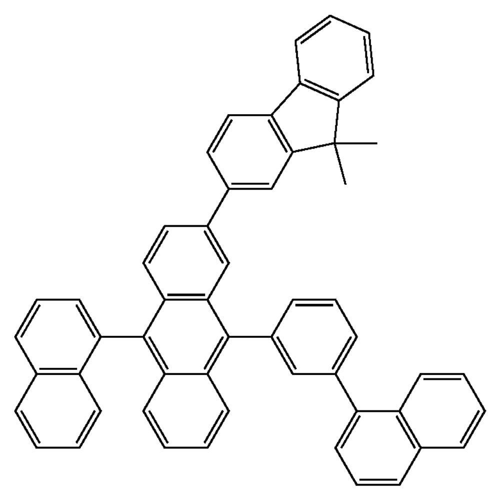

-continued
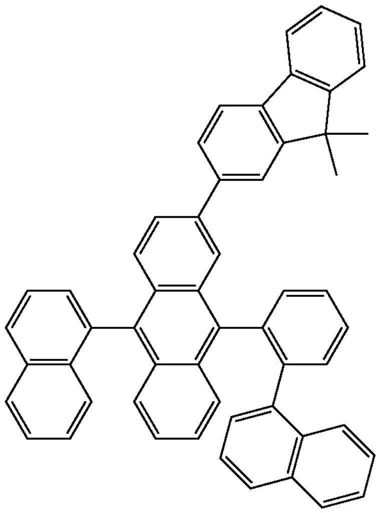
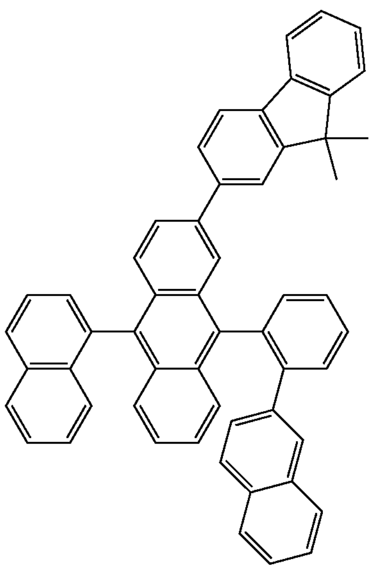
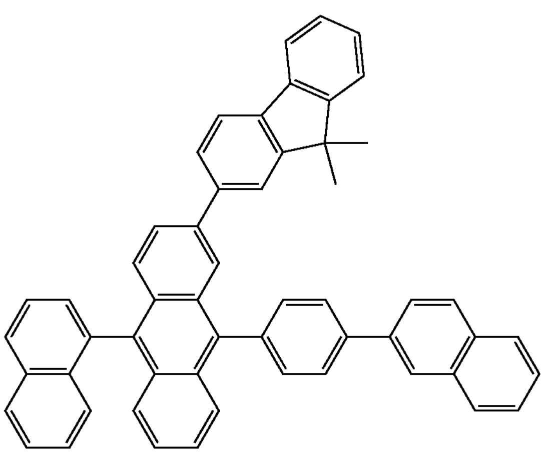
-continued
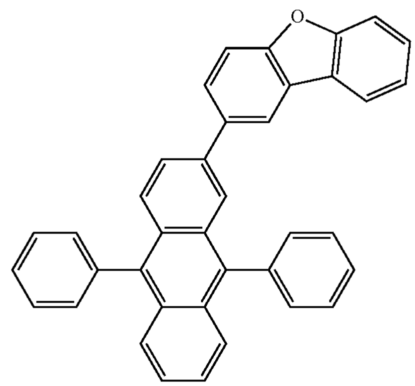
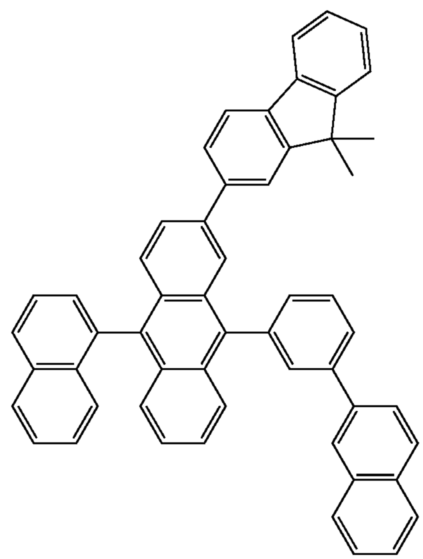
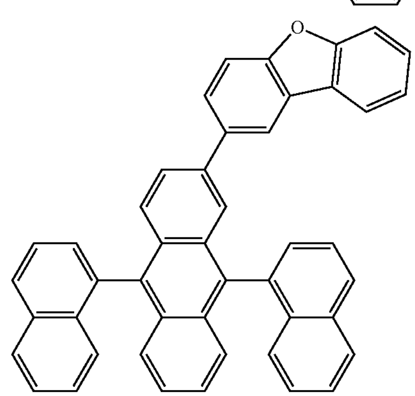
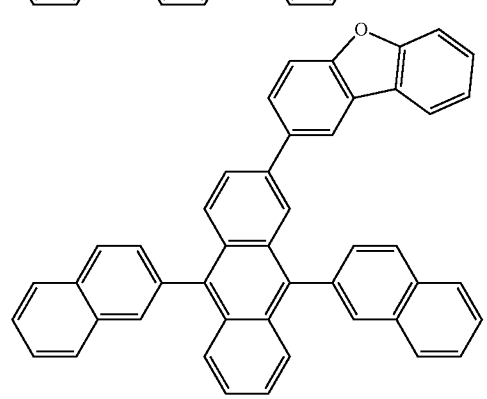

-continued
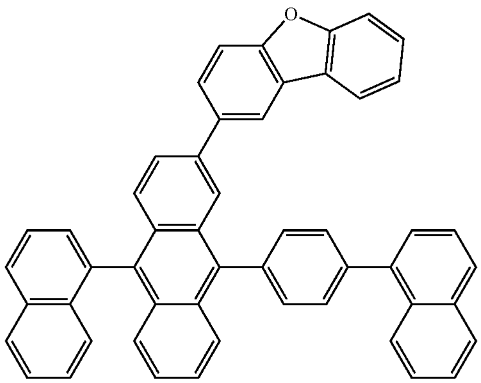
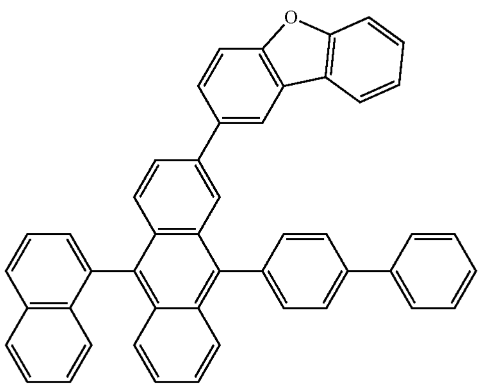
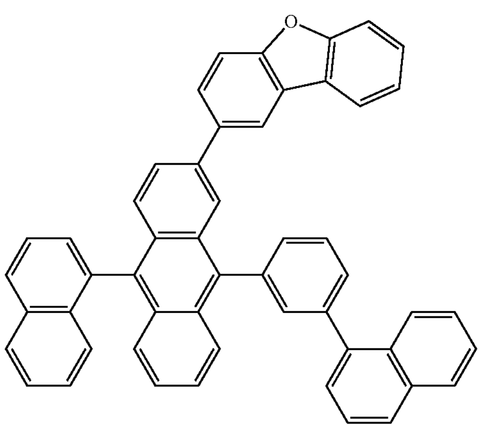
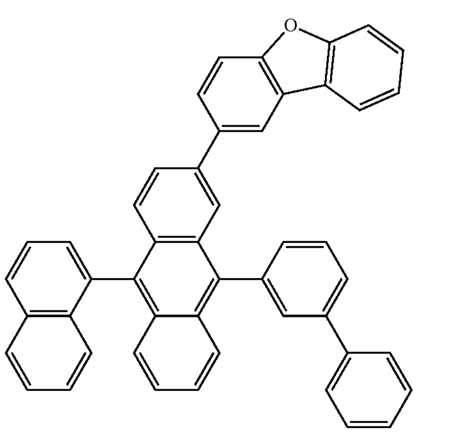
-continued
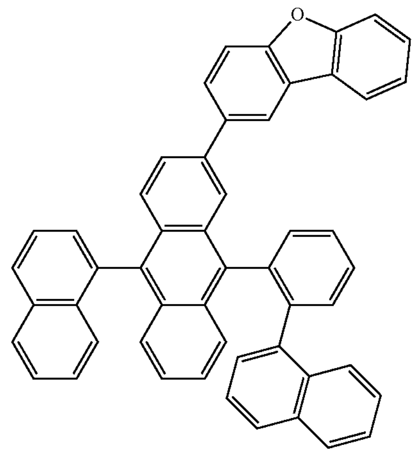
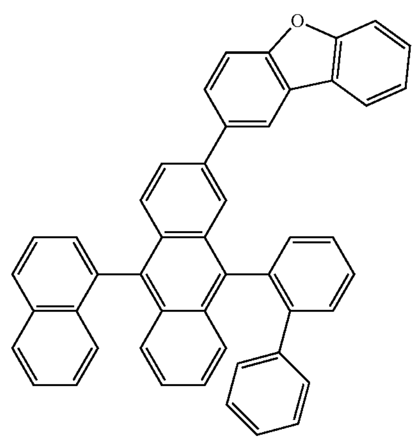
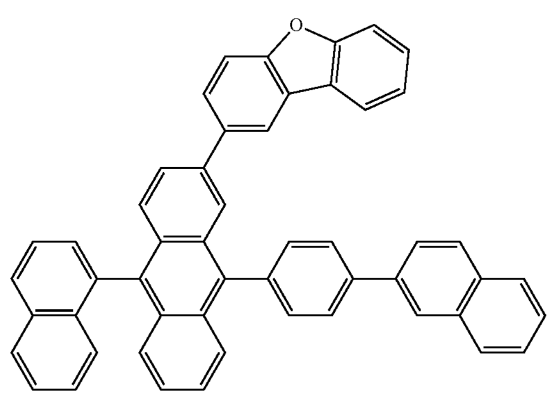

-continued
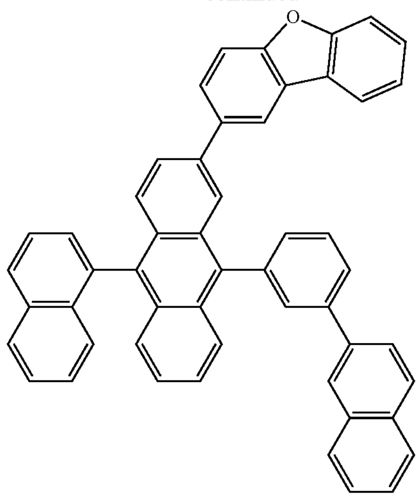
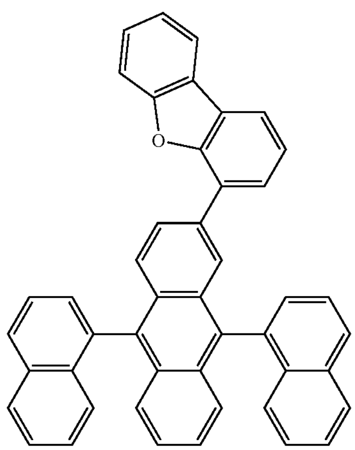
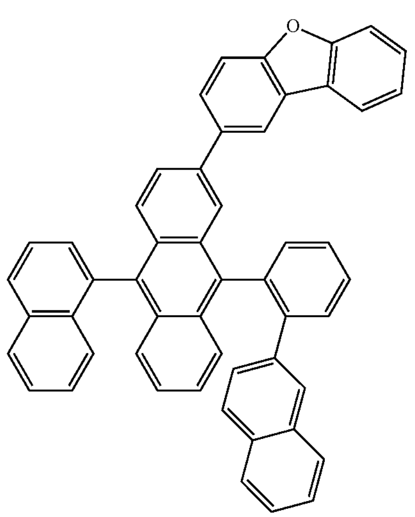
-continued
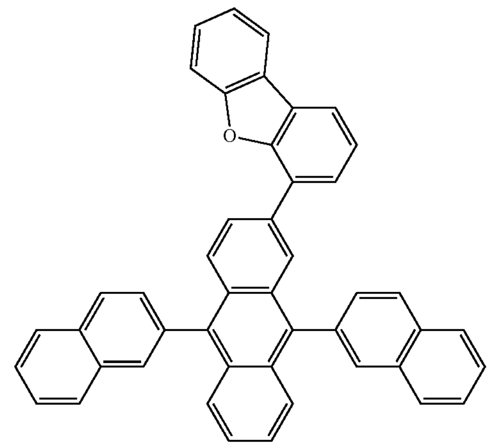
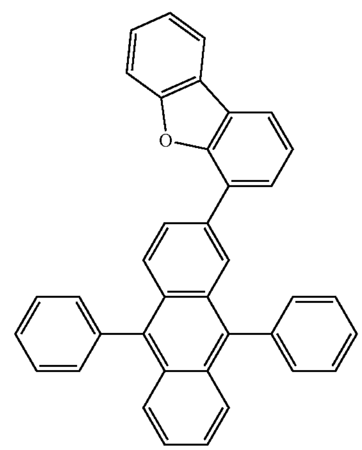
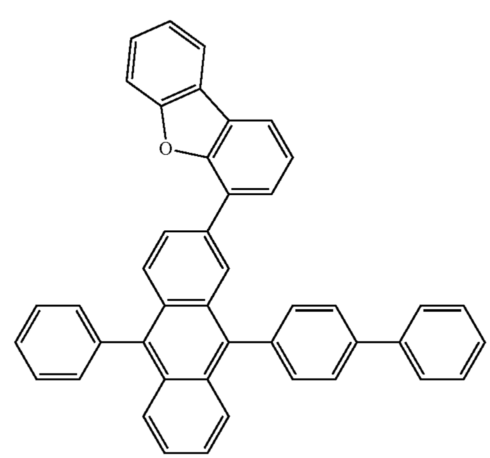

-continued
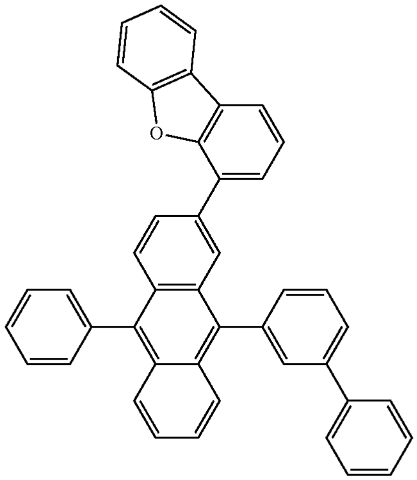
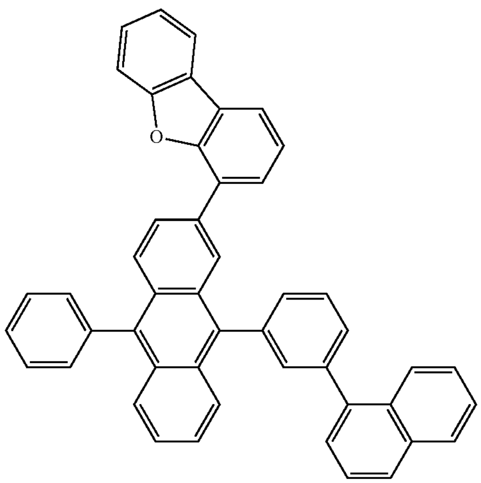
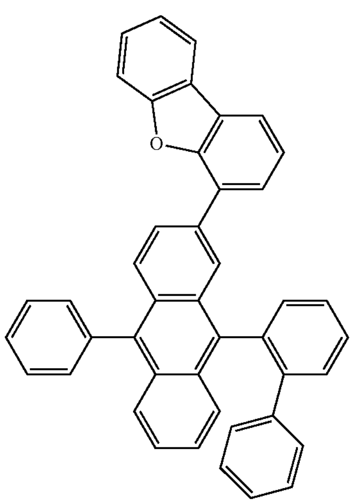
-continued
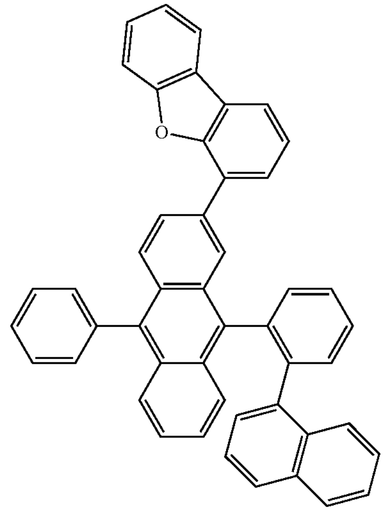
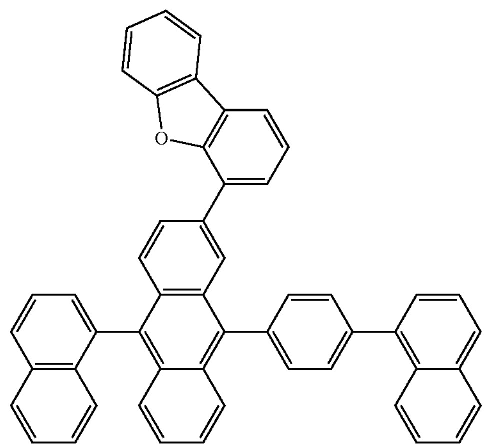
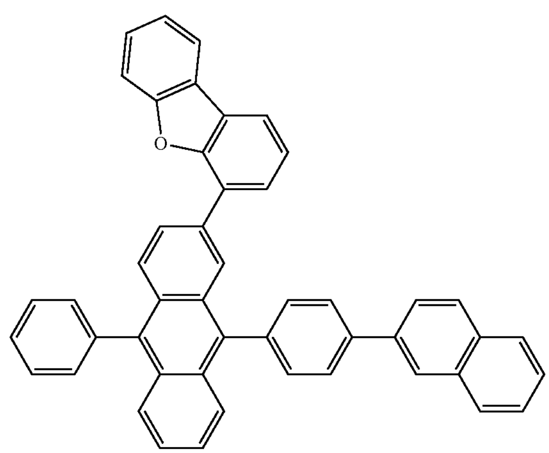

-continued
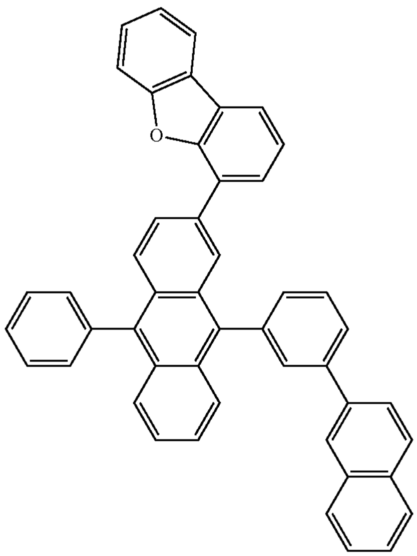
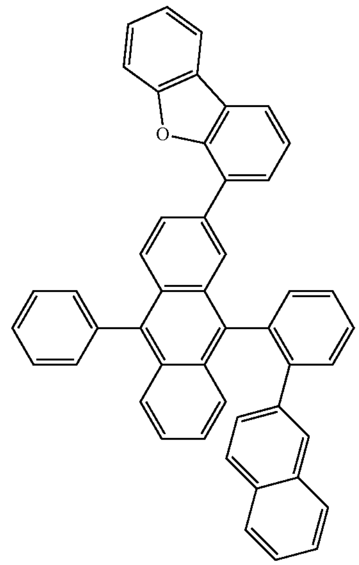
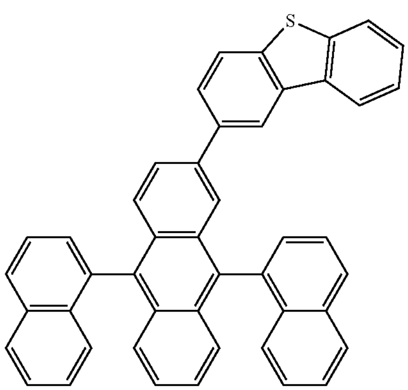
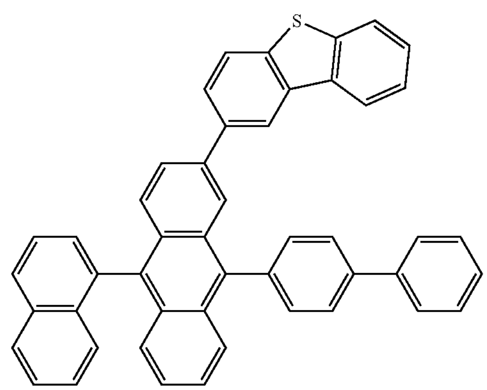
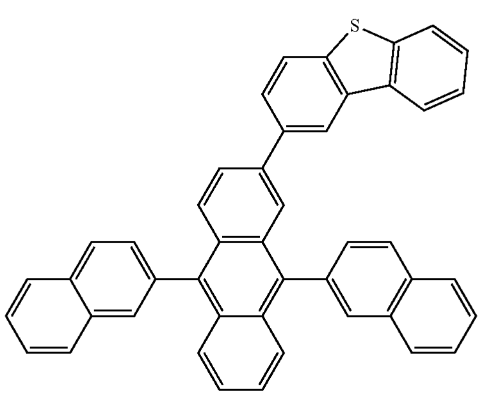
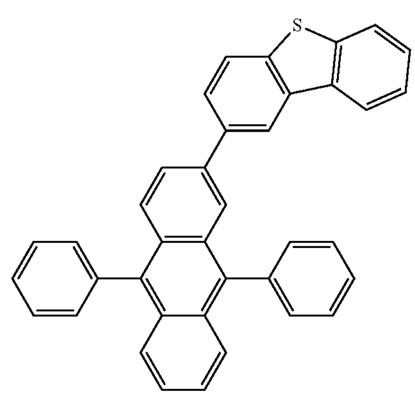

-continued
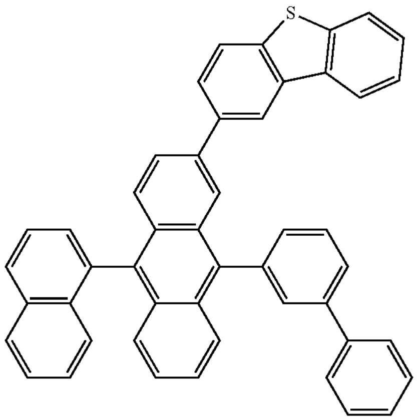
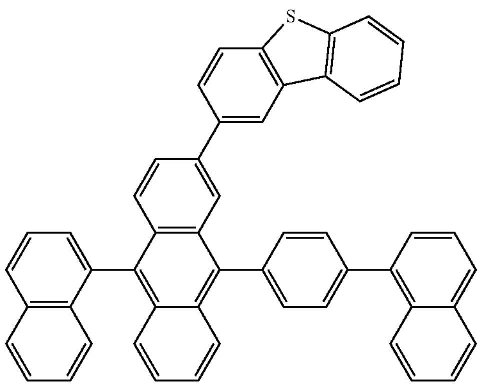
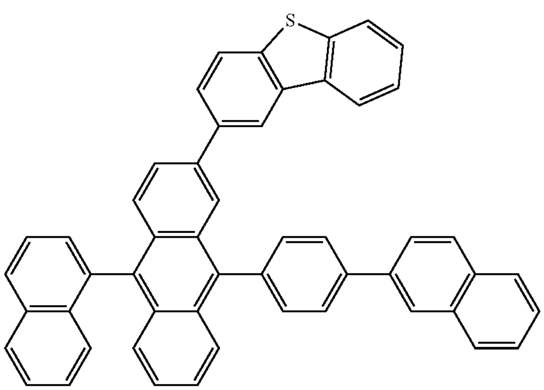
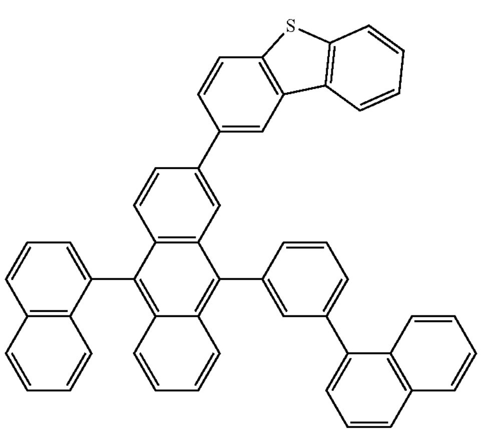
-continued
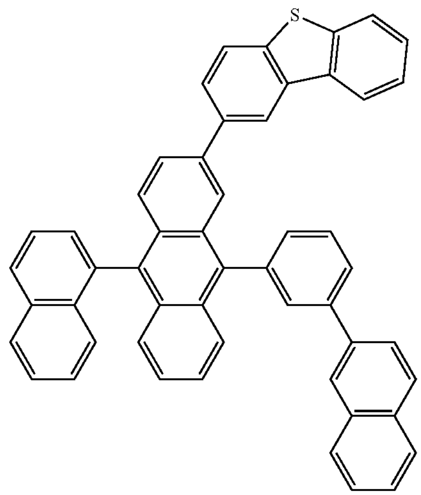
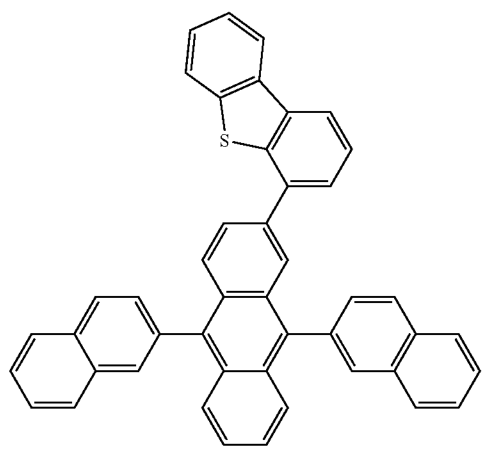
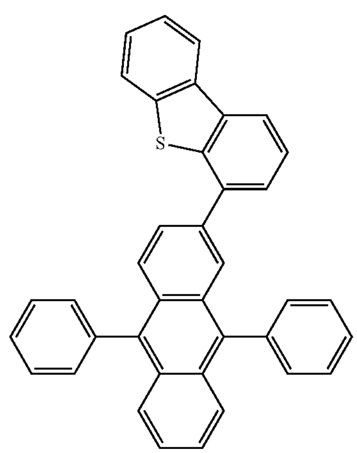

-continued
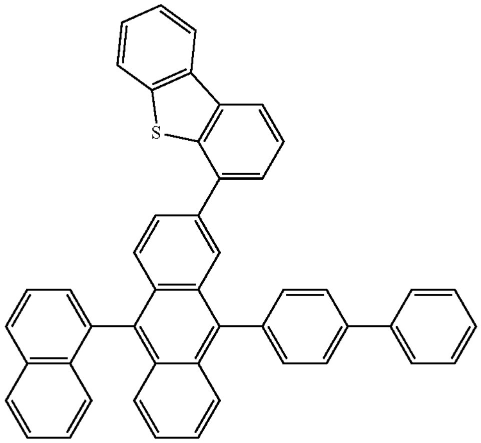
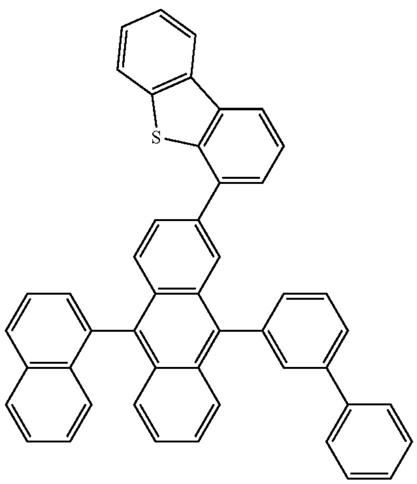
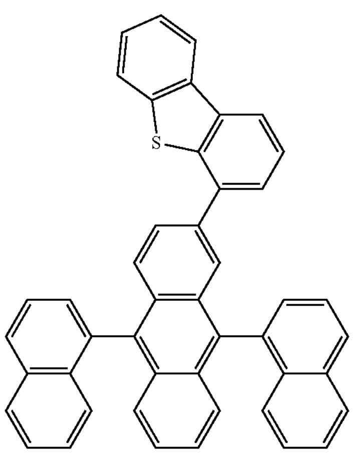
-continued
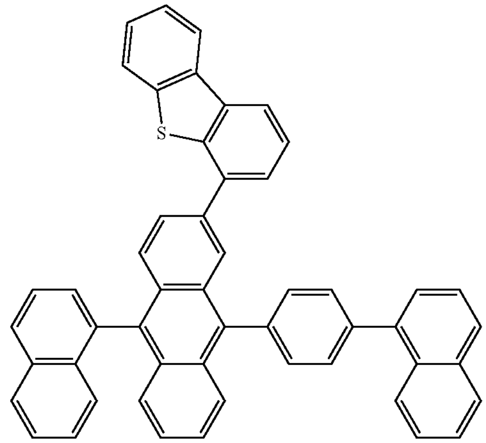
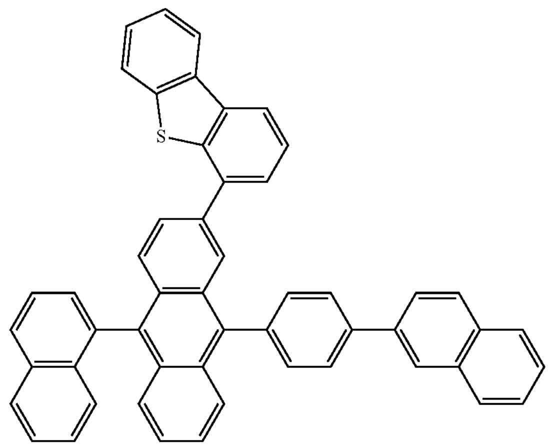
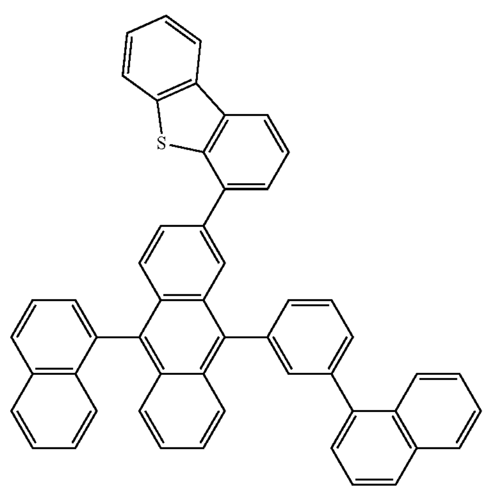

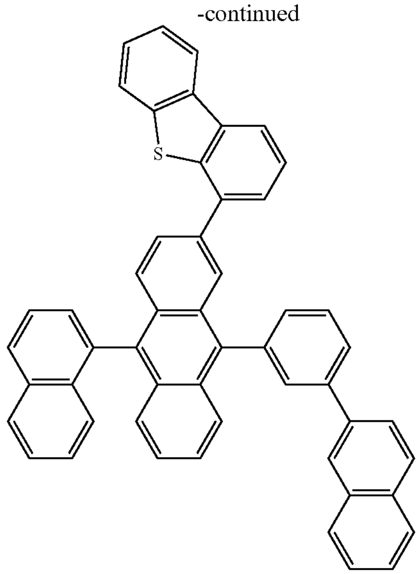
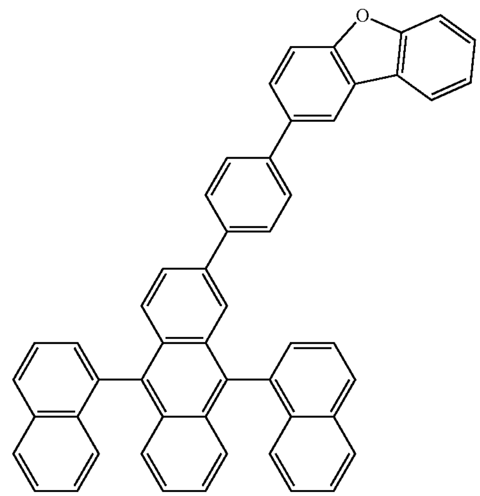
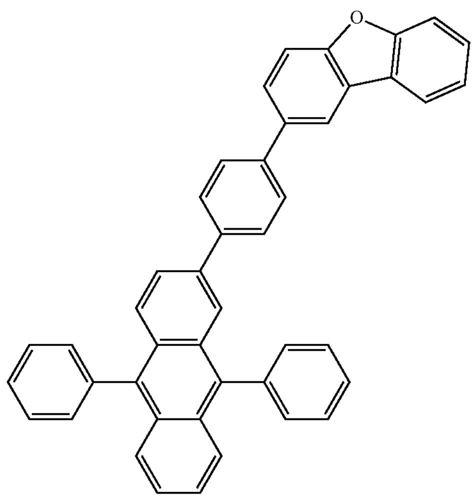
O
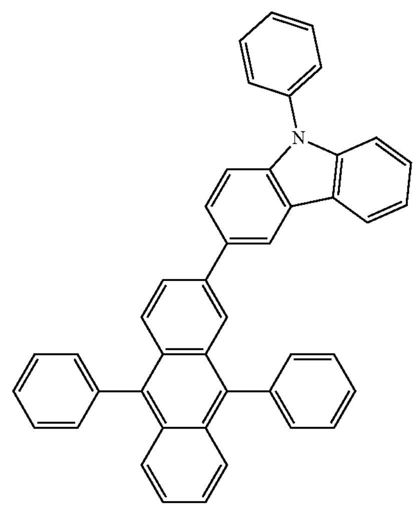
N
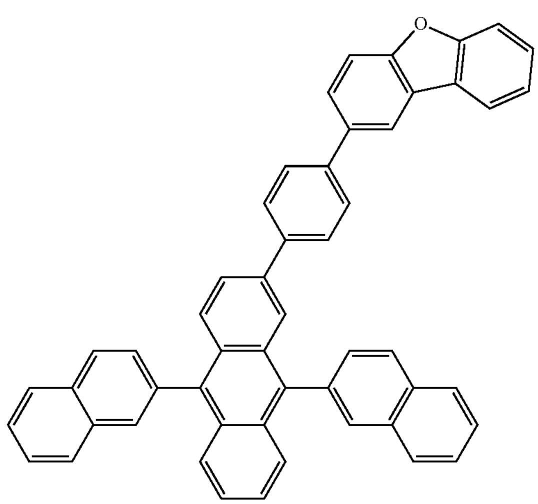
O
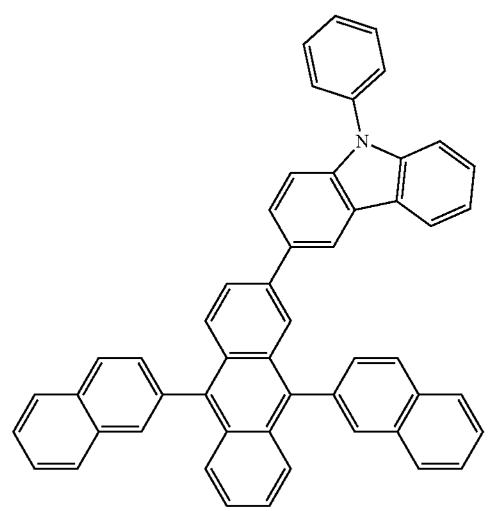
N

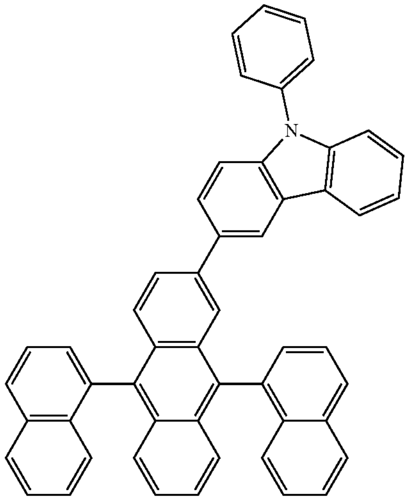
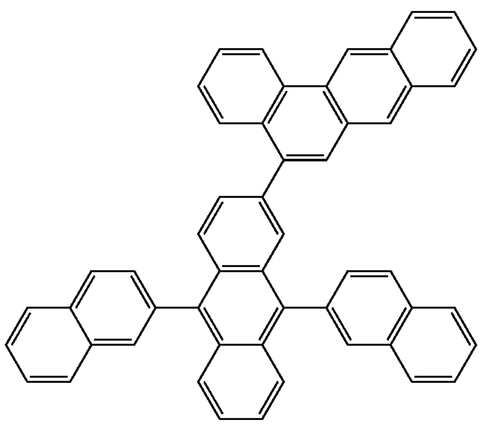
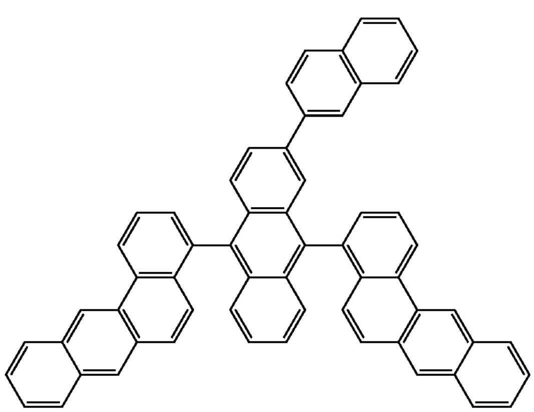
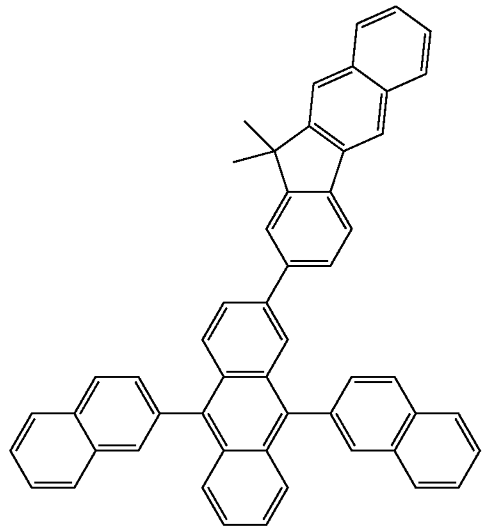
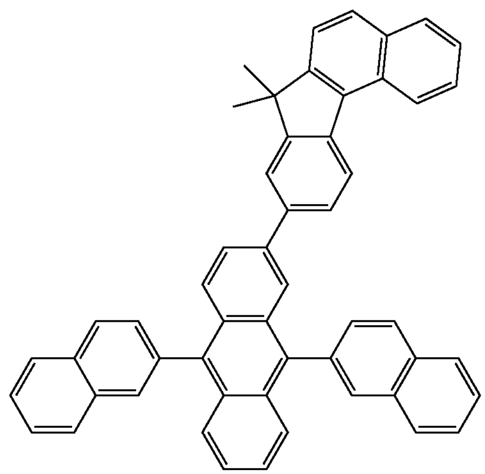
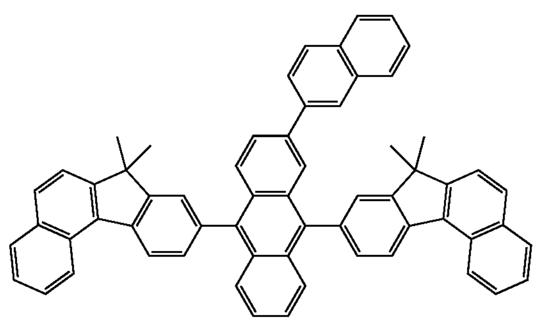

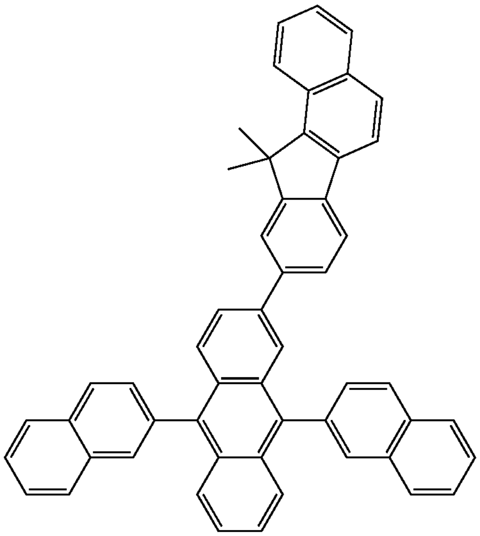
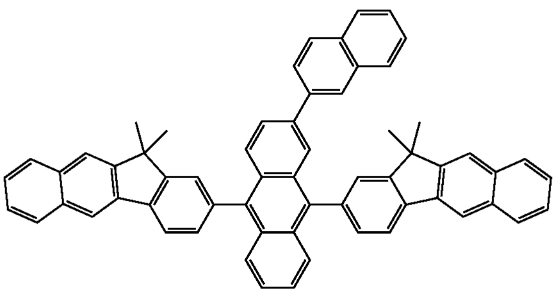
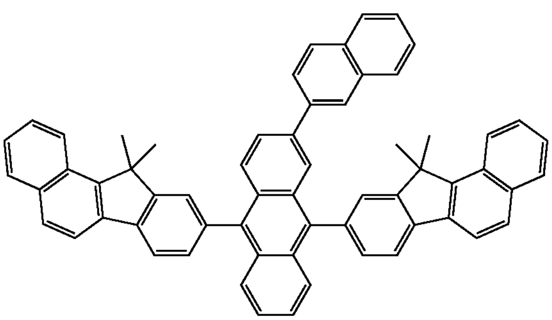
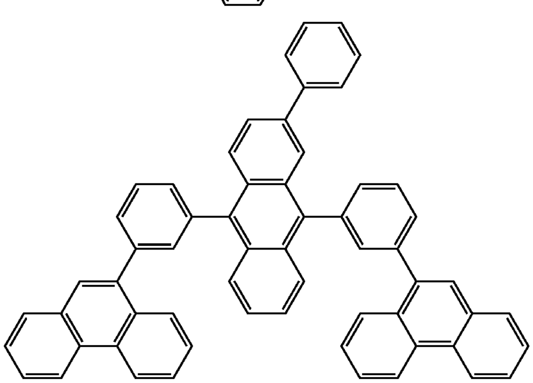
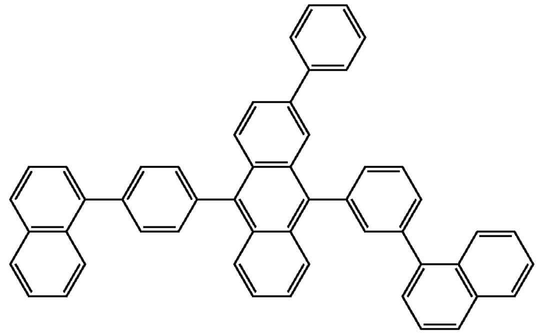
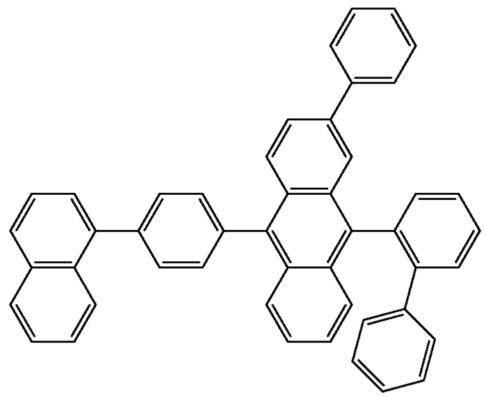
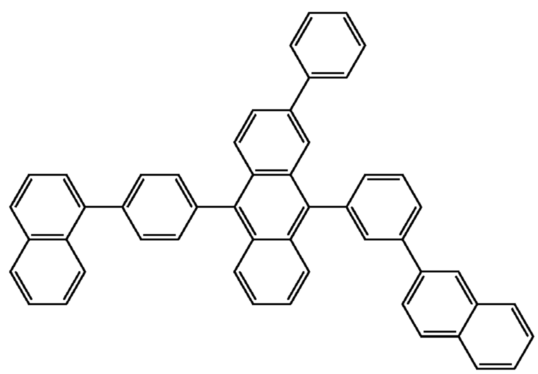
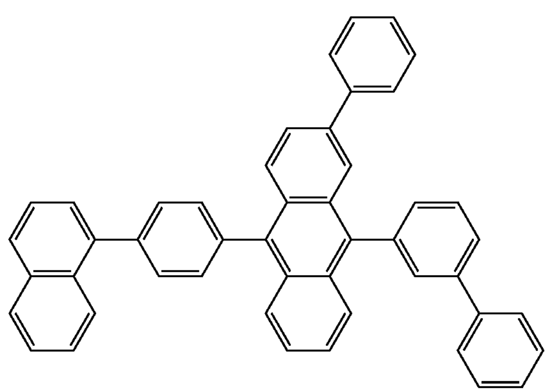

-continued
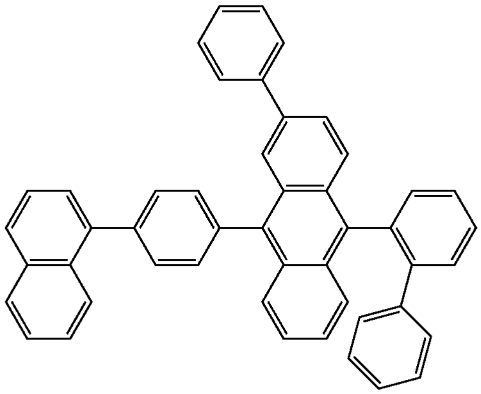
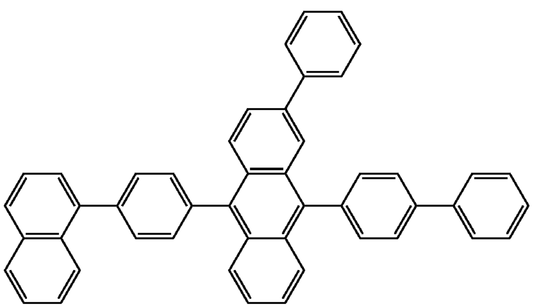
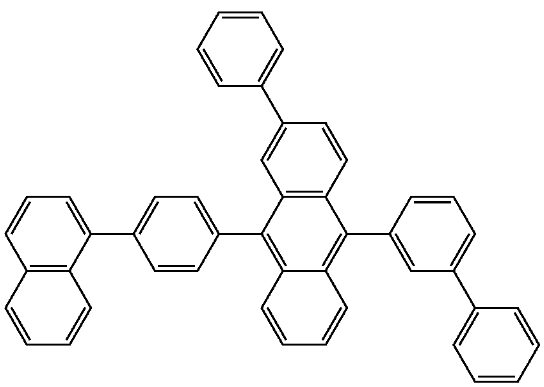
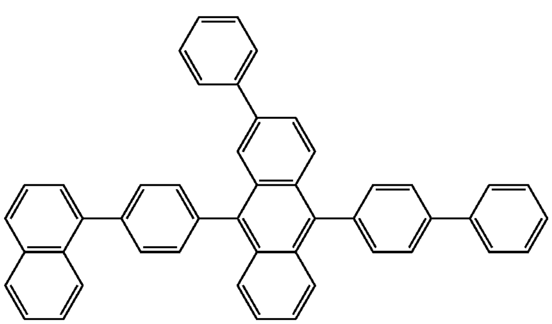
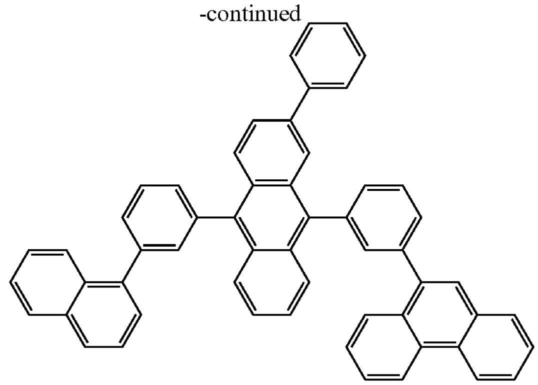
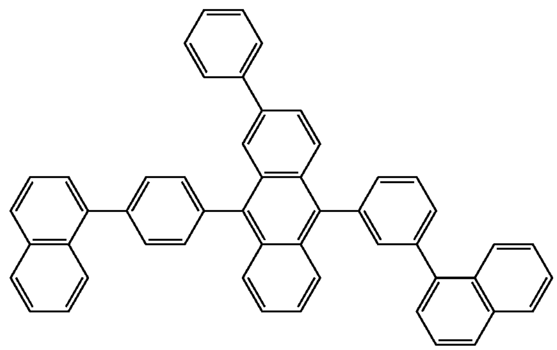
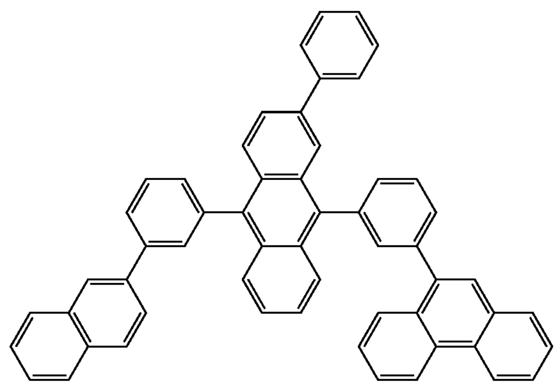
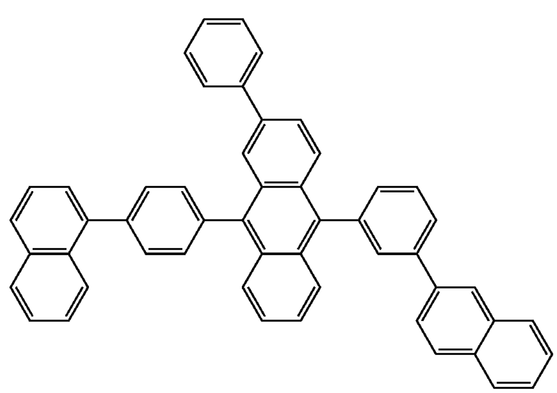
-continued -continued
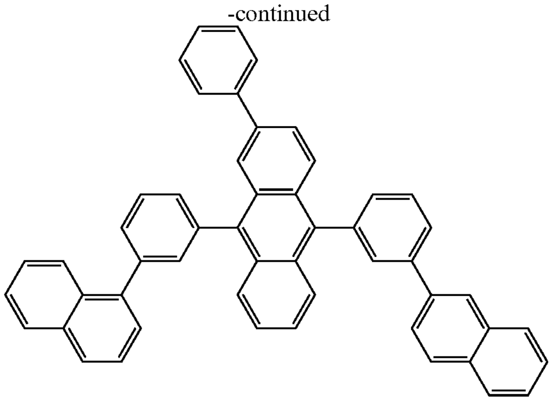
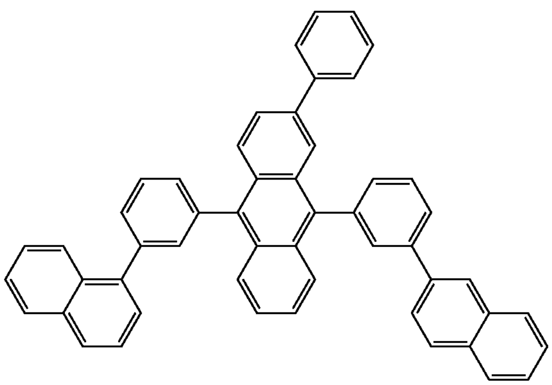
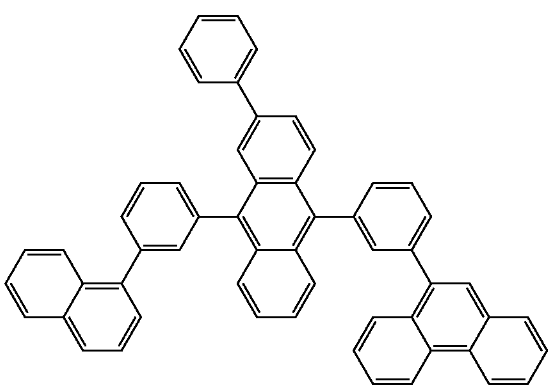
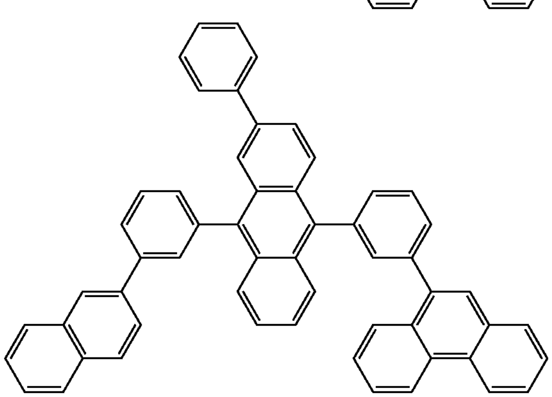
-continued
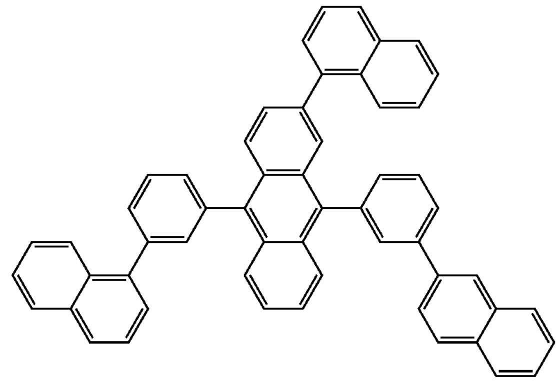
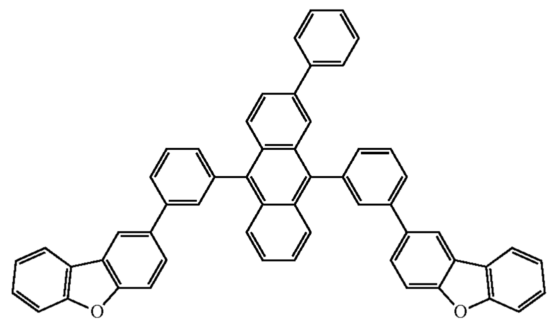
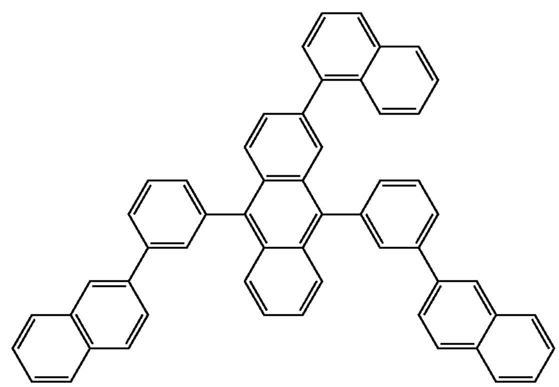
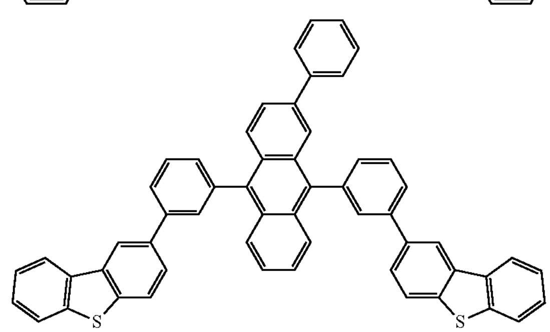
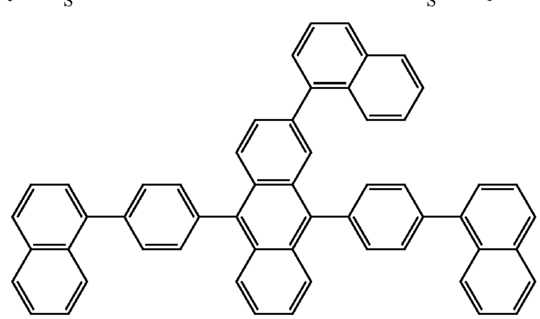

-continued
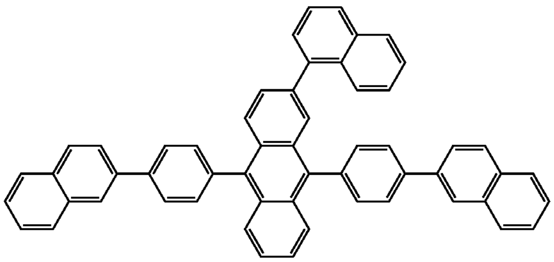
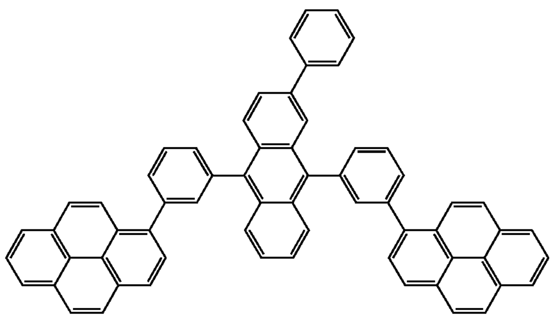
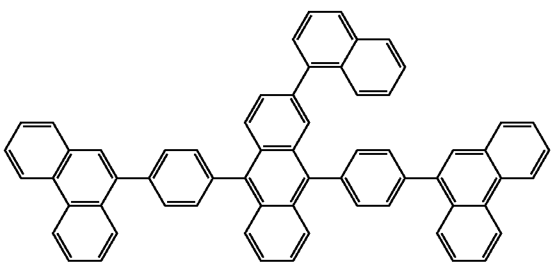
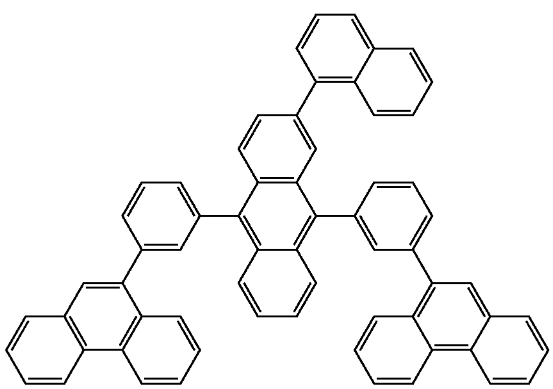
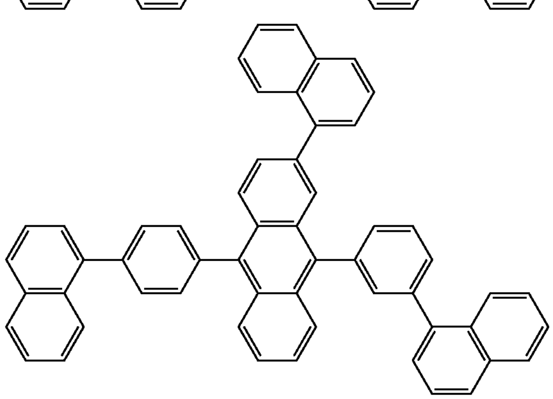
-continued
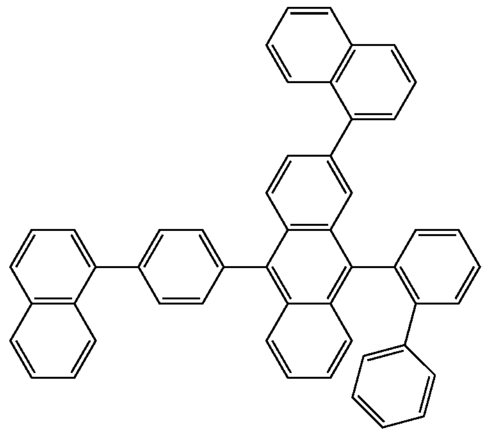
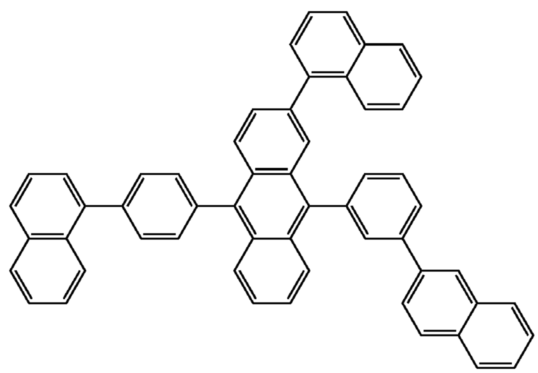
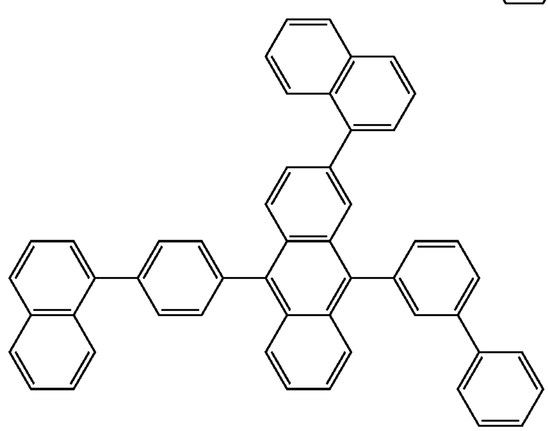
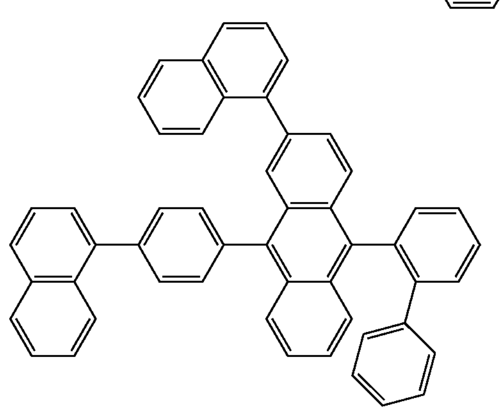

-continued
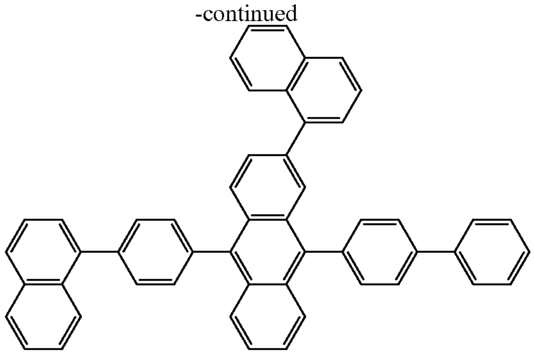
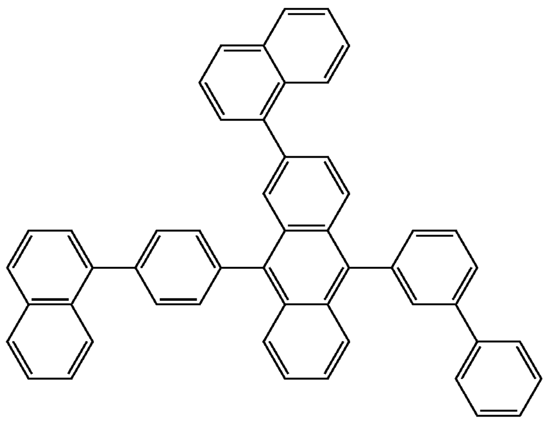
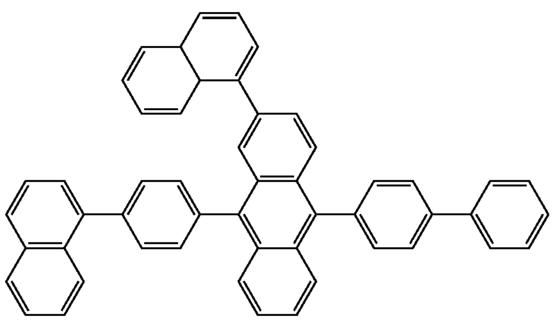
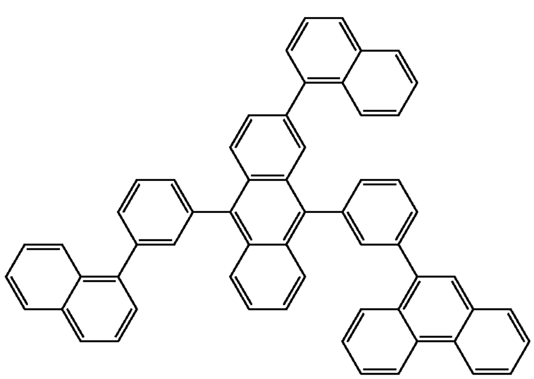
-continued
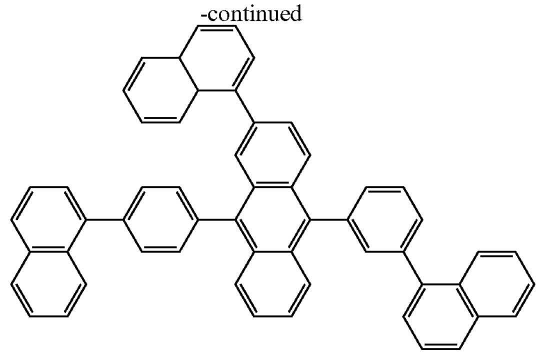
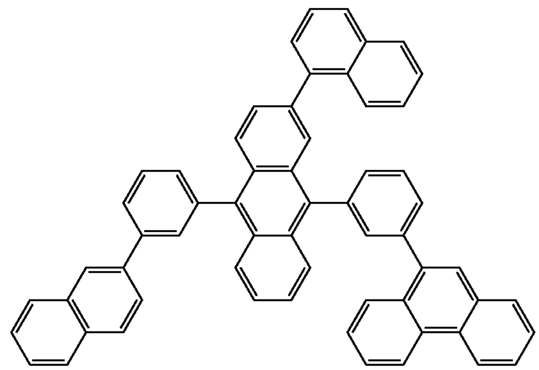
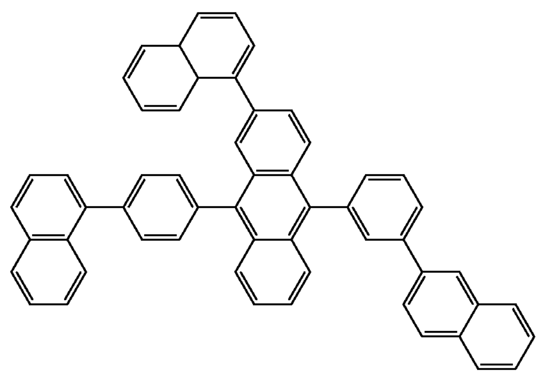
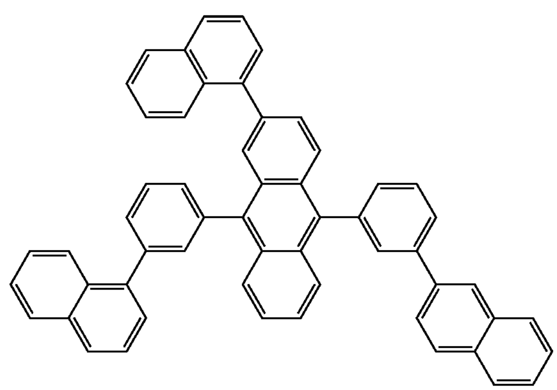

-continued
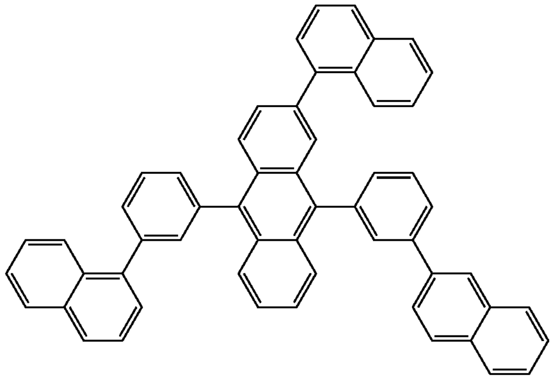
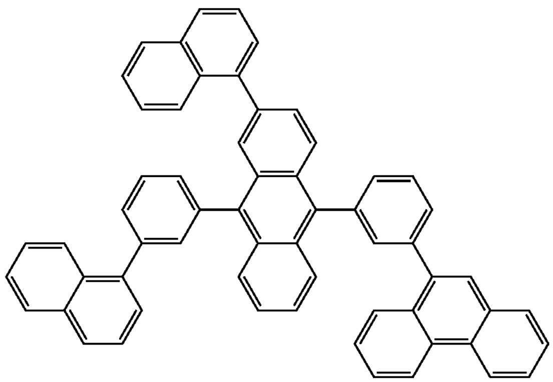
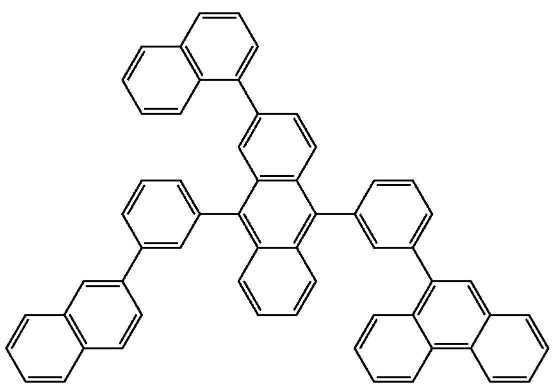
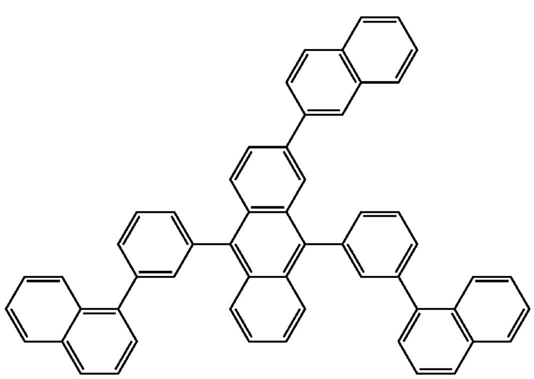
-continued
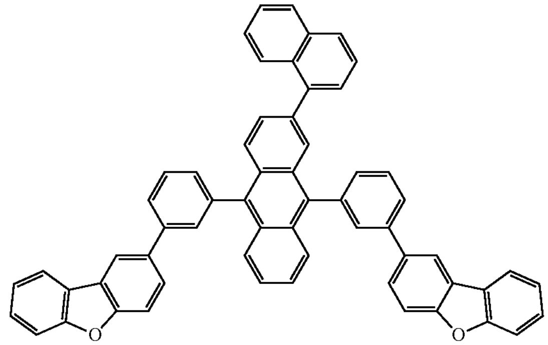
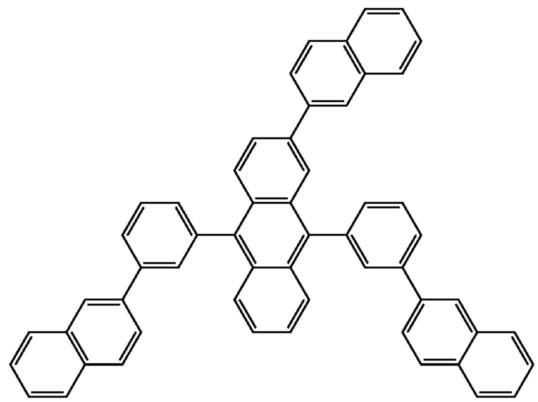
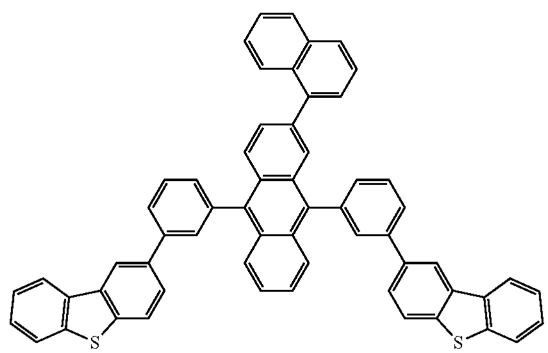
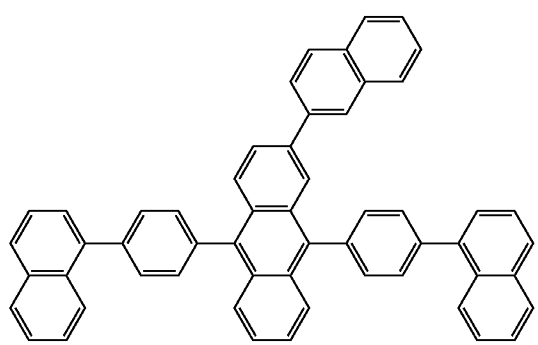

-continued
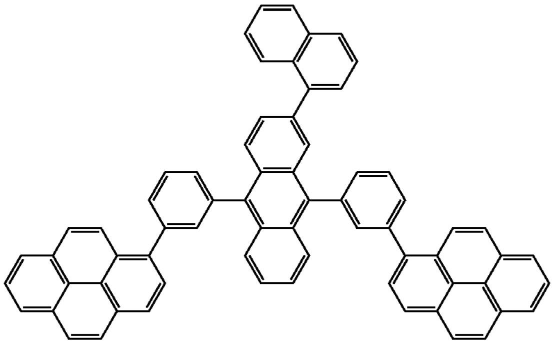
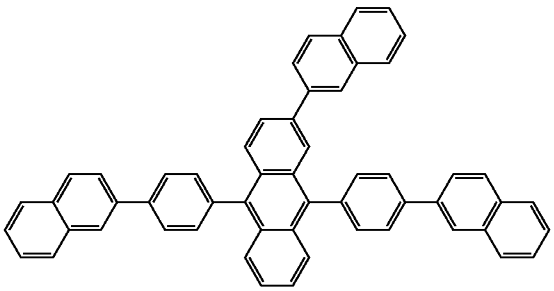
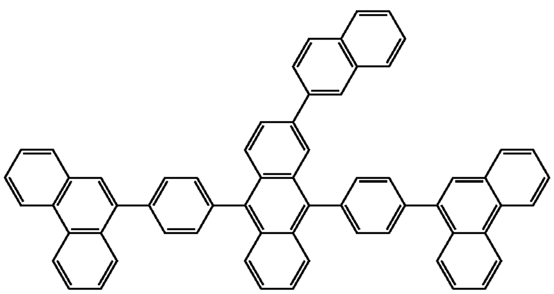
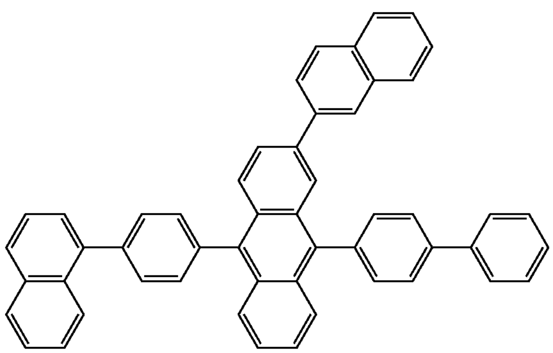
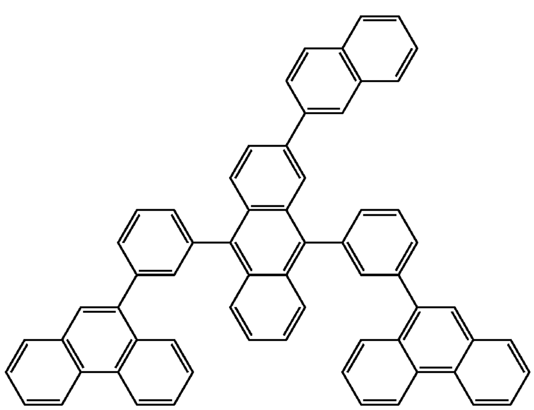
-continued
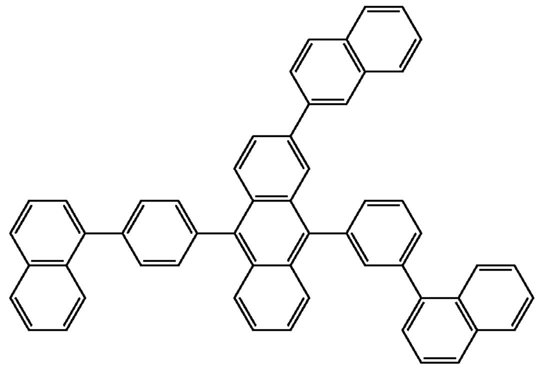
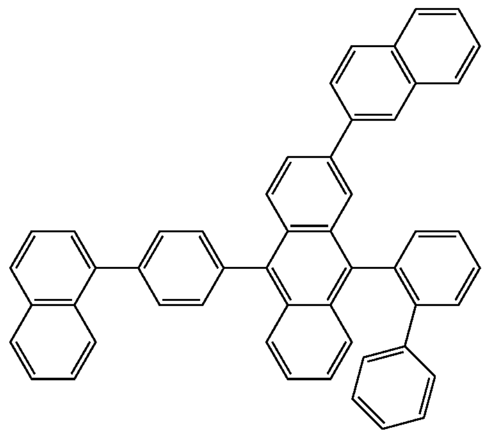
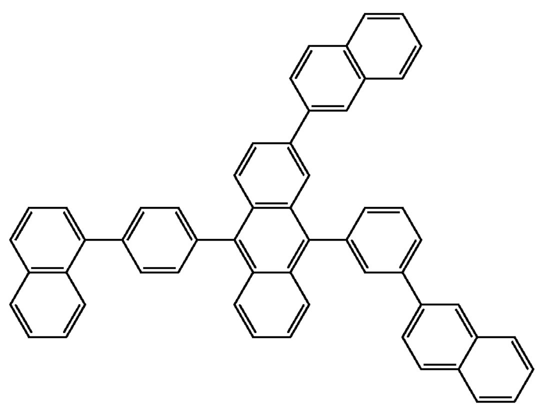
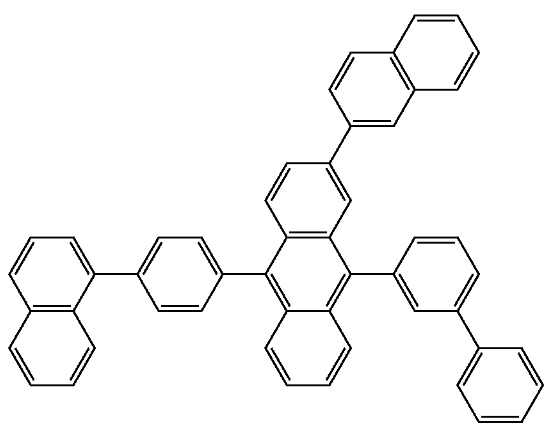

-continued
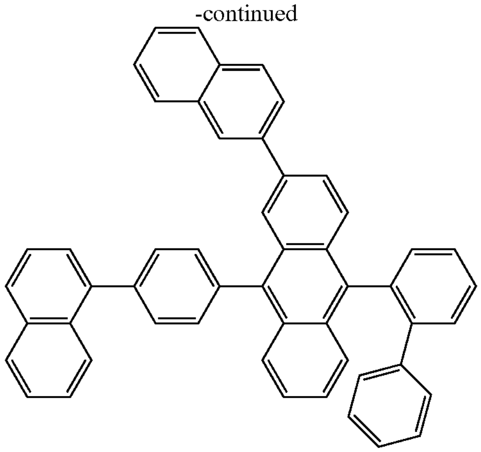
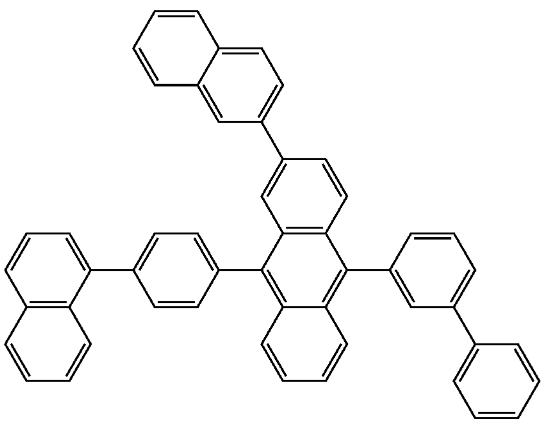
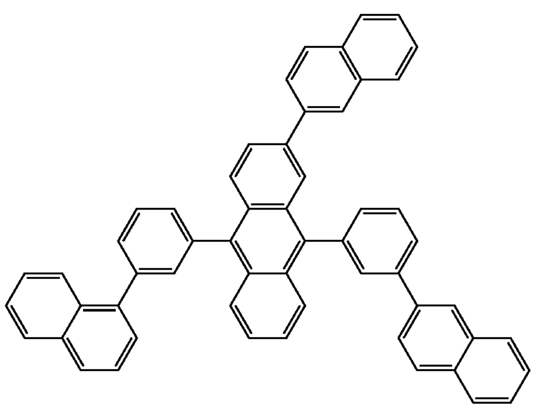
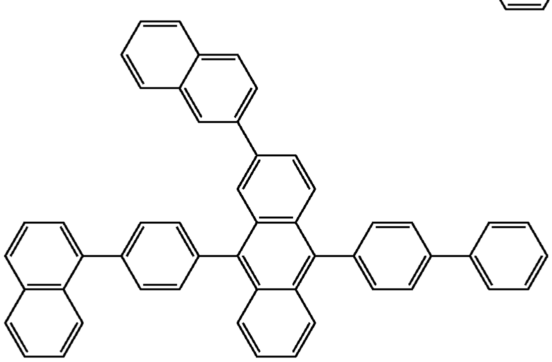
-continued
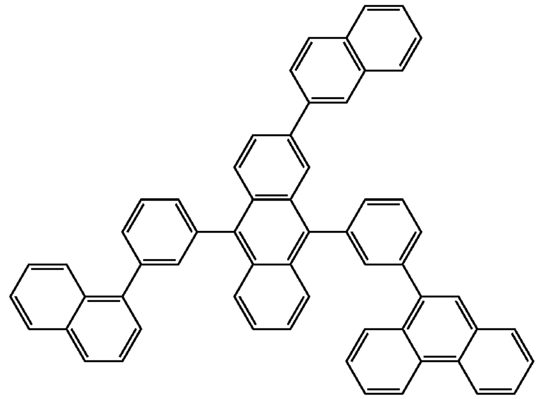
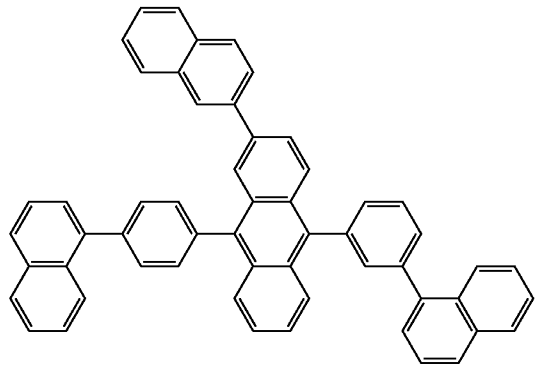
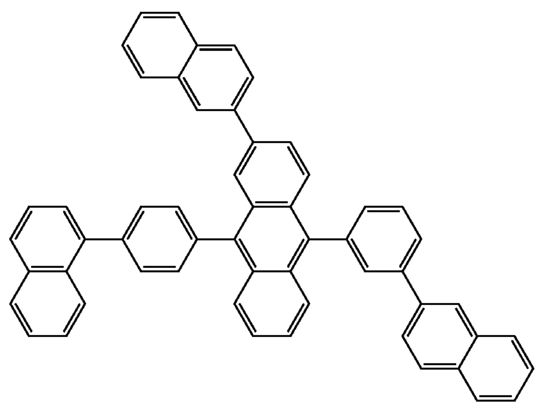
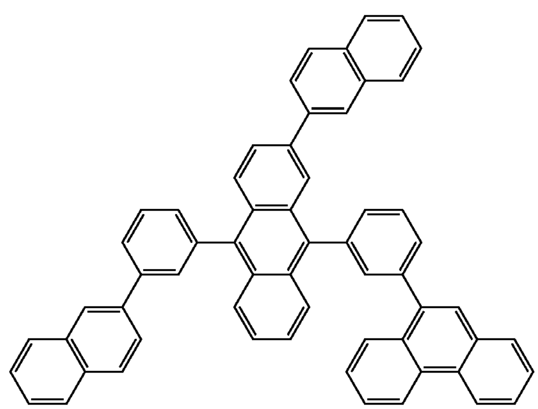

-continued
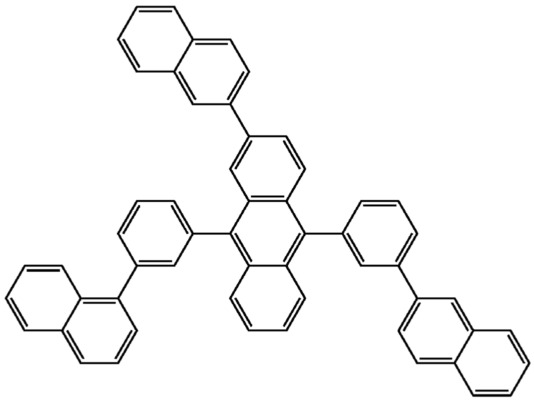
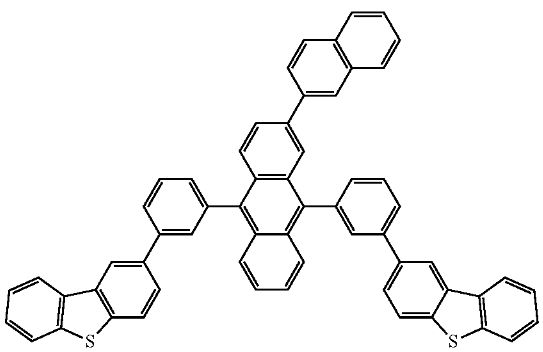
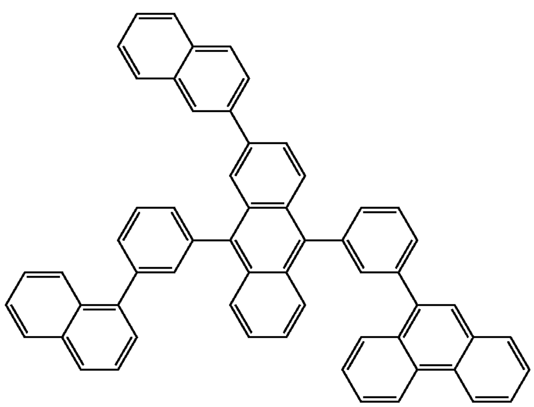
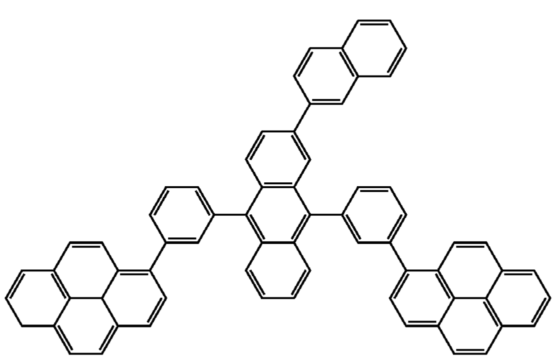
-continued
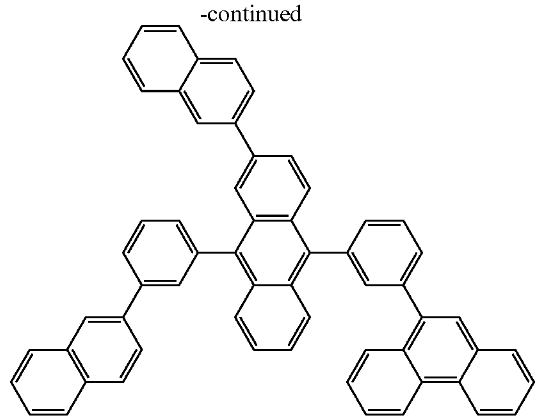
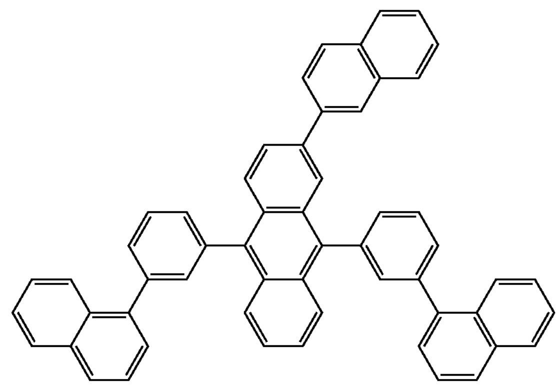
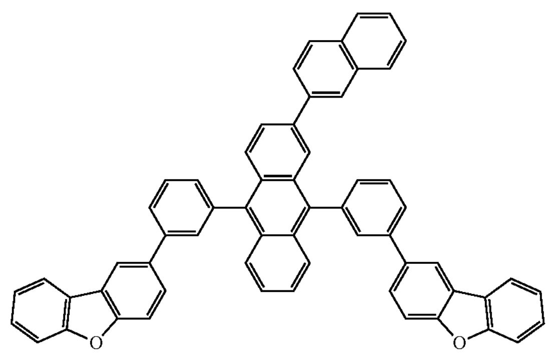
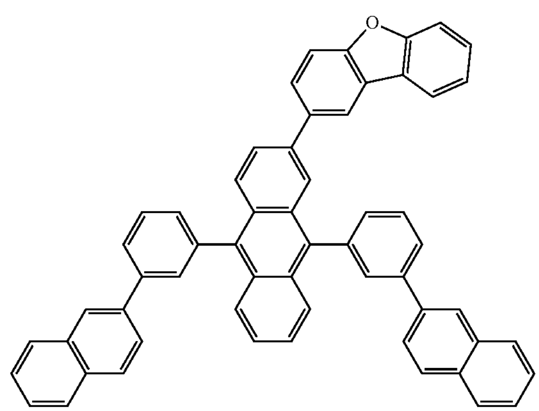

-continued
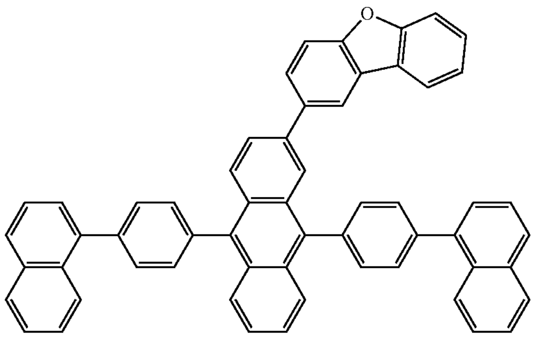
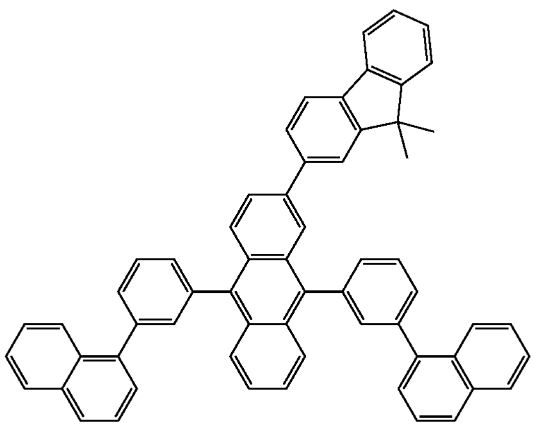
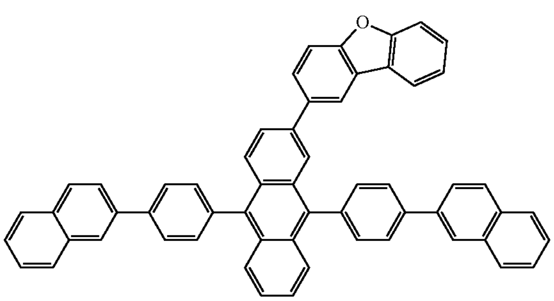
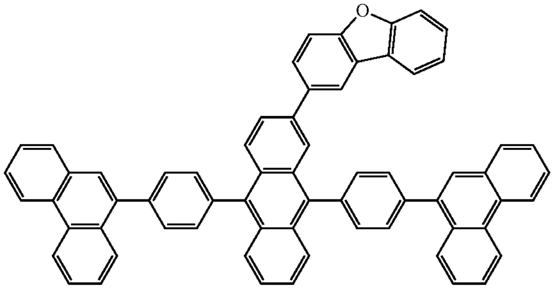
-continued
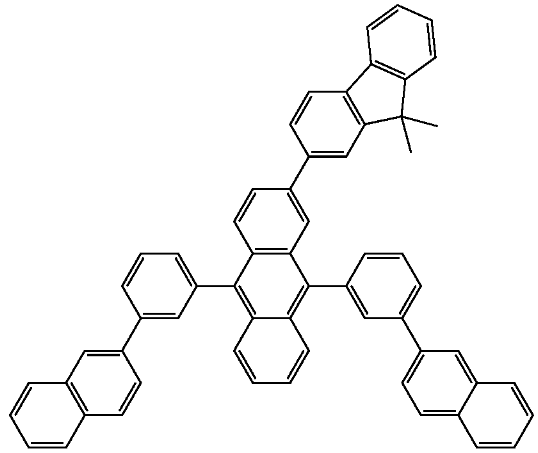
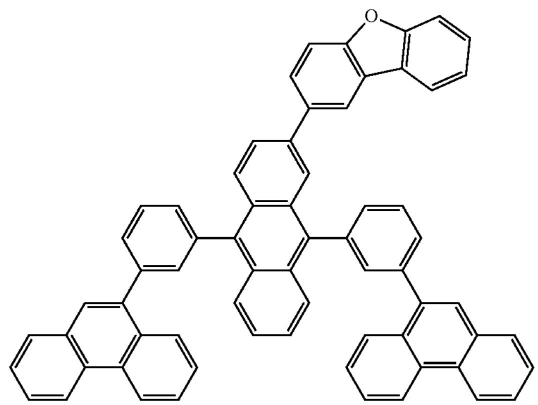
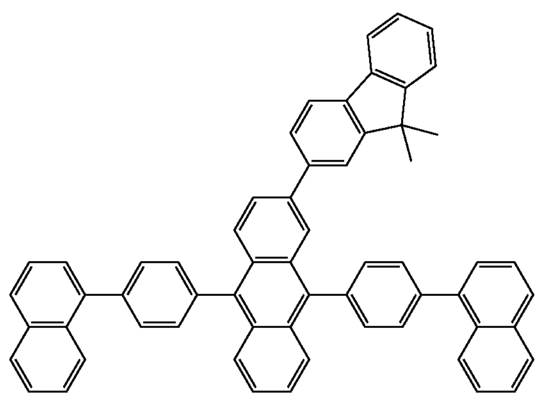
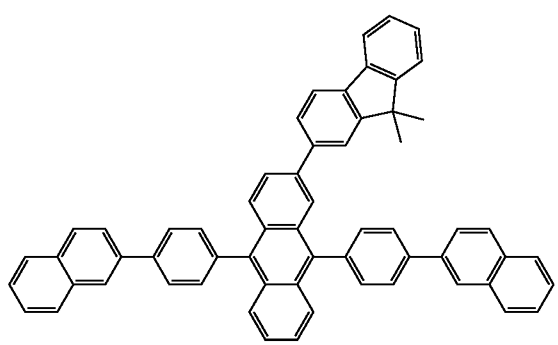

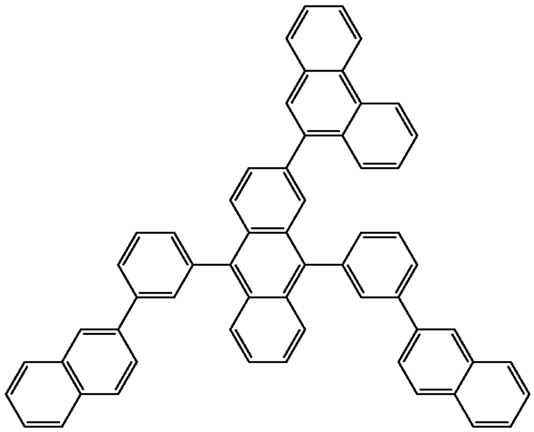
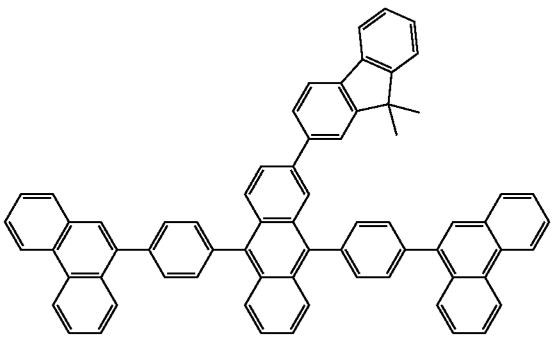
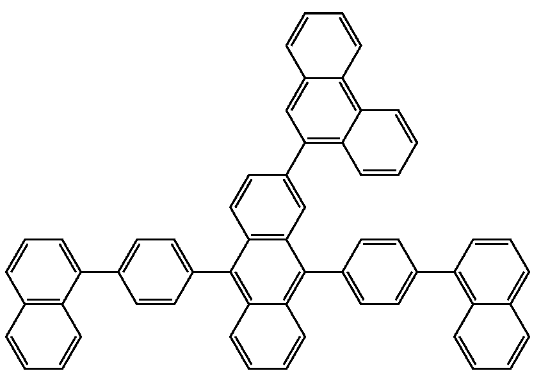
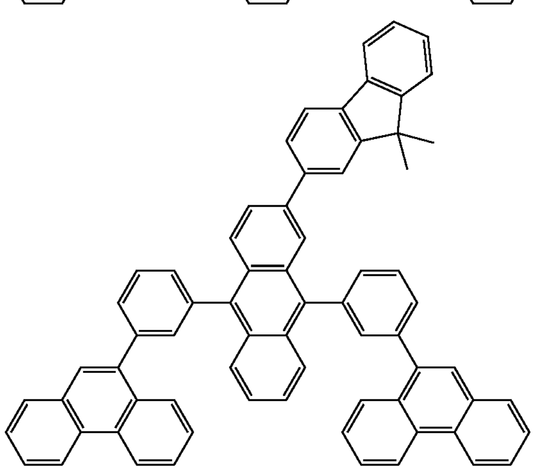
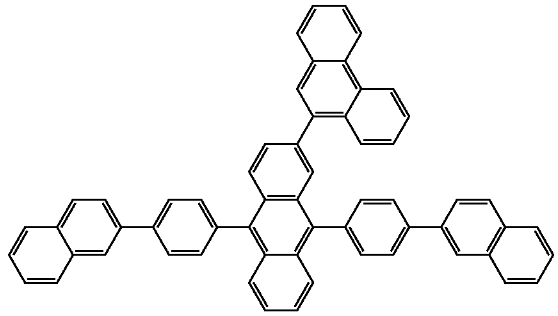
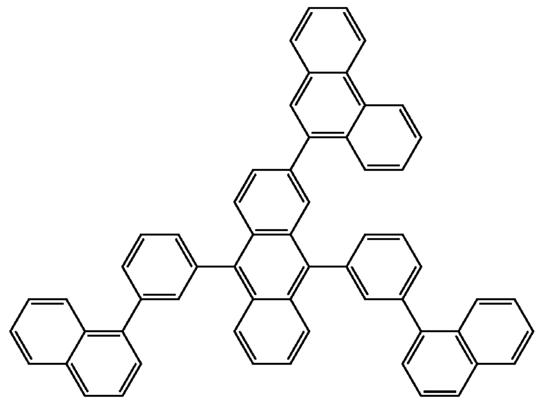
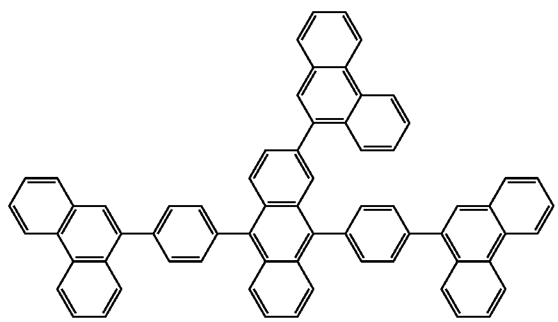
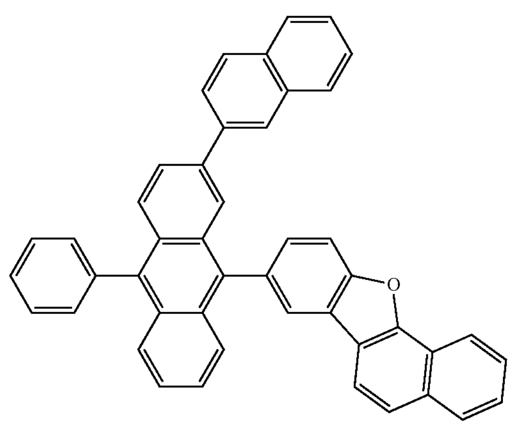
O -continued
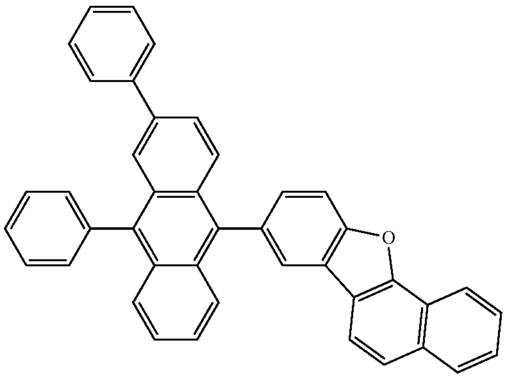
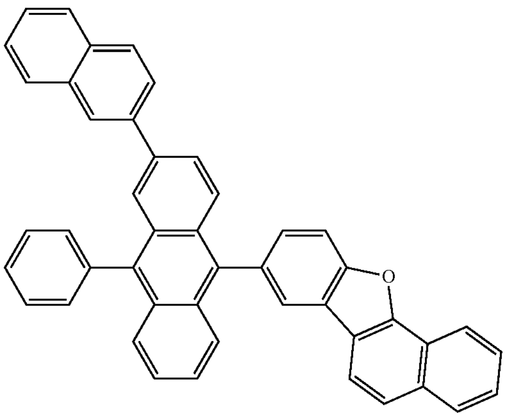
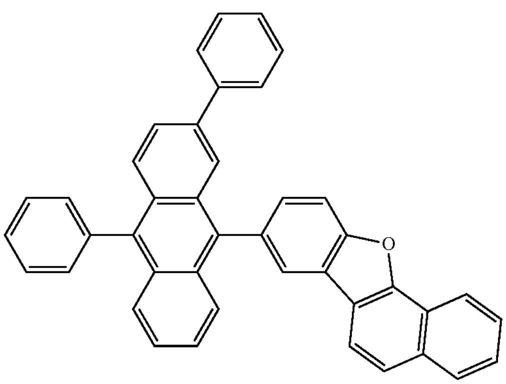
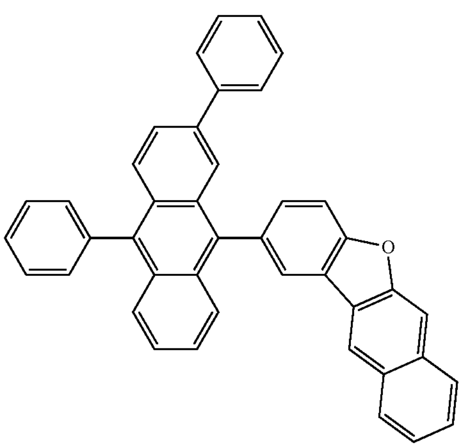
-continued
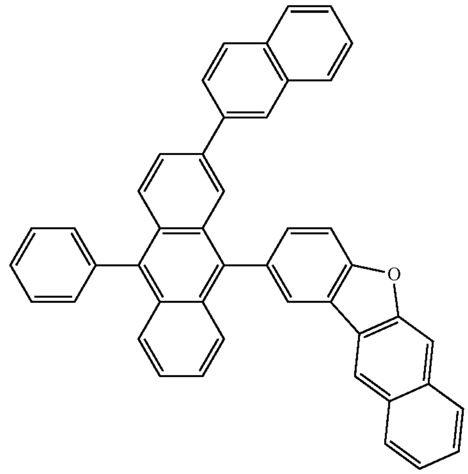
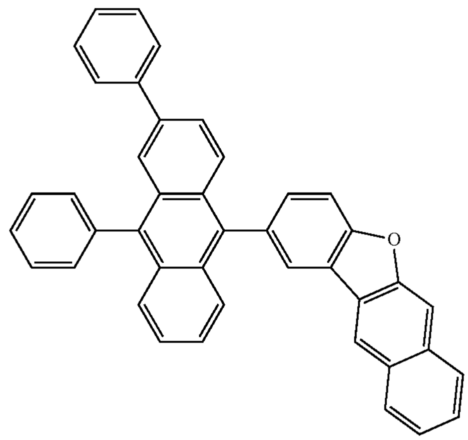
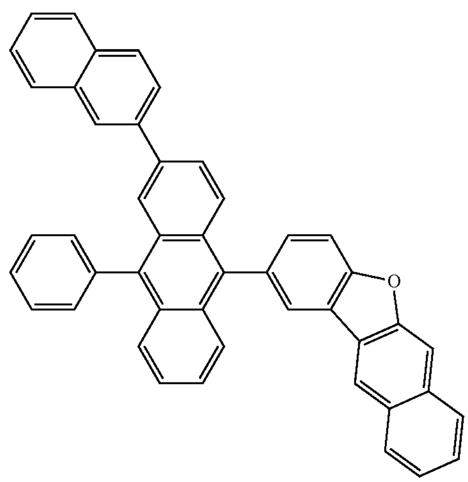
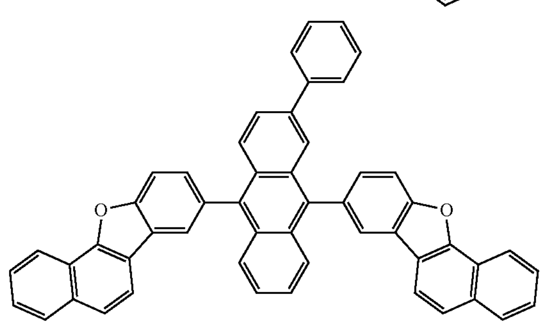

-continued

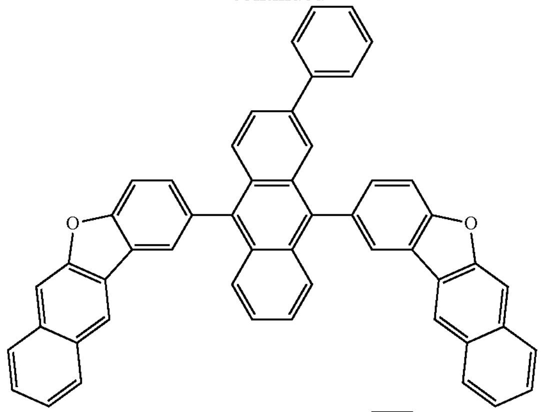

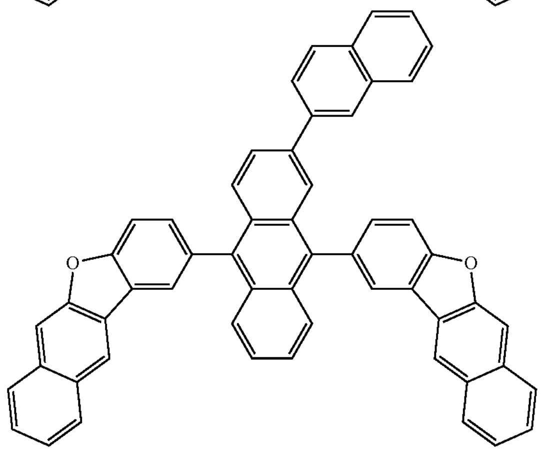

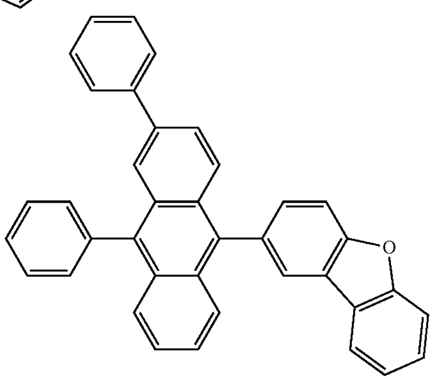

Dopant Material

The first emitting layer 132 preferably contains the compound represented by the formula (1) and the dopant material. The dopant material is sometimes referred to as a luminescent material, a guest material, or an emitter.

Examples of the dopant material contained in the first emitting layer 132 include a fluorescent material that emits fluorescence and a phosphorescent material that emits phosphorescence. The fluorescent material is a compound that can emit light in a singlet state. The phosphorescent material is a compound that can emit light in a triplet state. One of the dopant material may be used alone or two or more thereof may be used in combination.

Examples of a blue fluorescent material include a pyrene derivative, styrylamine derivative, chrysene derivative, fluoranthene derivative, fluorene derivative, monoamine derivative, diamine derivative, and triarylamine derivative.

Examples of a red fluorescent material include a tetracene derivative and a diamine derivative. Examples of a green fluorescent material include an aromatic amine derivative. Examples of a yellow fluorescent material include an anthracene derivative and a fluoranthene derivative.

Examples of a blue phosphorescent material include metal complexes such as an iridium complex, osmium complex and platinum complex. Examples of a green phosphorescent material include an iridium complex. Examples of a red phosphorescent material include metal complexes such as an iridium complex, platinum complex, terbium complex, and europium complex. Examples of a yellow phosphorescent material include an iridium complex.

Compound A

It is preferable that the dopant material contained in the first emitting layer 132 is a compound A, and a Stokes shift (SS) of the compound A is 20 nm or less.

Herein, the "Stokes shift (SS)" is a difference between an absorption maximum wavelength of an absorption spectrum and a fluorescence maximum wavelength of a fluorescence spectrum, and specifically can be measured by a method described in Examples.

In recent years, in order to improve a device performance, there is a tendency that a compound having a relatively small Stokes shift, specifically a compound having a Stokes shift of 20 nm or less is used as the dopant material.

For instance, in light of the three primary colors red, green and blue and four or more colors used for a full-color display, light without a target wavelength is removed by color filters or attenuated by a microcavity structure, likely resulting in a large energy loss. Use of a luminescent material having a small Stokes shift reduces a wavelength in the range being removed, thereby allowing for a smaller energy loss.

In the exemplary embodiment, the thickness of the first hole transporting zone 131 is set to be 60 nm or less and the first emitting layer 132 contains the compound represented by the formula (1) as the host material and the compound A (compound having a Stokes shift of 20 nm or less) as the dopant material, so that the energy transfer more likely occurs from the host material to the dopant material and consequently the effects of the exemplary embodiment are considered to further be exhibited.

The Stokes shift of the compound A is more preferably 15 nm or less. It should be noted that a lower limit of the Stokes shift of the compound A is preferably more than 0 nm, more preferably 5 nm or more.

The compound A is not particularly limited as long as the compound A is a compound having the Stokes shift of 20 nm or less, and may have any chemical structures.

Examples of the compound A include a compound represented by a formula (A-1), a formula (A-2), or a formula (A-3).

Compound Represented by Formula (A-1)

(A-1)

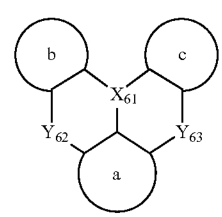

In the formula (A-1):

a ring, b ring and c ring are each independently a substituted or unsubstituted aromatic hydrocarbon ring having 6 to 50 ring carbon atoms or a substituted or unsubstituted heterocyclic group having 5 to 50 ring atoms;

$X_{61}$ is a boron atom or a nitrogen atom; and $Y_{62}$ and $Y_{63}$ are each independently $NR_d$, an oxygen atom, a sulfur atom, or a single bond;

with a proviso that when $X_{61}$ is a boron atom, $Y_{62}$ and $Y_{63}$ are each independently $NR_d$, an oxygen atom or a sulfur atom, and when $X_{61}$ is N, $Y_{62}$ and $Y_{63}$ are each a single bond;

$R_d$ is bonded with the a ring, b ring, or c ring to form a substituted or unsubstituted heterocycle, or to form no substituted or unsubstituted heterocycle; and $R_d$ not forming a substituted or unsubstituted heterocycle is each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In some embodiments, the compound represented by the formula (A-1) is a compound represented by a formula (11) below.

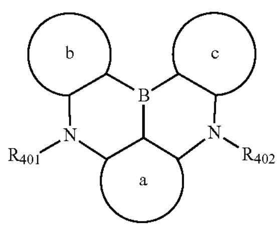

(11)

In the formula (11):

a ring, b ring and c ring are each independently a substituted or unsubstituted aromatic hydrocarbon ring having 6 to 50 ring carbon atoms or a substituted or unsubstituted heterocycle having 5 to 50 ring atoms;

$R_{401}$ and $R_{402}$ are each independently bonded with the a ring, b ring, or c ring to form a substituted or unsubstituted heterocycle or to form no substituted or unsubstituted heterocycle; and $R_{401}$ and $R_{402}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

The a ring, b ring and c ring are each a ring (a substituted or unsubstituted aromatic hydrocarbon ring having 6 to 50 ring carbon atoms, or a substituted or unsubstituted heterocycle having 5 to 50 ring atoms) fused with the fused by cyclic moiety formed of a boron atom and two nitrogen atoms at the center of the formula (11).

The "aromatic hydrocarbon ring" for the a, b, and c rings has the same structure as the compound formed by introducing a hydrogen atom to the "aryl group" described as the examples of the specific example group G1. Ring atoms of the "aromatic hydrocarbon ring" for the a ring include three carbon atoms on the fused bicyclic structure at the center of the formula (11). Ring atoms of the "aromatic hydrocarbon ring" for the b ring and the c ring include two carbon atoms on a fused bicyclic structure at the center of the formula (11).

Specific examples of the "substituted or unsubstituted aromatic hydrocarbon ring having 6 to 50 ring carbon atoms" include a compound formed by introducing a hydrogen atom to the "aryl group" described in the specific example group G1.

The "heterocycle" for the a, b, and c rings has the same structure as the compound formed by introducing a hydrogen atom to the "heterocyclic group" described as the examples of the specific example group G2. Ring atoms of the "heterocycle" for the a ring include three carbon atoms on the fused bicyclic structure at the center of the formula (11). Ring atoms of the "heterocycle" for the b ring and the c ring include two carbon atoms on the fused bicyclic structure at the center of the formula (11). Specific examples of the "substituted or unsubstituted heterocycle having 5 to 50 ring atoms" include a compound formed by introducing a hydrogen atom to the "heterocyclic group" described in the specific example group G2.

$R_{401}$ and $R_{402}$ are each independently bonded with the a ring, b ring, or c ring to form a substituted or unsubstituted heterocycle or to form no substituted or unsubstituted heterocycle. The "heterocycle" in this arrangement includes the nitrogen atom on the fused bicyclic structure at the center of the formula (11). The heterocycle in the above arrangement optionally include a hetero atom other than the nitrogen atom. $R_{401}$ and $R_{402}$ bonded with the a ring, b ring, or c ring specifically means that atoms forming $R_{401}$ and $R_{402}$ are bonded with atoms forming the a ring, b ring, or c ring.

For instance, $R_{401}$ is bonded to the a ring to form a bicyclic (or tri-or-more cyclic) fused nitrogen-containing heterocycle, in which the ring including $R_{401}$ and the a ring are fused, or to form no ring. Specific examples of the nitrogen-containing heterocycle include a compound corresponding to the nitrogen-containing bi(or-more)cyclic heterocyclic group in the specific example group G2.

The same applies to $R_{401}$ bonded with the b ring, $R_{402}$ bonded with the a ring, and $R_{402}$ bonded with the c ring.

In some embodiments, the a ring, b ring and c ring in the formula (11) are each independently a substituted or unsubstituted aromatic hydrocarbon ring having 6 to 50 ring carbon atoms.

In some embodiments, the a ring, b ring and c ring in the formula (11) are each independently a substituted or unsubstituted benzene ring or a substituted or unsubstituted naphthalene ring.

In some embodiments, $R_{401}$ and $R_{402}$ in the formula (11) are each independently a substituted or unsubstituted aryl group having 6 to 50 ring carbon atoms, or a substituted or unsubstituted heterocyclic group having 5 to 50 ring atoms, preferably a substituted or unsubstituted aryl group having 6 to 50 ring carbon atoms.

In some embodiments, the compound represented by the formula (11) is a compound represented by a formula (12) below.

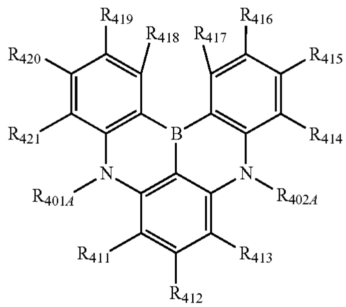

(12)

In the formula (12):

$R_{401A}$ is bonded with at least one selected from the group consisting of $R_{411}$ and $R_{421}$ to form a substituted or unsubstituted heterocycle or to form no substituted or unsubstituted heterocycle;

$R_{402A}$ is bonded with at least one selected from the group consisting of $R_{413}$ and $R_{414}$ to form a substituted or unsubstituted heterocycle or to form no substituted or unsubstituted heterocycle;

one or more of $R_{401A}$ and $R_{402A}$ not forming the substituted or unsubstituted heterocycle are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

at least one combination of adjacent two or more of $R_{411}$ to $R_{421}$ are mutually bonded to form a substituted or unsubstituted monocyclic ring, mutually bonded to form a substituted or unsubstituted fused ring, or not mutually bonded;

$R_{411}$ to $R_{421}$ not forming the substituted or unsubstituted heterocycle, not forming the monocyclic ring and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$ to $R_{907}$ each independently represent the same as $R_{901}$ to $R_{907}$ in the formula (1); and $R_{401A}$ and $R_{402A}$ in the formula (12) are groups corresponding to $R_{401}$ and $R_{402}$ in the formula (11), respectively.

For instance, $R_{401A}$ and $R_{411}$ may be bonded with each other to form a bicyclic (or tri-or-more cyclic) nitrogen-containing heterocycle, in which the ring including $R_{401A}$ and $R_{411}$ and a benzene ring corresponding to the a ring are fused. Specific examples of the nitrogen-containing heterocycle include a compound corresponding to the nitrogen-containing bi(or-more)cyclic heterocyclic group in the specific example group G2. The same applies to $R_{401A}$ bonded with $R_{421}$, $R_{402A}$ bonded with $R_{413}$, and $R_{402A}$ bonded with $R_{414}$.

At least one combination of adjacent two or more of $R_{411}$ to $R_{421}$ are mutually bonded to form a substituted or unsubstituted monocyclic ring, mutually bonded to form a substituted or unsubstituted fused ring, or not mutually bonded.

For instance, $R_{411}$ and $R_{412}$ are optionally mutually bonded to form a structure in which a benzene ring, indole ring, pyrrole ring, benzofuran ring, benzothiophene ring or the like is bonded to the six-membered ring bonded with $R_{411}$ and $R_{412}$, the resultant fused ring forming a naphthalene ring, carbazole ring, indole ring, dibenzofuran ring, or dibenzothiophene ring, respectively.

In some embodiments, one or more of $R_{411}$ to $R_{421}$, which do not contribute to ring formation, are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In some embodiments, one or more of $R_{411}$ to $R_{421}$, which do not contribute to ring formation, are each independently a hydrogen atom, a substituted or unsubstituted aryl group having 6 to 50 ring carbon atoms, or a substituted or unsubstituted heterocyclic group having 5 to 50 ring atoms.

In some embodiments, one or more of $R_{411}$ to $R_{421}$, which do not contribute to ring formation, are each independently a hydrogen atom, or a substituted or unsubstituted alkyl group having 1 to 50 carbon atoms.

In some embodiments, one or more of $R_{411}$ to $R_{421}$, which do not contribute to ring formation, are each independently a hydrogen atom or a substituted or unsubstituted alkyl group having 1 to 50 carbon atoms, at least one of $R_{411}$ to $R_{421}$ being a substituted or unsubstituted alkyl group having 1 to 50 carbon atoms.

In some embodiments, the compound represented by the formula (12) is a compound represented by a formula (13) below.

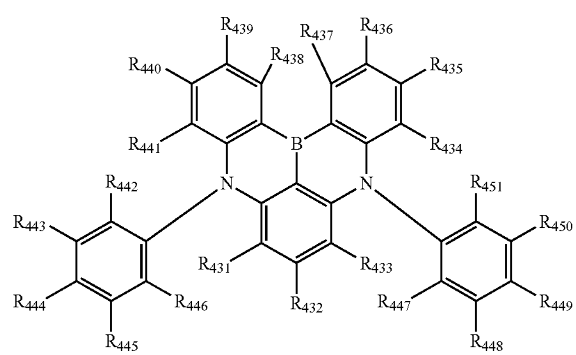

(13)

In the formula (13):

$R_{431}$ is optionally bonded with $R_{446}$ to form a substituted or unsubstituted heterocycle or to form no substituted or unsubstituted heterocycle; $R_{433}$ is optionally bonded with $R_{447}$ to form a substituted or unsubstituted heterocycle or to form no substituted or unsubstituted heterocycle; $R_{434}$ is optionally bonded with $R_{451}$ to form a substituted or unsubstituted heterocycle or to form no substituted or unsubstituted heterocycle; $R_{441}$ is optionally bonded with $R_{442}$ to form a substituted or unsubstituted heterocycle or to form no substituted or unsubstituted heterocycle;

at least one combination of adjacent two or more of $R_{431}$ to $R_{451}$ are mutually bonded to form a substituted or unsubstituted monocyclic ring, mutually bonded to form a substituted or unsubstituted fused ring, or not mutually bonded;

$R_{431}$ to $R_{451}$ not forming the substituted or unsubstituted heterocycle, not forming the monocyclic ring and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$ to $R_{907}$ each independently represent the same as $R_{901}$ to $R_{907}$ in the formula (1); and $R_{431}$ is optionally bonded with $R_{446}$ to form a substituted or unsubstituted heterocycle or to form no substituted or unsubstituted heterocycle. For instance, $R_{431}$ and $R_{446}$ are optionally bonded with each other to form a tri-or-more cyclic nitrogen-containing heterocycle, in which a benzene ring bonded with $R_{446}$, a ring including a nitrogen atom, and a benzene ring corresponding to the a ring are fused. Specific examples of the nitrogen-containing heterocycle include a compound corresponding to the nitrogen-containing tri(-or-more) cyclic heterocyclic group in the specific example group G2. The same applies to $R_{433}$ bonded with $R_{447}$, $R_{434}$ bonded with $R_{451}$, and $R_{441}$ bonded with $R_{442}$.

In some embodiments, $R_{431}$ to $R_{451}$ not contributing to ring formation are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In some embodiments, $R_{431}$ to $R_{451}$ not contributing to ring formation are each independently a hydrogen atom, a substituted or unsubstituted aryl group having 6 to 50 ring carbon atoms, or a substituted or unsubstituted heterocyclic group having 5 to 50 ring atoms.

In some embodiments, one or more of $R_{431}$ to $R_{451}$, which do not contribute to ring formation, are each independently a hydrogen atom, or a substituted or unsubstituted alkyl group having 1 to 50 carbon atoms.

In some embodiments, $R_{431}$ to $R_{451}$ not contributing to ring formation are each independently a hydrogen atom or a substituted or unsubstituted alkyl group having 1 to 50 carbon atoms, at least one of $R_{431}$ to $R_{451}$ being a substituted or unsubstituted alkyl group having 1 to 50 carbon atoms.

In some embodiments, the compound represented by the formula (13) is a compound represented by a formula (13A) below.

(13A)

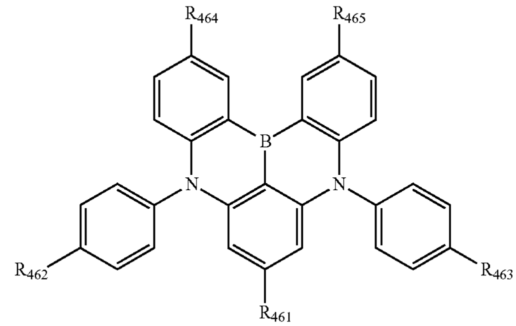

In the formula (13A), $R_{461}$ to $R_{465}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms.

In some embodiments, $R_{461}$ to $R_{465}$ are each independently a substituted or unsubstituted alkyl group having 1 to 50 carbon atoms, or a substituted or unsubstituted aryl group having 6 to 50 ring carbon atoms.

In some embodiments, $R_{461}$ to $R_{465}$ are each independently a substituted or unsubstituted alkyl group having 1 to 50 carbon atoms.

In some embodiments, the compound represented by the formula (13) is a compound represented by a formula (13B) below.

(13B)

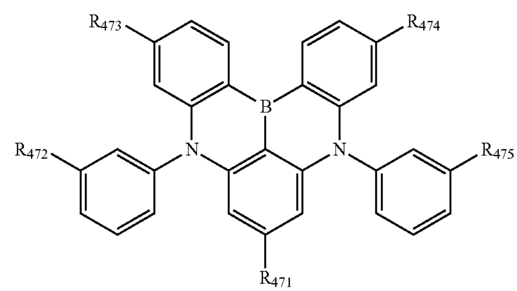

In the formula (13B):

$R_{471}$, $R_{472}$ and $R_{475}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, —N($R_{906}$)($R_{907}$), or a substituted or unsubstituted aryl group having 6 to 50 ring carbon atoms;

$R_{473}$ and $R_{474}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, —N($R_{906}$)($R_{907}$), a substituted or unsubstituted aryl group having 6 to 50 ring carbon atoms, or a substituted or unsubstituted heterocyclic group having 5 to 50 ring atoms; and $R_{906}$ to $R_{907}$ each independently represent the same as $R_{906}$ and $R_{907}$ in the formula (1).

In some embodiments, the compound represented by the formula (13) is a compound represented by a formula (13B') below.

(13B')

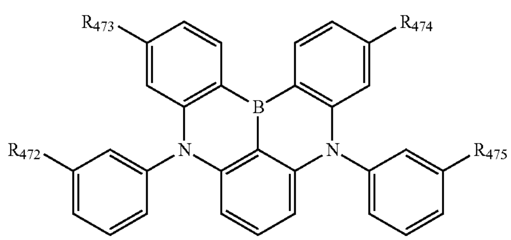

In the formula (13B'), $R_{472}$ to $R_{475}$ each independently represent the same as $R_{472}$ to $R_{475}$ in the formula (13B).

In some embodiments, at least one of $R_{472}$ to $R_{475}$ is a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, —N($R_{906}$)($R_{907}$) or a substituted or unsubstituted aryl group having 6 to 50 ring carbon atoms; and $R_{906}$ and $R_{907}$ each independently represent the same as $R_{906}$ and $R_{907}$ in the formula (1).

In some embodiments, $R_{472}$ is a hydrogen atom, a substituted or unsubstituted alkyl group having 1 to 50 carbon atoms, —N($R_{906}$)($R_{907}$) or a substituted or unsubstituted aryl group having 6 to 50 ring carbon atoms; and $R_{473}$ to $R_{475}$ are each independently a substituted or unsubstituted alkyl group having 1 to 50 carbon atoms, —N($R_{906}$)($R_{907}$) or a substituted or unsubstituted aryl group having 6 to 50 ring carbon atoms.

In some embodiments, the compound represented by the formula (13) is a compound represented by a formula (13C) below.

(13C)

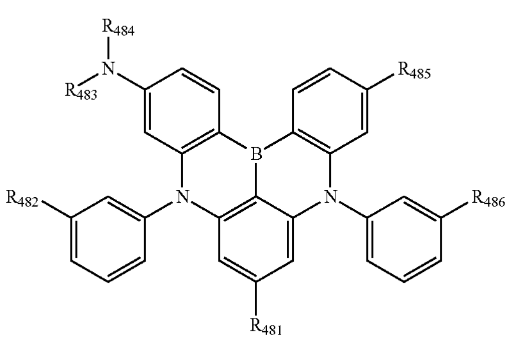

In the formula (13C), $R_{481}$ and $R_{482}$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms; and $R_{483}$ to $R_{486}$ are each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, or a substituted or unsubstituted aryl group having 6 to 50 ring carbon atoms.

In some embodiments, $R_{481}$ to $R_{486}$ are each independently a substituted or unsubstituted alkyl group having 1 to 50 carbon atoms, or a substituted or unsubstituted aryl group having 6 to 50 ring carbon atoms.

In some embodiments, $R_{481}$ to $R_{486}$ are each independently a substituted or unsubstituted aryl group having 6 to 50 ring carbon atoms.

In some embodiments, the compound represented by the formula (13) is a compound represented by a formula (13C') below.

(13C')

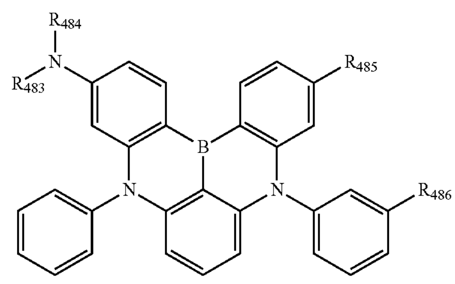

In the formula (13C'), $R_{483}$ to $R_{486}$ each independently represent the same as $R_{483}$ to $R_{486}$ in the formula (13C).

Compound Represented by Formula (A-2)

(A-2)

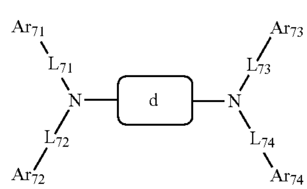

In the formula (A-2), d ring is a substituted or unsubstituted aromatic hydrocarbon ring having 6 to 50 ring carbon atoms or a substituted or unsubstituted heterocycle having 5 to 50 ring atoms;

$L_{71}$ to $L_{74}$ are each independently a single bond, a substituted or unsubstituted arylene group having 6 to 50 ring carbon atoms, or a substituted or unsubstituted divalent heterocyclic group having 5 to 50 ring atoms; and $Ar_{71}$ to $Ar_{74}$ are each independently a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

with a proviso that when the d ring is a substituted or unsubstituted aromatic hydrocarbon ring having 10 to 50 ring carbon atoms, at least two of $Ar_{71}$ to $Ar_{74}$ are each an aryl group having 6 to 50 ring carbon atoms substituted by an alkyl group having 1 to 50 carbon atoms, or a heterocyclic group having 5 to 50 ring atoms substituted by an alkyl group having 1 to 50 carbon atoms.

In some embodiments, the compound represented by the formula (A-2) is a compound represented by a formula (A-2-1) below.

(A-2-1)

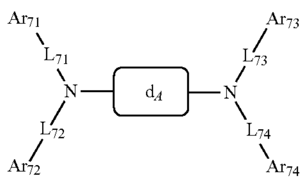

In the formula (A-2-1), $L_{71}$ to $L_{74}$ and $Ar_{71}$ to $Ar_{74}$ each independently represent the same as $L_{71}$ to $L_{74}$ and $Ar_{71}$ to $Ar_{74}$ in the formula (A-2).

In the formula (A-2-1), $d_A$ ring is a substituted or unsubstituted aromatic hydrocarbon ring having 10 to 50 ring carbon atoms.

In some embodiments, the $d_A$ ring is a substituted or unsubstituted pyrene ring.

In some embodiments, a substituent of the $d_A$ ring is a substituted or unsubstituted alkyl group having 1 to 50 carbon atoms, a substituted or unsubstituted cycloalkyl group having 3 to 50 ring carbon atoms, —Si($R_{901}$)($R_{902}$)($R_{903}$), a halogen atom, a cyano group, or a nitro group;

- $R_{901}$ to $R_{903}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.
- when a plurality of $R_{901}$ are present, the plurality of $R_{901}$ are mutually the same or different;
- when a plurality of $R_{902}$ are present, the plurality of $R_{902}$ are mutually the same or different;
- when a plurality of $R_{903}$ are present, the plurality of $R_{903}$ are mutually the same or different; and
- $R_{901}$ to $R_{903}$ each independently represent the same as $R_{901}$ to $R_{903}$ in the formula (1).

In other embodiments of the formula (A-2), the compound represented by the formula (A-2) is a compound represented by a formula (A-2-2) below.

(A-2-2)

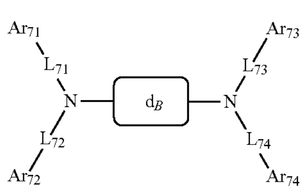

In the formula (A-2-2), $L_{71}$ to $L_{74}$ and $Ar_{71}$ to $Ar_{74}$ each independently represent the same as $L_{71}$ to $L_{74}$ and $Ar_{71}$ to $Ar_{74}$ in the formula (A-2).

In the formula (A-2-2), dB ring is a substituted or unsubstituted heterocycle having 12 to 50 ring carbon atoms.

In some embodiments, the dB ring is selected from a substituted or unsubstituted heterocycle having a cyclic structure represented by each of formulae (A-2-21) to (A-2-25) below.

(A-2-21)

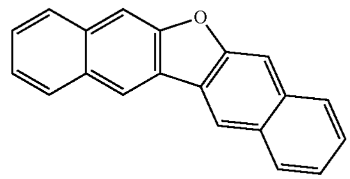

(A-2-22)

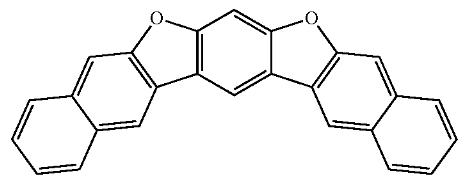

(A-2-23)

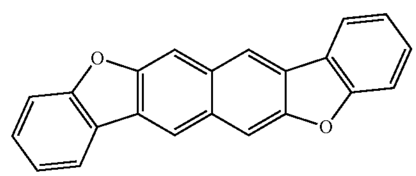

(A-2-24)

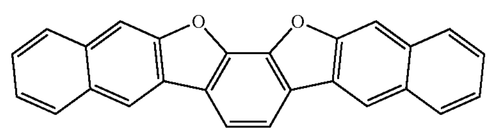

(A-2-25)

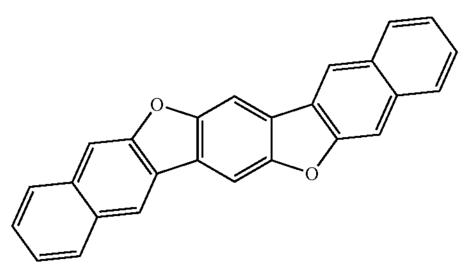

In some embodiments, it is preferable that a substituent of the dB ring is a substituted or unsubstituted alkyl group having 1 to 50 carbon atoms, a substituted or unsubstituted cycloalkyl group having 3 to 50 ring carbon atoms, —Si($R_{901}$)($R_{902}$)($R_{903}$), a halogen atom, a cyano group, or a nitro group,

- $R_{901}$ to $R_{903}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;
- when a plurality of $R_{901}$ are present, the plurality of $R_{901}$ are mutually the same or different;
- when a plurality of $R_{902}$ are present, the plurality of $R_{902}$ are mutually the same or different;

when a plurality of $R_{903}$ are present, the plurality of $R_{903}$ are mutually the same or different; and $R_{901}$ to $R_{903}$ each independently represent the same as $R_{901}$ to $R_{903}$ in the formula (1).

Compound Represented by Formula (A-3)

(A-3)

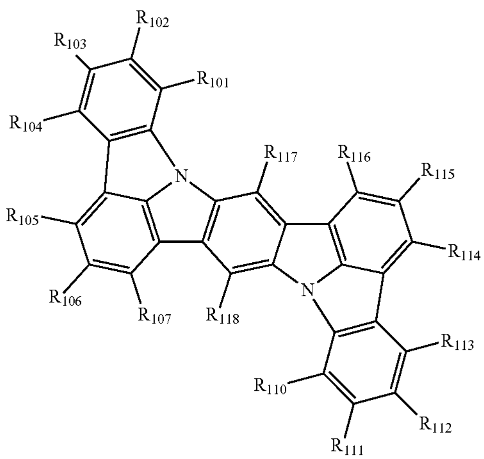

In the formula (A-3):

at least one combination of adjacent two or more of $R_{101}$ to $R_{107}$ and $R_{110}$ to $R_{118}$ are mutually bonded to form a substituted or unsubstituted monocyclic ring, mutually bonded to form a substituted or unsubstituted fused ring, or not mutually bonded;

$R_{101}$ to $R_{107}$ and $R_{101}$ to $R_{118}$ not forming the monocyclic ring and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms; and $R_{901}$ to $R_{907}$ in the formula (A-3) each independently represent the same as $R_{901}$ to $R_{907}$ in the formula (1).

In some embodiments, $R_{101}$ to $R_{107}$ and $R_{110}$ to $R_{118}$ are each independently a hydrogen atom, a substituted or unsubstituted aryl group having 6 to 50 ring carbon atoms, or a substituted or unsubstituted heterocyclic group having 5 to 50 ring atoms.

In some embodiments, $R_{101}$ to $R_{107}$ and $R_{110}$ to $R_{118}$ are each independently a hydrogen atom, a substituted or unsubstituted aryl group having 6 to 18 ring carbon atoms, and a substituted or unsubstituted heterocyclic group having 5 to 18 ring atoms.

In some embodiments, the compound represented by the formula (A-3) is a compound represented by a formula (A-31) below.

(A-31)

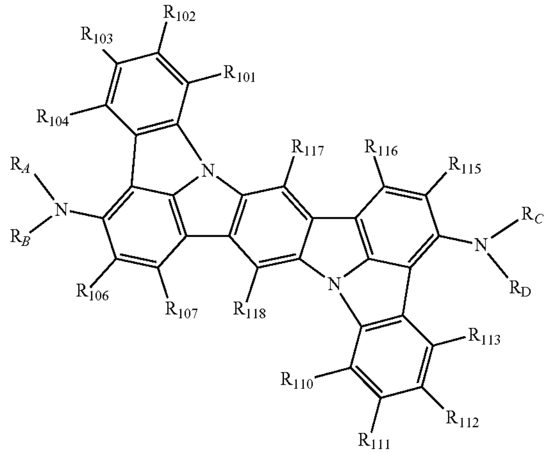

In the formula (A-31), $R_{421}$ to $R_{424}$, $R_{440}$ to $R_{443}$, $R_{447}$ and $R_{448}$ each independently represent the same as $R_{421}$ to $R_{424}$, $R_{440}$ to $R_{443}$, $R_{447}$ and $R_{448}$ in the formula (A-3); and $R_A$, $R_B$, $R_C$, and $R_D$ are each independently a substituted or unsubstituted aryl group having 6 to 18 ring carbon atoms, or a substituted or unsubstituted heterocyclic group having 5 to 18 ring atoms.

In some embodiments, the compound represented by the formula (A-31) is a compound represented by a formula (A-32) below.

(A-32)

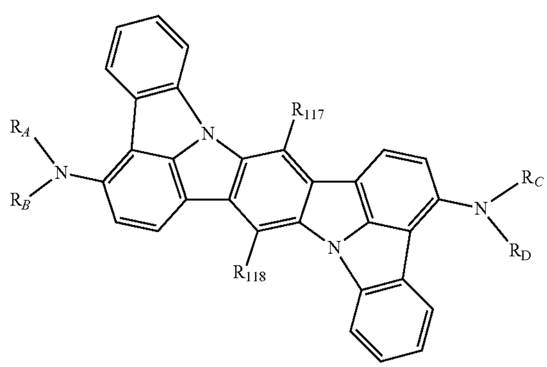

In the formula (A-32), $R_{117}$, $R_{118}$, $R_A$, $R_B$, $R_C$ and $R_D$ each independently represent the same as $R_{117}$, $R_{118}$, $R_A$, $R_B$, $R_C$ and $R_D$ in the formula (A-31).

In some embodiments, $R_A$, $R_B$, $R_C$, and $R_D$ are each independently a substituted or unsubstituted aryl group having 6 to 18 ring carbon atoms.

In some embodiments, $R_A$, $R_B$, $R_C$, and $R_D$ are each independently a substituted or unsubstituted phenyl group.

In some embodiments, $R_{117}$ and $R_{118}$ are each a hydrogen atom.

In some embodiments, the substituent meant by "substituted or unsubstituted" is an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901a}$)($R_{902a}$)($R_{903a}$), —O—($R_{904a}$), —S—($R_{905a}$), —N($R_{906a}$)($R_{907a}$), a halogen atom, a cyano group, a nitro group, an unsubstituted aryl group having 6 to 50 ring carbon atoms, or an unsubstituted heterocyclic group having 5 to 50 ring atoms;

$R_{901a}$ to $R_{907a}$ are each independently a hydrogen atom, an unsubstituted alkyl group having 1 to 50 carbon atoms, an unsubstituted aryl group having 6 to 50 ring carbon atoms, or an unsubstituted heterocyclic group having 5 to 50 ring atoms;

when two or more $R_{901a}$ are present, the two or more $R_{901a}$ are mutually the same or different;

when two or more $R_{902a}$ are present, the two or more $R_{902a}$ are mutually the same or different;

when two or more $R_{903a}$ are present, the two or more $R_{903a}$ are mutually the same or different;

when two or more $R_{904a}$ are present, the two or more $R_{904a}$ are mutually the same or different;

when two or more $R_{905a}$ are present, the two or more $R_{905a}$ are mutually the same or different;

when two or more $R_{906a}$ are present, the two or more $R_{906a}$ are mutually the same or different; and when two or more $R_{907a}$ are present, the two or more $R_{907a}$ are mutually the same or different.

In some embodiments, the substituent meant by "substituted or unsubstituted" is an unsubstituted alkyl group having 1 to 50 carbon atoms, an unsubstituted aryl group having 6 to 50 ring carbon atoms, or an unsubstituted heterocyclic group having 5 to 50 ring atoms.

In some embodiments, the substituent meant by "substituted or unsubstituted" is an unsubstituted alkyl group having 1 to 18 carbon atoms, an unsubstituted aryl group having 6 to 18 ring carbon atoms, or an unsubstituted heterocyclic group having 5 to 18 ring atoms.

A color emitted by the first emitting layer 132 is not particularly limited. The first emitting layer 132 may be a fluorescent layer (e.g., a blue fluorescent layer, yellow fluorescent layer, red fluorescent layer, and green fluorescent layer) or a phosphorescent layer (e.g., a blue phosphorescent layer, yellow phosphorescent layer, red phosphorescent layer, and green phosphorescent layer). The first emitting layer 132 may be provided by a single layer or a plurality of layers. When the first emitting layer 132 includes a plurality of layers, the first emitting layer 132 may be a layer in which a fluorescent layer and a phosphorescent layer are combined.

The first emitting layer 132 is preferably a blue fluorescent layer.

Herein, the blue light emission refers to light emission in which a main peak wavelength of emission spectrum is in a range from 430 nm to 480 nm.

The yellow light emission refers to light emission in which a main peak wavelength of emission spectrum is in a range from 530 nm to 600 nm.

The red light emission refers to light emission in which a main peak wavelength of emission spectrum is in a range from 600 nm to 660 nm.

The green light emission refers to light emission in which a main peak wavelength of emission spectrum is in a range from 500 nm to 560 nm.

Herein, when the dopant material is a fluorescent compound, the compound preferably emits light having a main peak wavelength in a range from 400 nm to 700 nm.

Herein, the main peak wavelength of the compound refers to a wavelength at which the luminous intensity of the fluorescence spectrum is at the maximum (a fluorescence maximum wavelength) measured by the method described in Examples.

When the dopant material is the compound A (compound having the Stokes shift of 20 nm or less), a main peak wavelength of the compound A is preferably in a range from 440 nm to 465 nm. In other words, the compound A is preferably a blue fluorescent compound.

Manufacturing Method of Compound A

The compound A can be manufactured by the following method.

When the compound has a rigid structure in a molecule, a rotational motion of the molecule and vibration between atoms are suppressed, so that the Stokes shift of the compound tends to be small. Accordingly, the compound having the Stokes shift of 20 nm or less (i.e., the compound A) can be obtained by designing the compound to have a rigid structure in the molecule.

The compound represented by the formula (11) is producible by, for instance, bonding the a ring, b ring and c ring with linking groups (a group including N—$R_{401}$ and a group including N—$R_{402}$) to form an intermediate (first reaction), and bonding the a ring, b ring and c ring with a linking group (a group including a boron atom) to form a final product (the compound represented by the formula (11)) (second reaction). In the first reaction, an amination reaction (e.g. Buchwald-Hartwig reaction) is applicable. In the second reaction, Tandem Hetero-Friedel-Crafts Reactions or the like is applicable.

The compound represented by the formula (A-3) can be manufactured by a known method.

Furthermore, the compound A can be manufactured, for instance, by application of known substitution reactions and/or materials depending on a target compound.

Specific examples of the compound A are shown below. It should be noted that the compound A according to the invention is not limited to these specific examples.

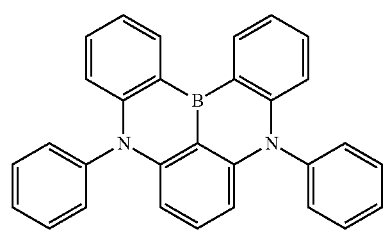

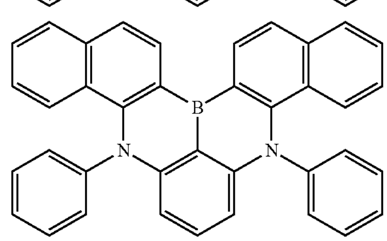

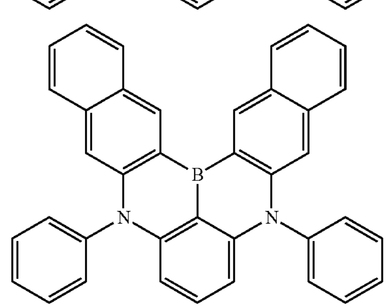

-continued
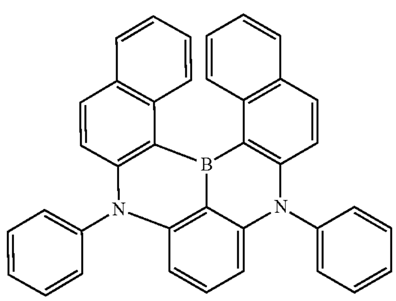
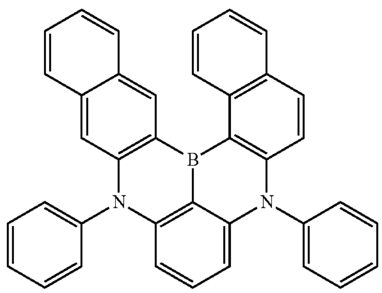
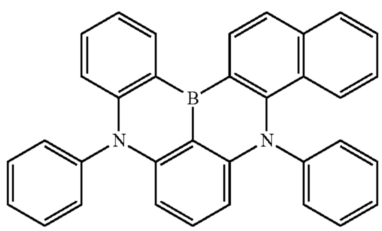
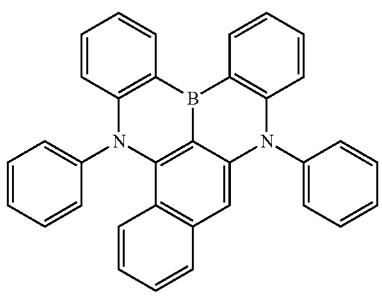
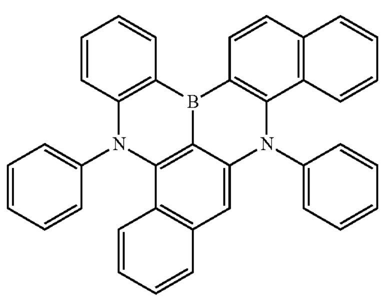
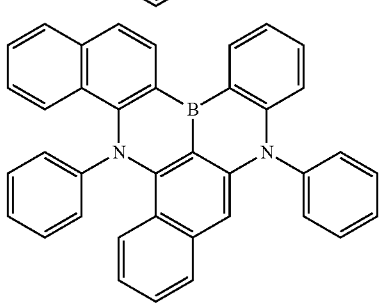
-continued
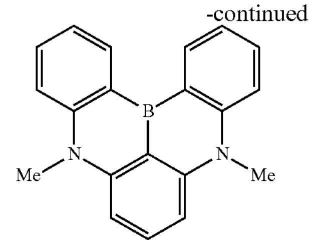
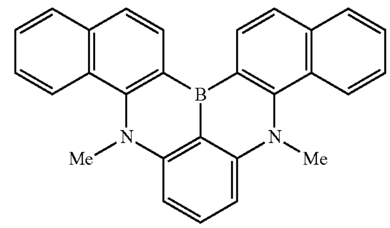
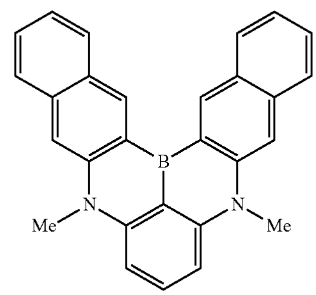
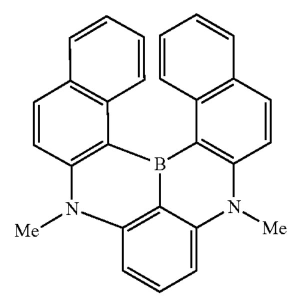
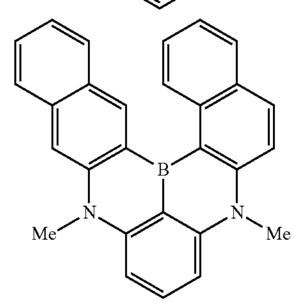
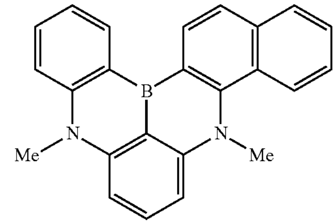

-continued
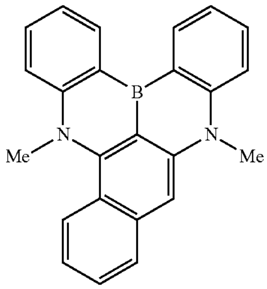
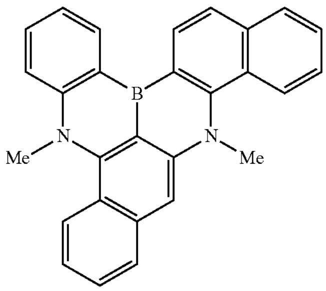
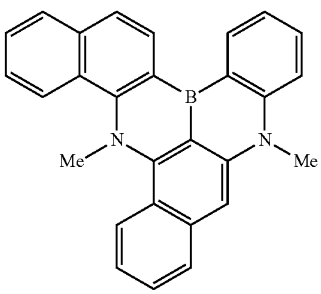
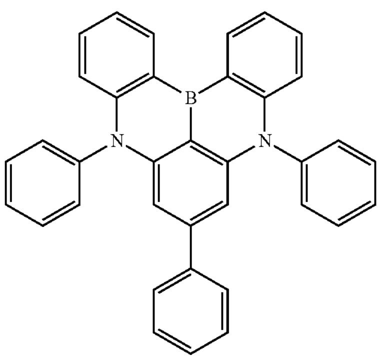
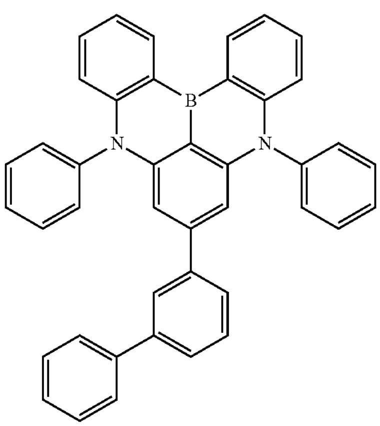
-continued
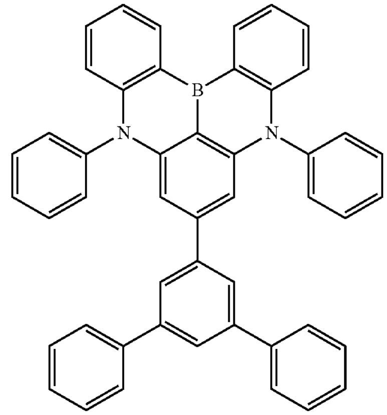
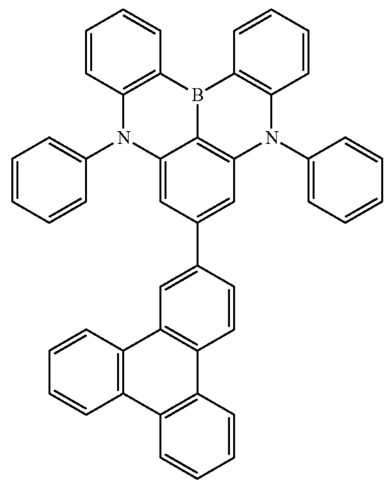
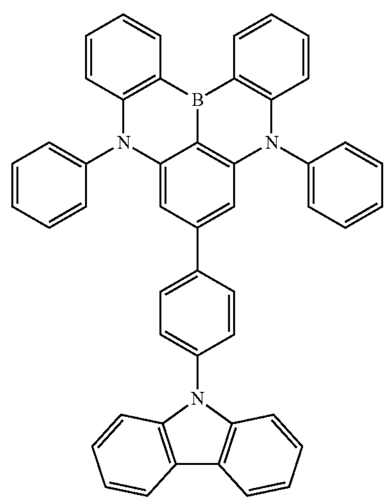

-continued
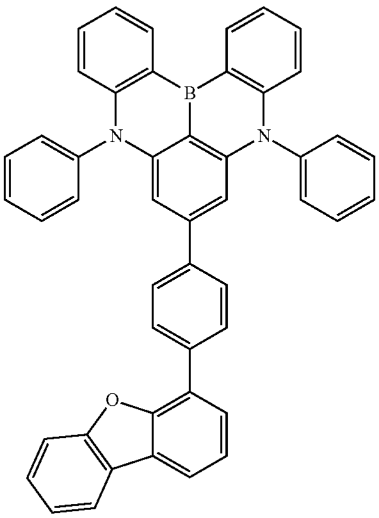
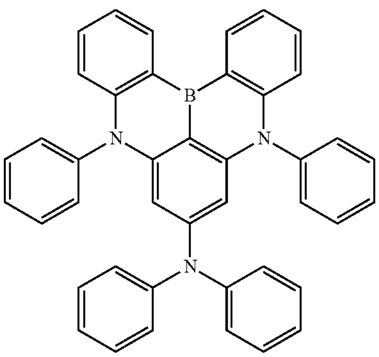
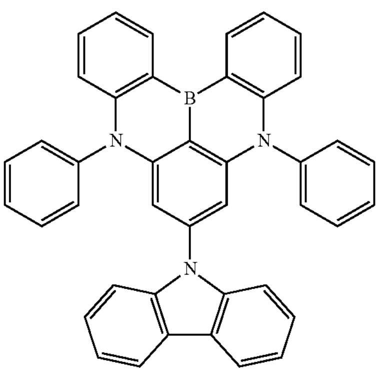
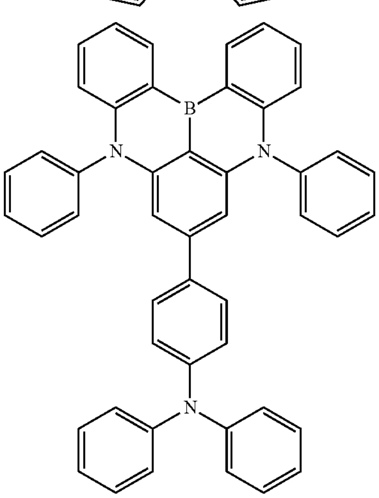
-continued
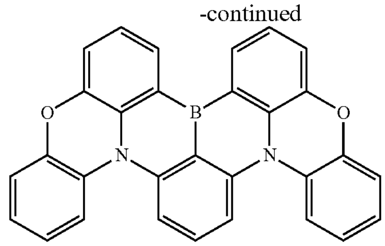
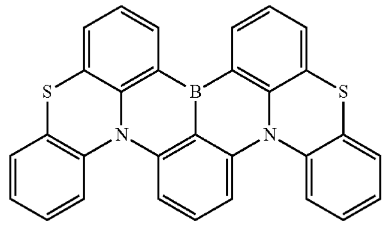
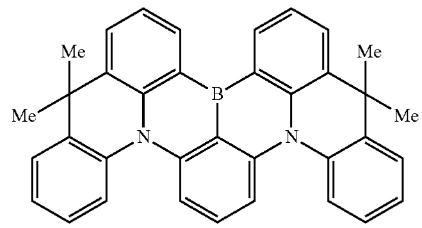
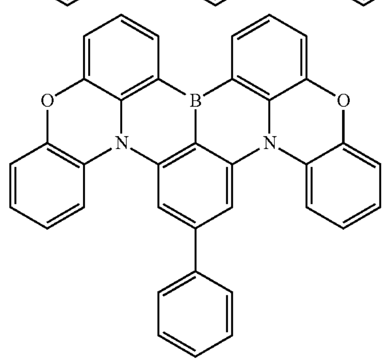
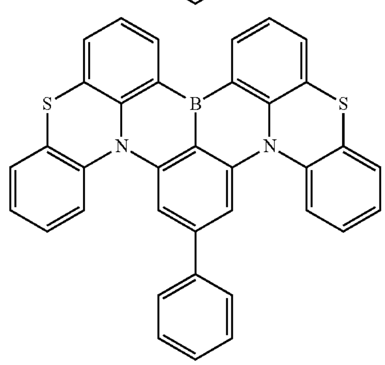
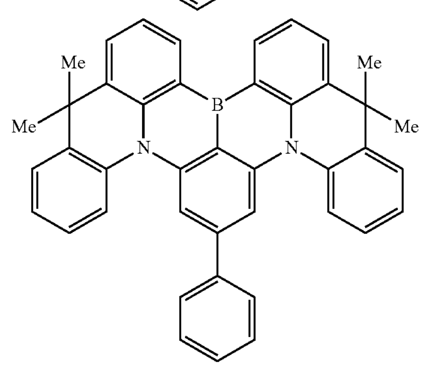

-continued
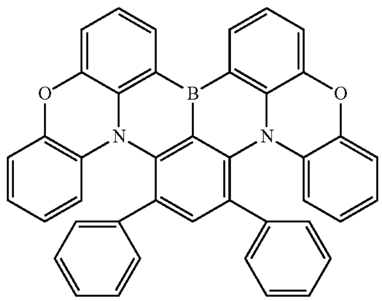
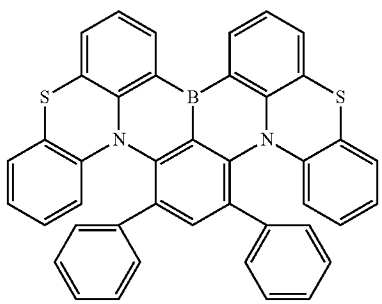
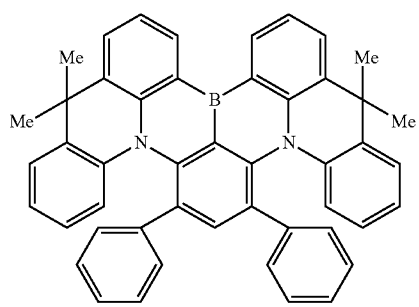
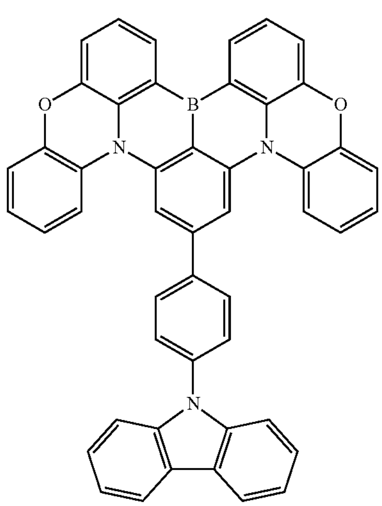
-continued
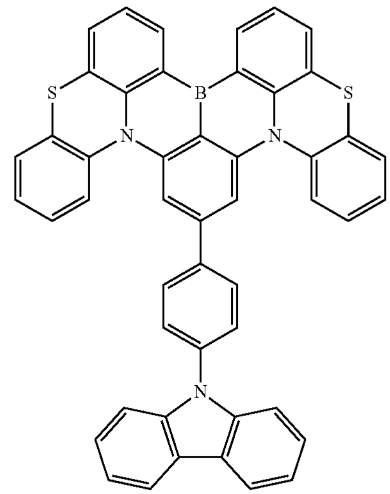
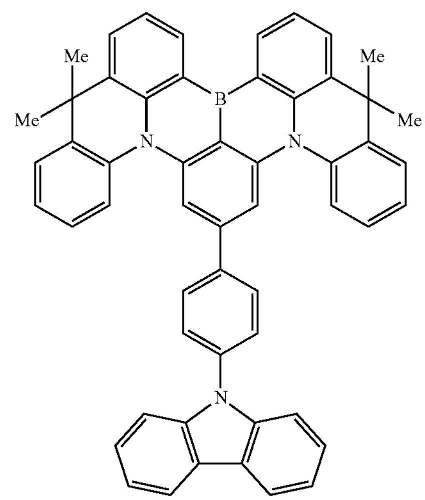
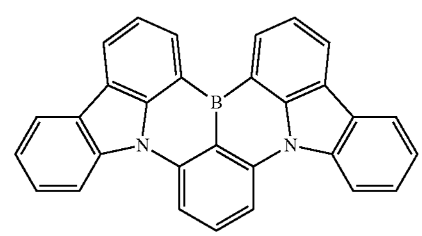
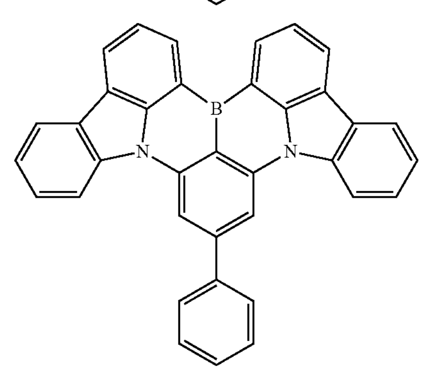

-continued
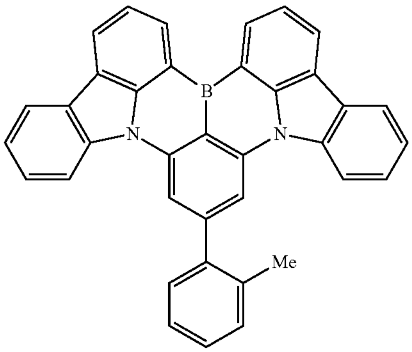
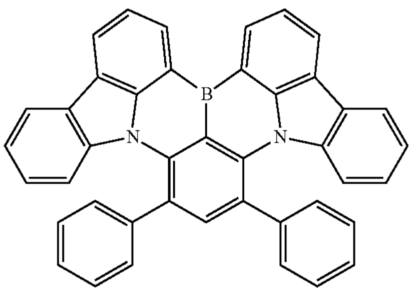
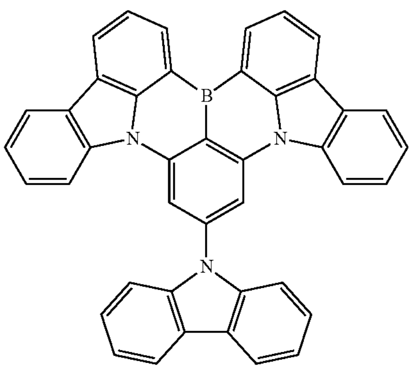
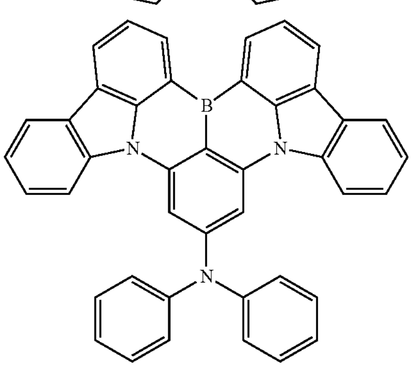
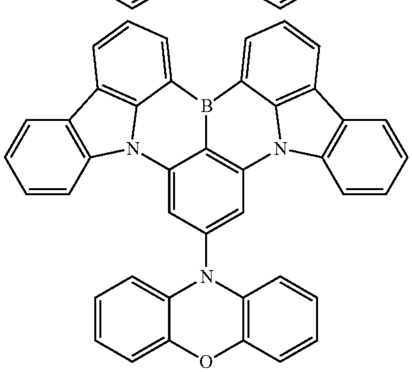
-continued
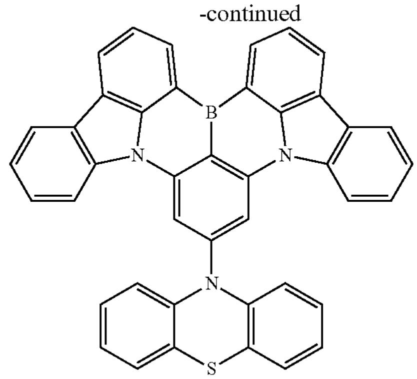
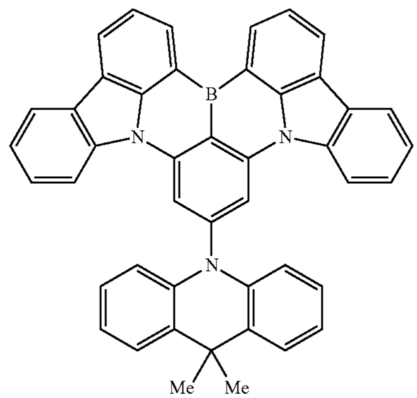
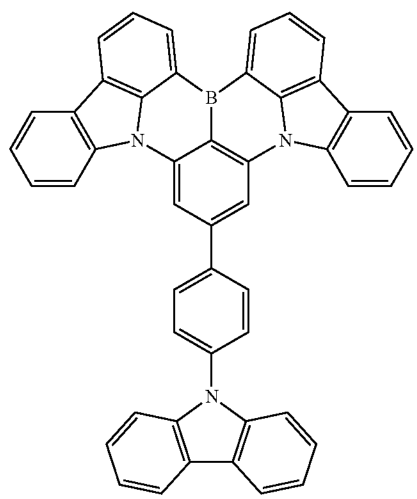
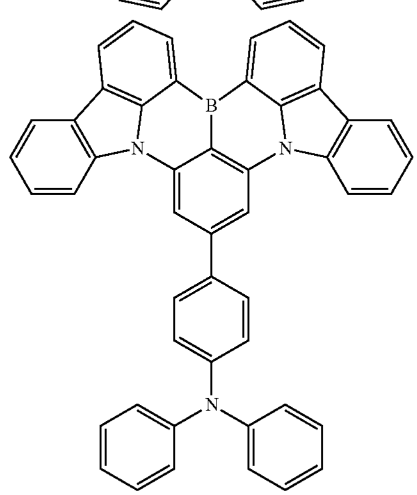

-continued
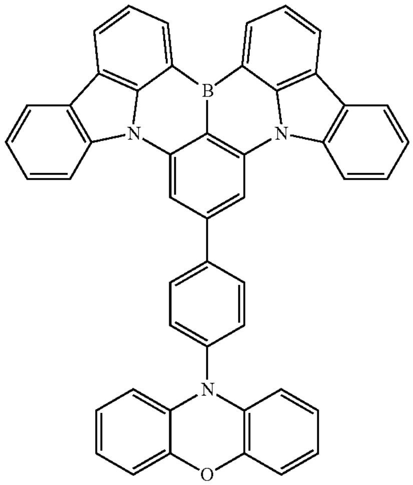
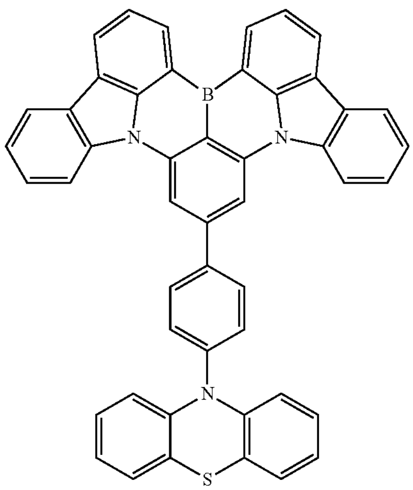
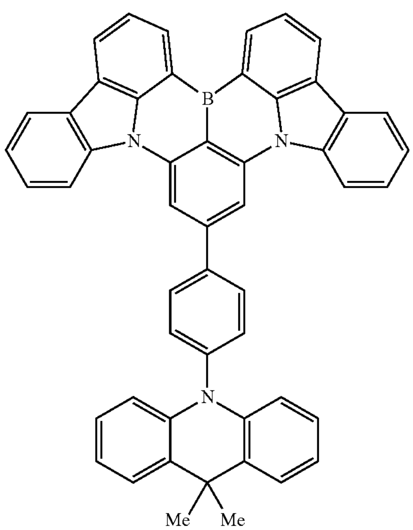
-continued
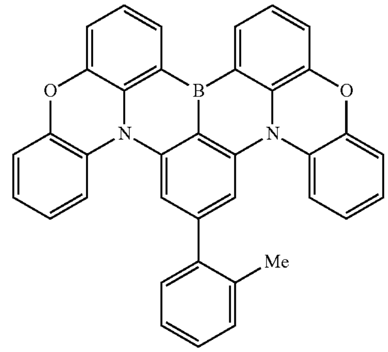
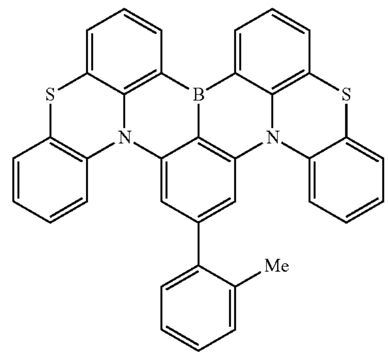
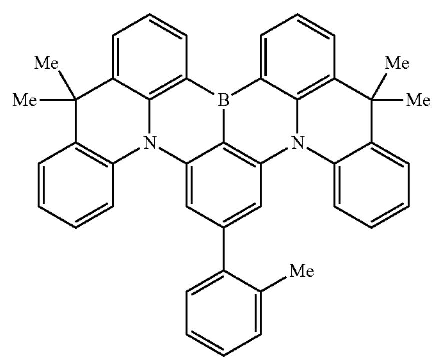
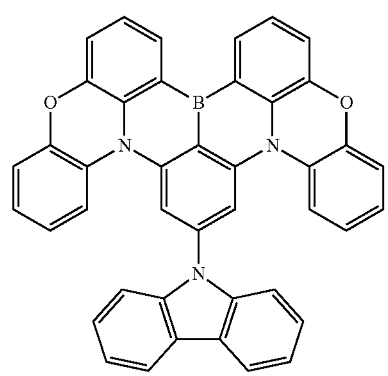

-continued
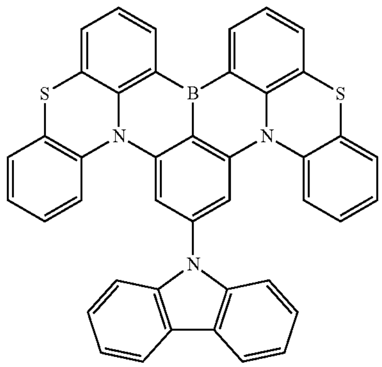
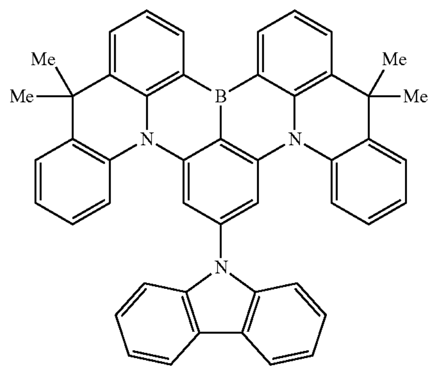
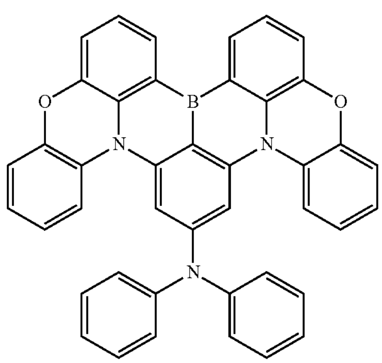
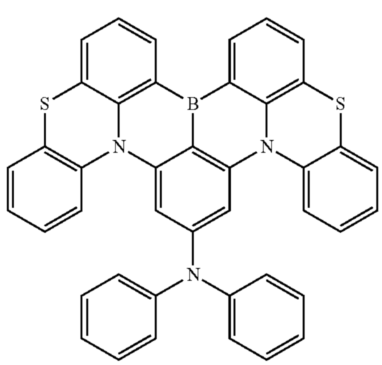
-continued
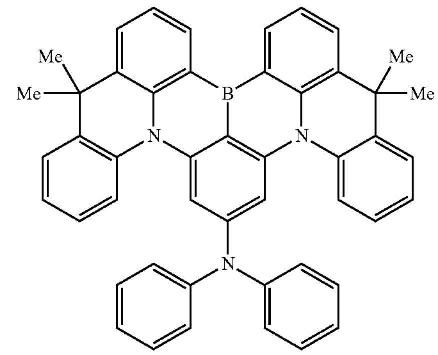
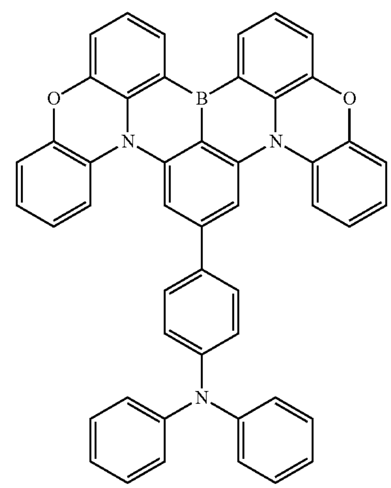
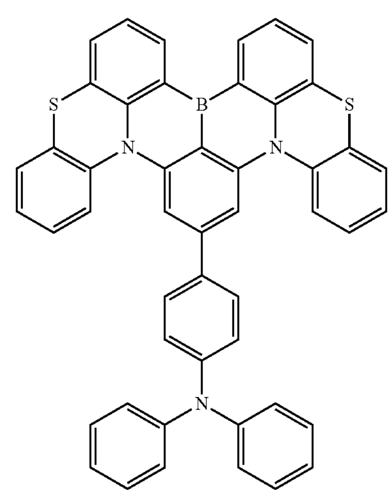

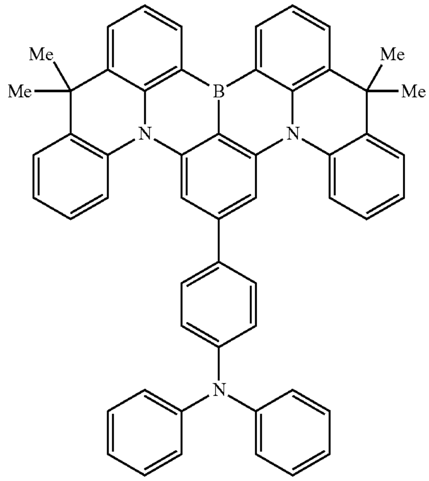
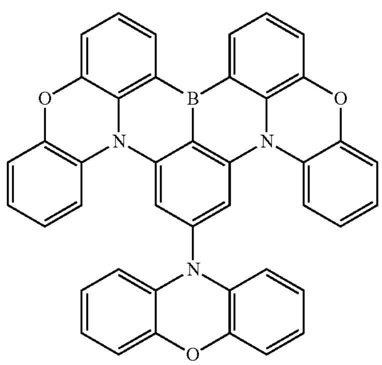
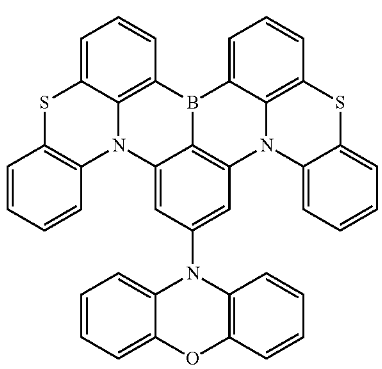
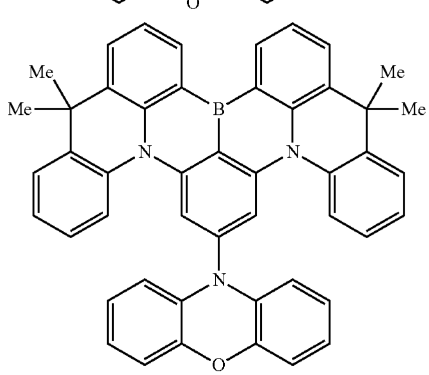
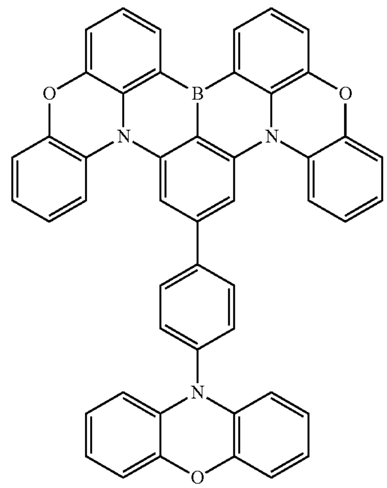
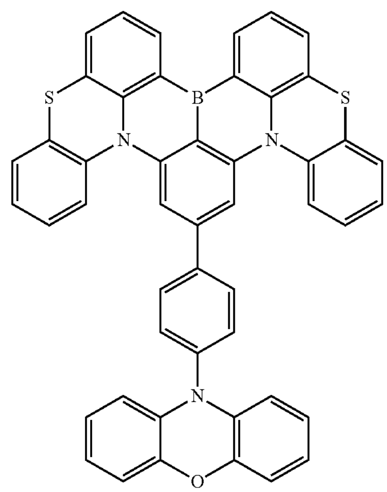
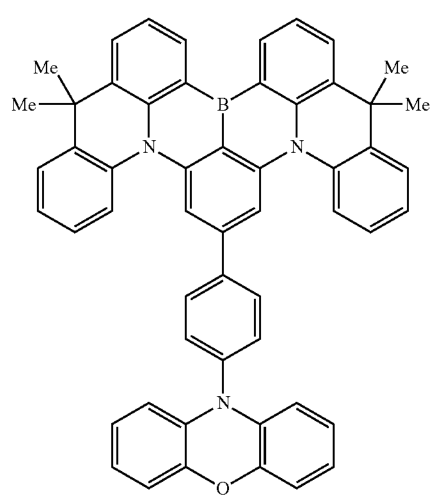

-continued
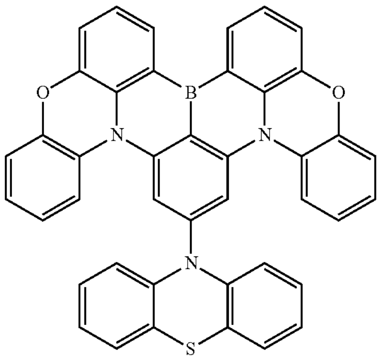
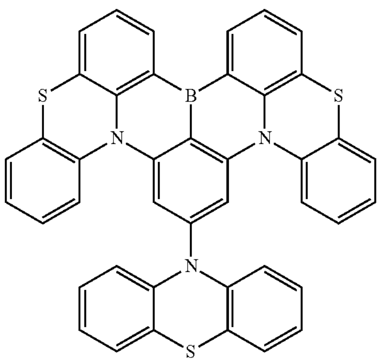
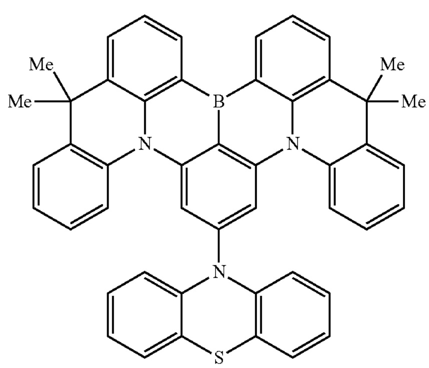
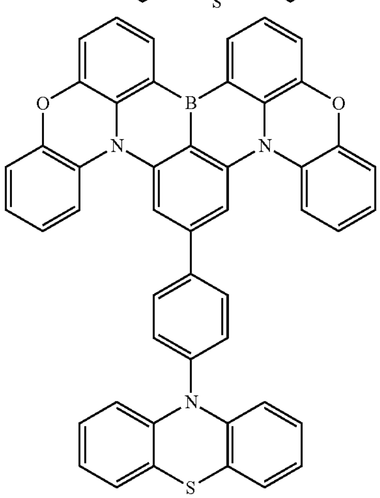
-continued
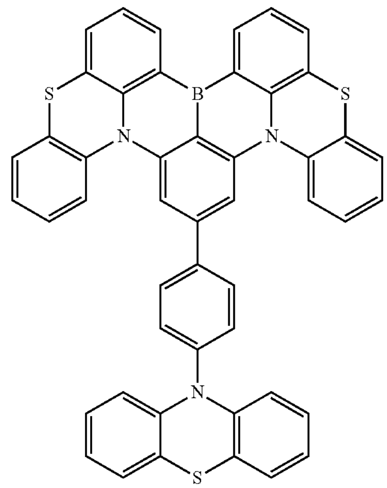
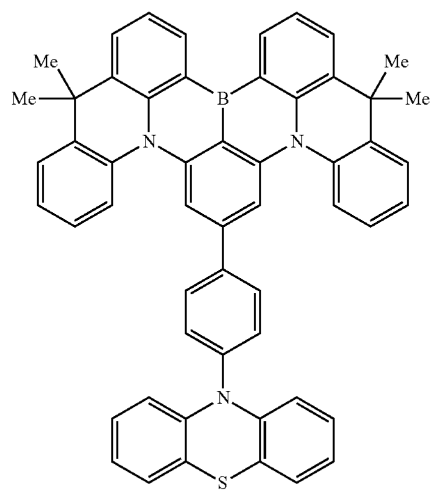
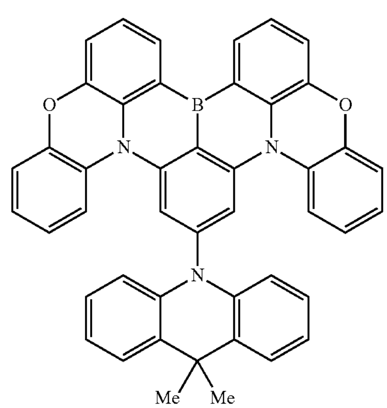

-continued
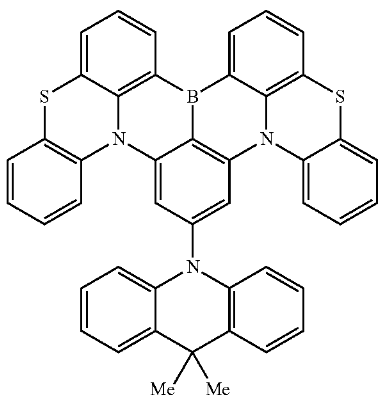
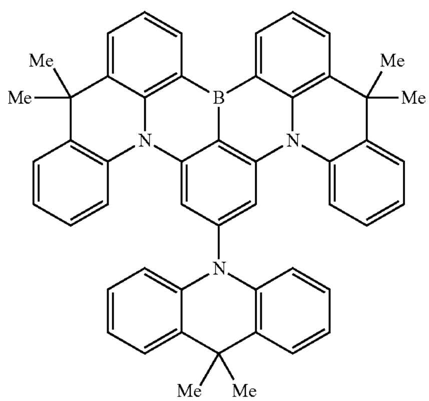
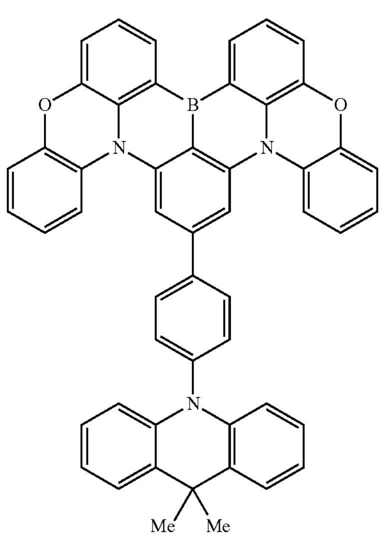
-continued
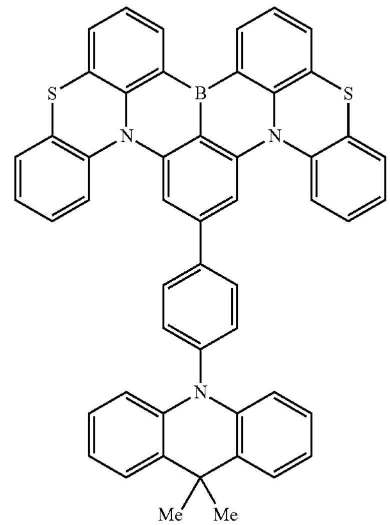
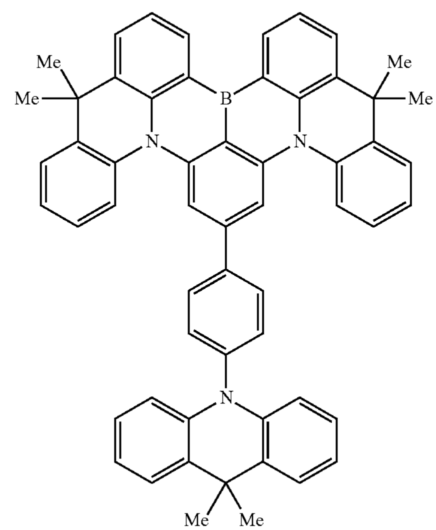
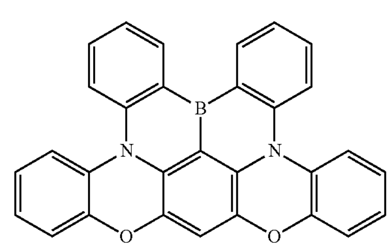
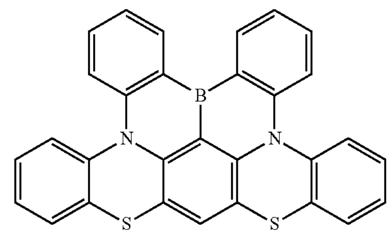

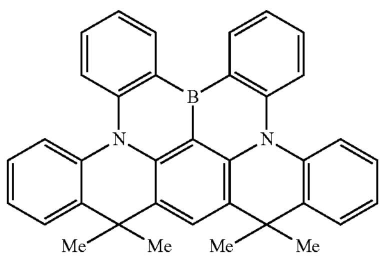
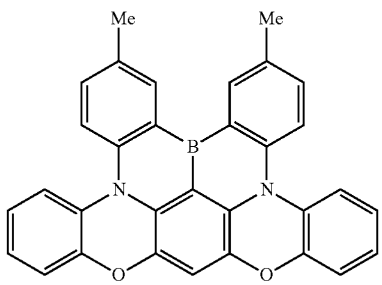
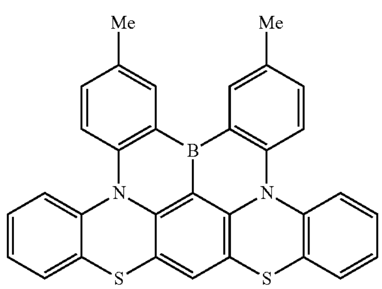
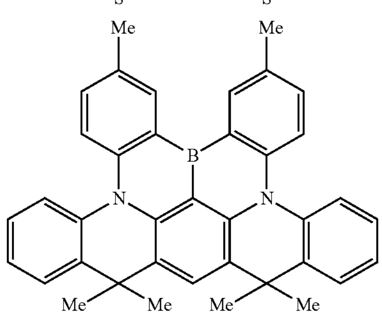
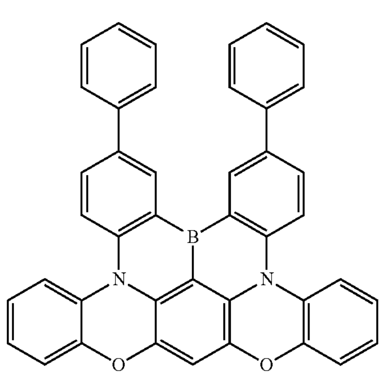
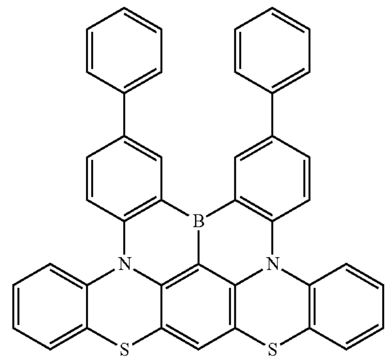
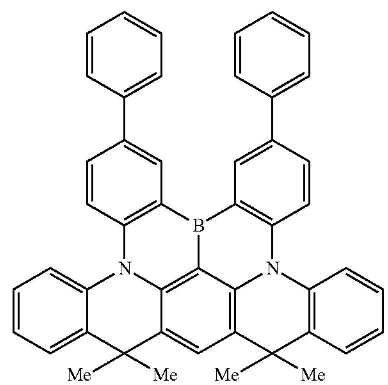
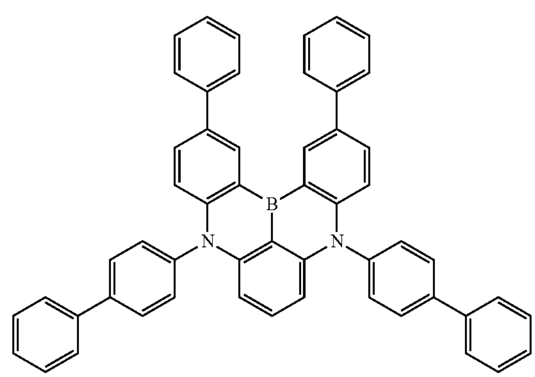
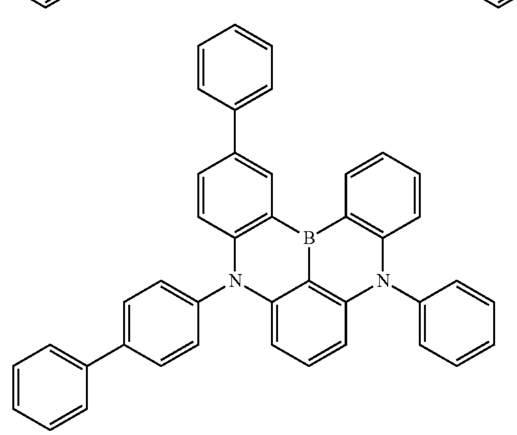

-continued
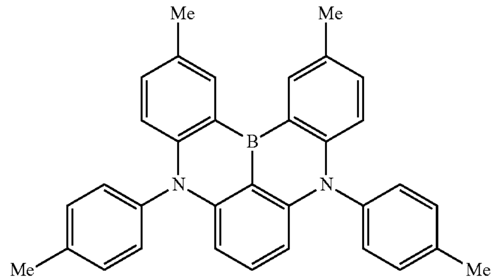
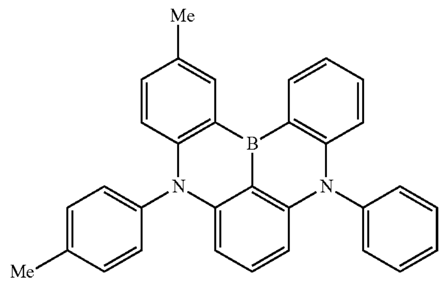
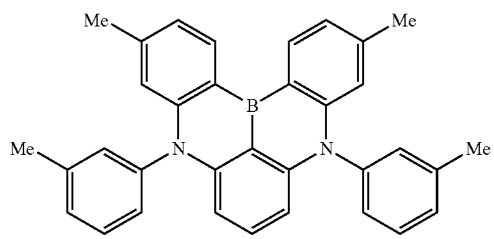
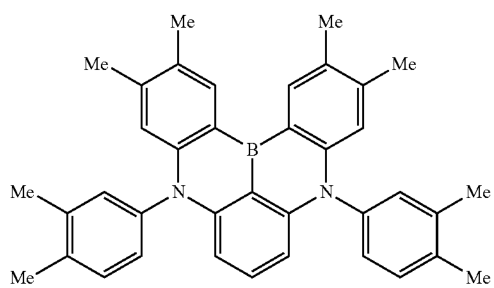
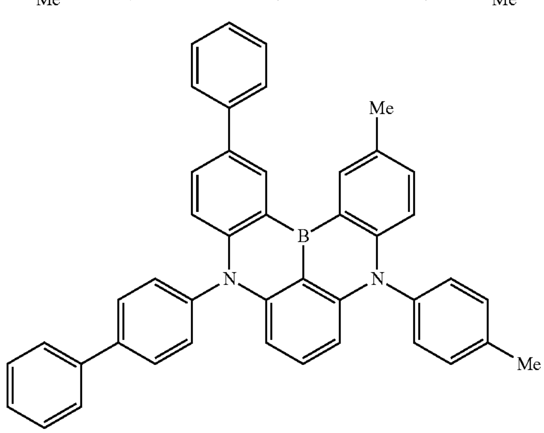
-continued
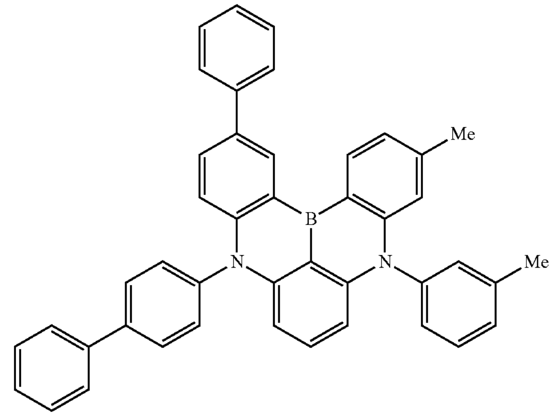
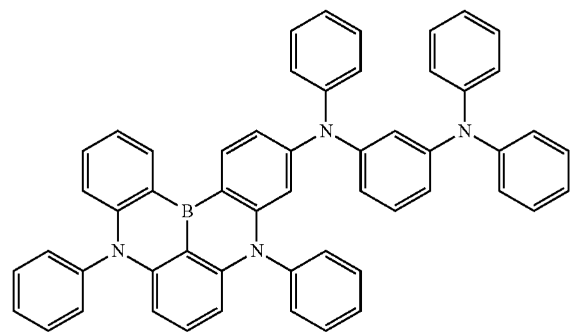
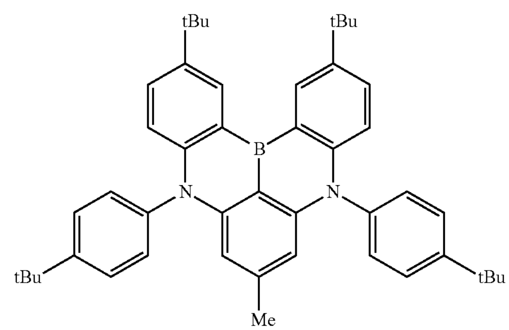
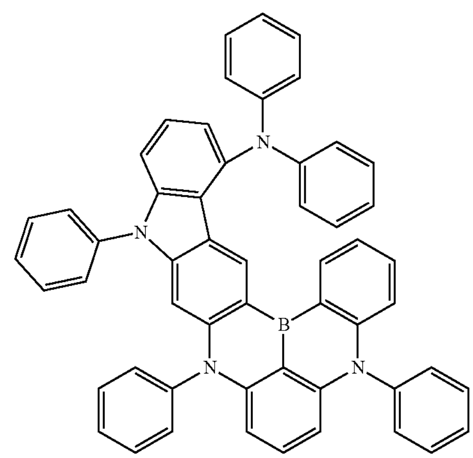

-continued
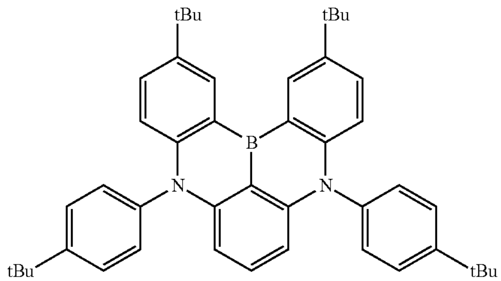
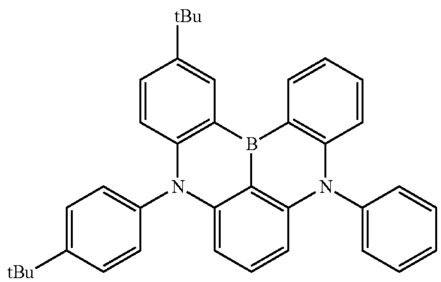
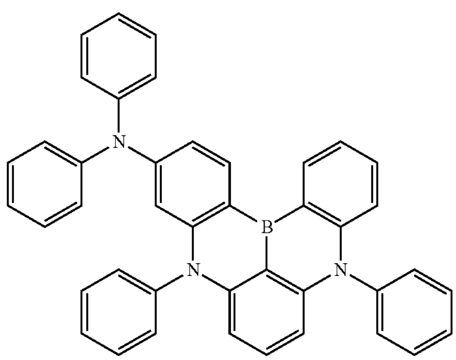
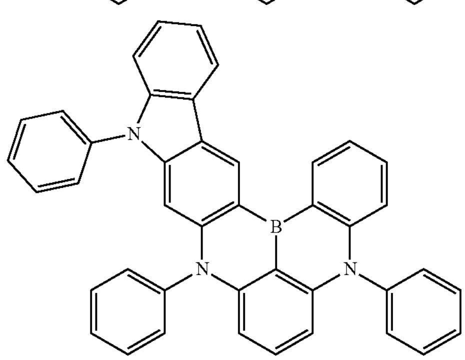
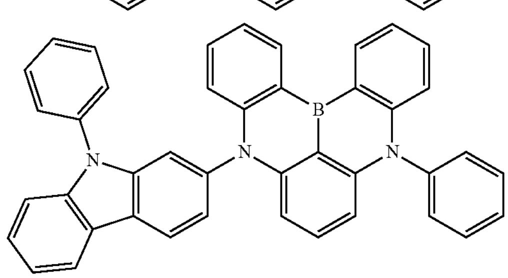
-continued
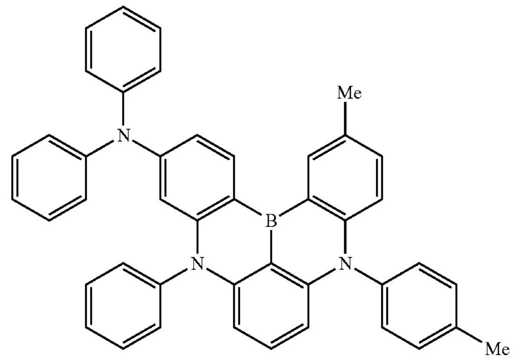
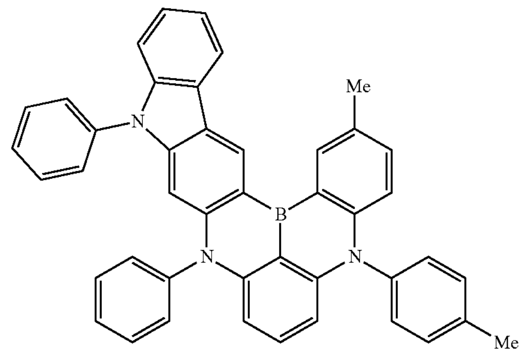
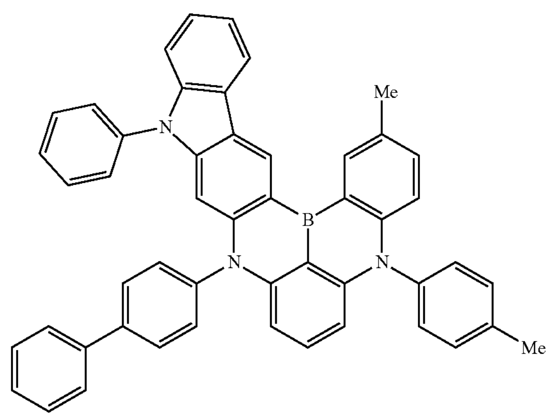
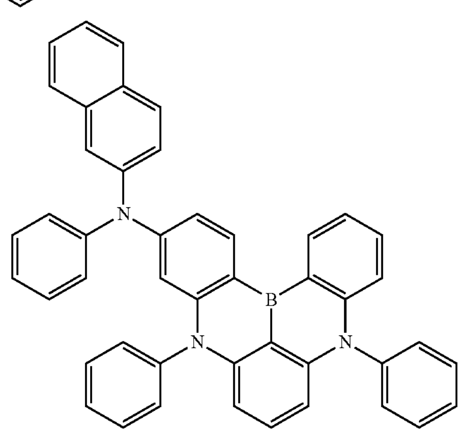

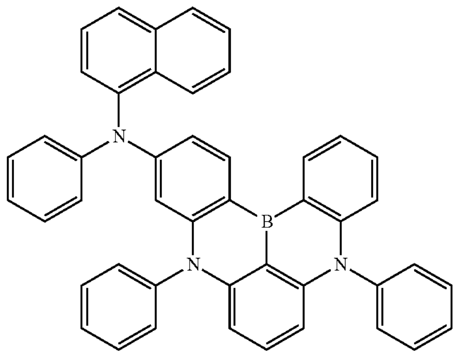
N
B
N
N
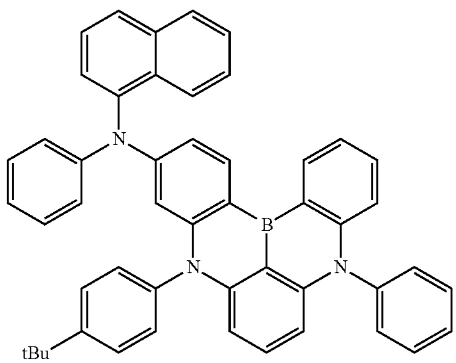
N
B
N
N
tBu
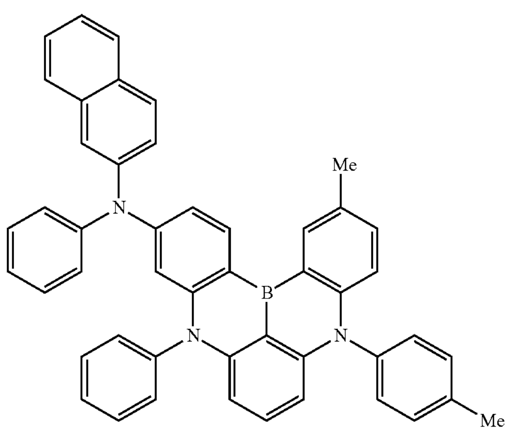
Me
N
B
N
N
Me
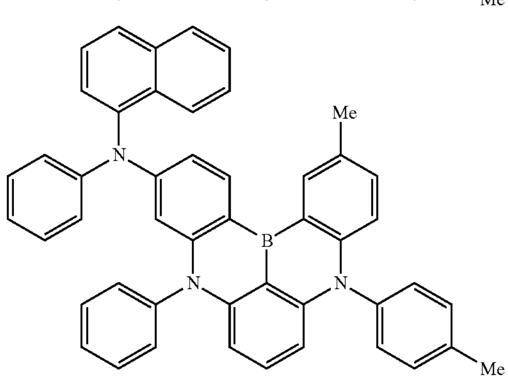
Me
N
B
N
N
Me
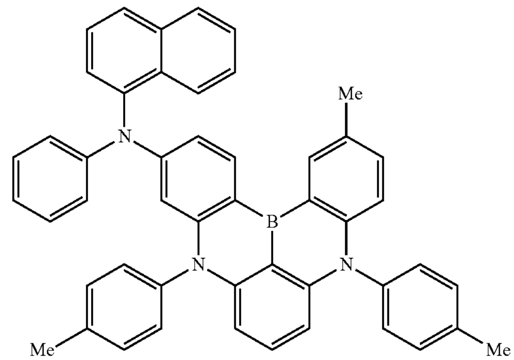
Me
N
B
N
N
Me
Me
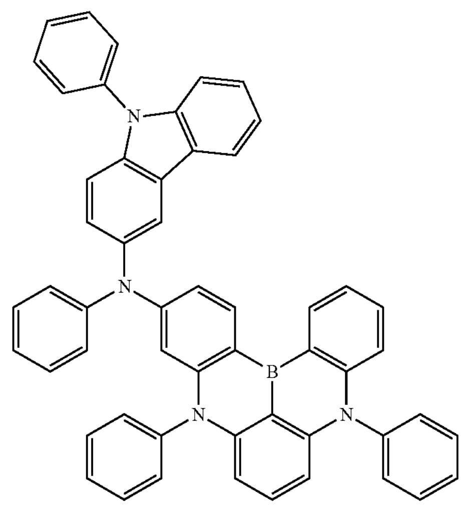
N
N
B
N
N
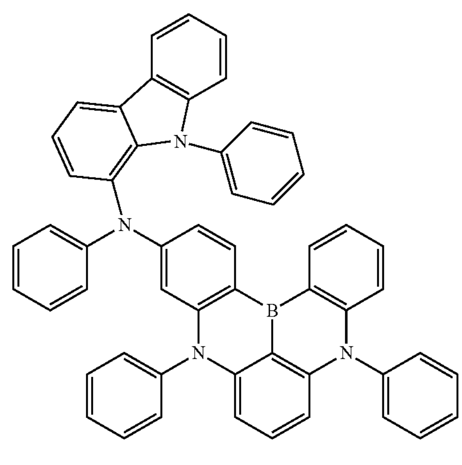
N
N
B
N
N

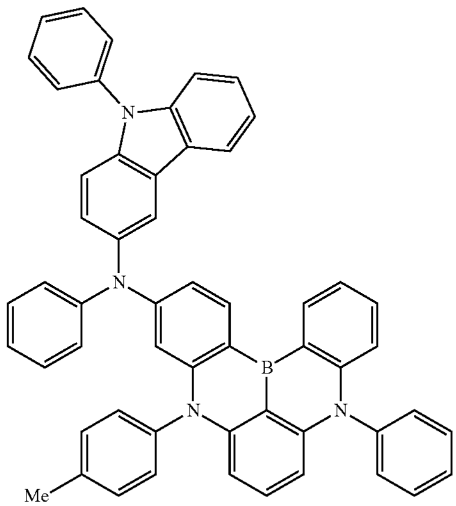
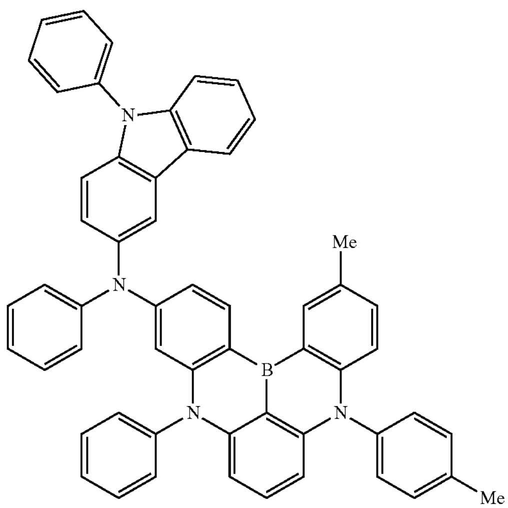
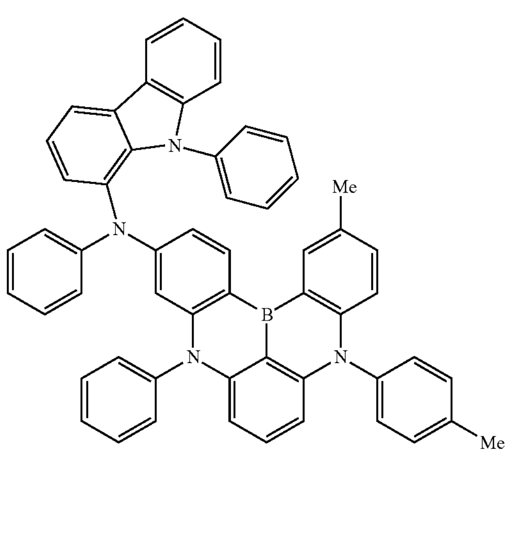
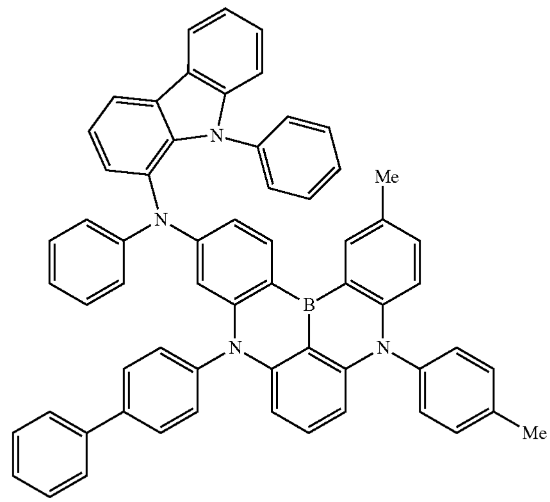
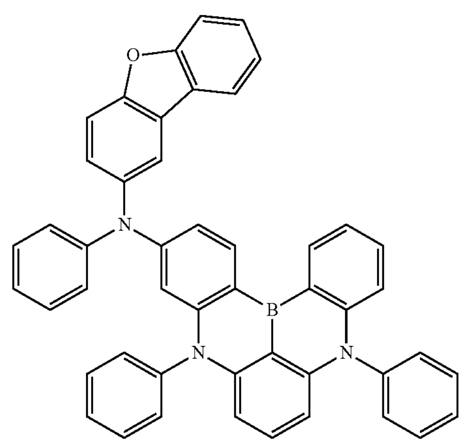
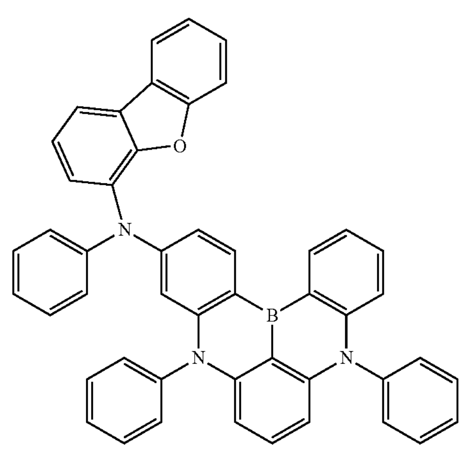

-continued
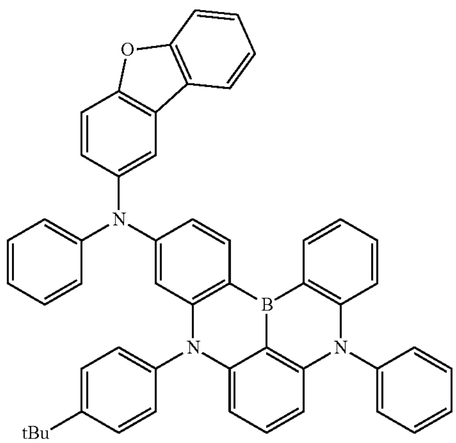
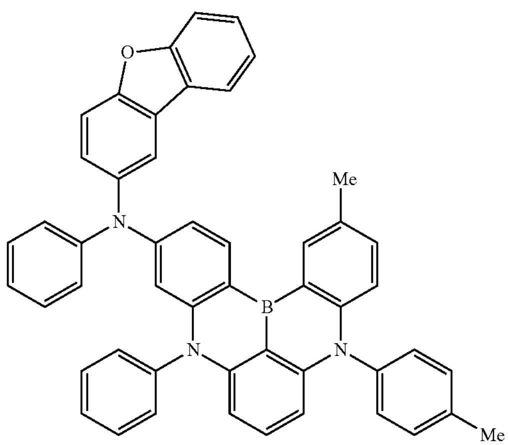
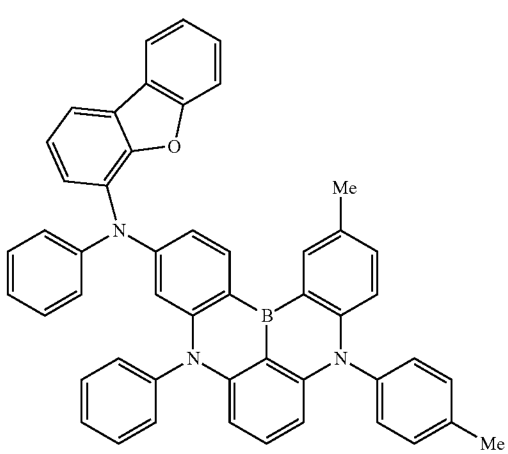
-continued
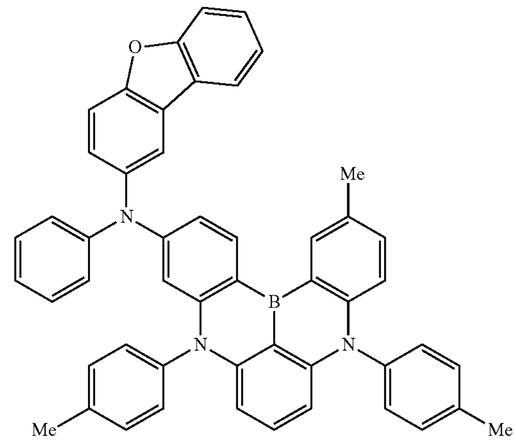
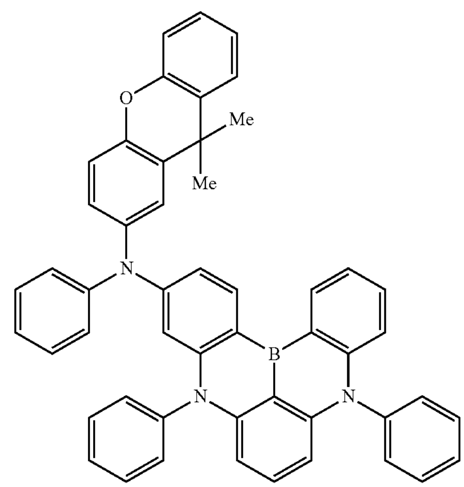
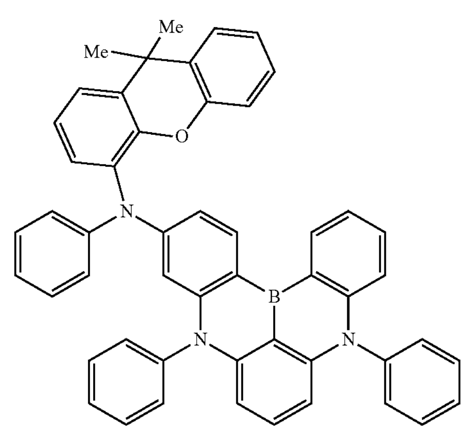

-continued
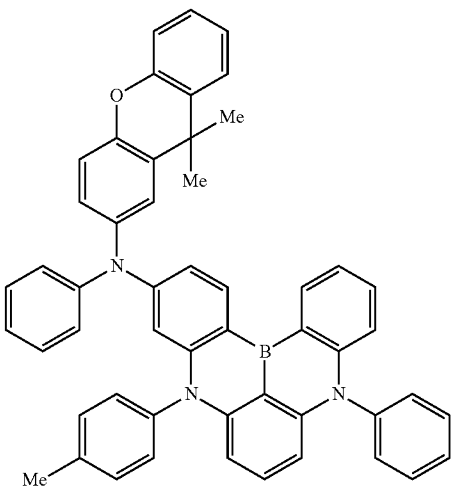
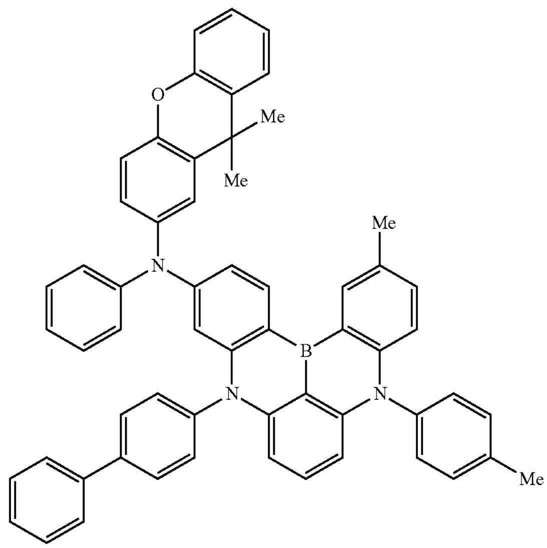
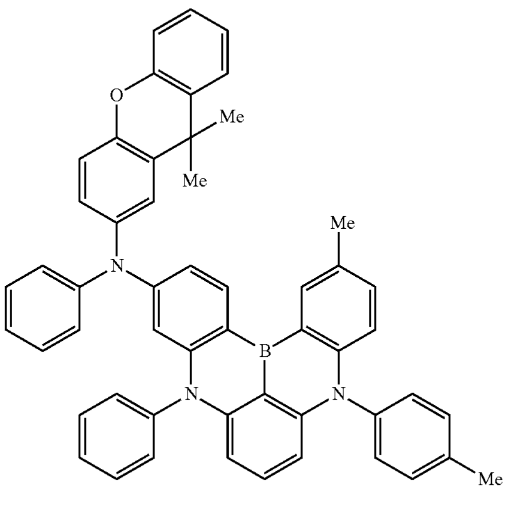
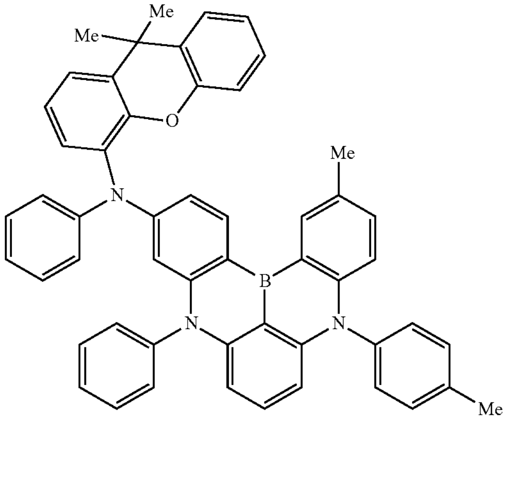
-continued
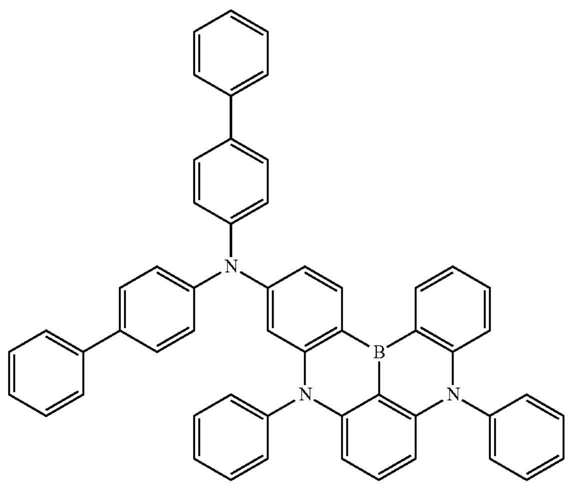
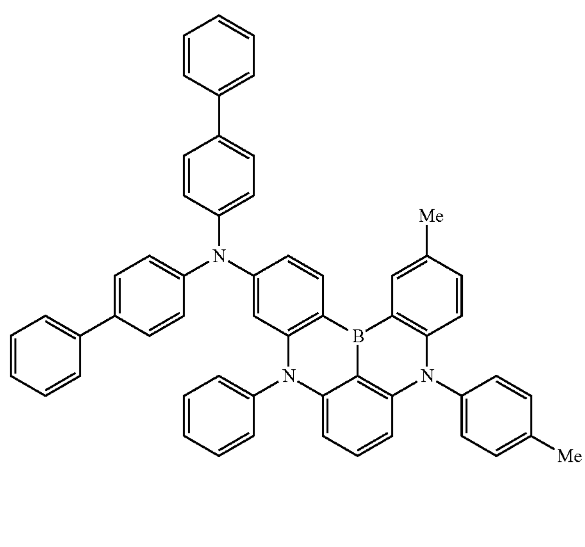

-continued
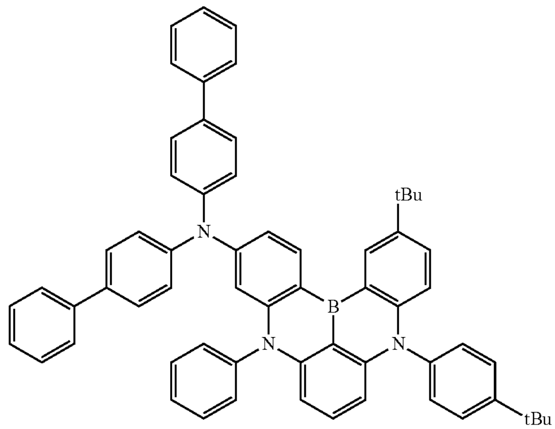
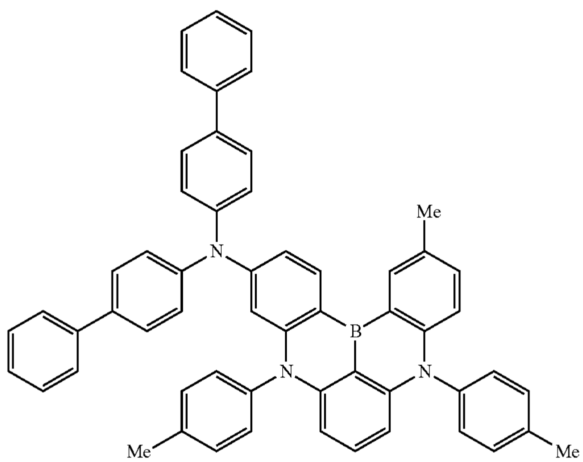
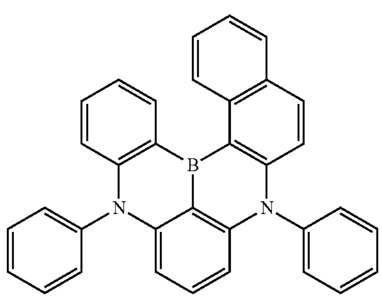
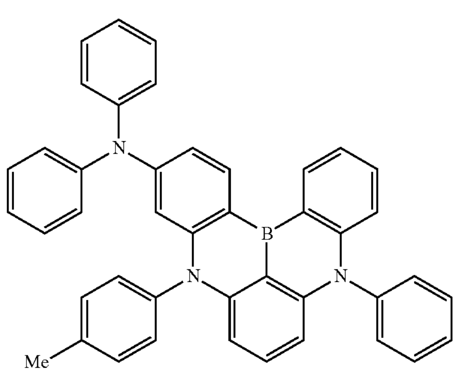
-continued
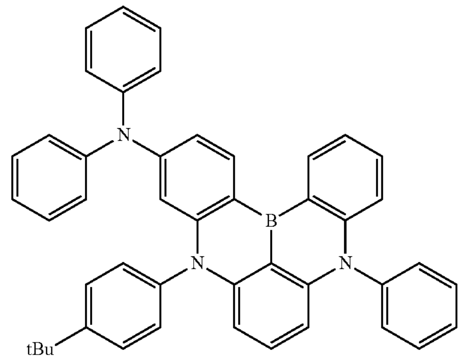
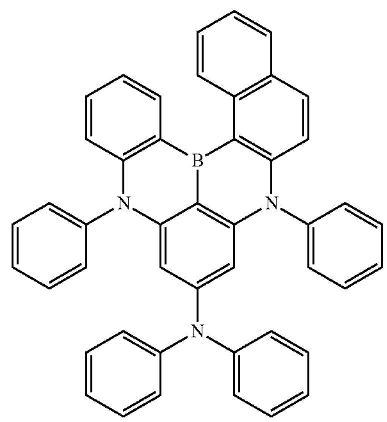
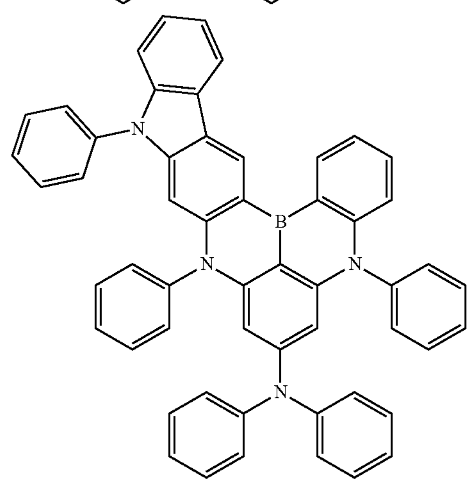
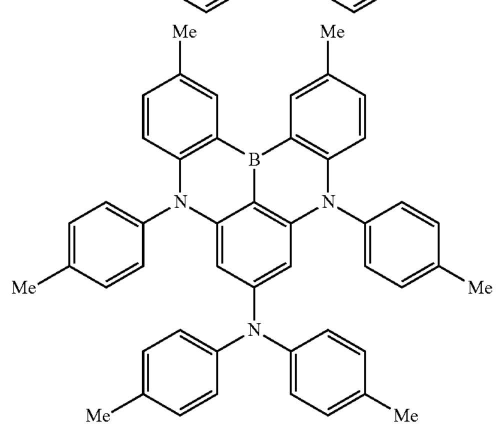

-continued
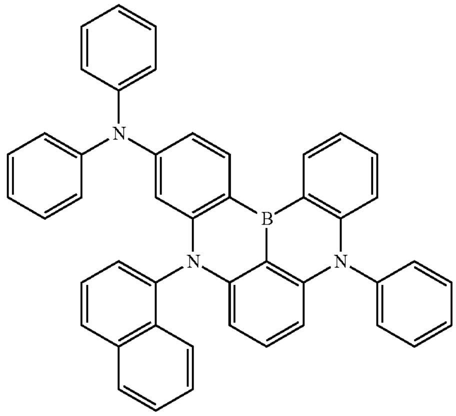
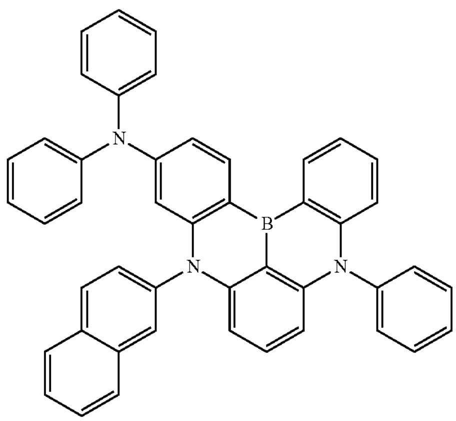
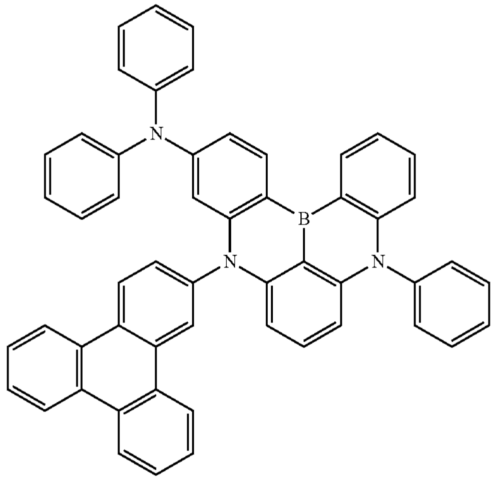
-continued
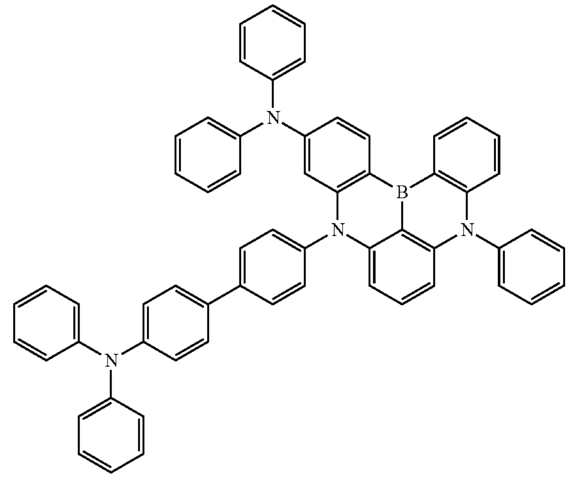
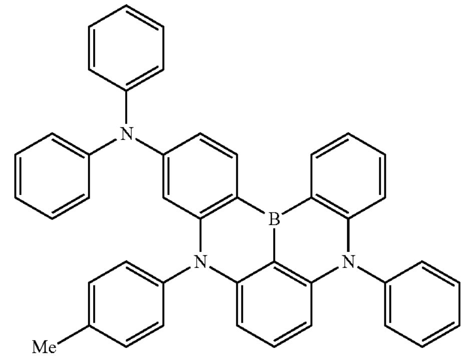
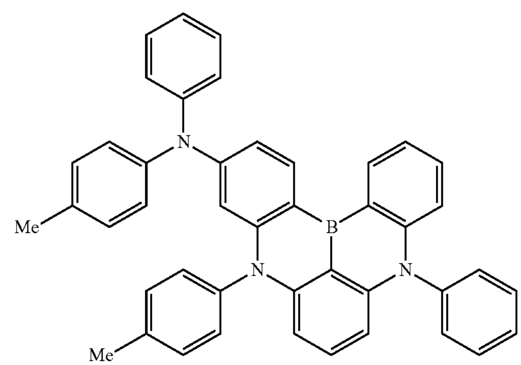
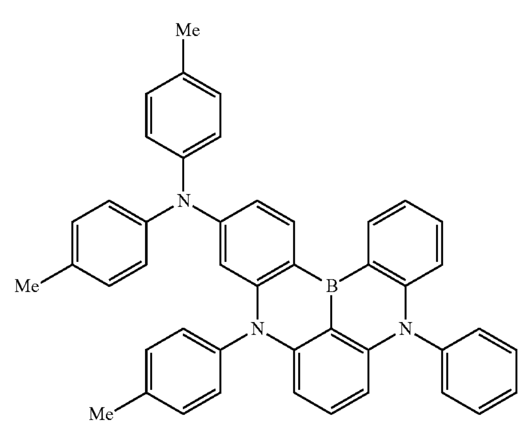

-continued
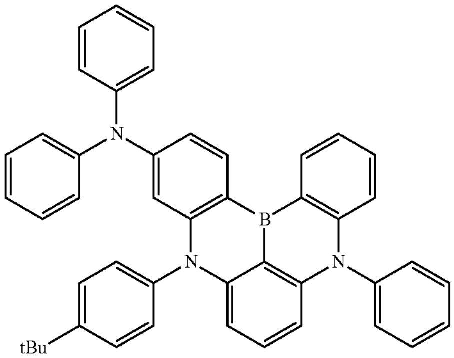
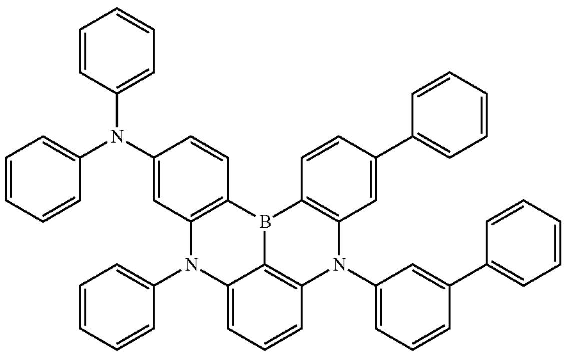
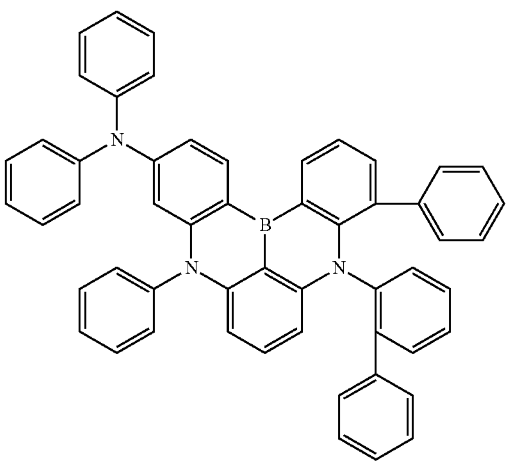
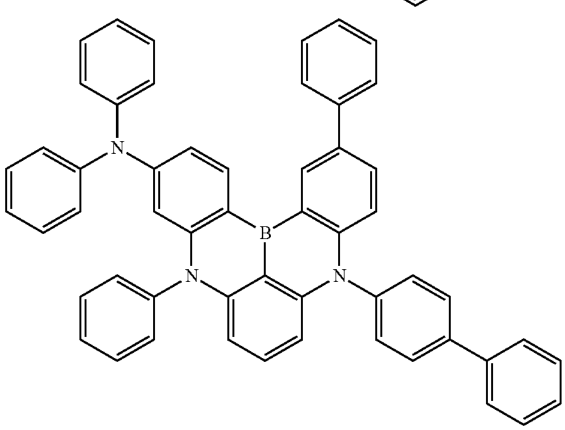
-continued
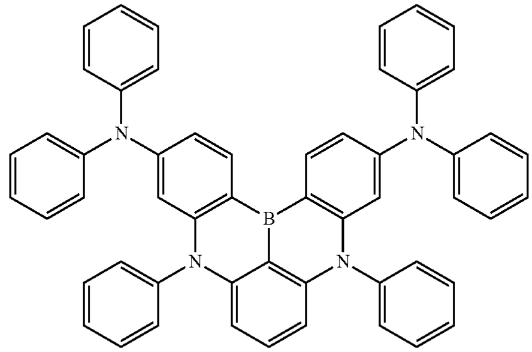
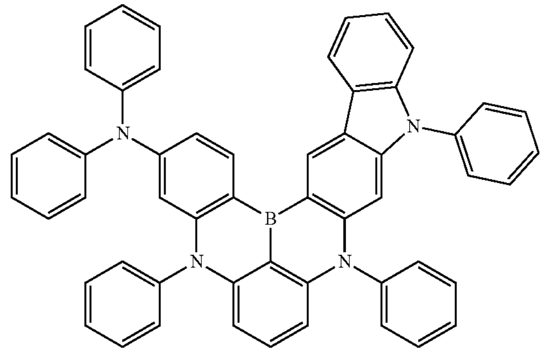
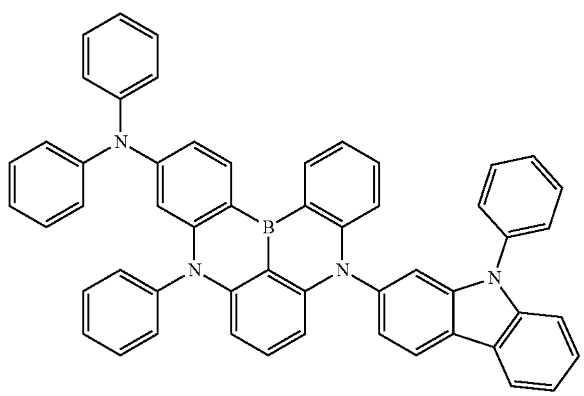
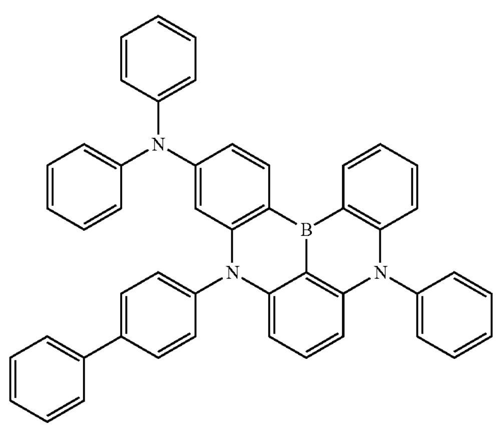

-continued
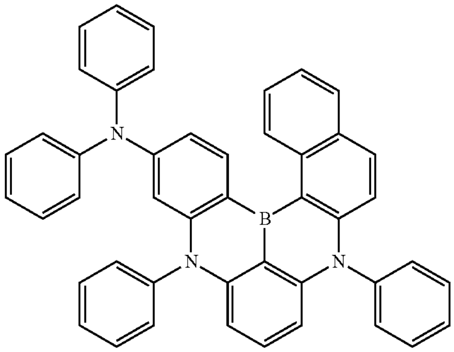
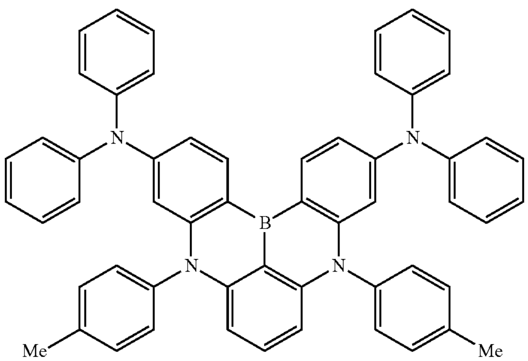
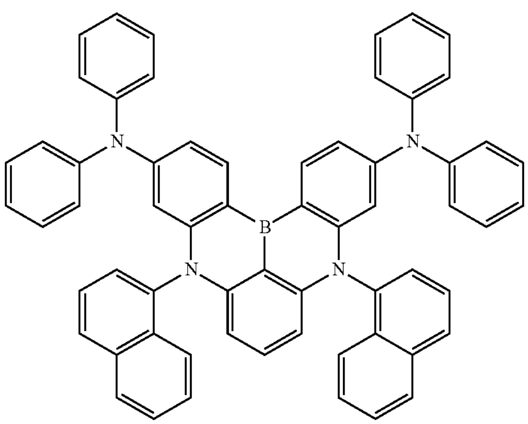
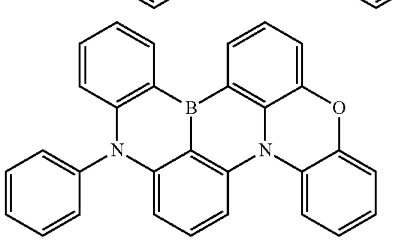
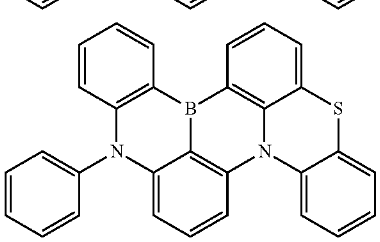
-continued
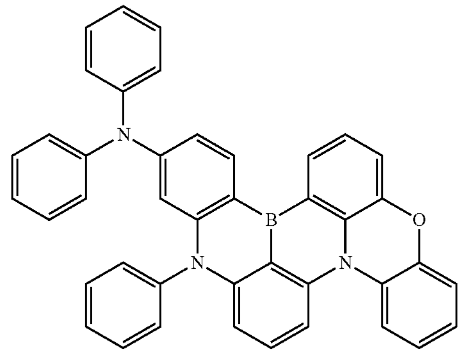
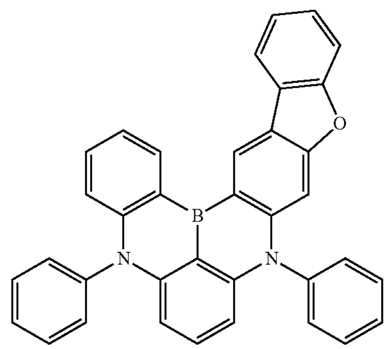
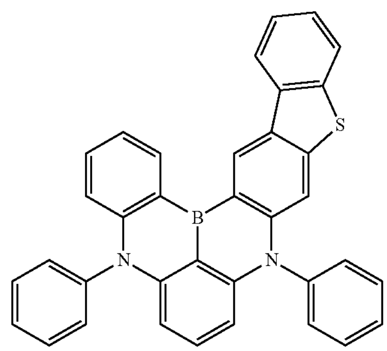
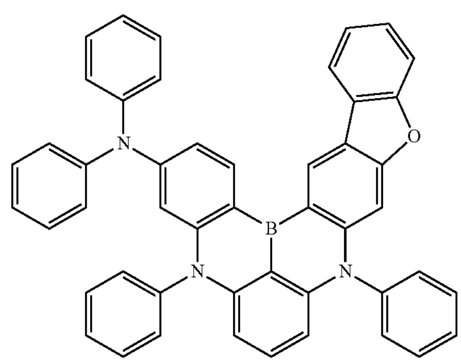
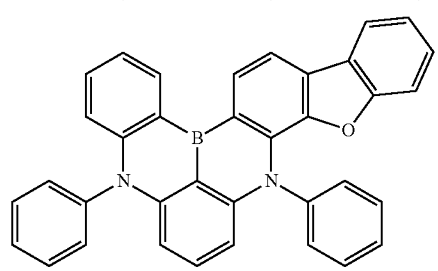

-continued
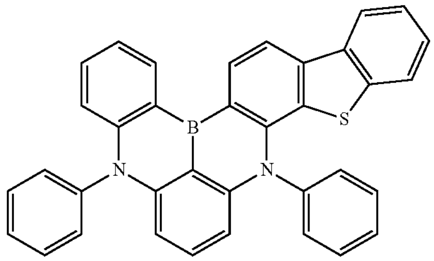
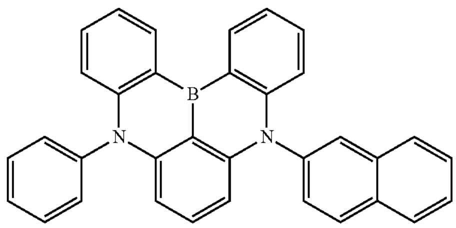
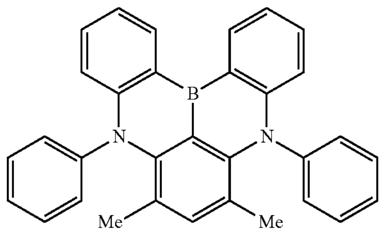
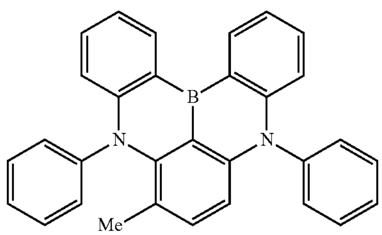
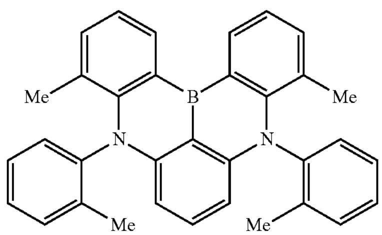
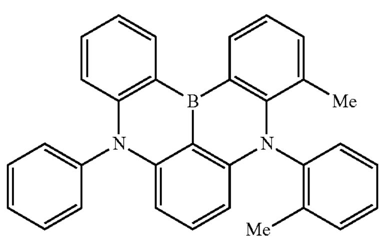
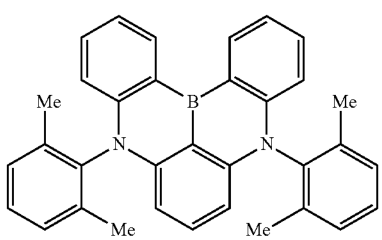
-continued
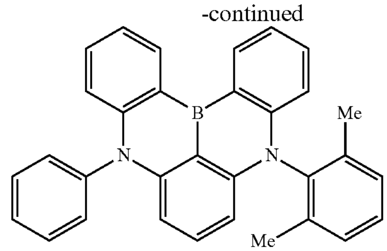
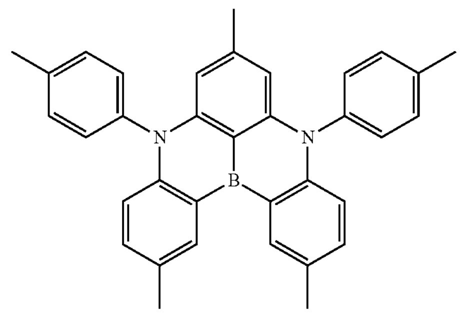
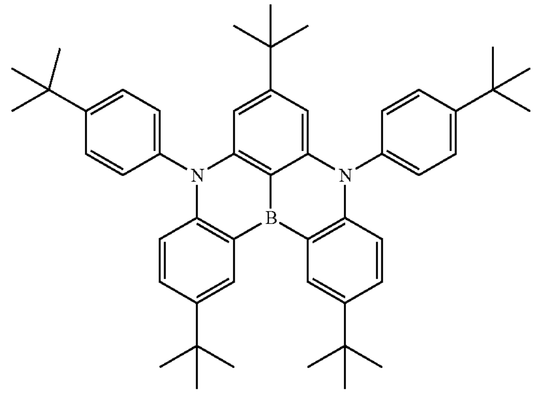
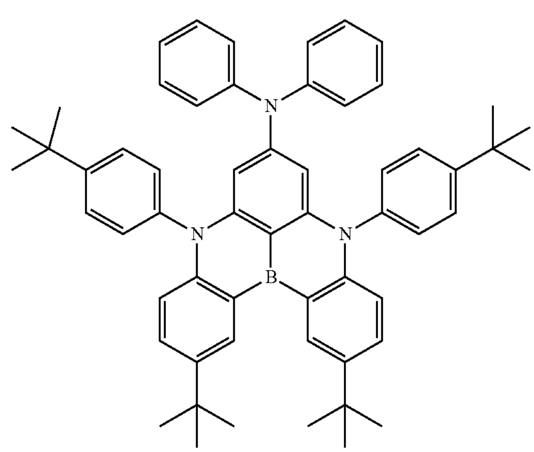

-continued
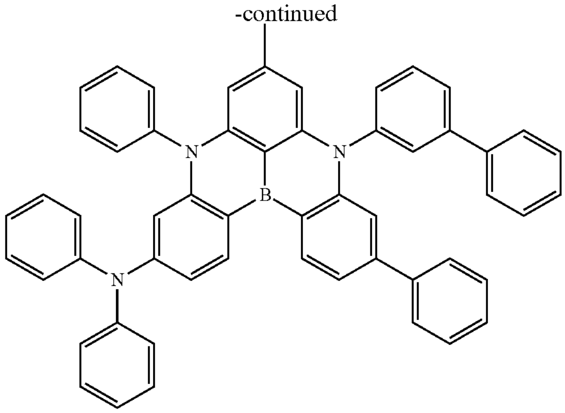
-continued
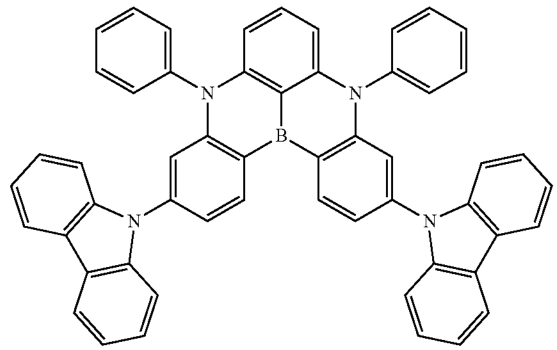 [SMILES: c1ccc(N2c3cc(-n4c5ccccc5c5ccccc54)ccc3B3c4ccc(-n5c6ccccc6c6ccccc65)cc4N(c4ccccc4)c4cccc2c43)cc1]
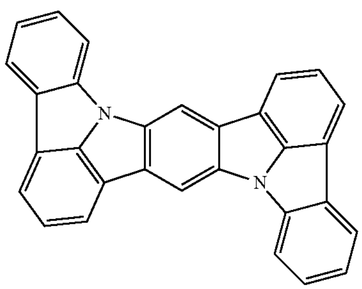
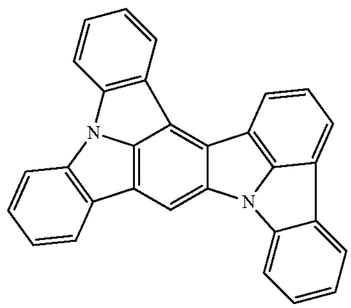
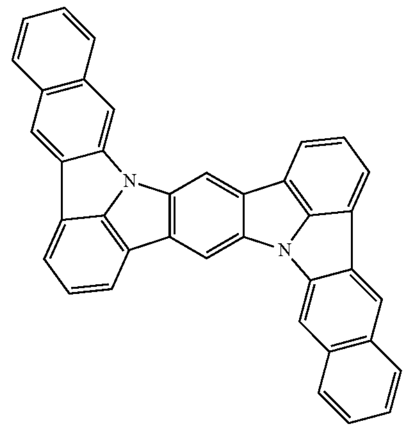
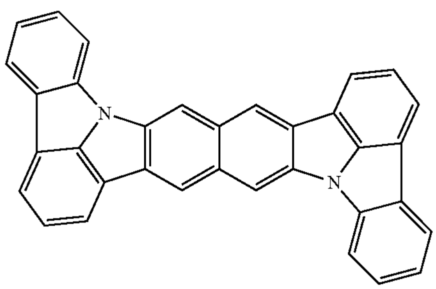
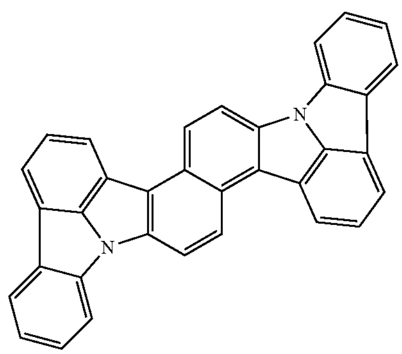
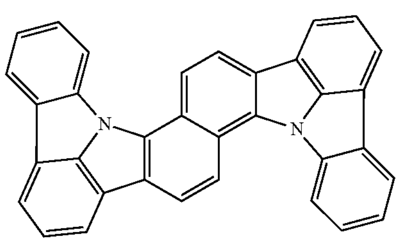
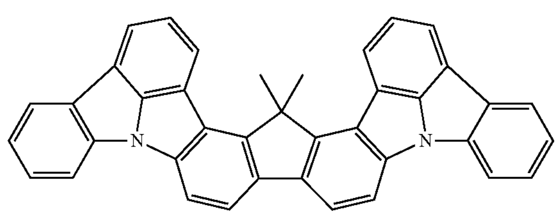

-continued
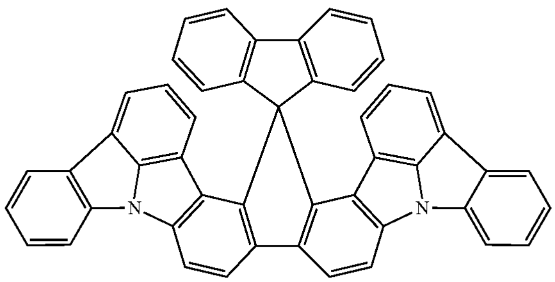
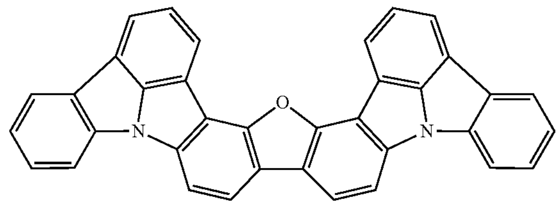
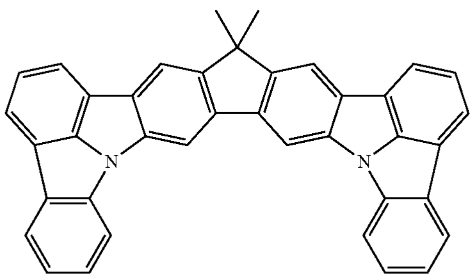
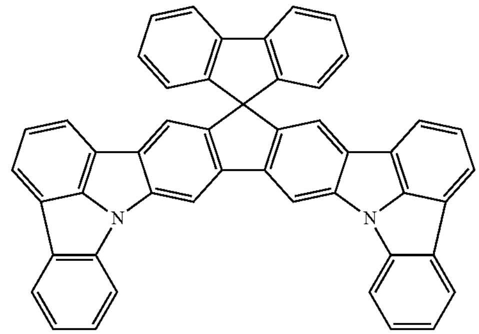
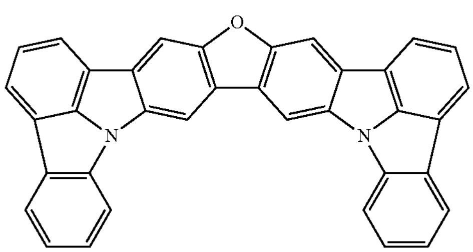
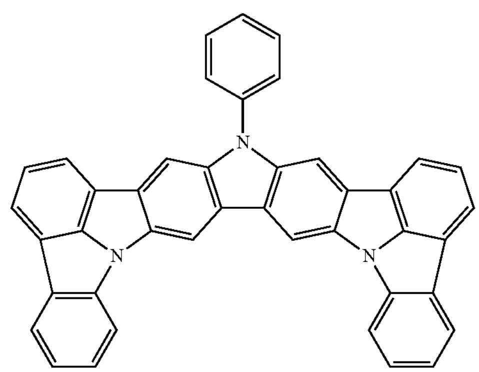
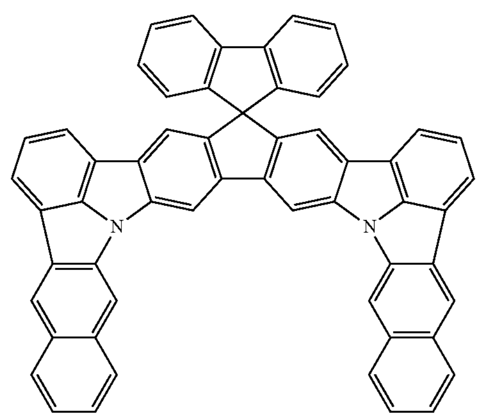
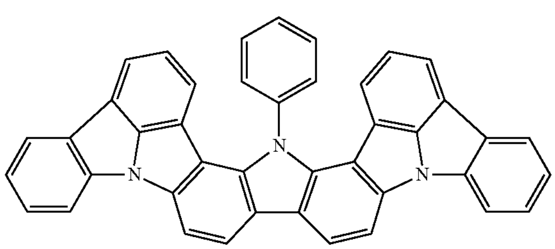
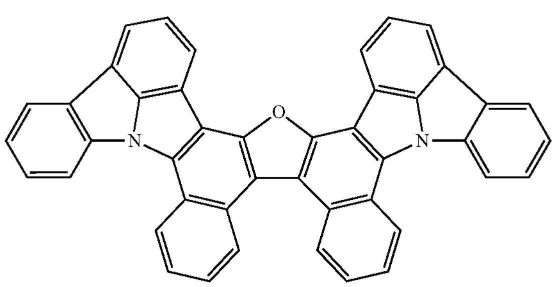

-continued
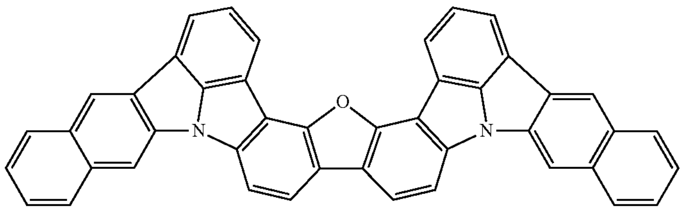
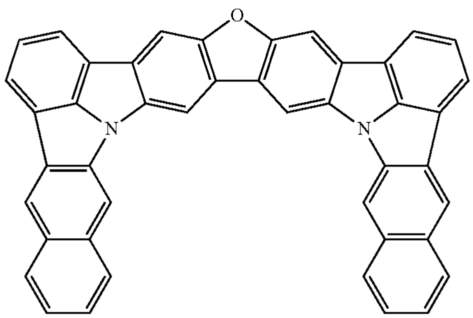
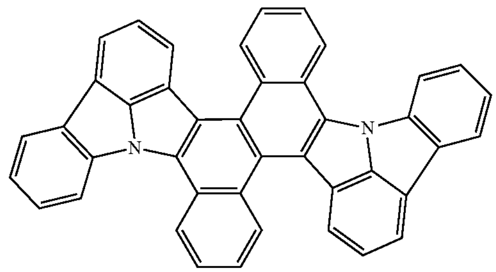
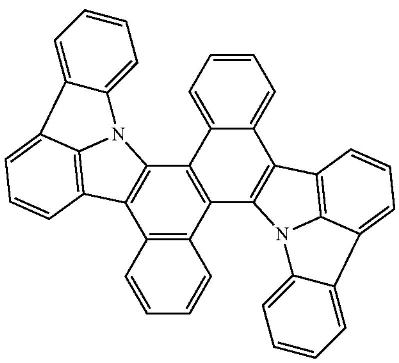
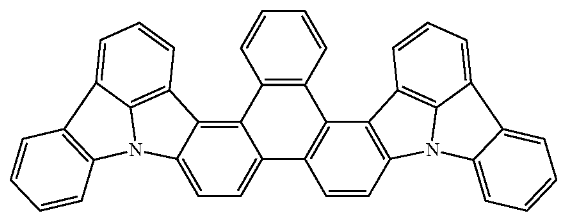
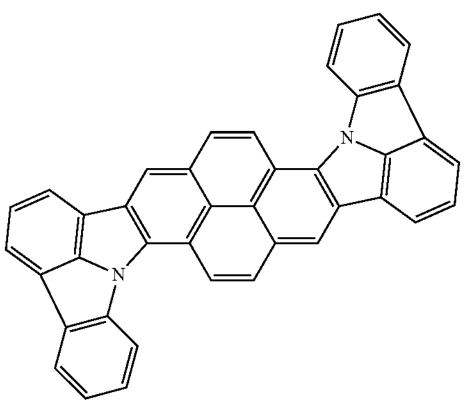
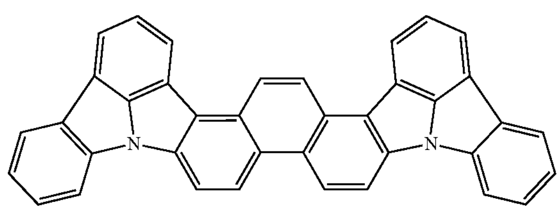
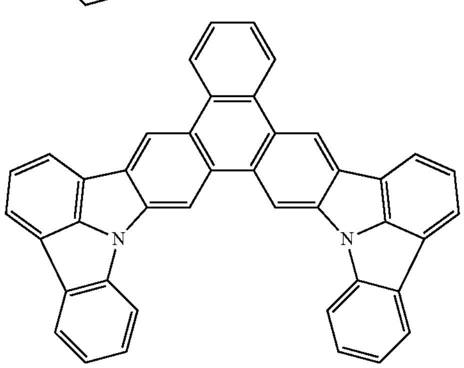
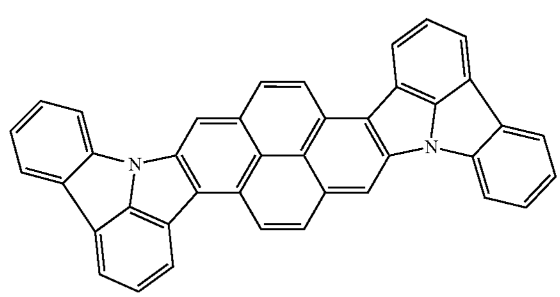

-continued
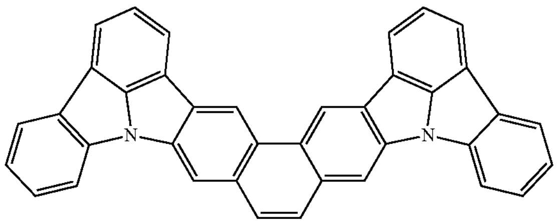
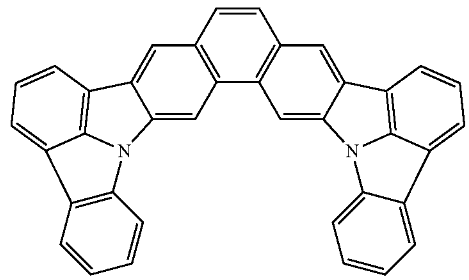
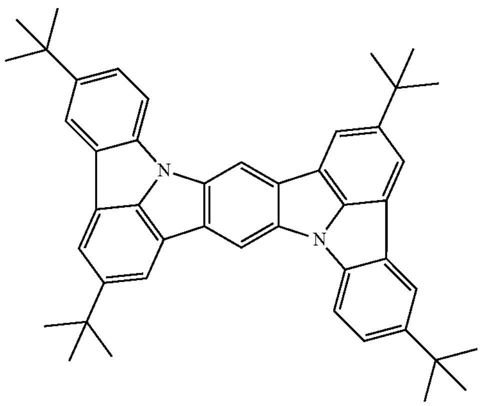
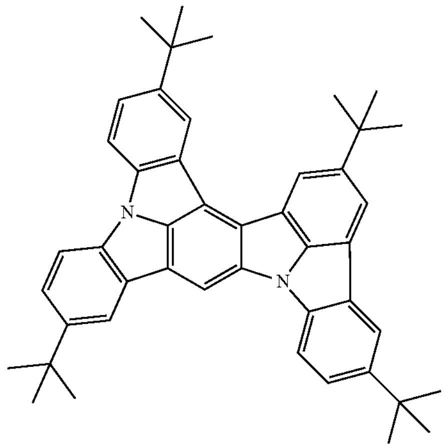
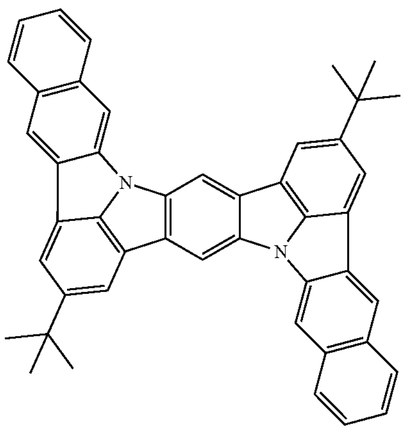
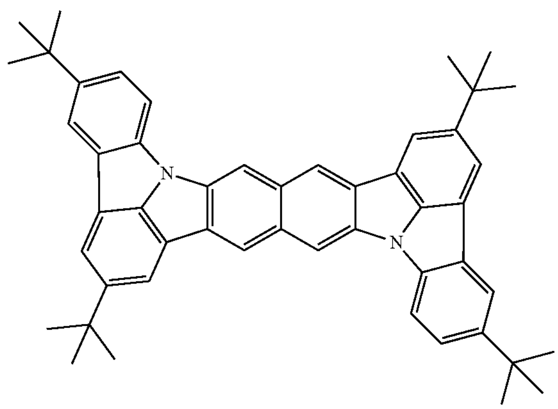
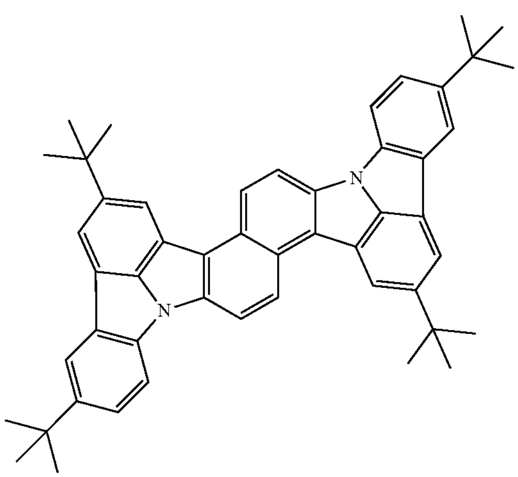
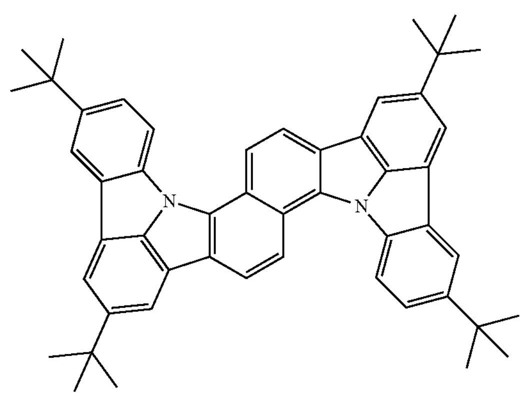

-continued
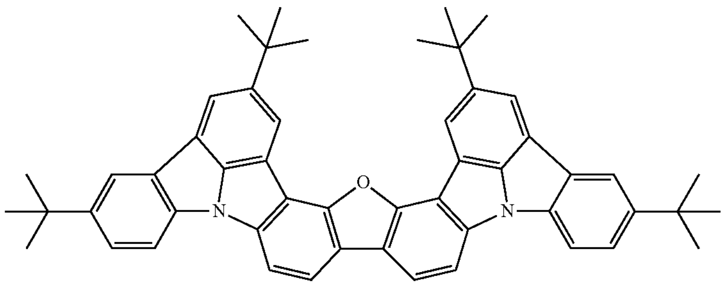
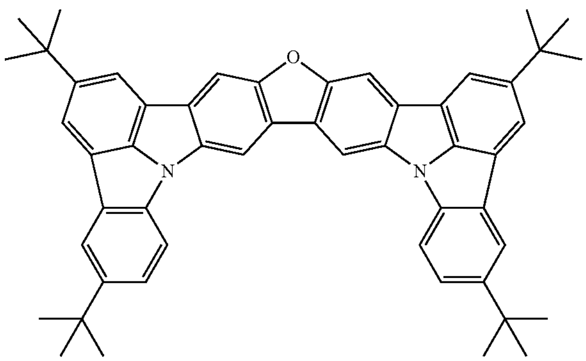
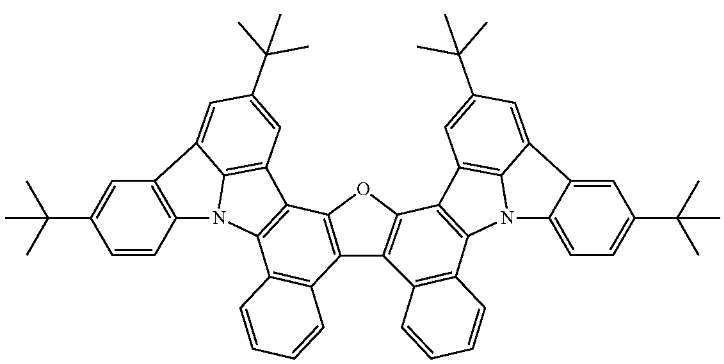
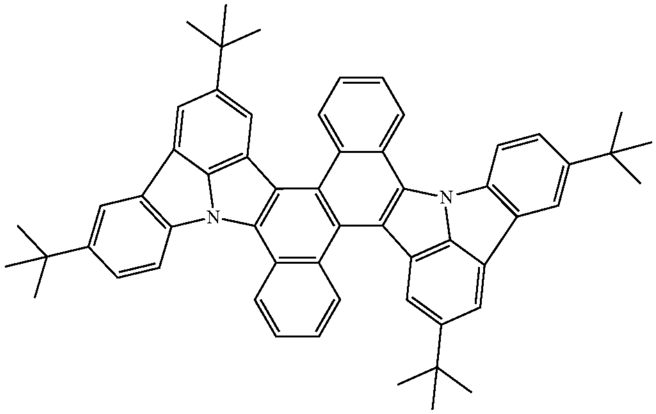

-continued
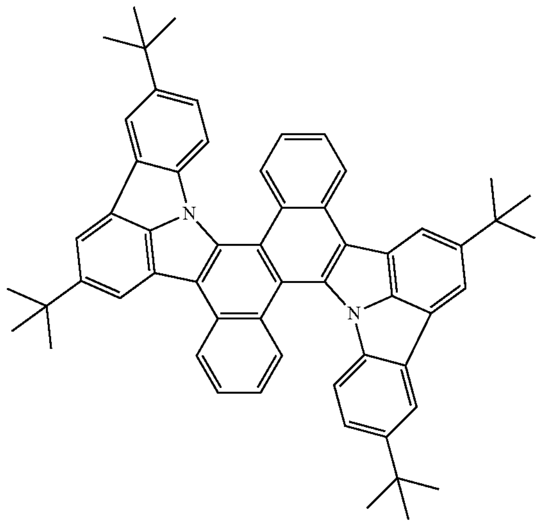
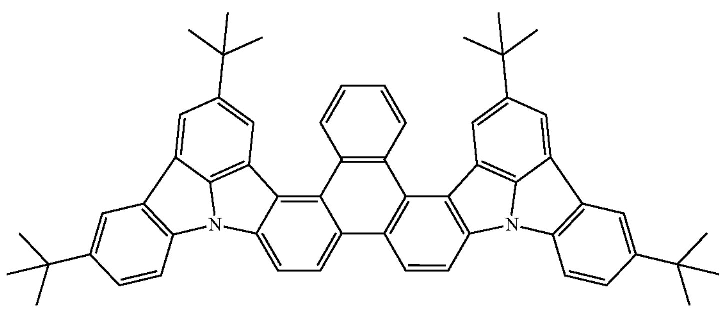
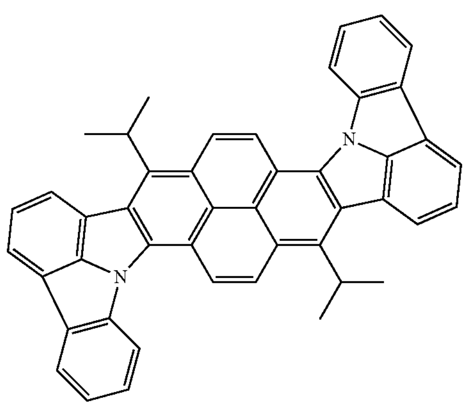
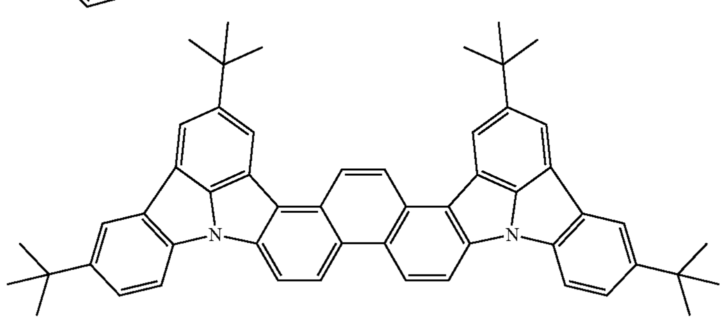

-continued
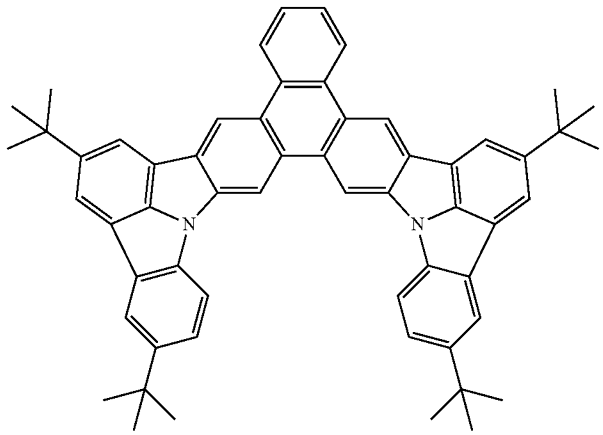
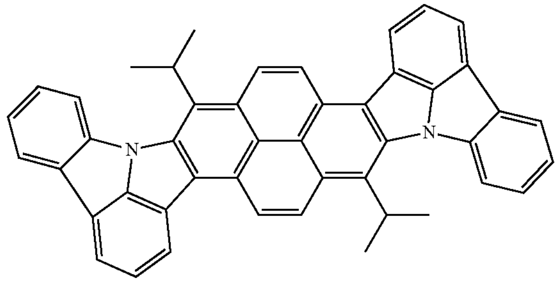
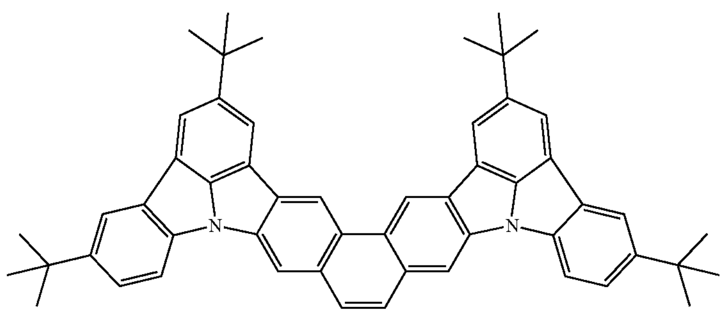
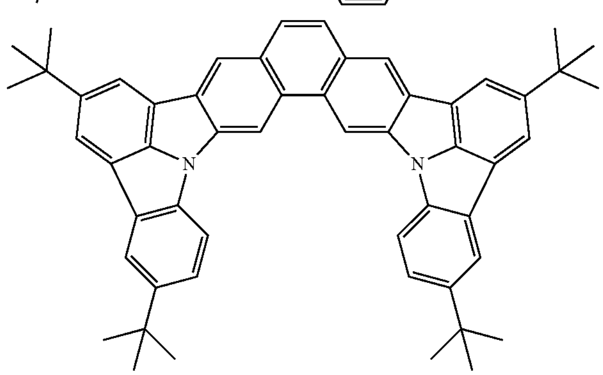
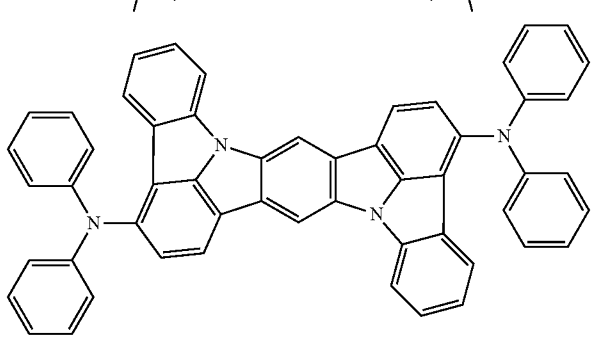

-continued
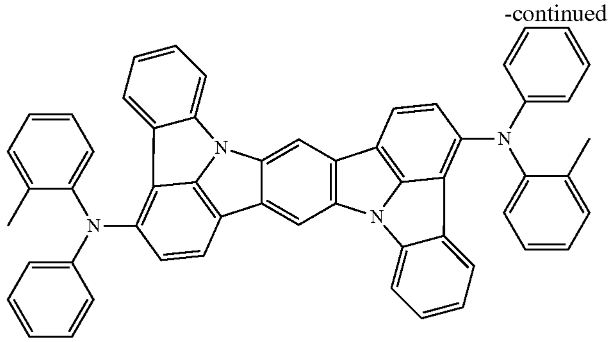
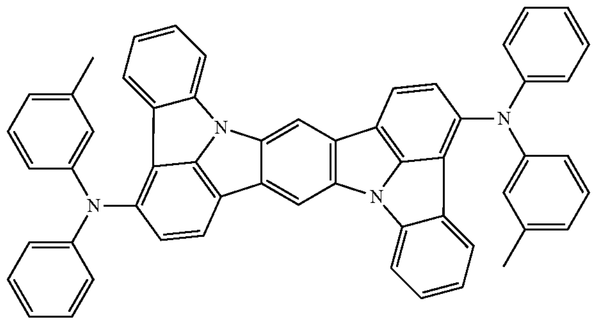
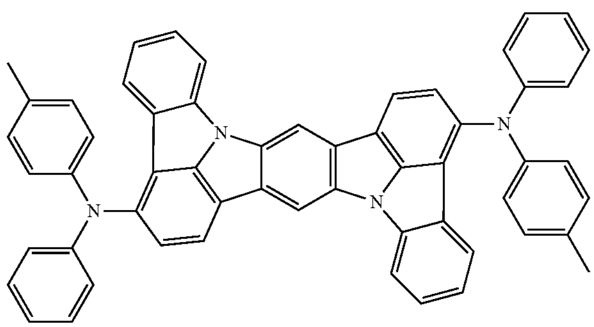
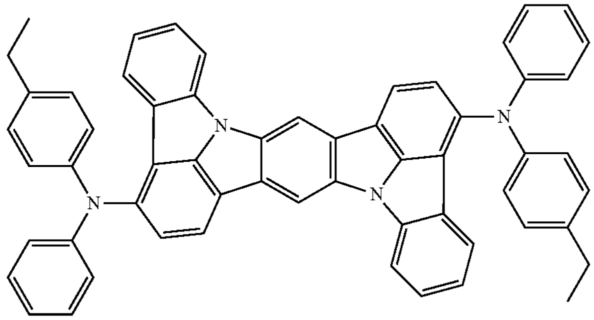
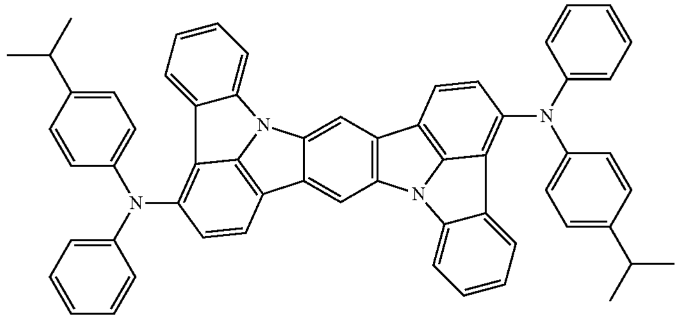

-continued
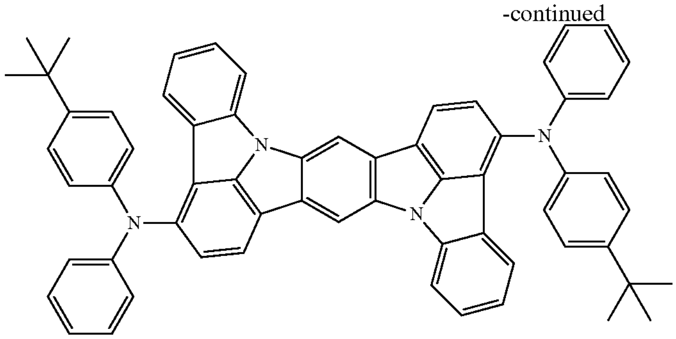
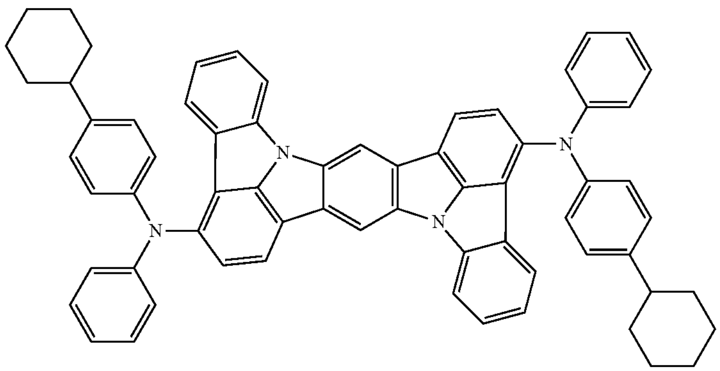
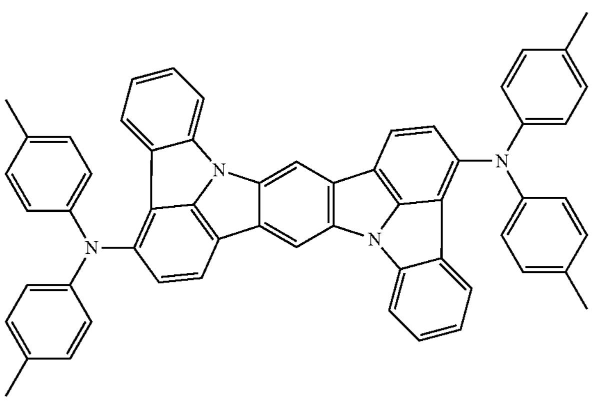
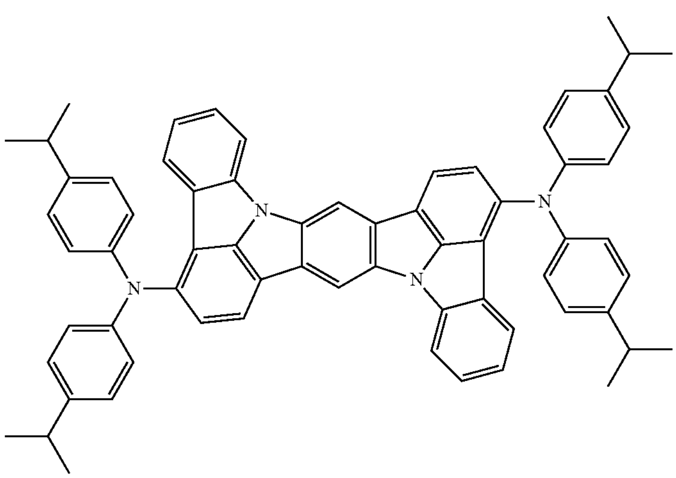

-continued
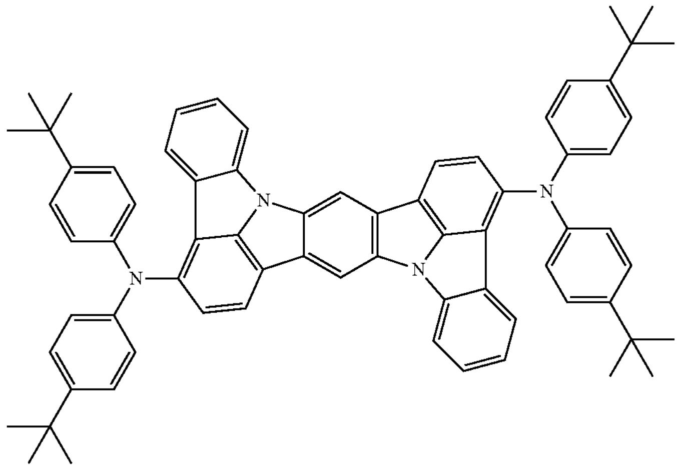
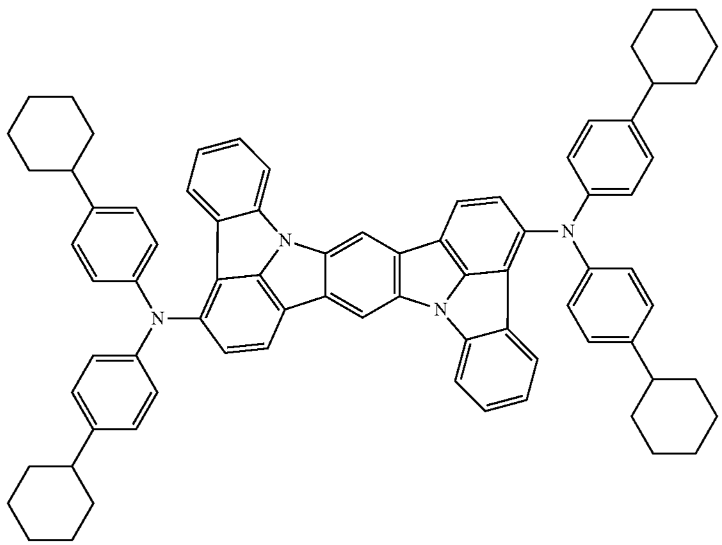
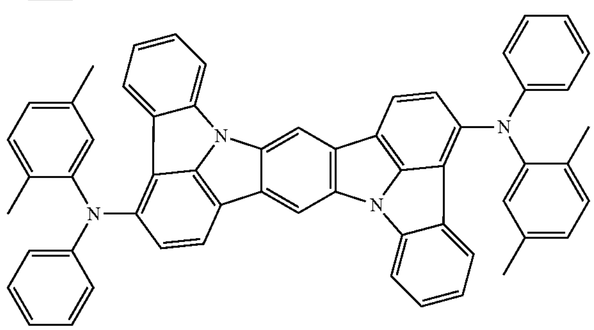
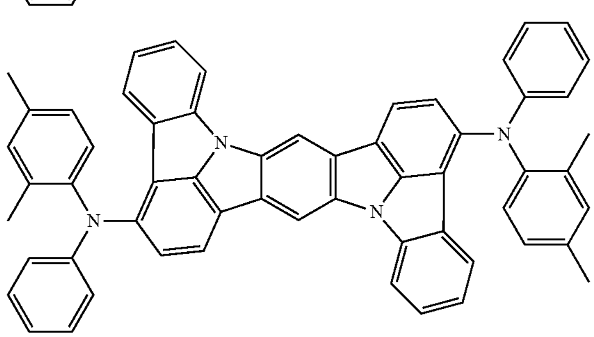

-continued
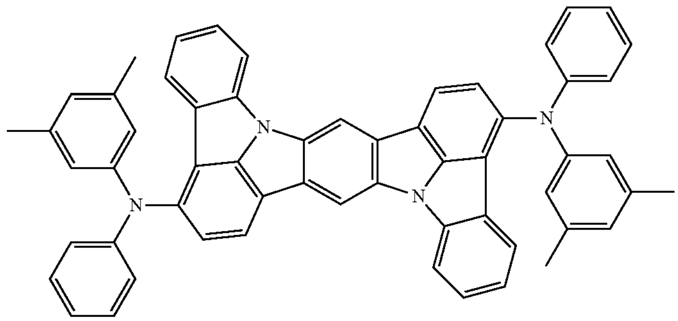
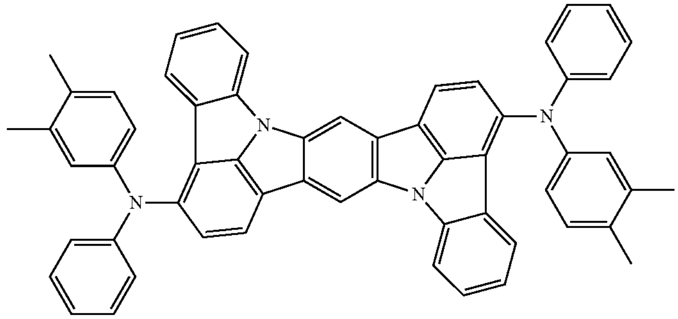
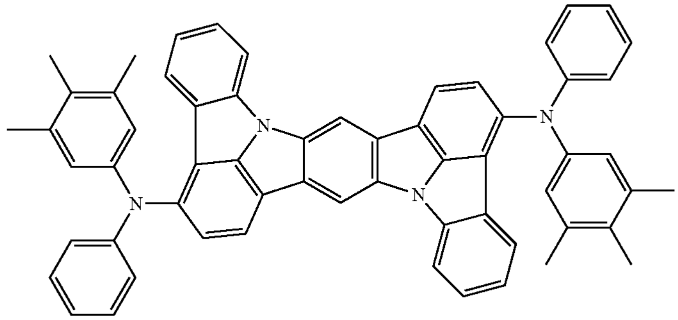
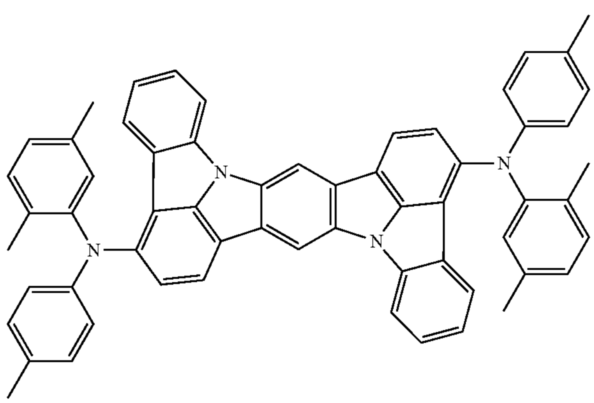
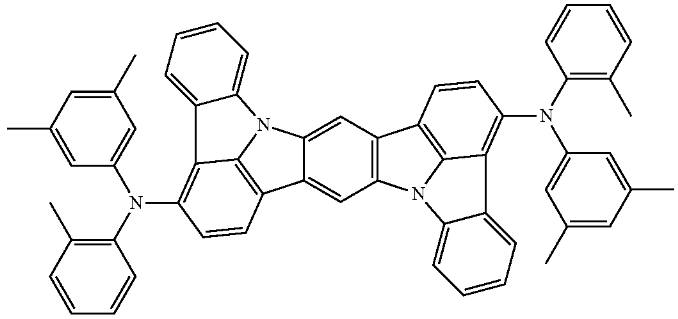

-continued
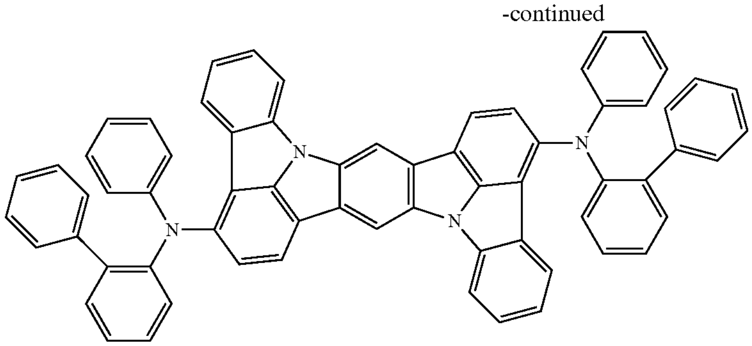
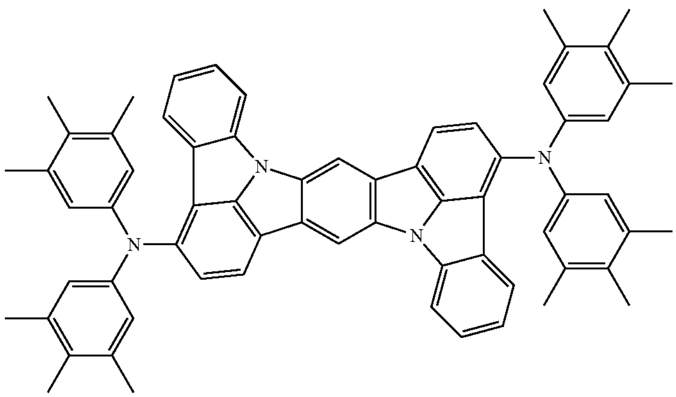
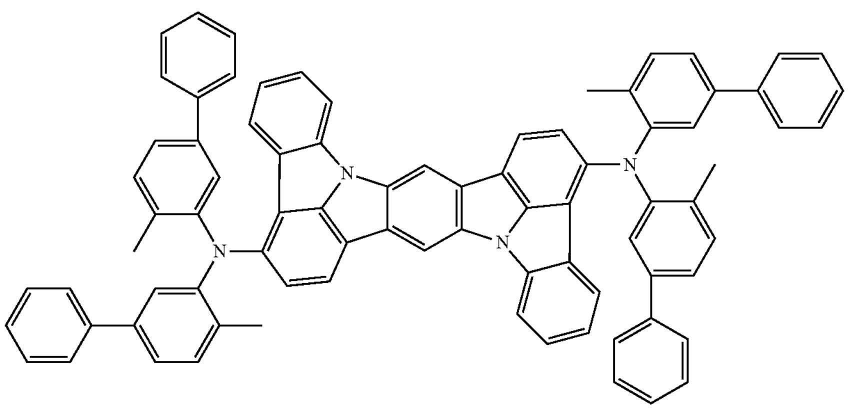
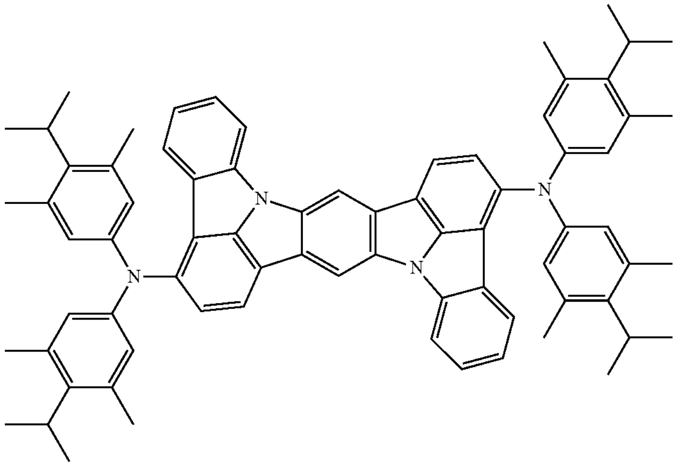

-continued
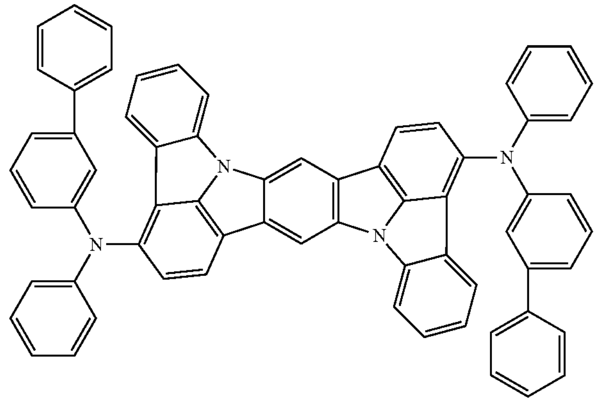
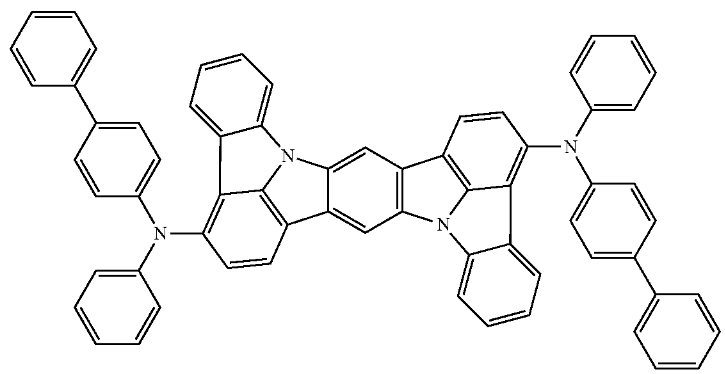
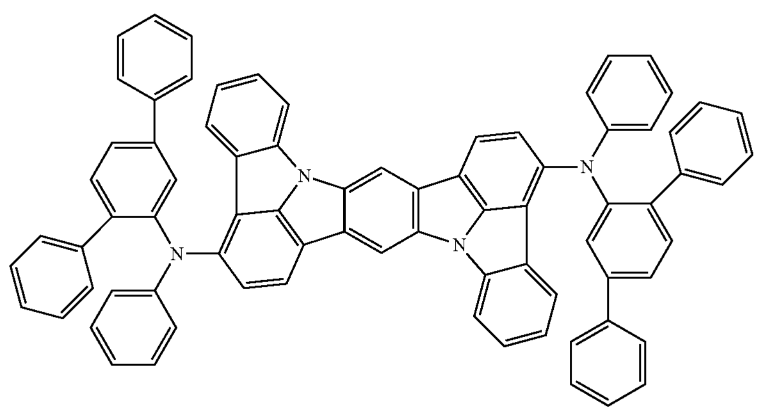
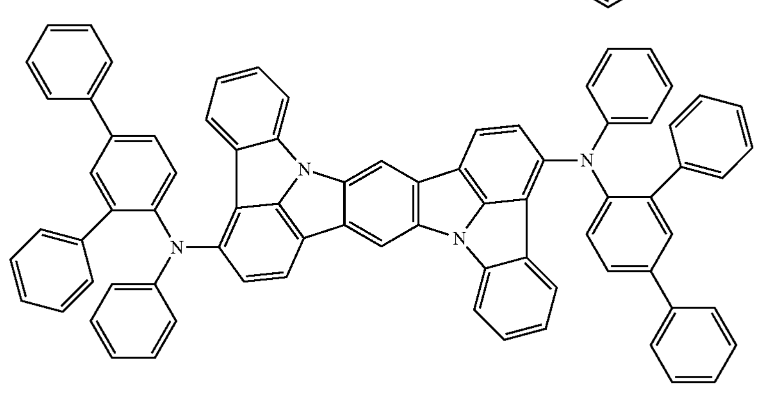

-continued
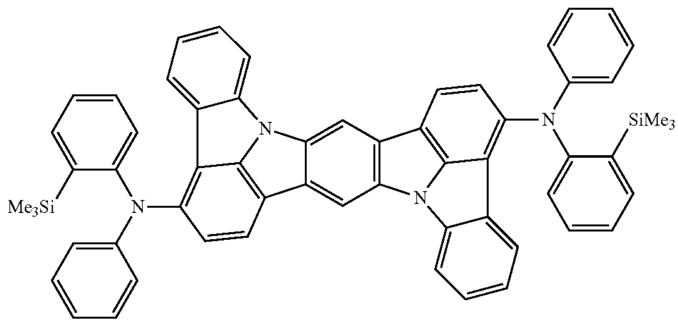
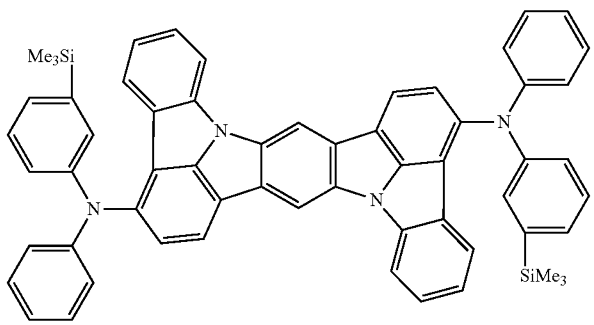
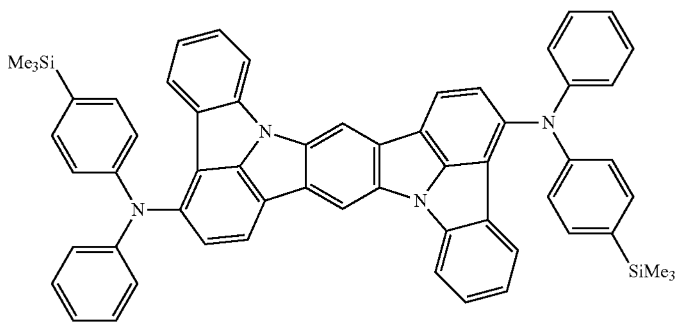
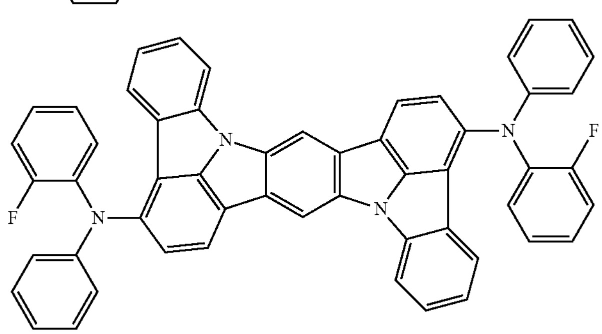
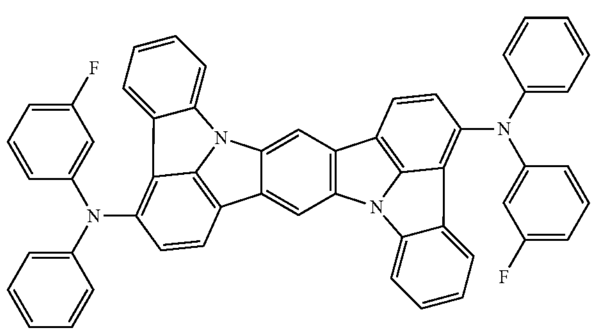

-continued
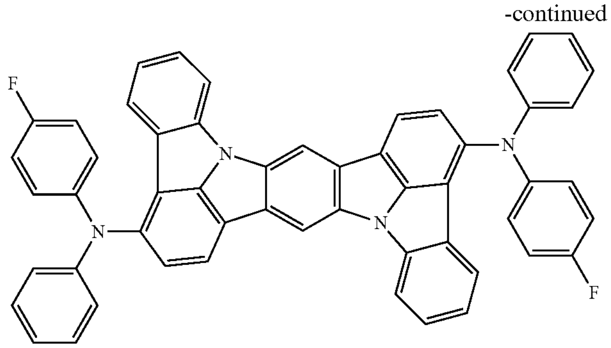
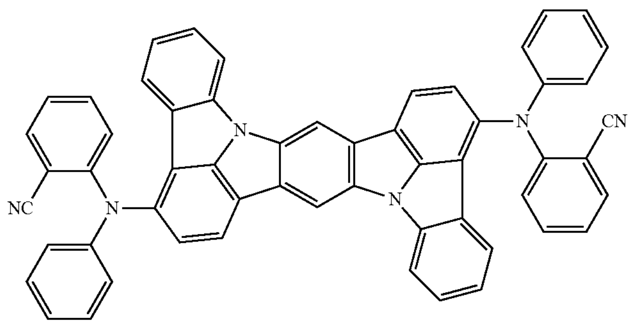
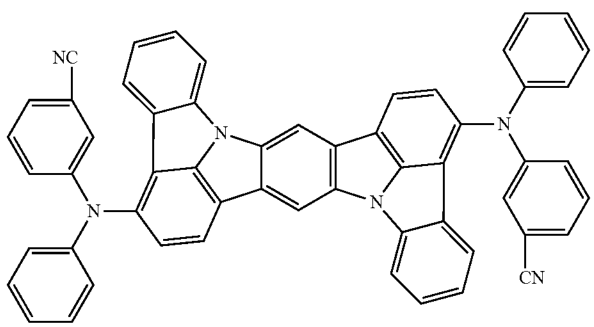
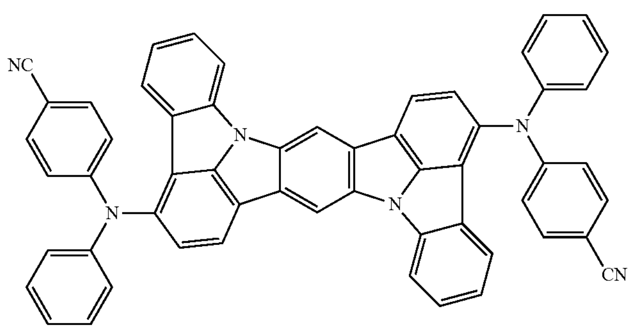
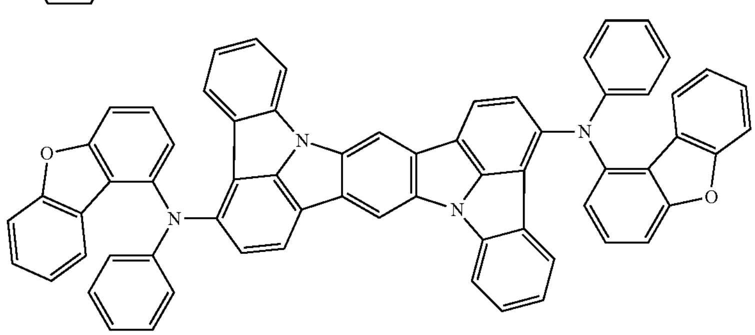

-continued
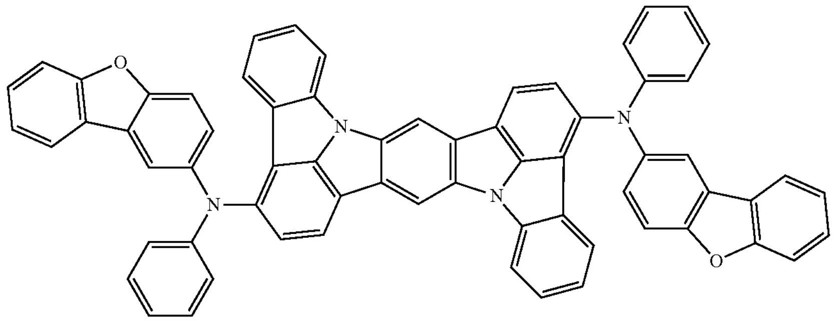
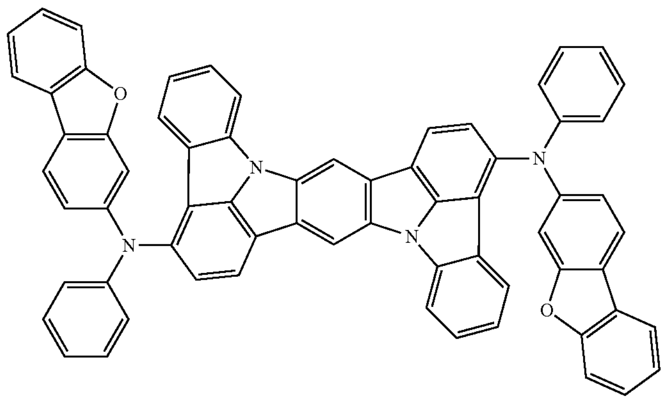
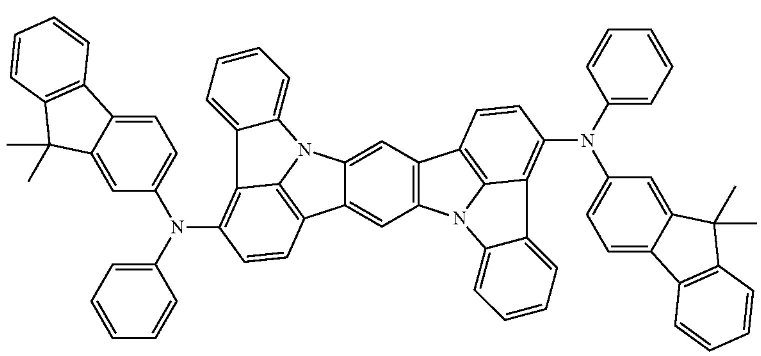
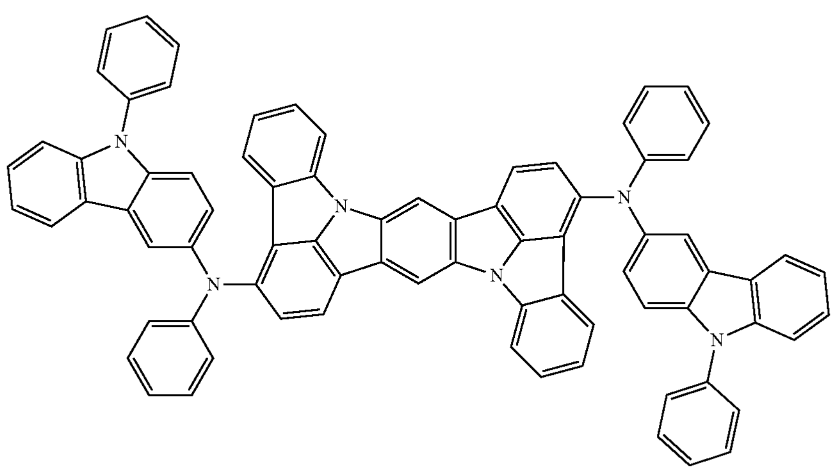

-continued
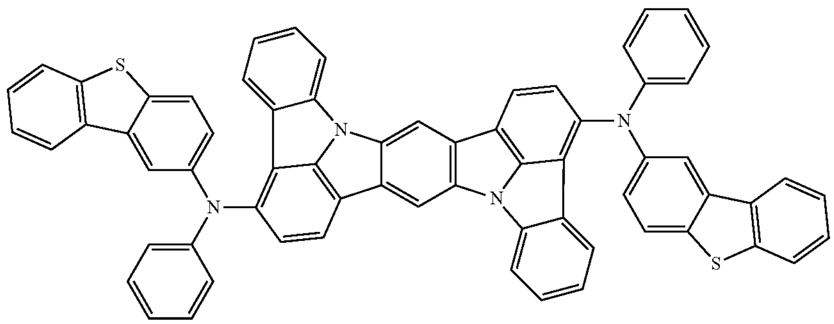
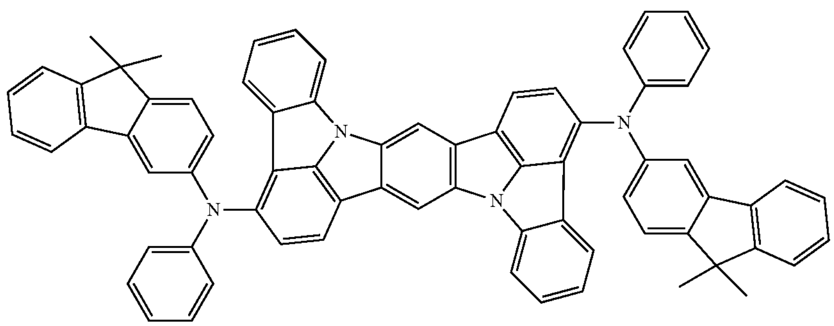
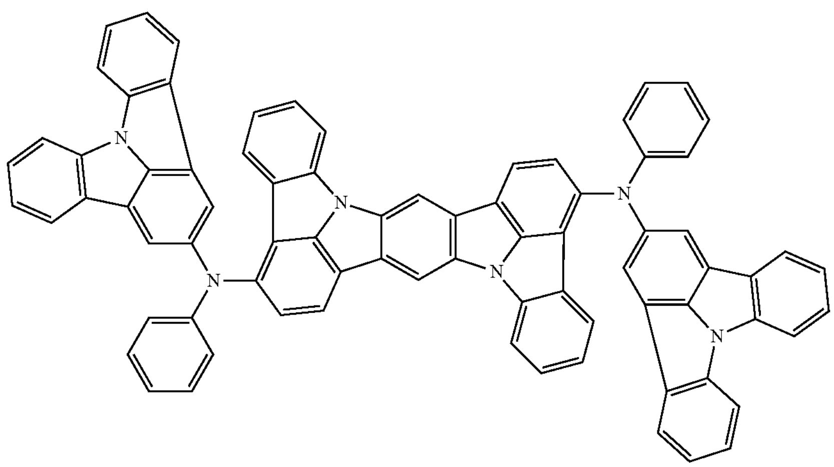
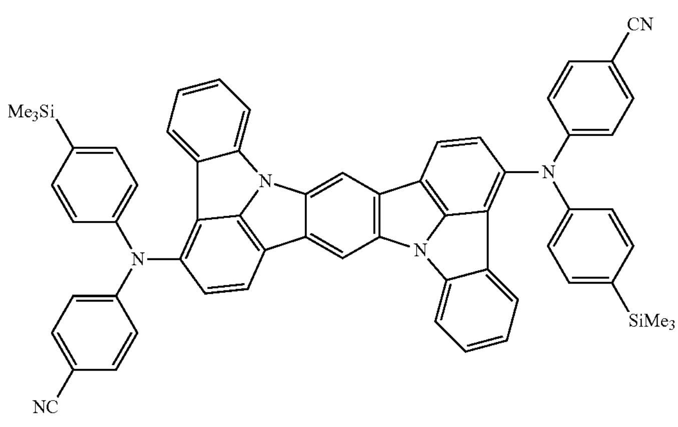

-continued
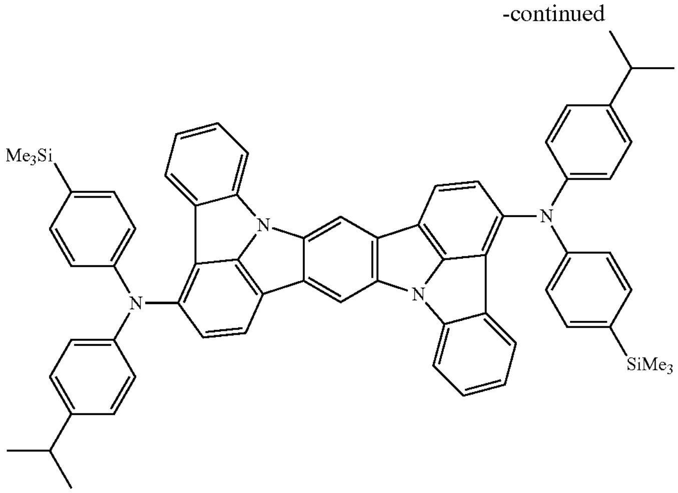
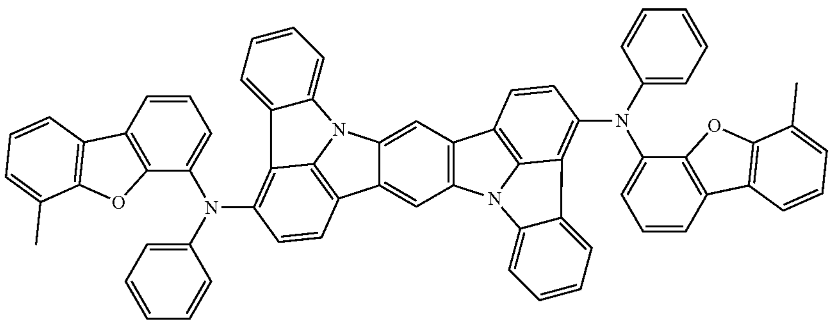
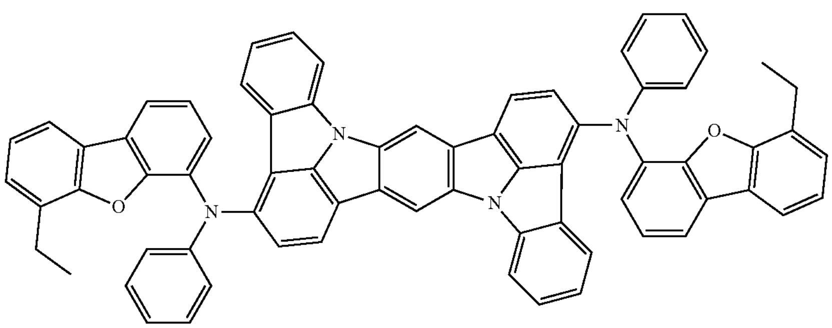
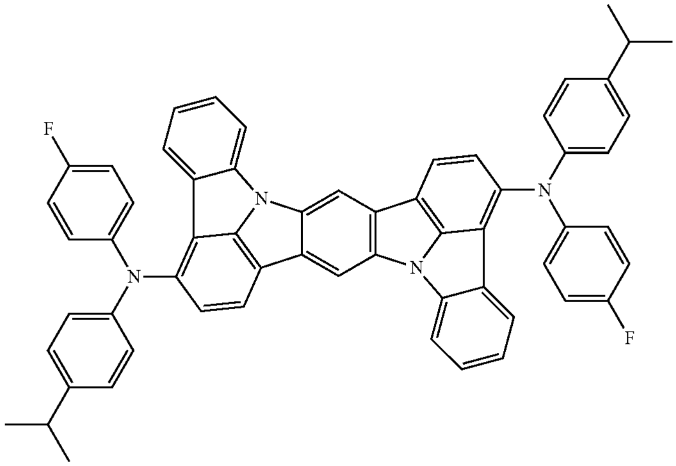

-continued
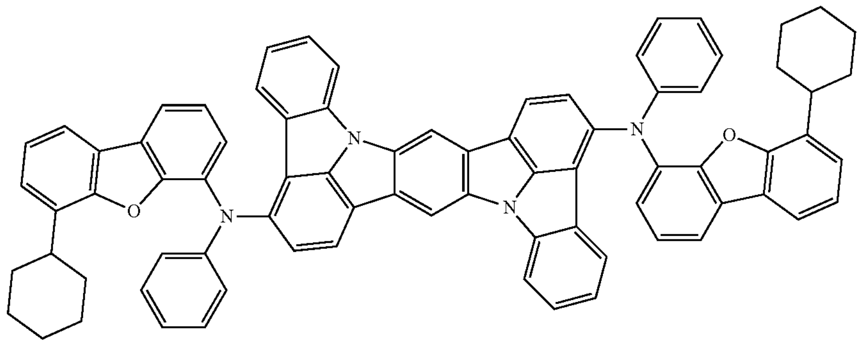
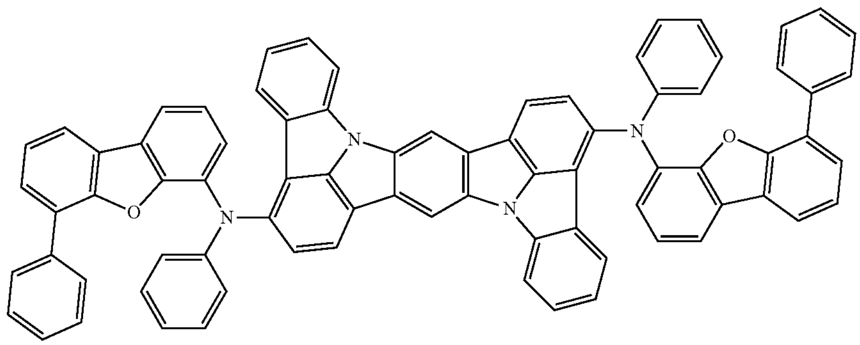
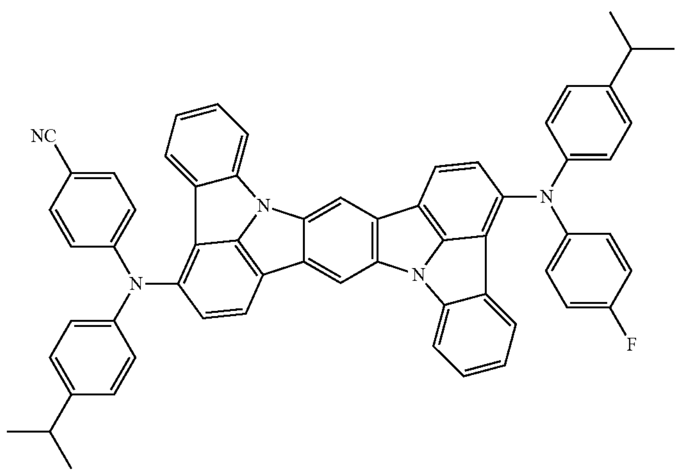
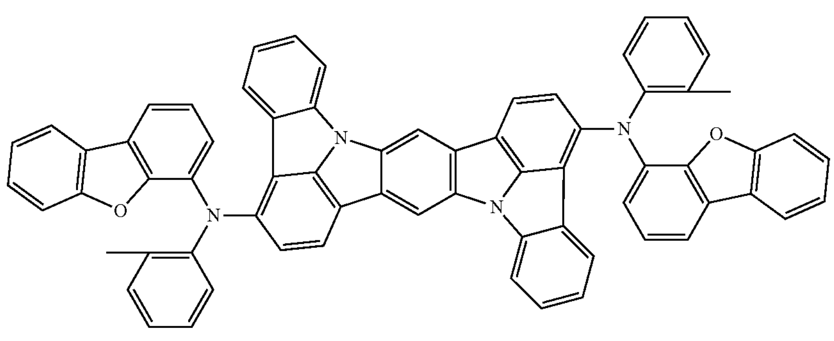

-continued
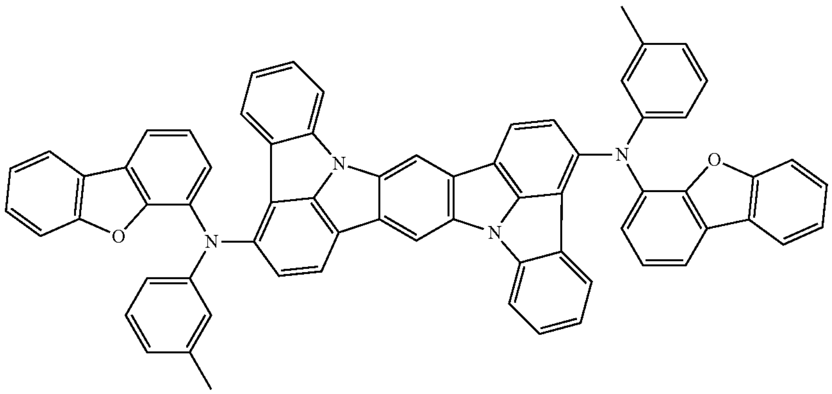
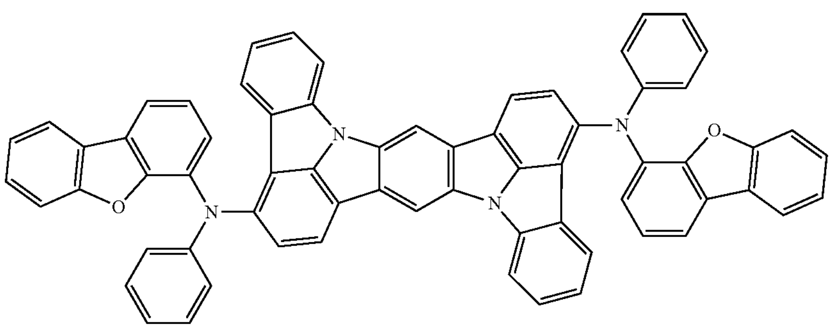
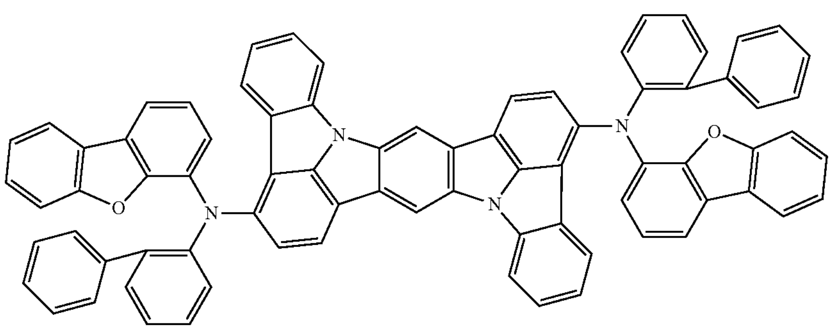
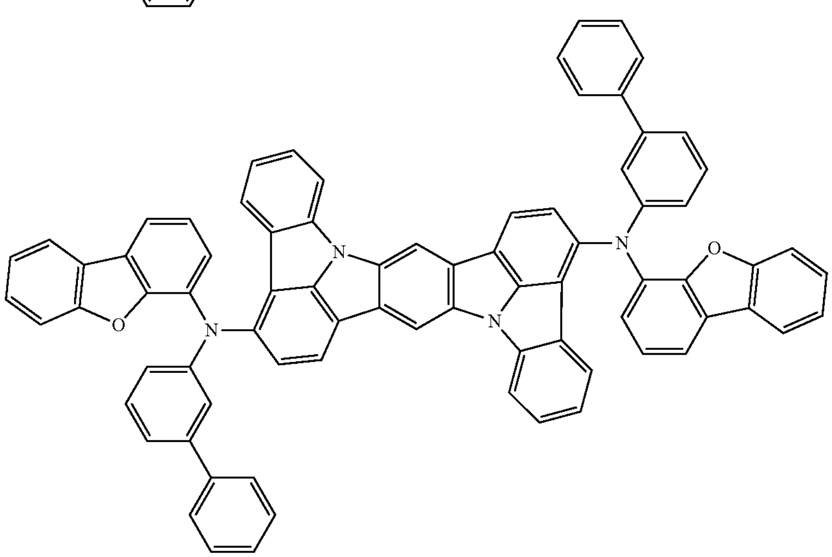

-continued
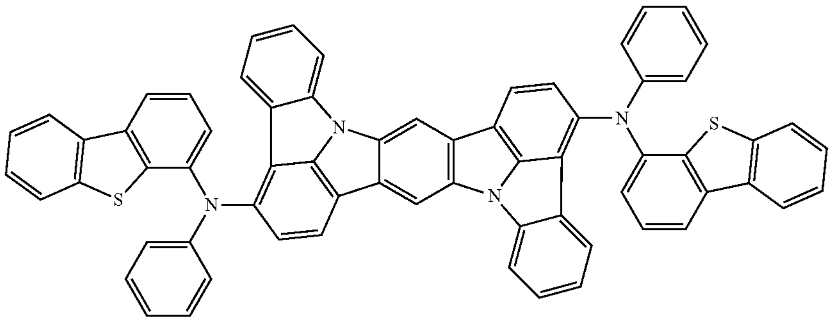
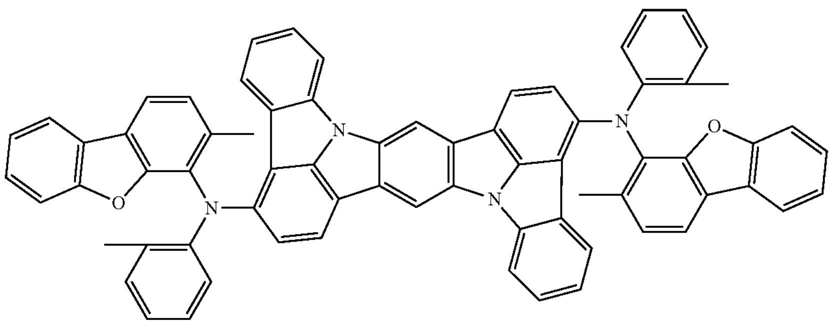
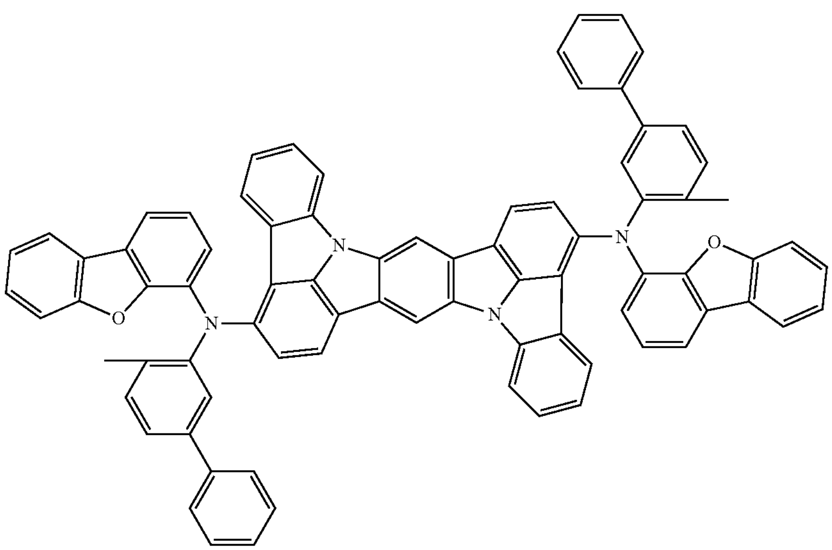
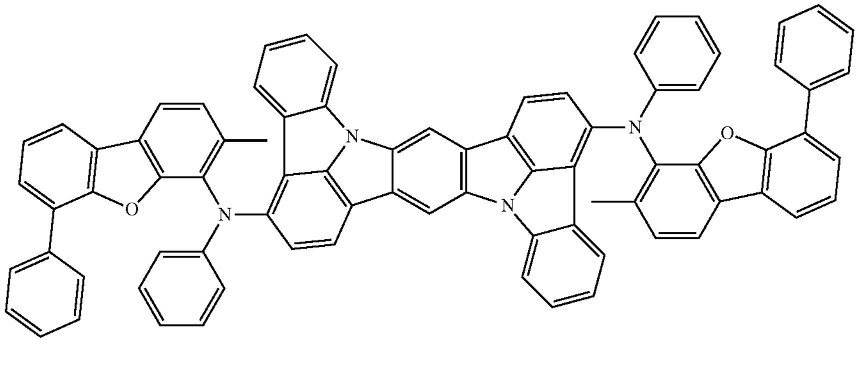

-continued
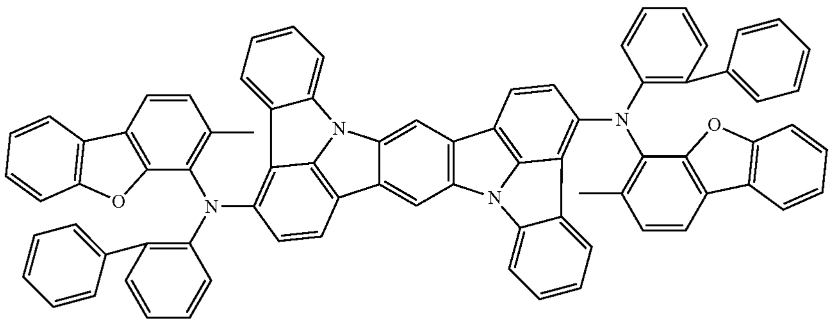
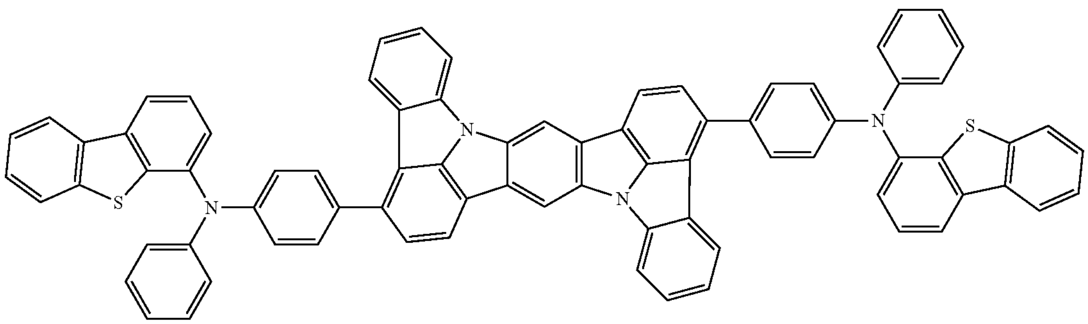
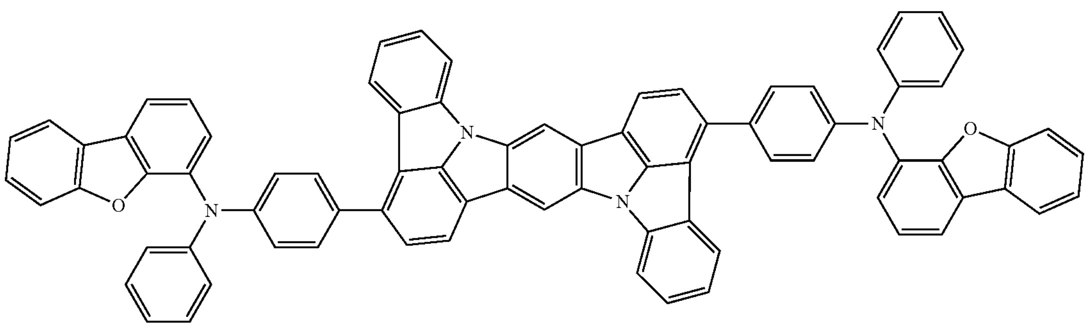
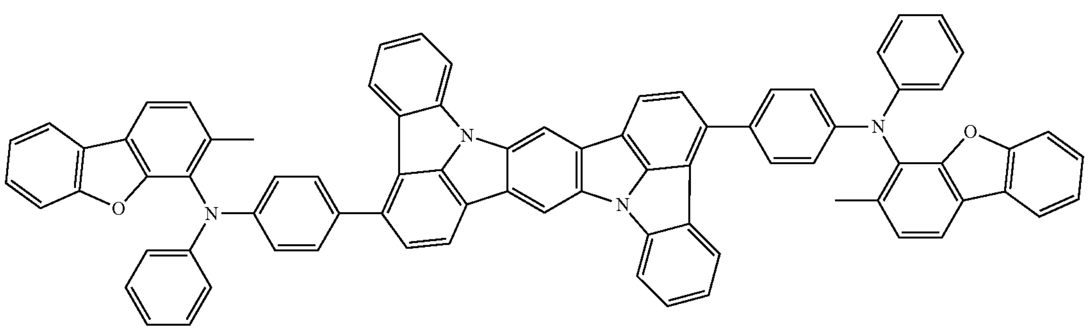
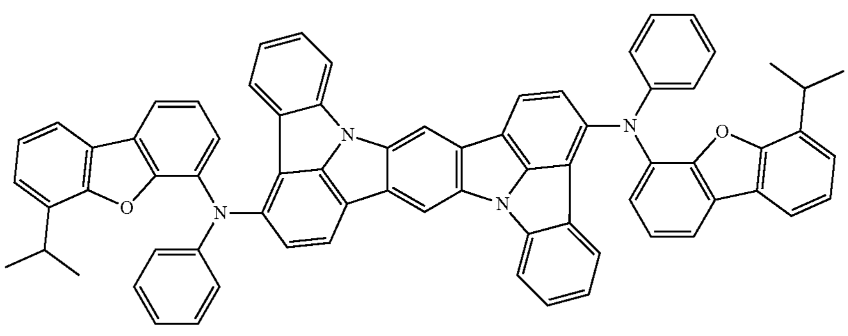

-continued
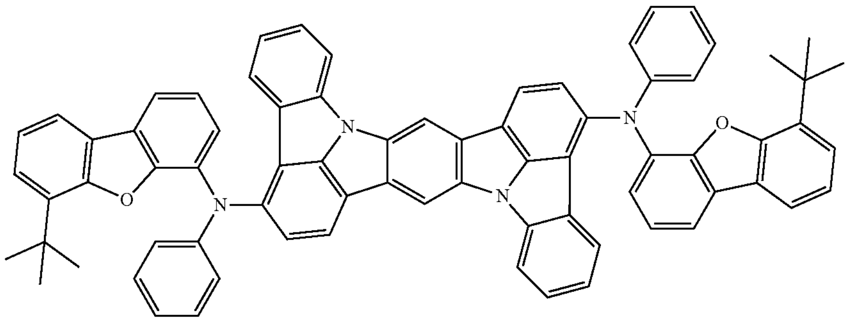
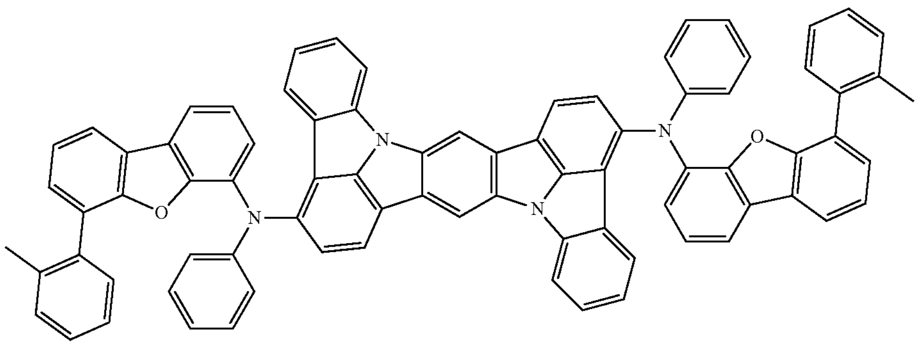
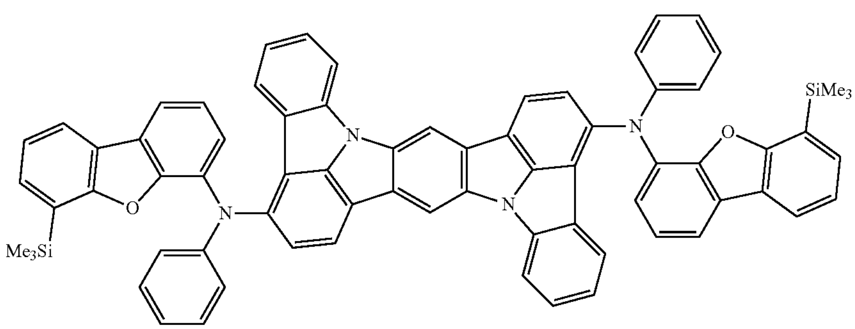
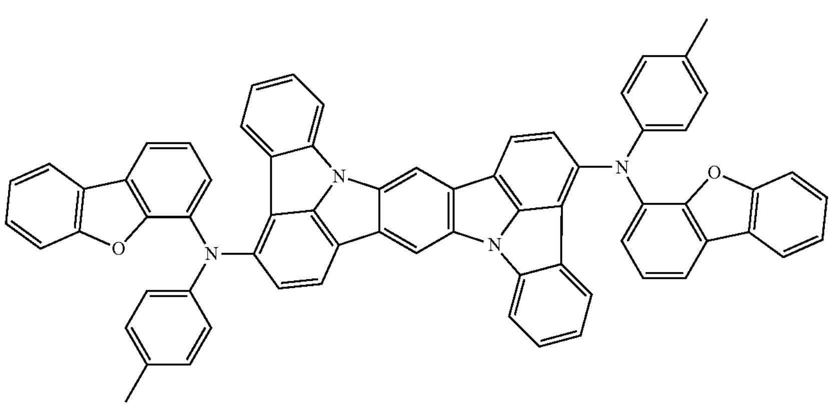

-continued
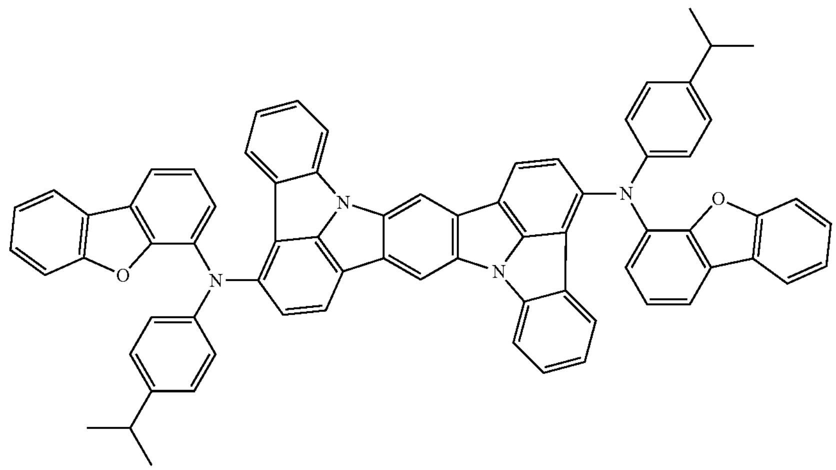
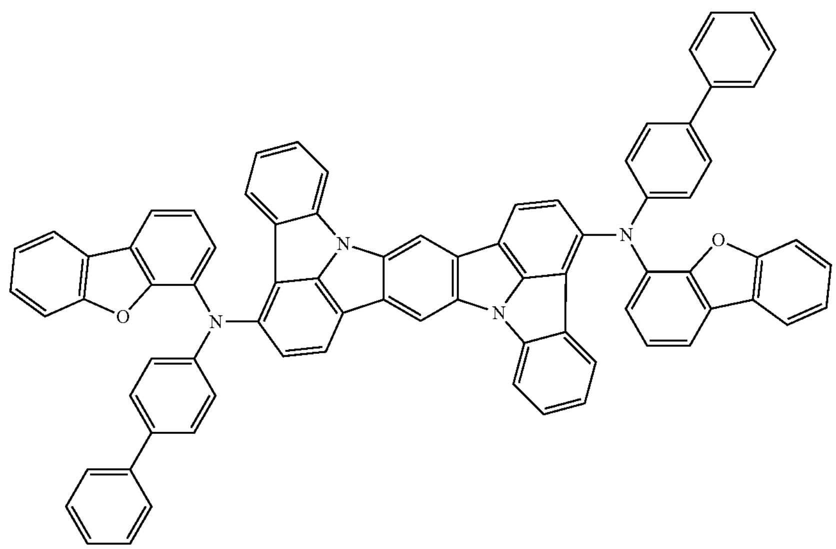
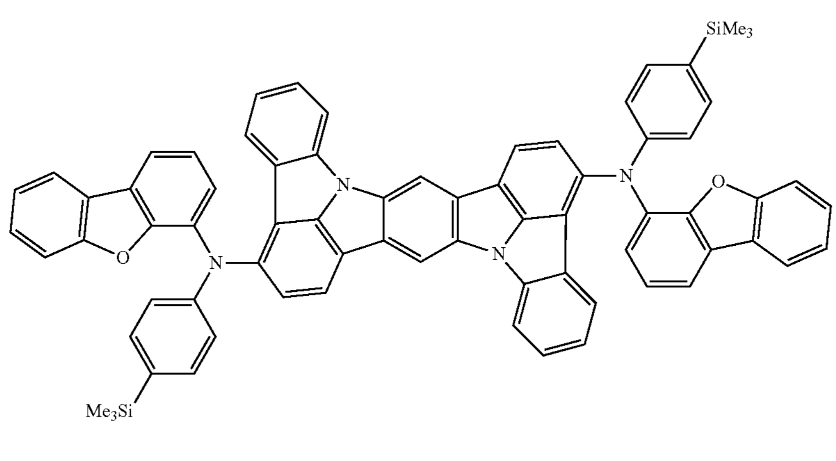

-continued
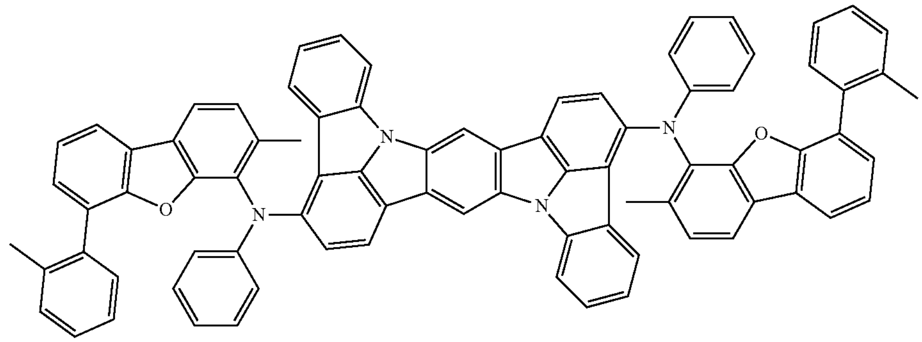
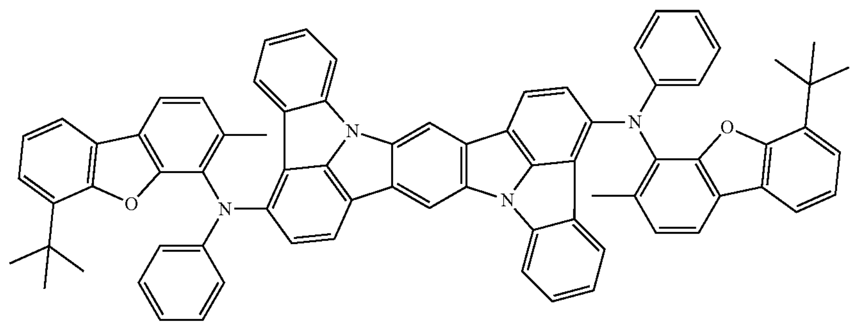
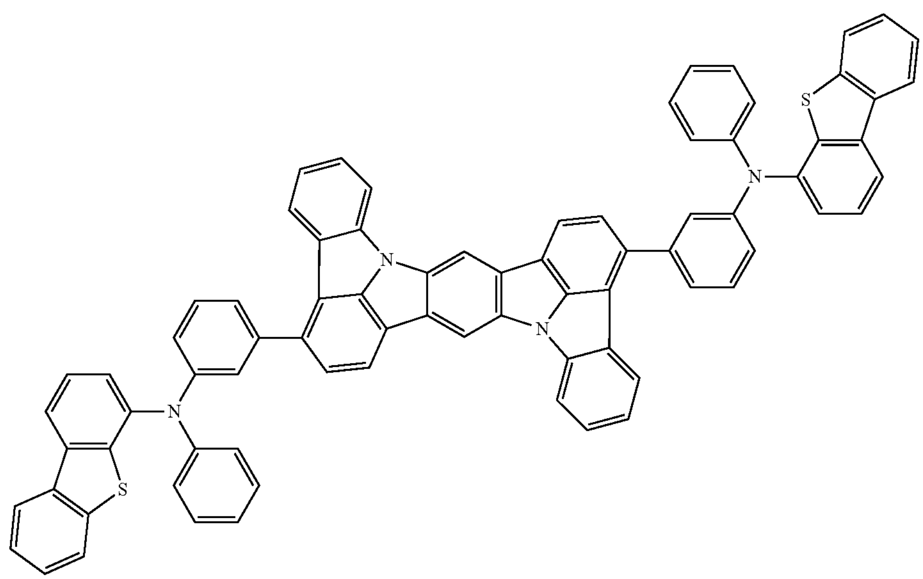

-continued
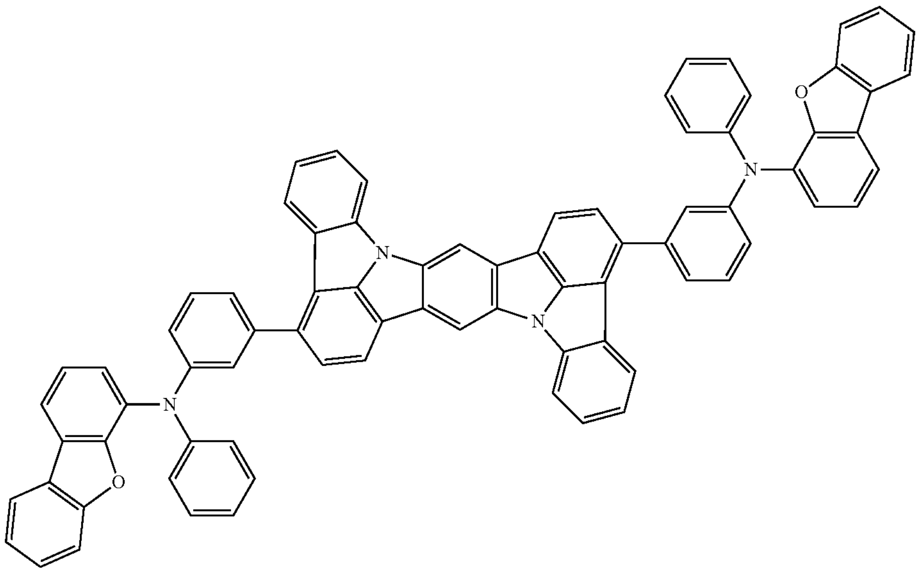
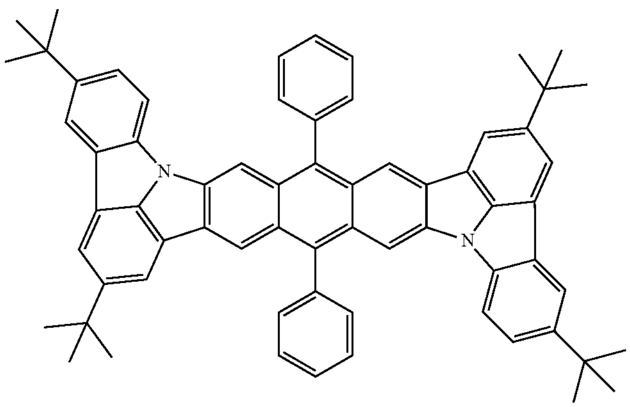
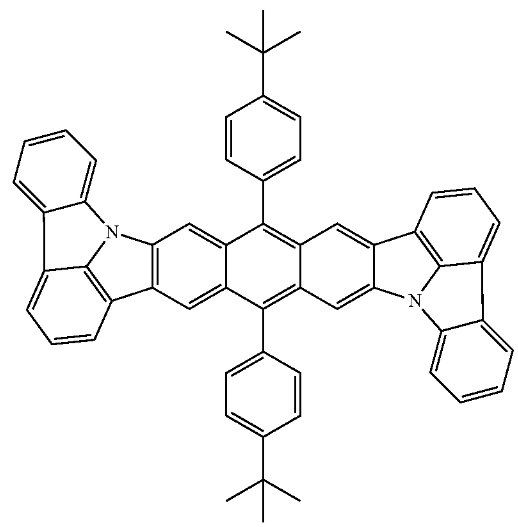
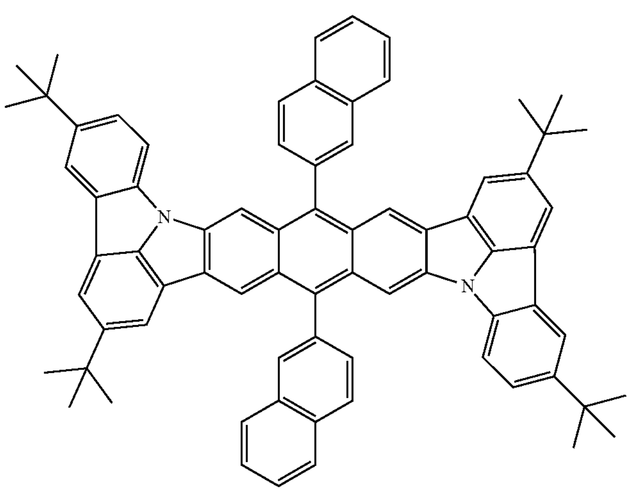

-continued
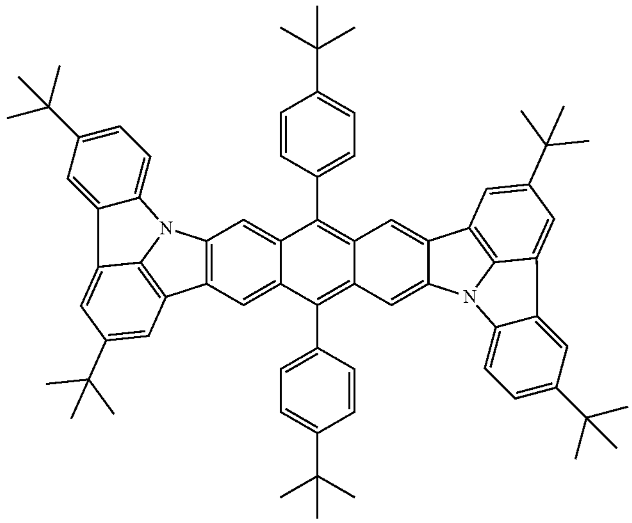
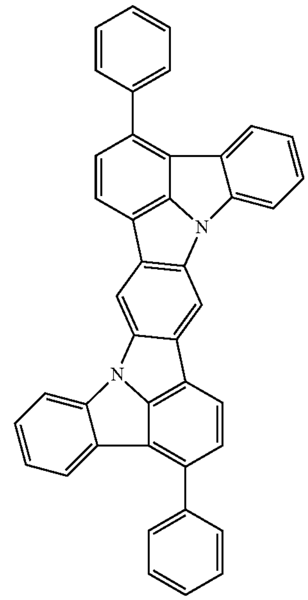
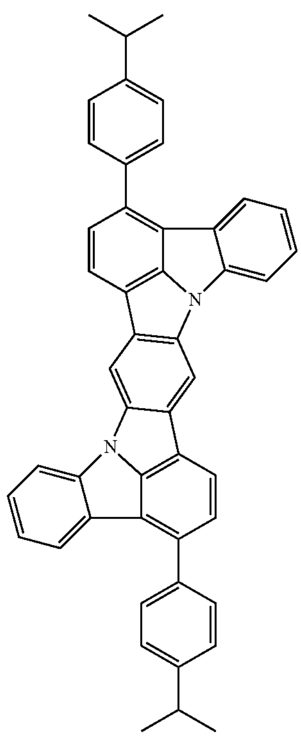
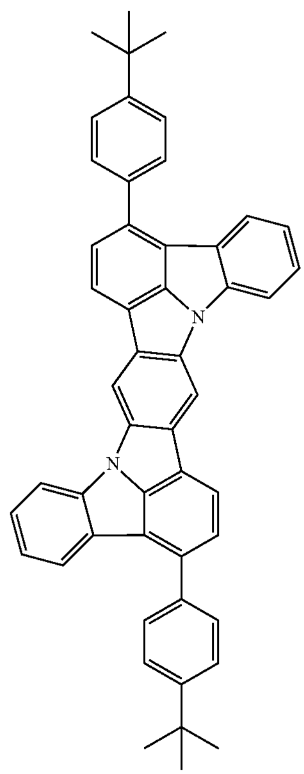
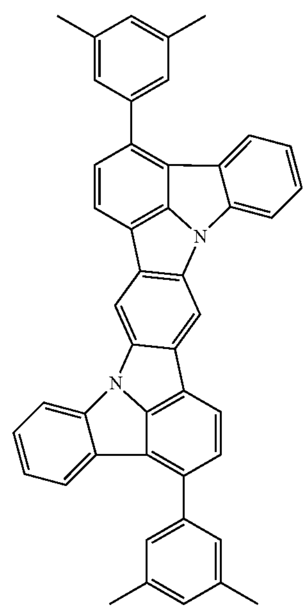

-continued
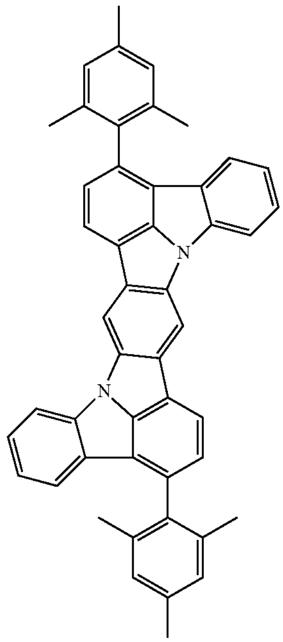
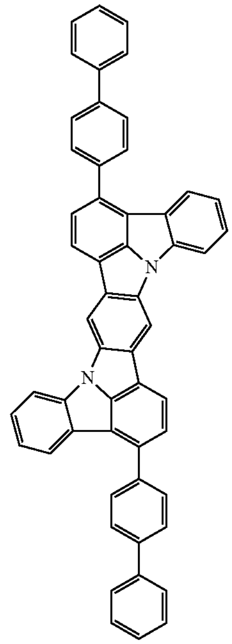
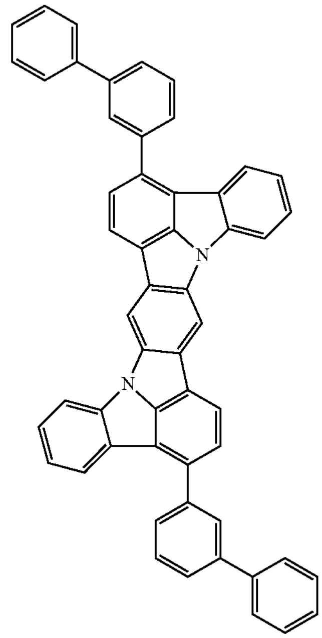
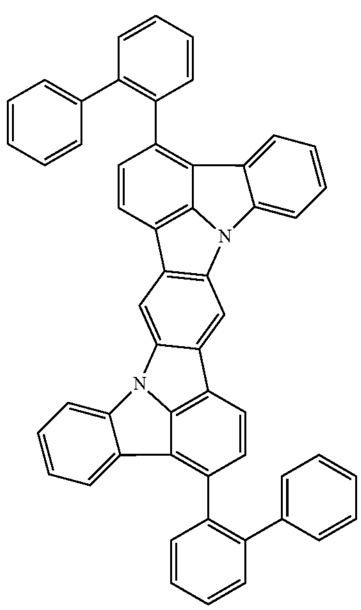
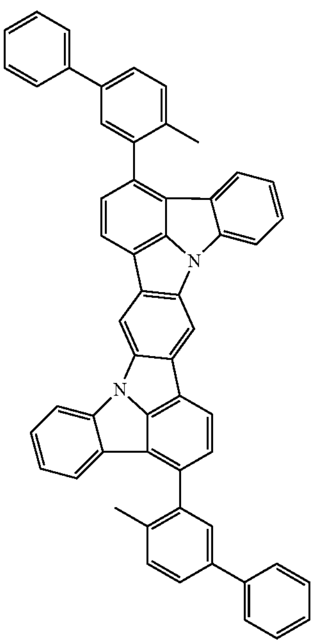
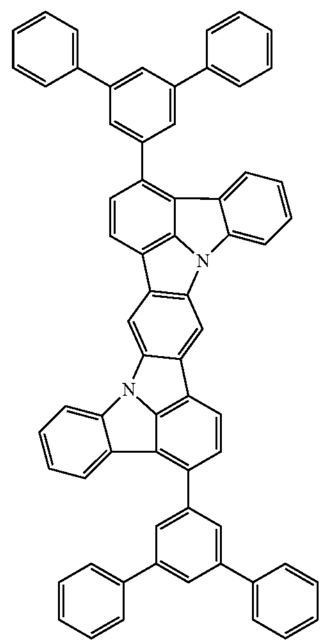

-continued
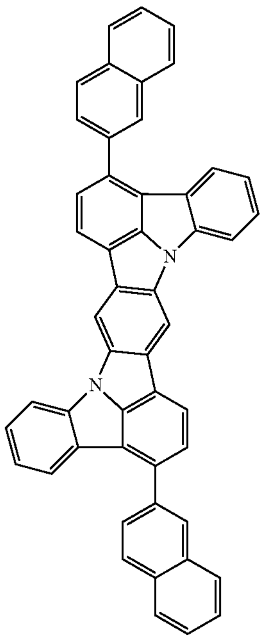
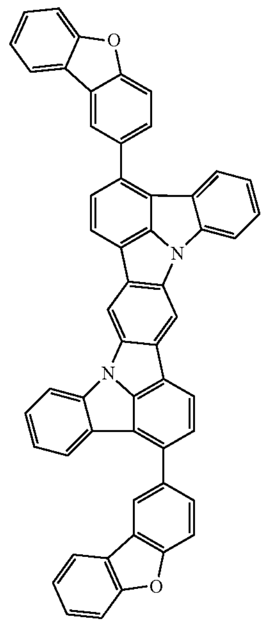
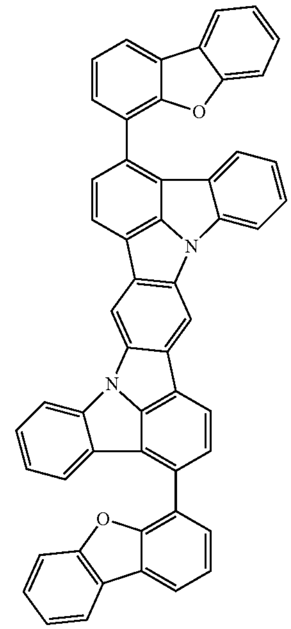
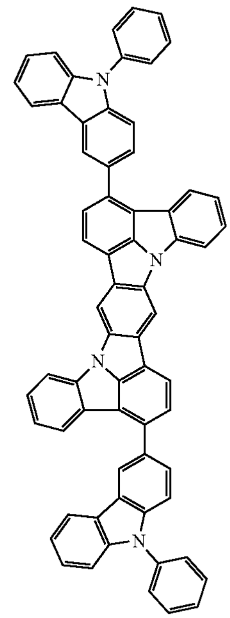
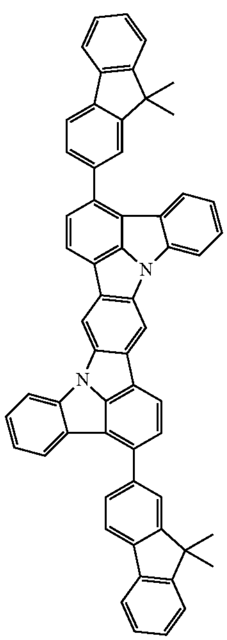
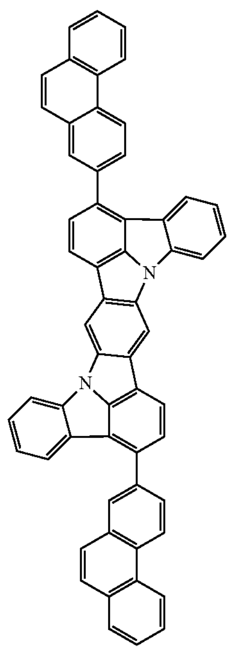
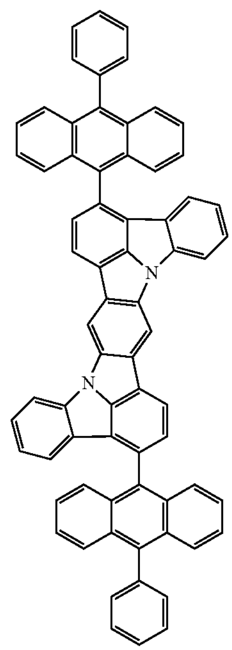
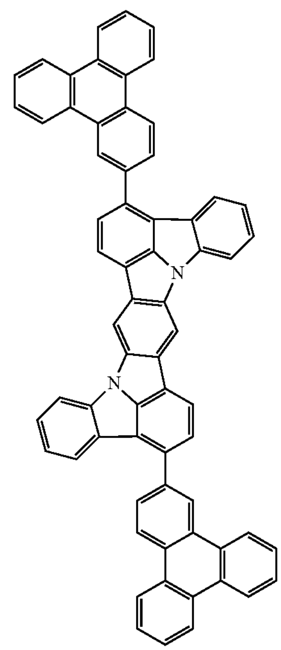

-continued
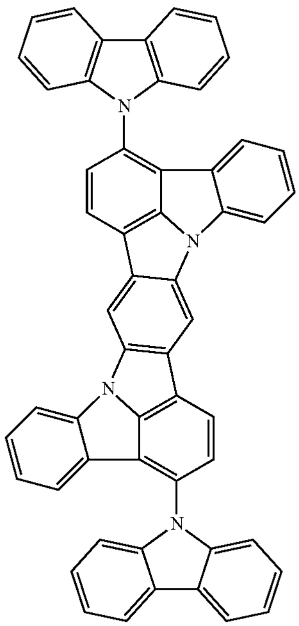
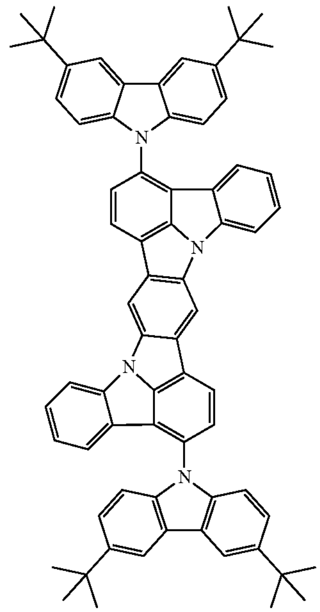
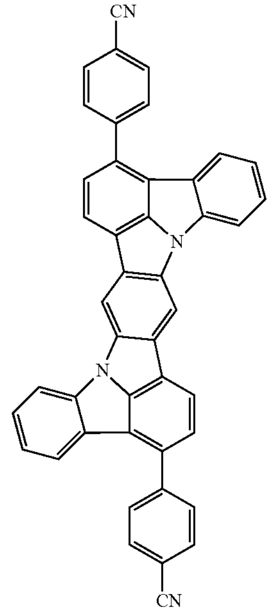
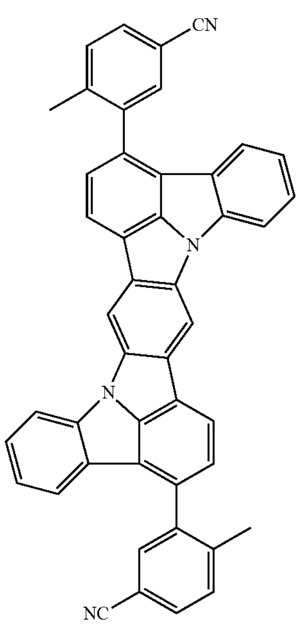
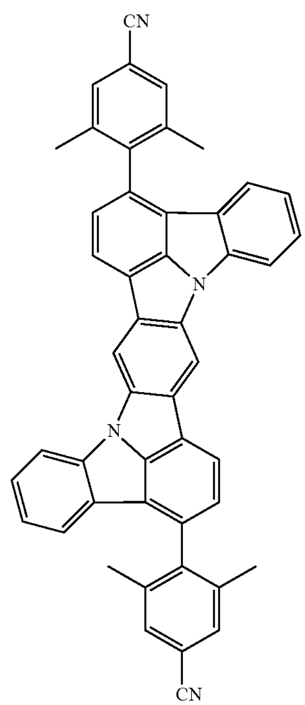
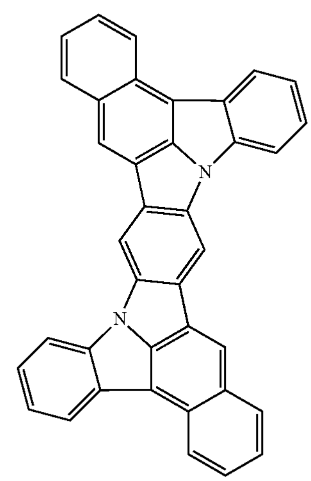

-continued
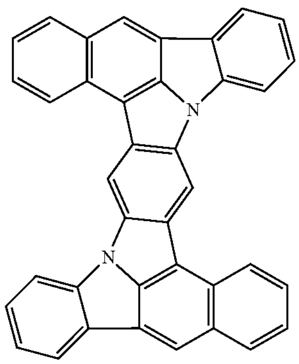
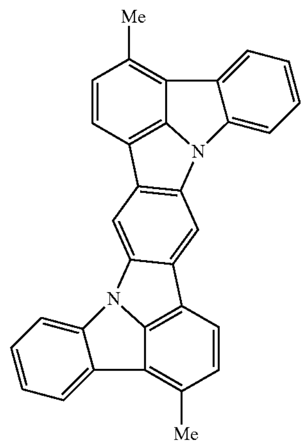
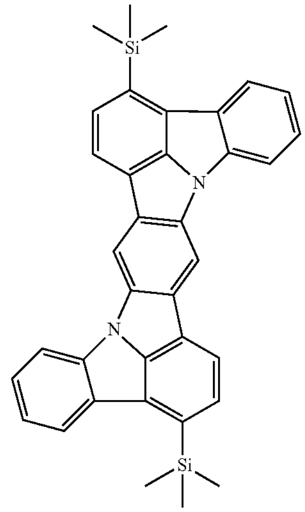
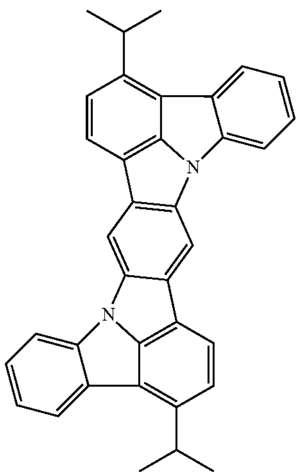
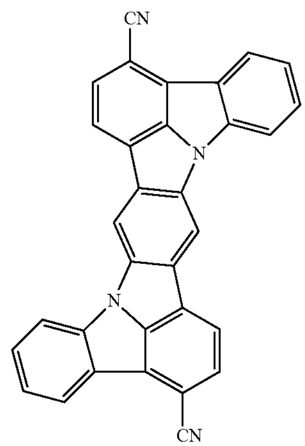
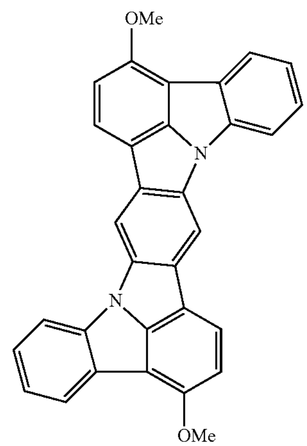
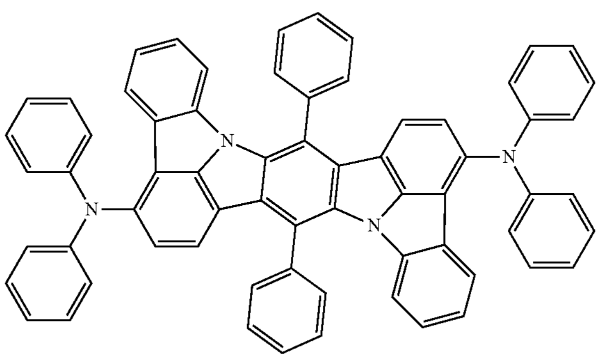
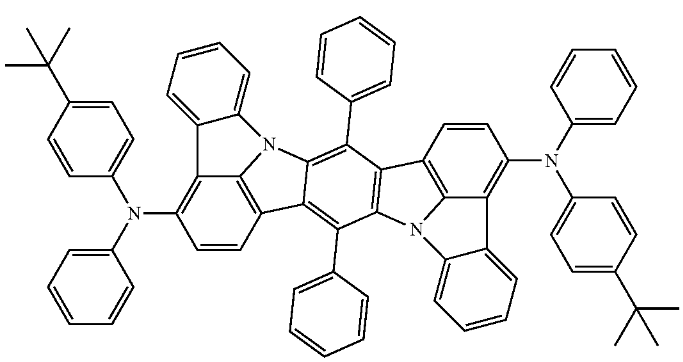

-continued
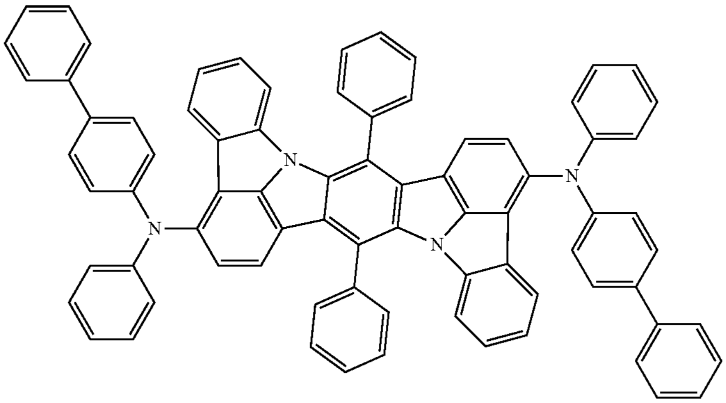
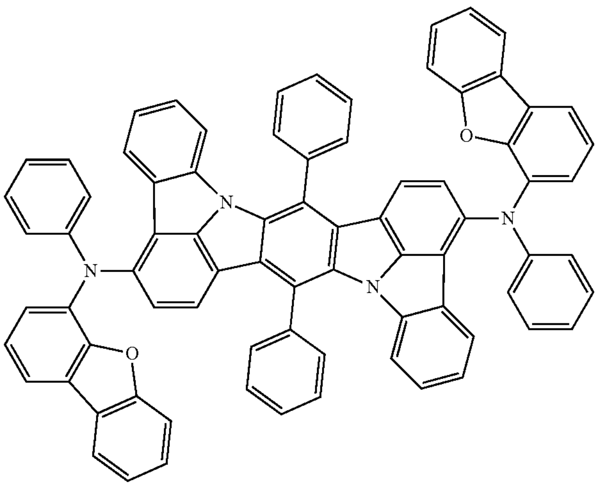
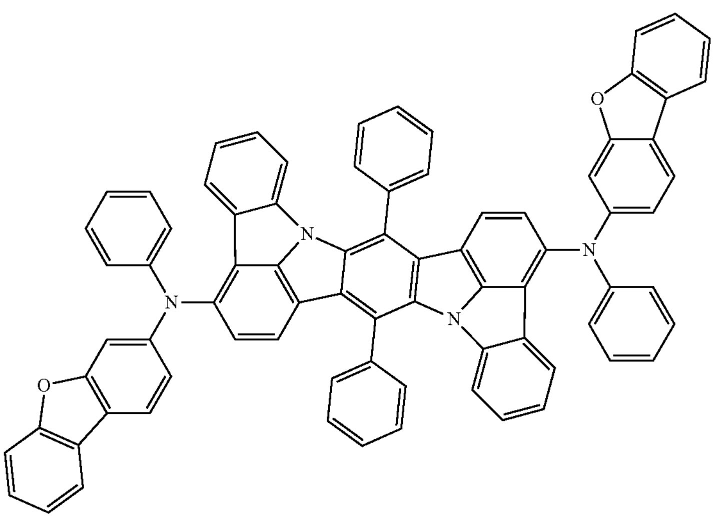

-continued
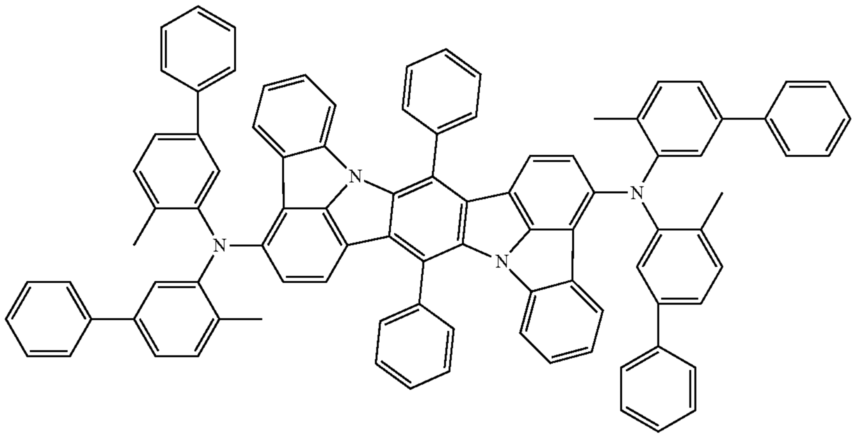
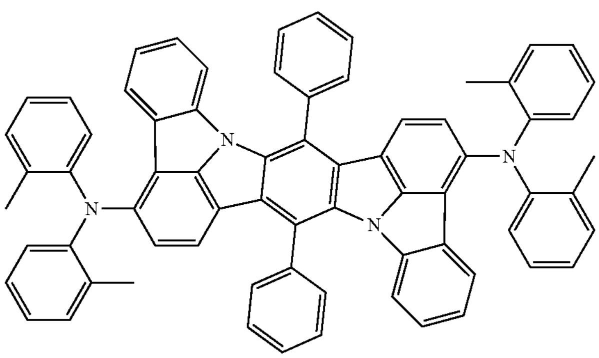
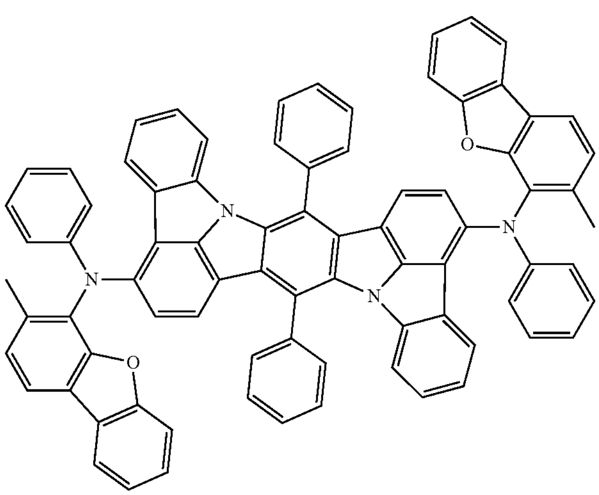

-continued
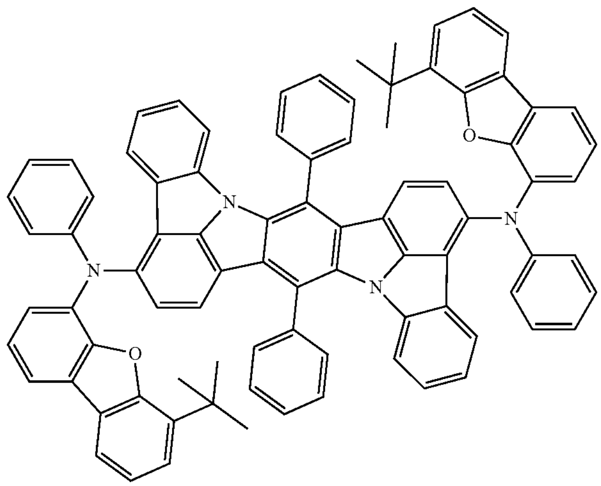
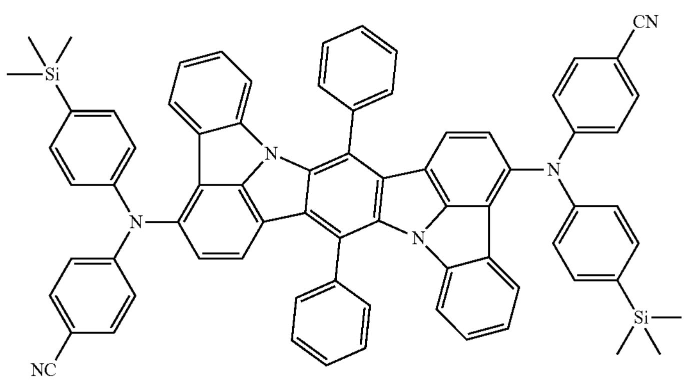
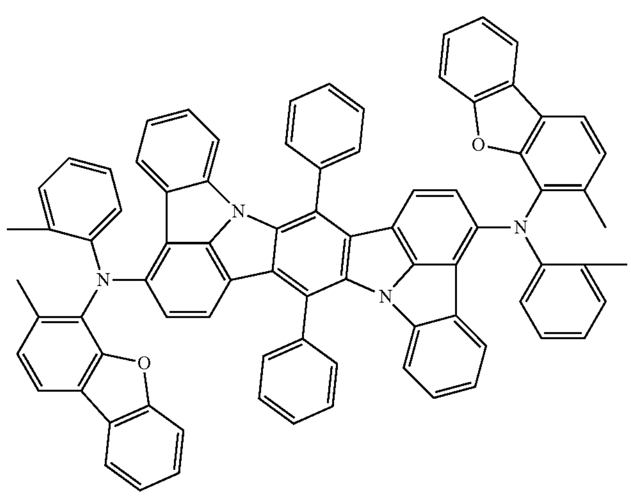

-continued
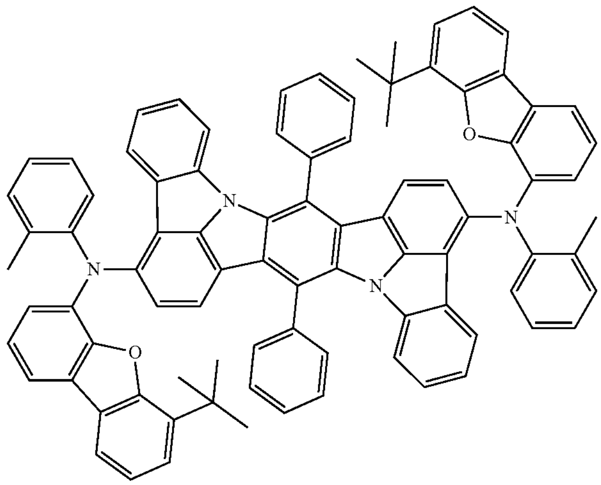
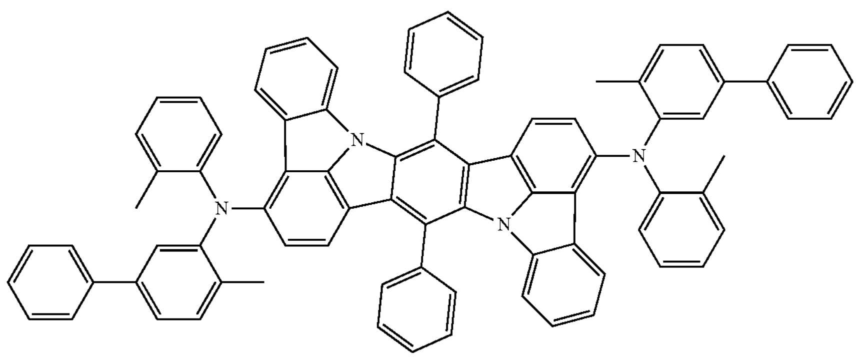
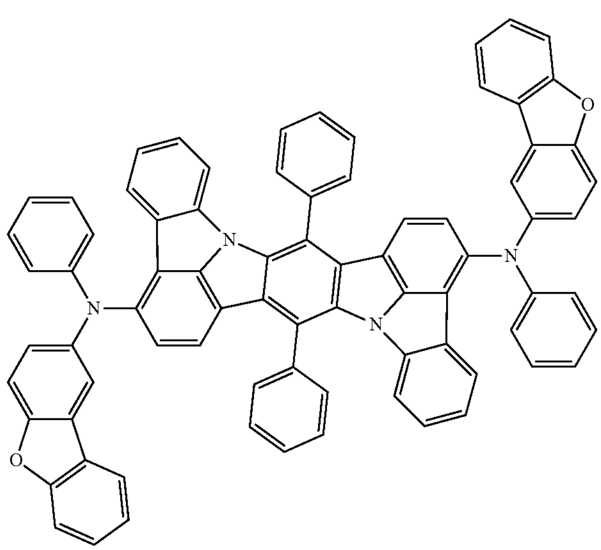

-continued
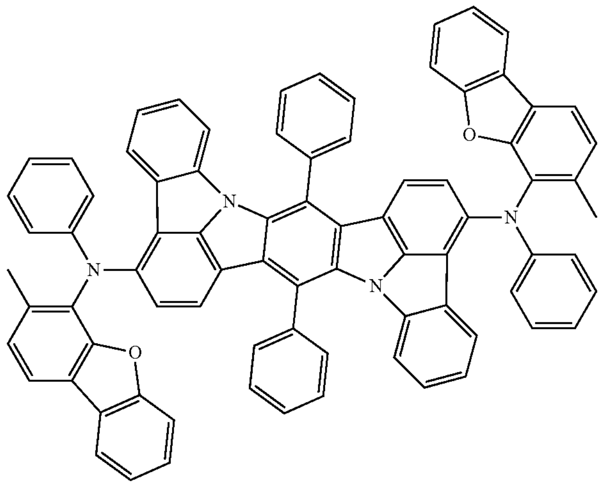
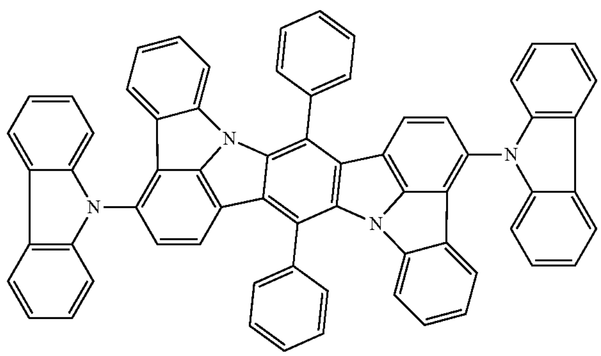
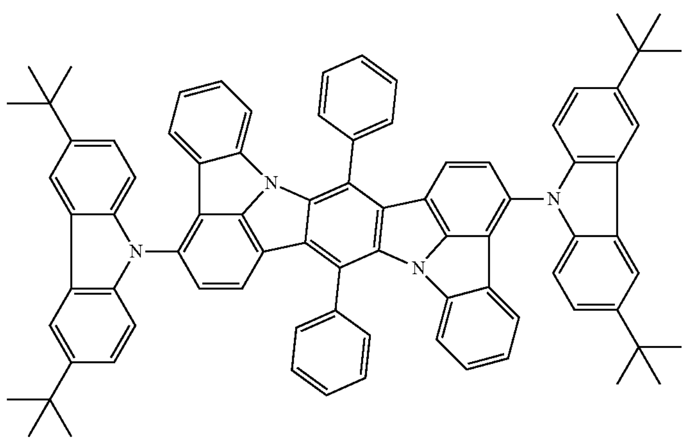
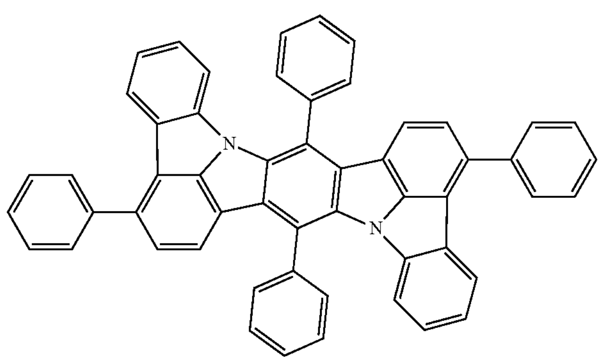

-continued
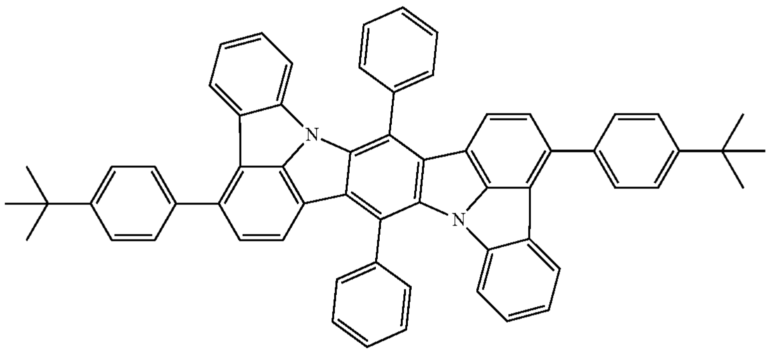
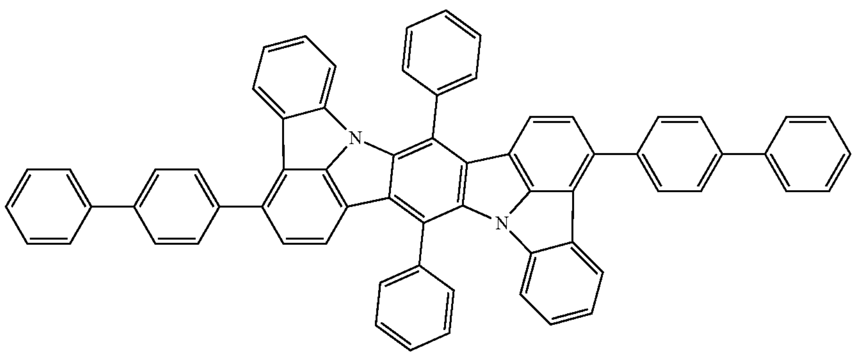
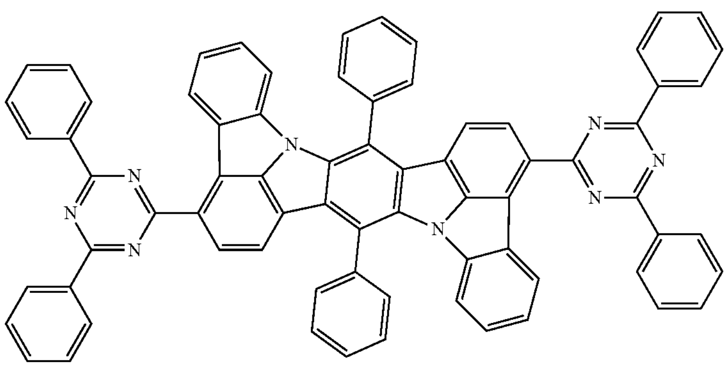
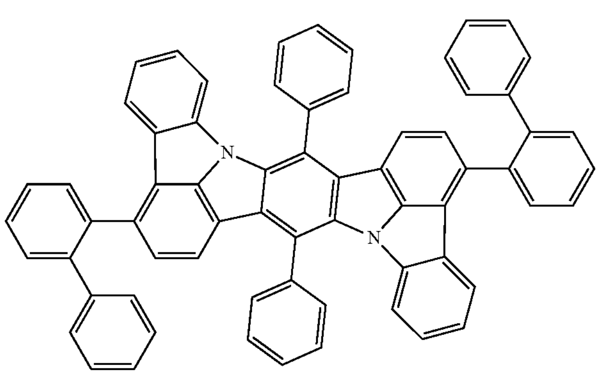

-continued
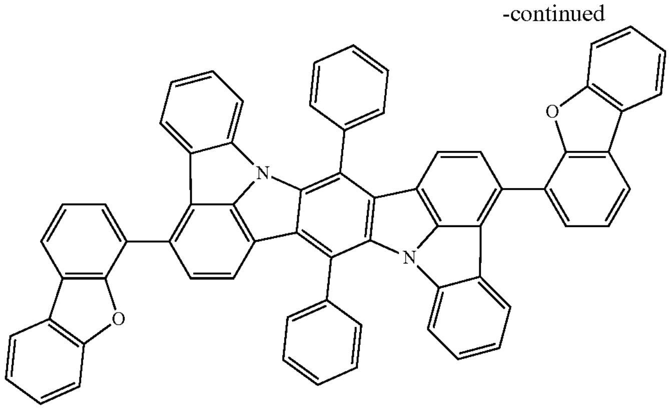
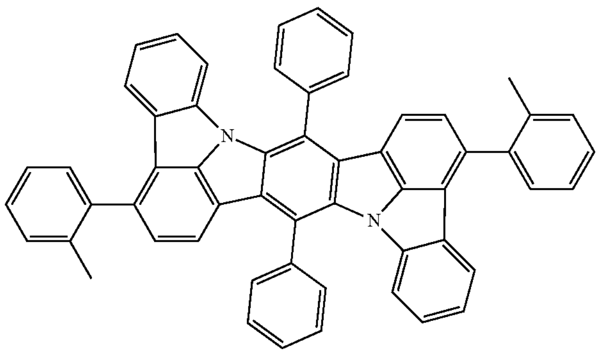
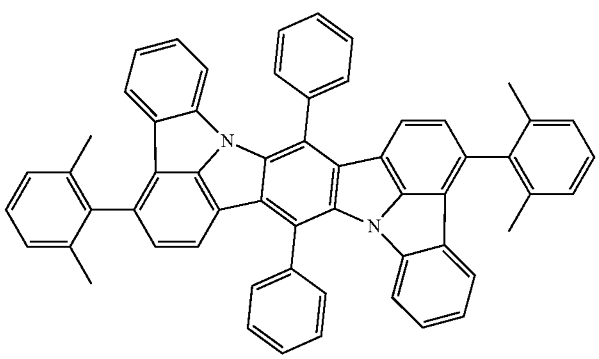
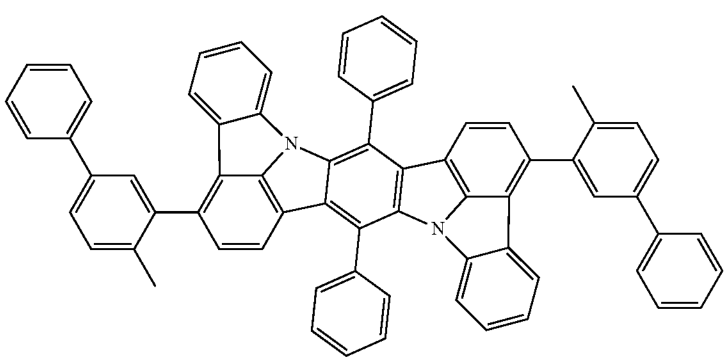

-continued
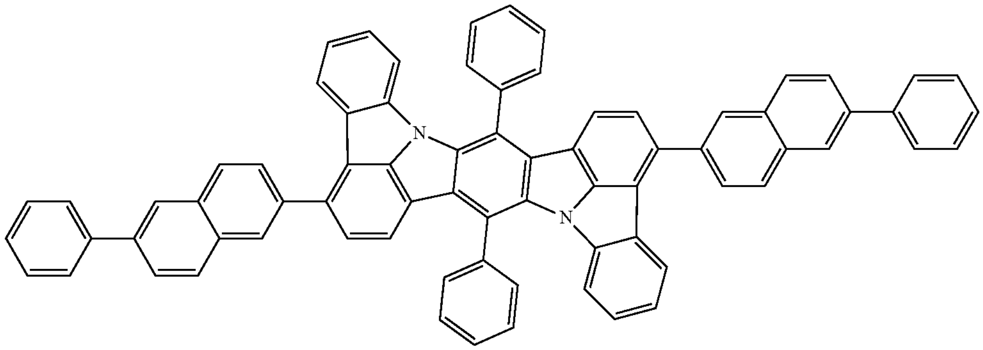
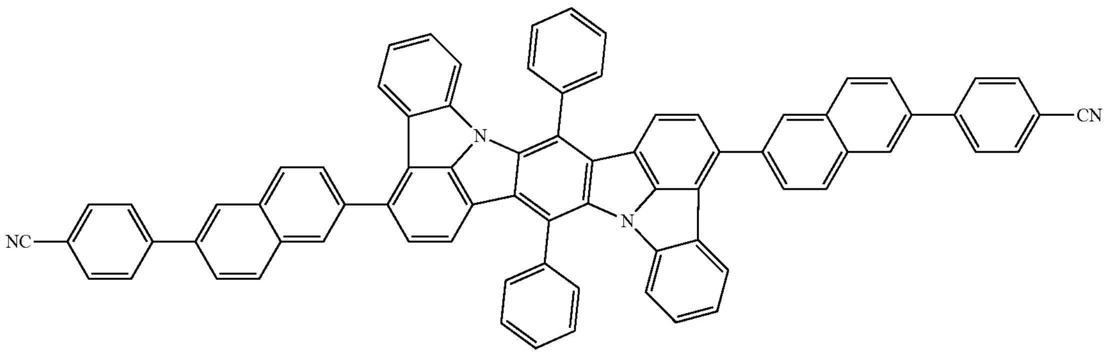
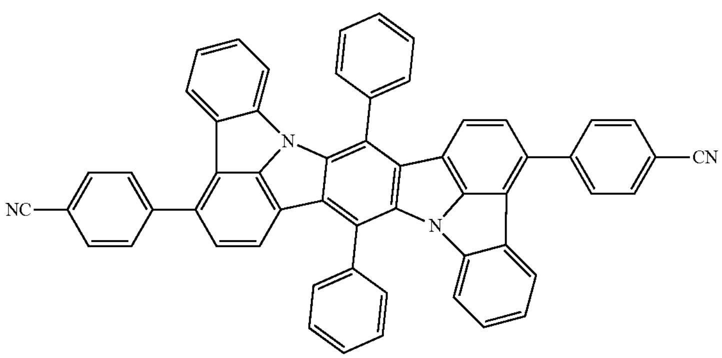
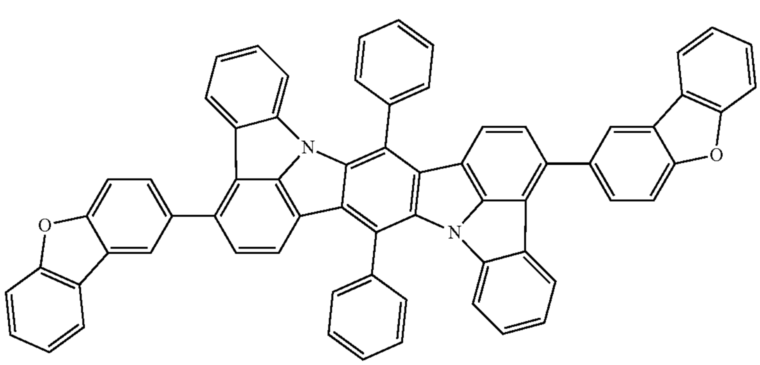

-continued
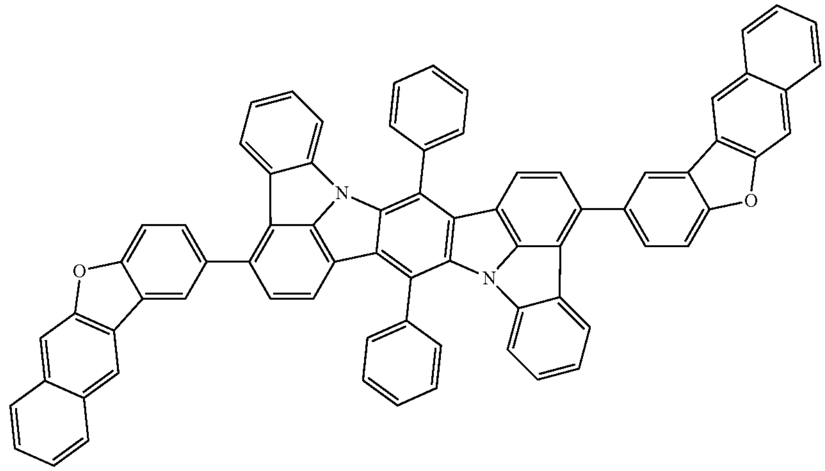
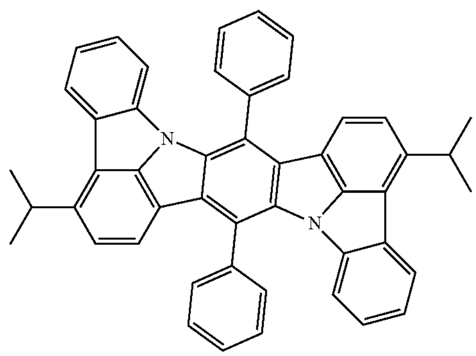
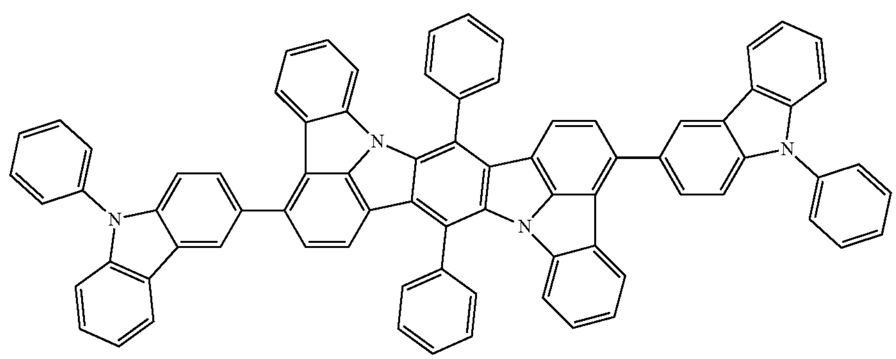
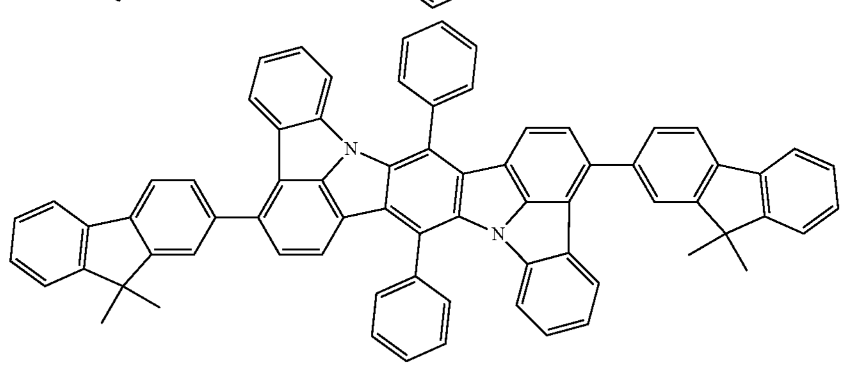

-continued
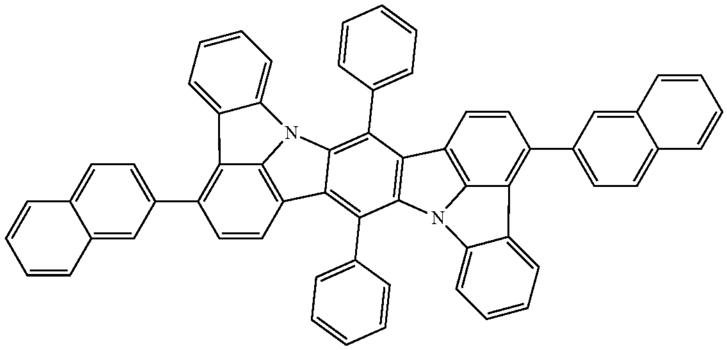
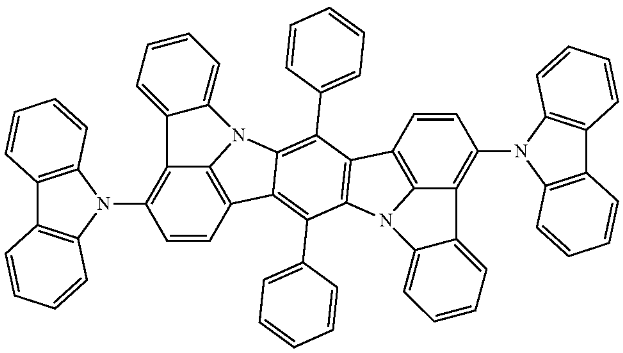
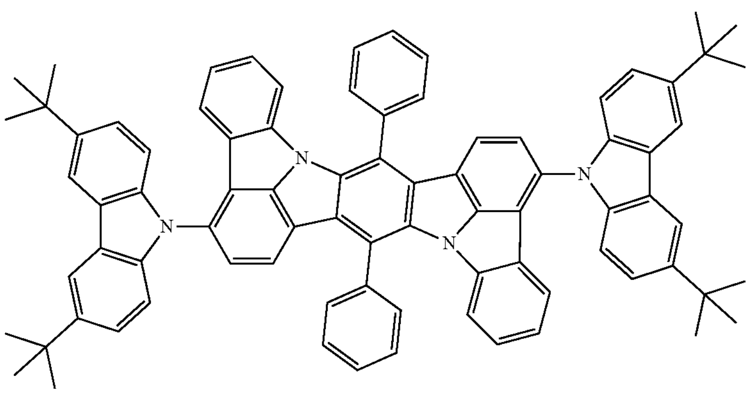
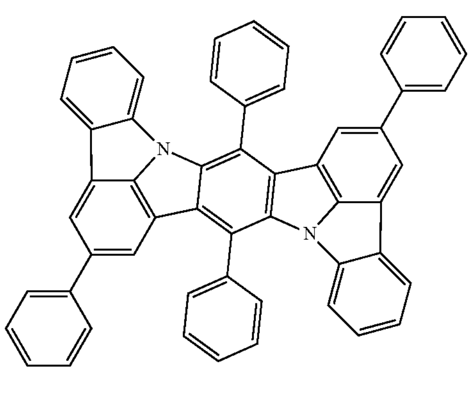
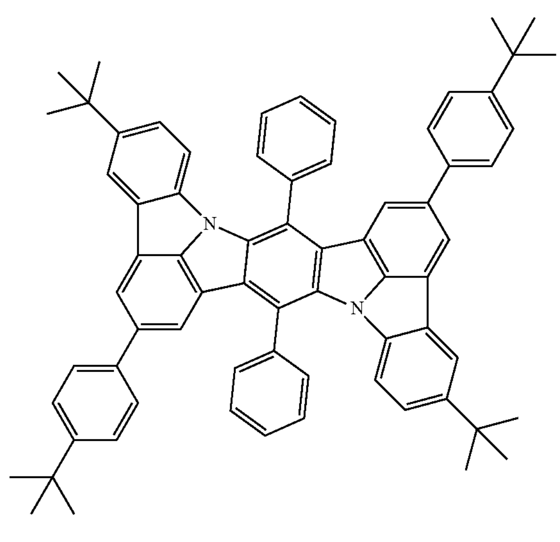

-continued
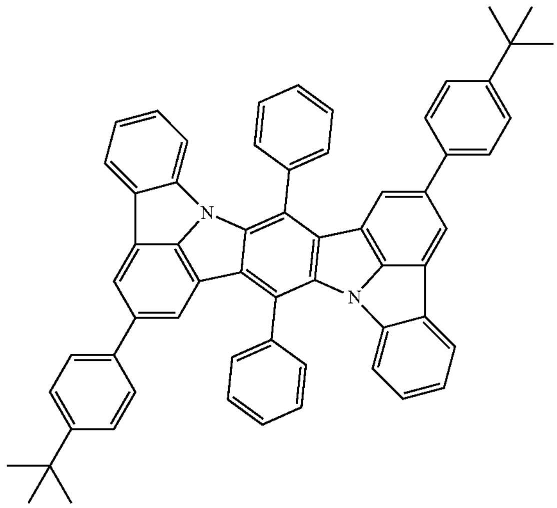
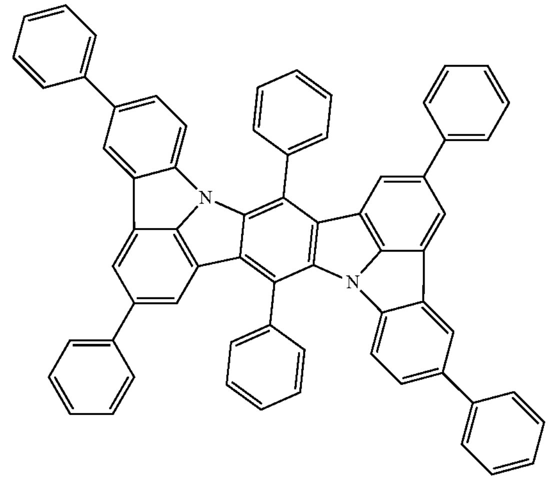
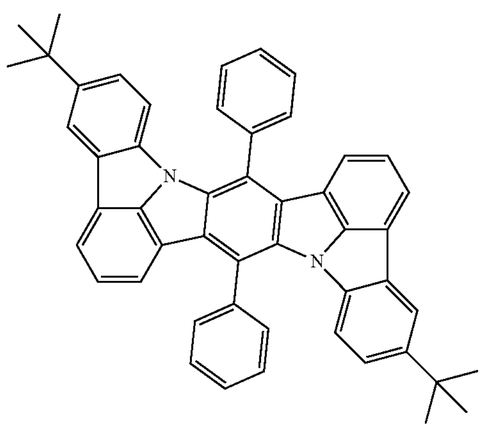
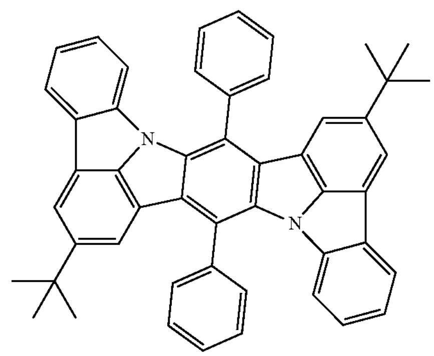
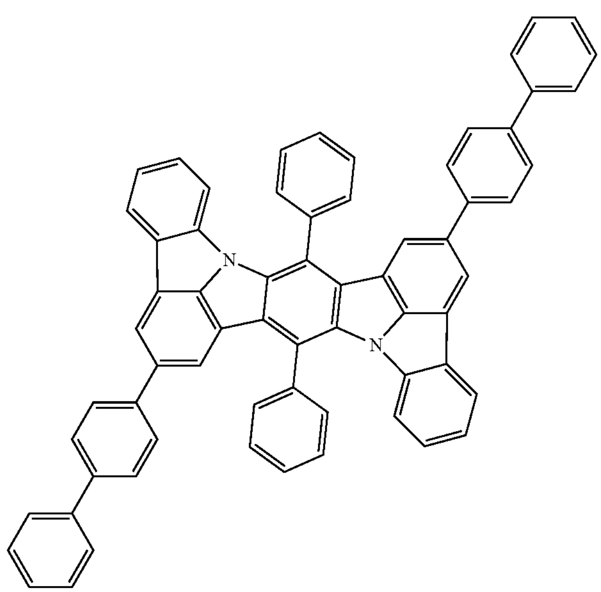

-continued
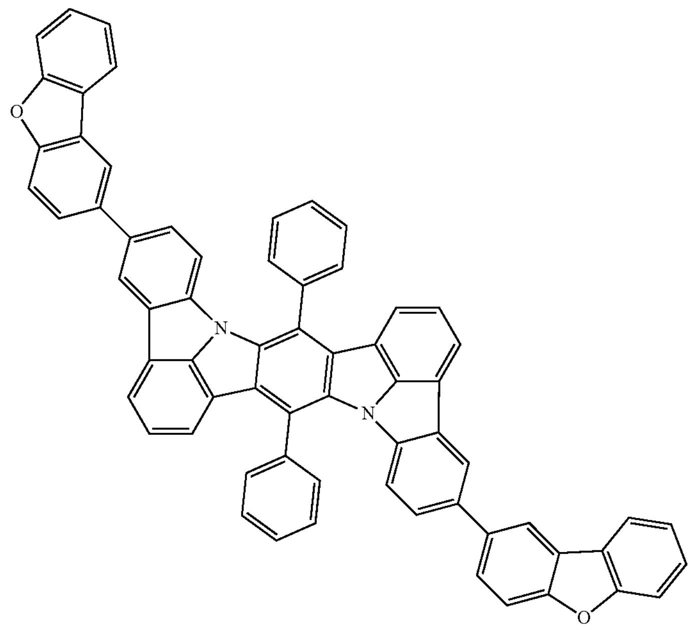
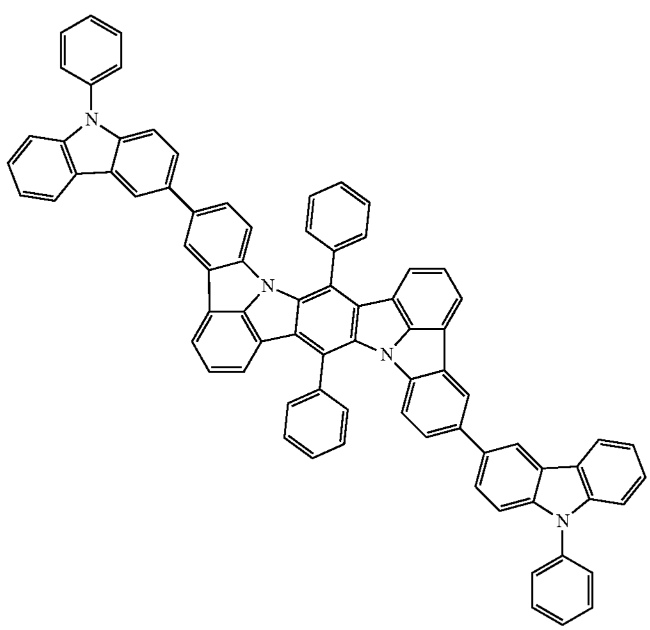

-continued
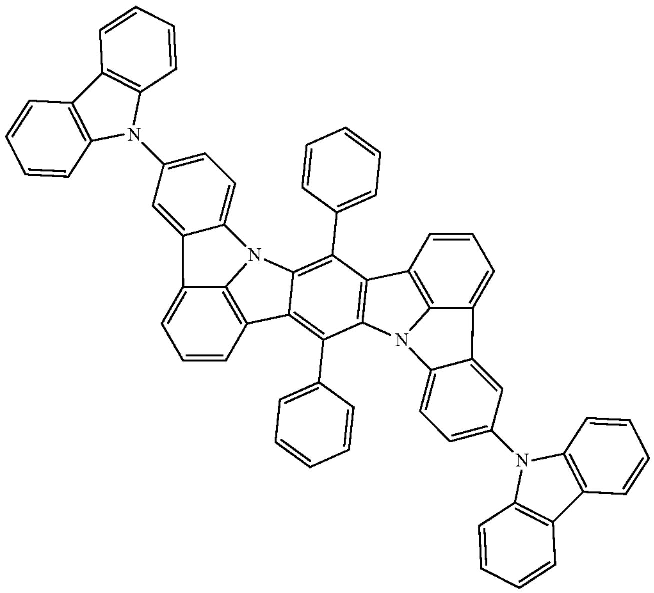
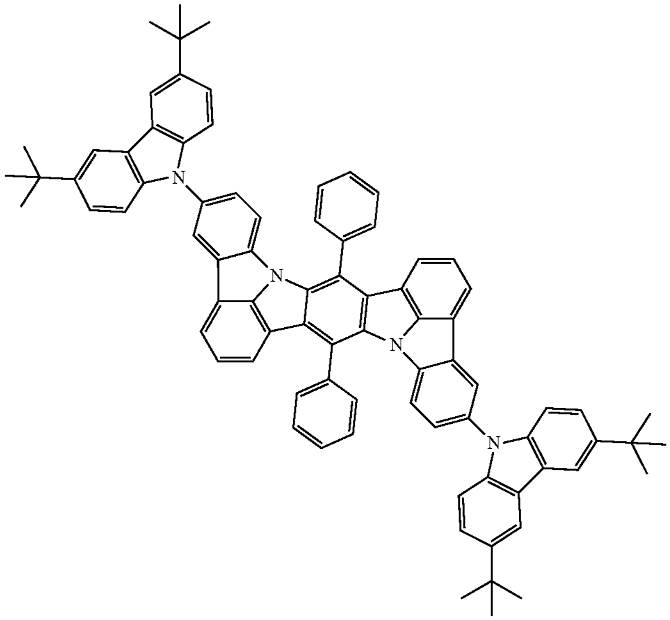
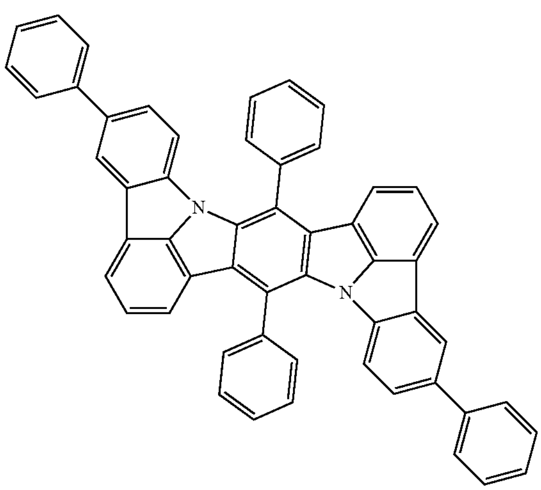
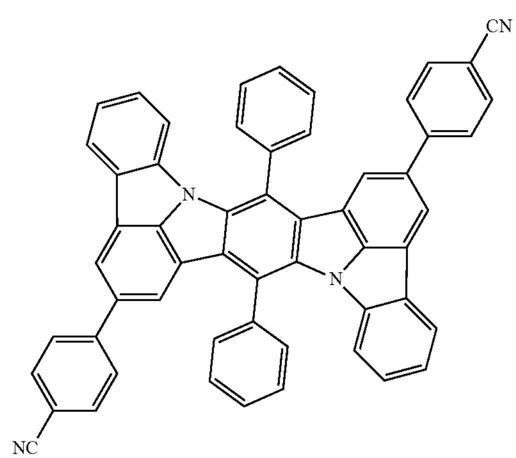

-continued
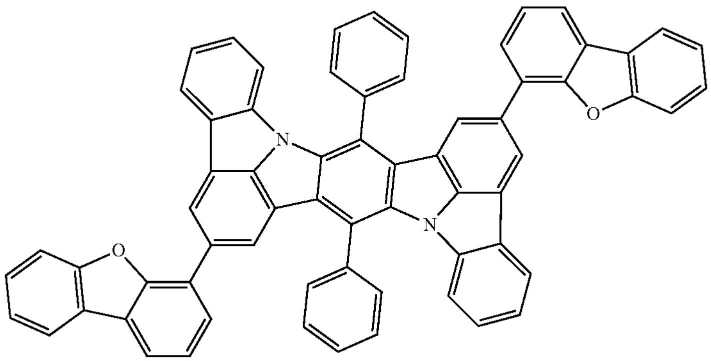
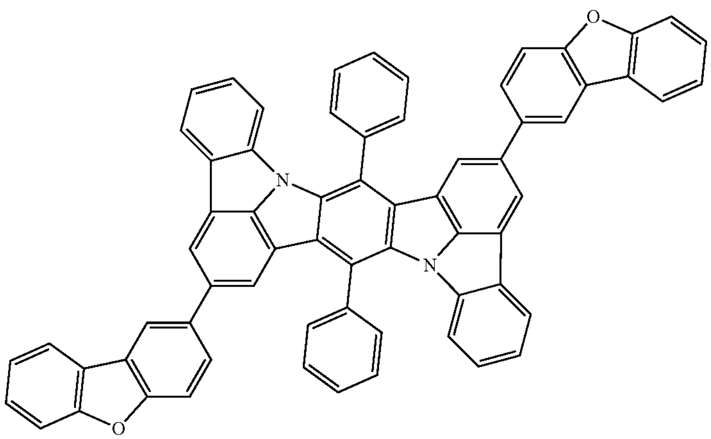
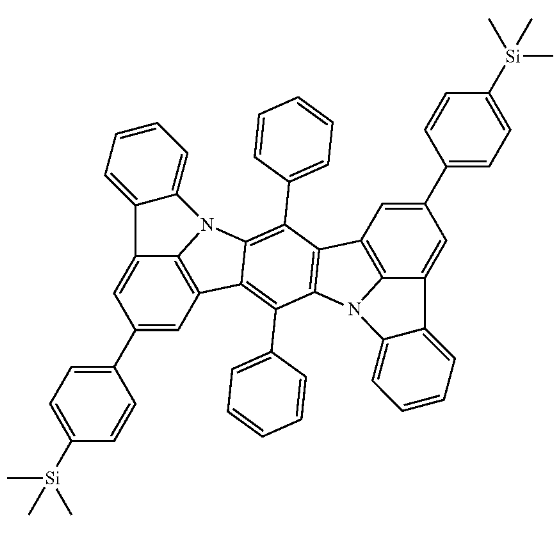

-continued
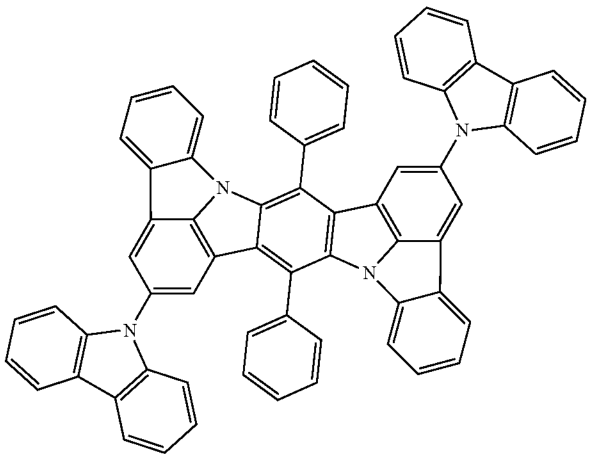
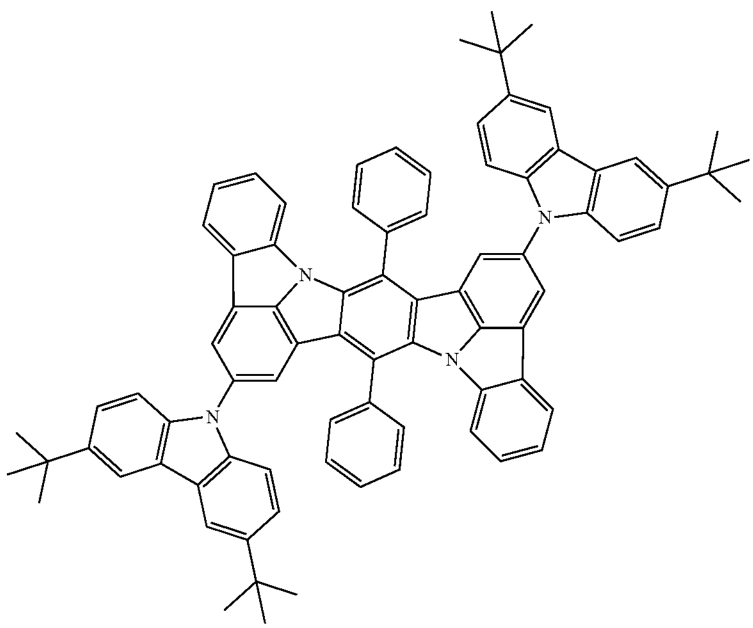
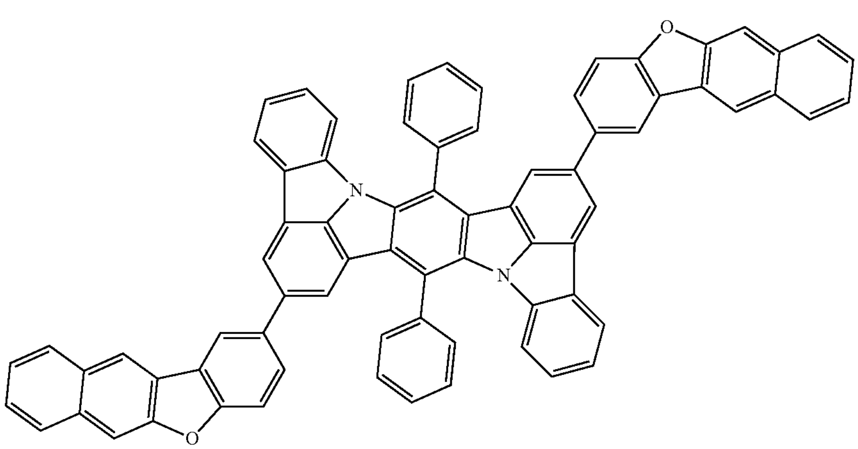

-continued
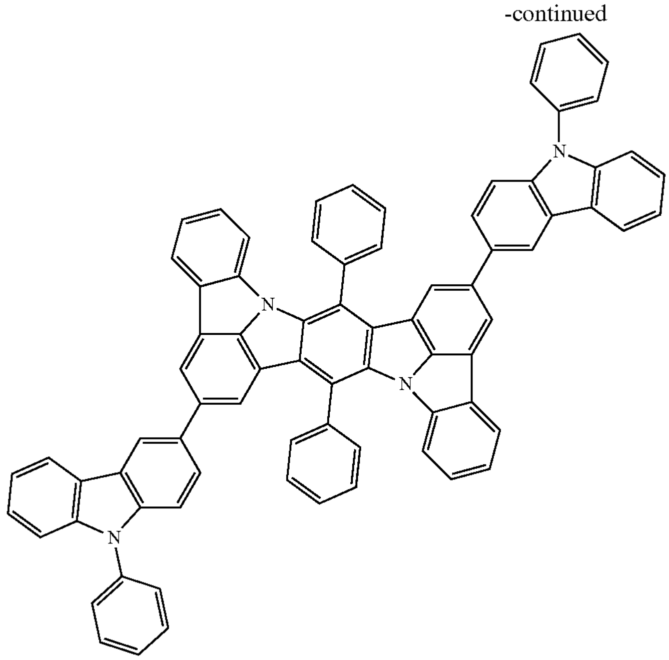
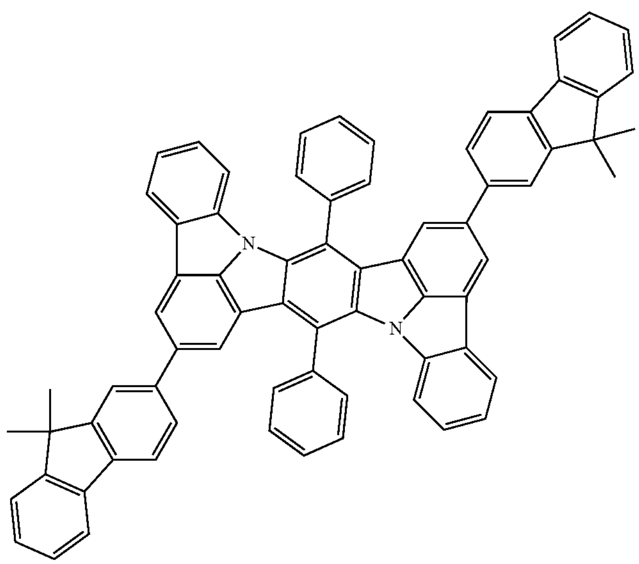
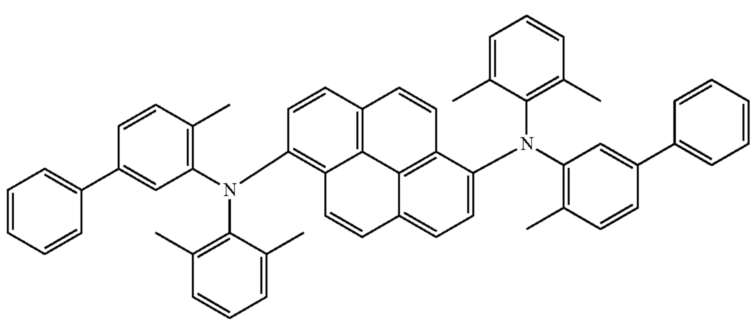

-continued
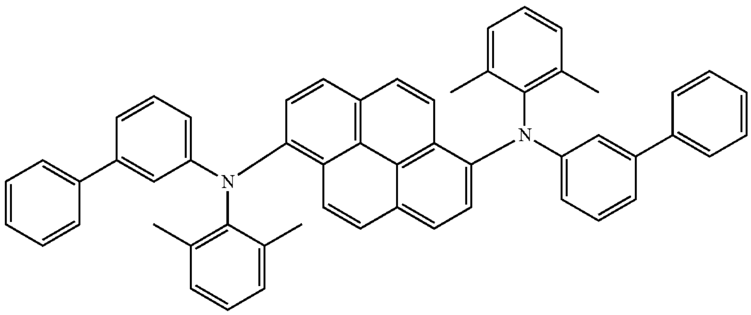
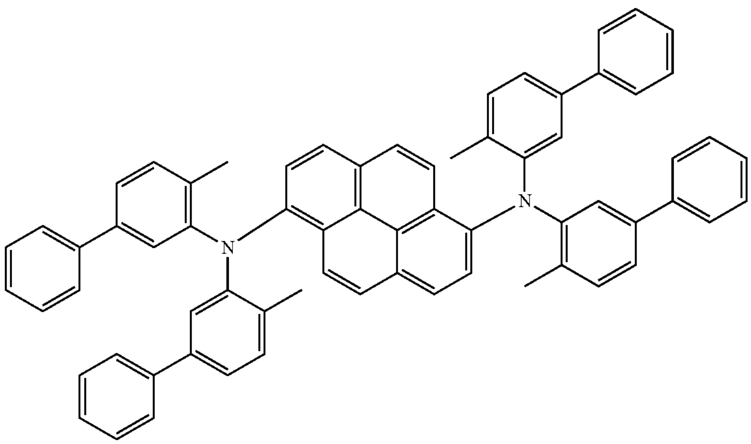
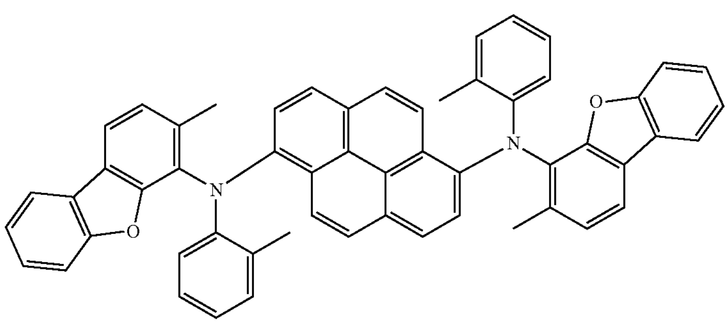
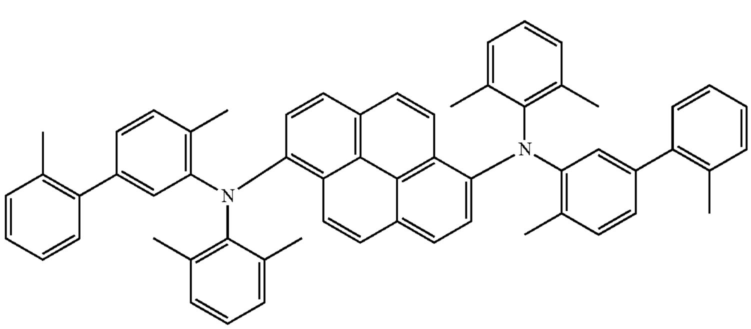

-continued
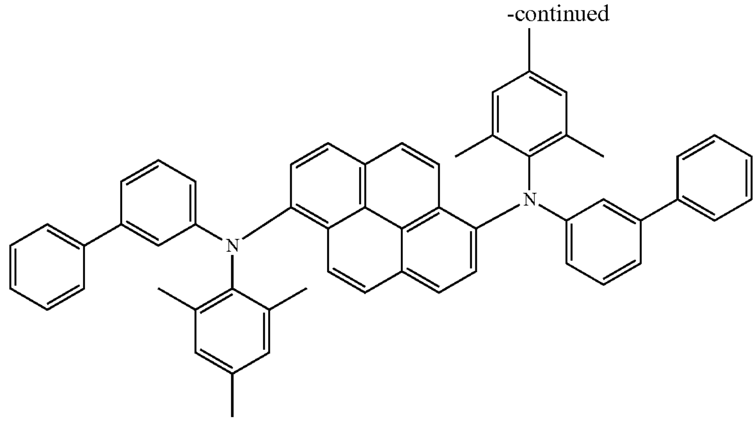
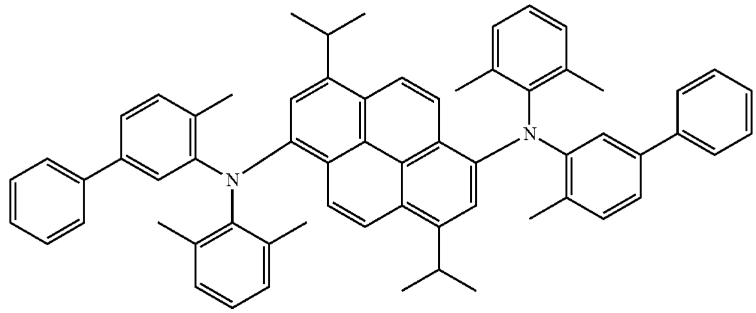
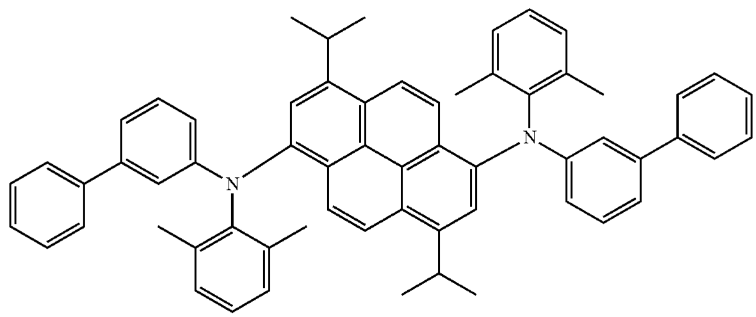
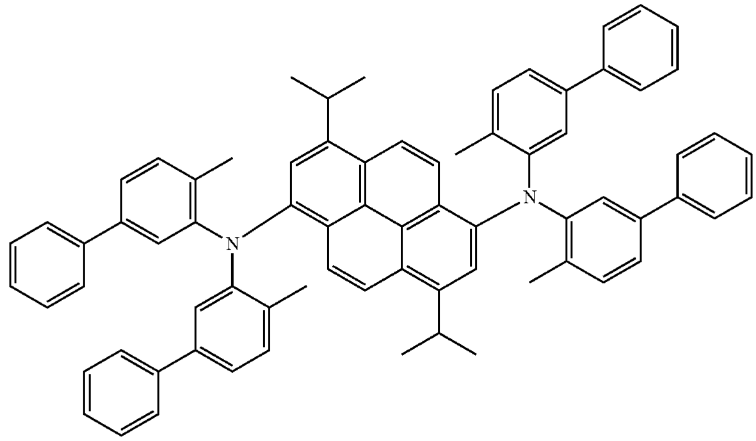

-continued
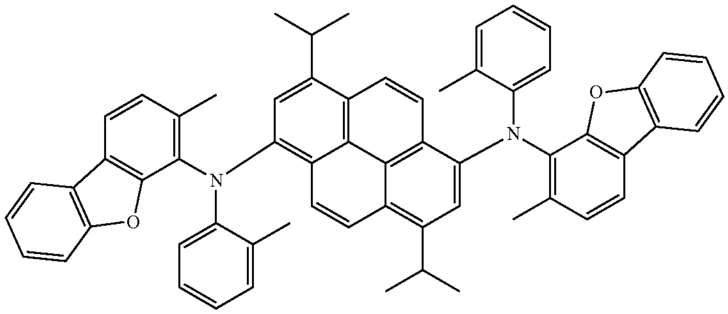
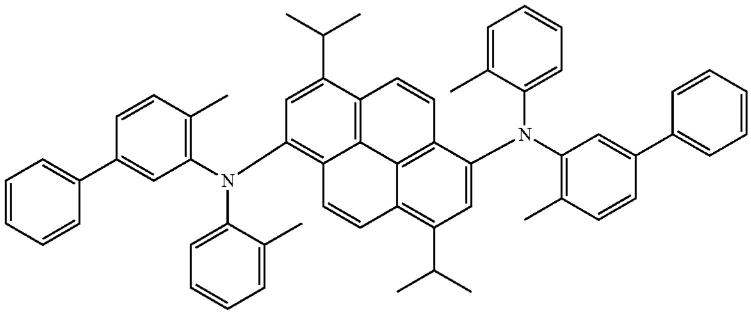
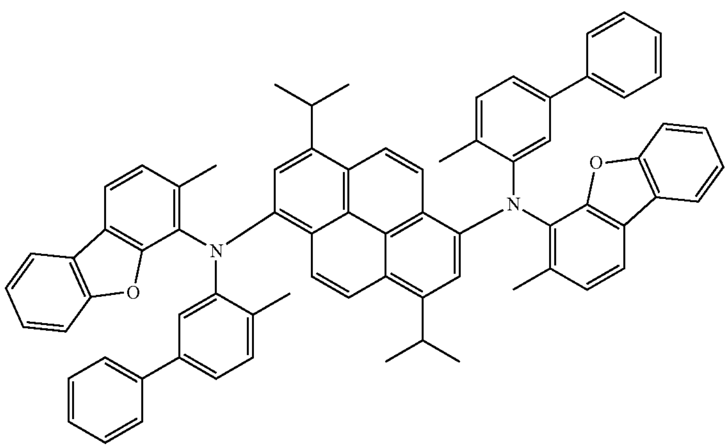
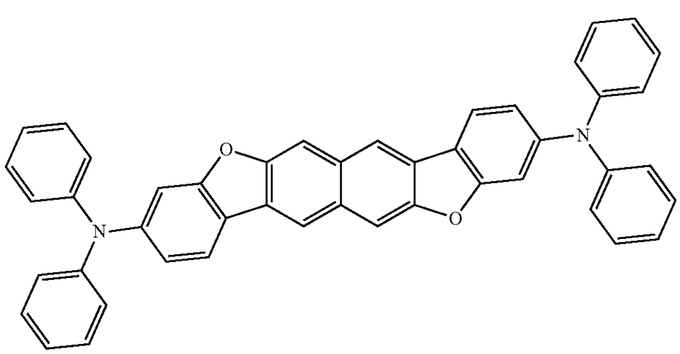

-continued
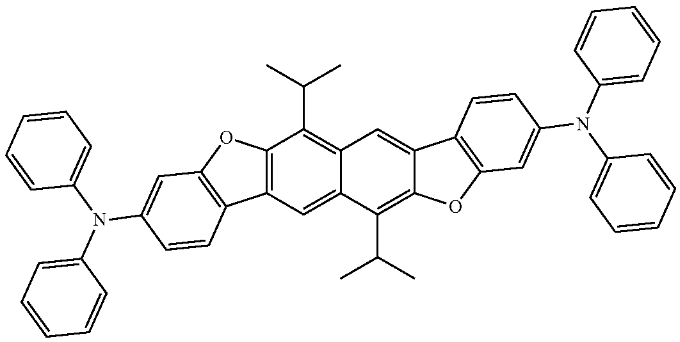
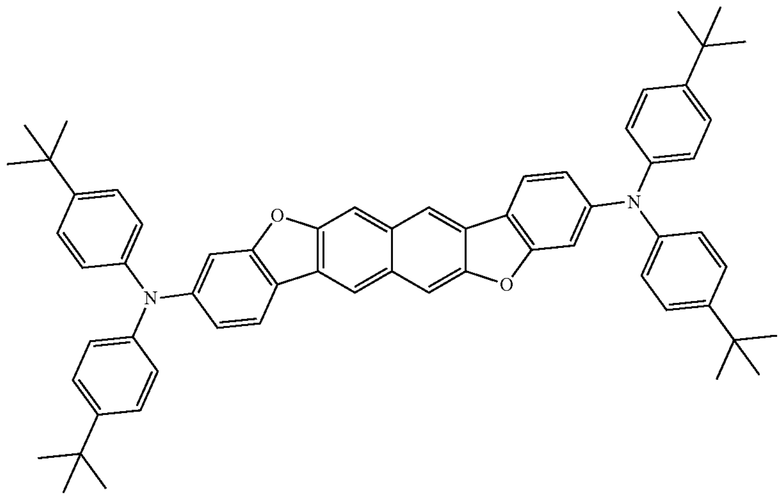
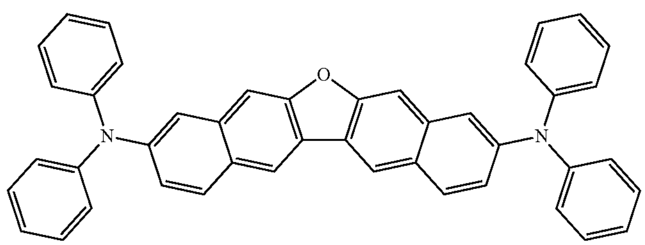
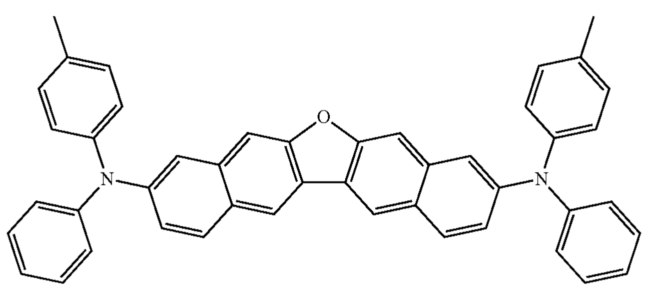
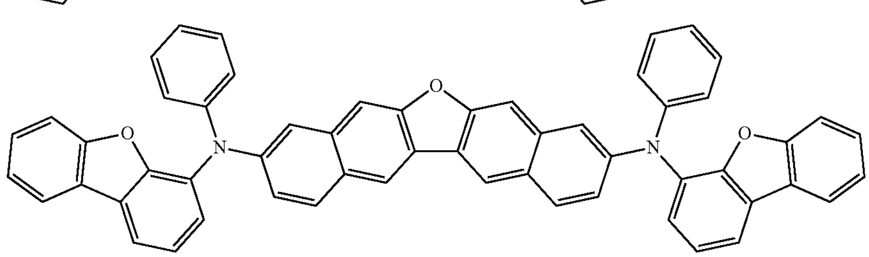

-continued
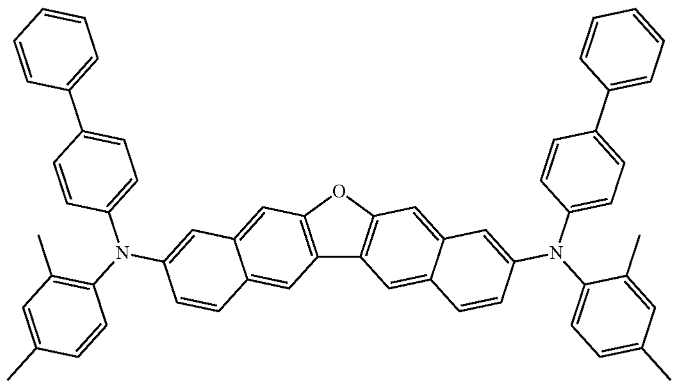
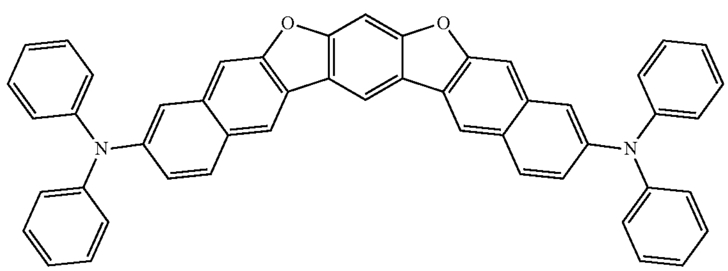
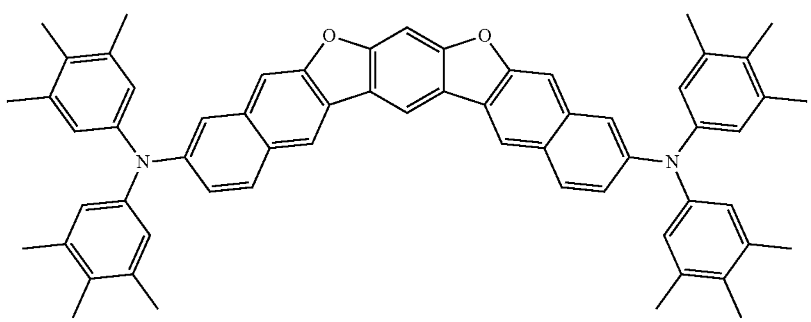
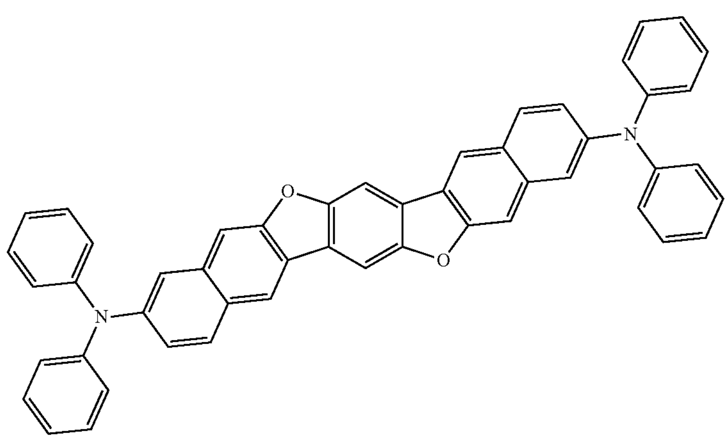

-continued
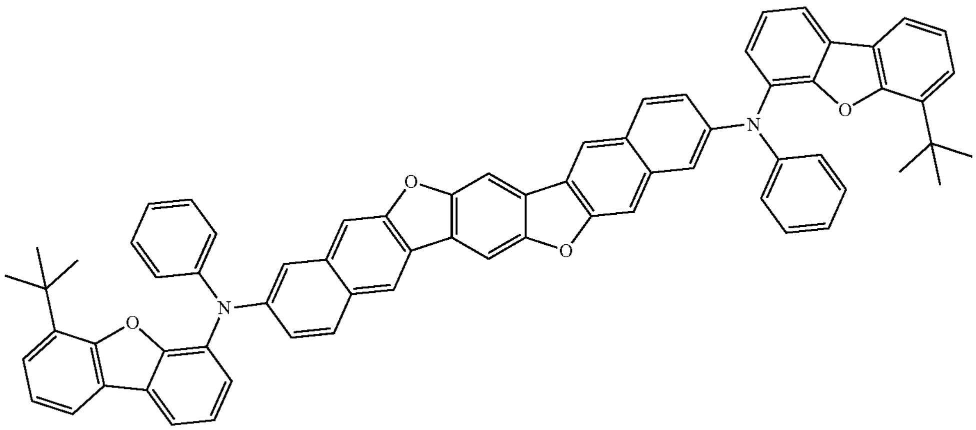
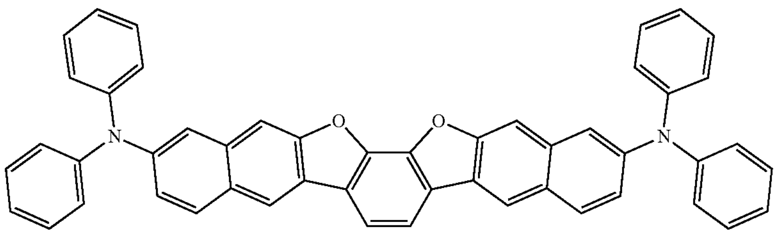
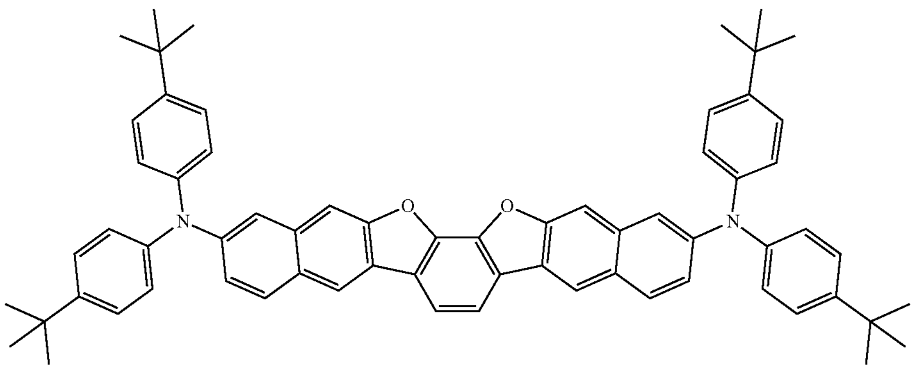
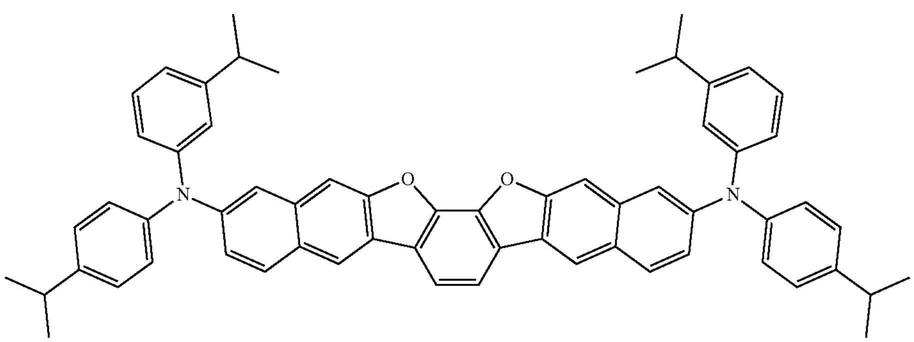
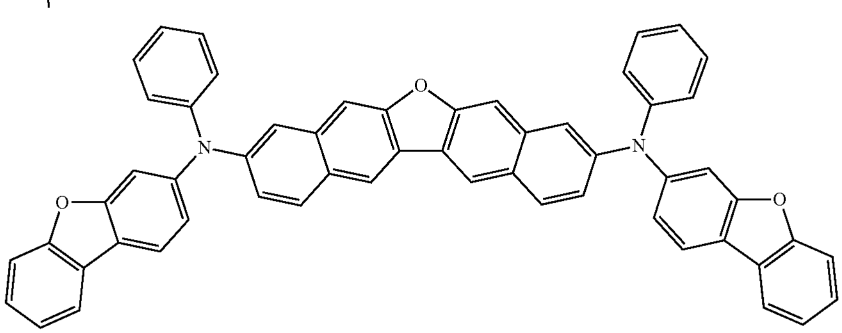

-continued

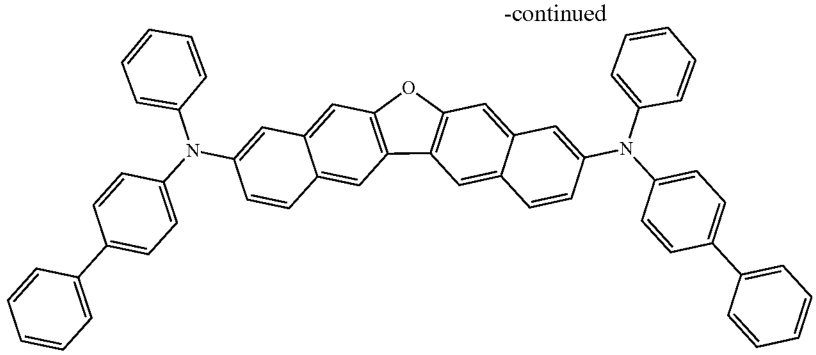

First Hole Transporting Zone of First Emitting Unit

Examples of layers forming the first hole transporting zone 131 in the first emitting unit 13 include a hole transporting layer, hole injecting layer, and electron blocking layer. It should be noted that the hole transporting layer also may serve as an electron blocking layer. The first hole transporting zone may be provided by a single layer or a plurality of layers.

The thickness $d_1$ of the first hole transporting zone 131 of the first emitting unit 13 is 60 nm or less, preferably in a range from 15 nm to 60 nm, more preferably in a range from 15 nm to 50 nm, further preferably in a range from 15 nm to 40 nm.

When the thickness $d_1$ of the first hole transporting zone 131 is 60 nm or less, more holes are likely to be supplied to the first emitting layer 132.

When the thickness $d_1$ of the first hole transporting zone 131 is 15 nm or more, the hole transfer to the first emitting layer 132 is easily adjusted.

When the first hole transporting zone 131 includes a plurality of layers, the thickness $d_1$ of the first hole transporting zone means a total thickness of the layers. The same applies to the thickness $d_2$ of the second hole transporting zone 151.

The thickness $d_1$ of the first hole transporting zone 131 is measured as follows.

A central part (reference numeral CL in FIG. 1) of the organic EL device 10 is cut in a direction perpendicular to a formation surface of the first hole transporting zone 131 (i.e., in a direction of the thickness $d_1$ of the first hole transporting zone 131). A cut surface of the central part is observed and measured with a transmission electron microscope (TEM).

The central part of the organic EL device 10 means a central part of a shape of the organic EL device 10 projected from the cathode 19. For instance, when the projected shape is rectangular, the central part means an intersection of diagonals of the rectangular shape. The thickness $d_2$ of the second hole transporting zone 151 can be measured by the same method.

Layer(s) forming the first hole transporting zone 131 and layer(s) forming the first electron transporting zone 133 will be described later.

Second Emitting Unit

Second Emitting Layer

The second emitting layer 152 preferably includes a host material and a dopant material.

The host material contained in the second emitting layer 152 is not particularly limited and a known host material is usable.

Examples of the known host material include an amine derivative, azine derivative and fused polycyclic aromatic derivative.

Examples of the amine derivative include a monoamine compound, diamine compound, triamine compound, tetramine compound, and amine compound substituted by a carbazole group.

Examples of the azine derivative are a monoazine derivative, diazine derivative and triazine derivative.

The fused polycyclic aromatic derivative is preferably a fused polycyclic aromatic hydrocarbon not having a heterocyclic skeleton. Examples of the fused polycyclic aromatic derivative include a fused polycyclic aromatic hydrocarbon such as naphthalene, anthracene, phenanthrene, chrysene, fluoranthene, and triphenylene, or a derivative of the fused polycyclic aromatic hydrocarbon.

The second emitting layer 152 may contain the compound represented by the formula (1) as the host material.

The dopant material contained in the second emitting layer 152 is not particularly limited and may be suitably selected from the fluorescent material and the phosphorescent material described under the subtitle "Dopant Material".

The second emitting layer 152 may contain the compound A as the dopant material. The second emitting layer 152 may contain the compound represented by the formula (A-1), the formula (A-2), or the formula (A-3) as the compound A.

A color emitted by the second emitting layer 152 is not particularly limited. The second emitting layer 152 may be a fluorescent layer or a phosphorescent layer in the same manner as the first emitting layer 132. The second emitting layer 152 may be provided by a single layer or a plurality of layers. When the second emitting layer 152 includes a plurality of layers, the second emitting layer 152 may be a layer in which a fluorescent layer and a phosphorescent layer are combined.

The second emitting layer 152 is preferably a blue fluorescent layer or a yellow phosphorescent layer.

Specifically, when the organic EL device 10 is of a top emission type, the second emitting layer 152 is preferably a blue fluorescent layer. In this case, the second emitting layer 152 preferably contains the compound represented by the formula (1) and the compound A, more preferably contains the compound represented by the formula (1) and the compound represented by the formula (A-1), the formula (A-2), or the formula (A-3) as the compound A.

When the organic EL device 10 is of a bottom emission type, the second emitting layer 152 is preferably a yellow phosphorescent layer.

The first emitting layer 132 and the second emitting layer 152 may have the same structure or mutually different structures.

A preferable combination of the first emitting layer 132 and the second emitting layer 152 is exemplified by the following embodiments:

- an embodiment in which the first emitting layer 132 and the second emitting layer 152 are both a blue fluorescent layer when the organic EL device 10 is of top emission type;
- an embodiment in which the first emitting layer 132 is a blue fluorescent layer and the second emitting layer 152 is a yellow phosphorescent layer when the organic EL device 10 is of a bottom emission type;
- an embodiment in which the first emitting layer 132 is a yellow fluorescent layer and the second emitting layer 152 is a blue fluorescent layer when the organic EL device 10 is of a top emission type or a bottom emission type; and
- an embodiment in which the first emitting layer 132 is a blue fluorescent layer and the second emitting layer 152 is a yellow fluorescent layer when the organic EL device 10 is of a top emission type.

Second Hole Transporting Zone of Second Emitting Unit

Examples of layers forming the second hole transporting zone 151 in the second emitting unit 15 include the same layers as those forming the first hole transporting zone 131. The second hole transporting zone 151 may be provided by a single layer or a plurality of layers.

The thickness $d_2$ of the second hole transporting zone 151 is preferably in a range from 5 nm to 70 nm, more preferably in a range from 10 nm to 60 nm, further preferably in a range from 10 nm to 55 nm.

When the thickness $d_2$ of the second hole transporting zone 151 is 70 nm or less, more holes are supplied to the second emitting layer 152.

When the thickness $d_2$ of the second hole transporting zone 151 is 5 nm or more, the hole transfer to the second emitting layer 152 is easily adjusted.

Layer(s) forming the second hole transporting zone 151 and layer(s) forming the second electron transporting zone 153 will be described later.

Second Exemplary Embodiment

An organic EL device according to a second exemplary embodiment is different from the organic EL device according to the first exemplary embodiment in that the first hole transporting zone of the first emitting unit includes two or more layers and the second hole transporting zone of the second emitting unit includes two or more layers. Since the organic EL device in the second exemplary embodiment is otherwise the same as the organic EL device in the first exemplary embodiment, the description of the same features is omitted or simplified.

Figure 2:
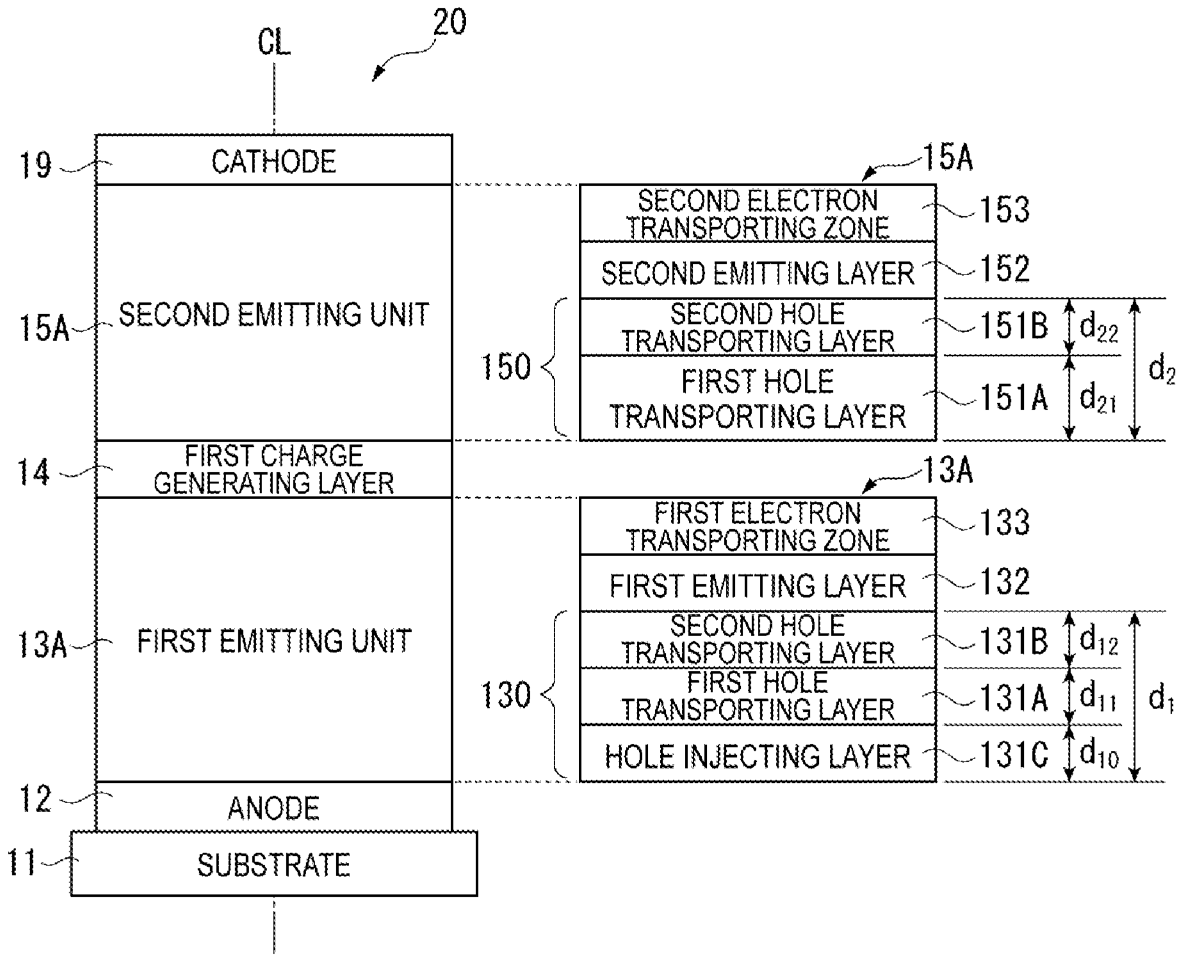
FIG. 2 schematically shows an exemplary arrangement of an organic EL device according to a second exemplary embodiment.

FIG. 2 schematically shows an exemplary arrangement of the organic EL device according to the second exemplary embodiment.

An organic EL device 20 shown in FIG. 2 includes the anode 12, a first emitting unit 13A, the first charge generating layer 14, a second emitting unit 15A, and the cathode 19, which are laminated on the substrate 11 in this order.

In the first emitting unit 13A, a first hole transporting zone 130 includes a hole injecting layer 131C, a first hole transporting layer 131A, and a second hole transporting layer 131B. The second hole transporting layer 131B of the first emitting unit 13A is in contact with the first emitting layer 132 and the hole injecting layer 131C is in contact with the anode 12. A thickness $d_1$ of the first hole transporting zone 130 (i.e., a total thickness of a thickness $d_{10}$ of the hole injecting layer 131C, a thickness $d_{11}$ of the first hole transporting layer 131A and a thickness $d_{12}$ of the second hole transporting layer 131B) is 60 nm or less. The first emitting layer 132 of the first emitting unit 13A contains the compound represented by the formula (1).

In the second emitting unit 15A, a second hole transporting zone 150 includes a first hole transporting layer 151A and a second hole transporting layer 151B. The second hole transporting layer 151B of the second emitting unit 15A is in contact with the second emitting layer 152 and the first hole transporting layer 151A of the second emitting unit 15A is in contact with the first charge generating layer 14. A thickness $d_2$ of the second hole transporting zone 150 (i.e., a total thickness of a thickness $d_{21}$ of the first hole transporting layer 151A and a thickness $d_{22}$ of the second hole transporting layer 151B) is preferably in a range from 5 nm to 70 nm. The second emitting layer 152 of the second emitting unit 15A preferably contains the compound represented by the formula (1).

In the organic EL device 20 according to the second exemplary embodiment, the first hole transporting zone 130 includes two layers, whereby the hole transfer to the first emitting layer 132 is easily adjusted. In the organic EL device 20 according to the second exemplary embodiment, the second hole transporting zone 150 includes two layers, whereby the hole transfer to the second emitting layer 152 is easily adjusted.

Accordingly, according to the second exemplary embodiment, the organic EL device 20 and emitting light with a long lifetime at a low voltage can be achieved.

Preferable embodiment(s) of the second exemplary embodiment will be described below.

In the first emitting unit 13A:

- the first hole transporting zone 130 preferably includes two or more layers, more preferably two to four layers, further preferably two to three layers;
- the thickness $d_{10}$ of the hole injecting layer 131C of the first hole transporting zone 130 is preferably in a range from 2 nm to 15 nm, more preferably in a range from 5 nm to 12 nm;
- the thickness $d_{11}$ of the first hole transporting layer 131A of the first hole transporting zone 130 is preferably in a range from 5 nm to 50 nm, more preferably in a range from 10 nm to 30 nm;
- the thickness $d_{12}$ of the second hole transporting layer 131B of the first hole transporting zone 130 is preferably in a range from 2 nm to 20 nm, more preferably in a range from 5 nm to 15 nm;
- a preferable range of the thickness $d_1$ of the first hole transporting zone 130 (a total thickness of the thickness $d_{10}$, the thickness $d_{11}$ and the thickness $d_{12}$) is the same range as that of the thickness $d_1$ of the first hole transporting zone 130 described in the first exemplary embodiment; and
- a ratio ($d_{12}/d_{11}$) of the thickness $d_{12}$ of the second hole transporting layer 131B to the thickness $d_{11}$ of the first hole transporting layer 131A in the first hole transporting zone 130 is preferably in a range from 0.1 to 0.95, more preferably in a range from 0.1 to 0.9.

In the second emitting unit 15A:

- the second hole transporting zone 150 preferably includes two or more layers, more preferably two to four layers, further preferably two to three layers;

the thickness $d_{21}$ of the first hole transporting layer 151A of the second hole transporting zone 150 is preferably in a range from 5 nm to 60 nm, more preferably in a range from 10 nm to 50 nm;

the thickness $d_{22}$ of the second hole transporting layer 151B of the second hole transporting zone 150 is preferably in a range from 2 nm to 20 nm, more preferably in a range from 5 nm to 15 nm;

a preferable range of the thickness $d_2$ of the second hole transporting zone 150 (a total thickness of the thickness $d_{21}$ and the thickness $d_{22}$) is the same range as that of the thickness $d_2$ of the second hole transporting zone 150 described in the first exemplary embodiment;

a ratio ($d_{22}/d_{21}$) of the thickness $d_{22}$ of the second hole transporting layer 151B to the thickness $d_{21}$ of the first hole transporting layer 151A in the second hole transporting zone 150 is preferably in a range from 0.1 to 0.95, more preferably in a range from 0.1 to 0.9; and it is preferable that the first emitting layer 132 of the first emitting unit 13A and the second emitting layer 152 of the second emitting unit 15A have the same structures as those of the first emitting layer 132 and the second emitting layer 152 in the first exemplary embodiment, respectively.

The embodiments of a preferable combination of the first emitting layer 132 and the second emitting layer 152 are the same as the embodiments of a preferable combination described in the first exemplary embodiment.

Third Exemplary Embodiment

An organic EL device according to a third exemplary embodiment is different from the organic EL device according to the first exemplary embodiment in that the organic EL device according to the third exemplary embodiment further includes a second charge generating layer and a third emitting unit between the second emitting unit and the cathode. Since the organic EL device is otherwise the same as the organic EL device in the first exemplary embodiment, the description of the same features is omitted or simplified.

Figure 3:
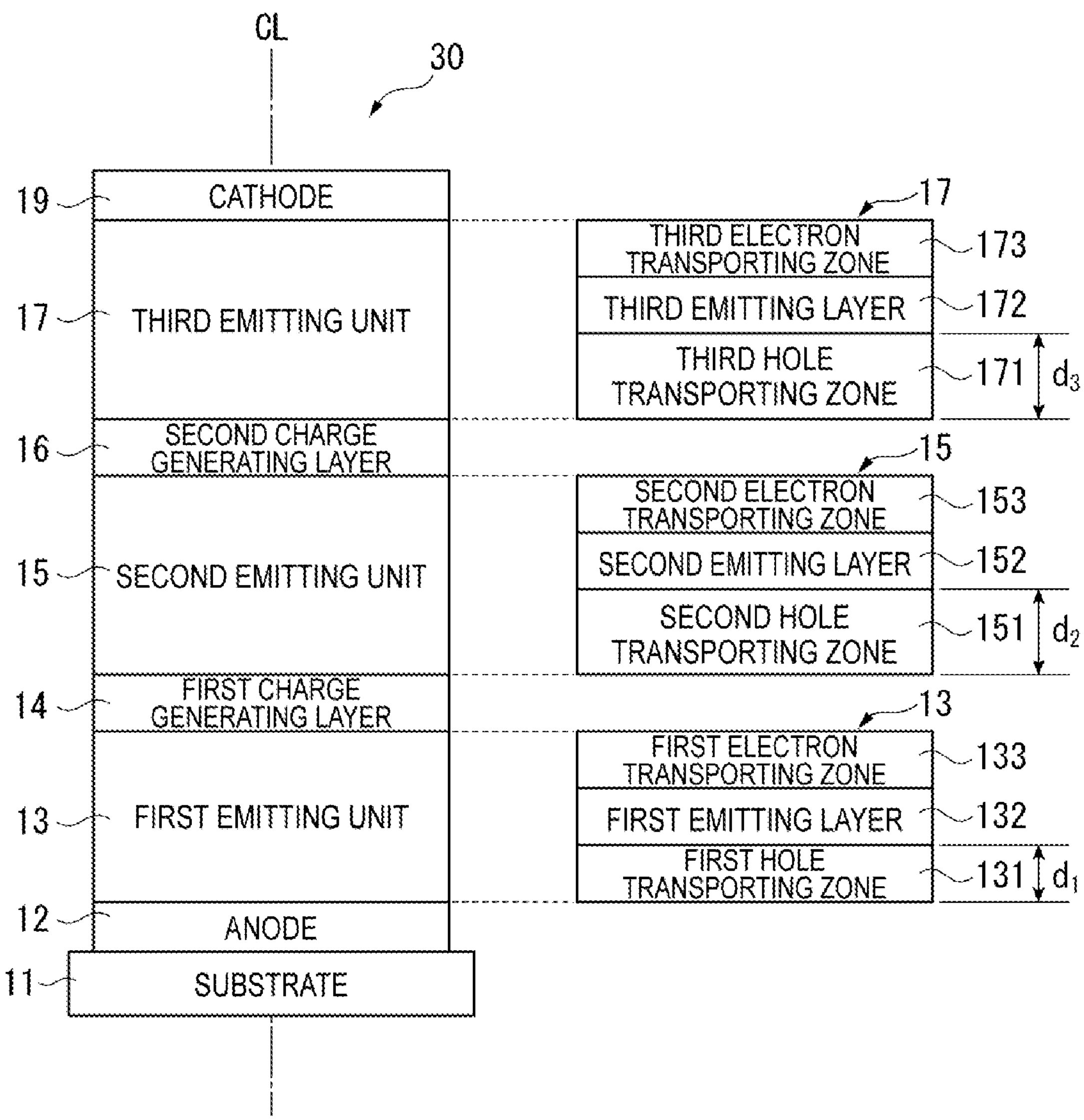
FIG. 3 schematically shows an exemplary arrangement of an organic EL device according to a third exemplary embodiment.

FIG. 3 schematically shows an exemplary arrangement of the organic EL device according to the third exemplary embodiment.

An organic EL device 30 shown in FIG. 3 includes the anode 12, the first emitting unit 13, the first charge generating layer 14, the second emitting unit 15, a second charge generating layer 16, a third emitting unit 17 and the cathode 19, which are laminated on the substrate 11 in this order.

The first emitting unit 13 and the second emitting unit 15 have the same structures as those of the first emitting unit 13 and the second emitting unit 15 in the first exemplary embodiment, respectively (see FIG. 1).

The third emitting unit 17 includes a third hole transporting zone 171, a third emitting layer 172 and a third electron transporting zone 173, which are laminated in this order from the second emitting unit 15.

The third hole transporting zone 171 of the third emitting unit 17 is in contact with the third emitting layer 172 and the second charge generating layer 16. A thickness $d_3$ of the third hole transporting zone 171 is preferably in a range from 5 nm to 70 nm. The third emitting layer 172 preferably contains the compound represented by the formula (1).

It is considered that a higher current efficiency is achievable since the organic EL device 30 according to the third exemplary embodiment includes three emitting units. Accordingly, according to the third exemplary embodiment, the organic EL device 30 emitting light with a long lifetime at a low voltage can be achieved.

Preferable embodiment(s) of the third exemplary embodiment will be described below.

Third Emitting Unit

Third Emitting Layer

The third emitting layer 172 preferably includes a host material and a dopant material.

A known host material (e.g., an amine derivative, azine derivative and fused polycyclic aromatic derivative) described in relation to the second emitting layer 152 is usable as the host material contained in the third emitting layer 172.

The third emitting layer 172 preferably contains the compound represented by the formula (1) as a host material.

The dopant material contained in the third emitting layer 172 is not particularly limited but may be the fluorescent material and the phosphorescent material described under the subtitle "Dopant Material". In addition, the third emitting layer 172 may contain the compound A as the dopant material, the compound A being the compound represented by the formula (A-1), the formula (A-2), or the formula (A-3).

The third emitting layer 172 preferably contains the compound represented by the formula (1) and the compound A. The third emitting layer 172 more preferably contains the compound represented by the formula (1) and the compound represented by the formula (A-1) or the formula (A-2) as the compound A.

A color emitted by the third emitting layer 172 is not particularly limited. The third emitting layer 172 may be a fluorescent layer or a phosphorescent layer in the same manner as the first emitting layer 132. The third emitting layer 172 may be provided by a single layer or a plurality of layers. When the third emitting layer 172 includes a plurality of layers, the third emitting layer 172 may be a layer in which a fluorescent layer and a phosphorescent layer are combined.

The third emitting layer 172 is preferably a blue fluorescent layer. The first emitting layer 132, the second emitting layer 152 and the third emitting layer 172 may have the same structure or mutually different structures.

It is preferable that the first emitting layer 132 of the first emitting unit 13 and the second emitting layer 152 of the second emitting unit 15 have the same structures as those of the first emitting layer 132 and the second emitting layer 152 in the first exemplary embodiment, respectively.

A preferable combination of the first emitting layer 132, the second emitting layer 152 and the third emitting layer 172 is exemplified by the following embodiments:

an embodiment in which the first emitting layer 132, the second emitting layer 152 and the third emitting layer 172 are all a blue fluorescent layer when the organic EL device 10 is of top emission type;

an embodiment in which the first emitting layer 132 is a blue fluorescent layer, the second emitting layer 152 is a yellow phosphorescent layer and the third emitting layer 172 is a blue fluorescent layer when the organic EL device 10 is of a bottom emission type; and an embodiment in which the first emitting layer 132 is a yellow fluorescent layer, the second emitting layer 152 is a blue fluorescent layer and the third emitting layer 172 is a blue fluorescent layer when the organic EL device 10 is of a bottom emission type.

Third Hole Transporting Zone of Third Emitting Unit

Examples of layers forming the third hole transporting zone 171 in the third emitting unit 17 include the same layers as those forming the first hole transporting zone 131. The third hole transporting zone 171 may be provided by a single layer or a plurality of layers.

In the third emitting unit 17, the third hole transporting zone 171 preferably includes two or more layers, more preferably two to four layers, further preferably two to three layers.

The thickness $d_3$ of the third hole transporting zone 171 is preferably in a range from 5 nm to 70 nm, more preferably in a range from 10 nm to 60 nm, further preferably in a range from 10 nm to 50 nm.

When the thickness $d_3$ of the third hole transporting zone 171 is 70 nm or less, more holes are likely to be supplied to the third emitting layer 172.

When the thickness $d_3$ of the third hole transporting zone 171 is 5 nm or more, the hole transfer to the third emitting layer 172 is easily adjusted.

Fourth Exemplary Embodiment

An organic EL device according to a fourth exemplary embodiment is different from the organic EL device according to the third exemplary embodiment in that the first hole transporting zone of the first emitting unit, the second hole transporting zone of the second emitting unit and the third hole transporting zone of the third emitting unit each include two or more layers. Since the organic EL device in the fourth exemplary embodiment is otherwise the same as the organic EL device in the third exemplary embodiment, the description of the same features is omitted or simplified.

Figure 4:
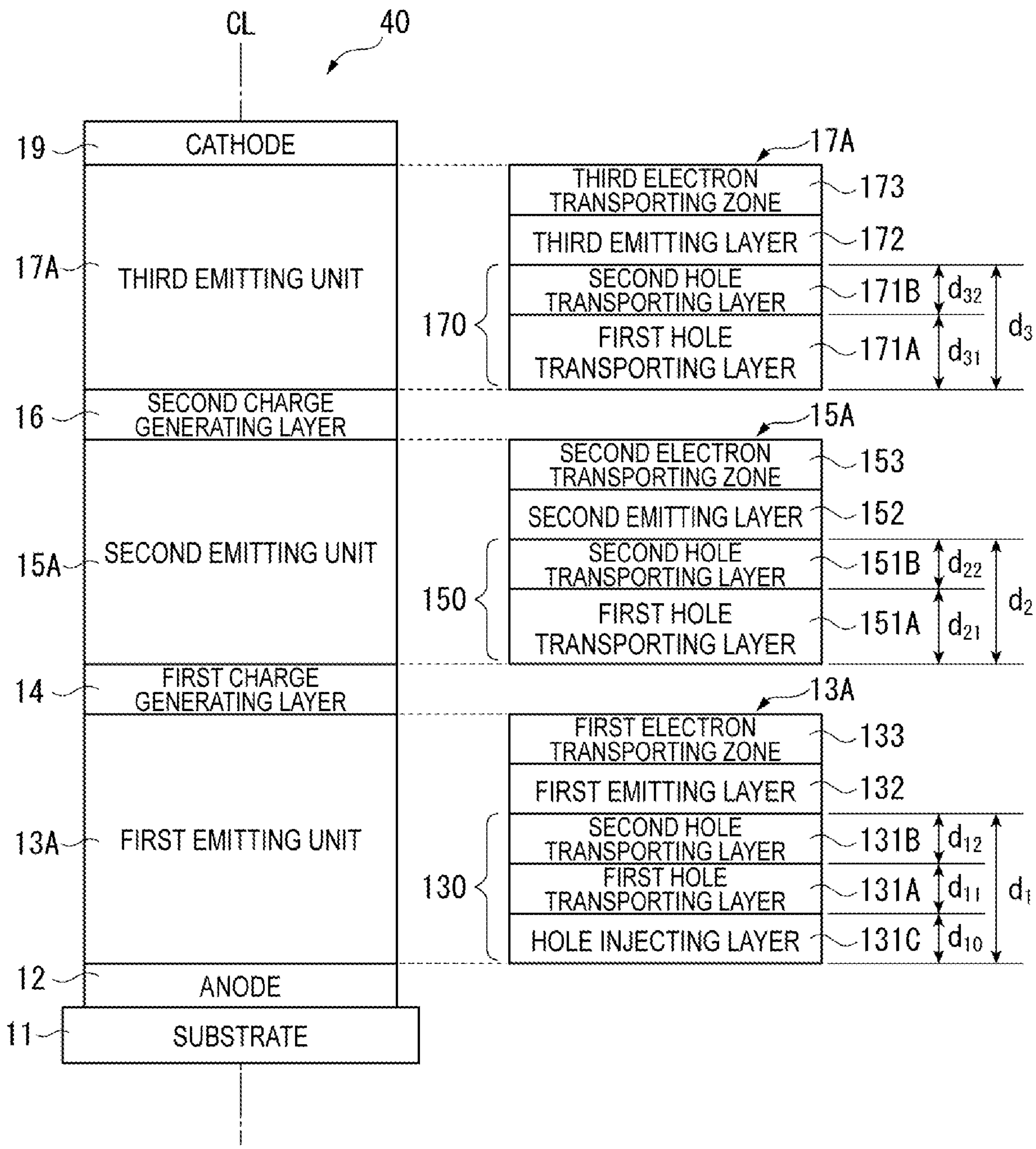
FIG. 4 schematically shows an exemplary arrangement of an organic EL device according to a fourth exemplary embodiment.

FIG. 4 schematically shows an exemplary arrangement of the organic EL device according to the fourth exemplary embodiment.

An organic EL device 40 shown in FIG. 4 includes the anode 12, the first emitting unit 13A, the first charge generating layer 14, the second emitting unit 15A, the second charge generating layer 16, a third emitting unit 17A and the cathode 19, which are laminated on the substrate 11 in this order.

The first emitting unit 13A and the second emitting unit 15A have the same structures as those of the first emitting unit 13A and the second emitting unit 15A in the second exemplary embodiment, respectively (see FIG. 2).

In the third emitting unit 17A, a third hole transporting zone 170 includes a first hole transporting layer 171A and a second hole transporting layer 171B. The second hole transporting layer 171B of the third emitting unit 17A is in contact with the third emitting layer 172 and the first hole transporting layer 171A of the third emitting unit 17A is in contact with the second charge generating layer 16. A thickness $d_3$ of the third hole transporting zone 170 (i.e., a total thickness of a thickness $d_{31}$ of the first hole transporting layer 171A and a thickness $d_{32}$ of the second hole transporting layer 171B) is preferably in a range from 5 nm to 70 nm. The third emitting layer 172 preferably contains the compound represented by the formula (1).

The organic EL device 40 according to the fourth exemplary embodiment includes three emitting units and a hole transporting zone of each of the emitting units includes two layers, whereby the hole transfer to the first emitting layer 132, the second emitting layer 152 and the third emitting layer 172 is easily adjusted.

Accordingly, according to the fourth exemplary embodiment, the organic EL device 40 emitting light with a long lifetime at a low voltage can be achieved.

Preferable embodiment(s) of the fourth exemplary embodiment will be described below.

In the third emitting unit 17A, the third hole transporting zone 170 preferably includes two or more layers, more preferably two to four layers, further preferably two to three layers.

The thickness $d_{31}$ of the first hole transporting layer 171A of the third hole transporting zone 170 is preferably in a range from 3 nm to 50 nm, more preferably in a range from 5 nm to 40 nm.

The thickness $d_{32}$ of the second hole transporting layer 171B of the third hole transporting zone 170 is preferably in a range from 2 nm to 20 nm, more preferably in a range from 5 nm to 15 nm.

The thickness $d_3$ of the third hole transporting zone 170 (a total thickness of the thickness $d_{31}$ and the thickness $d_{32}$) is preferably in a range from 5 nm to 70 nm, more preferably in a range from 10 nm to 50 nm.

A ratio ($d_{32}/d_{31}$) of the thickness $d_{32}$ of the second hole transporting layer 171B to the thickness $d_{31}$ of the first hole transporting layer 171A in the third hole transporting zone 170 is preferably in a range from 0.1 to 0.95, more preferably in a range from 0.1 to 0.9.

It is preferable that the first emitting layer 132 of the first emitting unit 13A, the second emitting layer 152 of the second emitting unit 15A and the third emitting layer 172 of the third emitting unit 17A have the same structures as those of the first emitting layer 132, the second emitting layer 152 and the third emitting layer 172 in the third exemplary embodiment, respectively.

The embodiments of a preferable combination of the first emitting layer 132, the second emitting layer 152 and the third emitting layer 172 are the same as the embodiments of the preferable combination described in the third exemplary embodiment.

Fifth Exemplary Embodiment

An organic EL device according to a fifth exemplary embodiment is different from the organic EL device according to the first exemplary embodiment in that the organic EL device according to the fifth exemplary embodiment further includes a fourth emitting unit between the first emitting unit and the second emitting unit.

Figure 5:
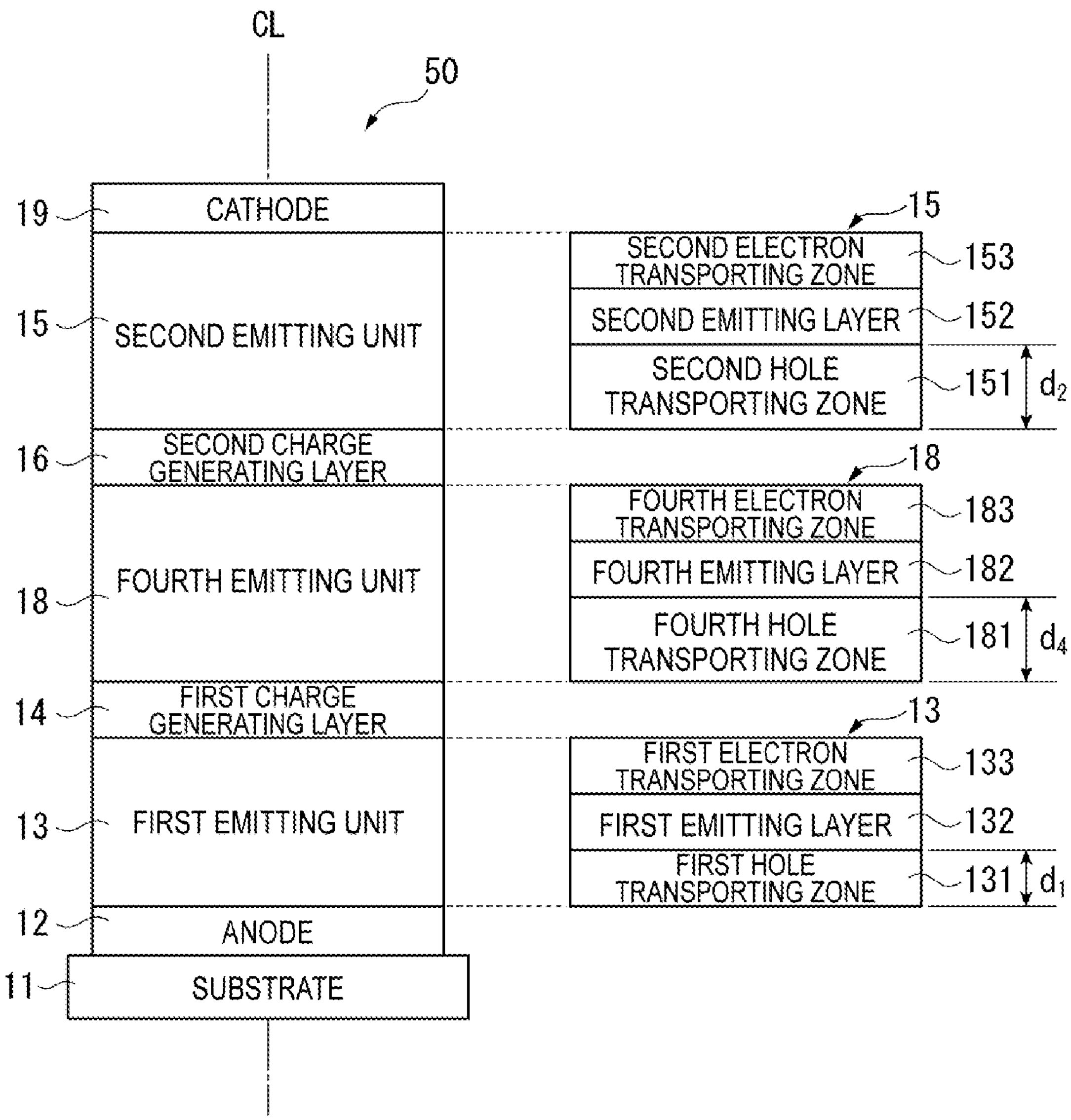
FIG. 5 schematically shows an exemplary arrangement of an organic EL device according to a fifth exemplary embodiment.

FIG. 5 schematically shows an exemplary arrangement of the organic EL device according to the fifth exemplary embodiment.

An organic EL device 50 shown in FIG. 5 includes the anode 12, the first emitting unit 13, the first charge generating layer 14, a fourth emitting unit 18, the second charge generating layer 16, the second emitting unit 15, and the cathode 19, which are laminated on the substrate 11 in this order.

The first emitting unit 13 has the same structure as that of the first emitting unit 13 in the first exemplary embodiment (see FIG. 1).

The fourth emitting unit 18 includes a fourth hole transporting zone 181, a fourth emitting layer 182 and a fourth electron transporting zone 183, which are laminated in this order from the first emitting unit 13. The fourth hole transporting zone 181 of the fourth emitting unit 18 is in contact with the fourth emitting layer 182 and the first charge generating layer 14. A thickness $d_4$ of the fourth hole transporting zone 181 is preferably in a range from 5 nm to 70 nm.

The structure of the fourth emitting unit 18 in the fifth exemplary embodiment is not particularly limited.

It is preferable that the fourth emitting unit 18 in the fifth exemplary embodiment has the same structure as that of the second emitting unit 15 in the third exemplary embodiment or the second emitting unit 15A in the fourth exemplary embodiment.

The second emitting unit 15 includes the second hole transporting zone 151, the second emitting layer 152 and the second electron transporting zone 153, which are laminated in this order from the fourth emitting unit 18.

The second hole transporting zone 151 of the second emitting unit 15 is in contact with the second emitting layer 152 and the second charge generating layer 16. A thickness $d_3$ of the second hole transporting zone 151 is preferably in a range from 5 nm to 70 nm. The second emitting layer 152 preferably contains the compound represented by the formula (1).

The structure of the second emitting unit 15 in the fifth exemplary embodiment is not particularly limited.

It is preferable that the second emitting unit 15 in the fifth exemplary embodiment has the same structure as that of the third emitting unit 17 in the third exemplary embodiment or the third emitting unit 17A in the fourth exemplary embodiment.

It is considered that a higher current efficiency is achievable since the organic EL device 50 according to the fifth exemplary embodiment includes three emitting units. Accordingly, according to the fifth exemplary embodiment, the organic EL device 50 emitting light with a long lifetime at a low voltage can be achieved.

The structure in common among the organic EL devices according to the first exemplary embodiment to the fifth exemplary embodiment will be described. In the following description, the first hole transporting zone to the fourth hole transporting zone, when are not distinguished from each other, may be simply referred to as the "hole transporting zone." Similarly, the first electron transporting zone to the fourth electron transporting zone, the first hole transporting layer and the second hole transporting layer, the first electron transporting layer and the second electron transporting layer, and the first charge generating layer and the second charge generating layer may be simply referred to as the "electron transporting zone," the "hole transporting layer," the "electron transporting layer," and the "charge generating layer," respectively.

Hole Transporting Zone

Hole Transporting Layer

The hole transporting layer is a layer containing a substance exhibiting a high hole transportability (preferably having a hole mobility of $10^{-6}$ $cm^2/[V \cdot s]$ or more). An aromatic amine compound, carbazole derivative, anthracene derivative and the like are usable for the hole transporting layer. Specific examples of the substance usable for the hole transporting layer include an aromatic amine compound such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluorene-9-yl)triphenylamine (abbreviation: BAFLP), 4,4'-bis[N-(9,9-dimethylfluorene-2-yl)-N-phenylamino]biphenyl (abbreviation: DFLDPBi), 4,4',4"-tris(N,N-diphenylamino)triphenylamine (abbreviation: TDATA), 4,4',4"-tris[N-(3-methylphenyl)-N-phenylamino] triphenylamine (abbreviation: MTDATA), and 4,4'-bis[N-(spiro-9,9'-bifluorene-2-yl)-N-phenylamino]biphenyl (abbreviation: BSPB).

A carbazole derivative such as CBP, CzPA, and PCzPA and an anthracene derivative such as t-BuDNA, DNA, and DPAnth may be used for the hole transporting layer. A high polymer compound such as poly(N-vinylcarbazole) (abbreviation: PVK) and poly(4-vinyltriphenylamine) (abbreviation: PVTPA) is also usable.

However, in addition to the above substances, any substance exhibiting a higher hole transportability than an electron transportability may be used. It should be noted that the layer containing the substance exhibiting a high hole transportability may be not only a single layer but also a laminate of two or more layers formed of the above substance(s).

Hole Injecting Layer

The hole injecting layer is a layer containing a substance exhibiting a high hole injectability. Examples of the substance exhibiting a high hole injectability include molybdenum oxide, titanium oxide, vanadium oxide, rhenium oxide, ruthenium oxide, chrome oxide, zirconium oxide, hafnium oxide, tantalum oxide, silver oxide, tungsten oxide, and manganese oxide.

Examples of the substance exhibiting a high hole injectability further include: an aromatic amine compound, which is a low-molecule organic compound, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1).

A high polymer compound (e.g., oligomer, dendrimer and polymer) is also usable as the substance exhibiting a high hole injectability. Examples of the high polymer compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), and poly[N,N'-bis(4-butylphenyl)-N,N'-bis(phenyl)benzidine] (abbreviation: Poly-TPD). Moreover, an acid-added high polymer compound such as poly(3,4-ethylenedioxythiophene)/poly(styrene sulfonic acid) (PEDOT/PSS) and polyaniline/poly(styrene sulfonic acid)(PAni/PSS) are also usable.

Electron Transporting Zone

Examples of layers forming the electron transporting zone include an electron transporting layer, an electron injecting layer, and a hole blocking layer. It should be noted that the electron transporting layer also may serve as a hole blocking layer. The electron transporting zone may be provided by a single layer or a plurality of layers.

Electron Transporting Layer

The electron transporting layer is a layer containing a substance exhibiting a high electron transportability (preferably an electron mobility of $10^{-6}$ $cm^2/[V \cdot s]$ or more). For the electron transporting layer, 1) a metal complex such as an aluminum complex, beryllium complex, and zinc complex, 2) a hetero aromatic compound such as an imidazole derivative, benzimidazole derivative, azine derivative, carbazole derivative, and phenanthroline derivative, and 3) a high polymer compound are usable. Specifically, as a low molecular organic compound, the metal complex such as Alq, tris(4-methyl-8-quinolinolato)aluminum (abbreviation: Almq3), bis(10-hydroxybenzo[h]quinolinato)beryllium (abbreviation: $BeBq_2$), BAlq, Znq, ZnPBO, and ZnBTZ are usable. In addition to the metal complex, a hetero aromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) is usable. It should be noted that any substance other than the above substance may be used for the electron transporting layer as long as the substance exhibits a higher electron transportability than the hole transportability. The electron transporting layer may be not only a single layer but also a laminate of two or more layers formed of the above substance(s).

Moreover, a high polymer compound is usable for the electron transporting layer. For instance, poly[(9,9-dihexylfluorene-2,7-diyl)-co-(pyridine-3,5-diyl)](abbreviation: PF-Py), and poly[(9,9-dioctylfluorene-2,7-diyl)-co-(2,2'-bipyridine-6,6'-diyl)] (abbreviation: PF-BPy) are usable.

Electron Injecting Layer

The electron injecting layer is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride ($CaF_2$), and lithium oxide (LiOx). In addition, a substance containing an alkali metal, alkaline earth metal or a compound thereof in the substance having an electron transportability, specifically, a substance containing magnesium (Mg) in Alq may be used for the electron injecting layer. In this case, the electrons can be more efficiently injected from the cathode.

Alternatively, the electron injecting layer may be provided by a composite material in a form of a mixture of the organic compound and the electron donor. Such a composite material exhibits excellent electron injectability and electron transportability since electrons are generated in the organic compound by the electron donor. In this case, the organic compound is preferably a material excellent in transporting the generated electrons. Specifically, the above examples (e.g., the metal complex and the hetero aromatic compound) of the substance forming the electron transporting layer are usable. As the electron donor, any substance exhibiting electron donating property to the organic compound is usable. Specifically, the electron donor is preferably an alkali metal, alkaline earth metal and rare earth metal, examples of which include lithium, cesium, magnesium, calcium, erbium and ytterbium. The electron donor is also preferably alkali metal oxide and alkaline earth metal oxide, examples of which include lithium oxide, calcium oxide and barium oxide. Moreover, a Lewis base such as magnesium oxide is usable. Further, the organic compound such as tetrathiafulvalene (abbreviation: TTF) is usable.

Charge Generating Layer

The charge generating layer may be a single layer but preferably contains the N layer configured to inject electrons into the anode and the P layer configured to inject holes into the cathode.

It should be noted that the charge generating layer may have other layer(s) (e.g., an organic layer, metal layer, and metal oxide layer) between the N layer and the P layer.

N Layer

The N layer preferably contains a π electron-deficient compound and an electron donating material.

π Electron-Deficient Compound

The π electron-deficient compound is exemplified by a compound capable of coordinating with a metal atom. Specifically, such a compound is exemplified by a phenanthroline compound, a benzimidazole compound, and quinolinol.

The phenanthroline compound is preferably compounds represented by respective formulae (I') to (III') below, among which the compounds represented by the formulae (I') and (II') are preferable.

(I')

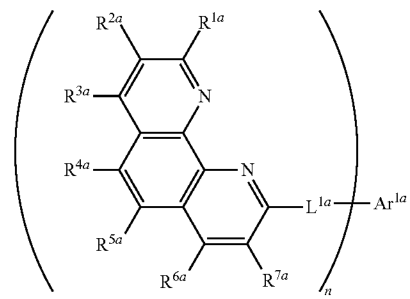

(II')

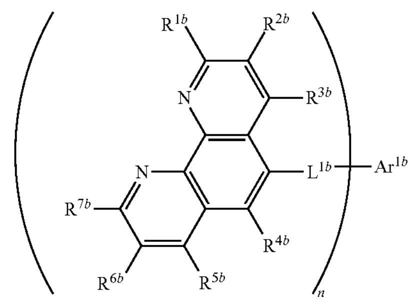

(III')

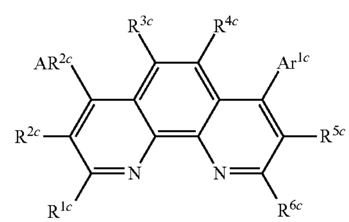

In the formulae (I') to (III∝), $R^{1a}$ to $R^{7a}$, $R^{1b}$ to $R^{7b}$, and $R^{1c}$ to $R^{6c}$ are each independently a hydrogen atom, a substituted or unsubstituted aryl group having 6 to 30 ring carbon atoms, a substituted or unsubstituted pyridyl group, a substituted or unsubstituted quinolyl group, a substituted or unsubstituted alkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted alkoxy group having 1 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkoxycarbonyl group having 2 to 30 carbon atoms, an amino group substituted by a substituted or unsubstituted aryl group having 6 to 30 ring carbon atoms, a halogen atom, a cyano group, a nitro group, a hydroxy group, or a carboxy group.

Among $R^{1a}$ to $R^{7a}$, $R^{1b}$ to $R^{7b}$, or $R^{1c}$ to $R^{6c}$, adjacent groups may be bonded to each other to form a ring. Examples of the ring include a benzene ring, naphthalene ring, pyrazine ring, pyridine ring, and furan ring.

$L^{1a}$ and $L^{1b}$ are each independently a single bond or a linking group. $L^{1a}$ and $L^{1b}$ as the linking group are each independently a substituted or unsubstituted aromatic group having 6 to 20 ring carbon atoms, a substituted or unsubstituted alkylene chain having 1 to 8 carbon atoms, and a substituted or unsubstituted hetero ring. Specifically, a substituted or unsubstituted benzene ring, a substituted or unsubstituted naphthalene ring, a substituted or unsubstituted methylene chain, or a substituted or unsubstituted pyridine ring are preferable.

$Ar^{1a}$, $Ar^{1b}$, $Ar^{1c}$ and $Ar^{2c}$ are each independently a substituted or unsubstituted aromatic group having 6 to 30 ring carbon atoms.

n is in a range from 1 to 4. When n is 2 or more, groups each having a phenanthroline skeleton in parentheses may be the same or different.

Specific examples of the compounds represented by the formulae (I') to (III') are shown below.

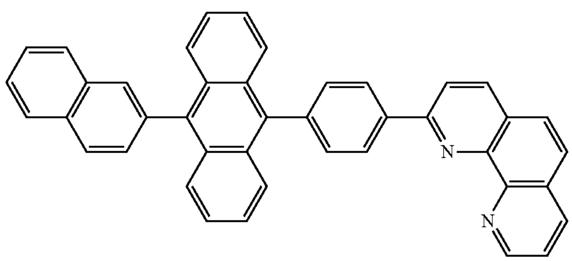

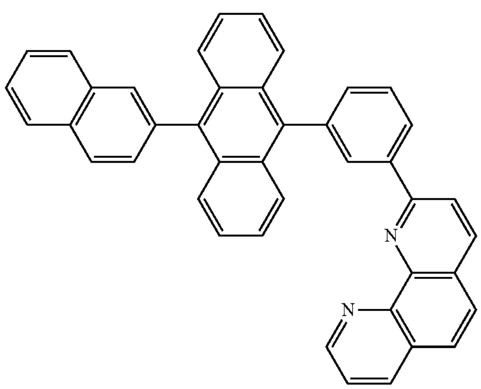

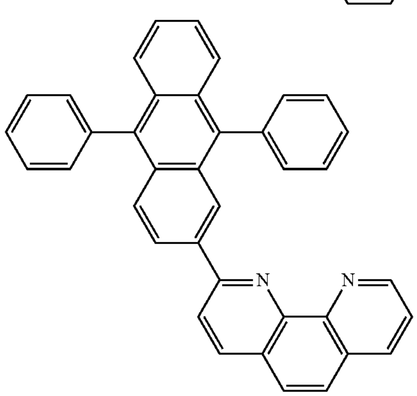

-continued

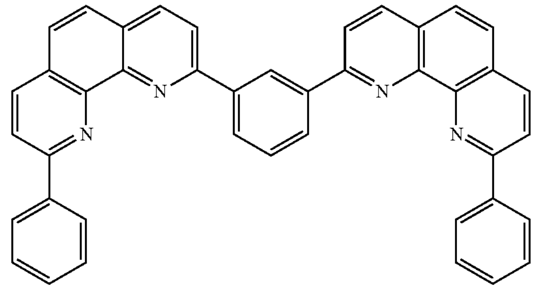

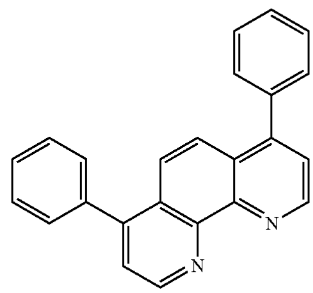

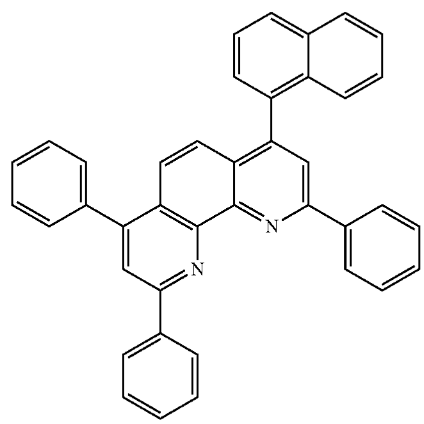

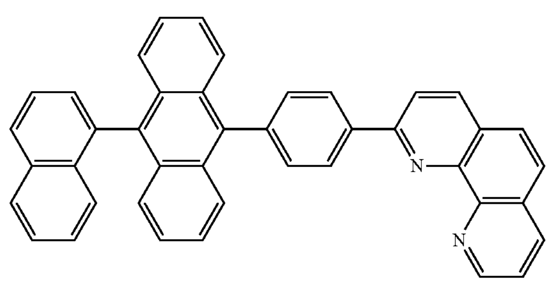

-continued

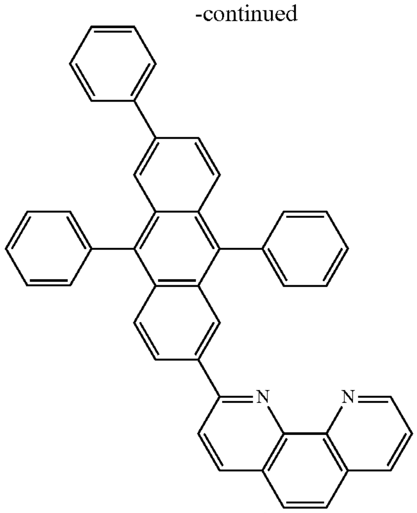

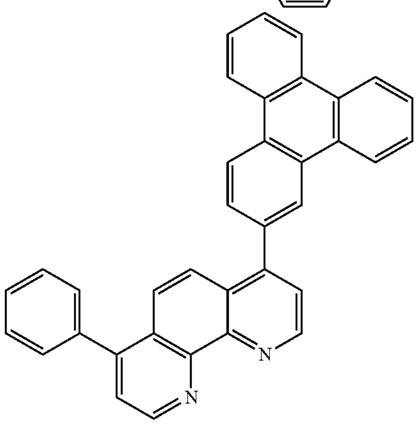

Electron Donating Material

Examples of the electron donating material include an electron donating metal element, metal compound and metal complex. Specifically, the electron donating material is preferably a layer containing at least one of alkali metal, alkali metal compound, organic metal complex containing alkali metal, alkaline earth metal, alkaline earth metal compound, organic metal complex containing alkaline earth metal, rare earth metal, rare earth metal compound, and organic metal complex containing rare earth metal. Among these substances, it is preferable to contain at least one of alkali metal, alkaline earth metal, rare earth metal element, rare earth metal compound and rare earth metal complex.

P Layer

P layer is a layer containing an acceptor material. The P layer may be a layer doped with the acceptor material (i.e., P-doped layer).

When the acceptor material is an organic material, examples of the acceptor material include a compound represented by a formula (1) (indenofluorenedione derivative) and a compound represented by a formula (III).

When the acceptor material is an inorganic material, examples of the acceptor material include molybdenum oxide ($MoO_3$), vanadium oxide ($V_2O_5$), and transparent oxide (e.g., ITO and IZO).

Moreover, the acceptor material can be selected as needed from the "substance exhibiting a high hole injectability" exemplarily listed in the description of the hole injecting layer.

It should be noted that the first hole transporting zone, the second hole transporting zone, and the third hole transporting zone each refer to a zone not containing the acceptor material.

For instance, the compound represented by the formula (1) (i.e., indenofluorenedione derivative) is usable as the acceptor material.

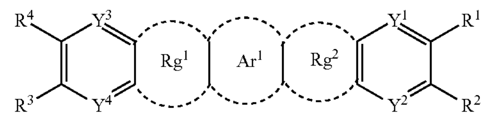

(I)

In the formula (1), $Ar^1$ is an aromatic ring having 6 to 24 ring carbon atoms or a hetero ring having 5 to 24 ring atoms, preferably an aromatic ring having 6 to 14 carbon atoms or a hetero ring having 5 to 14 ring atoms. Examples of the aromatic ring include a benzene ring, naphthalene ring, fluorene ring, 9,9-dimethylfluorene ring, and 9,9-dioctylfluorene ring. Examples of the hetero ring include a pyrazine ring, pyridine ring, quinoxaline ring, thiophene ring, benzothiophene ring, dibenzothiophene ring, furan ring, benzofuran ring, dibenzofuran ring, phenanthroline ring, naphthyridine ring, and tetraazaanthracene ring.

The aromatic ring and hetero ring may be substituted by $R^1$ to $R^4$ described below.

It should be noted that the term "ring carbon atoms" means carbon atoms forming an aromatic ring, and the term "ring atoms" means carbon atom(s) and hetero atom(s) forming a hetero ring (such as a saturated ring, unsaturated ring and aromatic hetero ring).

$Rg^1$ and $Rg^2$ may be mutually the same or different and represented by formula (i) or formula (ii) below.

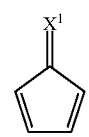

(i)

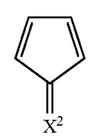

(ii)

In the formulae (i) and (ii), $X^1$ and $X^2$ may be mutually the same or different, and are each a divalent group represented by one of formulae (a) to (g).

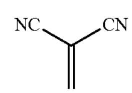

(a)

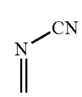

(b)

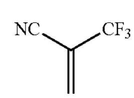

(c)

-continued (d)

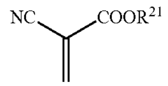

(e)

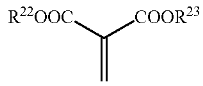

(f)

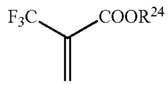

(g)

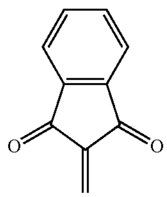

In the formulae (a) to (g), $R^{21}$ to $R^{24}$ may be mutually the same or different, and are each a hydrogen atom, a substituted or unsubstituted fluoroalkyl group, a substituted or unsubstituted alkyl group, a substituted or unsubstituted aryl group, or a substituted or unsubstituted heterocyclic group. $R^{22}$ and $R^{23}$ may be mutually bonded to form a ring.

$Y^1$ to $Y^4$ may be mutually the same or different, and are each —N═, —CH═, or C($R^5$)═. $R^5$ represents the same as $R^1$ to $R^4$ described later. Adjacent ones of $R^1$ to $R^5$ may be mutually bonded to form a ring.

In the formula (1), $R^1$ to $R^4$ may be mutually the same or different, and are each a hydrogen atom, a substituted or unsubstituted alkyl group, a substituted or unsubstituted cycloalkyl group, a substituted or unsubstituted alkenyl group, a substituted or unsubstituted aryl group, a substituted or unsubstituted heterocyclic group, a halogen atom, a substituted or unsubstituted fluoroalkyl group, a substituted or unsubstituted alkoxy group, a substituted or unsubstituted fluoroalkoxy group, a substituted or unsubstituted aryloxy group, a substituted or unsubstituted aralkyloxy group, a substituted or unsubstituted amino group, a substituted or unsubstituted silyl group, or a cyano group. $R^1$ and $R^2$ may be mutually bonded to form a ring. $R^3$ and $R^4$ may be mutually bonded to form a ring.

For instance, a compound represented by a formula (III) is usable as the acceptor material used in the P layer.

(III)

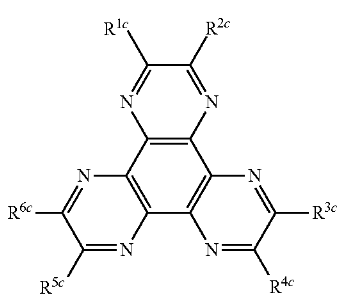

In the formula (III), $R^{1c}$ to $R^{6c}$ are each independently a hydrogen atom, a substituted or unsubstituted aryl group having 6 to 30 ring carbon atoms, a substituted or unsubstituted pyridyl group, a substituted or unsubstituted quinolyl group, a substituted or unsubstituted alkyl group having 1 to 30 carbon atoms, a substituted or unsubstituted cycloalkyl group having 3 to 30 carbon atoms, a substituted or unsubstituted aralkyl group having 7 to 50 ring carbon atoms, a substituted or unsubstituted alkoxy group 1 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkoxycarbonyl having 2 to 30 carbon atoms, an amino group substituted by a substituted or unsubstituted aryl group having 6 to 30 ring carbon atoms, a halogen atom, a cyano group, a nitro group, a hydroxyl group, or a carboxyl group.

Substrate

The substrate is used as a support for the luminescent device. For instance, glass, quartz, plastics and the like are usable for the substrate. A flexible substrate is also usable. The flexible substrate means a substrate that can be bent. Examples of the flexible substrate include a plastic substrate made of polycarbonate, polyarylate, polyethersulfone, polypropylene, polyester, polyvinyl fluoride, and polyvinyl chloride. Moreover, an inorganic vapor deposition film is also usable.

Anode

Metal having a large work function (specifically, 4.0 eV or more), an alloy, an electrically conductive compound and a mixture thereof are preferably used as the anode formed on the substrate. Specific examples of the material include ITO (Indium Tin Oxide), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The material is typically formed into a film by a sputtering method. For instance, indium oxide-zinc oxide can be formed by the sputtering method using a target containing zinc oxide in a range from 1 wt % to 10 wt % relative to indium oxide. The indium oxide containing tungsten oxide and zinc oxide can be formed by the sputtering method using a target in which tungsten oxide in a range from 0.5 wt % to 5 wt % and zinc oxide in a range from 0.1 wt % to 1 wt % are added to indium oxide. In addition, the anode may be formed by a vacuum deposition method, a coating method, an inkjet method, a spin coating method or the like.

Among the organic layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

The elements belonging to the group 1 or 2 of the periodic table, which are a material having a small work function, specifically, an alkali metal such as lithium (Li) and cesium (Cs), an alkaline earth metal such as magnesium (Mg), calcium (Ca) and strontium (Sr), an alloy containing the alkali metal and the alkaline earth metal (e.g., MgAg, AlLi), a rare earth metal such as europium (Eu) and ytterbium (Yb), and an alloy containing the rare earth metal are usable. It should be noted that the vacuum deposition method and the sputtering method are usable for forming the anode using the alkali metal, alkaline earth metal and the alloy thereof. Further, when a silver paste is used for the anode, the coating method and the inkjet method are usable.

When the organic EL device is of a bottom emission type, the anode is preferably formed of a light-transmissive or semi-transmissive metallic material that transmits light from the emitting layer. Herein, the light-transmissive or semi-transmissive property means the property of allowing transmissivity of 50% or more (preferably 80% or more) of the light emitted from the emitting layer. The light-transmissive or semi-transmissive metallic material can be selected in use as needed from the above materials listed in the description about the anode.

When the organic EL device is of a top emission type, the anode is a reflective electrode having a reflective layer. The reflective layer is preferably formed of a metallic material having light reflectivity. Herein, the light reflectivity means the property of reflecting 50% or more (preferably 80% or more) of the light emitted from the emitting layer. The metallic material having light reflectivity can be selected in use as needed from the above materials listed in the description about the anode.

The anode may be formed only of the reflective layer, but may be a multilayer structure having the reflective layer and a conductive layer (preferably a transparent conductive layer). When the anode has the reflective layer and the conductive layer, it is preferable that the conductive layer is disposed between the reflective layer and the hole transporting zone. A material of the conductive layer can be selected in use as needed from the above materials listed in the description about the anode.

Cathode

It is preferable to use metal, an alloy, an electroconductive compound, and a mixture thereof, which have a small work function (specifically, 3.8 eV or less) for the cathode. Examples of materials for the cathode include elements belonging to the group 1 or 2 of the periodic table, specifically, an alkali metal such as lithium (Li) and cesium (Cs), an alkaline earth metal such as magnesium (Mg), calcium (Ca) and strontium (Sr), an alloy containing the alkali metal and the alkaline earth metal (e.g., MgAg, AlLi), a rare earth metal such as europium (Eu) and ytterbium (Yb), and an alloy containing the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Ag, ITO, graphene, and indium oxide-tin oxide containing silicon or silicon oxide may be used for forming the cathode regardless of the work function. The conductive materials can be formed into a film using the sputtering method, inkjet method, spin coating method and the like.

When the organic EL device is of a bottom emission type, the cathode is a reflective electrode having a reflective layer. The reflective layer is preferably formed of a metallic material having light reflectivity. The metallic material having light reflectivity can be selected in use as needed from the above materials listed in the description about the cathode.

When the organic EL device is of a top emission type, the cathode is preferably formed of a light-transmissive or semi-transmissive metallic material that transmits light from the emitting layer. The light-transmissive or semi-transmissive metallic material can be selected in use as needed from the above materials listed in the description about the cathode.

Capping Layer

The top emission type organic EL device usually has a capping layer on the top of the cathode.

As the capping layer, for example, a high polymer compound, metal oxide, metal fluoride, metal boride, silicon nitride, silicon compound (silicon oxide or the like), and the like can be used.

In addition, an aromatic amine derivative, an anthracene derivative, a pyrene derivative, a fluorene derivative, or a dibenzofuran derivative can also be used for the capping layer.

Moreover, a laminate obtained by laminating layers containing these substances is also usable as a capping layer.

Layer Thickness

The film thickness of each of the organic layers of the organic EL device according to the exemplary embodiment, which is not specifically limited unless specifically mentioned in the above, is usually preferably in a range from several nanometers to 1 μm because excessively small film thickness is likely to cause defects (e.g. pin holes) and excessively large thickness leads to the necessity of applying high voltage and consequent reduction in efficiency.

Manufacturing Method of Organic EL Device

A manufacturing method of an organic EL device is not particularly limited. A typical manufacturing method used for an organic EL device is usable. Specific examples for forming the respective layers on the substrate are a vacuum deposition method, a casting method, a coating method and a spin coating method.

Moreover, in addition to the casting method, the coating method and the spin coating using a solution, in which the organic material of the layers are dispersed, on a transparent polymer such as polycarbonate, polyurethane, polystyrene, polyarylate and polyester, the respective layers can be formed by simultaneous deposition with the organic material and the transparent polymer.

Sixth Exemplary Embodiment

Electronic Device

An electronic device of a sixth exemplary embodiment is installed with at least one of the organic EL devices according to the first to fifth exemplary embodiments. Examples of the electronic device include a display device and a light-emitting unit. Examples of the display device include a display component (e.g., an organic EL panel module), TV, mobile phone, tablet and personal computer. Examples of the light-emitting unit include an illuminator and a vehicle light.

Since the electronic device according to the sixth exemplary embodiment is installed with any one of the organic EL devices according to the first to fifth exemplary embodiments, the electronic device emits light with a long lifetime at a low voltage.

Other Exemplary Embodiment

In the first to fifth exemplary embodiments, the organic EL devices each including two or three emitting units have been described but the number of emitting units may be four or more.

Modification of Exemplary Embodiment(s)

The scope of the invention is not limited by the above-described exemplary embodiments but includes any modification and improvement as long as such modification and improvement are compatible with the invention.

Specific structure, shape and the like of the components in the invention may be designed in any manner as long as an object of the invention can be achieved.

EXAMPLE(S)

Example(s) of the invention will be described below. However, the invention is not limited to Example(s).

Compounds Compounds represented by the formula (1) and the formula (A-3), which are used in manufacturing organic EL devices according to Examples, are shown below.

BH-1

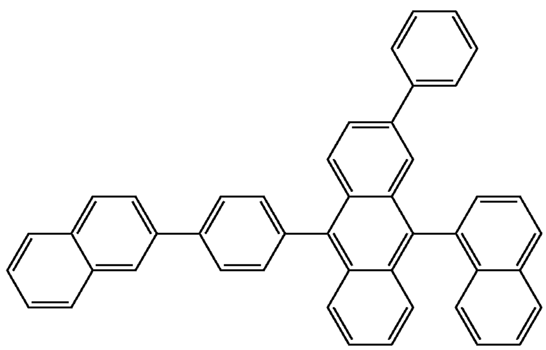

BD-1

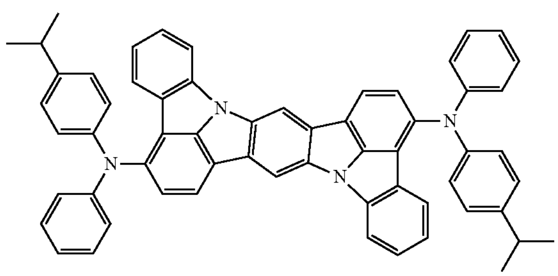

Compounds used for manufacturing organic EL devices according to Comparatives are shown below.

BH-R1

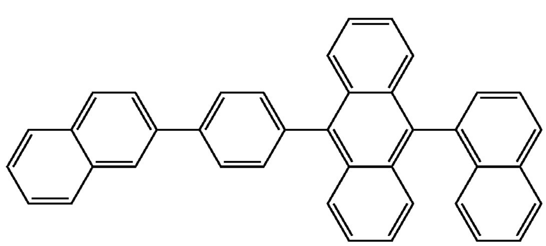

Structures of other compounds used for manufacturing the organic EL devices according to Examples and Comparatives are shown below.

HI

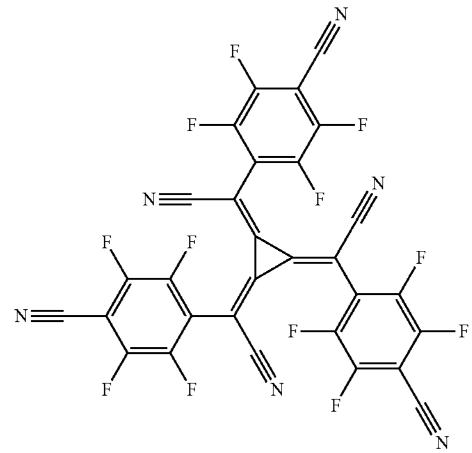

YD-1

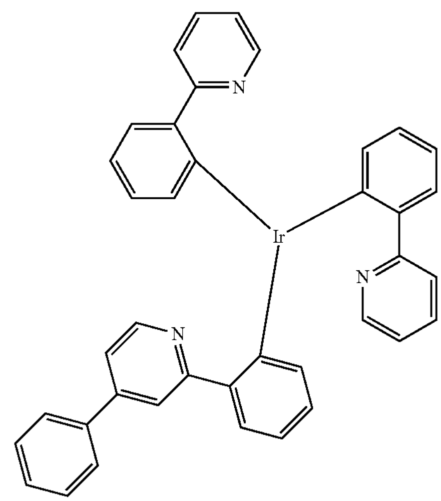

HT-1

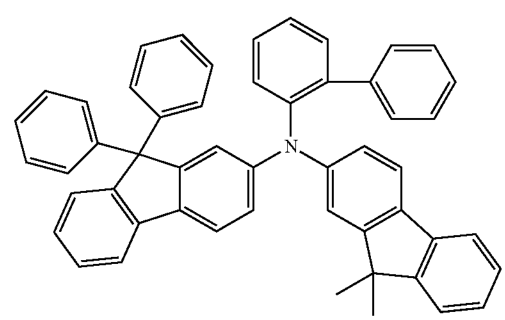

-continued

HT-2

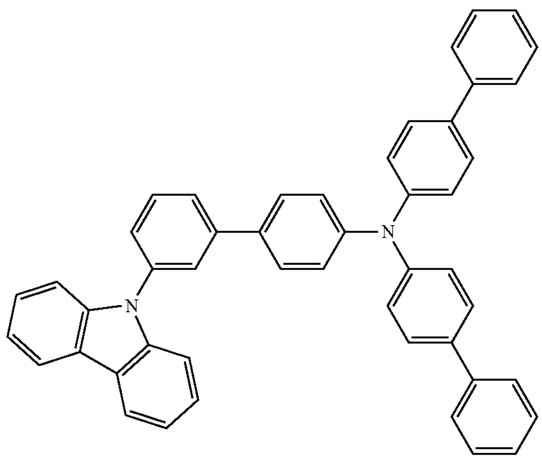

ET-1

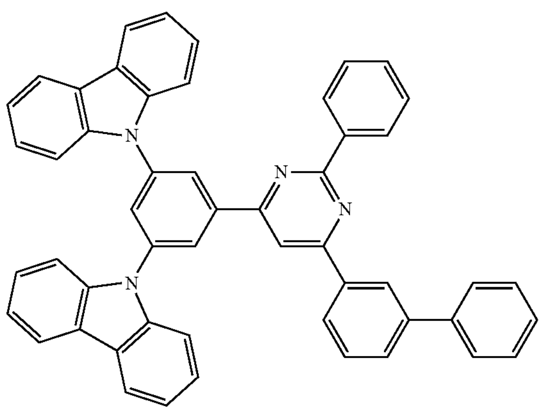

ET-2

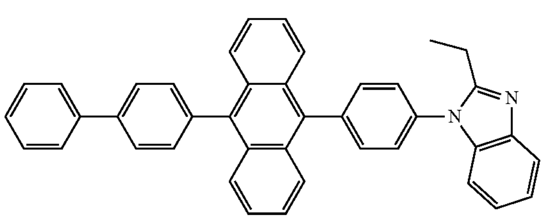

ET-3

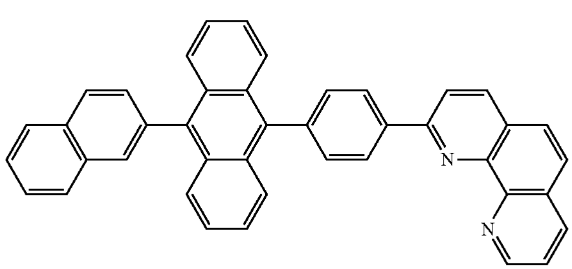

-continued

PHG

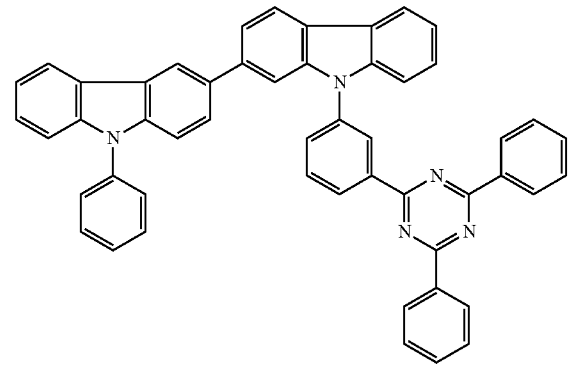

Cap-1

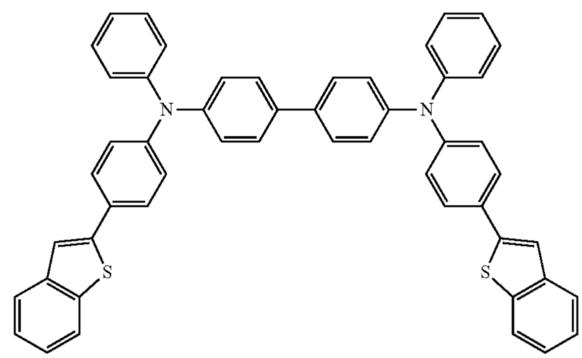

Liq

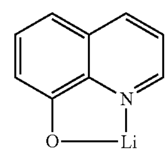

Preparation of Organic EL Device of Top Emission Type

Example 1

An APC (Ag—Pd—Cu) layer (reflective layer) having a film thickness of 100 nm, which was silver alloy layer, and an indium zinc oxide (IZO: registered trademark) layer (transparent conductive layer) having a thickness of 10 nm were sequentially formed by sputtering on a glass substrate (25 mm×75 mm×0.7 mm thickness) to be a substrate for manufacturing a device. By this operation, a conductive material layer of the APC layer and the IZO layer was obtained.

Subsequently, the conductive material layer was patterned by etching using a resist pattern as a mask using a normal lithography technique to form a lower electrode (anode).

Formation of First Emitting Unit

Next, a compound HT-1 and a compound HI were co-deposited on the lower electrode through vacuum deposition to form a 10-nm-thick hole injecting layer. The concentrations of the compound HT-1 and the compound HI in the hole injecting layer were 90 mass % and 10 mass %, respectively.

Next, the compound HT-1 was vapor-deposited on the hole injecting layer to form a 10-nm-thick first hole transporting layer on the hole injecting layer.

Next, a compound HT-2 was vapor-deposited on the first hole transporting layer to form a 5-nm-thick second hole transporting layer.

Next, a compound BH-1 and a compound BD-1 were co-deposited on the second hole transporting layer to form a 20-nm-thick first emitting layer in a form of a blue fluorescent layer. The concentrations of the compound BH-1 and the compound BD-1 in the blue fluorescent layer were 99 mass % and 1 mass %, respectively.

Next, a compound ET-1 was vapor-deposited on the blue fluorescent layer to form a 5-nm-thick electron transporting layer.

Formation of First Charge Generating Layer

Next, a first N layer and a first P layer were sequentially formed on the electron transporting layer of the first emitting unit.

A compound ET-3 and lithium (Li) were co-deposited on the electron transporting layer of the first emitting unit to form a 60-nm-thick first N layer. The concentrations of the compound ET-3 and Li in the first N layer were 96 mass % and 4 mass %, respectively.

Next, the compound HT-1 and the compound HI were co-deposited on the first N layer to form a 10-nm-thick first P layer. The concentrations of the compound HT-1 and the compound HI in the first P layer were 90 mass % and 10 mass %, respectively.

Formation of Second Emitting Unit

Next, the compound HT-1 was vapor-deposited on the first P layer to form a 20-nm-thick first hole transporting layer.

Next, the compound HT-2 was vapor-deposited on the first hole transporting layer to form a 5-nm-thick second hole transporting layer.

Next, the compound BH-1 and the compound BD-1 were co-deposited on the second hole transporting layer to form a 20-nm-thick second emitting layer in a form of a blue fluorescent layer. The concentrations of the compound BH-1 and the compound BD-1 in the blue fluorescent layer were 99 mass % and 1 mass %, respectively.

Next, the compound ET-1 was vapor-deposited on the blue fluorescent layer to form a 5-nm-thick electron transporting layer.

Formation of Second Charge Generating Layer

Next, a second N layer and a second P layer were sequentially formed on the electron transporting layer of the second emitting unit.

Next, the compound ET-3 and lithium (Li) were co-deposited on the electron transporting layer of the second emitting unit to form a 50-nm-thick second N layer. The concentrations of the compound ET-3 and Li in the second N layer were 96 mass % and 4 mass %, respectively.

Next, the compound HT-1 and the compound HI were co-deposited on the second N layer to form a 10-nm-thick second P layer. The concentrations of the compound HT-1 and the compound HI in the second P layer were 90 mass % and 10 mass %, respectively.

Formation of Third Emitting Unit

Next, the compound HT-1 was vapor-deposited on the second P layer to form a 20-nm-thick first hole transporting layer.

Next, the compound HT-2 was vapor-deposited on the first hole transporting layer to form a 5-nm-thick second hole transporting layer.

Next, the compound BH-1 and the compound BD-1 were co-deposited on the second hole transporting layer to form a 20-nm-thick third emitting layer in a form of a blue fluorescent layer. The concentrations of the compound BH-1 and the compound BD-1 in the blue fluorescent layer were 99 mass % and 1 mass %, respectively.

Next, the compound ET-1 was vapor-deposited on the blue fluorescent layer to form a 5-nm-thick first electron transporting layer.

Next, the compound ET-2 and Liq were co-deposited on the first electron transporting layer to form a 15-nm-thick second electron transporting layer. The concentrations of the compound ET-2 and Li in the second electron transporting layer were 50 mass % and 50 mass %, respectively.

Next, lithium fluoride (LiF) was vapor-deposited on the second electron transporting layer to form a 1-nm-thick electron injecting layer.

Subsequently, Mg and Ag were co-deposited on the electron injecting layer at a mixing ratio (mass % ratio) of 15:85, thereby forming a 15-nm-thick semi-transparent upper electrode (cathode) formed of Mg—Ag alloy.

Next, a compound Cap-1 was deposited on the entire surface of the upper electrode to form a 70-nm-thick capping layer.

The organic EL device of a top emission type was manufactured as described above.

A device arrangement of the organic EL device of Example 1 is roughly shown as follows.

APC(100)/IZO(10)/
HT-1:HI(10,90%:10%)/HT-1(10)/HT-2(5)/BH-1:BD-1 (20,99%:1%)/ET-1(5)
ET-3:Li(60,96%:4%)/HT-1: HI(10,90%:10%)/
HT-1(20)/HT-2(5)/BH-1:BD-1(20,99%:1%)/ET-1 (5)/
ET-3:Li(50,96%:4%)/HT-1: HI(10,90%:10%)/
HT-1(20)/HT-2(5)/BH-1:BD-1(20,99%,1%)/ET-1(5)/ET-2:Liq(15,50%:50%)/LiF(1)/Mg:Ag(15,15%:85%)/Cap-1(70)

The numerals in parentheses represent film thickness (unit: nm).

The numerals represented by percentage in the same parentheses indicate, for instance in case of HT-1:HI (10, 90%:90%), a ratio (mass %) between the compounds HT-1 and HI in the hole injecting layer being HT-1:HI=90 mass %:10 mass %. The same notations apply to other numerals in parentheses.

Comparatives 1 to 3

The organic EL devices in Comparatives 1 to 3 were manufactured in the same manner as in Example 1 except that the first emitting unit, the second emitting unit and the third emitting unit in Example 1 were replaced as shown in Table 1.

Preparation of Organic EL Device of Bottom Emission Type

Example 2 and Comparative 4

The organic EL devices in Example 2 and Comparative 4 were manufactured in the same manner as in Example 1 except that the anode, the first emitting unit, the second emitting unit, the second charge generating layer, the third emitting unit and the cathode in Example 1 were replaced as shown in Table 1 and did not include a capping layer.

Evaluation

The organic EL devices manufactured in Examples 1 to 2 and Comparatives 1 to 4 were evaluated as follows. The results are shown in Table 1.

Drive Voltage

The voltage (unit: V) when electric current was applied between the anode and the cathode such that the current density was 10 mA/cm$^2$ was measured.

Main Peak Wavelength λp and Main Peak Intensity of Blue Fluorescence

A main peak wavelength λp and main peak intensity of blue fluorescence obtained from each of the organic EL devices were measured by the following method.

Voltage was applied on each of the organic EL devices such that a current density was 10 $mA/cm^2$, where spectral radiance spectra were measured by a spectroradiometer CS-2000 (manufactured by Konica Minolta, Inc.).

In the obtained spectral radiance spectra, a peak wavelength and an intensity of the emission spectrum, at which the luminous intensity of the emission spectrum were at the maximum, were measured and defined as a "main peak wavelength λp (unit: nm) of blue fluorescence" and a "main peak intensity of blue fluorescence" in this evaluation.

The "main peak intensity of blue fluorescence" of Example 1 was set to be 100 and a "main peak intensity of blue fluorescence" of each of Examples and Comparatives was obtained as a "main peak intensity of blue fluorescence (relative value: %)" using a numerical formula (Numerical Formula 100) below. The "main peak intensity of blue fluorescence (relative value: %)" was used as an index for a blue fluorescence efficiency.

Main peak intensity of blue fluorescence of each of Examples and Comparatives (relative value: %)=(main peak intensity of blue fluorescence of each of Examples and Comparatives/main peak intensity of blue fluorescence of Example 1)×100 (Numerical Formula 100)

Lifetime LT95

Voltage was applied on each of the organic EL devices such that a current density was 50 $mA/cm^2$, where spectral radiance spectra were measured for each current-applied time by a spectroradiometer CS-200 (manufactured by Konica Minolta, Inc.), and an emission peak intensity at 460 nm that falls within a blue wavelength region was measured. A ratio of the emission peak intensity after the current was applied relative to the initial emission peak intensity was calculated. A time elapsed before the peak intensity was decreased by 5% relative to the initial emission peak intensity was defined as 5%-deterioration lifetime (unit: minutes). In other words, the 5%-deterioration lifetime represents a time elapsed before the emission peak intensity was decreased to 0.95× in which X represents the initial emission peak intensity.

Herein, the 5%-deterioration lifetime is referred to as a "lifetime LT95 (h)".

The "lifetime LT95 (h)" of Example 1 was set to be 100 and a "lifetime LT95 (h)" of each of Examples and Comparatives was obtained as a "lifetime LT95 (relative value: %)" using a numerical formula (Numerical Formula 101) below.

Lifetime LT95 of each of Examples and Comparatives (relative value: %)=(lifetime LT95 (h) of each of Examples and Comparatives/lifetime LT95 (h) of Example 1)×100 (Numerical Formula 101)

TABLE 1

| | | First Emitting Unit | | | | | | | | First Charge Generating Layer | |
|---|---|---|---|---|---|---|---|---|---|---|---|
| | | First HT Zone | | | First Emitting Layer | | | First ET Zone | | First N Layer | First P Layer |
| | Anode | HIL (nm) | HTL1 (nm) | HTL2 (nm) | Thickness (nm) | Host Material | Luminescent Material | Thickness (nm) | | Thickness (nm) | Thickness (nm) |
| Ex. 1 | APC/IZO | 10 | 10 | 5 | 20 | BH-1 | BD-1 | 5 | | 60 | 10 |
| Comp. 1 | APC/IZO | 10 | 10 | 5 | 20 | BH-R1 | BD-1 | 5 | | 60 | 10 |
| Comp. 2 | APC/IZO | 10 | 130 | 5 | 20 | BH-1 | BD-1 | 5 | | 60 | 10 |
| Comp. 3 | APC/IZO | 10 | 130 | 5 | 20 | BH-R1 | BD-1 | 5 | | 60 | 10 |
| Ex. 2 | ITO (80) | 10 | 15 | 5 | 20 | BH-1 | BD-1 | 5 | | 20 | 10 |
| Comp. 4 | ITO (130) | 10 | 20 | 5 | 20 | BH-R1 | BD-1 | 5 | | 20 | 10 |

| | Second Emitting Unit | | | | | | Second Charge Generating Layer | | Third Emitting Unit | | |
|---|---|---|---|---|---|---|---|---|---|---|---|
| | Second HT Zone | | Second Emitting Layer | | | Second ET Zone | Second N Layer | Second P Layer | Third HT Zone | | Third Emitting Layer |
| | HTL1 (nm) | HTL2 (nm) | Thickness (nm) | Host Material | Luminescent Material | Thickness (nm) | Thickness (nm) | Thickness (nm) | HTL1 (nm) | HTL2 (nm) | Thickness (nm) |
| Ex. 1 | 20 | 5 | 20 | BH-1 | BD-1 | 5 | 50 | 10 | 20 | 5 | 20 |
| Comp. 1 | 20 | 5 | 20 | BH-R1 | BD-1 | 5 | 50 | 10 | 20 | 5 | 20 |
| Comp. 2 | 20 | 5 | 20 | BH-1 | BD-1 | 5 | 50 | 10 | 20 | 5 | 20 |
| Comp. 3 | 20 | 5 | 20 | BH-R1 | BD-1 | 5 | 50 | 10 | 20 | 5 | 20 |
| Ex. 2 | 15 | 5 | 48 | PGH (80%) | YD-1 (20%) | 5 | 100 | 10 | 15 | 5 | 20 |
| Comp. 4 | 15 | 5 | 48 | PGH (80%) | YD-1 (20%) | 5 | 100 | 10 | 15 | 5 | 20 |

| | Third Emitting Unit | | | | | | | | Evaluation | | |
|---|---|---|---|---|---|---|---|---|---|---|---|
| | Third Emitting Layer | | Third ET Zone | | | | | | Main Peak Wavelength | Blue Efficiency Main Peak Intensity | Lifetime LT95 |
| | Host Material | Luminescent Material | ETL1 (nm) | ETL2 (nm) | EIL (nm) | Cathode | Cap (nm) | Voltage (V) | λp (nm) | (Relative Value: %) | (Relative Value: %) |
| Ex. 1 | BH-1 | BD-1 | 5 | 15 | 1 | Mg/Ag | 70 | 11.2 | 460 | 100 | 100 |
| Comp. 1 | BH-R1 | BD-1 | 5 | 40 | 1 | Mg/Ag | 70 | 11.7 | 460 | 87 | 63 |
| Comp. 2 | BH-1 | BD-1 | 5 | 40 | 1 | Mg/Ag | 70 | 12.0 | 460 | 184 | 50 |

TABLE 1-continued

| | | | | | | | | | | | |
|---|---|---|---|---|---|---|---|---|---|---|---|
| Comp. 3 | BH-R1 | BD-1 | 5 | 40 | 1 | Mg/Ag | 70 | 12.5 | 460 | 159 | 31 |
| Ex. 2 | BH-1 | BD-1 | 5 | 20 | 1 | Al (80) | 0 | 11.3 | 460 | 71 | 113 |
| Comp. 4 | BH-1 | BD-1 | 5 | 40 | 1 | Al (80) | 0 | 11.8 | 460 | 62 | 70 |

Explanation of Table 1

The HT zone represents the hole transporting zone.

HIL represents the hole injecting layer.

HTL1 represents the first hole transporting layer. HTL2 represents the second hole transporting layer.

The ET zone represents the electron transporting zone.

EIL represents the electron injecting layer.

ETL1 represents the first electron transporting layer. ETL2 represents the second electron transporting layer.

In the column of the anode, numerical values in the parentheses represent a thickness (nm).

In the column of the cathode, numerical values in the parentheses represent a thickness (nm). Mg/Ag represents an Mg—Ag alloy.

In the column of the second emitting layer, PGH (80%) represents a ratio (mass %) of PGH in the second emitting layer being 80 mass %. YD-1 (20%) represents a ratio (mass %) of YD-1 in the second emitting layer being 20 mass %.

Among the organic EL devices of a top emission type according to Example 1 and Comparatives 1 to 3, the organic EL device according to Example 1 was driven at a low voltage and emitted light with a long lifetime at a high efficiency as compared with the organic EL device according to Comparative 1. In addition, the organic EL device according to Example 1 was driven at a low voltage and emitted light with a long lifetime as compared with the organic EL devices according to Comparatives 2 to 3. The organic EL devices according to Comparatives 2 to 3, of which first hole transporting zone was a thick film, had a high light extraction efficiency while having a short lifetime and being driven at a low voltage.

For the organic EL devices of a bottom emission type according to Example 2 and Comparative 4, the organic EL device according to Example 2 was driven at a low voltage and emitted light with a long lifetime as compared with the organic EL device according to Comparative 4.

Evaluation of Compounds

Values of physical properties of the compounds were measured by the following method.

Stokes Shift (SS) (nm)

Target compounds for measurement were each dissolved in toluene at a concentration of $2.0\times10^{-5}$ mol/L to prepare measurement samples. The measurement samples were each put into a quartz cell and were irradiated with continuous light falling within an ultraviolet-to-visible region at a room temperature (300K), to measure an absorption spectrum (ordinate axis: absorbance, abscissa axis: wavelength) therefrom. A spectrophotometer U-3900/3900H manufactured by Hitachi High-Tech Science Corporation was used for the absorption spectrum measurement. Target compounds for measurement were each dissolved in toluene at a concentration of $4.9\times10^{-6}$ mol/L to prepare measurement samples. The measurement samples were each put into a quartz cell and were irradiated with excited light at a room temperature (300K), to measure fluorescence spectrum (ordinate axis: fluorescence intensity, abscissa axis: wavelength) therefrom. A spectrophotofluorometer F-7000 manufactured by Hitachi High-Tech Science Corporation was used for the fluorescence spectrum measurement.

A difference between an absorption maximum wavelength and a fluorescence maximum wavelength was calculated from the absorption spectrum and the fluorescence spectrum to obtain a Stokes shift (SS). A unit of the Stokes shift (SS) was denoted by denoted by nm.

The Stokes shift (SS) of the compound BD-1 was 14 nm.

Preparation of Toluene Solution

The compound BD-1 was dissolved in toluene at a concentration of $4.9\times10^{-6}$ mol/L to prepare a toluene solution of the compound BD-1.

Measurement of Fluorescence Main Peak Wavelength (FL-Peak)

Fluorescence main peak wavelength of the toluene solution of the compound BD-1 excited at 390 nm was measured using a fluorescence spectrometer (spectrophotofluorometer F-7000 (manufactured by Hitachi High-Tech Science Corporation)).

The fluorescence main peak wavelength of the compound BD-1 was 453 nm.

What is claimed is:

1. An organic electroluminescence device comprising:

an anode;

a cathode;

a first emitting unit comprising a first emitting layer and a first hole transporting zone;

a first charge generating layer; and a second emitting unit comprising a second emitting layer, wherein the first emitting unit, the first charge generating layer, and the second emitting unit are provided between the anode and the cathode in this order from the anode, the first hole transporting zone of the first emitting unit is provided between the anode and the first emitting layer, the first emitting layer comprises a compound represented by a formula (1-2) below, a formula (1-3) below, or a formula (1-4) below, and a thickness of the first hole transporting zone of the first emitting unit is 60 nm or less, (1-2)

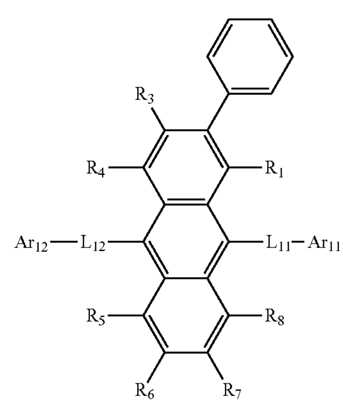

-continued (1-3)

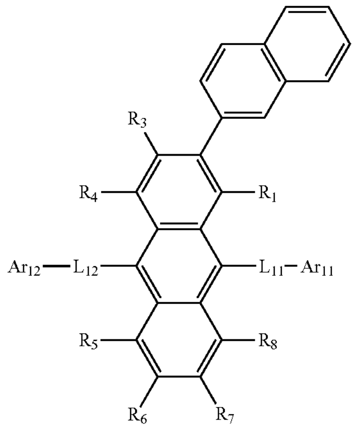

(1-4)

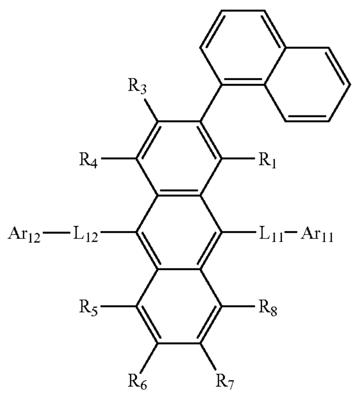

where, in the formula (1-2):

$L_{11}$ to $L_{12}$ are each independently a single bond, a substituted or unsubstituted arylene group having 6 to 50 ring carbon atoms, or a substituted or unsubstituted divalent heterocyclic group having 5 to 50 ring atoms;

$Ar_{11}$ is a substituted or unsubstituted naphthyl group, a substituted or unsubstituted fluorenyl group, a substituted or unsubstituted 9,9'-spirobifluorenyl group, a substituted or unsubstituted benzofluorenyl group, a substituted or unsubstituted phenanthryl group, or a substituted or unsubstituted benzophenanthryl group;

$Ar_{12}$ is a substituted or unsubstituted aryl group having 6 to 50 ring carbon atoms, or a substituted or unsubstituted heterocyclic group having 5 to 50 ring atoms;

$R_1$, $R_3$ to $R_8$ are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

with a proviso that when $R_3$, $R_6$, and $R_7$ are each independently a substituted or unsubstituted aryl group having 6 to 50 ring carbon atoms, $R_3$, $R_6$, and $R_7$ are each independently a substituted or unsubstituted phenyl group, a substituted or unsubstituted biphenyl group, a substituted or unsubstituted terphenyl group, a substituted or unsubstituted naphthyl group, a substituted or unsubstituted anthryl group, a substituted or unsubstituted phenanthryl group, a substituted or unsubstituted benzophenanthryl group, a substituted or unsubstituted phenalenyl group, a substituted or unsubstituted pyrenyl group, a substituted or unsubstituted chrysenyl group, a substituted or unsubstituted benzochrysenyl group, a substituted or unsubstituted triphenylenyl group, a substituted or unsubstituted benzotriphenylenyl group, a substituted or unsubstituted tetracenyl group, a substituted or unsubstituted pentacenyl group, a substituted or unsubstituted fluorenyl group, a substituted or unsubstituted 9,9'-spirobifluorenyl group, a substituted or unsubstituted benzofluorenyl group, a substituted or unsubstituted dibenzofluorenyl group, a substituted or unsubstituted fluoranthenyl group, a substituted or unsubstituted benzofluoranthenyl group, a substituted or unsubstituted perylenyl group;

$R_{901}$, $R_{902}$, $R_{903}$, $R_{904}$, $R_{905}$, $R_{906}$, and $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different;

where, in the formula (1-3):

$L_{11}$ to $L_{12}$ are each independently a single bond, a substituted or unsubstituted arylene group having 6 to 50 ring carbon atoms, or a substituted or unsubstituted divalent heterocyclic group having 5 to 50 ring atoms;

with a proviso that at least one of $L_{11}$ and Lie is each independently a substituted or unsubstituted arylene group having 6 to 50 ring carbon atoms, or a substituted or unsubstituted divalent heterocyclic group having 5 to 50 ring atoms;

$Ar_{11}$ to $Ar_{12}$ are each independently a substituted or unsubstituted phenyl group, a substituted or unsubstituted naphthyl group, a substituted or unsubstituted 9,9'-spirobifluorenyl group, a substituted or unsubstituted benzofluorenyl group, a substituted or unsubstituted phenanthryl group, or a substituted or unsubstituted benzophenanthryl group;

$R_1$, $R_3$ to $R_8$ in the formula (1-3) each independently represent the same as $R_1$ to $R_8$ in the formula (1-2);

$R_{901}$, $R_{902}$, $R_{903}$, $R_{904}$, $R_{905}$, $R_{906}$, and $R_{907}$ in the formula (1-3) each independently represent the same as $R_{901}$, $R_{902}$, $R_{903}$, $R_{904}$, $R_{905}$, $R_{906}$, and $R_{907}$ in the formula (1-2);

where, in the formula (1-4):

$L_{11}$ to $L_{12}$ are each independently a single bond, a substituted or unsubstituted arylene group having 6 to 50 ring carbon atoms, or a substituted or unsubstituted divalent heterocyclic group having 5 to 50 ring atoms;

$Ar_{11}$ is an unsubstituted phenyl group, a substituted naphthyl group, a substituted or unsubstituted fluorenyl group, a substituted or unsubstituted 9,9'-spirobifluorenyl group, a substituted or unsubstituted benzofluorenyl group, a substituted or unsubstituted phenanthryl group, or a substituted or unsubstituted benzophenanthryl group;

$Ar_{12}$ is a substituted or unsubstituted aryl group having 6 to 50 ring carbon atoms, or a substituted or unsubstituted heterocyclic group having 5 to 50 ring atoms;

$R_1$, $R_3$ to $R_8$ in the formula (1-4) each independently represent the same as $R_1$ to $R_8$ in the formula (1-2);

$R_{901}$, $R_{902}$, $R_{903}$, $R_{904}$, $R_{905}$, $R_{906}$, and $R_{907}$ in the formula (1-4) each independently represent the same as $R_{901}$, $R_{902}$, $R_{903}$, $R_{904}$, $R_{905}$, $R_{906}$, and $R_{907}$ in the formula (1-2), and wherein at least one of $L_{11}$ and $L_{12}$ in the formula (1-2) and the formula (1-4) is each independently a substituted or unsubstituted arylene group having 6 to 50 ring carbon atoms, or a substituted or unsubstituted divalent heterocyclic group having 5 to 50 ring atoms.

2. The organic electroluminescence device according to claim 1, wherein $L_{11}$ and $L_{12}$ are each independently a single bond, or a substituted or unsubstituted arylene group having 6 to 50 ring carbon atoms.

3. The organic electroluminescence device according to claim 1, wherein $L_{11}$ and $L_{12}$ are each independently a single bond, a substituted or unsubstituted phenylene group, a substituted or unsubstituted biphenylene group, a substituted or unsubstituted terphenylene group, a substituted or unsubstituted quarter-phenylene group, or a substituted or unsubstituted naphthylene group.

4. The organic electroluminescence device according to claim 1, wherein in the formula (1-2) and (1-4), $Ar_{12}$ is a substituted or unsubstituted aryl group having 6 to 30 ring carbon atoms.

5. The organic electroluminescence device according to claim 1, wherein in the formula (1-2) and (1-4), $Ar_{12}$ is a substituted or unsubstituted phenyl group, a substituted or unsubstituted naphthyl group, a substituted or unsubstituted fluorenyl group, a substituted or unsubstituted 9,9'-spirobifluorenyl group, a substituted or unsubstituted benzofluorenyl group, a substituted or unsubstituted phenanthryl group, or a substituted or unsubstituted benzophenanthryl group.

6. The organic electroluminescence device according to claim 1, wherein $R_1$ and $R_3$ to $R_8$ is a hydrogen atom.

7. The organic electroluminescence device according to claim 1, wherein one of $L_{11}$ and $L_{12}$ is a single bond.

8. The organic electroluminescence device according to claim 1, wherein the first emitting layer further comprises a compound A, a Stokes shift of the compound A is 20 nm or less, and a main peak wavelength of the compound A is in a range from 440 nm to 465 nm.

9. The organic electroluminescence device according to claim 8, wherein the compound A is a compound represented by a formula (A-1) below, a formula (A-2) below, or a formula (A-3) below, (A-1)

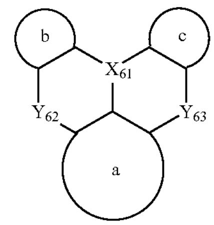

where: in the formula (A-1):

a ring, b ring and c ring are each independently a substituted or unsubstituted aromatic hydrocarbon ring having 6 to 50 ring carbon atoms or a substituted or unsubstituted heterocycle group having 5 to 50 ring atoms; $X_{61}$ is a boron atom or a nitrogen atom; and $Y_{62}$ and $Y_{63}$ are each independently $NR_d$, an oxygen atom, a sulfur atom, or a single bond; with a proviso that when $X_{61}$ is a boron atom, $Y_{62}$ and $Y_{63}$ are each independently $1NR_d$, an oxygen atom or a sulfur atom, and when $X_{61}$ is a nitrogen atom, $Y_{62}$ and $Y_{63}$ are each a single bond; $R_d$ is bonded with the a ring, b ring, or c ring to form a substituted or unsubstituted heterocycle, or to form no substituted or unsubstituted heterocycle; and $R_d$ not forming a substituted or unsubstituted heterocycle is each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms, (A-2)

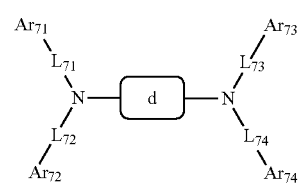

in the formula (A-2): d ring is a substituted or unsubstituted aromatic hydrocarbon ring having 6 to 50 ring carbon atoms or a substituted or unsubstituted heterocycle having 5 to 50 ring atoms;

$L_{71}$ to $L_{74}$ each independently represent a single bond, a substituted or unsubstituted arylene group having 6 to 50 ring carbon atoms, or a substituted or unsubstituted divalent heterocyclic group having 5 to 50 ring atoms; and $Ar_{71}$ to $Ar_{74}$ each independently represent a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

with a proviso that when the d ring is a substituted or unsubstituted aromatic hydrocarbon ring having 10 to 50 ring carbon atoms, at least two of $Ar_{71}$ to $Ar_{74}$ are each an aryl group having 6 to 50 ring carbon atoms substituted by an alkyl group having 1 to 50 carbon atoms, or a heterocyclic group having 5 to 50 ring atoms substituted by an alkyl group having 1 to 50 carbon atoms; and (A-3)

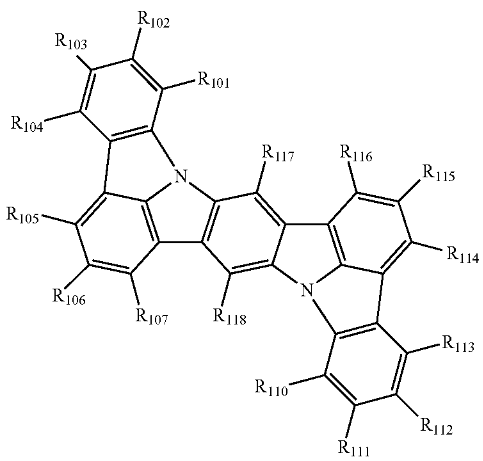

in the formula (A-3):

at least one combination of adjacent two or more of $R_{101}$ to $R_{107}$ and $R_{110}$ to $R_{118}$ are mutually bonded to form a substituted or unsubstituted monocyclic ring, mutually bonded to form a substituted or unsubstituted fused ring, or not mutually bonded;

$R_{110}$ to $R_{107}$ and $R_{110}$ to $R_{118}$ not forming the monocyclic ring and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$ to $R_{907}$ each independently are a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

10. The organic electroluminescence device according to claim 1, wherein the thickness of the first hole transporting zone of the first emitting unit is in a range from 15 nm to 50 nm.

11. The organic electroluminescence device according to claim 1, wherein the first hole transporting zone of the first emitting unit is in contact with the first emitting layer and the anode.

12. The organic electroluminescence device according to claim 1, wherein the first hole transporting zone of the first emitting unit comprises two or more layers.

13. The organic electroluminescence device according to claim 1, wherein a second hole transporting zone of the second emitting unit is provided between the first charge generating layer and the second emitting layer, the second emitting layer comprises the compound represented by the formula (1-2), the formula (1-3) or the formula (1-4), and a thickness of the second hole transporting zone of the second emitting unit is in a range from 5 nm to 70 nm.

14. The organic electroluminescence device according to claim 13, wherein the second hole transporting zone of the second emitting unit is in contact with the second emitting layer and the first charge generating layer.

15. The organic electroluminescence device according to claim 13, wherein the second hole transporting zone of the second emitting unit comprises two or more layers.

16. The organic electroluminescence device according to claim 1, further comprising a second charge generating layer and a third emitting unit comprising a third emitting layer, between the second emitting unit and the cathode in this order from the second emitting unit, wherein the third emitting unit comprises a third hole transporting zone between the second charge generating layer and the third emitting layer, the third emitting layer comprises the compound represented by the formula (1-2), the formula (1-3) or the formula (1-4), and a thickness of the third hole transporting zone of the third emitting unit is in a range from 5 nm to 70 nm.

17. The organic electroluminescence device according to claim 16, wherein the third hole transporting zone of the third emitting unit is in contact with the third emitting layer and the second charge generating layer.

18. The organic electroluminescence device according to claim 16, wherein the third hole transporting zone of the third emitting unit comprises two or more layers.

19. An electronic device comprising the organic electroluminescence device according to claim 1.

20. The organic electroluminescence device according to claim 1, wherein the first emitting layer further comprises a compound A, the compound A is a compound represented by a formula (A-1) below, or a formula (A-3) below, (A-1)

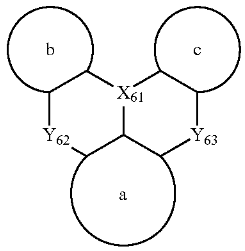

where: in the formula (A-1):

a ring, b ring and c ring are each independently a substituted or unsubstituted aromatic hydrocarbon ring having 6 to 50 ring carbon atoms or a substituted or unsubstituted heterocycle group having 5 to 50 ring atoms; $X_{61}$ is a boron atom or a nitrogen atom; and $Y_{62}$ and $Y_{63}$ are each independently $NR_d$, an oxygen atom, a sulfur atom, or a single bond; with a proviso that when $X_{61}$ is a boron atom, $Y_{62}$ and $Y_{63}$ are each independently $NR_d$, an oxygen atom or a sulfur atom, and when $X_{61}$ is a nitrogen atom, $Y_{62}$ and $Y_{63}$ are each a single bond; $R_d$ is bonded with the a ring, b ring, or c ring to form a substituted or unsubstituted heterocycle, or to form no substituted or unsubstituted heterocycle; and $R_d$ not forming a substituted or unsubstituted heterocycle is each independently a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms, and (A-3)

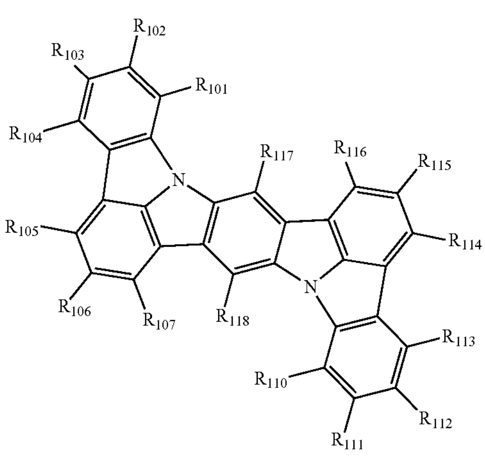

in the formula (A-3):

at least one combination of adjacent two or more of $R_{101}$ to $R_{107}$ and $R_{110}$ to $R_{118}$ are mutually bonded to form a substituted or unsubstituted monocyclic ring, mutually bonded to form a substituted or unsubstituted fused ring, or not mutually bonded;

$R_{101}$ to $R_{107}$ and $R_{110}$ to $R_{118}$ not forming the monocyclic ring and not forming the fused ring are each independently a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a halogen atom, a cyano group, a nitro group, a substituted or unsubstituted aryl group having 6 to 50 ring carbon atoms, or a substituted or unsubstituted heterocyclic group having 5 to 50 ring atoms;

$R_{901}$ to $R_{907}$ each independently are a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

21. The organic electroluminescence device according to claim 20, wherein the compound A is a compound represented by the formula (A-3).

* * * * *